(12) United States Patent
Lin et al.

(10) Patent No.: US 8,164,171 B2
(45) Date of Patent: Apr. 24, 2012

(54) SYSTEM-IN PACKAGES

(75) Inventors: Mou-Shiung Lin, Hsin-Chu (TW); Jin-Yuan Lee, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 33 days.

(21) Appl. No.: 12/779,863

(22) Filed: May 13, 2010

(65) Prior Publication Data

US 2010/0290191 A1    Nov. 18, 2010

Related U.S. Application Data

(60) Provisional application No. 61/178,493, filed on May 14, 2009.

(51) Int. Cl.
*H01L 23/02* (2006.01)
(52) U.S. Cl. . 257/686; 257/685; 257/777; 257/E25.006; 257/E25.013; 257/E25.017; 257/E25.021; 257/E25.027; 257/E23.085; 257/698
(58) Field of Classification Search ............... 257/686, 257/698, 777, E25.006, E25.013, E25.017, 257/E25.021, E25.027, E23.085, 685
See application file for complete search history.

(56) References Cited

U.S. PATENT DOCUMENTS

| | | |
|---|---|---|
| 6,359,340 B1 | 3/2002 | Lin |
| 6,765,299 B2 | 7/2004 | Takahashi |
| 7,029,953 B2 | 4/2006 | Sasaki |
| 7,045,899 B2 | 5/2006 | Yamane |
| 2003/0227095 A1* | 12/2003 | Fujisawa et al. ............ 257/782 |
| 2008/0217761 A1* | 9/2008 | Yang et al. ................. 257/700 |
| 2010/0103634 A1* | 4/2010 | Funaya et al. .............. 361/761 |

FOREIGN PATENT DOCUMENTS

WO    WO2008120755    10/2008

OTHER PUBLICATIONS

Chiang, C., Ph.D; "TSV-EDS Challenges & Solutions"; Synopsys, Inc.; Sep. 10, 2008; pp. 1-22.
De Moor, P., et al.; "Recent Advances in 3D Integrations at IMEC"; Mater. Res. Soc. Symp. Proc.; vol. 970; 2007; pp. 1-10.
Deptuch, G. et al.; "3D-IC Technology for Future Detectors"; Fermilab; Feb. 17, 2009; pp. 1-32.
Ehrmann, O.; "Future Directions in Hybridization of Pixel Detectors"; Fraunhofer Institut for Reliability and Microintegration IZM; Sep. 9-12, 2002; pp. 1-38.
Fukushima, T. et al.; "New Three-Dimensional Integration Technology Using Self-Assembly Technique"; downloaded Feb. 28, 2010; IEEE Xplore; pp. 1-4.
Gruber, P. et al.; "3D Packaging Micro Bumping"; IBM T.J. Watson Research Center; Jul. 16, 2008; pp. 1-21.

(Continued)

*Primary Examiner* — Jasmine Clark
(74) *Attorney, Agent, or Firm* — McDermott Will & Emery LLP

(57) ABSTRACT

System-in packages, or multichip modules, are described which can include multi-layer chips in a multi-layer polymer structure, on-chip metal bumps on the multi-layer chips, intra-chip metal bumps in the multi-layer polymer structure, and patterned metal layers in the multi-layer polymer structure. The multi-layer chips in the multi-layer polymer structure can be connected to each other or to an external circuit through the on-chip metal bumps, the intra-chip metal bumps and the patterned metal layers. The system-in packages can be connected to external circuits through solder bumps, meal bumps or wirebonded wires.

20 Claims, 120 Drawing Sheets

OTHER PUBLICATIONS

Ishino, M. et al.; "Latest ASET Activities for System-Integration R&D in Japan"; ASET; Sep. 2001; pp. 1-26.

Iwasaki, T. et al.; Development of 30 Micron Pitch Bump Interconnections for COC-FCBGA; 2006; IEEE; pp. 1216-1222.

Kawano, M. et al.; "A 3D Packaging Technology for 4 Gbit Stacked DRAM With 3 Gbps Data Transfer"; NEC Electronics; downloaded Jul. 8, 2010 from IEEE Xplore; pp. 1-4.

Koyanagi, M. et al.; "Neuromorphic Vision Chip Fabricated Using Three-Dimensional Integration Technology"; IEEE International Solid-State Circuits Conference; 2001; pp. 1-3.

Koyanagi, M. et al.; "Three-Dimension Integration Technology Based on Wafer Bonding With Vertical Buried Interconnections"; downloaded Mar. 8, 2010; IEEE Xplore; pp. 2799-2808.

Kurino H., et al.; "Intelligent Image Sensor Chip With Three Dimensional Structure"; downloaded Jul. 8, 2010 from IEEE Xplore (IEDM 99); pp. 879-882.

Kurino, H. et al.; "Three-Dimensional Integration Technology for Real Time Micro-Vision System"; downloaded Dec. 17, 2009; IEEE Xplore; pp. 203-212.

Lee, K.W. et al.; Three-Dimensional Shared Memory Fabricated Using Wafer Stacking Technology; Dept. of Machine Intelligence and System Engineering; Tohoku University; downloaded Jul. 8, 2010 from IEEE Xplore; pp. 165-168.

Mitsuhashi, T. et al.; "Development of 3D-Packaging Process Technology for Stacked Memory Chips"; Mater. Res. Soc. Symp. vol. 970; 2007; pp. 1-8.

Ono, T., et al.; "Three-Dimensional Processor System Fabricated by Wafer Stacking Technology"; Dept. of Machine Intelligence and System Engineering; Tohoku University; 2002 Cool Chips V (Apr. 19, 2002) pp. 1-9.

Prismark Partners LLC; "3D Packaging: PoP, TSS/TSV, Face to Face Bonding"; Sep. 9, 2009; pp. 1-128.

Reif, R. et al. Fabrication Technologies for Three-Dimensional Integrated Circuites; downloaded Jul. 20, 2010; IEEE Xplore; pp. 1-5.

Swinnen, B. et al; "Introduction to IMEC's Research Programs on 3D-Technology 3D-WLP/3D-SIC"; imec; 2007; pp. 1-72.

Yarema R.; "3D Technology Issues and On-Going Developments at FNAL"; ILC Vertec Workshop; Apr. 23, 2008; Mennagio, Italy; pp. 1-47.

Yarema, R.; "Development of 3D Integrated Circuits for HEP"; 12th LHC Electronics Workshop; Sep. 25-29, 2006; Valencia, Spain; pp. 1-51.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

International Search Report and Written Opinion for International Application No. PCT/US2010/034815, International Searching Authority, mailed Aug. 23, 2010.

* cited by examiner

SYSTEM-IN PACKAGES

RELATED APPLICATION

This application claims priority to U.S. provisional application No. 61/178,493, filed on May 14, 2009, which is herein incorporated by reference in its entirety.

BACKGROUND OF THE DISCLOSURE

1. Field of the Disclosure

The disclosure relates to system-in packages, and more particularly, to system-in packages that utilize on-chip metal bumps and intra-chip metal bumps for electrical interconnection between stacked chips.

2. Brief Description of the Related Art

Semiconductor wafers are processed to produce IC (integrated circuit) chips having ever-increasing device density and shrinking feature geometries. Multiple conductive and insulating layers are required to enable the interconnection and isolation of the large number of semiconductor devices in different layers (e.g., active and passive devices, such as TFT, CMOS, capacitors, inductors, resistors, etc). Such large scale integration results in an increasing number of electrical connections between various layers and semiconductor devices. It also leads to an increasing number of leads to the resultant IC chip. These leads are exposed through a passivation layer of the IC chip, terminating in I/O pads that allow connections to external contact structures in a chip package.

Wafer-Level Packaging (WLP) commonly refers to the technology of packaging an IC chip at wafer level, instead of the traditional process of assembling the package of each individual unit after wafer dicing. WLP allows for the integration of wafer fabrication, packaging, test, and burn-in at the wafer level, before being singulated by dicing for final assembly into a chip carrier package, e.g., a ball grid array (BGA) package. The advantages offered by WLP include less size (reduced footprint and thickness), lesser weight, relatively easier assembly process, lower overall production costs, and improvement in electrical performance. WLP therefore streamlines the manufacturing process undergone by a device from silicon start to customer shipment. While WLP is a high throughput and low cost approach to IC chip packaging, it however invites significant challenges in manufacturability and structural reliability.

SUMMARY OF THE DISCLOSURE

The present disclosure is directed to system-in packages or multichip modules (MCMs) that include multi-layer chips in a multi-layer polymer structure, on-chip metal bumps on the multi-layer chips, intra-chip metal bumps in the multi-layer polymer structure, and patterned metal layers in the multi-layer polymer structure. The multi-layer chips in the multi-layer polymer structure can be connected to each other or to an external circuit or structure, such as mother board, ball-grid-array (BGA) substrate, printed circuit board, metal substrate, glass substrate or ceramic substrate, through the on-chip metal bumps, the intra-chip metal bumps and the patterned metal layers. The system-in packages or multichip modules can be connected to the external circuit or structure through solder bumps, meal bumps or wirebonded wires.

Exemplary embodiments of the present disclosure provide system-in packages or multichip module having multi-layer chips in a multi-layer polymer structure and using metal bumps on the multi-layer chips and in the multi-layer polymer structure for electrical interconnection between the chips.

Exemplary embodiments of the present disclosure provide a method which includes adhering chips with on-chip metal bumps to a substrate with intra-chip metal bumps, then encapsulating the chips and the substrate, then polishing or grinding to expose both the on-chip and the intra-chip metal bumps, then forming metal interconnections on the polished or ground surface, and then repeating the above processes for integrating the second, third, forth, and etc. tier chips.

Furthermore, exemplary embodiments can provide for ease for manufacturing multi-layer chip integration with good electromagnetic field shield and high routing density between chips due to fine-pitched intra-chip metal bumps and on-chip metal bumps.

Furthermore, exemplary embodiments can provide manufacturing multi-layer chip integration with high silicon utilization.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
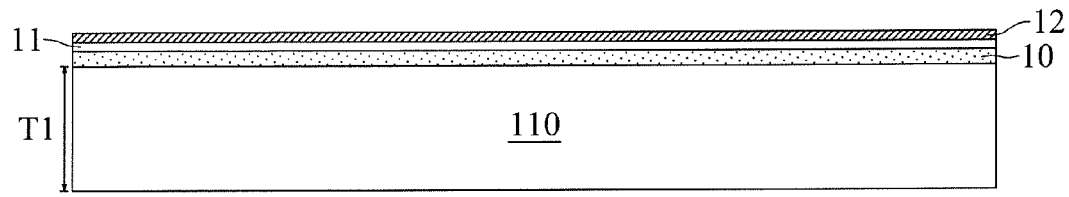
FIGS. 1-9, 11-36 and 38-52 are cross-sectional views showing a process of forming a system-in package or multichip module, according to an embodiment of the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Aspects of the present disclosure are directed to system-in packages or multichip modules (MCMs) that include multi-layer chips in a multi-layer polymer structure, on-chip metal bumps on the multi-layer chips, intra-chip metal bumps in the multi-layer polymer structure, and patterned metal layers in the multi-layer polymer structure. The multi-layer chips in the multi-layer polymer structure can be connected to each other or to an external circuit or structure, such as mother board, ball-grid-array (BGA) substrate, printed circuit board, metal substrate, glass substrate and/or ceramic substrate, through the on-chip metal bumps, the intra-chip metal bumps, and/or the patterned metal layers. The system-in packages or multichip modules can be connected to the external circuit or structure through solder bumps, meal bumps, and/or wirebonded wires.

Figure 52:
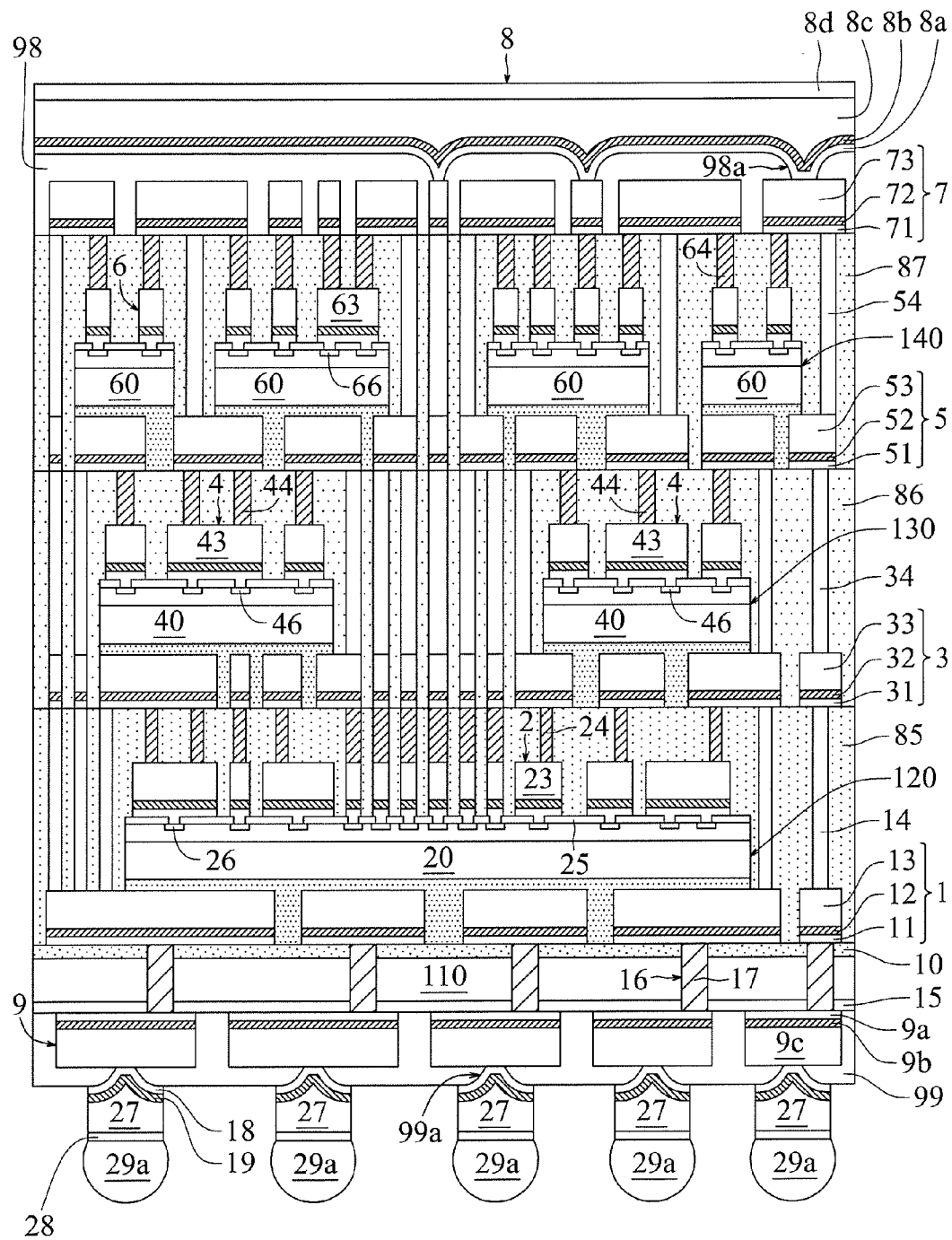

FIGS. 1-52 show a process for forming a system-in package or multichip module according to an exemplary embodiment of the present disclosure.

Referring to FIG. 1, a dielectric or insulating layer 10 having a suitable thickness, e.g., between 0.3 and 30 micrometers, and preferably between 1 and 10 micrometers, can be formed on a top surface of a substrate 110 by using a chemical-vapor deposition (CVD) process, a spin-coating process or a lamination process. Next, an adhesion layer 11 having a thickness, e.g., less than 1 micrometer, such as between 1 nanometer and 0.5 micrometers, can be formed on the dielectric or insulating layer 10 by using a physical-vapor deposition (PVD) process, such as sputtering process or evaporation process, or a chemical-vapor deposition (CVD) process. Next, a seed layer 12 having a thickness, e.g., less than 1 micrometer, such as between 10 nanometers and 0.8 micrometers, can be formed on the adhesion layer 11 by using a physical-vapor deposition (PVD) process, such as sputtering process or evaporation process, a chemical-vapor deposition (CVD) process, or an electroless plating process.

The substrate 110 can have a suitable thickness, T1, for example, between about 10 and about 1,000 micrometers, between 10 and 100 micrometers or between 100 and 500 micrometers. The substrate 110 can be made of a suitable material, examples of which include, but are not limited to, silicon, glass, ceramic, aluminum, copper or organic polymer. For example, the substrate 110 can be a silicon substrate, a glass substrate, a ceramic substrate, a metal substrate, an organic substrate or a polymer substrate having thickness, e.g., T1 between 10 and 1,000 micrometers, between 10 and 100 micrometers, or between 100 and 500 micrometers. Alternatively, the substrate 110 can be a wafer, such as silicon wafer, including lower-tier chips.

The dielectric or insulating layer 10 can be made of a suitable material. For example, the dielectric or insulating layer 10 can be made of silicon dioxide ($SiO_2$), silicon nitride, silicon oxynitride, silicon carbon nitride, polyimide, epoxy, benzocyclobutane (BCB), polybenzoxazole (PBO), polyphenylene oxide (PPO), silosane or SU-8 having a suitable thickness, e.g., between 0.3 and 30 micrometers, and preferably between 1 and 10 micrometers.

The adhesion layer 11 can be made of suitable material. For example, the material of the adhesion layer 11 may include titanium, a titanium-tungsten alloy, titanium nitride, chromium, tantalum, tantalum nitride, nickel, or nickel vanadium. The seed layer may be made of suitable material. For example, the material of the seed layer 12 may include copper, titanium-copper alloy, silver, gold, nickel, aluminum, platinum, or palladium.

For example, when the adhesion layer 11 is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the dielectric or insulating layer 10, the seed layer 12 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the titanium-containing layer.

Alternatively, when the adhesion layer 11 is formed by sputtering a tantalum-containing layer, such as a single layer of tantalum or tantalum nitride, having a thickness, e.g., less than 1 micrometer, such as between 1 nanometer and 0.5 micrometers, on the dielectric or insulating layer 10, the seed layer 12 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the tantalum-containing layer.

Alternatively, when the adhesion layer 11 is formed by sputtering a chromium-containing layer, such as a single layer of chromium, having a thickness, e.g., less than 1 micrometer, such as between 1 nanometer and 0.5 micrometers, on the dielectric or insulating layer 10, the seed layer 12 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the chromium-containing layer.

Alternatively, when the adhesion layer 11 is formed by sputtering a nickel-containing layer, such as a single layer of nickel or nickel vanadium, having a thickness, e.g., less than 1 micrometer, such as between 1 nanometer and 0.5 micrometers, on the dielectric or insulating layer 10, the seed layer 12 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the nickel-containing layer.

Figure 2:
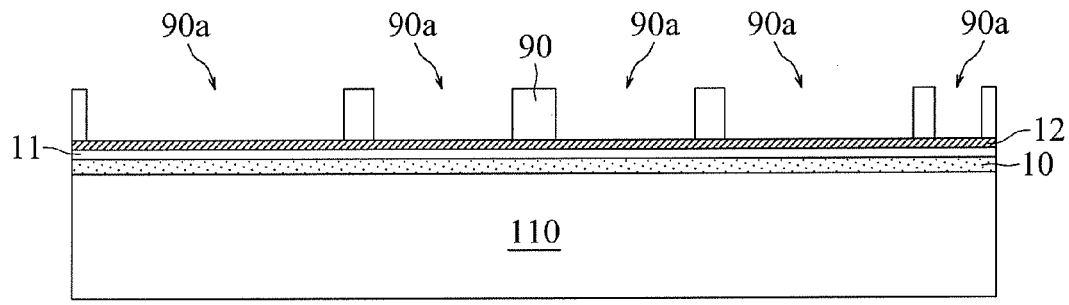

Referring to FIG. 2, after forming the seed layer 12, a photoresist layer 90, such as positive-type photoresist layer or negative-type photoresist layer (preferred), can be formed on the seed layer 12 of any previously described material by using a spin-on coating process or a lamination process. Next, the photoresist layer 90 is patterned with processes of lithographic, light exposure and development to form multiple openings 90a in the photoresist layer 90 exposing the seed layer 12 of any previously described material.

Figure 3:
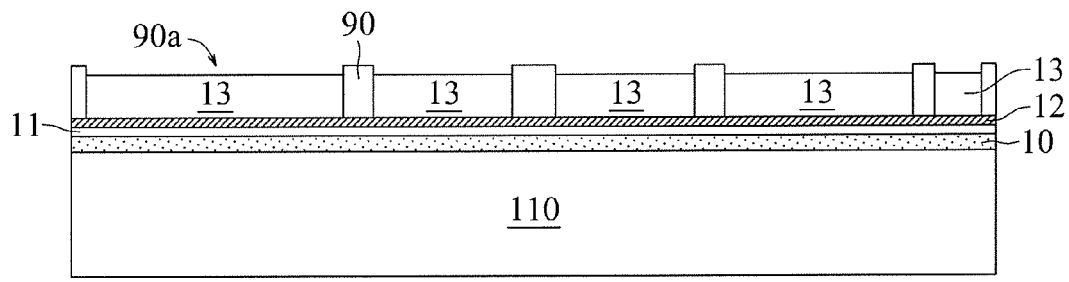

Next, referring to FIG. 3, a metal layer 13, a conductive layer, having a suitable thickness, e.g., greater than 1 micrometer, such as between 2 and 30 micrometers, and preferably between 3 and 10 micrometers, can be formed on the seed layer 12 exposed by the openings 90a and in the openings 90a by using an electroplating or electroless plating process. The metal layer 13 can be a single layer of copper, silver, gold, palladium, platinum, rhodium, ruthenium, rhenium or nickel, or a composite layer made of the previously described metals.

For example, the metal layer 13 can be a single metal layer formed by electroplating a copper layer, to a desired thickness, e.g., greater than 1 micrometer, such as between 2 and 30 micrometers, and preferably between 3 and 10 micrometers, in the openings 90a and on the seed layer 12, preferably the previously described copper or titanium-copper-alloy seed layer 12, exposed by the openings 90a.

Alternatively, the metal layer 13 can be a single metal layer formed by electroplating a gold layer, to a desired thickness, e.g., greater than 1 micrometer, such as between 2 and 30 micrometers, and preferably between 3 and 10 micrometers, in the openings 90a and on the seed layer 12, preferably the previously described gold seed layer 12, exposed by the openings 90a.

Alternatively, the metal layer 13 can be a single metal layer formed by electroplating a nickel layer, to a suitable thickness, e.g., greater than 1 micrometer, such as between 2 and 30 micrometers, and preferably between 3 and 10 micrometers, in the openings 90a and on the seed layer 12, preferably the previously described copper, nickel or titanium-copper-alloy seed layer 12, exposed by the openings 90a.

Alternatively, the metal layer 13 can be composed of two (or, double) metal layers formed by electroplating a nickel layer, to a suitable thickness, e.g., greater than 1 micrometer, such as between 2 and 30 micrometers, and preferably between 3 and 10 micrometers, in the openings 90a and on the seed layer 12, preferably the previously described copper, nickel or titanium-copper-alloy seed layer 12, exposed by the openings 90a, and then electroplating or electroless plating a gold layer or a palladium layer, to a suitable thickness, e.g., between 0.005 and 10 micrometers, and preferably between 0.05 and 1 micrometers, in the openings 90a and on the electroplated nickel layer in the openings 90a.

Alternatively, the metal layer 13 can be composed of three (or, triple) metal layers formed by electroplating a copper layer, to a thickness, e.g., greater than 1 micrometer, such as between 2 and 30 micrometers, and preferably between 3 and 10 micrometers, in the openings 90a and on the seed layer 12, preferably the previously described copper or titanium-copper-alloy seed layer 12, exposed by the openings 90a, next electroplating or electroless plating a nickel layer, to a thickness, e.g., between 1 and 15 micrometers or between 0.3 and 1 micrometers, in the openings 90a and on the electroplated copper layer in the openings 90a, and then electroplating or electroless plating a gold layer or a palladium layer, to a thickness, e.g., between 0.005 and 1 micrometers, and preferably between 0.05 and 0.1 micrometers, in the openings 90a and on the electroplated or electroless plated nickel layer in the openings 90a.

Figure 4:
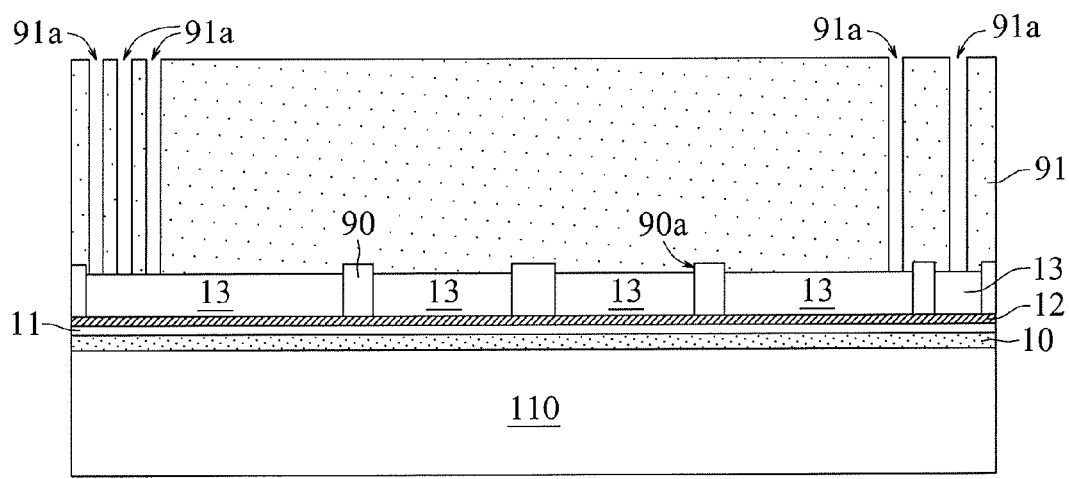

Referring to FIG. 4, after forming the metal layer 13, a photoresist layer 91, such as positive-type photoresist layer or negative-type photoresist layer (which is preferred), having a thickness, e.g., greater than 1 micrometer can be formed on the photoresist layer 90 and on the metal layer 13 by a spin-on coating process or a lamination process. Next, the photoresist layer 91 is patterned with processes of lithographic, light exposure and development to form multiple cylindrical openings 91a in the photoresist layer 91 exposing multiple contact points of the metal layer 13.

Figure 5:
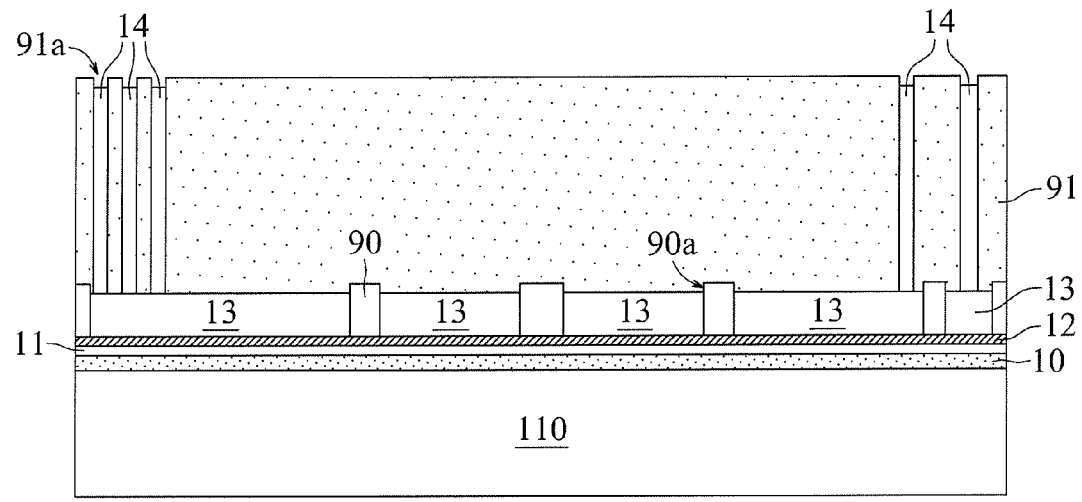

Next, referring to FIG. 5, multiple metal pillars or bumps 14 (intra-chip metal pillars or bumps) having a thickness, e.g., or height greater than 15 micrometers, such as between 15 and 520 micrometers, and preferably between 20 and 110 micrometers, are formed in the cylindrical openings 91a and on the contact points of the metal layer 13 exposed by the cylindrical openings 91a using an electroplating or electroless plating process. The metal pillars or bumps 14 can be composed of a single layer, e.g., of copper, silver, gold, palladium, platinum, rhodium, ruthenium, rhenium or nickel, or a composite layer made of the previously described metals.

For example, the metal pillars or bumps 14 can be composed of a single metal layer formed by electroplating a copper layer, to a thickness, e.g., greater than 15 micrometers, such as between 15 and 520 micrometers, and preferably between 20 and 110 micrometers, in the cylindrical openings 91*a* and on the contact points of the metal layer 13, preferably the previously described copper layer 13, exposed by the cylindrical openings 91*a*.

Alternatively, the metal pillars or bumps 14 can be composed of a single metal layer formed by electroplating a gold layer, to a thickness, e.g., greater than 15 micrometers, such as between 15 and 520 micrometers, and preferably between 20 and 110 micrometers, in the cylindrical openings 91*a* and on the contact points of the metal layer 13, preferably the previously described gold layer 13, exposed by the cylindrical openings 91*a*.

Alternatively, the metal pillars or bumps 14 can be composed of a single metal layer formed by electroplating a nickel layer, to a thickness, e.g., greater than 15 micrometers, such as between 15 and 520 micrometers, and preferably between 20 and 110 micrometers, in the cylindrical openings 91*a* and on the contact points of the metal layer 13, preferably the previously described nickel or copper layer 13, exposed by the cylindrical openings 91*a*.

Alternatively, the metal pillars or bumps 14 can be composed of three (or, triple) metal layers formed by electroplating a copper layer, to a thickness, e.g., greater than 10 micrometers, such as between 15 and 500 micrometers, and preferably between 20 and 100 micrometers, in the cylindrical openings 91*a* and on the contact points of the metal layer 13, preferably the previously described copper layer 13, exposed by the cylindrical openings 91*a*, next electroplating or electroless plating a nickel layer, to a thickness, e.g., between 1 and 15 micrometers or between 0.3 and 1 micrometers, in the cylindrical openings 91*a* and on the electroplated copper layer in the cylindrical openings 91*a*, and then electroplating or electroless plating a gold layer or a palladium layer, to a thickness, e.g., between 0.005 and 1 micrometers, and preferably between 0.05 and 0.1 micrometers, in the cylindrical openings 91*a* and on the electroplated or electroless plated nickel layer in the cylindrical openings 91*a*.

Figure 6:
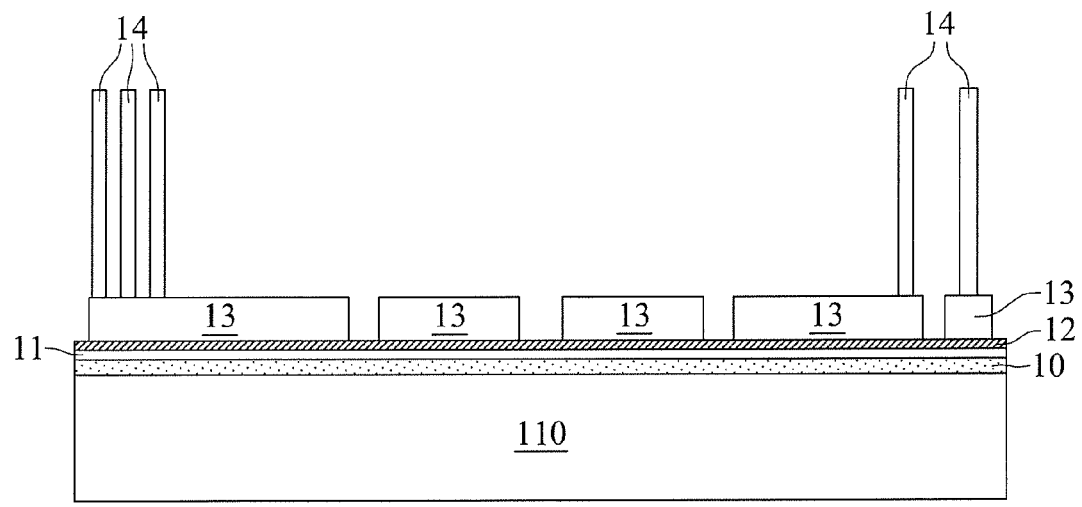

Referring to FIG. 6, after forming the metal pillars or bumps 14, the photoresist layers 90 and 91 are removed using a chemical solution containing amine or NaCO$_3$. Accordingly, the metal pillars or bumps 14 can be formed on the metal layer 13 after the photoresist layers 90 and 91 are removed.

Alternatively, another process for forming the metal pillars or bumps 14 on the metal layer 13 can be performed by the following steps. First, the photoresist layer 90 is removed using a chemical solution containing amine or NaCO$_3$ after forming the metal layer 13 illustrated in FIG. 3. Next, the photoresist layer 91 illustrated in FIG. 4 can be formed on the metal layer 13 and on the seed layer 12 by a spin-on coating process or a lamination process. Next, the photoresist layer 91 is patterned with the processes of lithographic, light exposure and development to form the cylindrical openings 91*a* in the photoresist layer 91 exposing the contact points of the metal layer 13. Next, the metal pillars or bumps 14 can be formed in the cylindrical openings 91*a* and on the contact points of the metal layer 13 exposed by the cylindrical openings 91*a* using an electroplating or electroless plating process, which can be referred to as the step illustrated in FIG. 5. Next, the photoresist layer 91 can be removed using a chemical solution containing amine or NaCO$_3$. Accordingly, the metal pillars or bumps 14 can be formed on the metal layer 13 after the photoresist layer 91 is removed.

Alternatively, the process steps illustrated in FIGS. 4 and 5 can be repeated (e.g., once more) for making higher metal bumps, if necessary. That is, another photoresist layer can be formed on the photoresist layer 91 using a spin-on coating process or a lamination process, next multiple cylindrical openings are formed in the another photoresist layer and expose the metal pillars or bumps 14, next additional metal bumps are formed on the metal pillars or bumps 14 exposed by the cylindrical openings in the another photoresist layer and in the cylindrical openings in the another photoresist layer using an electroplating or electroless plating process, and then the another photoresist layer and the photoresist layers 90 and 91 are removed using a chemical solution containing amine or NaCO$_3$. The additional metal bumps can be composed of a single layer of copper, silver, gold, palladium, platinum, rhodium, ruthenium, rhenium or nickel, or a composite layer made of the previously described metals.

Figure 7:
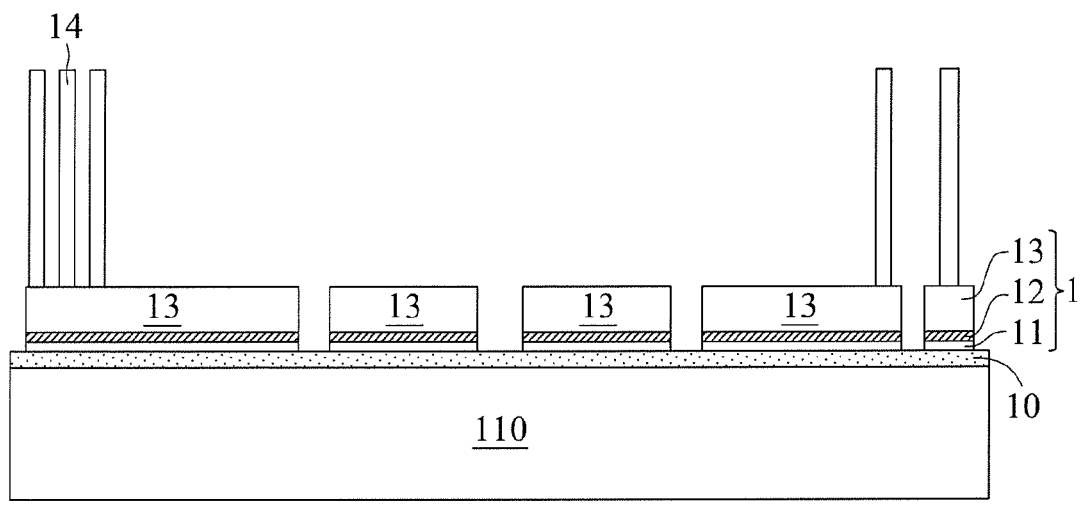

Referring to FIG. 7, after removing the photoresist layers 90 and 91, the seed layer 12 not under the metal layer 13 can be removed by using a wet chemical etching process or a reactive ion etching (RIE) process, and then the adhesion layer 11 not under the metal layer 13 can be removed by a suitable process such as by using a wet chemical etching process or a reactive ion etching (RIE) process.

Accordingly, the adhesion layer 11, the seed layer 12 and the metal layer 13 can form a patterned metal layer 1 on the dielectric or insulating layer 10. The metal pillars or bumps 14 are formed on the metal layer 13 of the patterned metal layer 1. The pitch between neighboring or adjacent pairs of metal pillars or bumps 14 can be designed as desired, e.g., greater than 100 micrometers, such as between 100 and 250 micrometers, or less than 100 micrometers, such as between 5 and 50 micrometers or between, 50 and 100 micrometers. Each of the metal pillars or bumps 14 may have a suitable width or diameter, e.g., greater than 5 micrometers, such as between 5 and 300 micrometers, and preferably between 5 and 50 micrometers. The patterned metal layer 1 may include a signal trace, a power interconnect, such as power plane, power bus or power trace, or a ground interconnect, such as ground plane, ground bus or ground trace, connecting multiple of the metal pillars or bumps 14. A coverage ratio of an area of the patterned metal layer 1 covering a top surface of the dielectric or insulating layer 10 to an area of the top surface ranges from 50% to 95%, and preferably ranges from 60% to 90%.

Figure 8:
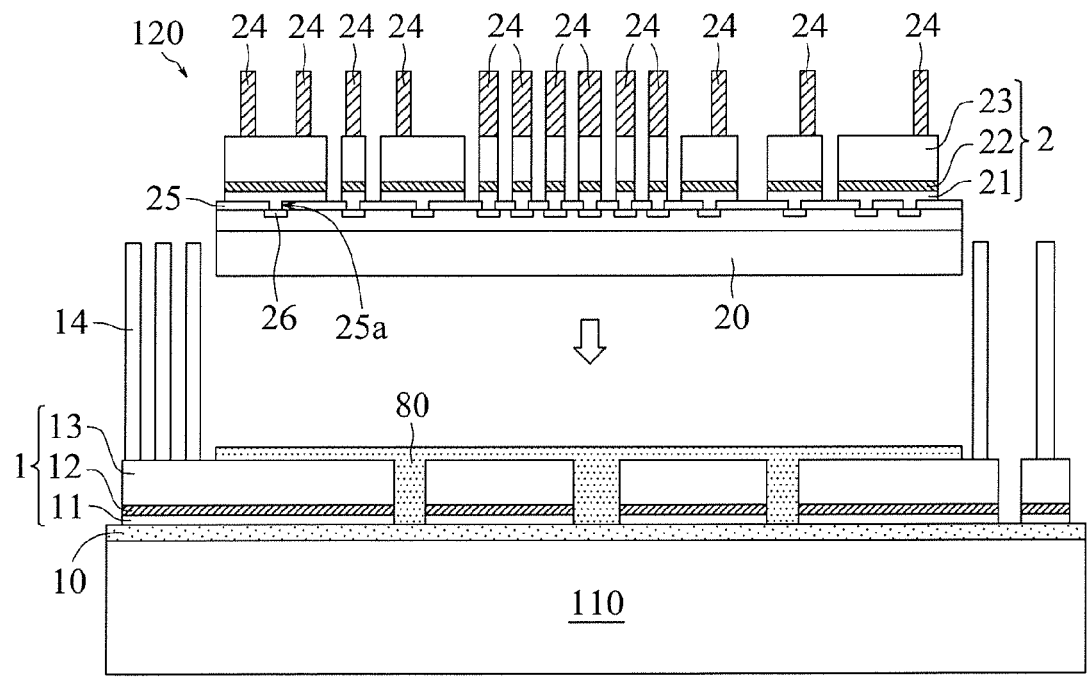
Figure 9:
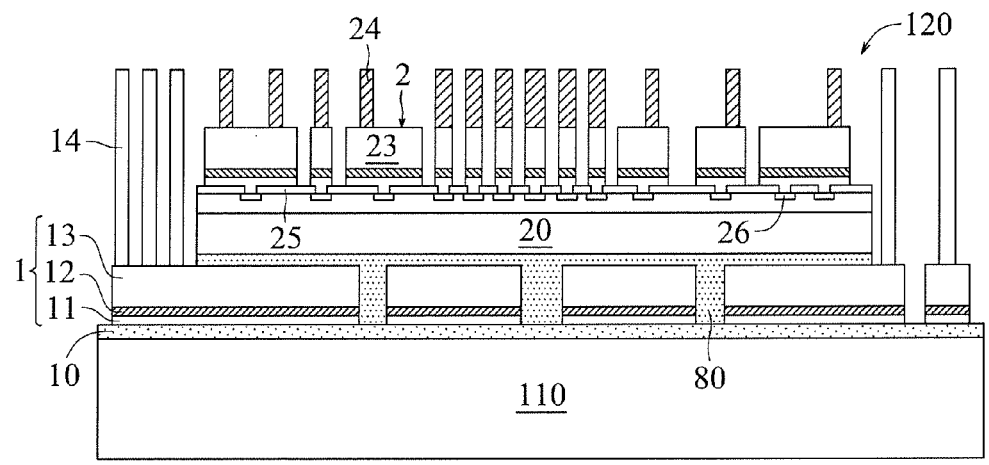

Next, referring to FIGS. 8 and 9, a glue (or, adhesive) material 80 can be formed on or applied to the metal layer 13 of the patterned metal layer 1 and on the dielectric or insulating layer 10 by using a dispensing process, a lamination process or a screen-printing process, and then one or more chips 120 (one of them is shown) can be attached to the metal layer 13 of the patterned metal layer 1 and to the dielectric or insulating layer 10 by the glue material 80.

Alternatively, another technique to attach the chips 120 is by first forming or applying the glue material 80 onto bottom surfaces of the chips 120 and then attaching the chips 120 to the metal layer 13 of the patterned metal layer 1 and to the dielectric or insulating layer 10 through the glue material 80 using, e.g., a thermal compression process.

Alternatively, after the step illustrated in FIG. 7, a polymer layer may be formed on the metal layer 13 of the patterned metal layer 1 and on the dielectric or insulating layer 10, and then the chips 120 can be attached to the polymer layer by the glue material 80. The polymer layer can be a polyimide layer or a benzocyclobutene layer having a suitable thickness, e.g., between 2 and 30 micrometers. The glue material 80 can be formed on the polymer layer, and the chips 120 can be formed on the glue material 80.

Examples of suitable glue or adhesive material 80 include, but are not limited to, epoxy, polyimide, benzocyclobutane (BCB), polybenzoxazole (PBO), poly-phenylene oxide (PPO), silosane or SU-8, and may have a suitable thickness, e.g., greater than or equal to 3 micrometers, such as between 3 and 100 micrometers, and preferably between 5 and 50 micrometers or between 10 and 30 micrometers.

Each of the chips 120 can include a semiconductor substrate 20, multiple transistors, such as NMOS transistors, PMOS transistors or bipolar transistors, in and/or over the semiconductor substrate 20, multiple fine-line metal layers over the semiconductor substrate 20, multiple dielectric layers over the semiconductor substrate 20 and between the fine-line metal layers, multiple via plugs of copper or tungsten in the dielectric layers, a passivation layer 25 over the semiconductor substrate 20, over the transistors, over the dielectric layers and over the fine-line metal layers, a patterned metal layer 2 on the passivation layer 25, and multiple metal pillars or bumps 24 (on-chip metal pillars or bumps) on the patterned metal layer 2. In each of the chips 120, a coverage ratio of an area of the patterned metal layer 2 covering a top surface of the passivation layer 25 to an area of the top surface can range from, for example, 50% to 95%, and preferably ranges from 60% to 90%. The transistors can be provided for NOR gates, NAND gates, AND gates, OR gates, flash memory cells, static random access memory (SRAM) cells, dynamic random access memory (DRAM) cells, non-volatile memory cells, erasable programmable read-only memory (EPROM) cells, read-only memory (ROM) cells, magnetic random access memory (MRAM) cells, sense amplifiers, inverters, operational amplifiers, adders, multiplexers, diplexers, multipliers, analog-to-digital (A/D) converters, digital-to-analog (D/A) converters, analog circuits, complementary-metal-oxide-semiconductor (CMOS) sensors, and/or charge coupled devices (CCD) or the like. The dielectric layers can be composed of a single layer of silicon oxide, silicon nitride, silicon oxynitride, silicon carbon nitride or silicon oxycarbide, or a composite layer made of the previously described materials. The fine-line metal layers may include aluminum, aluminum-copper-alloy, electroplated copper or other suitable metallic materials.

In each of the chips 120, multiple metal traces or pads 26 provided by the topmost fine-line metal layer are formed over the semiconductor substrate 20, on one of the dielectric layers and under the passivation layer 25. Multiple openings 25a in the passivation layer 25 are over multiple contact points of the metal traces or pads 26 and expose them, and the contact points of the metal traces or pads 26 are at bottoms of the openings 25a. Each of the openings 25a may have a suitable width or diameter, e.g., between 0.5 and 100 micrometers, and preferably between 1 and 20 micrometers. The patterned metal layer 2 of each chip 120 can be formed on the contact points, exposed by the openings 25a, of the metal traces or pads 26 and on the passivation layer 25, and can be connected to the contact points, exposed by the openings 25a, of the metal traces or pads 26 through the openings 25a. The metal traces or pads 26 may include aluminum, aluminum-copper-alloy or electroplated copper.

Each of the chips 120 can have multiple circuit interconnects, provided by the fine-line metal layers and the via plugs, between the semiconductor substrate 20 and the passivation layer 25. The circuit interconnects may have a suitable thickness, e.g., between 10 nanometers and 2 micrometers, and may include, e.g., aluminum, aluminum-copper-alloy, electroplated copper or tungsten.

Alternatively, each of the chips 120 may further include multiple carbon nanotube interconnects between the semiconductor substrate 20 and the passivation layer 25, and an organic polymer layer with a suitable thickness, e.g., greater than 3 micrometers, such as between 3 and 20 micrometers, and preferably between 5 and 12 micrometers, on the passivation layer 25. Multiple openings in the organic polymer layer are over the contact points, exposed by the openings 25a in the passivation layer 25, of the metal traces or pads 26 and expose the contact points. The organic polymer layer can be made of a suitable material or materials, examples of which include, but are not limited to, polyimide, benzocyclobutane (BCB), polybenzoxazole (PBO), poly-phenylene oxide (PPO), silosane, SU-8 or epoxy. In this case, each of the chips 120 has the patterned metal layer 2 formed on the contact points of the metal traces or pads 26, on the organic polymer layer and over the passivation layer 25, and connected to the contact points of the metal traces or pads 26 through the openings in the organic polymer layer and through the openings 25a in the passivation layer 25. Each of the chips 120 may have the circuit interconnects connected to the transistors through the carbon nanotube interconnects.

The semiconductor substrate 20 may be made from a suitable substrate such as a silicon substrate or a gallium arsenide (GaAs) substrate. The substrate 20 may have a suitable thickness, e.g., greater than 1 micrometer, such as between 1 and 30 micrometers, between 2 and 10 micrometers, between 5 and 50 micrometers, between 10 and 100 micrometers or between 10 and 500 micrometers.

The passivation layer 25 can be formed by a suitable process or processes, e.g., a chemical vapor deposition (CVD) method. The passivation layer 25 can have a suitable thickness, for example, greater than 0.2 micrometers, such as between 0.3 and 1.5 micrometers. The passivation layer 25 can be made of silicon oxide (such as $SiO_2$), silicon nitride (such as $Si_3N_4$), silicon oxynitride, silicon oxycarbide, phosphosilicate glass (PSG), silicon carbon nitride or a composite of the previously described materials. The passivation layer 25 can include or be composed of one or more inorganic layers. For example, the passivation layer 25 can be composed of an oxide layer, such as silicon oxide or silicon oxycarbide, having a thickness, e.g., between 0.2 and 1.2 micrometers and a nitride layer, such as silicon nitride, silicon oxynitride or silicon carbon nitride, having a thickness, e.g., between 0.2 and 1.2 micrometers on the oxide layer. Alternatively, the passivation layer 25 can be a single layer of silicon nitride, silicon oxynitride or silicon carbon nitride having a thickness, e.g., between 0.3 and 1.5 micrometers. For exemplary embodiments, the passivation layer 25 in one of the chips 120 can include a topmost inorganic layer of the one of the chips 120. For example, the topmost inorganic layer of the one of the chips 120 can be a layer of a nitrogen-containing compound, such as silicon nitride, silicon oxynitride, silicon carbon nitride or silicon carbon oxynitride, having a suitable thickness, e.g., greater than 0.2 micrometers, such as between 0.2 and 1.5 micrometers, or a layer of an oxygen-containing compound, such as silicon oxide, silicon oxynitride, silicon carbon oxide or silicon carbon oxynitride, having a suitable thickness, e.g., greater than 0.2 micrometers, such as between 0.2 and 1.5 micrometers.

Each of the chips 120 can have multiple metal interconnects or traces provided by the patterned metal layer 2 and formed on the contact points of the metal traces or pads 26 and on the passivation layer 25. And each of the chips 120 has the metal pillars or bumps 24 formed on the metal interconnects or traces and connected to the contact points of the metal traces or pads 26 through the metal interconnects or traces and through the openings 25a in the passivation layer 25. The metal interconnects or traces can be signal traces, power planes, power buses, power traces, ground planes, ground buses or ground traces. For example, in each of the chips 120, one of the contact points of the metal traces or pads 26 can be connected to another one of the contact points of the metal traces or pads 26 through one of the metal interconnects or traces, and one or more of the metal pillars or bumps 14 on the one of the metal interconnects or traces can be connected to the two contact points of the two metal traces or pads 26 through the one of the metal interconnects or traces. And a gap is between the two metal traces or pads 26 providing the two contact points connected to each other through the one of the metal interconnects or traces provided by the patterned metal layer 2.

Each of the chips 120 can have patterned metal layer 2 composed of an adhesion layer 21 on the contact points of the metal traces or pads 26 and on the passivation layer 25 or organic polymer layer, a seed layer 22 on the adhesion layer 21, and a metal layer 23 on the seed layer 22, and has the metal pillars or bumps 24 formed on the metal layer 23 of the patterned metal layer 2 and connected to the contact points of the metal traces or pads 26 through the patterned metal layer 2 and through the openings 25a in the passivation layer 25.

The adhesion layer 21 may have a suitable thickness, e.g., less than 1 micrometer, such as between 1 nanometer and 0.5 micrometers, and preferably between 1 nanometer and 0.1 micrometers. The seed layer 22 may have a thickness, e.g., less than 1 micrometer, such as between 10 nanometers and 0.8 micrometers, and preferably between 20 nanometer and 0.5 micrometers. The material of the adhesion layer 21 may include titanium, a titanium-tungsten alloy, titanium nitride, chromium, tantalum, tantalum nitride, nickel or nickel vanadium. The material of the seed layer 22 may include copper, titanium-copper alloy, silver, gold, nickel, aluminum, platinum or palladium.

For example, when the adhesion layer 21 is a titanium-containing layer, such as a single layer of titanium-tungsten alloy, titanium or titanium nitride, having a thickness, e.g., less than 1 micrometer, such as between 1 nanometer and 0.5 micrometers, and preferably between 1 nanometer and 0.1 micrometers, on the contact points of the metal traces or pads 26 and on the passivation layer 25 or organic polymer layer, the seed layer 22 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the titanium-containing layer.

Alternatively, when the adhesion layer 21 is a tantalum-containing layer, such as a single layer of tantalum or tantalum nitride, having a thickness, e.g., less than 1 micrometer, such as between 1 nanometer and 0.5 micrometers, and preferably between 1 nanometer and 0.1 micrometers, on the contact points of the metal traces or pads 26 and on the passivation layer 25 or organic polymer layer, the seed layer 22 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the tantalum-containing layer.

Alternatively, when the adhesion layer 21 is a chromium-containing layer, such as a single layer of chromium, having a thickness, e.g., less than 1 micrometer, such as between 1 nanometer and 0.5 micrometers, and preferably between 1 nanometer and 0.1 micrometers, on the contact points of the metal traces or pads 26 and on the passivation layer 25 or organic polymer layer, the seed layer 22 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the chromium-containing layer.

Alternatively, when the adhesion layer 21 is a nickel-containing layer, such as a single layer of nickel or nickel vanadium, having a thickness, e.g., less than 1 micrometer, such as between 1 nanometer and 0.5 micrometers, and preferably between 1 nanometer and 0.1 micrometers, on the contact points of the metal traces or pads 26 and on the passivation layer 25 or organic polymer layer, the seed layer 22 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the nickel-containing layer.

The metal layer 23 may have a thickness, e.g., greater than 1 micrometer, such as between 2 and 30 micrometers, and preferably between 3 and 10 micrometers. Sidewalls of the metal layer 23 are not covered by the adhesion layer 21 and the seed layer 22. The metal layer 23 can be a single layer of copper, silver, gold, palladium, platinum, rhodium, ruthenium, rhenium or nickel, or a composite layer made of the previously described metals.

For example, the metal layer 23 can be a single copper layer having a thickness, e.g., greater than 1 micrometer, such as between 2 and 30 micrometers, and preferably between 3 and 10 micrometers, on the seed layer 22, preferably the previously described copper or titanium-copper-alloy seed layer 22.

Alternatively, the metal layer 23 can be a single silver layer having a thickness, e.g., greater than 1 micrometer, such as between 2 and 30 micrometers, and preferably between 3 and 10 micrometers, on the seed layer 22, preferably the previously described silver seed layer 22.

Alternatively, the metal layer 23 can be a single gold layer having a thickness, e.g., greater than 1 micrometer, such as between 2 and 30 micrometers, and preferably between 3 and 10 micrometers, on the seed layer 22, preferably the previously described gold seed layer 22.

Alternatively, the metal layer 23 can be a single nickel layer having a thickness, e.g., greater than 1 micrometer, such as between 2 and 30 micrometers, and preferably between 3 and 10 micrometers, on the seed layer 22, preferably the previously described copper, nickel or titanium-copper-alloy seed layer 22.

Alternatively, the metal layer 23 can be composed of an electroplated copper layer having a thickness, e.g., greater than 1 micrometer, such as between 2 and 30 micrometers, and preferably between 3 and 10 micrometers, on the seed layer 22, preferably the previously described copper or titanium-copper-alloy seed layer 22, a nickel layer having a thickness, e.g., greater than 1 micrometer, such as between 1 and 15 micrometers, and preferably between 2 and 5 micrometers, on the electroplated copper layer, and a gold or palladium layer having a thickness, e.g., between 0.005 and 1 micrometers, and preferably between 0.05 and 0.1 micrometers, on the nickel layer.

Each of the metal pillars or bumps 24 has a suitable thickness, e.g., or height greater than 5 micrometers, such as between 5 and 50 micrometers, and preferably between 10 and 20 micrometers, and less than that of each of the metal pillars or bumps 14, and has a suitable width or diameter, e.g., between 5 and 100 micrometers, and preferably between 5 and 50 micrometers. The metal pillars or bumps 24 can be composed of a single layer of copper, silver, gold, palladium, platinum, rhodium, ruthenium, rhenium or nickel, or a composite layer made of the previously described metals.

For example, each of the chips 120 has the metal pillars or bumps 24 composed of a single copper layer having a thickness, e.g., greater than 5 micrometers, such as between 5 and 50 micrometers, and preferably between 10 and 20 micrometers, on the metal layer 23, preferably the previously described copper layer 23.

Alternatively, each of the chips 120 has the metal pillars or bumps 24 composed of a single silver layer having a thickness, e.g., greater than 5 micrometers, such as between 5 and 50 micrometers, and preferably between 10 and 20 micrometers, on the metal layer 23, preferably the previously described silver layer 23.

Alternatively, each of the chips 120 has the metal pillars or bumps 24 composed of a single gold layer having a thickness, e.g., greater than 5 micrometers, such as between 5 and 50 micrometers, and preferably between 10 and 20 micrometers, on the metal layer 23, preferably the previously described gold layer 23.

Alternatively, each of the chips 120 has the metal pillars or bumps 24 composed of a single nickel layer having a thickness, e.g., greater than 5 micrometers, such as between 5 and 50 micrometers, and preferably between 10 and 20 micrometers, on the metal layer 23, preferably the previously described copper or nickel layer 23.

Alternatively, each of the chips 120 has the metal pillars or bumps 24 can be composed of an electroplated copper layer having a thickness, e.g., greater than 5 micrometers, such as between 5 and 50 micrometers, and preferably between 10 and 20 micrometers, on the metal layer 23, preferably the previously described copper layer 23, a nickel layer having a thickness, e.g., greater than 1 micrometer, such as between 1 and 5 micrometers, on the electroplated copper layer, and a gold or palladium layer having a thickness, e.g., between 0.005 and 1 micrometers, and preferably between 0.05 and 0.1 micrometers, on the nickel layer.

Each chip 120 may include input/output (I/O) circuits serving for chip probing testing (CP testing), for build-in-self testing or for external signal connection, and one of the I/O circuits may have a total loading (total capacitance) between 15 pF (pico farad) and 50 pF. Each of the I/O circuits may include a driver, a receiver and/or an electro static discharge (ESD) circuit. Each of the chips 120 may have built-in self test (BIST) circuits for reducing the testing time for the system-in package or multichip module.

No matter where the chips 120 are provided, any one of the chips 120 can be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a wireless local area network (WLAN) chip, a memory chip, such as flash memory chip, dynamic-random-access-memory (DRAM) chip or statistic-random-access-memory (SRAM) chip, a logic chip, an analog chip, a power device, a regulator, a power management device, a global-positioning-system (GPS) chip, a "Bluetooth" chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processing-unit (CPU) circuit block, or a system-on chip (SOC) including a graphics-processing-unit (GPU) circuit block and a wireless local area network (WLAN) circuit block, but not including any baseband circuit block and any central-processing-unit (CPU) circuit block. Alternatively, any one of the chips 120 can be a chip including a central-processing-unit (CPU) circuit block designed by x86 architecture or by non x86 architecture, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block, and/or a modem circuit block.

Figure 10:
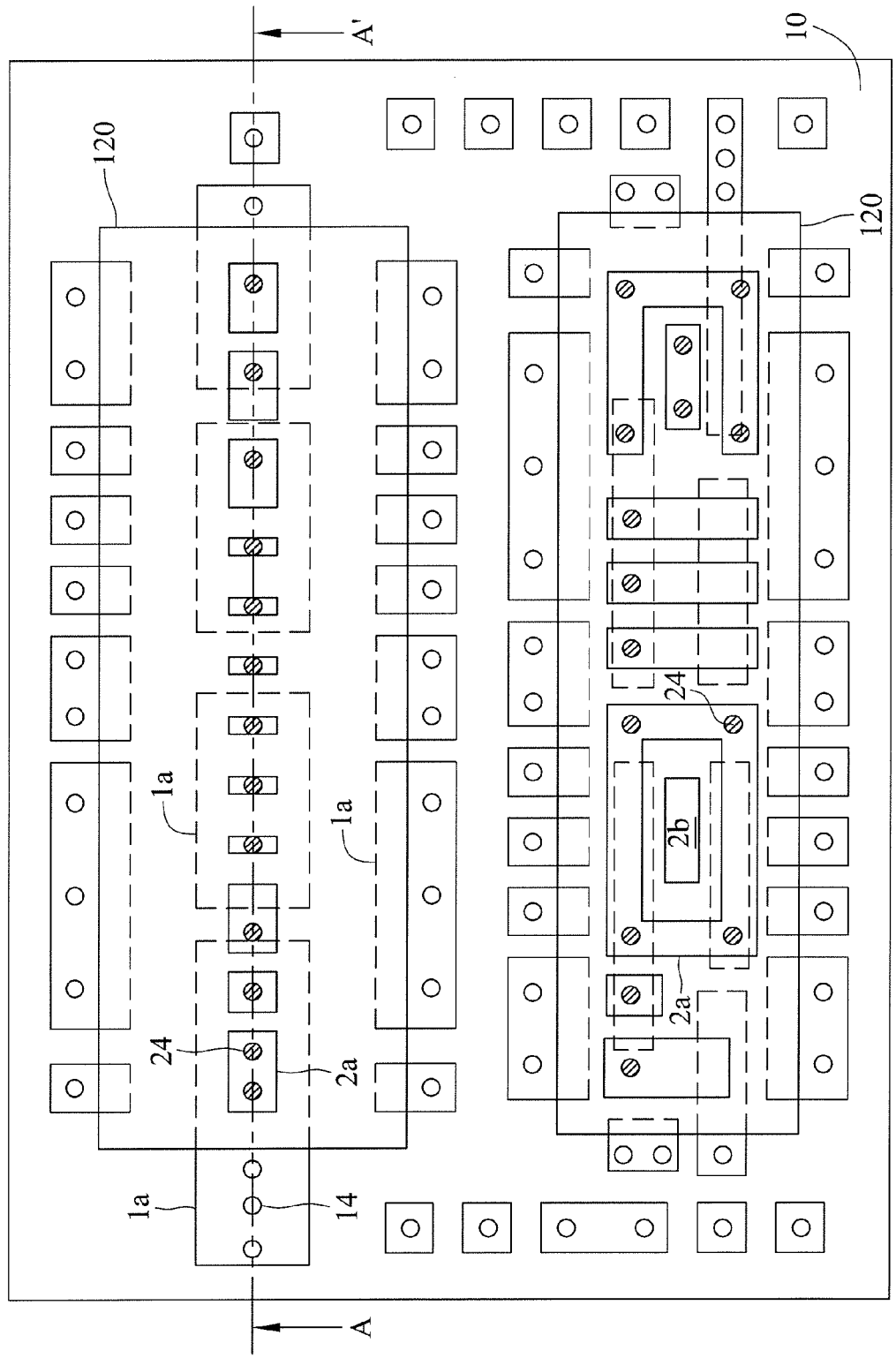
FIG. 10 is a schematic top perspective view of the semi finished device shown in FIG. 9.

FIG. 10 is a schematically top perspective view of the semi finished device shown in FIG. 9, and FIG. 9 is the cross-sectional view cut along the line A-A' shown in FIG. 10. Referring to FIG. 10, circles 24 enclosing oblique lines indicate the metal pillars or bumps 24 preformed on the patterned metal layer 2, shown in FIG. 9, before the chips 120 are cut from a semiconductor wafer. Circles 14 enclosing no oblique lines indicate the metal pillars or bumps 14 preformed on the patterned metal layer 1, shown in FIG. 9, before the chips 120 are attached to the patterned metal layer 1 and to the dielectric or insulating layer 10.

Referring to FIGS. 9 and 10, multiple metal interconnects or traces 1a provided by the patterned metal layer 1 can be on or over the dielectric or insulating layer 10. The metal pillars or bumps 14 can be on or over the metal interconnects or traces 1a. The metal interconnects or traces 1a can be signal traces, power planes, power buses, power traces, ground planes, ground buses, ground traces, or the like. There can be a number of chips 120, e.g., two, attached to the metal interconnects or traces 1a and to the dielectric or insulating layer 10 by the glue/adhesive material 80. Each of the chips 120 can have multiple metal interconnects or traces 2a provided by the patterned metal layer 2 and formed on the contact points, exposed by the openings 25a, of the metal traces or pads 26 and on the passivation layer 25, and can have the metal pillars or bumps 24 formed on the metal interconnects or traces 2a. The metal interconnects or traces 2a can be signal traces, power planes, power buses, power traces, ground planes, ground buses, ground traces or the like. Each of the metal interconnects or traces 2a can be connected to one or more of the metal traces or pads 26, such as two metal traces or pads 26, through one or more of the openings 25a in the passivation layer 25. For example, in each of the two chips 120, one of the metal traces or pads 26 can be connected to another one of the metal traces or pads 26 through one of the metal interconnects or traces 2a. Each of the metal pillars or bumps 24 can be connected to one or more of the metal traces or pads 26, such as two metal traces or pads 26, through one of the metal interconnects or traces 2a. One of the two chips 120 shown in FIG. 10 can include a metal interconnect or trace 2b provided by the patterned metal layer 2 and formed on the contact points, exposed by the openings 25a, of the metal traces or pads 26 and on the passivation layer 25. The metal interconnect or trace 2b can be a signal trace, a clock trace, a power plane, a power bus, a power trace, a ground plane, a ground bus, a ground trace, or the like. The metal interconnect or trace 2b can be free of any metal pillar or bump, in exemplary embodiments. Likewise, metal pillars or bumps can be omitted between the metal interconnect or trace 2b and a patterned metal layer 3 (e.g., as described in further detail below) for connecting the metal interconnect or trace 2b to the patterned metal layer 3. The metal interconnect or trace 2b can connect one of the metal traces or pads 26 to another one of the metal traces or pads 26. The metal interconnect or trace 2b can be enclosed by one of the metal interconnects or traces 2a.

Figure 11:
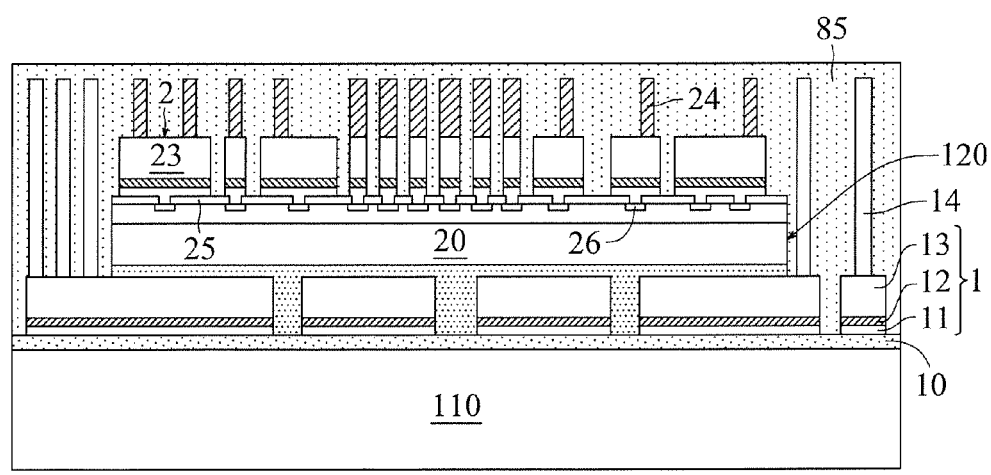

Referring to FIG. 11, after attaching the chips 120 to the metal layer 13 of the patterned metal layer 1 and to the dielectric or insulating layer 10, a filling or encapsulating layer 85 can be formed over the substrate 110, on the dielectric or insulating layer 10, on the metal layer 13 of the patterned metal layer 1, on the chips 120, on the metal layer 23 of the patterned metal layer 2 and on tops of the metal pillars or bumps 14 and 24 by using a suitable process, such as for example, a molding process, a spin coating process, a lamination process, or a printing process. The filling or encapsulating layer 85 can be made of a suitable material. Examples of suitable materials for the encapsulating layer 85 can include a polymer layer, such as epoxy layer, polyimide layer, benzocyclobutane (BCB) layer, polybenzoxazole (PBO) layer, poly-phenylene oxide (PPO) layer, silosane layer or SU-8 layer, having a suitable thickness, e.g., between about 20 and about 500 micrometers, and preferably between 30 and 100 micrometers.

Figure 12:
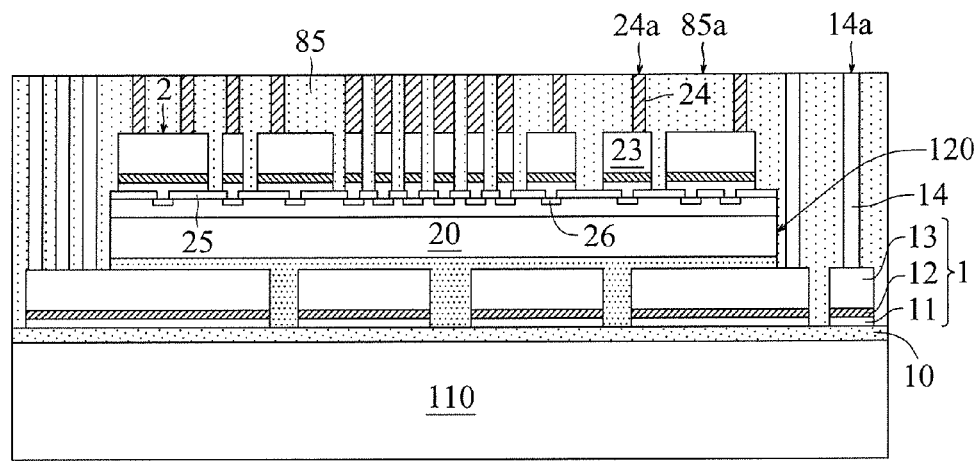

Next, referring to FIG. 12, the filling or encapsulating layer 85 can be ground or polished by a grinding or polishing process, such as mechanical grinding process, mechanical polishing process or chemical mechanical polishing (CMP) process. Accordingly, top surfaces 14a of the metal pillars or bumps 14 and top surfaces 24a of the metal pillars or bumps 24 are exposed and are not covered by the filling or encapsulating layer 85, and the top surfaces 24a of the metal pillars or bumps 24 are substantially coplanar with the top surfaces 14a of the metal pillars or bumps 14 and with a top surface 85a of the filling or encapsulating layer 85.

After the grinding or polishing process, each of the metal pillars or bumps 24 has a suitable thickness, e.g., or height, e.g., greater than about 5 micrometers, such as between 5 and 50 micrometers, and preferably between 10 and 20 micrometers, and each of the metal pillars or bumps 14 has a suitable thickness, e.g., or height, e.g., greater than about 15 micrometers, such as between 15 and 520 micrometers, and preferably between 20 and 110 micrometers, and greater than that of each of the metal pillars or bumps 24.

After the grinding or polishing process, each of the metal pillars or bumps 24 has a suitable width or diameter, e.g., between 5 and 100 micrometers, and preferably between 5 and 50 micrometers, and each of the metal pillars or bumps 14 has a suitable width or diameter, e.g., greater than 5 micrometers, such as between 5 and 300 micrometers, and preferably between 5 and 50 micrometers.

The metal pillars or bumps 24, after the grinding or polishing process, can be composed of a single layer of copper, silver, gold, palladium, platinum, rhodium, ruthenium, rhenium or nickel, or a composite layer made of the previously described metals.

For example, each of the chips 120 can have metal pillars or bumps 24, after the grinding or polishing process, composed of a single copper layer having a desired thickness, e.g., greater than 5 micrometers, such as between 5 and 50 micrometers, and preferably between 10 and 20 micrometers, on the metal layer 23, preferably the previously described copper layer 23.

Alternatively, each of the chips 120 can have metal pillars or bumps 24, after the grinding or polishing process, that are composed of a single silver layer having a desired thickness, e.g., greater than 5 micrometers, such as between 5 and 50 micrometers, and preferably between 10 and 20 micrometers, on the metal layer 23, preferably the previously described silver layer 23.

Alternatively, each of the chips 120 has the metal pillars or bumps 24, after the grinding or polishing process, composed of a single gold layer having a thickness, e.g., greater than 5 micrometers, such as between 5 and 50 micrometers, and preferably between 10 and 20 micrometers, on the metal layer 23, preferably the previously described gold layer 23.

Alternatively, each of the chips 120 has the metal pillars or bumps 24, after the grinding or polishing process, composed of a single nickel layer having a thickness, e.g., greater than 5 micrometers, such as between 5 and 50 micrometers, and preferably between 10 and 20 micrometers, on the metal layer 23, preferably the previously described copper or nickel layer 23.

Alternatively, each of the chips 120 has the metal pillars or bumps 24, after the grinding or polishing process, composed of an electroplated copper layer having a thickness, e.g., greater than 5 micrometers, such as between 5 and 50 micrometers, and preferably between 10 and 20 micrometers, on the metal layer 23, preferably the previously described copper layer 23, an electroplated or electroless plated nickel layer having a thickness, e.g., greater than 1 micrometer, such as between 1 and 5 micrometers, on the electroplated copper layer, and an electroplated or electroless plated gold layer having a thickness, e.g., between 0.005 and 1 micrometers, and preferably between 0.05 and 0.1 micrometers, on the electroplated or electroless plated nickel layer.

Alternatively, each of the chips 120 has the metal pillars or bumps 24, after the grinding or polishing process, composed of an electroplated copper layer having a thickness, e.g., greater than 5 micrometers, such as between 5 and 50 micrometers, and preferably between 10 and 20 micrometers, on the metal layer 23, preferably the previously described copper layer 23, an electroplated or electroless plated nickel layer having a thickness, e.g., greater than 1 micrometer, such as between 1 and 5 micrometers, on the electroplated copper layer, and an electroplated or electroless plated palladium layer having a thickness, e.g., between 0.005 and 1 micrometers, and preferably between 0.05 and 0.1 micrometers, on the electroplated or electroless plated nickel layer.

The metal pillars or bumps 14, after the grinding or polishing process, can be composed of a single layer of copper, silver, gold, palladium, platinum, rhodium, ruthenium, rhenium or nickel, or a composite layer made of the previously described metals.

For example, the metal pillars or bumps 14, after the grinding or polishing process, can be composed of a single copper layer having a thickness, e.g., greater than 15 micrometers, such as between 15 and 520 micrometers, and preferably between 20 and 110 micrometers, on the metal layer 13, preferably the previously described copper layer 13.

Alternatively, the metal pillars or bumps 14, after the grinding or polishing process, can be composed of a single silver layer having a thickness, e.g., greater than 15 micrometers, such as between 15 and 520 micrometers, and preferably between 20 and 110 micrometers, on the metal layer 13, preferably the previously described silver layer 13.

Alternatively, the metal pillars or bumps 14, after the grinding or polishing process, can be composed of a single gold layer having a thickness, e.g., greater than 15 micrometers, such as between 15 and 520 micrometers, and preferably between 20 and 110 micrometers, on the metal layer 13, preferably the previously described gold layer 13.

Alternatively, the metal pillars or bumps 14, after the grinding or polishing process, can be composed of a single nickel layer having a thickness, e.g., greater than 15 micrometers, such as between 15 and 520 micrometers, and preferably between 20 and 110 micrometers, on the metal layer 13, preferably the previously described nickel or copper layer 13.

Alternatively, the metal pillars or bumps 14, after the grinding or polishing process, can be composed of an electroplated copper layer having a thickness, e.g., greater than 10 micrometers, such as between 15 and 500 micrometers, and preferably between 20 and 100 micrometers, on the metal layer 13, preferably the previously described copper layer 13, an electroplated or electroless plated nickel layer having a thickness, e.g., greater than 1 micrometer, such as between 1 and 15 micrometers, and preferably between 2 and 10 micrometers, on the electroplated copper layer, and an electroplated or electroless plated gold layer having a thickness, e.g., between 0.005 and 1 micrometers, and preferably between 0.05 and 0.1 micrometers, on the electroplated or electroless plated nickel layer.

Alternatively, the metal pillars or bumps 14, after the grinding or polishing process, can be composed of an electroplated copper layer having a thickness, e.g., greater than 10 micrometers, such as between 15 and 500 micrometers, and preferably between 20 and 100 micrometers, on the metal layer 13, preferably the previously described copper layer 13, an electroplated or electroless plated nickel layer having a thickness, e.g., greater than 1 micrometer, such as between 1 and 15 micrometers, and preferably between 2 and 10 micrometers, on the electroplated copper layer, and an electroplated or electroless plated palladium layer having a thickness, e.g., between 0.005 and 1 micrometers, and preferably between 0.05 and 0.1 micrometers, on the electroplated or electroless plated nickel layer.

Figure 13:
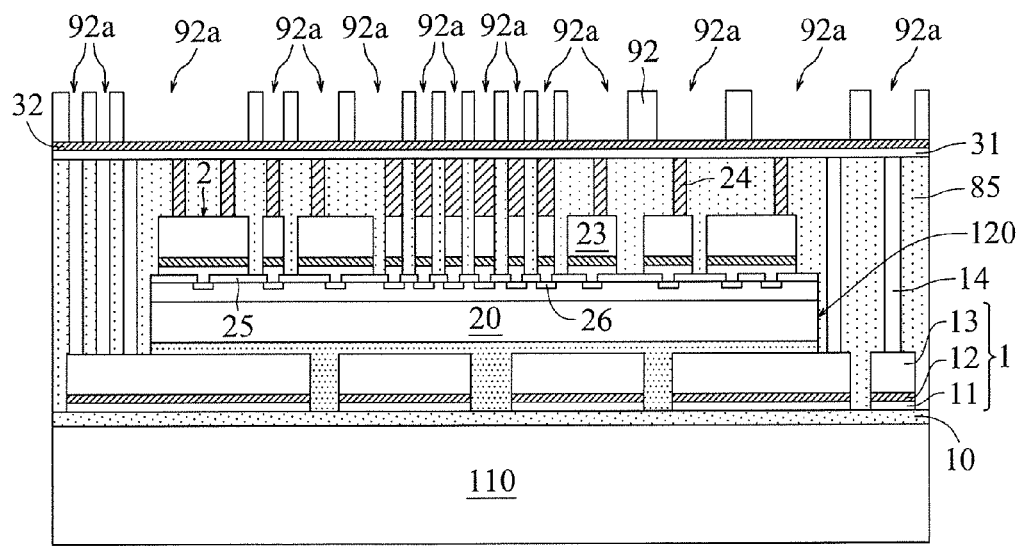

Next, referring to FIG. 13, an adhesion layer 31 having a thickness, e.g., less than 1 micrometer, such as between 1 nanometer and 0.5 micrometers, can be formed on the top surface 85a of the filling or encapsulating layer 85, on the top surfaces 24a of the metal pillars or bumps 24 and on the top surfaces 14a of the metal pillars or bumps 14 by using a physical-vapor deposition (PVD) process, such as sputtering process or evaporation process, or a chemical-vapor deposition (CVD) process. Next, a seed layer 32 having a thickness, e.g., less than 1 micrometer, such as between 10 nanometers and 0.8 micrometers, can be formed on the adhesion layer 31 by using a physical-vapor deposition (PVD) process, such as sputtering process or evaporation process, a chemical-vapor deposition (CVD) process or an electroless plating process. Next, a photoresist layer 92, such as positive-type photoresist layer or negative-type photoresist layer (preferred), having a thickness, e.g., greater than 1 micrometer can be formed on the seed layer 32 by using a spin-on coating process or a lamination process. Next, the photoresist layer 92 is patterned with processes of lithographic, light exposure and development to form multiple openings 92a in the photoresist layer 92 exposing the seed layer 32.

The material of the adhesion layer 31 may include titanium, a titanium-tungsten alloy, titanium nitride, chromium, tantalum, tantalum nitride, nickel or nickel vanadium. The material of the seed layer 32 may include copper, titanium-copper alloy, silver, gold, nickel, aluminum, platinum or palladium.

For example, when the adhesion layer 31 is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the top surface 85a of the filling or encapsulating layer 85, on the top surfaces 24a of the metal pillars or bumps 24 and on the top surfaces 14a of the metal pillars or bumps 14, the seed layer 32 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the titanium-containing layer.

Alternatively, when the adhesion layer 31 is formed by sputtering a tantalum-containing layer, such as a single layer of tantalum or tantalum nitride, having a thickness, e.g., less than 1 micrometer, such as between 1 nanometer and 0.5 micrometers, on the top surface 85a of the filling or encapsulating layer 85, on the top surfaces 24a of the metal pillars or bumps 24 and on the top surfaces 14a of the metal pillars or bumps 14, the seed layer 32 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the tantalum-containing layer.

Alternatively, when the adhesion layer 31 is formed by sputtering a chromium-containing layer, such as a single layer of chromium, having a thickness, e.g., less than 1 micrometer, such as between 1 nanometer and 0.5 micrometers, on the top surface 85a of the filling or encapsulating layer 85, on the top surfaces 24a of the metal pillars or bumps 24 and on the top surfaces 14a of the metal pillars or bumps 14, the seed layer 32 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the chromium-containing layer.

Alternatively, when the adhesion layer 31 is formed by sputtering a nickel-containing layer, such as a single layer of nickel or nickel vanadium, having a thickness, e.g., less than 1 micrometer, such as between 1 nanometer and 0.5 micrometers, on the top surface 85a of the filling or encapsulating layer 85, on the top surfaces 24a of the metal pillars or bumps 24 and on the top surfaces 14a of the metal pillars or bumps 14, the seed layer 32 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the nickel-containing layer.

Figure 14:
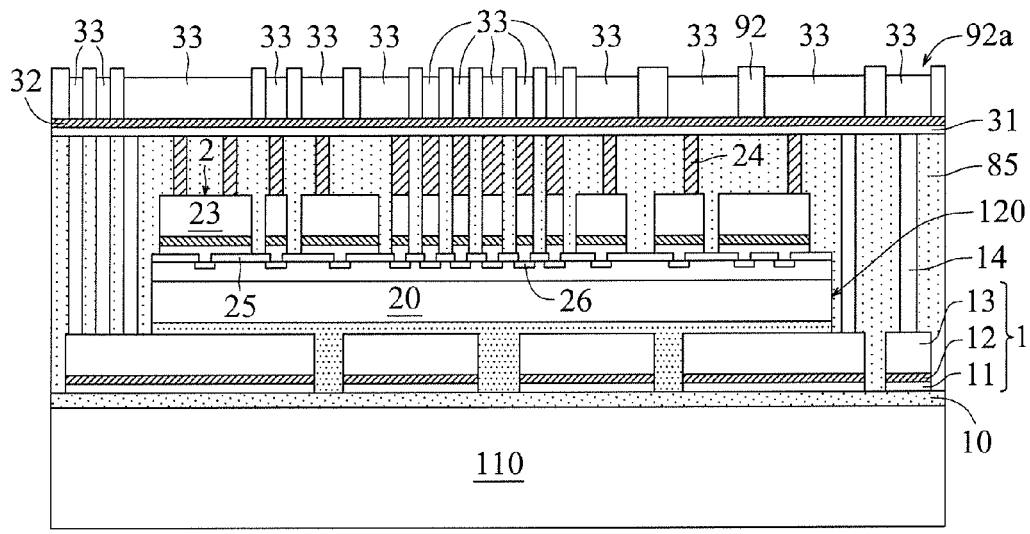

Next, referring to FIG. 14, a metal layer 33, a conductive layer, having a thickness, e.g., greater than 1 micrometer, such as between 2 and 30 micrometers, and preferably between 3 and 10 micrometers, can be formed on the seed layer 32 exposed by the openings 92a and in the openings 92a by using an electroplating or electroless plating process. The metal layer 33 can be a single layer of copper, silver, gold, palladium, platinum, rhodium, ruthenium, rhenium or nickel, or a composite layer made of the previously described metals.

For example, the metal layer 33 can be a single metal layer formed by electroplating a copper layer, to a thickness, e.g., greater than 1 micrometer, such as between 2 and 30 micrometers, and preferably between 3 and 10 micrometers, in the openings 92a and on the seed layer 32, preferably the previously described copper or titanium-copper-alloy seed layer 32, exposed by the openings 92a.

Alternatively, the metal layer 33 can be a single metal layer formed by electroplating a gold layer, to a thickness, e.g., greater than 1 micrometer, such as between 2 and 30 micrometers, and preferably between 3 and 10 micrometers, in the openings 92a and on the seed layer 32, preferably the previously described gold seed layer 32, exposed by the openings 92a.

Alternatively, the metal layer 33 can be composed of double metal layers formed by electroplating a nickel layer, to a thickness, e.g., greater than 1 micrometer, such as between 2 and 30 micrometers, and preferably between 3 and 10 micrometers, in the openings 92a and on the seed layer 32, preferably the previously described copper, nickel or titanium-copper-alloy seed layer 32, exposed by the openings 92a, and then electroplating or electroless plating a gold layer or a palladium layer, to a thickness, e.g., between 0.005 and 10 micrometers, and preferably between 0.05 and 1 micrometers, in the openings 92a and on the electroplated nickel layer in the openings 92a.

Alternatively, the metal layer 33 can be composed of triple metal layers formed by electroplating a copper layer, to a thickness, e.g., greater than 1 micrometer, such as between 2 and 30 micrometers, and preferably between 3 and 10 micrometers, in the openings 92a and on the seed layer 32, preferably the previously described copper or titanium-copper-alloy seed layer 32, exposed by the openings 92a, next electroplating or electroless plating a nickel layer, to a thickness, e.g., between 1 and 15 micrometers or between 0.3 and 1 micrometers, in the openings 92a and on the electroplated copper layer in the openings 92a, and then electroplating or electroless plating a gold layer or a palladium layer, to a thickness, e.g., between 0.005 and 1 micrometers, and preferably between 0.05 and 0.1 micrometers, in the openings 92a and on the electroplated or electroless plated nickel layer in the openings 92a.

Figure 15:
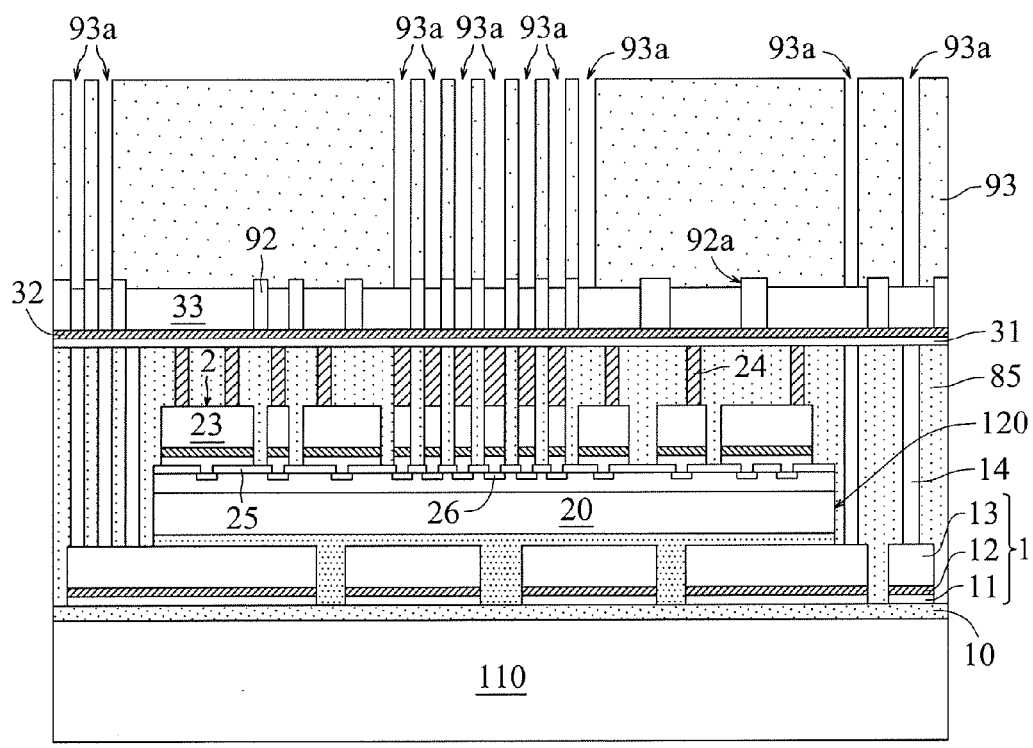

Referring to FIG. 15, after forming the metal layer 33 illustrated in FIG. 14, a photoresist layer 93, such as positive-type photoresist layer or negative-type photoresist layer (preferred), having a thickness, e.g., greater than 1 micrometer can be formed on the photoresist layer 92 and on the metal layer 33 by a spin-on coating process or a lamination process. Next, the photoresist layer 93 is patterned with processes of lithographic, light exposure and development to form multiple cylindrical openings 93a in the photoresist layer 93 exposing multiple contact points of the metal layer 33.

Figure 16:
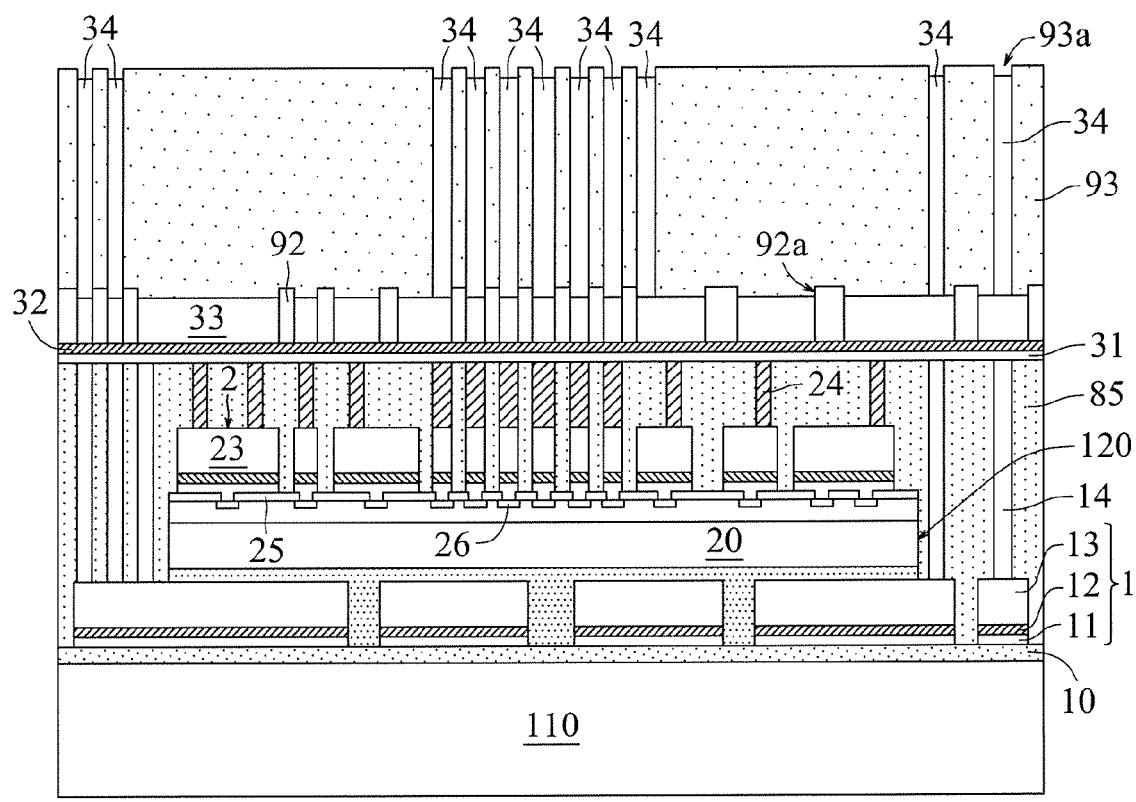

Next, referring to FIG. 16, multiple metal pillars or bumps 34 (intra-chip metal pillars or bumps) having a thickness, e.g., or height greater than 15 micrometers, such as between 15 and 520 micrometers, and preferably between 20 and 110 micrometers, are formed in the cylindrical openings 93a and on the contact points of the metal layer 33 exposed by the cylindrical openings 93a using an electroplating or electroless plating process. The metal pillars or bumps 34 can be composed of a single layer of copper, silver, gold, palladium, platinum, rhodium, ruthenium, rhenium or nickel, or a composite layer made of the previously described metals.

For example, the metal pillars or bumps 34 can be composed of a single metal layer formed by electroplating a copper layer, to a thickness, e.g., greater than 15 micrometers, such as between 15 and 520 micrometers, and preferably between 20 and 110 micrometers, in the cylindrical openings 93a and on the contact points of the metal layer 33, preferably the previously described copper layer 33, exposed by the cylindrical openings 93a.

Alternatively, the metal pillars or bumps 34 can be composed of a single metal layer formed by electroplating a gold layer, to a thickness, e.g., greater than 15 micrometers, such as between 15 and 520 micrometers, and preferably between 20 and 110 micrometers, in the cylindrical openings 93a and on the contact points of the metal layer 33, preferably the previously described gold layer 33, exposed by the cylindrical openings 93a.

Alternatively, the metal pillars or bumps 34 can be composed of a single metal layer formed by electroplating a nickel layer, to a thickness, e.g., greater than 15 micrometers, such as between 15 and 520 micrometers, and preferably between 20 and 110 micrometers, in the cylindrical openings 93a and on the contact points of the metal layer 33, preferably the previously described nickel or copper layer 33, exposed by the cylindrical openings 93a.

Alternatively, the metal pillars or bumps 34 can be composed of triple metal layers formed by electroplating a copper layer, to a thickness, e.g., greater than 10 micrometers, such as between 15 and 500 micrometers, and preferably between 20 and 100 micrometers, in the cylindrical openings 93a and on the contact points of the metal layer 33, preferably the previously described copper layer 33, exposed by the cylindrical openings 93a, next electroplating or electroless plating a nickel layer, to a thickness, e.g., between 1 and 15 micrometers or between 0.3 and 1 micrometers, in the cylindrical openings 93a and on the electroplated copper layer in the cylindrical openings 93a, and then electroplating or electroless plating a gold layer or a palladium layer, to a thickness, e.g., between 0.005 and 1 micrometers, and preferably between 0.05 and 0.1 micrometers, in the cylindrical openings 93a and on the electroplated or electroless plated nickel layer in the cylindrical openings 93a.

Figure 17:
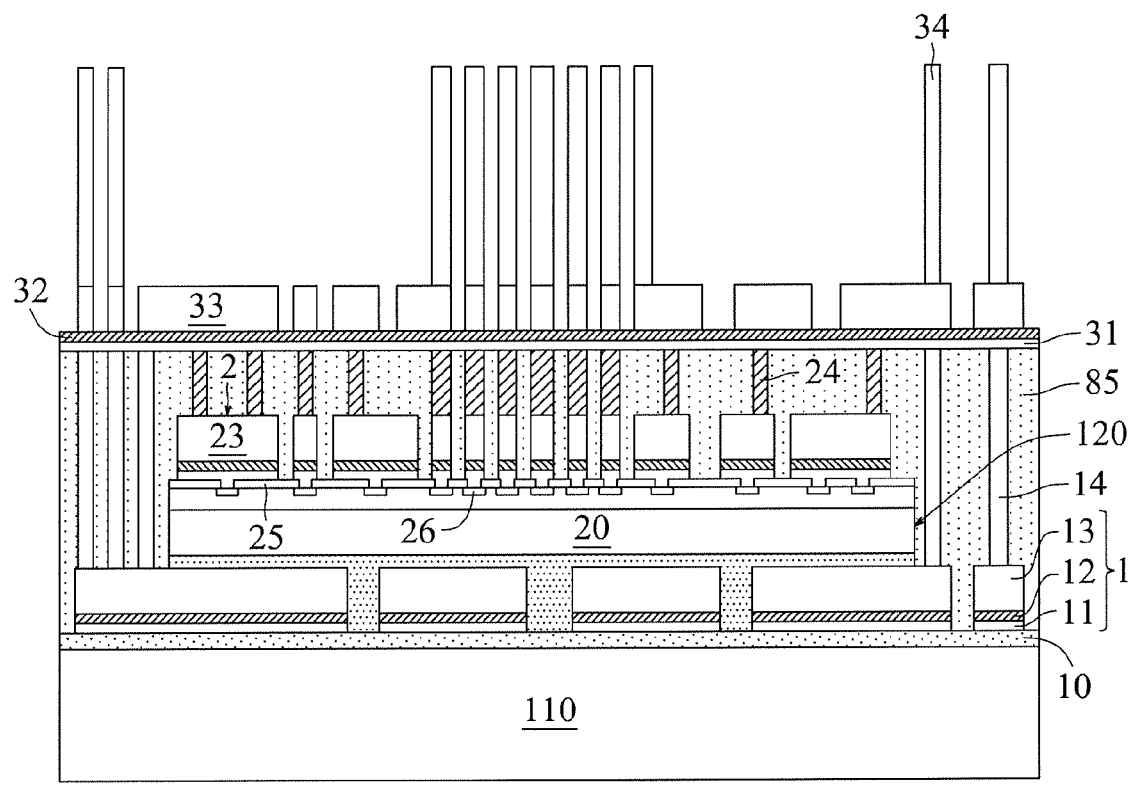

Referring to FIG. 17, after forming the metal pillars or bumps 34, the photoresist layers 92 and 93 are removed using a chemical solution containing amine or $NaCO_3$. Accordingly, the metal pillars or bumps 34 can be formed on the metal layer 33 after the photoresist layers 92 and 93 are removed.

Alternatively, another process for forming the metal pillars or bumps 34 on the metal layer 33 can be performed by the following steps. First, the photoresist layer 92 is removed using a chemical solution containing amine or $NaCO_3$ after forming the metal layer 33 illustrated in FIG. 14. Next, the photoresist layer 93 illustrated in FIG. 15 can be formed on the metal layer 33 and on the seed layer 32 by a spin-on coating process or a lamination process. Next, the photoresist layer 93 is patterned with the processes of lithographic, light exposure and development to form the cylindrical openings 93a in the photoresist layer 93 exposing the contact points of the metal layer 33. Next, the metal pillars or bumps 34 are formed in the cylindrical openings 93a and on the contact points of the metal layer 33 exposed by the cylindrical openings 93a using an electroplating or electroless plating process, which can be referred to as the step illustrated in FIG. 16. Next, the photoresist layer 93 is removed using a chemical solution containing amine or $NaCO_3$. Accordingly, the metal pillars or bumps 34 can be formed on the metal layer 33 after the photoresist layer 93 is removed.

Alternatively, the process steps illustrated in FIGS. 15 and 16 can be repeated once more for making higher metal pillars or bumps, if necessary, that is, another photoresist layer is formed on the photoresist layer 93 using a spin-on coating process or a lamination process, next multiple cylindrical openings are formed in the another photoresist layer and expose the metal pillars or bumps 34, next additional metal pillars or bumps are formed on the metal pillars or bumps 34 exposed by the cylindrical openings in the another photoresist layer and in the cylindrical openings in the another photoresist layer using an electroplating or electroless plating process, and then the another photoresist layer and the photoresist layers 92 and 93 are removed using a chemical solution containing amine or $NaCO_3$. The additional metal bumps can be composed of a single layer of copper, silver, gold, palladium, platinum, rhodium, ruthenium, rhenium or nickel, or a composite layer made of the previously described metals.

Figure 18:
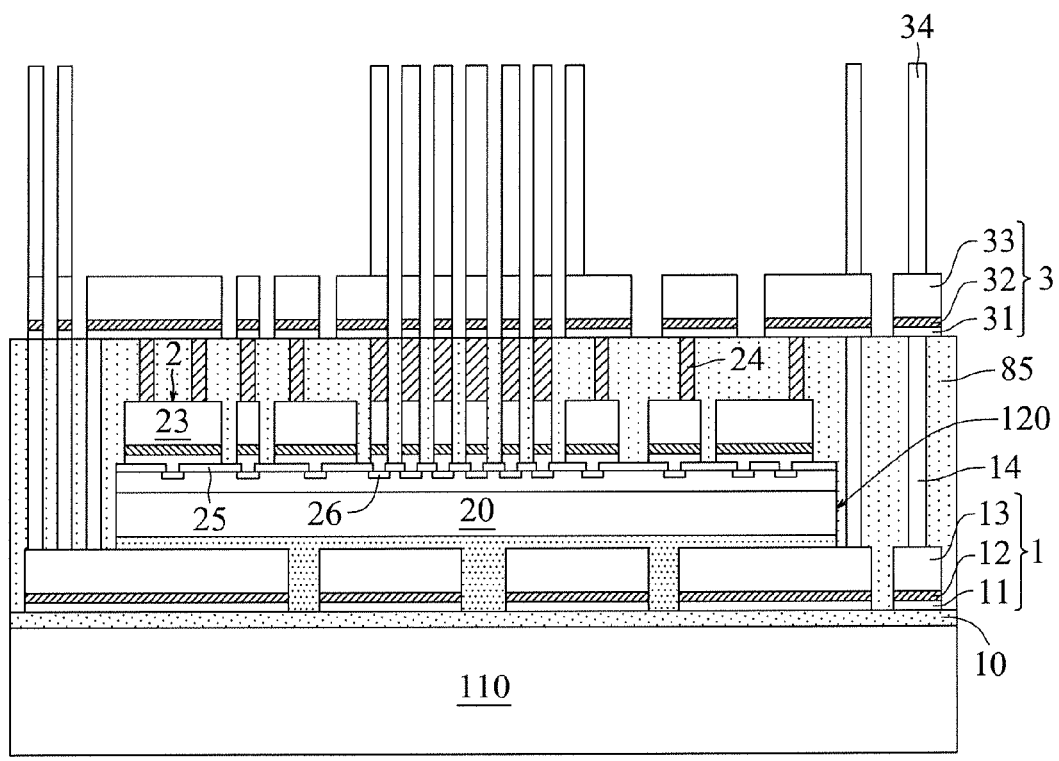

Referring to FIG. 18, after removing the photoresist layers 92 and 93, the seed layer 32 not under the metal layer 33 is removed by using a wet chemical etching process or a reactive ion etching (RIE) process, and then the adhesion layer 31 not under the metal layer 33 is removed by using a wet chemical etching process or a reactive ion etching (RIE) process.

Accordingly, the adhesion layer 31, the seed layer 32 and the metal layer 33 compose a patterned metal layer 3 formed on the top surface 85a of the filling or encapsulating layer 85, on the top surfaces 24a of the metal pillars or bumps 24 and on the top surfaces 14a of the metal pillars or bumps 14. The metal pillars or bumps 34 can be formed on the metal layer 33 of the patterned metal layer 3, and the pitch between neighboring or adjacent pairs of metal pillars or bumps 34 can be, e.g., greater than 100 micrometers, such as between 100 and 250 micrometers, or less than 100 micrometers, such as between 5 and 50 micrometers or between 50 and 100 micrometers. Each of the metal pillars or bumps 34 may have a suitable width or diameter, e.g., greater than 5 micrometers, such as between 5 and 300 micrometers, and preferably between 5 and 50 micrometers. The patterned metal layer 3 may include a metal plane, bus or trace, such as signal trace, clock bus, clock trace, power plane, power bus, power trace, ground plane, ground bus or ground trace, connecting one or more metal pillars or bumps 34 to one or more metal pillars or bumps 14, to one or more metal pillars or bumps 24 or to multiple of the metal pillars or bumps 14 and 24. A coverage ratio of an area of the patterned metal layer 3 covering a ground or polished surface including the top surfaces 14a, 24a and 85a shown in FIG. 12 to an area of the ground or polished surface ranges from 50% to 95%, and preferably ranges from 60% to 90%.

Figure 19:
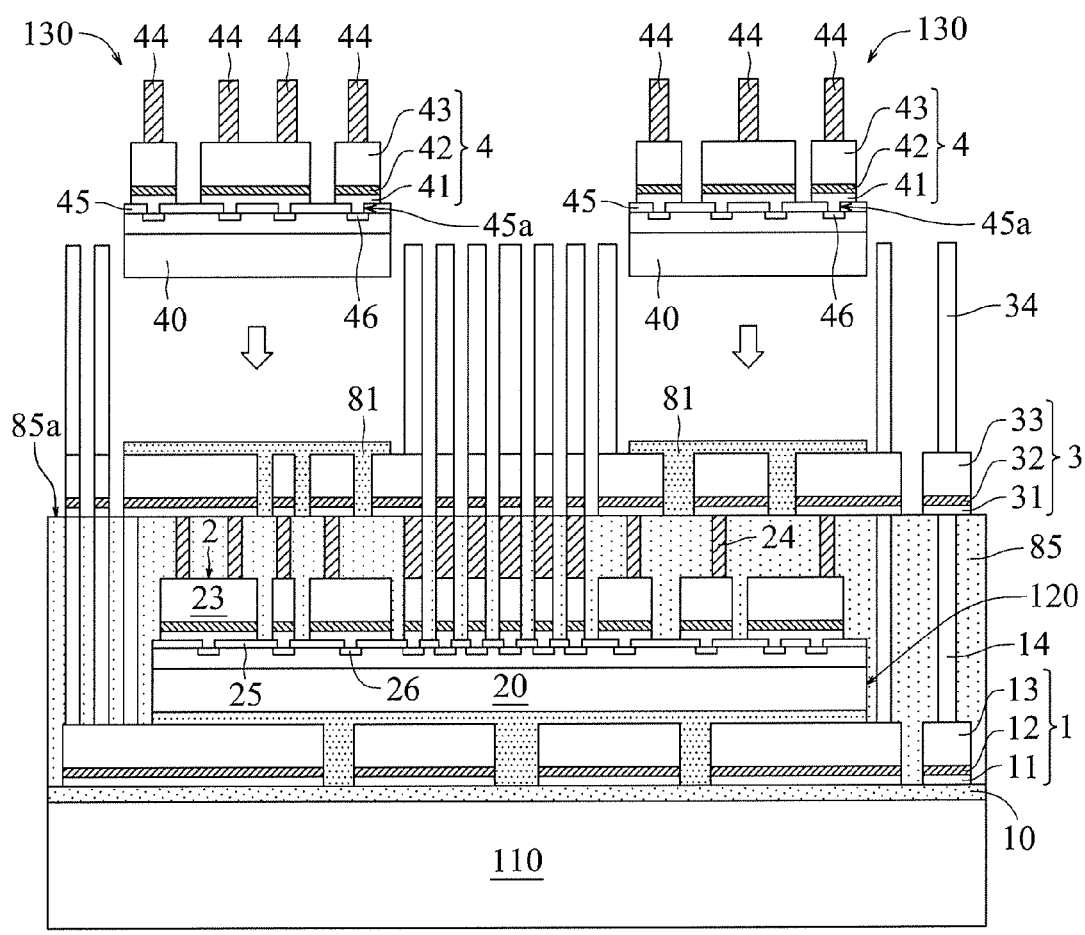
Figure 20:
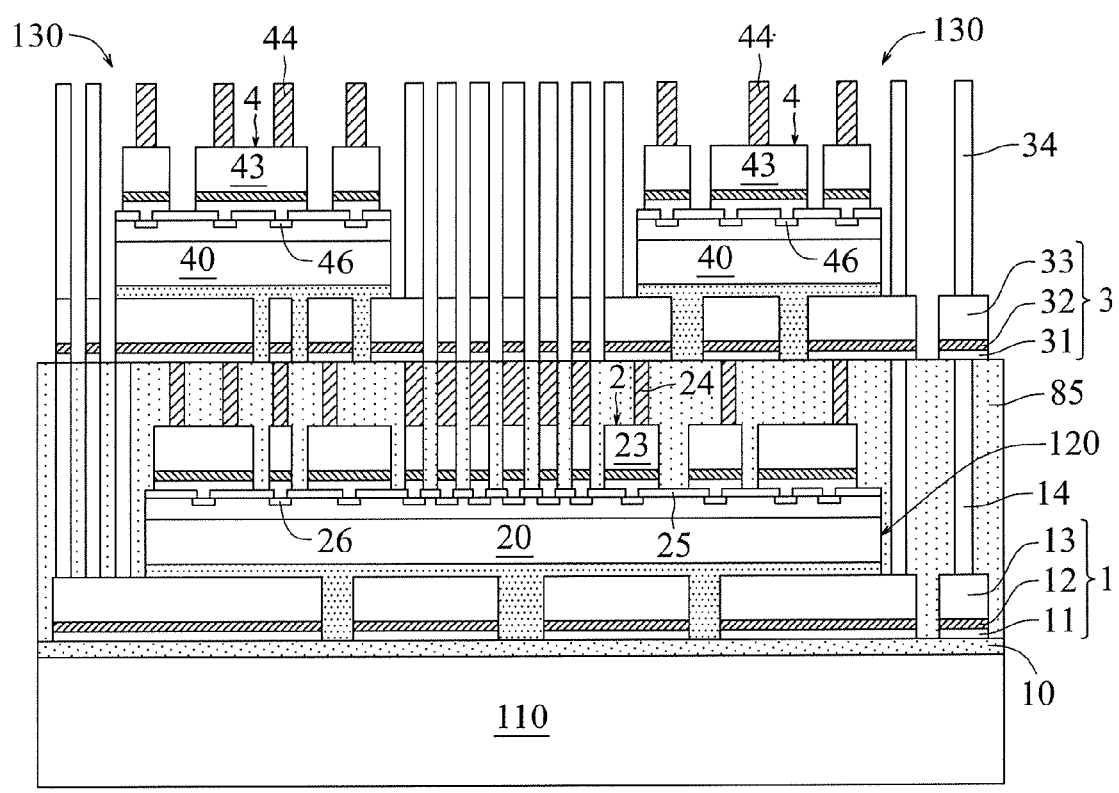

Next, referring to FIGS. 19 and 20, a glue (or, adhesive) material 81 can be formed on the metal layer 33 of the patterned metal layer 3 and on the top surface 85a of the filling or encapsulating layer 85 by using a dispensing process, a lamination process or a screen-printing process, and then multiple chips 130 (two of them are shown) can be attached to the metal layer 33 of the patterned metal layer 3 and to the top surface 85a of the filling or encapsulating layer 85 by the glue material 81.

Alternatively, another technique to attach the chips 130 is by first forming the glue material 81 onto bottom surfaces of the chips 130 and then attaching the chips 130 to the metal layer 33 of the patterned metal layer 3 and to the top surface 85a of the filling or encapsulating layer 85 through the glue material 81 using, e.g. a thermal compression process.

Alternatively, after the step illustrated in FIG. 18, a polymer layer may be formed on the metal layer 33 of the patterned metal layer 3 and on the top surface 85a of the filling or encapsulating layer 85, and then the chips 130 can be attached to the polymer layer by the glue material 81. The polymer layer can be a polyimide layer or a benzocyclobutene layer having a suitable thickness, e.g., between 2 and 30 micrometers. The glue material 81 can be formed on the polymer layer, and the chips 130 can be formed on the glue material 81.

Examples of suitable glue material 81 include, but are not limited to, epoxy, polyimide, benzocyclobutane (BCB), polybenzoxazole (PBO), poly-phenylene oxide (PPO), silosane or SU-8, and may have a suitable thickness, between the metal layer 33 of the patterned metal layer 3 and any one of the chips 130, greater than 3 micrometers, such as between 3 and 100 micrometers, and preferably between 5 and 50 micrometers or between 10 and 30 micrometers.

Each of the chips 130 includes a semiconductor substrate 40, multiple transistors, such as NMOS transistors, PMOS transistors or bipolar transistors, in and/or over the semiconductor substrate 40, multiple fine-line metal layers over the semiconductor substrate 40, multiple dielectric layers over the semiconductor substrate 40 and between the fine-line metal layers, multiple via plugs of copper or tungsten in the dielectric layers, a passivation layer 45 over the semiconductor substrate 40, over the transistors, over the dielectric layers and over the fine-line metal layers, a patterned metal layer 4 on the passivation layer 45, and multiple metal pillars or bumps 44 (on-chip metal pillars or bumps) on the patterned metal layer 4. In each of the chips 130, a coverage ratio of an area of the patterned metal layer 4 covering a top surface of the passivation layer 45 to an area of the top surface ranges from 50% to 95%, and preferably can range from, for example, 60% to 90%. The transistors can be provided for NOR gates, NAND gates, AND gates, OR gates, flash memory cells, static random access memory (SRAM) cells, dynamic random access memory (DRAM) cells, non-volatile memory cells, erasable programmable read-only memory (EPROM) cells, read-only memory (ROM) cells, magnetic random access memory (MRAM) cells, sense amplifiers, inverters, operational amplifiers, adders, multiplexers, diplexers, multipliers, analog-to-digital (A/D) converters, digital-to-analog (D/A) converters, analog circuits, complementary-metal-oxide-semiconductor (CMOS) sensors, and/or charge coupled devices (CCD) or the like. The dielectric layers can be composed of a single layer of silicon oxide, silicon nitride, silicon oxynitride, silicon carbon nitride or silicon oxycarbide, or a composite layer made of the previously described materials. The fine-line metal layers may include aluminum, aluminum-copper-alloy or electroplated copper or other suitable metallic materials.

In each of the chips 130, multiple metal traces or pads 46 provided by the topmost fine-line metal layer are formed over the semiconductor substrate 40, on one of the dielectric layers and under the passivation layer 45. Multiple openings 45a in the passivation layer 45 are over multiple contact points of the metal traces or pads 46 and expose them, and the contact points of the metal traces or pads 46 are at bottoms of the openings 45a. Each of the openings 45a has a suitable width or diameter, e.g., between 0.5 and 100 micrometers, and preferably between 1 and 20 micrometers. The patterned metal layer 4 of each chip 130 can be formed on the contact points, exposed by the openings 45a, of the metal traces or pads 46 and on the passivation layer 45, and can be connected to the contact points, exposed by the openings 45a, of the metal traces or pads 46 through the openings 45a. The metal traces or pads 46 may include aluminum, aluminum-copper-alloy or electroplated copper.

Each of the chips 130 can have multiple circuit interconnects, provided by the fine-line metal layers and the via plugs, between the semiconductor substrate 40 and the passivation layer 45. The circuit interconnects may have a suitable thickness, e.g., between 10 nanometers and 2 micrometers, and may include, e.g., aluminum, aluminum-copper-alloy, electroplated copper or tungsten.

Alternatively, each of the chips 130 may further include multiple carbon nanotube interconnects between the semiconductor substrate 40 and the passivation layer 45, and an organic polymer layer with a suitable thickness, e.g., greater than 3 micrometers, such as between 3 and 20 micrometers, and preferably between 5 and 12 micrometers, on the passivation layer 45. Multiple openings in the organic polymer layer are over the contact points, exposed by the openings 45a in the passivation layer 45, of the metal traces or pads 46 and expose the contact points. The organic polymer layer can be made of a suitable material or materials, examples of which include, but are not limited to, polyimide, benzocyclobutane (BCB), polybenzoxazole (PBO), poly-phenylene oxide (PPO), silosane, SU-8 or epoxy. In this case, each of the chips 130 has the patterned metal layer 4 formed on the contact points of the metal traces or pads 46, on the organic polymer layer and over the passivation layer 45, and connected to the contact points of the metal traces or pads 46 through the openings in the organic polymer layer and through the openings 45a in the passivation layer 45. Each of the chips 130 may have the circuit interconnects connected to the transistors through the carbon nanotube interconnects.

The semiconductor substrate 40 may be a silicon substrate or a gallium arsenide (GaAs) substrate, and may have a thickness, e.g., greater than 1 micrometer, such as between 1 and 30 micrometers, between 2 and 10 micrometers, between 5 and 50 micrometers, between 10 and 100 micrometers or between 10 and 500 micrometers.

The passivation layer 45 can be formed by a suitable process or processes, e.g., a chemical vapor deposition (CVD) method. The passivation layer 45 can have a thickness, e.g., greater than 0.2 micrometers, such as between 0.3 and 1.5 micrometers. The passivation layer 45 can be made of silicon oxide (such as $SiO_2$), silicon nitride (such as $Si_3N_4$), silicon oxynitride, silicon oxycarbide, phosphosilicate glass (PSG), silicon carbon nitride or a composite of the previously described materials. The passivation layer 45 can be include or composed of one or more inorganic layers. For example, the passivation layer 45 can be composed of an oxide layer, such as silicon oxide or silicon oxycarbide, having a thickness, e.g., between 0.2 and 1.2 micrometers and a nitride layer, such as silicon nitride, silicon oxynitride or silicon carbon nitride, having a thickness, e.g., between 0.2 and 1.2 micrometers on the oxide layer. Alternatively, the passivation layer 45 can be a single layer of silicon nitride, silicon oxynitride or silicon carbon nitride having a thickness, e.g., between 0.3 and 1.5 micrometers. For exemplary embodiments, the passivation layer 45 in one of the chips 130 can include a topmost inorganic layer of the one of the chips 130. For example, the topmost inorganic layer of the one of the chips 130 can be a layer of a nitrogen-containing compound, such as silicon nitride, silicon oxynitride, silicon carbon nitride or silicon carbon oxynitride, having a suitable thickness, e.g., greater than 0.2 micrometers, such as between 0.2 and 1.5 micrometers, or a layer of an oxygen-containing compound, such as silicon oxide, silicon oxynitride, silicon carbon oxide or silicon carbon oxynitride, having a suitable thickness, e.g., greater than 0.2 micrometers, such as between 0.2 and 1.5 micrometers.

Each of the chips 130 has multiple metal interconnects or traces provided by the patterned metal layer 4 and formed on the contact points of the metal traces or pads 46 and on the passivation layer 45. And each of the chips 130 has the metal pillars or bumps 44 formed on the metal interconnects or traces and connected to the contact points of the metal traces or pads 46 through the metal interconnects or traces and through the openings 45a in the passivation layer 45. The metal interconnects or traces can be signal traces, power planes, power buses, power traces, ground planes, ground buses or ground traces. For example, in each of the chips 130, one of the contact points of the metal traces or pads 46 can be connected to another one of the contact points of the metal traces or pads 46 through one of the metal interconnects or traces, and one or more of the metal pillars or bumps 44 on the one of the metal interconnects or traces can be connected to the two contact points of the two metal traces or pads 46 through the one of the metal interconnects or traces. And a gap is between the two metal traces or pads 46 providing the two contact points connected to each other through the one of the metal interconnects or traces provided by the patterned metal layer 4.

Each of the chips 130 has the patterned metal layer 4 composed of an adhesion layer 41 on the contact points of the metal traces or pads 46 and on the passivation layer 45 or organic polymer layer, a seed layer 42 on the adhesion layer 41, and a metal layer 43 on the seed layer 42, and has the metal pillars or bumps 44 formed on the metal layer 43 of the patterned metal layer 4 and connected to the contact points of the metal traces or pads 46 through the patterned metal layer 4 and through the openings 45a in the passivation layer 45.

The adhesion layer 41 may have a thickness, e.g., less than 1 micrometer, such as between 1 nanometer and 0.5 micrometers, and preferably between 1 nanometer and 0.1 micrometers. The seed layer 42 may have a thickness, e.g., less than 1 micrometer, such as between 10 nanometers and 0.8 micrometers, and preferably between 20 nanometer and 0.5 micrometers. The material of the adhesion layer 41 may include titanium, a titanium-tungsten alloy, titanium nitride, chromium, tantalum, tantalum nitride, nickel or nickel vanadium. The material of the seed layer 42 may include copper, titanium-copper alloy, silver, gold, nickel, aluminum, platinum or palladium.

For example, when the adhesion layer 41 is a titanium-containing layer, such as a single layer of titanium-tungsten alloy, titanium or titanium nitride, having a thickness, e.g., less than 1 micrometer, such as between 1 nanometer and 0.5 micrometers, and preferably between 1 nanometer and 0.1 micrometers, on the contact points of the metal traces or pads 46 and on the passivation layer 45 or organic polymer layer, the seed layer 42 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the titanium-containing layer.

Alternatively, when the adhesion layer 41 is a tantalum-containing layer, such as a single layer of tantalum or tantalum nitride, having a thickness, e.g., less than 1 micrometer, such as between 1 nanometer and 0.5 micrometers, and preferably between 1 nanometer and 0.1 micrometers, on the contact points of the metal traces or pads 46 and on the passivation layer 45 or organic polymer layer, the seed layer 42 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the tantalum-containing layer.

Alternatively, when the adhesion layer 41 is a chromium-containing layer, such as a single layer of chromium, having a thickness, e.g., less than 1 micrometer, such as between 1 nanometer and 0.5 micrometers, and preferably between 1 nanometer and 0.1 micrometers, on the contact points of the metal traces or pads 46 and on the passivation layer 45 or organic polymer layer, the seed layer 42 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the chromium-containing layer.

Alternatively, when the adhesion layer 41 is a nickel-containing layer, such as a single layer of nickel or nickel vanadium, having a thickness, e.g., less than 1 micrometer, such as between 1 nanometer and 0.5 micrometers, and preferably between 1 nanometer and 0.1 micrometers, on the contact points of the metal traces or pads 46 and on the passivation layer 45 or organic polymer layer, the seed layer 42 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the nickel-containing layer.

The metal layer 43 may have a thickness, e.g., greater than 1 micrometer, such as between 2 and 30 micrometers, and preferably between 3 and 10 micrometers. Sidewalls of the metal layer 43 are not covered by the adhesion layer 41 and the seed layer 42. The metal layer 43 can be a single layer of copper, silver, gold, palladium, platinum, rhodium, ruthenium, rhenium or nickel, or a composite layer made of the previously described metals.

For example, the metal layer 43 can be a single copper layer having a thickness, e.g., greater than 1 micrometer, such as between 2 and 30 micrometers, and preferably between 3 and 10 micrometers, on the seed layer 42, preferably the previously described copper or titanium-copper-alloy seed layer 42.

Alternatively, the metal layer 43 can be a single silver layer having a thickness, e.g., greater than 1 micrometer, such as between 2 and 30 micrometers, and preferably between 3 and 10 micrometers, on the seed layer 42, preferably the previously described silver seed layer 42.

Alternatively, the metal layer 43 can be a single gold layer having a thickness, e.g., greater than 1 micrometer, such as between 2 and 30 micrometers, and preferably between 3 and 10 micrometers, on the seed layer 42, preferably the previously described gold seed layer 42.

Alternatively, the metal layer 43 can be a single nickel layer having a thickness, e.g., greater than 1 micrometer, such as between 2 and 30 micrometers, and preferably between 3 and 10 micrometers, on the seed layer 42, preferably the previously described copper, nickel or titanium-copper-alloy seed layer 42.

Alternatively, the metal layer 43 can be composed of an electroplated copper layer having a thickness, e.g., greater than 1 micrometer, such as between 2 and 30 micrometers, and preferably between 3 and 10 micrometers, on the seed layer 42, preferably the previously described copper or titanium-copper-alloy seed layer 42, a nickel layer having a thickness, e.g., greater than 1 micrometer, such as between 1 and 15 micrometers, and preferably between 2 and 5 micrometers, on the electroplated copper layer, and a gold or palladium layer having a thickness, e.g., between 0.005 and 1 micrometers, and preferably between 0.05 and 0.1 micrometers, on the nickel layer.

Each of the metal pillars or bumps 44 has a suitable thickness or height, e.g., greater than 5 micrometers, such as between 5 and 50 micrometers, and preferably between 10 and 20 micrometers, and preferably less than that of each of the metal pillars or bumps 34, and has a suitable width or diameter, e.g., between 5 and 100 micrometers, and preferably between 5 and 50 micrometers. The metal pillars or bumps 44 can be composed of a single layer of copper, silver, gold, palladium, platinum, rhodium, ruthenium, rhenium or nickel, or a composite layer made of the previously described metals.

Each chip 130 may include input/output (I/O) circuits serving for chip probing testing (CP testing), for build-in-self testing or for external signal connection, and one of the I/O circuits may have a total loading (total capacitance) between 15 pF and 50 pF. Each of the I/O circuits may include a driver, a receiver and/or an electro static discharge (ESD) circuit. Each of the chips 130 may have built-in self test (BIST) circuits for reducing the testing time for the system-in package or multichip module.

No matter where the chips 130 are provided, any one of the chips 130 can be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a wireless local area network (WLAN) chip, a memory chip, such as flash memory chip, dynamic-random-access-memory (DRAM) chip or statistic-random-access-memory (SRAM) chip, a logic chip, an analog chip, a power device, a regulator, a power management device, a global-positioning-system (GPS) chip, a Bluetooth chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processing-unit (CPU) circuit block, or a system-on chip (SOC) including a graphics-processing-unit (GPU) circuit block and a wireless local area network (WLAN) circuit block, but not including any baseband circuit block and any central-processing-unit (CPU) circuit block. Alternatively, any one of the chips 130 can be a chip including a central-processing-unit (CPU) circuit block designed by x86 architecture or by non x86 architecture, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block, and/or a modem circuit block.

Figure 21:
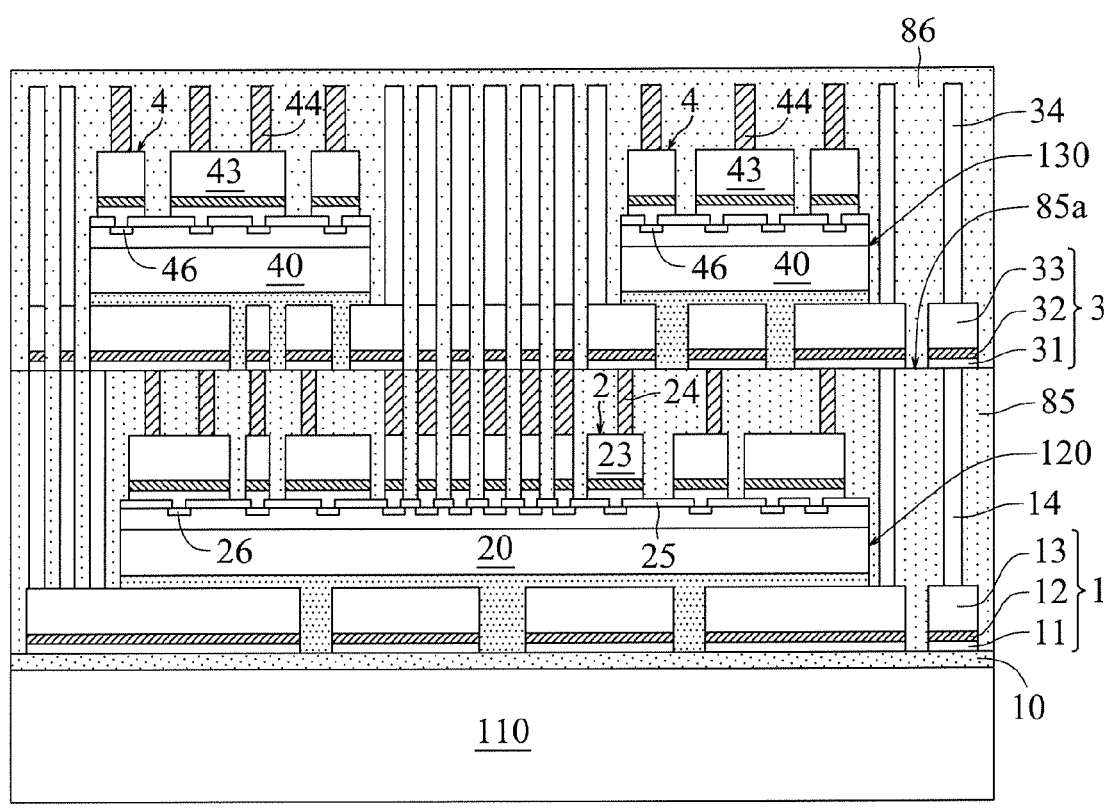

Referring to FIG. 21, after attaching the chips 130 to the metal layer 33 of the patterned metal layer 3 and to the top surface 85a of the filling or encapsulating layer 85, a filling or encapsulating layer 86 is formed on the top surface 85a of the filling or encapsulating layer 85, on the metal layer 33 of the patterned metal layer 3, on the chips 130, on the metal layer 43 of the patterned metal layer 4 and on tops of the metal pillars or bumps 34 and 44 by using a molding process, a spin coating process, a lamination process or a printing process. The filling or encapsulating layer 86 can be a polymer layer, such as epoxy layer, polyimide layer, benzocyclobutane (BCB) layer, polybenzoxazole (PBO) layer, poly-phenylene oxide (PPO) layer, silosane layer or SU-8 layer, having a thickness, e.g., between 20 and 500 micrometers, and preferably between 30 and 100 micrometers.

Figure 22:
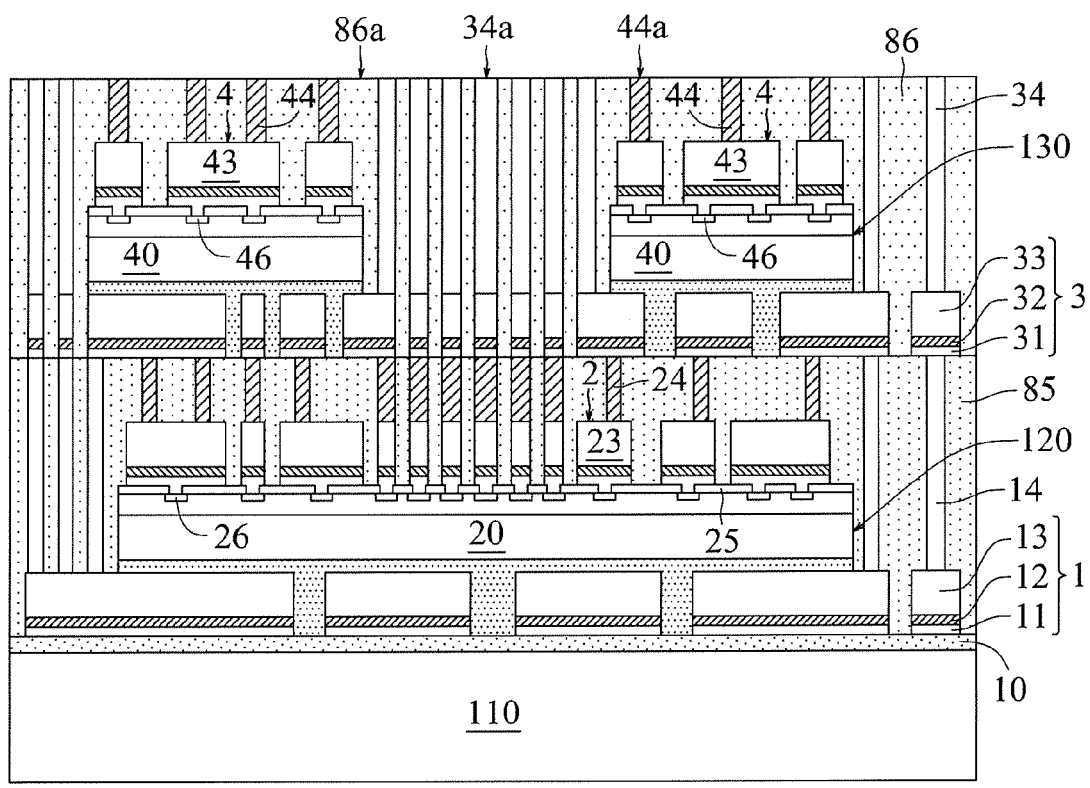

Next, referring to FIG. 22, the filling or encapsulating layer 86 is ground or polished by a grinding or polishing process, such as mechanical grinding process, mechanical polishing process or chemical mechanical polishing (CMP) process. Accordingly, top surfaces 34a of the metal pillars or bumps 34 and top surfaces 44a of the metal pillars or bumps 44 are exposed and are not covered by the filling or encapsulating layer 86, and the top surfaces 44a of the metal pillars or bumps 44 are substantially coplanar with the top surfaces 34a of the metal pillars or bumps 34 and with a top surface 86a of the filling or encapsulating layer 86.

After the grinding or polishing process, each of the metal pillars or bumps 44 has a thickness, e.g., or height greater than 5 micrometers, such as between 5 and 50 micrometers, and preferably between 10 and 20 micrometers, and each of the metal pillars or bumps 34 has a thickness, e.g., or height greater than 15 micrometers, such as between 15 and 520 micrometers, and preferably between 20 and 110 micrometers, and greater than that of each of the metal pillars or bumps 44.

After the grinding or polishing process, each of the metal pillars or bumps 44 has a suitable width or diameter, e.g., between 5 and 100 micrometers, and preferably between 5 and 50 micrometers. Each of the metal pillars or bumps 34 can have a suitable width or diameter, e.g., greater than 5 micrometers, such as between 5 and 300 micrometers, and preferably between 5 and 50 micrometers.

The metal pillars or bumps 44, after the grinding or polishing process, can be composed of a single layer of copper, silver, gold, palladium, platinum, rhodium, ruthenium, rhenium or nickel, or a composite layer made of the previously described metals.

For example, each of the chips 130 has the metal pillars or bumps 44, after the grinding or polishing process, composed of a single copper layer having a thickness, e.g., greater than 5 micrometers, such as between 5 and 50 micrometers, and preferably between 10 and 20 micrometers, on the metal layer 43, preferably the previously described copper layer 43.

Alternatively, each of the chips 130 has the metal pillars or bumps 44, after the grinding or polishing process, composed of a single silver layer having a thickness, e.g., greater than 5 micrometers, such as between 5 and 50 micrometers, and preferably between 10 and 20 micrometers, on the metal layer 43, preferably the previously described silver layer 43.

Alternatively, each of the chips 130 has the metal pillars or bumps 44, after the grinding or polishing process, composed of a single gold layer having a thickness, e.g., greater than 5 micrometers, such as between 5 and 50 micrometers, and preferably between 10 and 20 micrometers, on the metal layer 43, preferably the previously described gold layer 43.

Alternatively, each of the chips 130 has the metal pillars or bumps 44, after the grinding or polishing process, composed of a single nickel layer having a thickness, e.g., greater than 5 micrometers, such as between 5 and 50 micrometers, and preferably between 10 and 20 micrometers, on the metal layer 43, preferably the previously described copper or nickel layer 43.

Alternatively, each of the chips 130 has the metal pillars or bumps 44, after the grinding or polishing process, composed of an electroplated copper layer having a thickness, e.g., greater than 5 micrometers, such as between 5 and 50 micrometers, and preferably between 10 and 20 micrometers, on the metal layer 43, preferably the previously described copper layer 43, an electroplated or electroless plated nickel layer having a thickness, e.g., greater than 1 micrometer, such as between 1 and 5 micrometers, on the electroplated copper layer, and an electroplated or electroless plated gold layer having a thickness, e.g., between 0.005 and 1 micrometers, and preferably between 0.05 and 0.1 micrometers, on the electroplated or electroless plated nickel layer.

Alternatively, each of the chips 130 has the metal pillars or bumps 44, after the grinding or polishing process, composed of an electroplated copper layer having a thickness, e.g., greater than 5 micrometers, such as between 5 and 50 micrometers, and preferably between 10 and 20 micrometers, on the metal layer 43, preferably the previously described copper layer 43, an electroplated or electroless plated nickel layer having a thickness, e.g., greater than 1 micrometer, such as between 1 and 5 micrometers, on the electroplated copper layer, and an electroplated or electroless plated palladium layer having a thickness, e.g., between 0.005 and 1 micrometers, and preferably between 0.05 and 0.1 micrometers, on the electroplated or electroless plated nickel layer.

The metal pillars or bumps 34, after the grinding or polishing process, can be composed of a single layer of copper, silver, gold, palladium, platinum, rhodium, ruthenium, rhenium or nickel, or a composite layer made of the previously described metals.

For example, the metal pillars or bumps 34, after the grinding or polishing process, can be composed of a single copper layer having a thickness, e.g., greater than 15 micrometers, such as between 15 and 520 micrometers, and preferably between 20 and 110 micrometers, on the metal layer 33, preferably the previously described copper layer 33.

Alternatively, the metal pillars or bumps 34, after the grinding or polishing process, can be composed of a single silver layer having a thickness, e.g., greater than 15 micrometers, such as between 15 and 520 micrometers, and preferably between 20 and 110 micrometers, on the metal layer 33, preferably the previously described silver layer 33.

Alternatively, the metal pillars or bumps 34, after the grinding or polishing process, can be composed of a single gold layer having a thickness, e.g., greater than 15 micrometers, such as between 15 and 520 micrometers, and preferably between 20 and 110 micrometers, on the metal layer 33, preferably the previously described gold layer 33.

Alternatively, the metal pillars or bumps 34, after the grinding or polishing process, can be composed of a single nickel layer having a thickness, e.g., greater than 15 micrometers, such as between 15 and 520 micrometers, and preferably between 20 and 110 micrometers, on the metal layer 33, preferably the previously described nickel or copper layer 33.

Alternatively, the metal pillars or bumps 34, after the grinding or polishing process, can be composed of an electroplated copper layer having a thickness, e.g., greater than 10 micrometers, such as between 15 and 500 micrometers, and preferably between 20 and 100 micrometers, on the metal layer 33, preferably the previously described copper layer 33, an electroplated or electroless plated nickel layer having a thickness, e.g., greater than 1 micrometer, such as between 1 and 15 micrometers, and preferably between 2 and 10 micrometers, on the electroplated copper layer, and an electroplated or electroless plated gold layer having a thickness, e.g., between 0.005 and 1 micrometers, and preferably between 0.05 and 0.1 micrometers, on the electroplated or electroless plated nickel layer.

Alternatively, the metal pillars or bumps 34, after the grinding or polishing process, can be composed of an electroplated copper layer having a thickness, e.g., greater than 10 micrometers, such as between 15 and 500 micrometers, and preferably between 20 and 100 micrometers, on the metal layer 33, preferably the previously described copper layer 33, an electroplated or electroless plated nickel layer having a thickness, e.g., greater than 1 micrometer, such as between 1 and 15 micrometers, and preferably between 2 and 10 micrometers, on the electroplated copper layer, and an electroplated or electroless plated palladium layer having a thickness, e.g., between 0.005 and 1 micrometers, and preferably between 0.05 and 0.1 micrometers, on the electroplated or electroless plated nickel layer.

Figure 23:
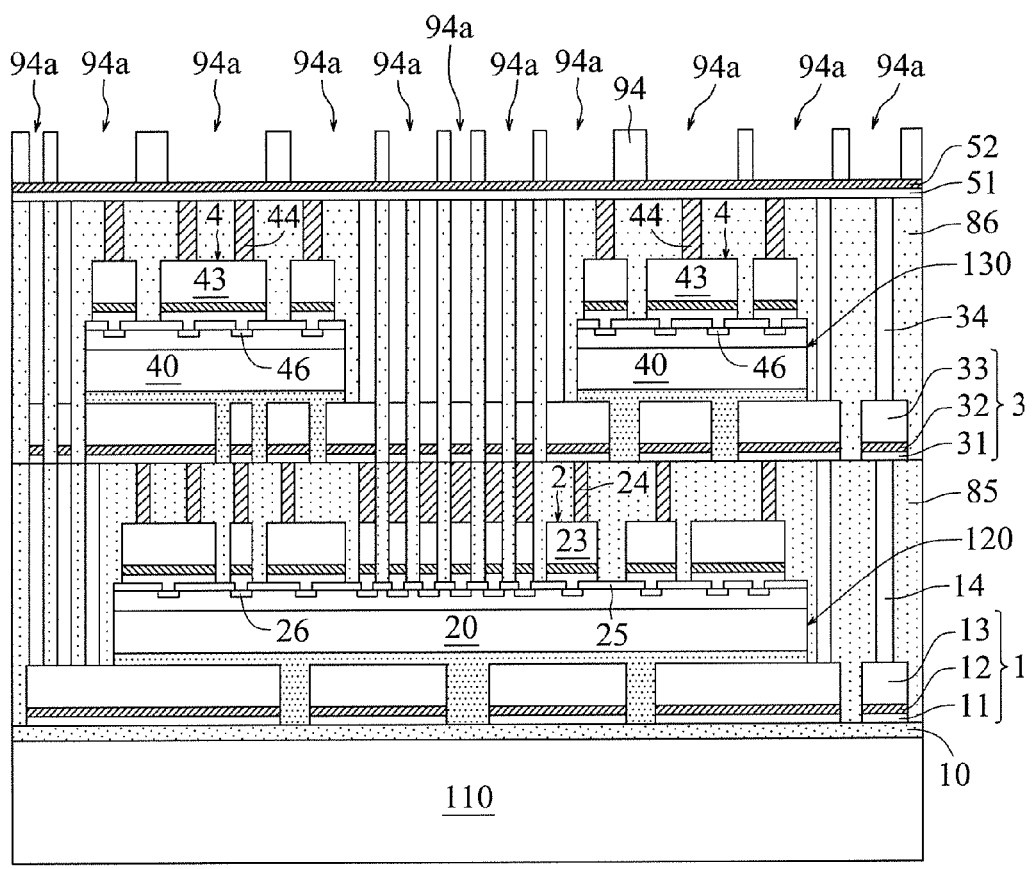

Next, referring to FIG. 23, an adhesion layer 51 having a thickness, e.g., less than 1 micrometer, such as between 1 nanometer and 0.5 micrometers, can be formed on the top surface 86a of the filling or encapsulating layer 86, on the top surfaces 44a of the metal pillars or bumps 44 and on the top surfaces 34a of the metal pillars or bumps 34 by using a physical-vapor deposition (PVD) process, such as sputtering process or evaporation process, or a chemical-vapor deposition (CVD) process. Next, a seed layer 52 having a thickness, e.g., less than 1 micrometer, such as between 10 nanometers and 0.8 micrometers, can be formed on the adhesion layer 51 by using a physical-vapor deposition (PVD) process, such as sputtering process or evaporation process, a chemical-vapor deposition (CVD) process or an electroless plating process. Next, a photoresist layer 94, such as positive-type photoresist layer or negative-type photoresist layer (preferred), having a thickness, e.g., greater than 1 micrometer can be formed on the seed layer 52 by using a spin-on coating process or a lamination process. Next, the photoresist layer 94 is patterned with processes of lithographic, light exposure and development to form multiple openings 94a in the photoresist layer 94 exposing the seed layer 52.

The material of the adhesion layer 51 may include titanium, a titanium-tungsten alloy, titanium nitride, chromium, tantalum, tantalum nitride, nickel or nickel vanadium. The material of the seed layer 52 may include copper, titanium-copper alloy, silver, gold, nickel, aluminum, platinum or palladium.

For example, when the adhesion layer 51 is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the top surface 86a of the filling or encapsulating layer 86, on the top surfaces 44a of the metal pillars or bumps 44 and on the top surfaces 34a of the metal pillars or bumps 34, the seed layer 52 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the titanium-containing layer.

Alternatively, when the adhesion layer 51 is formed by sputtering a tantalum-containing layer, such as a single layer of tantalum or tantalum nitride, having a thickness, e.g., less than 1 micrometer, such as between 1 nanometer and 0.5 micrometers, on the top surface 86a of the filling or encapsulating layer 86, on the top surfaces 44a of the metal pillars or bumps 44 and on the top surfaces 34a of the metal pillars or bumps 34, the seed layer 52 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the tantalum-containing layer.

Alternatively, when the adhesion layer 51 is formed by sputtering a chromium-containing layer, such as a single layer of chromium, having a thickness, e.g., less than 1 micrometer, such as between 1 nanometer and 0.5 micrometers, on the top surface 86a of the filling or encapsulating layer 86, on the top surfaces 44a of the metal pillars or bumps 44 and on the top surfaces 34a of the metal pillars or bumps 34, the seed layer 52 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the chromium-containing layer.

Alternatively, when the adhesion layer 51 is formed by sputtering a nickel-containing layer, such as a single layer of nickel or nickel vanadium, having a thickness, e.g., less than 1 micrometer, such as between 1 nanometer and 0.5 micrometers, on the top surface 86a of the filling or encapsulating layer 86, on the top surfaces 44a of the metal pillars or bumps 44 and on the top surfaces 34a of the metal pillars or bumps 34, the seed layer 52 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the nickel-containing layer.

Figure 24:
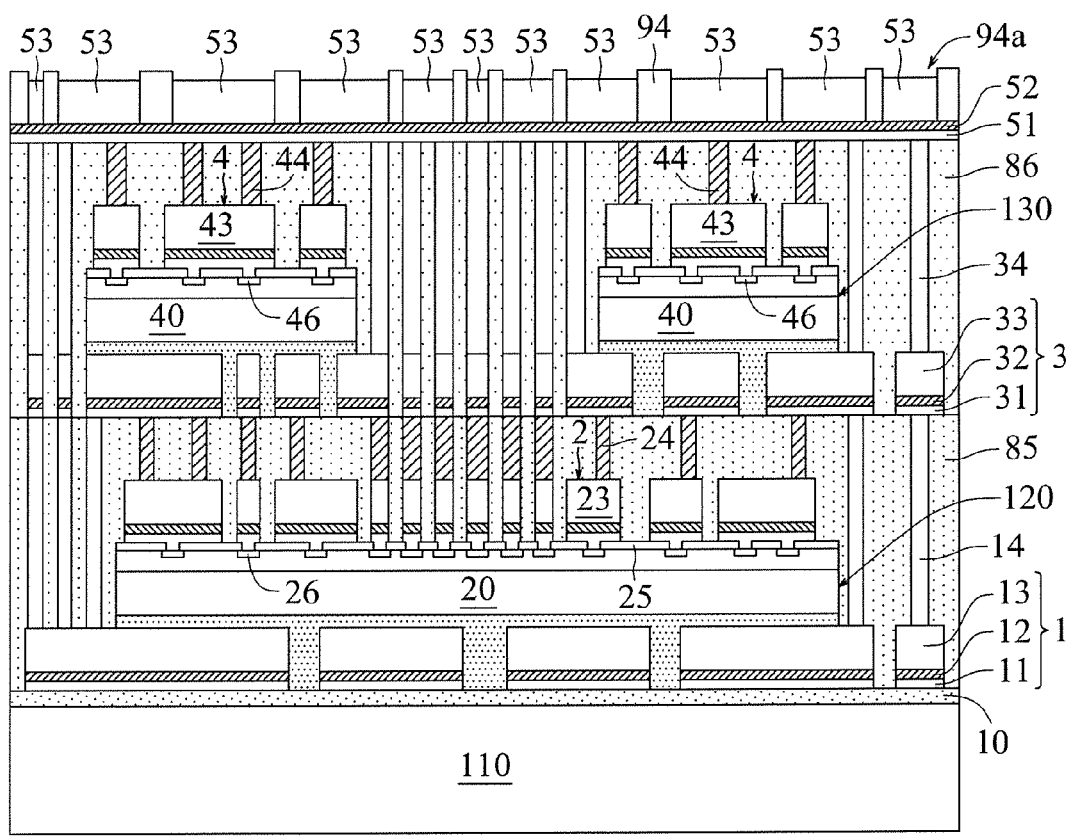

Next, referring to FIG. 24, a metal layer 53, a conductive layer, having a thickness, e.g., greater than 1 micrometer, such as between 2 and 30 micrometers, and preferably between 3 and 10 micrometers, can be formed on the seed layer 52 exposed by the openings 94a and in the openings 94a by using an electroplating or electroless plating process. The metal layer 53 can be a single layer of copper, silver, gold, palladium, platinum, rhodium, ruthenium, rhenium or nickel, or a composite layer made of the previously described metals.

For example, the metal layer 53 can be a single metal layer formed by electroplating a copper layer, to a thickness, e.g., greater than 1 micrometer, such as between 2 and 30 micrometers, and preferably between 3 and 10 micrometers, in the openings 94a and on the seed layer 52, preferably the previously described copper or titanium-copper-alloy seed layer 52, exposed by the openings 94a.

Alternatively, the metal layer 53 can be a single metal layer formed by electroplating a gold layer, to a thickness, e.g., greater than 1 micrometer, such as between 2 and 30 micrometers, and preferably between 3 and 10 micrometers, in the openings 94a and on the seed layer 52, preferably the previously described gold seed layer 52, exposed by the openings 94a.

Alternatively, the metal layer 53 can be composed of double metal layers formed by electroplating a nickel layer, to a thickness, e.g., greater than 1 micrometer, such as between 2 and 30 micrometers, and preferably between 3 and 10 micrometers, in the openings 94a and on the seed layer 52, preferably the previously described copper, nickel or titanium-copper-alloy seed layer 52, exposed by the openings 94a, and then electroplating or electroless plating a gold layer or a palladium layer, to a thickness, e.g., between 0.005 and 10 micrometers, and preferably between 0.05 and 1 micrometers, in the openings 94a and on the electroplated nickel layer in the openings 94a.

Alternatively, the metal layer 53 can be composed of triple metal layers formed by electroplating a copper layer, to a thickness, e.g., greater than 1 micrometer, such as between 2 and 30 micrometers, and preferably between 3 and 10 micrometers, in the openings 94a and on the seed layer 52, preferably the previously described copper or titanium-copper-alloy seed layer 52, exposed by the openings 94a, next electroplating or electroless plating a nickel layer, to a thickness, e.g., between 1 and 15 micrometers or between 0.3 and 1 micrometers, in the openings 94a and on the electroplated copper layer in the openings 94a, and then electroplating or electroless plating a gold layer or a palladium layer, to a thickness, e.g., between 0.005 and 1 micrometers, and preferably between 0.05 and 0.1 micrometers, in the openings 94a and on the electroplated or electroless plated nickel layer in the openings 94a.

Figure 25:
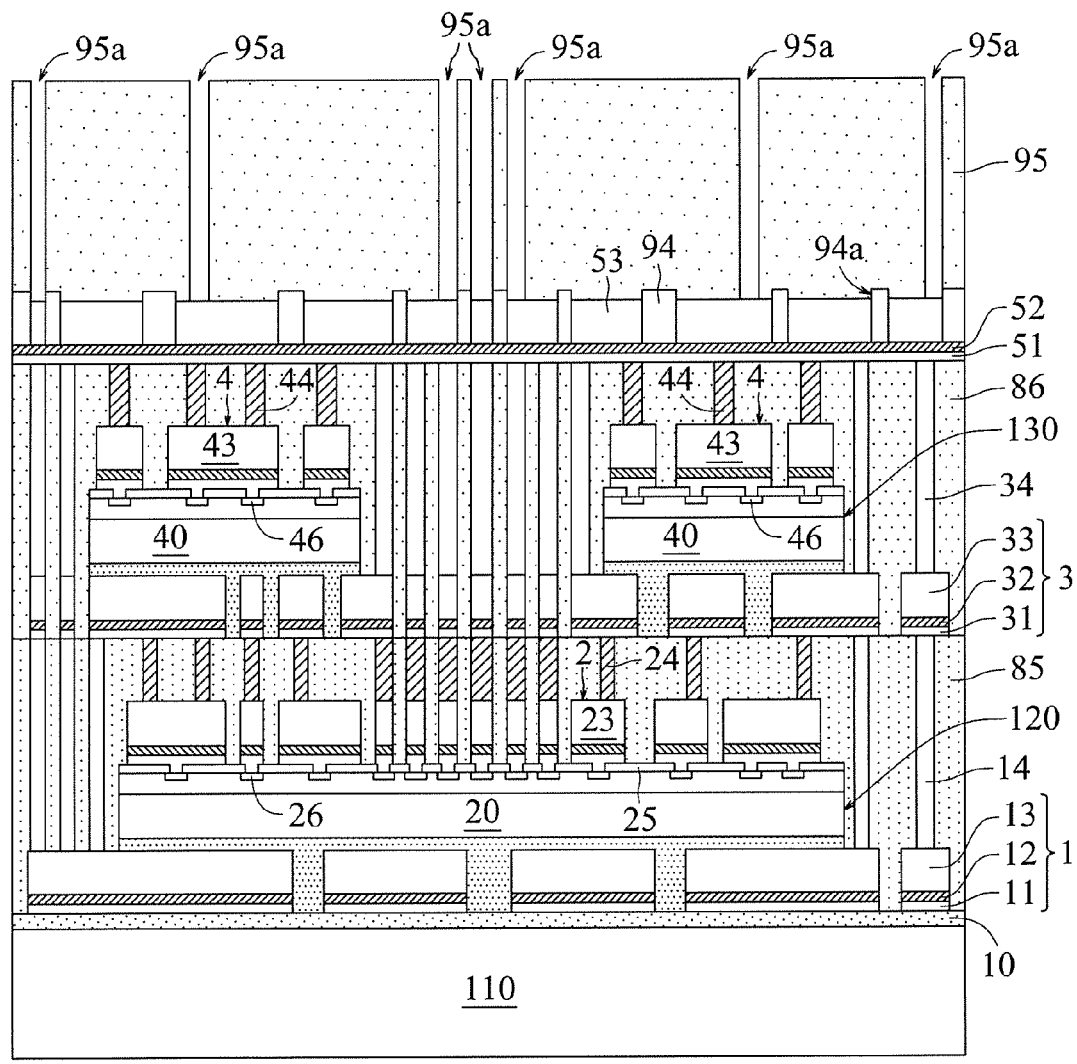

Referring to FIG. 25, after forming the metal layer 53 illustrated in FIG. 24, a photoresist layer 95, such as positive-type photoresist layer or negative-type photoresist layer (preferred), having a thickness, e.g., greater than 1 micrometer can be formed on the photoresist layer 94 and on the metal layer 53 by a spin-on coating process or a lamination process. Next, the photoresist layer 95 is patterned with processes of lithographic, light exposure and development to form multiple cylindrical openings 95a in the photoresist layer 95 exposing multiple contact points of the metal layer 53.

Figure 26:
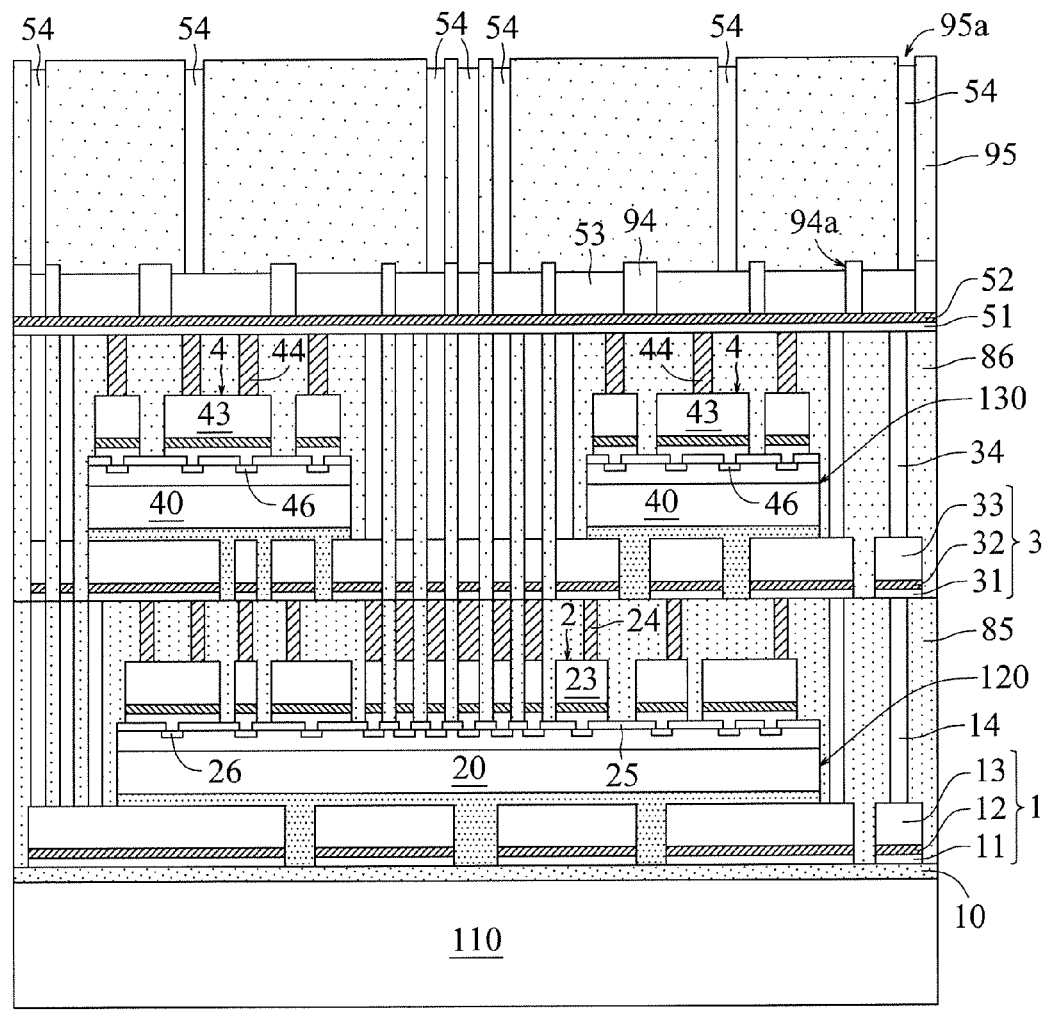

Next, referring to FIG. 26, multiple metal pillars or bumps 54 (intra-chip metal pillars or bumps) having a thickness, e.g., or height greater than 15 micrometers, such as between 15 and 520 micrometers, and preferably between 20 and 110 micrometers, are formed in the cylindrical openings 95a and on the contact points of the metal layer 53 exposed by the cylindrical openings 95a using an electroplating or electroless plating process. The metal pillars or bumps 54 can be composed of a single layer of copper, silver, gold, palladium, platinum, rhodium, ruthenium, rhenium or nickel, or a composite layer made of the previously described metals.

For example, the metal pillars or bumps 54 can be composed of a single metal layer formed by electroplating a copper layer, to a thickness, e.g., greater than 15 micrometers, such as between 15 and 520 micrometers, and preferably between 20 and 110 micrometers, in the cylindrical openings 95a and on the contact points of the metal layer 53, preferably the previously described copper layer 53, exposed by the cylindrical openings 95a.

Alternatively, the metal pillars or bumps 54 can be composed of a single metal layer formed by electroplating a gold layer, to a thickness, e.g., greater than 15 micrometers, such as between 15 and 520 micrometers, and preferably between 20 and 110 micrometers, in the cylindrical openings 95a and on the contact points of the metal layer 53, preferably the previously described gold layer 53, exposed by the cylindrical openings 95a.

Alternatively, the metal pillars or bumps 54 can be composed of a single metal layer formed by electroplating a nickel layer, to a thickness, e.g., greater than 15 micrometers, such as between 15 and 520 micrometers, and preferably between 20 and 110 micrometers, in the cylindrical openings 95a and on the contact points of the metal layer 53, preferably the previously described nickel or copper layer 53, exposed by the cylindrical openings 95a.

Alternatively, the metal pillars or bumps 54 can be composed of triple metal layers formed by electroplating a copper layer, to a thickness, e.g., greater than 10 micrometers, such as between 15 and 500 micrometers, and preferably between 20 and 100 micrometers, in the cylindrical openings 95a and on the contact points of the metal layer 53, preferably the previously described copper layer 53, exposed by the cylindrical openings 95a, next electroplating or electroless plating a nickel layer, to a thickness, e.g., between 1 and 15 micrometers or between 0.3 and 1 micrometers, in the cylindrical openings 95a and on the electroplated copper layer in the cylindrical openings 95a, and then electroplating or electroless plating a gold layer or a palladium layer, to a thickness, e.g., between 0.005 and 1 micrometers, and preferably between 0.05 and 0.1 micrometers, in the cylindrical openings 95a and on the electroplated or electroless plated nickel layer in the cylindrical openings 95a.

Figure 27:
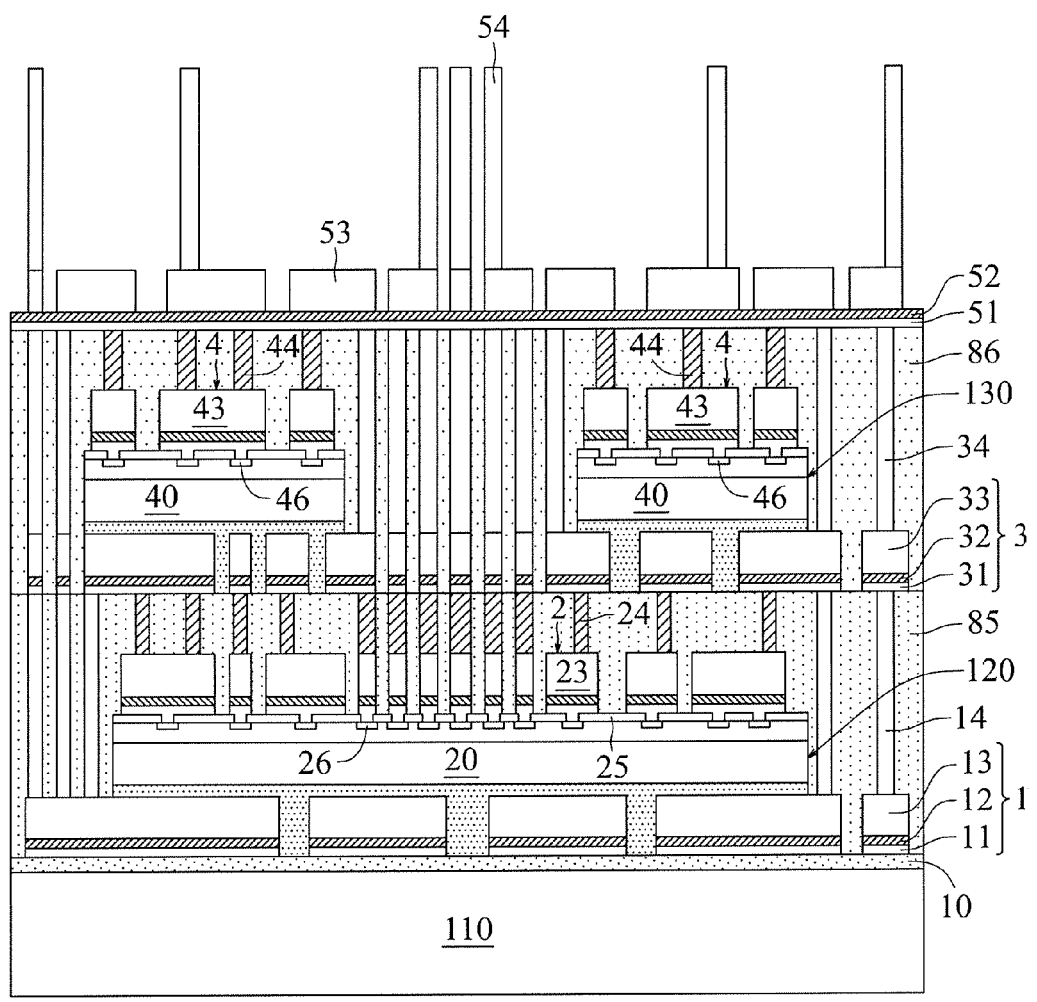

Referring to FIG. 27, after forming the metal pillars or bumps 54, the photoresist layers 94 and 95 are removed using a chemical solution containing amine or $NaCO_3$. Accordingly, the metal pillars or bumps 54 can be formed on the metal layer 53 after the photoresist layers 94 and 95 are removed.

Alternatively, another process for forming the metal pillars or bumps 54 on the metal layer 53 can be performed by the following steps. First, the photoresist layer 94 is removed using a chemical solution containing amine or $NaCO_3$ after forming the metal layer 53 illustrated in FIG. 24. Next, the photoresist layer 95 illustrated in FIG. 25 can be formed on the metal layer 53 and on the seed layer 52 by a spin-on coating process or a lamination process. Next, the photoresist layer 95 is patterned with the processes of lithographic, light exposure and development to form the cylindrical openings 95a in the photoresist layer 95 exposing the contact points of the metal layer 53. Next, the metal pillars or bumps 54 are formed in the cylindrical openings 95a and on the contact points of the metal layer 53 exposed by the cylindrical openings 95a using an electroplating or electroless plating process, which can be referred to as the step illustrated in FIG. 26. Next, the photoresist layer 95 is removed using a chemical solution containing amine or $NaCO_3$. Accordingly, the metal pillars or bumps 54 can be formed on the metal layer 53 after the photoresist layer 95 is removed.

Alternatively, the process steps illustrated in FIGS. 25 and 26 can be repeated once more for making higher metal pillars or bumps, if necessary, that is, another photoresist layer is formed on the photoresist layer 95 using a spin-on coating process or a lamination process, next multiple cylindrical openings are formed in the another photoresist layer and expose the metal pillars or bumps 54, next additional metal pillars or bumps are formed on the metal pillars or bumps 54 exposed by the cylindrical openings in the another photoresist layer and in the cylindrical openings in the another photoresist layer using an electroplating or electroless plating process, and then the another photoresist layer and the photoresist layers 94 and 95 are removed using a chemical solution containing amine or $NaCO_3$. The additional metal bumps can be composed of a single layer of copper, silver, gold, palladium, platinum, rhodium, ruthenium, rhenium or nickel, or a composite layer made of the previously described metals.

Figure 28:
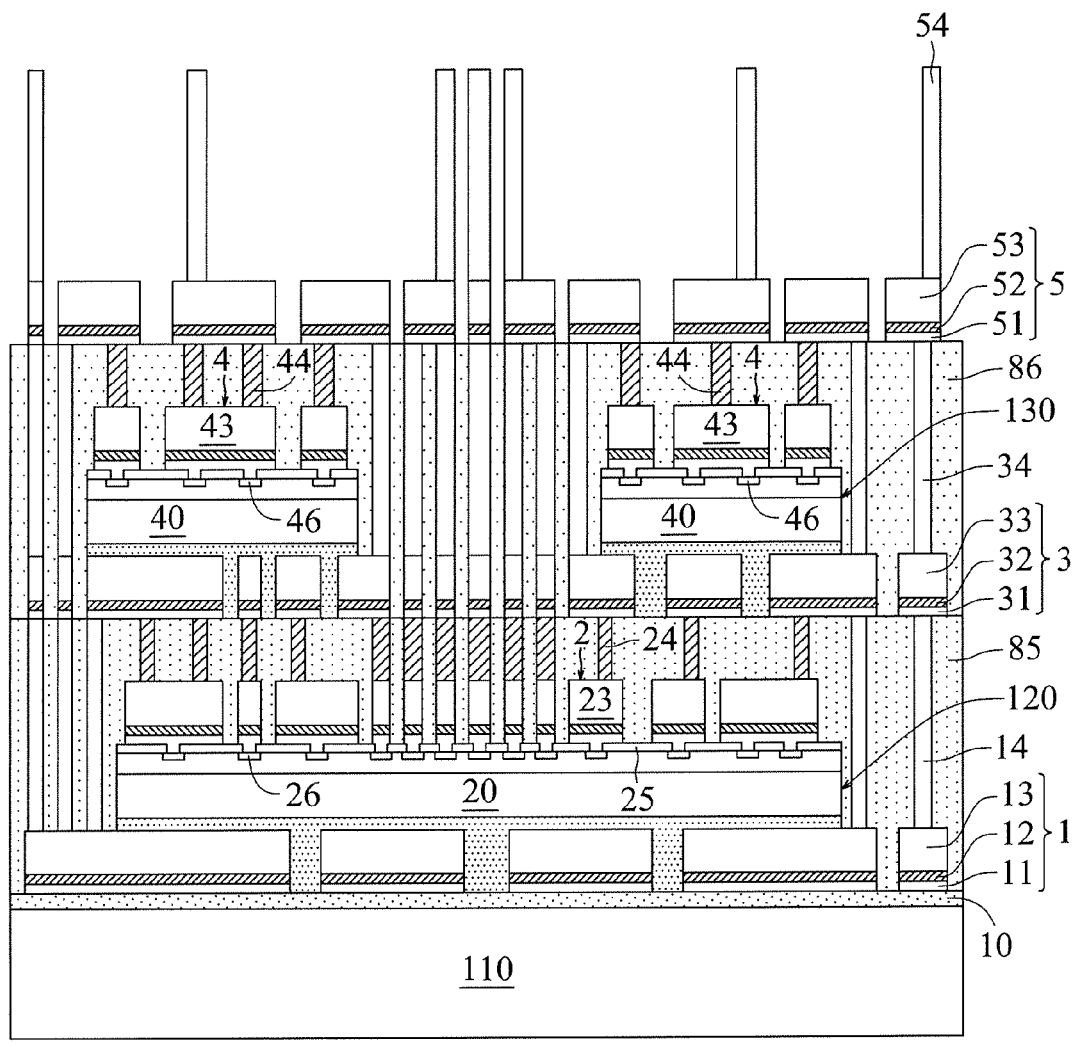

Referring to FIG. 28, after removing the photoresist layers 94 and 95, the seed layer 52 not under the metal layer 53 is removed by using a wet chemical etching process or a reactive ion etching (RIE) process, and then the adhesion layer 51 not under the metal layer 53 is removed by using a wet chemical etching process or a reactive ion etching (RIE) process.

Accordingly, the adhesion layer 51, the seed layer 52 and the metal layer 53 compose a patterned metal layer 5 formed on the top surface 86a of the filling or encapsulating layer 86, on the top surfaces 44a of the metal pillars or bumps 44 and on the top surfaces 34a of the metal pillars or bumps 34. The metal pillars or bumps 54 are formed on the metal layer 53 of the patterned metal layer 5, and the pitch between neighboring or adjacent pairs of metal pillars or bumps 54 can be, e.g., greater than 100 micrometers, such as between 100 and 250 micrometers, or less than 100 micrometers, such as between 5 and 50 micrometers or between 50 and 100 micrometers. Each of the metal pillars or bumps 54 may have a suitable width or diameter, e.g., greater than 5 micrometers, such as between 5 and 300 micrometers, and preferably between 5 and 50 micrometers. The patterned metal layer 5 may include a metal interconnect or trace, such as signal trace, clock bus, clock trace, power plane, power bus, power trace, ground plane, ground bus or ground trace, connecting one or more of the metal pillars or bumps 54 to one or more of the metal pillars or bumps 34, to one or more of the metal pillars or bumps 44, or to multiple of the metal pillars or bumps 34 and multiple of the metal pillars or bumps 44. A coverage ratio of an area of the patterned metal layer 5 covering a ground or polished surface including the top surfaces 34a, 44a and 86a shown in FIG. 22 to an area of the ground or polished surface ranges from 50% to 95%, and preferably ranges from 60% to 90%. Each of the chips 130 may have one of the metal traces or pads 46 connected to multiple of the metal traces or pads 26 in one or more of the chips 120 through, in sequence, the patterned metal layer 4, one of the metal pillars or bumps 44, the patterned metal layer 5, one or more of the metal pillars or bumps 34, the patterned metal layer 3, multiple of the metal pillars or bumps 24, and the patterned metal layer 2.

Figure 29:
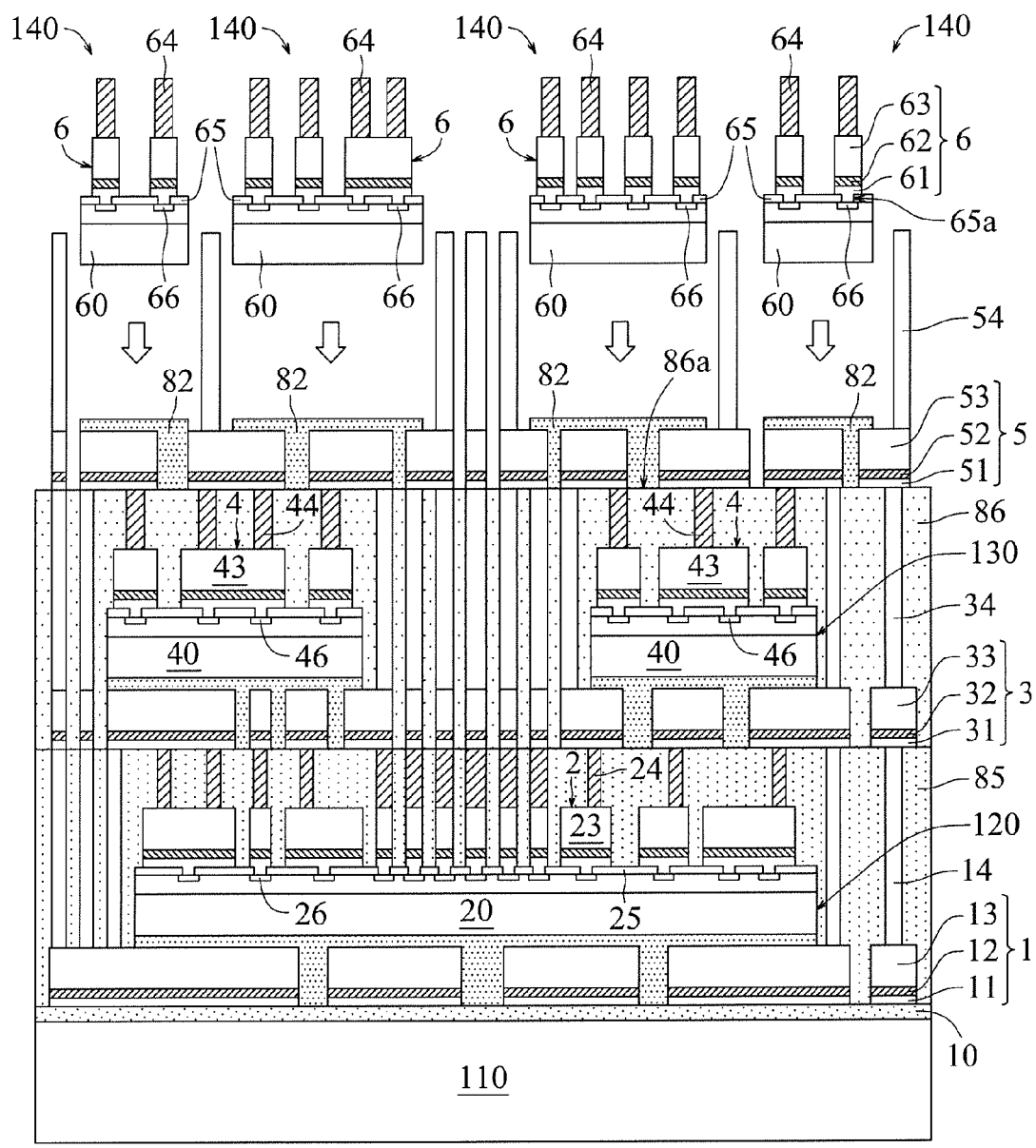
Figure 30:
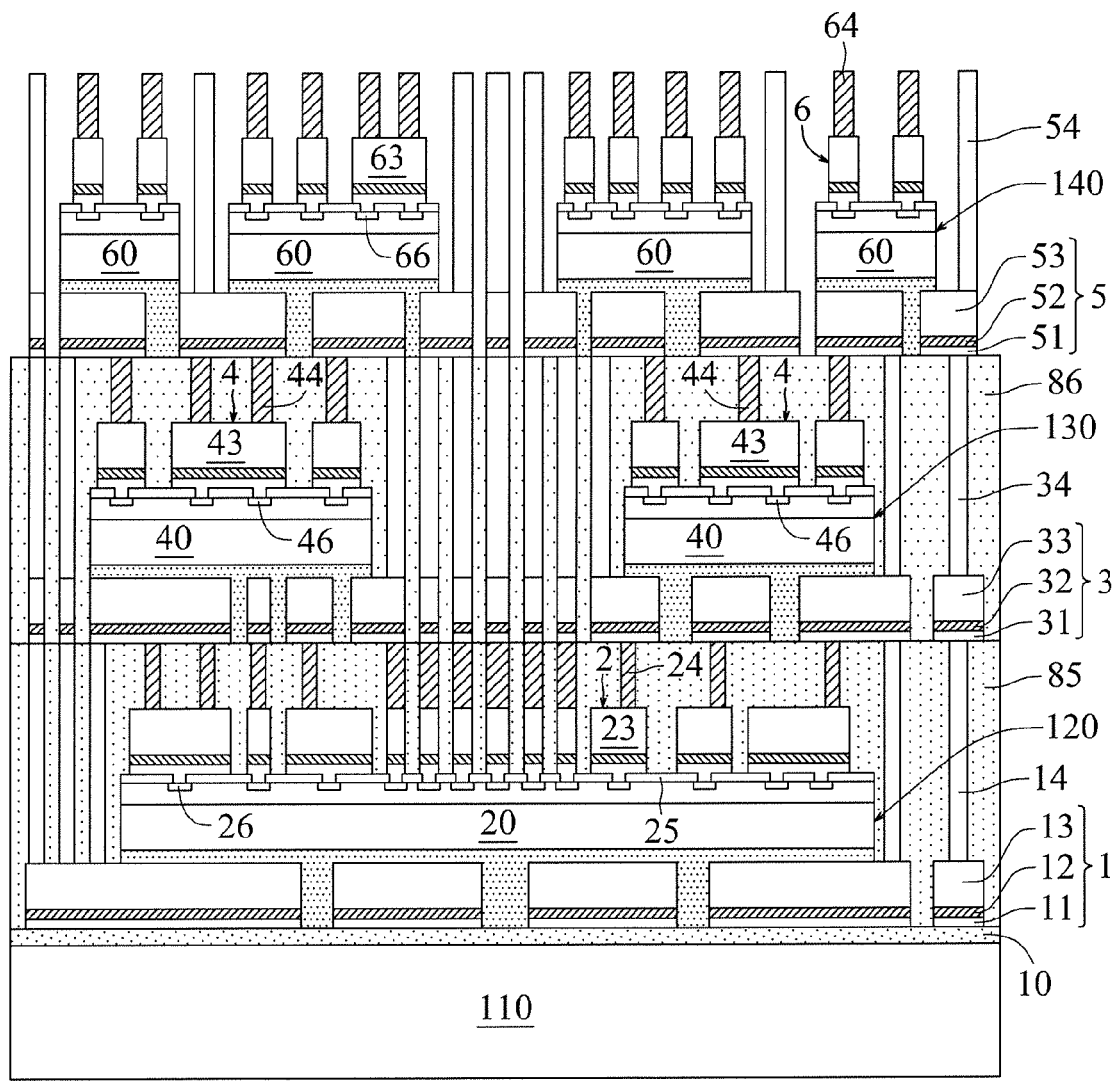

Next, referring to FIGS. 29 and 30, a glue (or, adhesive) material 82 can be formed on the metal layer 53 of the patterned metal layer 5 and on the top surface 86a of the filling or encapsulating layer 86 by using a dispensing process, a lamination process or a screen-printing process, and then multiple chips 140 can be attached to the metal layer 53 of the patterned metal layer 5 and to the top surface 86a of the filling or encapsulating layer 86 by the glue material 82.

Alternatively, another technique to attach the chips 140 is by first forming the glue material 82 onto bottom surfaces of the chips 140 and then attaching the chips 140 to the metal layer 53 of the patterned metal layer 5 and to the top surface 86a of the filling or encapsulating layer 86 through the glue material 82 using, e.g., a thermal compression process.

Alternatively, after the step illustrated in FIG. 28, a polymer layer may be formed on the metal layer 53 of the patterned metal layer 5 and on the top surface 86a of the filling or encapsulating layer 86, and then the chips 140 can be attached to the polymer layer by the glue material 82. The polymer layer can be a polyimide layer or a benzocyclobutene layer having a suitable thickness, e.g., between 2 and 30 micrometers. The glue material 82 can be formed on the polymer layer, and the chips 140 can be formed on the glue material 82.

Examples of suitable glue material 82 include, but are not limited to, epoxy, polyimide, benzocyclobutane (BCB), poly-benzoxazole (PBO), poly-phenylene oxide (PPO), silosane or SU-8, and may have a suitable thickness, between the metal layer 53 of the patterned metal layer 5 and any one of the chips 140, greater than 3 micrometers, such as between 3 and 100 micrometers, and preferably between 5 and 50 micrometers or between 10 and 30 micrometers.

Each of the chips 140 includes a semiconductor substrate 60, multiple transistors, such as NMOS transistors, PMOS transistors or bipolar transistors, in and/or over the semiconductor substrate 60, multiple fine-line metal layers over the semiconductor substrate 60, multiple dielectric layers over the semiconductor substrate 60 and between the fine-line metal layers, multiple via plugs of copper or tungsten in the dielectric layers, a passivation layer 65 over the semiconductor substrate 60, over the transistors, over the dielectric layers and over the fine-line metal layers, a patterned metal layer 6 on the passivation layer 65, and multiple metal pillars or bumps 64 (on-chip metal pillars or bumps) on the patterned metal layer 6. In each of the chips 140, a coverage ratio of an area of the patterned metal layer 6 covering a top surface of the passivation layer 65 to an area of the top surface ranges from 50% to 95%, and preferably can range from, for example, 60% to 90%. The transistors can be provided for NOR gates, NAND gates, AND gates, OR gates, flash memory cells, static random access memory (SRAM) cells, dynamic random access memory (DRAM) cells, non-volatile memory cells, erasable programmable read-only memory (EPROM) cells, read-only memory (ROM) cells, magnetic random access memory (MRAM) cells, sense amplifiers, operational amplifiers, adders, multiplexers, diplexers, multipliers, analog circuits, analog-to-digital (A/D) converters, digital-to-analog (D/A) converters, inverters, complementary-metal-oxide-semiconductor (CMOS) sensors, and/or charge coupled devices (CCD) or the like. The dielectric layers can be composed of a single layer of silicon oxide, silicon nitride, silicon oxynitride, silicon carbon nitride or silicon oxycarbide, or a composite layer made of the previously described materials. The fine-line metal layers may include aluminum, aluminum-copper-alloy or electroplated copper or other suitable metallic materials.

In each of the chips 140, multiple metal traces or pads 66 provided by the topmost fine-line metal layer are formed over the semiconductor substrate 60, on one of the dielectric layers and under the passivation layer 65. Multiple openings 65a in the passivation layer 65 are over multiple contact points of the metal traces or pads 66 and expose them, and the contact points of the metal traces or pads 66 are at bottoms of the openings 65a. Each of the openings 65a has a suitable width or diameter, e.g., between 0.5 and 100 micrometers, and preferably between 1 and 20 micrometers. The patterned metal layer 6 of each chip 140 can be formed on the contact points, exposed by the openings 65a, of the metal traces or pads 66 and on the passivation layer 65, and can be connected to the contact points, exposed by the openings 65a, of the metal traces or pads 66 through the openings 65a. The metal traces or pads 66 may include aluminum, aluminum-copper-alloy or electroplated copper.

Each of the chips 140 can have multiple circuit interconnects, provided by the fine-line metal layers and the via plugs, between the semiconductor substrate 60 and the passivation layer 65. The circuit interconnects may have a suitable thickness, e.g., between 10 nanometers and 2 micrometers, and may include, e.g., aluminum, aluminum-copper-alloy, electroplated copper or tungsten.

Alternatively, each of the chips 140 may further include multiple carbon nanotube interconnects between the semiconductor substrate 60 and the passivation layer 65, and an organic polymer layer with a suitable thickness, e.g., greater than 3 micrometers, such as between 3 and 20 micrometers, and preferably between 5 and 12 micrometers, on the passivation layer 65. Multiple openings in the organic polymer layer are over the contact points, exposed by the openings 65a in the passivation layer 65, of the metal traces or pads 66 and expose the contact points. The organic polymer layer can be made of a suitable material or materials, examples of which include, but are not limited to, polyimide, benzocyclobutane (BCB), polybenzoxazole (PBO), poly-phenylene oxide (PPO), silosane, SU-8 or epoxy. In this case, each of the chips 140 has the patterned metal layer 6 formed on the contact points of the metal traces or pads 66, on the organic polymer layer and over the passivation layer 65, and connected to the contact points of the metal traces or pads 66 through the openings in the organic polymer layer and through the openings 65a in the passivation layer 65. Each of the chips 140 may have the circuit interconnects connected to the transistors through the carbon nanotube interconnects.

The semiconductor substrate 60 may be a silicon substrate or a gallium arsenide (GaAs) substrate, and may have a thickness, e.g., greater than 1 micrometer, such as between 1 and 30 micrometers, between 2 and 10 micrometers, between 5 and 50 micrometers, between 10 and 100 micrometers or between 10 and 500 micrometers.

The passivation layer 65 can be formed by a suitable process or processes, e.g., a chemical vapor deposition (CVD) method. The passivation layer 65 can have a thickness, e.g., greater than 0.2 micrometers, such as between 0.3 and 1.5 micrometers. The passivation layer 65 can be made of silicon oxide (such as $SiO_2$), silicon nitride (such as $Si_3N_4$), silicon oxynitride, silicon oxycarbide, phosphosilicate glass (PSG), silicon carbon nitride or a composite of the previously described materials. The passivation layer 65 can include or be composed of one or more inorganic layers. For example, the passivation layer 65 can be composed of an oxide layer, such as silicon oxide or silicon oxycarbide, having a thickness, e.g., between 0.2 and 1.2 micrometers and a nitride layer, such as silicon nitride, silicon oxynitride or silicon carbon nitride, having a thickness, e.g., between 0.2 and 1.2 micrometers on the oxide layer. Alternatively, the passivation layer 65 can be a single layer of silicon nitride, silicon oxynitride or silicon carbon nitride having a thickness, e.g., between 0.3 and 1.5 micrometers. For exemplary embodiments, the passivation layer 65 in one of the chips 140 can include a topmost inorganic layer of the one of the chips 140. For example, the topmost inorganic layer of the one of the chips 140 can be a layer of a nitrogen-containing compound, such as silicon nitride, silicon oxynitride, silicon carbon nitride or silicon carbon oxynitride, having a suitable thickness, e.g., greater than 0.2 micrometers, such as between 0.2 and 1.5 micrometers, or a layer of an oxygen-containing compound, such as silicon oxide, silicon oxynitride, silicon carbon oxide or silicon carbon oxynitride, having a suitable thickness, e.g., greater than 0.2 micrometers, such as between 0.2 and 1.5 micrometers.

Each of the chips 140 has multiple metal interconnects or traces provided by the patterned metal layer 6 and formed on the contact points of the metal traces or pads 66 and on the passivation layer 65. And each of the chips 140 has the metal pillars or bumps 64 formed on the metal interconnects or traces and connected to the contact points of the metal traces or pads 66 through the metal interconnects or traces and through the openings 65a in the passivation layer 65. The metal interconnects or traces can be signal traces, power planes, power buses, power traces, ground planes, ground buses or ground traces. For example, in each of the chips 140, one of the contact points of the metal traces or pads 66 can be connected to another one of the contact points of the metal traces or pads 66 through one of the metal interconnects or traces, and one or more of the metal pillars or bumps 64 on the one of the metal interconnects or traces can be connected to the two contact points of the two metal traces or pads 66 through the one of the metal interconnects or traces. And a gap is between the two metal traces or pads 66 providing the two contact points connected to each other through the one of the metal interconnects or traces provided by the patterned metal layer 6.

Each of the chips 140 has the patterned metal layer 6 composed of an adhesion layer 61 on the contact points of the metal traces or pads 66 and on the passivation layer 65 or organic polymer layer, a seed layer 62 on the adhesion layer 61, and a metal layer 63 on the seed layer 62, and has the metal pillars or bumps 64 formed on the metal layer 63 of the patterned metal layer 6 and connected to the contact points of the metal traces or pads 66 through the patterned metal layer 6 and through the openings 65a in the passivation layer 65.

The adhesion layer 61 may have a thickness, e.g., less than 1 micrometer, such as between 1 nanometer and 0.5 micrometers, and preferably between 1 nanometer and 0.1 micrometers. The seed layer 62 may have a thickness, e.g., less than 1 micrometer, such as between 10 nanometers and 0.8 micrometers, and preferably between 20 nanometer and 0.5 micrometers. The material of the adhesion layer 61 may include titanium, a titanium-tungsten alloy, titanium nitride, chromium, tantalum, tantalum nitride, nickel or nickel vanadium. The material of the seed layer 62 may include copper, titanium-copper alloy, silver, gold, nickel, aluminum, platinum or palladium.

For example, when the adhesion layer 61 is a titanium-containing layer, such as a single layer of titanium-tungsten alloy, titanium or titanium nitride, having a thickness, e.g., less than 1 micrometer, such as between 1 nanometer and 0.5 micrometers, and preferably between 1 nanometer and 0.1 micrometers, on the contact points of the metal traces or pads 66 and on the passivation layer 65 or organic polymer layer, the seed layer 62 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the titanium-containing layer.

Alternatively, when the adhesion layer 61 is a tantalum-containing layer, such as a single layer of tantalum or tantalum nitride, having a thickness, e.g., less than 1 micrometer, such as between 1 nanometer and 0.5 micrometers, and preferably between 1 nanometer and 0.1 micrometers, on the contact points of the metal traces or pads 66 and on the passivation layer 65 or organic polymer layer, the seed layer 62 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the tantalum-containing layer.

Alternatively, when the adhesion layer 61 is a chromium-containing layer, such as a single layer of chromium, having a thickness, e.g., less than 1 micrometer, such as between 1 nanometer and 0.5 micrometers, and preferably between 1 nanometer and 0.1 micrometers, on the contact points of the metal traces or pads 66 and on the passivation layer 65 or organic polymer layer, the seed layer 62 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the chromium-containing layer.

Alternatively, when the adhesion layer 61 is a nickel-containing layer, such as a single layer of nickel or nickel vanadium, having a thickness, e.g., less than 1 micrometer, such as between 1 nanometer and 0.5 micrometers, and preferably between 1 nanometer and 0.1 micrometers, on the contact points of the metal traces or pads 66 and on the passivation layer 65 or organic polymer layer, the seed layer 62 can be a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, and preferably between 20 nanometer and 0.5 micrometers, on the nickel-containing layer.

The metal layer 63 may have a thickness, e.g., greater than 1 micrometer, such as between 2 and 30 micrometers, and preferably between 3 and 10 micrometers. Sidewalls of the metal layer 63 are not covered by the adhesion layer 61 and the seed layer 62. The metal layer 63 can be a single layer of copper, silver, gold, palladium, platinum, rhodium, ruthenium, rhenium or nickel, or a composite layer made of the previously described metals.

For example, the metal layer 63 can be a single copper layer having a thickness, e.g., greater than 1 micrometer, such as between 2 and 30 micrometers, and preferably between 3 and 10 micrometers, on the seed layer 62, preferably the previously described copper or titanium-copper-alloy seed layer 62.

Alternatively, the metal layer 63 can be a single silver layer having a thickness, e.g., greater than 1 micrometer, such as between 2 and 30 micrometers, and preferably between 3 and 10 micrometers, on the seed layer 62, preferably the previously described silver seed layer 62.

Alternatively, the metal layer 63 can be a single gold layer having a thickness, e.g., greater than 1 micrometer, such as between 2 and 30 micrometers, and preferably between 3 and 10 micrometers, on the seed layer 62, preferably the previously described gold seed layer 62.

Alternatively, the metal layer 63 can be a single nickel layer having a thickness, e.g., greater than 1 micrometer, such as between 2 and 30 micrometers, and preferably between 3 and 10 micrometers, on the seed layer 62, preferably the previously described copper, nickel or titanium-copper-alloy seed layer 62.

Alternatively, the metal layer 63 can be composed of an electroplated copper layer having a thickness, e.g., greater than 1 micrometer, such as between 2 and 30 micrometers, and preferably between 3 and 10 micrometers, on the seed layer 62, preferably the previously described copper or titanium-copper-alloy seed layer 62, a nickel layer having a thickness, e.g., greater than 1 micrometer, such as between 1 and 15 micrometers, and preferably between 2 and 5 micrometers, on the electroplated copper layer, and a gold or palladium layer having a thickness, e.g., between 0.005 and 1 micrometers, and preferably between 0.05 and 0.1 micrometers, on the nickel layer.

Each of the metal pillars or bumps 64 has a thickness, e.g., or height greater than 5 micrometers, such as between 5 and 50 micrometers, and preferably between 10 and 20 micrometers, and less than that of each of the metal pillars or bumps 54, and has a suitable width or diameter, e.g., between 5 and 100 micrometers, and preferably between 5 and 50 micrometers. The metal pillars or bumps 64 can be composed of a single layer of copper, silver, gold, palladium, platinum, rhodium, ruthenium, rhenium or nickel, or a composite layer made of the previously described metals.

Each chip 140 may include input/output (I/O) circuits serving for chip probing testing (CP testing), for build-in-self testing or for external signal connection, and one of the I/O circuits may have a total loading (total capacitance) between 15 pF and 50 pF. Each of the I/O circuits may include a driver, a receiver and/or an electro static discharge (ESD) circuit. Each of the chips 140 may have built-in self test (BIST) circuits for reducing the testing time for the system-in package or multichip module.

No matter where the chips 140 are provided, any one of the chips 140 can be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a wireless local area network (WLAN) chip, a memory chip, such as flash memory chip, dynamic-random-access-memory (DRAM) chip or statistic-random-access-memory (SRAM) chip, a logic chip, an analog chip, a power device, a regulator, a power management device, a global-positioning-system (GPS) chip, a Bluetooth chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processing-unit (CPU) circuit block, or a system-on chip (SOC) including a graphics-processing-unit (GPU) circuit block and a wireless local area network (WLAN) circuit block, but not including any baseband circuit block and any central-processing-unit (CPU) circuit block. Alternatively, any one of the chips 140 can be a chip including a central-processing-unit (CPU) circuit block designed by x86 architecture or by non x86 architecture, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block, and/or a modem circuit block.

Figure 31:
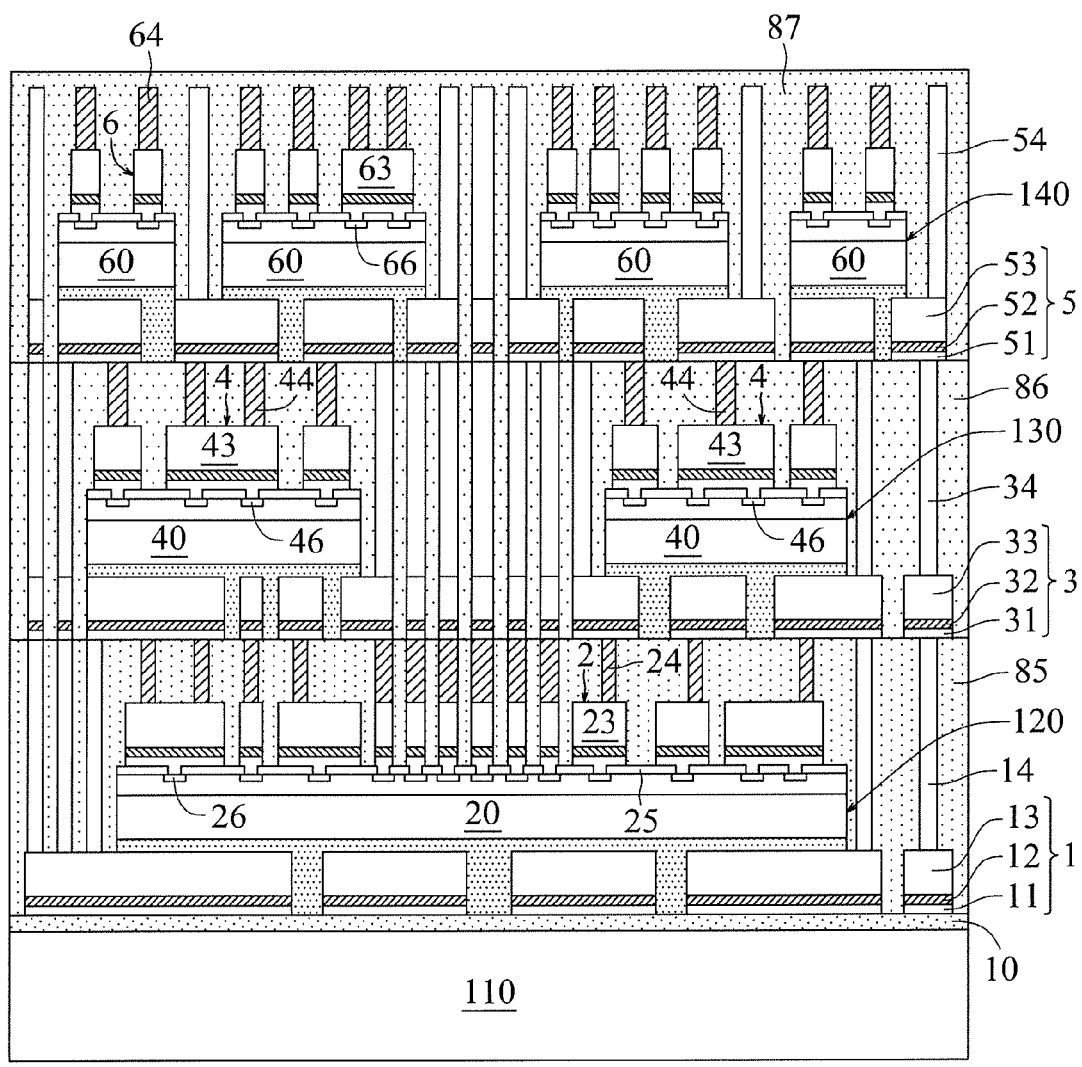

Referring to FIG. 31, after attaching the chips 140 to the metal layer 53 of the patterned metal layer 5 and to the top surface 86a of the filling or encapsulating layer 86, a filling or encapsulating layer 87 is formed on the top surface 86a of the filling or encapsulating layer 86, on the metal layer 53 of the patterned metal layer 5, on the chips 140, on the metal layer 63 of the patterned metal layer 6 and on tops of the metal pillars or bumps 54 and 64 by using a molding process, a spin coating process, a lamination process or a printing process. The filling or encapsulating layer 87 can be a polymer layer, such as epoxy layer, polyimide layer, benzocyclobutane (BCB) layer, polybenzoxazole (PBO) layer, poly-phenylene oxide (PPO) layer, silosane layer or SU-8 layer, having a thickness, e.g., between 20 and 500 micrometers, and preferably between 30 and 100 micrometers.

Figure 32:
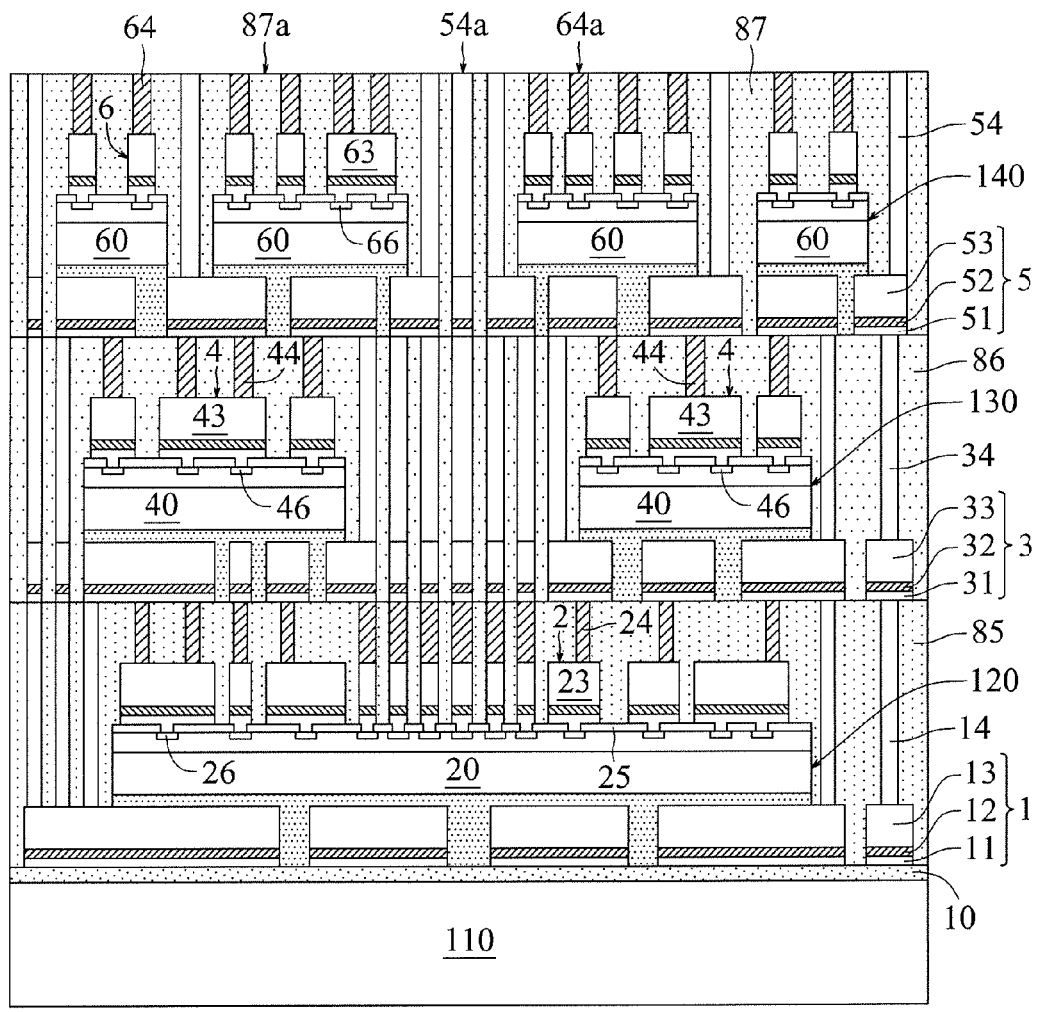

Next, referring to FIG. 32, the filling or encapsulating layer 87 is ground or polished by a grinding or polishing process, such as mechanical grinding process, mechanical polishing process or chemical mechanical polishing (CMP) process. Accordingly, top surfaces 54a of the metal pillars or bumps 54 and top surfaces 64a of the metal pillars or bumps 64 are exposed and are not covered by the filling or encapsulating layer 87, and the top surfaces 64a of the metal pillars or bumps 64 are substantially coplanar with the top surfaces 54a of the metal pillars or bumps 54 and with a top surface 87*a* of the filling or encapsulating layer 87.

After the grinding or polishing process, each of the metal pillars or bumps 64 has a thickness, e.g., or height greater than 5 micrometers, such as between 5 and 50 micrometers, and preferably between 10 and 20 micrometers, and each of the metal pillars or bumps 54 has a thickness, e.g., or height greater than 15 micrometers, such as between 15 and 520 micrometers, and preferably between 20 and 110 micrometers, and greater than that of each of the metal pillars or bumps 64.

After the grinding or polishing process, each of the metal pillars or bumps 64 has a suitable width or diameter, e.g., between 5 and 100 micrometers, and preferably between 5 and 50 micrometers. Each of the metal pillars or bumps 54 has a suitable width or diameter, e.g., greater than 5 micrometers, such as between 5 and 300 micrometers, and preferably between 5 and 50 micrometers.

The metal pillars or bumps 64, after the grinding or polishing process, can be composed of a single layer of copper, silver, gold, palladium, platinum, rhodium, ruthenium, rhenium or nickel, or a composite layer made of the previously described metals.

For example, each of the chips 140 has the metal pillars or bumps 64, after the grinding or polishing process, composed of a single copper layer having a thickness, e.g., greater than 5 micrometers, such as between 5 and 50 micrometers, and preferably between 10 and 20 micrometers, on the metal layer 63, preferably the previously described copper layer 63.

Alternatively, each of the chips 140 has the metal pillars or bumps 64, after the grinding or polishing process, composed of a single silver layer having a thickness, e.g., greater than 5 micrometers, such as between 5 and 50 micrometers, and preferably between 10 and 20 micrometers, on the metal layer 63, preferably the previously described silver layer 63.

Alternatively, each of the chips 140 has the metal pillars or bumps 64, after the grinding or polishing process, composed of a single gold layer having a thickness, e.g., greater than 5 micrometers, such as between 5 and 50 micrometers, and preferably between 10 and 20 micrometers, on the metal layer 63, preferably the previously described gold layer 63.

Alternatively, each of the chips 140 has the metal pillars or bumps 64, after the grinding or polishing process, composed of a single nickel layer having a thickness, e.g., greater than 5 micrometers, such as between 5 and 50 micrometers, and preferably between 10 and 20 micrometers, on the metal layer 63, preferably the previously described copper or nickel layer 63.

Alternatively, each of the chips 140 has the metal pillars or bumps 64, after the grinding or polishing process, composed of an electroplated copper layer having a thickness, e.g., greater than 5 micrometers, such as between 5 and 50 micrometers, and preferably between 10 and 20 micrometers, on the metal layer 63, preferably the previously described copper layer 63, an electroplated or electroless plated nickel layer having a thickness, e.g., greater than 1 micrometer, such as between 1 and 5 micrometers, on the electroplated copper layer, and an electroplated or electroless plated gold layer having a thickness, e.g., between 0.005 and 1 micrometers, and preferably between 0.05 and 0.1 micrometers, on the electroplated or electroless plated nickel layer.

Alternatively, each of the chips 140 has the metal pillars or bumps 64, after the grinding or polishing process, composed of an electroplated copper layer having a thickness, e.g., greater than 5 micrometers, such as between 5 and 50 micrometers, and preferably between 10 and 20 micrometers, on the metal layer 63, preferably the previously described copper layer 63, an electroplated or electroless plated nickel layer having a thickness, e.g., greater than 1 micrometer, such as between 1 and 5 micrometers, on the electroplated copper layer, and an electroplated or electroless plated palladium layer having a thickness, e.g., between 0.005 and 1 micrometers, and preferably between 0.05 and 0.1 micrometers, on the electroplated or electroless plated nickel layer.

The metal pillars or bumps 54, after the grinding or polishing process, can be composed of a single layer of copper, silver, gold, palladium, platinum, rhodium, ruthenium, rhenium or nickel, or a composite layer made of the previously described metals.

For example, the metal pillars or bumps 54, after the grinding or polishing process, can be composed of a single copper layer having a thickness, e.g., greater than 15 micrometers, such as between 15 and 520 micrometers, and preferably between 20 and 110 micrometers, on the metal layer 53, preferably the previously described copper layer 53.

Alternatively, the metal pillars or bumps 54, after the grinding or polishing process, can be composed of a single silver layer having a thickness, e.g., greater than 15 micrometers, such as between 15 and 520 micrometers, and preferably between 20 and 110 micrometers, on the metal layer 53, preferably the previously described silver layer 53.

Alternatively, the metal pillars or bumps 54, after the grinding or polishing process, can be composed of a single gold layer having a thickness, e.g., greater than 15 micrometers, such as between 15 and 520 micrometers, and preferably between 20 and 110 micrometers, on the metal layer 53, preferably the previously described gold layer 53.

Alternatively, the metal pillars or bumps 54, after the grinding or polishing process, can be composed of a single nickel layer having a thickness, e.g., greater than 15 micrometers, such as between 15 and 520 micrometers, and preferably between 20 and 110 micrometers, on the metal layer 53, preferably the previously described nickel or copper layer 53.

Alternatively, the metal pillars or bumps 54, after the grinding or polishing process, can be composed of an electroplated copper layer having a thickness, e.g., greater than 10 micrometers, such as between 15 and 500 micrometers, and preferably between 20 and 100 micrometers, on the metal layer 53, preferably the previously described copper layer 53, an electroplated or electroless plated nickel layer having a thickness, e.g., greater than 1 micrometer, such as between 1 and 15 micrometers, and preferably between 2 and 10 micrometers, on the electroplated copper layer, and an electroplated or electroless plated gold layer having a thickness, e.g., between 0.005 and 1 micrometers, and preferably between 0.05 and 0.1 micrometers, on the electroplated or electroless plated nickel layer.

Alternatively, the metal pillars or bumps 54, after the grinding or polishing process, can be composed of an electroplated copper layer having a thickness, e.g., greater than 10 micrometers, such as between 15 and 500 micrometers, and preferably between 20 and 100 micrometers, on the metal layer 53, preferably the previously described copper layer 53, an electroplated or electroless plated nickel layer having a thickness, e.g., greater than 1 micrometer, such as between 1 and 15 micrometers, and preferably between 2 and 10 micrometers, on the electroplated copper layer, and an electroplated or electroless plated palladium layer having a thickness, e.g., between 0.005 and 1 micrometers, and preferably between 0.05 and 0.1 micrometers, on the electroplated or electroless plated nickel layer.

Figure 33:
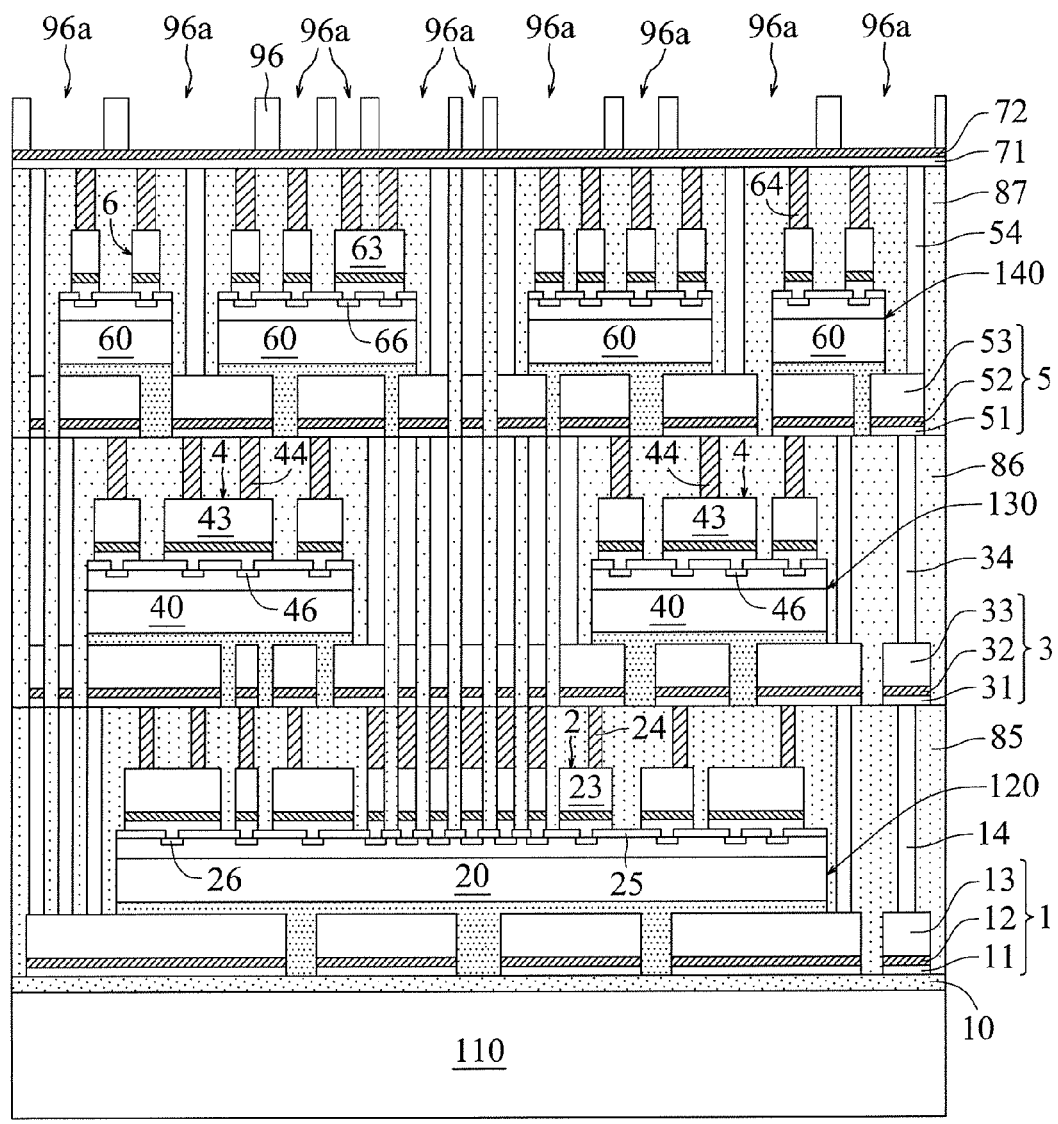

Next, referring to FIG. 33, an adhesion layer 71 having a thickness, e.g., less than 1 micrometer, such as between 1 nanometer and 0.5 micrometers, can be formed on the top surface 87a of the filling or encapsulating layer 87, on the top surfaces 54a of the metal pillars or bumps 54 and on the top surfaces 64a of the metal pillars or bumps 64 by using a physical-vapor deposition (PVD) process, such as sputtering process or evaporation process, or a chemical-vapor deposition (CVD) process. Next, a seed layer 72 having a thickness, e.g., less than 1 micrometer, such as between 10 nanometers and 0.8 micrometers, can be formed on the adhesion layer 71 by using a physical-vapor deposition (PVD) process, such as sputtering process or evaporation process, a chemical-vapor deposition (CVD) process or an electroless plating process. Next, a photoresist layer 96, such as positive-type photoresist layer or negative-type photoresist layer (preferred), having a thickness, e.g., greater than 1 micrometer can be formed on the seed layer 72 by using a spin-on coating process or a lamination process. Next, the photoresist layer 96 is patterned with processes of lithographic, light exposure and development to form multiple openings 96a in the photoresist layer 96 exposing the seed layer 72.

The material of the adhesion layer 71 may include titanium, a titanium-tungsten alloy, titanium nitride, chromium, tantalum, tantalum nitride, nickel or nickel vanadium. The material of the seed layer 72 may include copper, titanium-copper-alloy, silver, gold, nickel, aluminum, platinum or palladium.

For example, when the adhesion layer 71 is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the top surface 87a of the filling or encapsulating layer 87, on the top surfaces 54a of the metal pillars or bumps 54 and on the top surfaces 64a of the metal pillars or bumps 64, the seed layer 72 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the titanium-containing layer.

Alternatively, when the adhesion layer 71 is formed by sputtering a tantalum-containing layer, such as a single layer of tantalum or tantalum nitride, having a thickness, e.g., less than 1 micrometer, such as between 1 nanometer and 0.5 micrometers, on the top surface 87a of the filling or encapsulating layer 87, on the top surfaces 54a of the metal pillars or bumps 54 and on the top surfaces 64a of the metal pillars or bumps 64, the seed layer 72 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the tantalum-containing layer.

Alternatively, when the adhesion layer 71 is formed by sputtering a chromium-containing layer, such as a single layer of chromium, having a thickness, e.g., less than 1 micrometer, such as between 1 nanometer and 0.5 micrometers, on the top surface 87a of the filling or encapsulating layer 87, on the top surfaces 54a of the metal pillars or bumps 54 and on the top surfaces 64a of the metal pillars or bumps 64, the seed layer 72 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the chromium-containing layer.

Alternatively, when the adhesion layer 71 is formed by sputtering a nickel-containing layer, such as a single layer of nickel or nickel vanadium, having a thickness, e.g., less than 1 micrometer, such as between 1 nanometer and 0.5 micrometers, on the top surface 87a of the filling or encapsulating layer 87, on the top surfaces 54a of the metal pillars or bumps 54 and on the top surfaces 64a of the metal pillars or bumps 64, the seed layer 72 can be formed by sputtering a copper layer, a silver layer, a titanium-copper-alloy layer, a gold layer, a nickel layer, an aluminum layer, a platinum layer or a palladium layer with a thickness, e.g., less than 1 micrometer, such as between 10 nanometers and 0.8 micrometers, on the nickel-containing layer.

Figure 34:
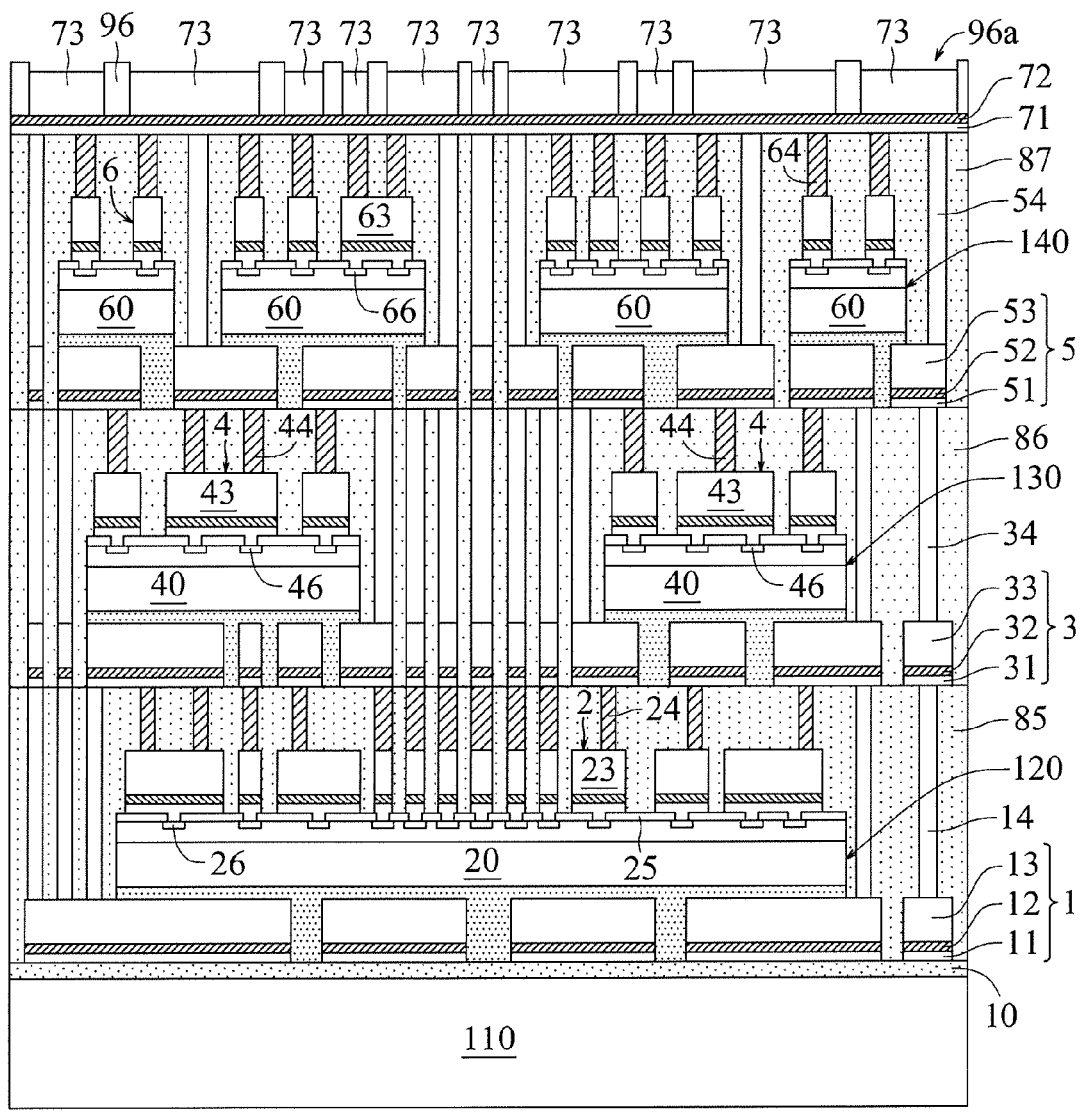

Next, referring to FIG. 34, a metal layer 73, a conductive layer, having a thickness, e.g., greater than 1 micrometer, such as between 2 and 30 micrometers, and preferably between 3 and 10 micrometers, can be formed on the seed layer 72 exposed by the openings 96a and in the openings 96a by using an electroplating or electroless plating process. The metal layer 73 can be a single layer of copper, silver, gold, palladium, platinum, rhodium, ruthenium, rhenium or nickel, or a composite layer made of the previously described metals.

For example, the metal layer 73 can be a single metal layer formed by electroplating a copper layer, to a thickness, e.g., greater than 1 micrometer, such as between 2 and 30 micrometers, and preferably between 3 and 10 micrometers, in the openings 96a and on the seed layer 72, preferably the previously described copper or titanium-copper-alloy seed layer 72, exposed by the openings 96a.

Alternatively, the metal layer 73 can be a single metal layer formed by electroplating a gold layer, to a thickness, e.g., greater than 1 micrometer, such as between 2 and 30 micrometers, and preferably between 3 and 10 micrometers, in the openings 96a and on the seed layer 72, preferably the previously described gold seed layer 72, exposed by the openings 96a.

Alternatively, the metal layer 73 can be composed of double metal layers formed by electroplating a nickel layer, to a thickness, e.g., greater than 1 micrometer, such as between 2 and 30 micrometers, and preferably between 3 and 10 micrometers, in the openings 96a and on the seed layer 72, preferably the previously described copper, nickel or titanium-copper-alloy seed layer 72, exposed by the openings 96a, and then electroplating or electroless plating a gold layer or a palladium layer, to a thickness, e.g., between 0.005 and 10 micrometers, and preferably between 0.05 and 1 micrometers, in the openings 96a and on the electroplated nickel layer in the openings 96a.

Alternatively, the metal layer 73 can be composed of triple metal layers formed by electroplating a copper layer, to a thickness, e.g., greater than 1 micrometer, such as between 2 and 30 micrometers, and preferably between 3 and 10 micrometers, in the openings 96a and on the seed layer 72, preferably the previously described copper or titanium-copper-alloy seed layer 72, exposed by the openings 96a, next electroplating or electroless plating a nickel layer, to a thickness, e.g., between 1 and 15 micrometers or between 0.3 and 1 micrometers, in the openings 96a and on the electroplated copper layer in the openings 96a, and then electroplating or electroless plating a gold layer or a palladium layer, to a thickness, e.g., between 0.005 and 1 micrometers, and preferably between 0.05 and 0.1 micrometers, in the openings 96a and on the electroplated or electroless plated nickel layer in the openings 96a.

Figure 35:
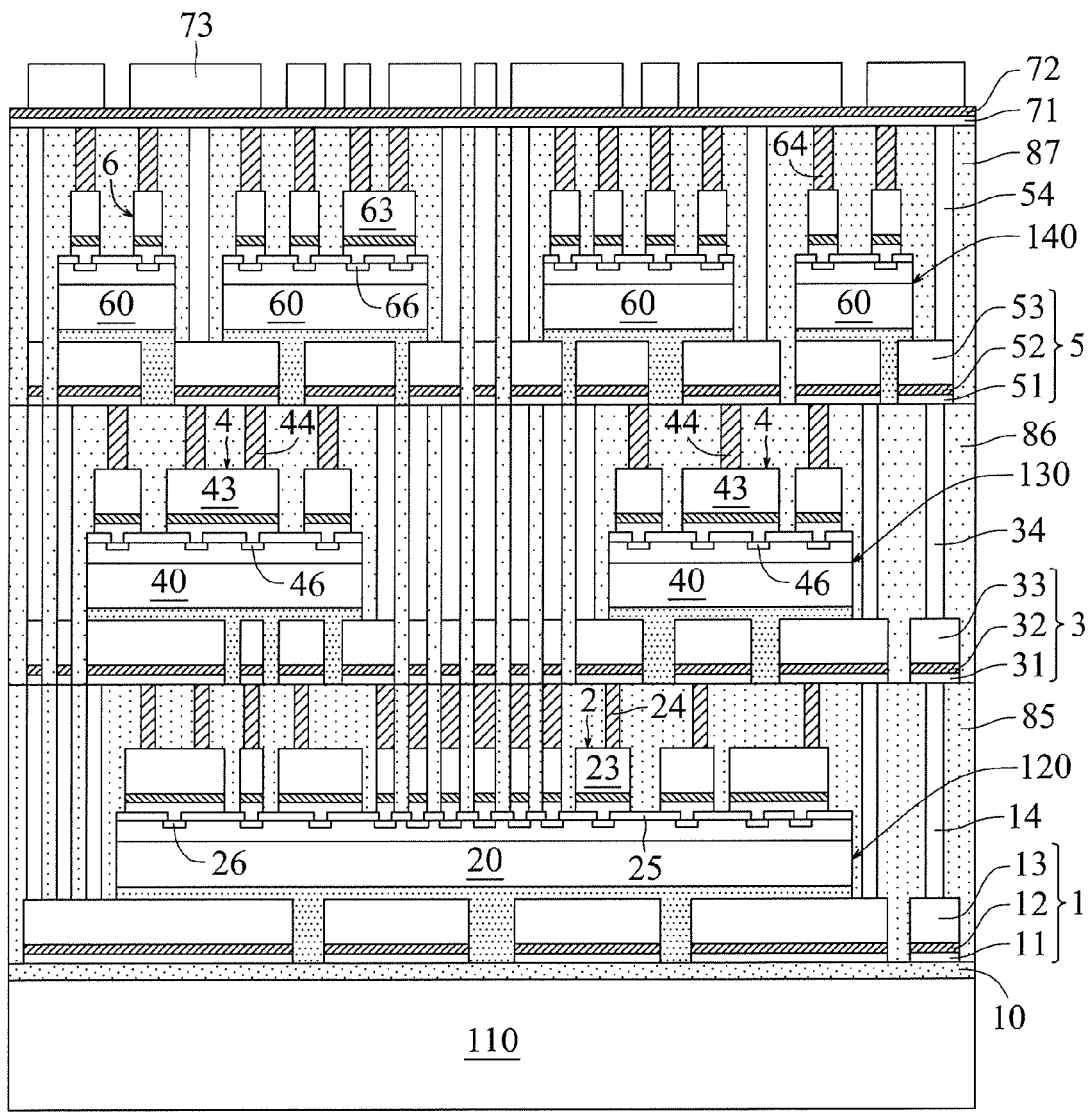

Referring to FIG. 35, after forming the metal layer 73 illustrated in FIG. 34, the photoresist layer 96 is removed using a chemical solution containing amine or $NaCO_3$. Next, referring to FIG. 36, the seed layer 72 not under the metal layer 73 is removed by using a wet chemical etching process or a reactive ion etching (RIE) process, and then the adhesion layer 71 not under the metal layer 73 is removed by using a wet chemical etching process or a reactive ion etching (RIE) process.

Accordingly, the adhesion layer 71, the seed layer 72 and the metal layer 73 compose a patterned metal layer 7 formed on the top surface 87a of the filling or encapsulating layer 87, on the top surfaces 54a of the metal pillars or bumps 54 and on the top surfaces 64a of the metal pillars or bumps 64. The patterned metal layer 7 may include a metal plane, bus or trace, such as signal trace, clock bus, clock trace, power plane, power bus, power trace, ground plane, ground bus or ground trace, connecting one or more metal pillars or bumps 54, connecting one or more metal pillars or bumps 64 or connecting one or more metal pillars or bumps 54 to one or more metal pillars or bumps 64. A coverage ratio of an area of the patterned metal layer 7 covering a ground or polished surface including the top surfaces 54a, 64a and 87a shown in FIG. 32 to an area of the ground or polished surface ranges from 50% to 95%, and preferably ranges from 60% to 90%.

Figure 36:
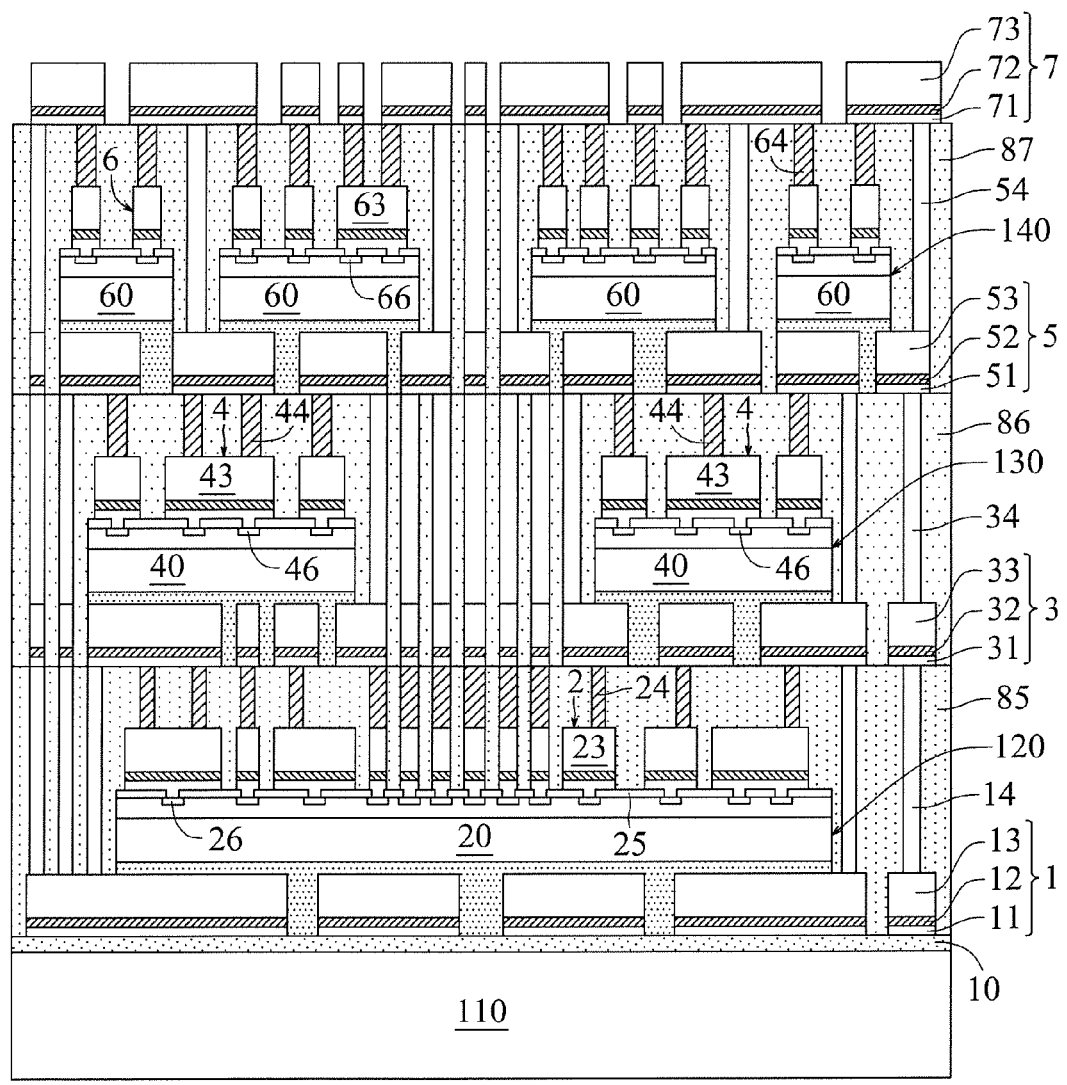
Figure 37:
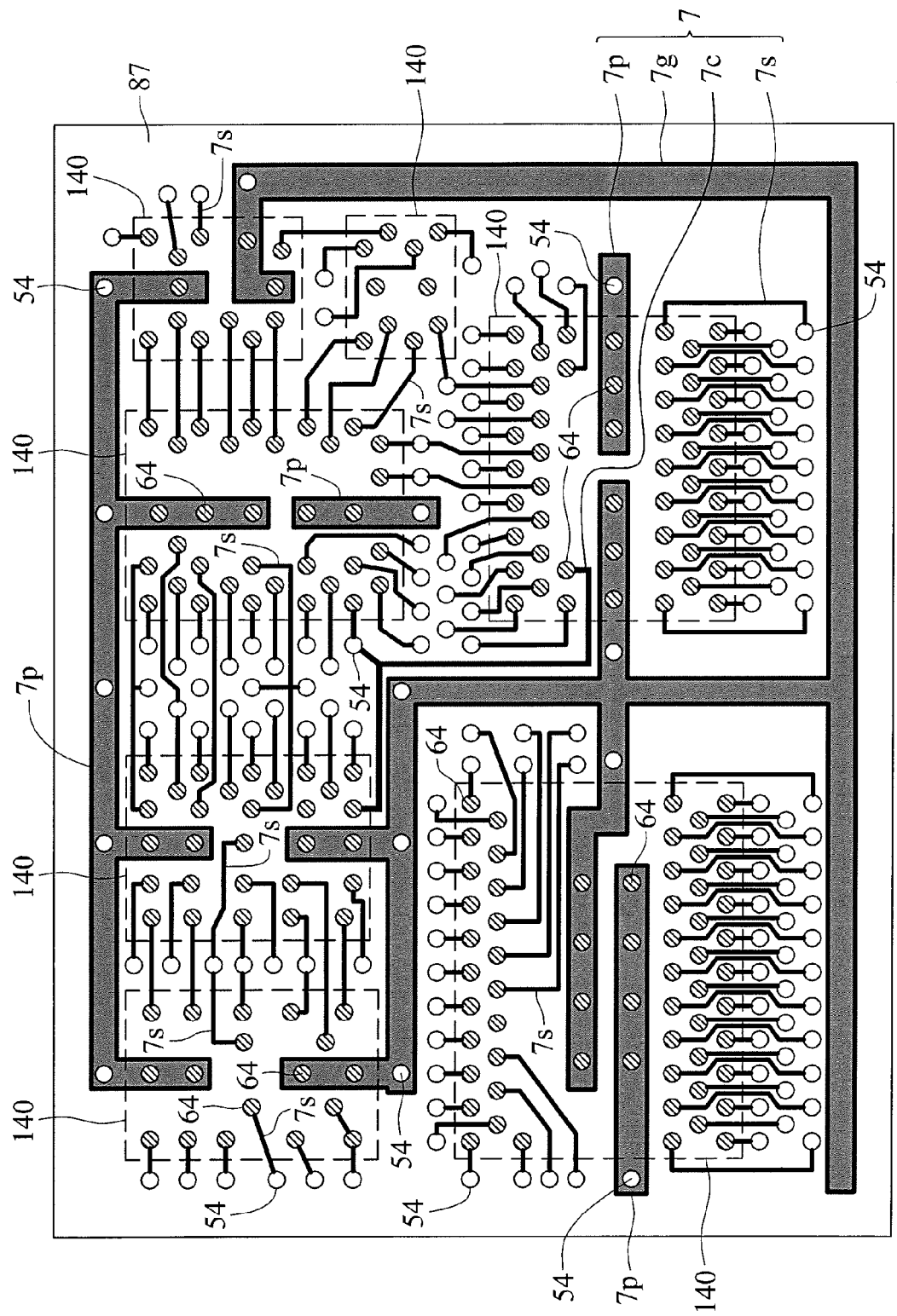
FIG. 37 is a schematic top perspective view of the patterned metal layer 7 of FIG. 36.

FIG. 37 is a schematically top perspective view of the semi finished device shown in FIG. 36. Referring to FIG. 37, circles 64 enclosing oblique lines indicate the metal pillars or bumps 64 preformed on the patterned metal layer 6, shown in FIG. 36, before the chips 140 are cut from a semiconductor wafer. Circles 54 enclosing no oblique lines indicate the metal pillars or bumps 54 preformed on the patterned metal layer 5, shown in FIG. 36, before the chips 140 are attached to the patterned metal layer 5 and to the top surface 86a of the filling or encapsulating layer 86.

Referring to FIGS. 36 and 37, the patterned metal layer 7 includes a clock interconnect, bus or trace 7c, a ground plane, bus or trace 7g, multiple power planes, buses or traces 7p, and multiple signal interconnects, traces or lines 7s. One or more metal pillars or bumps 54 can be connected to one or more metal pillars or bumps 64 through the clock interconnect, bus or trace 7c, through the ground plane, bus or trace 7g, through one of the power planes, buses or traces 7p, or through one of the signal interconnects, traces or lines 7s. Through one or more metal pillars or bumps 64, each of the chips 140 can be connected to the clock interconnect, bus or trace 7c, to the ground plane, bus or trace 7g, to one or more power planes, buses or traces 7p or to one or more signal interconnects, traces or lines 7s. Each of the chips 140 has one of the metal traces or pads 66 connected to one or more of the metal traces or pads 46 in one or more of the chips 130 through, in sequence, the patterned metal layer 6, one of the metal pillars or bumps 64, the patterned metal layer 7, such as the clock interconnect, bus or trace 7c, the ground plane, bus or trace 7g, the power plane, bus or trace 7p or the signal interconnect, trace or line 7s, one or more of the metal pillars or bumps 54, the patterned metal layer 5, one or more of the metal pillars or bumps 44, and the patterned metal layer 4. Each of the chips 140 has another one of the metal traces or pads 66 connected to one or more of the metal traces or pads 26 in one or more of the chips 120 through, in sequence, the patterned metal layer 6, one of the metal pillars or bumps 64, the patterned metal layer 7, such as the clock interconnect, bus or trace 7c, the ground plane, bus or trace 7g, the power plane, bus or trace 7p or the signal interconnect, trace or line 7s, one or more of the metal pillars or bumps 54, the patterned metal layer 5, one or more of the metal pillars or bumps 34, the patterned metal layer 3, one or more of the metal pillars or bumps 24, and the patterned metal layer 2. Each of the chips 140 has another one of the metal traces or pads 66 connected to the patterned metal layer 1 through, in sequence, the patterned metal layer 6, one of the metal pillars or bumps 64, the patterned metal layer 7, such as the clock interconnect, bus or trace 7c, the ground plane, bus or trace 7g, the power plane, bus or trace 7p or the signal interconnect, trace or line 7s, one of the metal pillars or bumps 54, the patterned metal layer 5, one of the metal pillars or bumps 34, the patterned metal layer 3, and one of the metal pillars or bumps 14. One of the metal pillars or bumps 64, of one of the chips 140, can be connected to another one of the metal pillars or bumps 64, of another one of the chips 140, through the clock interconnect, bus or trace 7c, through the ground plane, bus or trace 7g, through one of the power planes, buses or traces 7p, or through one of the signal interconnects, traces or lines 7s. Each of the chips 140 may have two of the metal pillars or bumps 64 connected to each other through the ground plane, bus or trace 7g, through one of the power planes, buses or traces 7p or through one of the signal interconnects, traces or lines 7s.

Figure 38:
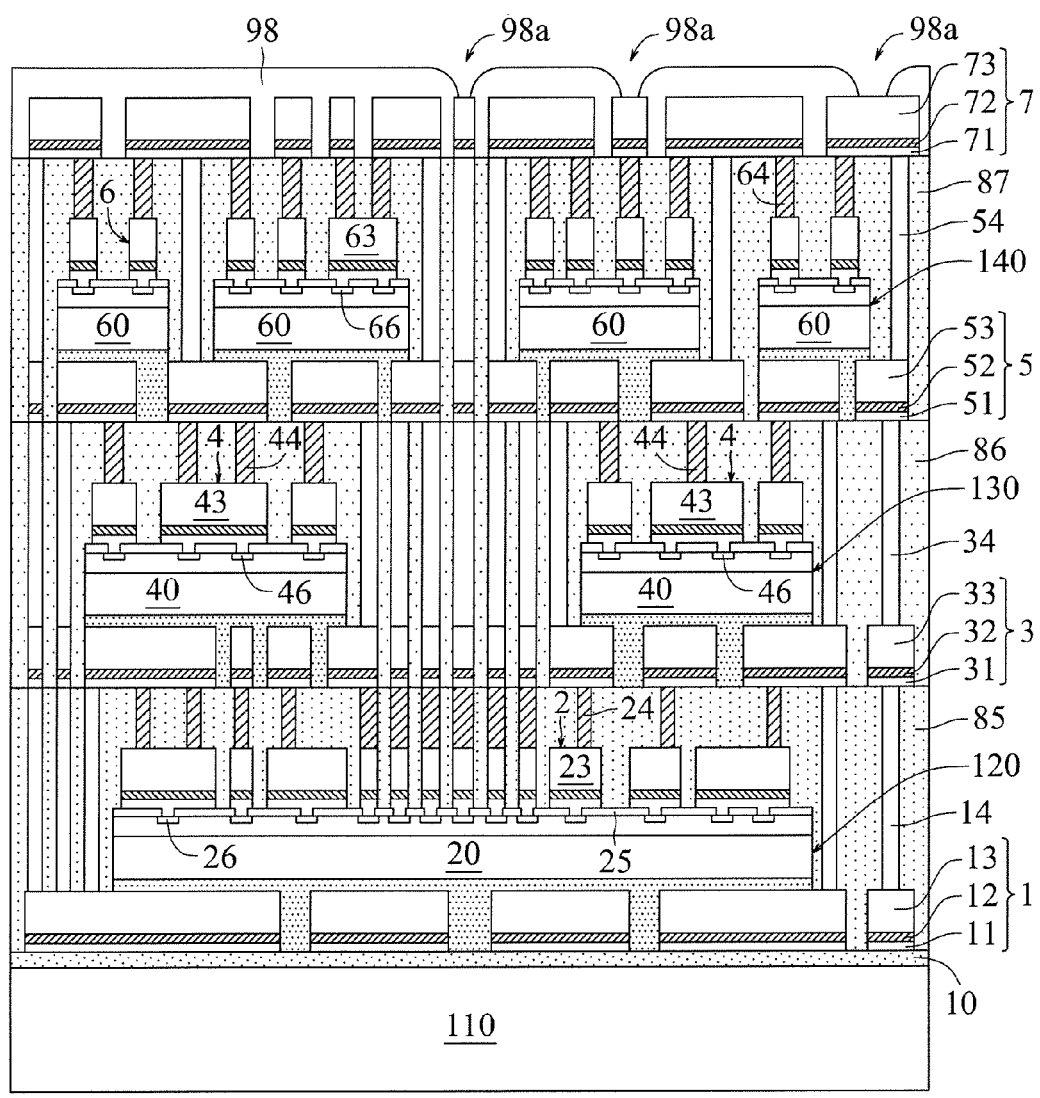

Referring to FIG. 38, after the step illustrated in FIG. 36, a polymer layer 98, such as positive-type photosensitive polymer layer or negative-type photosensitive polymer layer (preferred), can be formed on the metal layer 73 of the patterned metal layer 7 and on the top surface 87a of the filling or encapsulating layer 87 by using a spin coating process or a lamination process. Next, the polymer layer 98 is patterned with processes of lithographic, light exposure and development to form multiple openings 98a in the polymer layer 98 exposing multiple contact points of the metal layer 73. Next, the polymer layer 98 is cured or heated at a temperature between 130 and 400° C. Accordingly, the polymer layer 98 having a thickness, e.g., between 1 and 20 micrometers, and preferably between 2 and 15 micrometers or between 5 and 10 micrometers, can be formed on the metal layer 73 of the patterned metal layer 7 and on the top surface 87a of the filling or encapsulating layer 87, and the openings 98a in the polymer layer 98 are over the contact points of the metal layer 73 and expose them. The polymer layer 98 can be a polyimide layer, a polybenzoxazole (PBO) layer, a benzocyclobutane (BCB) layer, an epoxy layer, a poly-phenylene oxide (PPO) layer, a silosane layer or a SU-8 layer.

Figure 39:
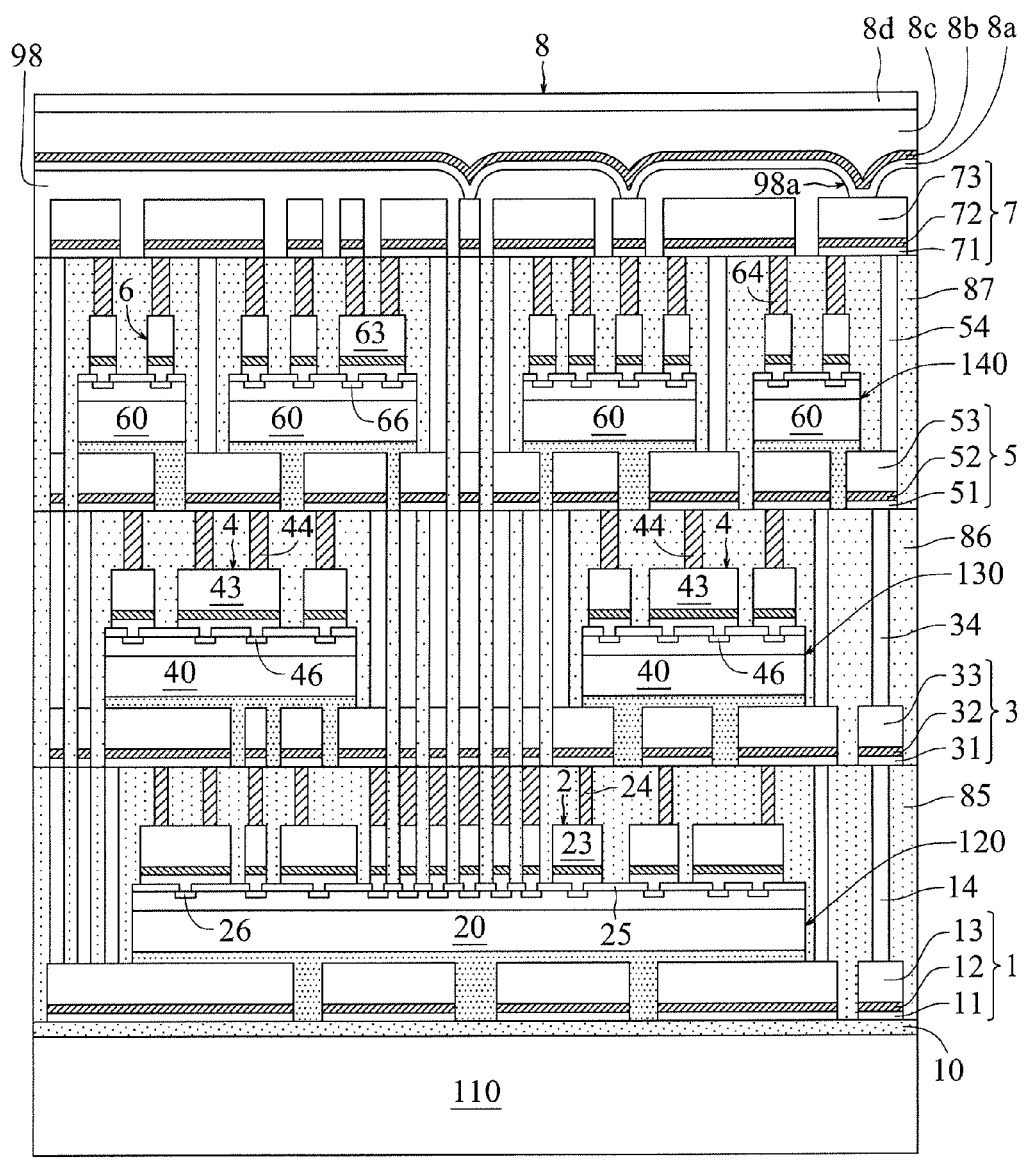

Next, referring to FIG. 39, an adhesion layer 8a having a thickness, e.g., less than 1 micrometer, such as between 1 nanometer and 0.5 micrometers, can be formed on the polymer layer 98 and on the contact points, exposed by the openings 98a, of the metal layer 73 by using a physical-vapor deposition (PVD) process, such as sputtering process or evaporation process, or a chemical-vapor deposition (CVD) process. Next, a seed layer 8b having a thickness, e.g., less than 1 micrometer, such as between 10 nanometers and 0.8 micrometers, can be formed on the adhesion layer 8a by using a physical-vapor deposition (PVD) process, such as sputtering process or evaporation process, a chemical-vapor deposition (CVD) process or an electroless plating process. Next, a metal layer 8c, a conductive layer, having a thickness, e.g., greater than 1 micrometer, such as between 2 and 30 micrometers, and preferably between 3 and 10 micrometers, can be formed on the seed layer 8b by using an electroplating or electroless plating process. Next, a metal layer 8d, a protection layer, having a thickness, e.g., between 0.2 and 20 micrometers, and preferably between 1 and 10 micrometers, can be formed on the metal layer 8c by using an electroplating or electroless plating process.

The material of the adhesion layer 8a may include titanium, a titanium-tungsten alloy, titanium nitride, chromium, tantalum, tantalum nitride, nickel or nickel vanadium. The material of the seed layer 8b may include copper, silver, gold or titanium-copper alloy.

For example, when the adhesion layer 8a is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the polymer layer 98 and on the contact points, exposed by the openings 98a, of the metal layer 73, the seed layer 8b can be formed by sputtering a copper layer, a silver layer, a titanium-copper-alloy layer or a gold layer with a thickness, e.g., less than 1 micrometer, such as between 10 nanometers and 0.8 micrometers, on the titanium-containing layer.

Alternatively, when the adhesion layer 8a is formed by sputtering a tantalum-containing layer, such as a single layer of tantalum or tantalum nitride, having a thickness, e.g., less than 1 micrometer, such as between 1 nanometer and 0.5 micrometers, on the polymer layer 98 and on the contact points, exposed by the openings 98a, of the metal layer 73, the seed layer 8b can be formed by sputtering a copper layer, a silver layer, a titanium-copper-alloy layer or a gold layer with a thickness, e.g., less than 1 micrometer, such as between 10 nanometers and 0.8 micrometers, on the tantalum-containing layer.

Alternatively, when the adhesion layer 8a is formed by sputtering a chromium-containing layer, such as a single layer of chromium, having a thickness, e.g., less than 1 micrometer, such as between 1 nanometer and 0.5 micrometers, on the polymer layer 98 and on the contact points, exposed by the openings 98a, of the metal layer 73, the seed layer 8b can be formed by sputtering a copper layer, a silver layer, a titanium-copper-alloy layer or a gold layer with a thickness, e.g., less than 1 micrometer, such as between 10 nanometers and 0.8 micrometers, on the chromium-containing layer.

Alternatively, when the adhesion layer 8a is formed by sputtering a nickel-containing layer, such as a single layer of nickel or nickel vanadium, having a thickness, e.g., less than 1 micrometer, such as between 1 nanometer and 0.5 micrometers, on the polymer layer 98 and on the contact points, exposed by the openings 98a, of the metal layer 73, the seed layer 8b can be formed by sputtering a copper layer, a silver layer, a titanium-copper-alloy layer or a gold layer with a thickness, e.g., less than 1 micrometer, such as between 10 nanometers and 0.8 micrometers, on the nickel-containing layer.

The metal layer 8c can be a single layer of copper, silver or gold. The metal layer 8d can be a single layer of nickel or chromium, or double layers composed of a nickel layer on the metal layer 8c and a gold layer on the nickel layer.

For example, when the metal layer 8c is a single metal layer formed by electroplating a copper layer, to a thickness, e.g., greater than 1 micrometer, such as between 2 and 30 micrometers, and preferably between 3 and 10 micrometers, on the seed layer 8b, preferably the previously described copper or titanium-copper-alloy seed layer 8b, the metal layer 8d can be a single metal layer formed by electroplating or electroless plating a nickel or chromium layer, to a thickness, e.g., between 0.2 and 20 micrometers, and preferably between 1 and 10 micrometers, on the electroplated copper layer.

Alternatively, when the metal layer 8c is a single metal layer formed by electroplating a silver layer, to a thickness, e.g., greater than 1 micrometer, such as between 2 and 30 micrometers, and preferably between 3 and 10 micrometers, on the seed layer 8b, preferably the previously described silver seed layer 8b, the metal layer 8d can be a single metal layer formed by electroplating or electroless plating a nickel or chromium layer, to a thickness, e.g., between 0.2 and 20 micrometers, and preferably between 1 and 10 micrometers, on the electroplated silver layer.

Alternatively, when the metal layer 8c is a single metal layer formed by electroplating a gold layer, to a thickness, e.g., greater than 1 micrometer, such as between 2 and 30 micrometers, and preferably between 3 and 10 micrometers, on the seed layer 8b, preferably the previously described gold seed layer 8b, the metal layer 8d can be a single metal layer formed by electroplating or electroless plating a nickel or chromium layer, to a thickness, e.g., between 0.2 and 20 micrometers, and preferably between 1 and 10 micrometers, on the electroplated gold layer.

Accordingly, the adhesion layer 8a, the seed layer 8b and the metal layers 8c and 8d compose a metal layer 8 formed on the polymer layer 98 and on the contact points, exposed by the openings 98a, of the metal layer 73.

Alternatively, the metal layer 8 can be formed by electroless plating a first copper layer with a thickness, e.g., between 50 nanometers and 0.5 micrometers on the polymer layer 98 and on the contact points, exposed by the openings 98a, of the metal layer 73, next electroplating a second copper layer with a thickness, e.g., greater than 1 micrometer, such as between 2 and 30 micrometers, and preferably between 3 and 10 micrometers, on the first copper layer, and then electroplating or electroless plating the previously described metal layer 8d on the second copper layer. For example, the metal layer 8d can be a single layer of nickel or chromium with a thickness, e.g., between 0.2 and 20 micrometers, and preferably between 1 and 10 micrometers, on the second copper layer, or can be double layers composed of a nickel layer on the second copper layer and a gold layer on the nickel layer. Accordingly, the metal layer 8 can be composed of an electroless plated copper layer on the polymer layer 98 and on the contact points, exposed by the openings 98a, of the metal layer 73, an electroplated copper layer on the electroless plated copper layer, and the previously described metal layer 8d on the electroplated copper layer.

The metal layer 8 can serve as a thermal spreading plane (or called heat spreading plane), and the heat generated by the chips 120, 130 and 140 can be transferred to the metal layer 8 through the metal pillars or bumps 24, 34, 44, 54 and 64.

The metal layer 8 can be connected to one or more of the power planes, buses or traces 7p, shown in FIG. 37, through one or more of the openings 98 in the polymer layer 98, or to the ground plane, bus or trace 7g, shown in FIG. 37, through one or more of the openings 98 in the polymer layer 98. Each of the chips 140 may have one of the metal traces or pads 66 connected to the metal layer 8 through, in sequence, the patterned metal layer 6, one of the metal pillars or bumps 64 and the patterned metal layer 7 such as the power plane, bus or trace 7p or the ground plane, bus or trace 7g.

The metal layer 8 can be connected to one of the metal traces or pads 46 of one of the chips 130 through, in sequence, the patterned metal layer 7, such as the clock interconnect, bus or trace 7c, the ground plane, bus or trace 7g, the power plane, bus or trace 7p or the signal interconnect, trace or line 7s, one of the metal pillars or bumps 54, the patterned metal layer 5, one of the metal pillars or bumps 44, and the patterned metal layer 4, can be connected to one of the metal traces or pads 26 of one of the chips 120 through, in sequence, the patterned metal layer 7, such as the clock interconnect, bus or trace 7c, the ground plane, bus or trace 7g, the power plane, bus or trace 7p or the signal interconnect, trace or line 7s, one of the metal pillars or bumps 54, the patterned metal layer 5, one of the metal pillars or bumps 34, the patterned metal layer 3, one of the metal pillars or bumps 24, and the patterned metal layer 2, and can be connected to the patterned metal layer 1 through, in sequence, the patterned metal layer 7, such as the clock interconnect, bus or trace 7c, the ground plane, bus or trace 7g, the power plane, bus or trace 7p or the signal interconnect, trace or line 7s, one of the metal pillars or bumps 54, the patterned metal layer 5, one of the metal pillars or bumps 34, the patterned metal layer 3, and one of the metal pillars or bumps 14.

Figure 40:
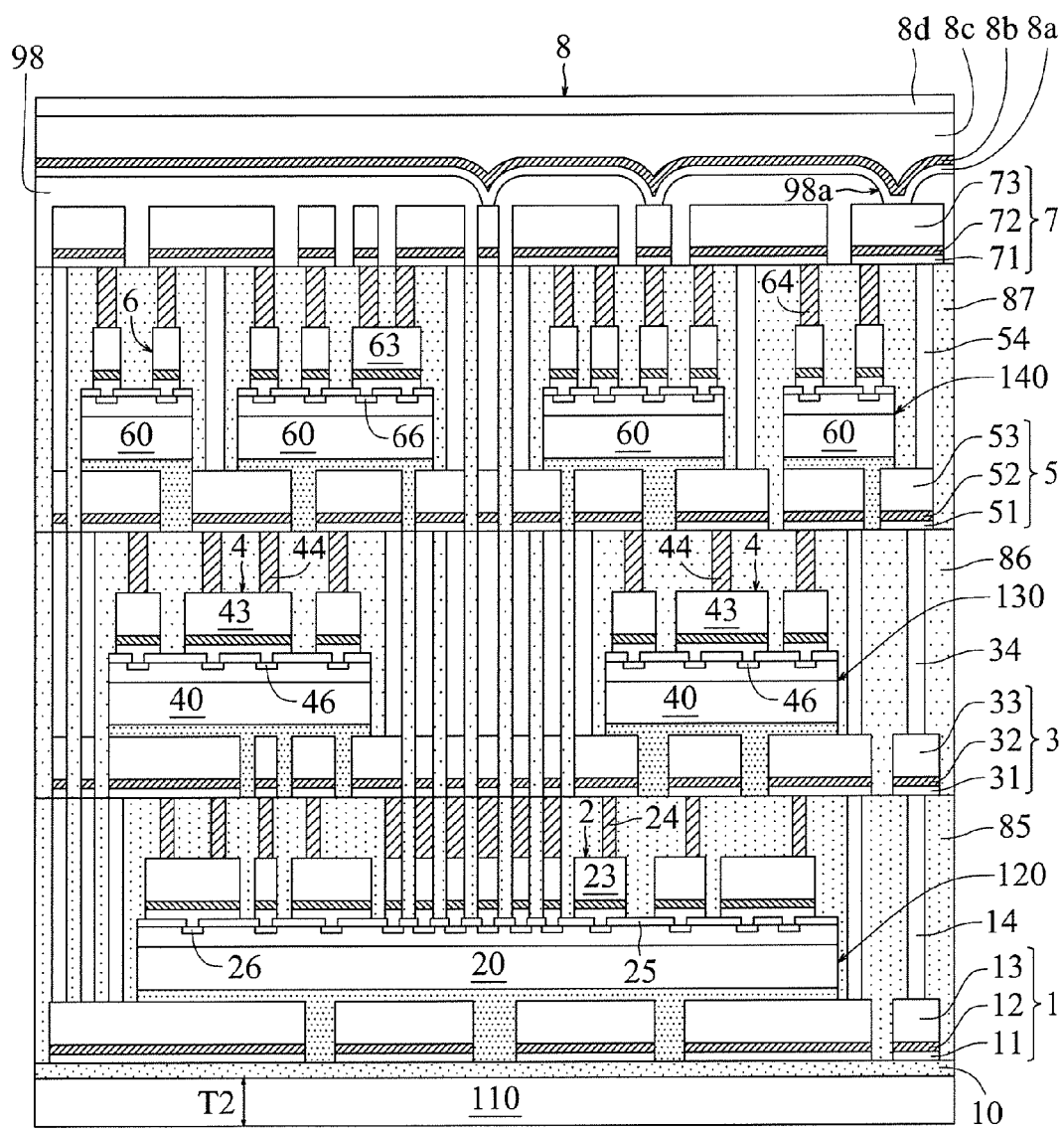

Referring to FIG. 40, after forming the metal layer 8 illustrated in FIG. 39, the substrate 110 is thinned to a thickness, e.g., T2 between 1 and 10 micrometers, between 3 and 50 micrometers or between 10 and 150 micrometers by mechanically grinding or chemically mechanically polishing (CMP) a backside of the substrate 110.

Figure 41:
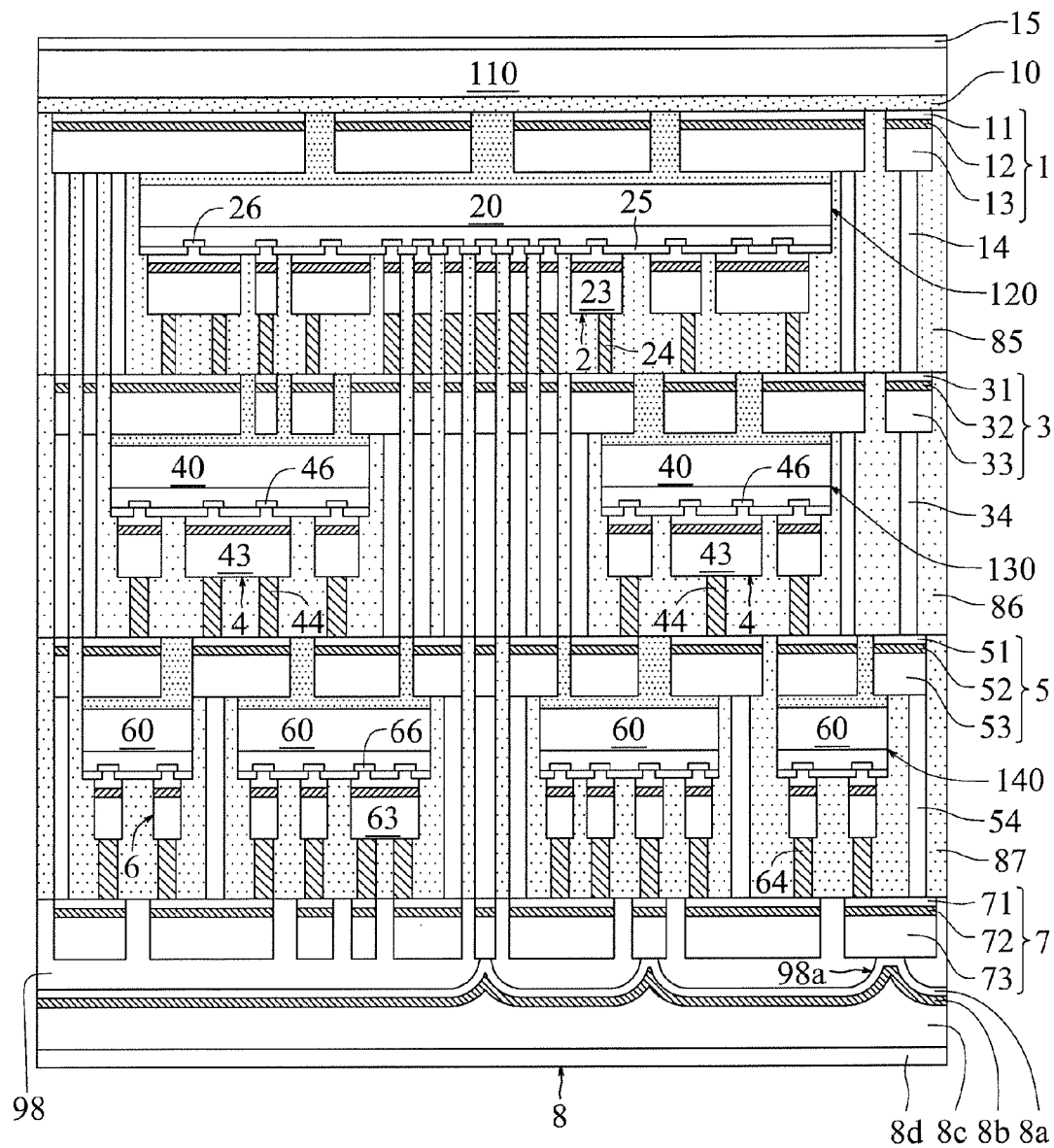

Next, referring to FIG. 41, with the step being illustrated with a reverse figure for simple explanation, an insulating layer 15 having a thickness, e.g., between 1 and 20 micrometers, and preferably between 3 and 15 micrometers or between 5 and 10 micrometers, can be formed on the thinned backside of the substrate 110 by a chemical-vapor deposition (CVD) process, a spin coating process or a lamination process. The insulating layer 15 can be silicon dioxide ($SiO_2$), silicon nitride, silicon oxynitride, silicon carbon nitride, polyimide, epoxy, benzocyclobutane (BCB), polybenzoxazole (PBO), poly-phenylene oxide (PPO), silosane or SU-8.

Figure 42:
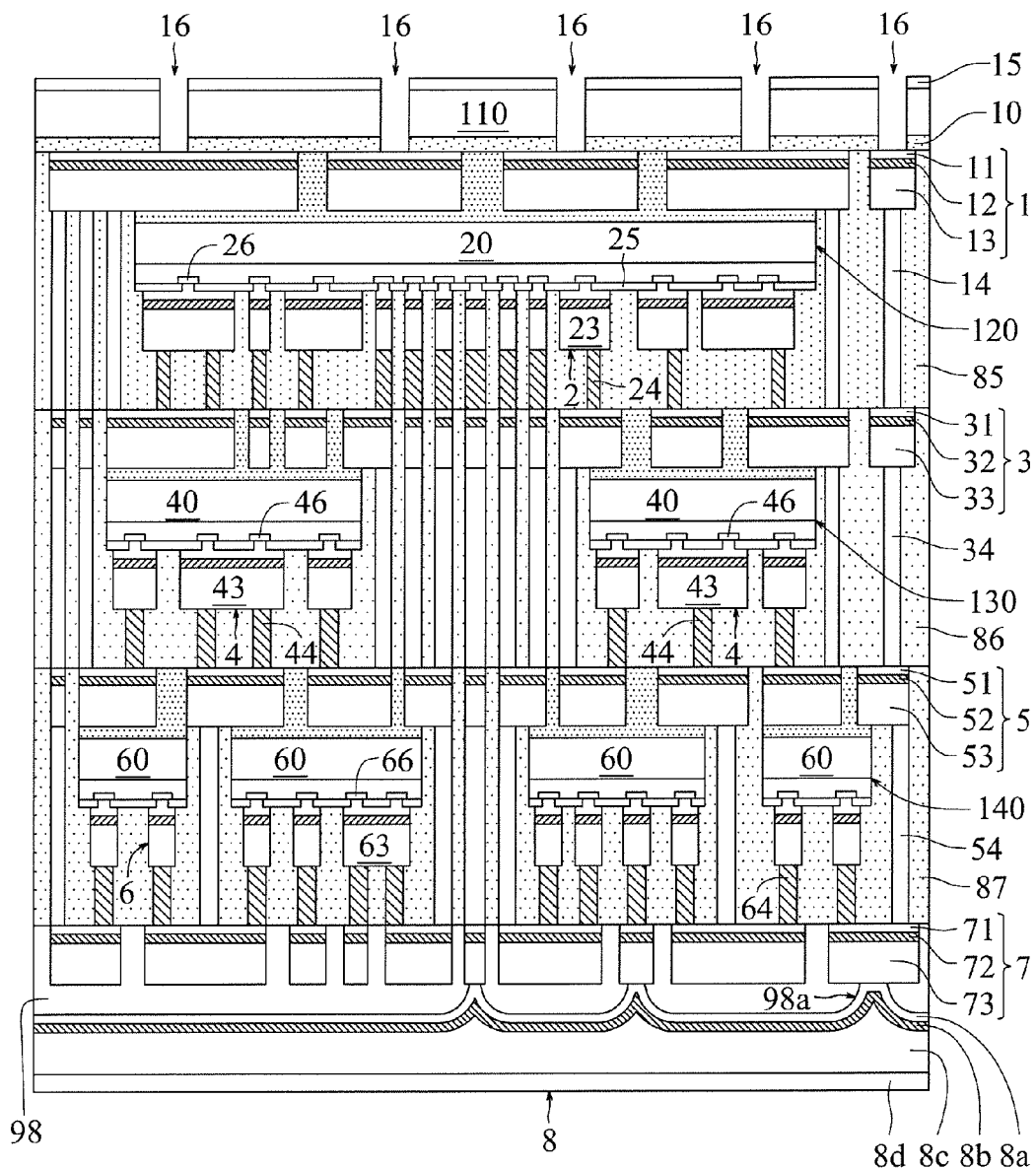

Next, referring to FIG. 42, with the step being illustrated with a reverse figure for simple explanation, multiple through holes 16 are formed through the insulating layer 15, through the substrate 110 and through the dielectric or insulating layer 10 using lithographic and etching processes or using a laser drilling process. Accordingly, the through holes 16 are formed in the substrate 110 and over multiple contact points of the adhesion layer 11 of the patterned metal layer 1, and expose the contact points of the adhesion layer 11 of the patterned metal layer 1. Each of the through holes 16 may have a suitable width or diameter, e.g., between 2 and 200 micrometers, and preferably between 5 and 100 micrometers or between 5 and 20 micrometers. After forming the through holes 16, a dielectric layer (not shown) can be optionally formed on sidewalls of the through holes 16.

Figure 43:
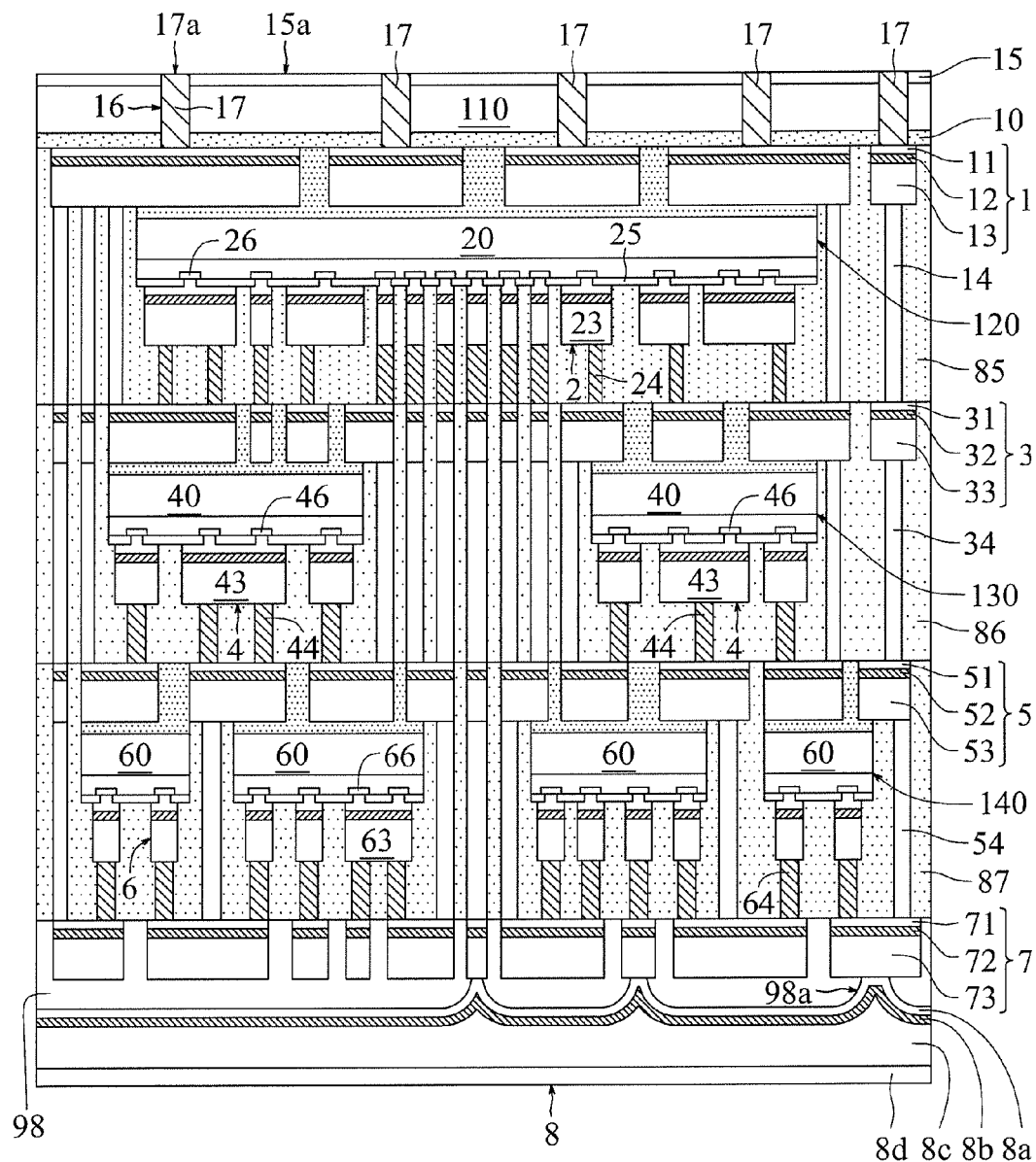

Next, referring to FIG. 43, with the step being illustrated with a reversed figure for simple explanation, multiple through-hole connections 17 having a suitable width or diameter, e.g., between 2 and 200 micrometers, and preferably between 5 and 100 micrometers or between 5 and 20 micrometers, are formed in the through holes 16 and on the contact points of the adhesion layer 11 using suitable processes, e.g., including a sputtering process, an electroplating process and a chemical mechanical polishing (CMP) process. The through-hole connections 17 may include copper, a Sn—Ag alloy, a Sn—Ag—Cu alloy or a Sn—Au alloy. Each of the through-hole connections 17 may have a surface 17a substantially coplanar with a surface 15a of the insulating layer 15.

Figure 44:
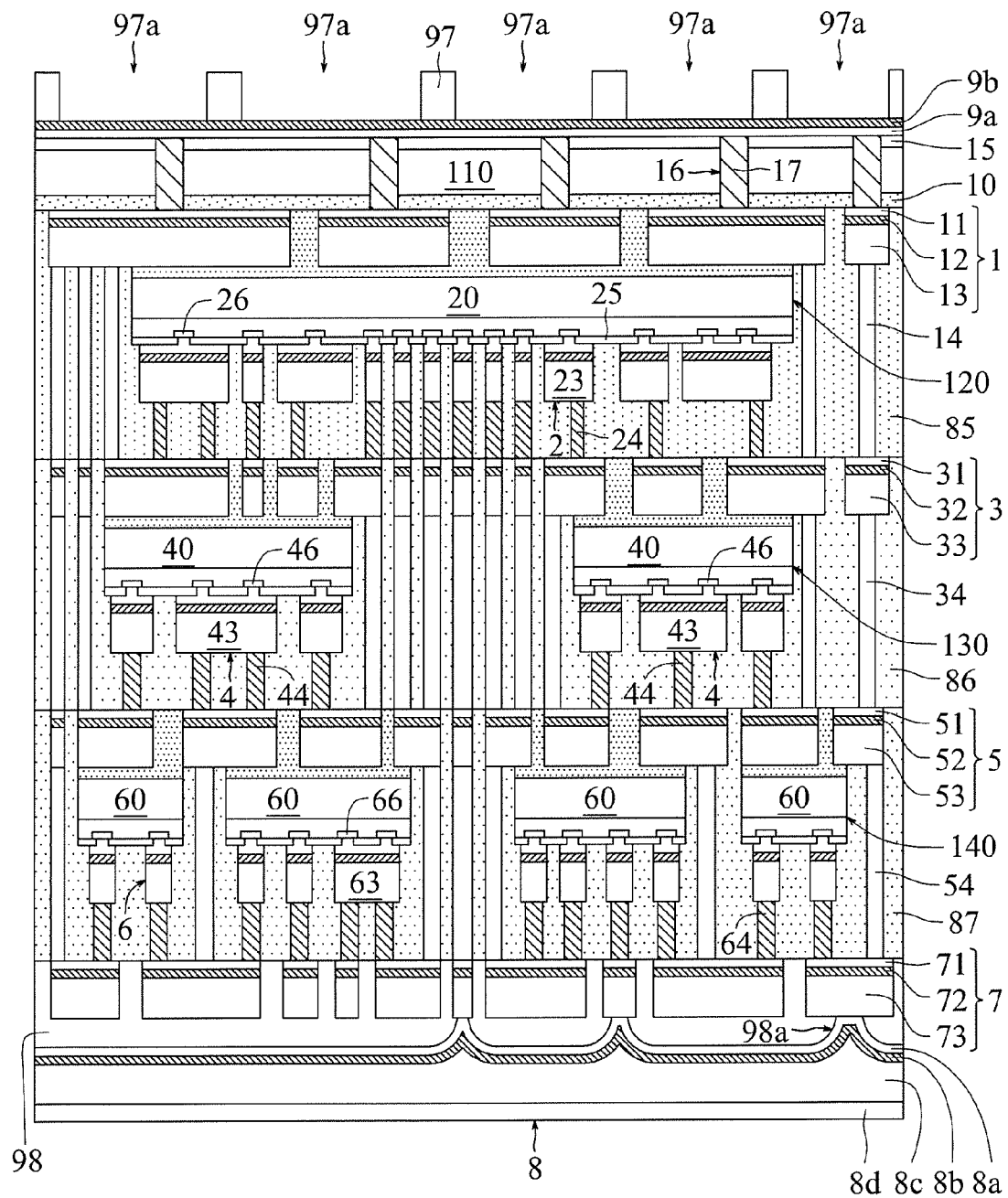

Next, referring to FIG. 44, with the step being illustrated with a reverse figure for simple explanation, an adhesion layer 9a having a thickness, e.g., less than 1 micrometer, such as between 1 nanometer and 0.5 micrometers, can be formed on the surfaces 17a of the through-hole connections 17 and on the surface 15a of the insulating layer 15 by using a physical-vapor deposition (PVD) process, such as sputtering process or evaporation process, or a chemical-vapor deposition (CVD) process. Next, a seed layer 9b having a thickness, e.g., less than 1 micrometer, such as between 10 nanometers and 0.8 micrometers, can be formed on the adhesion layer 9a by using a physical-vapor deposition (PVD) process, such as sputtering process or evaporation process. Next, a photoresist layer 97, such as positive-type photoresist layer or negative-type photoresist layer (preferred), having a thickness, e.g., greater than 1 micrometer can be formed on the seed layer 9b by using a spin-on coating process or a lamination process. Next, the photoresist layer 97 is patterned with processes of lithographic, light exposure and development to form multiple trace-shaped openings 97a in the photoresist layer 97 exposing the seed layer 9b.

The material of the adhesion layer 9a may include titanium, a titanium-tungsten alloy, titanium nitride, chromium, tantalum, tantalum nitride, nickel or nickel vanadium. The material of the seed layer 9b may include copper, silver, gold or titanium-copper alloy.

For example, when the adhesion layer 9a is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the surfaces 17a of the through-hole connections 17 and on the surface 15a of the insulating layer 15, the seed layer 9b can be formed by sputtering a copper layer, a silver layer, a titanium-copper-alloy layer or a gold layer with a thickness, e.g., less than 1 micrometer, such as between 10 nanometers and 0.8 micrometers, on the titanium-containing layer.

Alternatively, when the adhesion layer 9a is formed by sputtering a tantalum-containing layer, such as a single layer of tantalum or tantalum nitride, having a thickness, e.g., less than 1 micrometer, such as between 1 nanometer and 0.5 micrometers, on the surfaces 17a of the through-hole connections 17 and on the surface 15a of the insulating layer 15, the seed layer 9b can be formed by sputtering a copper layer, a silver layer, a titanium-copper-alloy layer or a gold layer with a thickness, e.g., less than 1 micrometer, such as between 10 nanometers and 0.8 micrometers, on the tantalum-containing layer.

Alternatively, when the adhesion layer 9a is formed by sputtering a chromium-containing layer, such as a single layer of chromium, having a thickness, e.g., less than 1 micrometer, such as between 1 nanometer and 0.5 micrometers, on the surfaces 17a of the through-hole connections 17 and on the surface 15a of the insulating layer 15, the seed layer 9b can be formed by sputtering a copper layer, a silver layer, a titanium-copper-alloy layer or a gold layer with a thickness, e.g., less than 1 micrometer, such as between 10 nanometers and 0.8 micrometers, on the chromium-containing layer.

Alternatively, when the adhesion layer 9a is formed by sputtering a nickel-containing layer, such as a single layer of nickel or nickel vanadium, having a thickness, e.g., less than 1 micrometer, such as between 1 nanometer and 0.5 micrometers, on the surfaces 17a of the through-hole connections 17 and on the surface 15a of the insulating layer 15, the seed layer 9b can be formed by sputtering a copper layer, a silver layer, a titanium-copper-alloy layer or a gold layer with a thickness, e.g., less than 1 micrometer, such as between 10 nanometers and 0.8 micrometers, on the nickel-containing layer.

Figure 45:
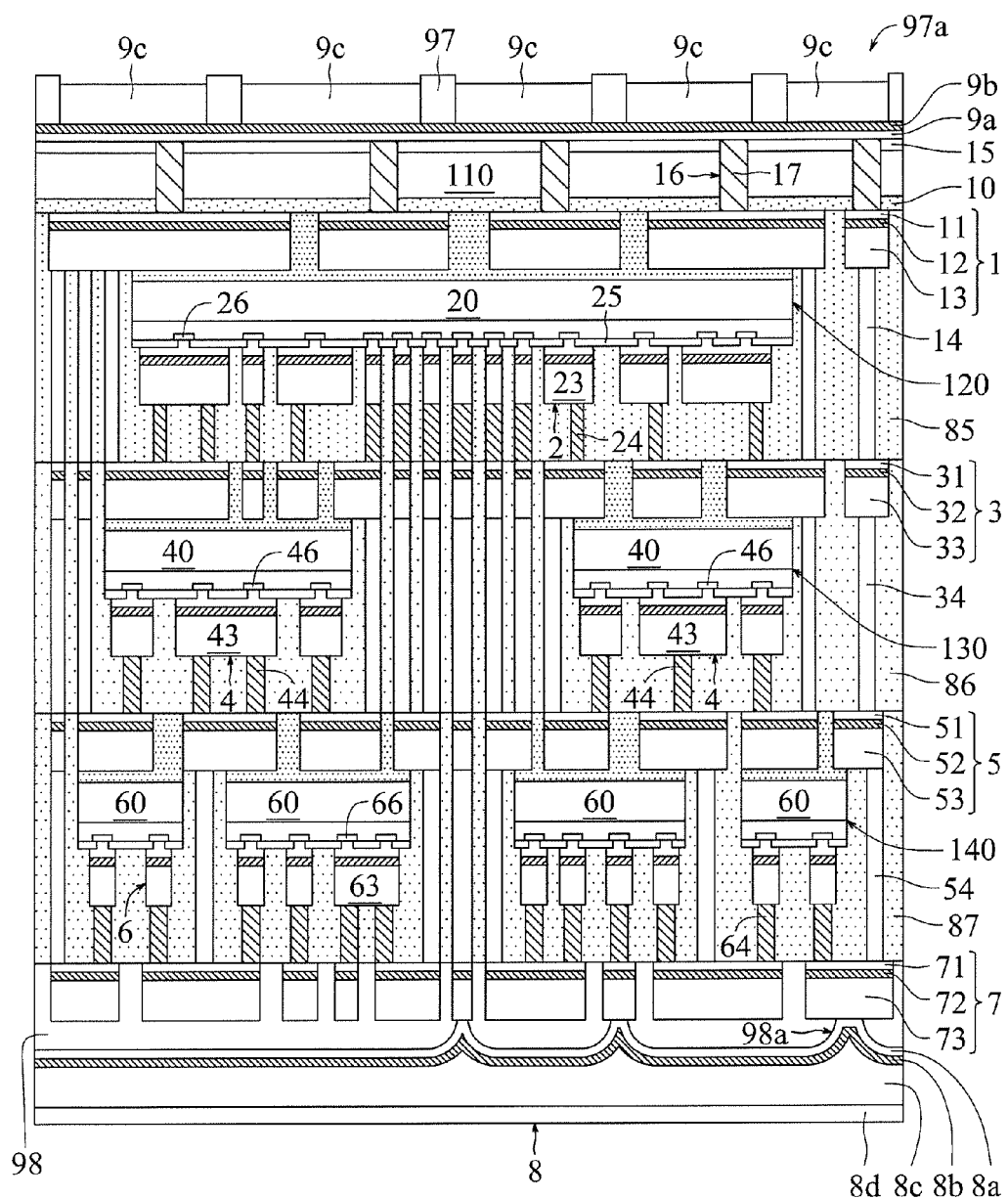

Next, referring to FIG. 45, with the step being illustrated with a reverse figure for simple explanation, a metal layer 9c, a conductive layer, having a thickness, e.g., greater than 1 micrometer, such as between 2 and 30 micrometers, and preferably between 3 and 10 micrometers, can be formed on the seed layer 9b exposed by the trace-shaped openings 97a and in the trace-shaped openings 97a by using an electroplating process or by using an electroplating process and an electroless plating process. The metal layer 9c can be a single layer of copper, silver, gold or nickel, or a composite layer made of the previously described metals.

For example, the metal layer 9c can be a single metal layer formed by electroplating a copper layer, to a thickness, e.g., greater than 1 micrometer, such as between 2 and 30 micrometers, and preferably between 3 and 10 micrometers, in the trace-shaped openings 97a and on the seed layer 9b, preferably the previously described copper or titanium-copper-alloy seed layer 9b, exposed by the trace-shaped openings 97a.

Alternatively, the metal layer 9c can be a single metal layer formed by electroplating a gold layer, to a thickness, e.g., greater than 1 micrometer, such as between 2 and 30 micrometers, and preferably between 3 and 10 micrometers, in the trace-shaped openings 97a and on the seed layer 9b, preferably the previously described gold seed layer 9b, exposed by the trace-shaped openings 97a.

Alternatively, the metal layer 9c can be composed of double metal layers formed by electroplating a copper layer, to a thickness, e.g., greater than 1 micrometer, such as between 2 and 30 micrometers, and preferably between 3 and 10 micrometers, in the trace-shaped openings 97a and on the seed layer 9b, preferably the previously described copper or titanium-copper-alloy seed layer 9b, exposed by the trace-shaped openings 97a, and then electroplating or electroless plating a nickel layer, to a thickness, e.g., greater than 1 micrometer, such as between 1 and 15 micrometers, and preferably between 2 and 5 micrometers, in the trace-shaped openings 97a and on the electroplated copper layer in the trace-shaped openings 97a.

Figure 46:
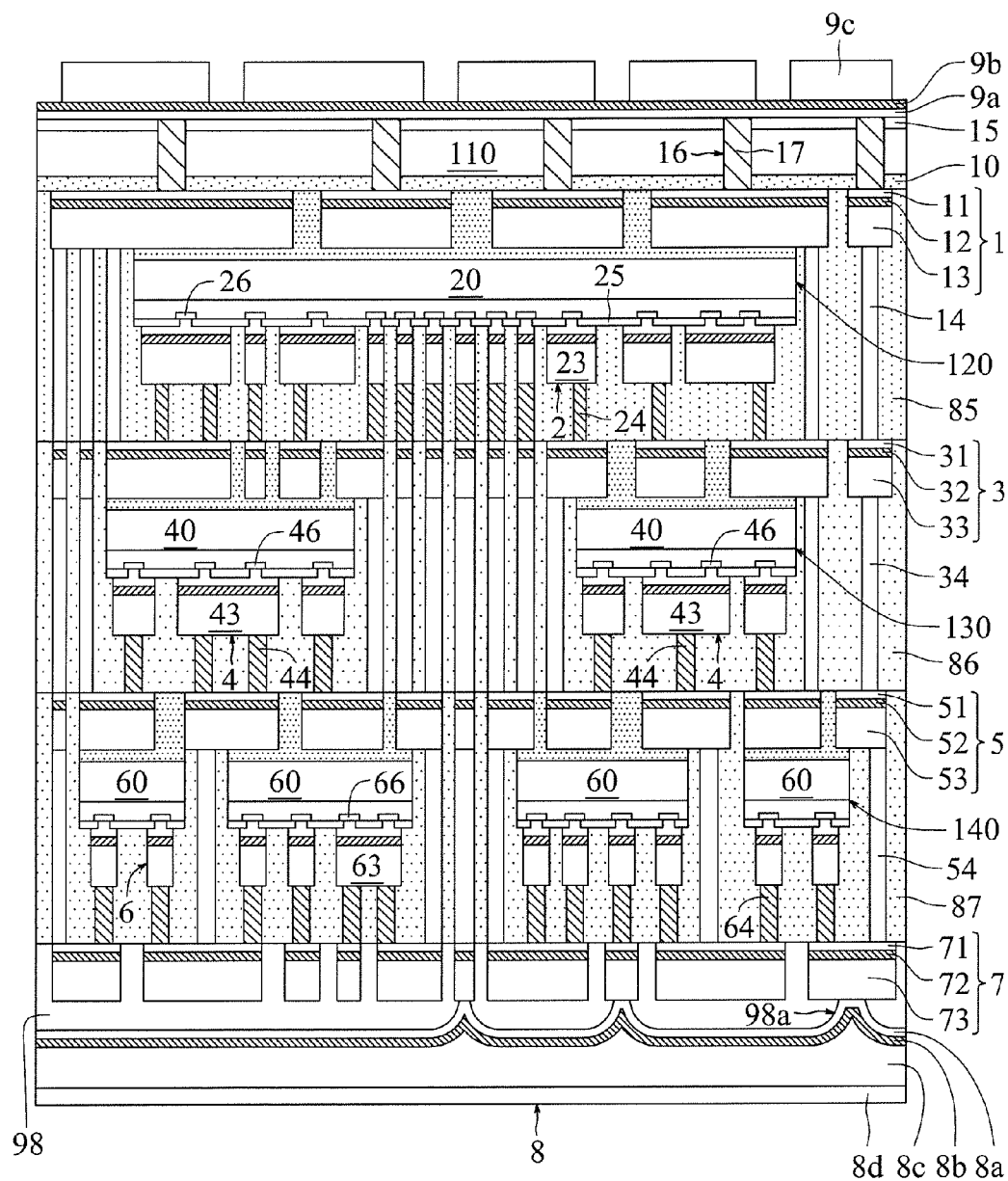
Figure 47:
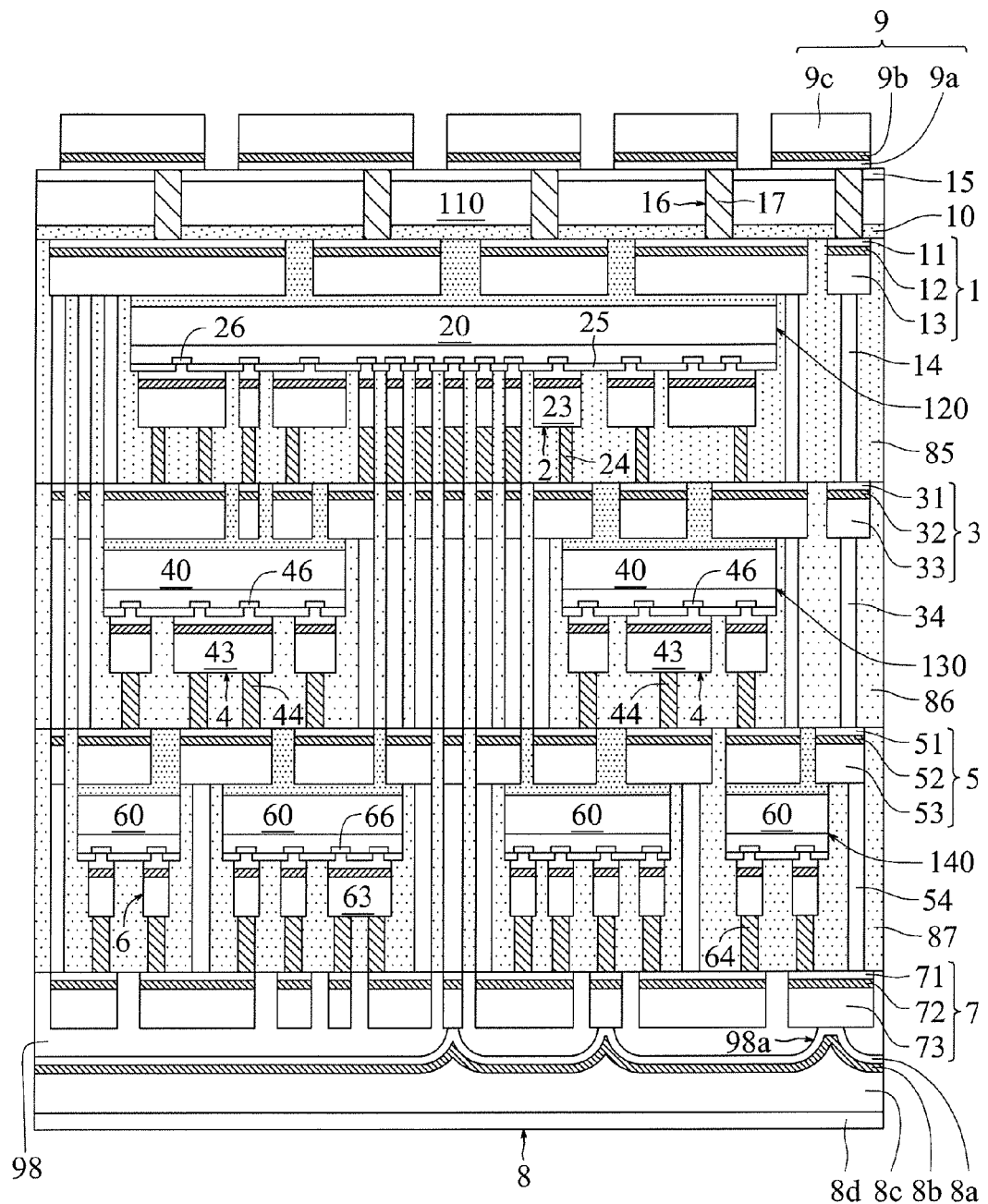

Referring to FIG. 46, with the step being illustrated with a reverse figure for simple explanation, after forming the metal layer 9c, the photoresist layer 97 is removed using a chemical solution containing amine or $NaCO_3$. Next, referring to FIG. 47, with the step being illustrated with a reverse figure for simple explanation, the seed layer 9b not under the metal layer 9c is removed by using a wet chemical etching process or a reactive ion etching (RIE) process, and then the adhesion layer 9a not under the metal layer 9c is removed by using a wet chemical etching process or a reactive ion etching (RIE) process.

Accordingly, the adhesion layer 9a, the seed layer 9b and the metal layer 9c compose a patterned metal layer 9 formed on the surfaces 17a of the through-hole connections 17 and on the surface 15a of the insulating layer 15. The patterned metal layer 9 may include a metal interconnect or trace, such as signal trace, clock bus, clock trace, power plane, power bus, power trace, ground plane, ground bus or ground trace, connected to the patterned metal layer 1 through one or more of the through-hole connections 17. A coverage ratio of an area of the patterned metal layer 9 covering a bottom surface including the surfaces 15a and 17a shown in FIG. 43 to an area of the bottom surface ranges from 50% to 95%, and preferably ranges from 60% to 90%.

Figure 48:
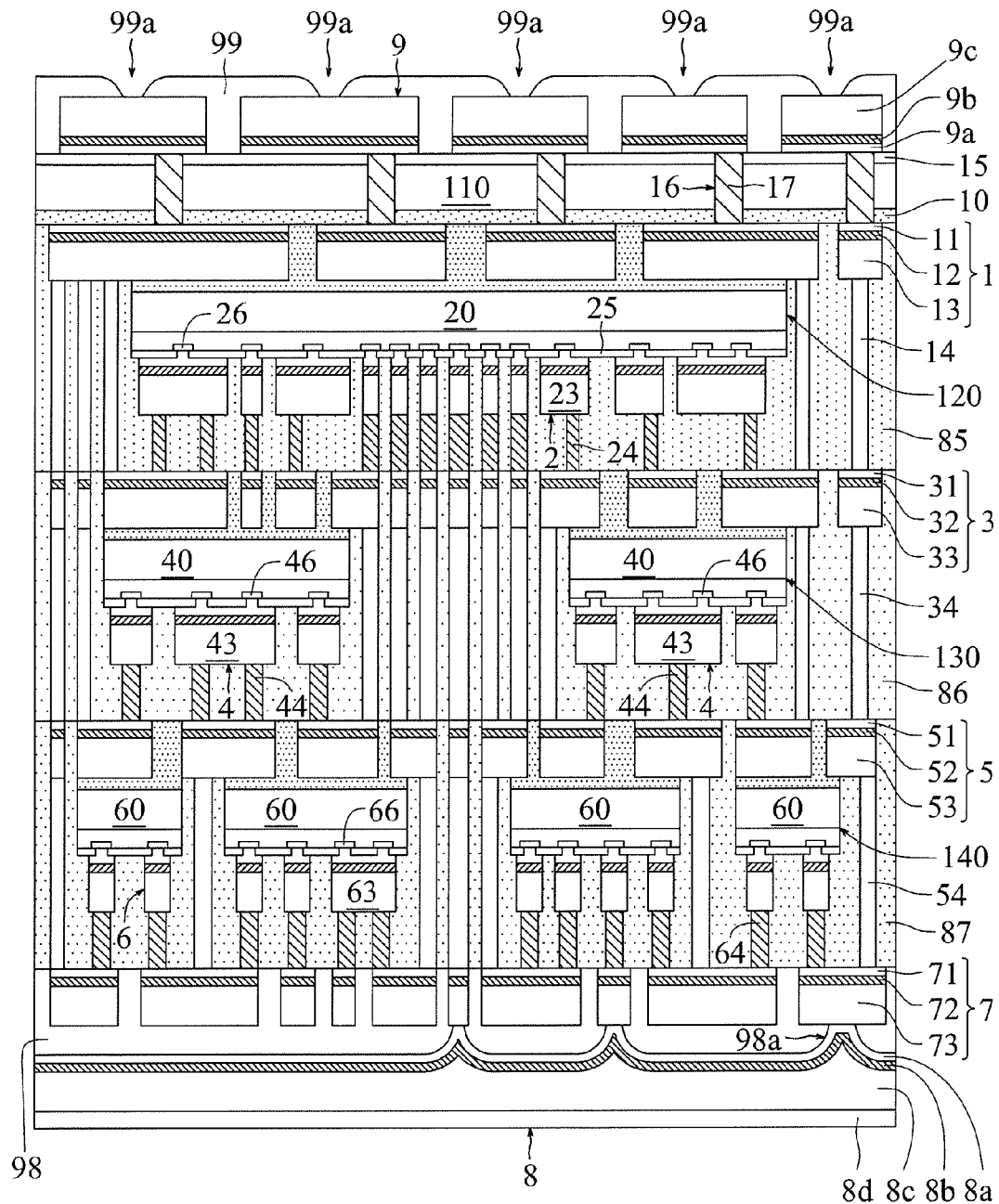

Next, referring to FIG. 48, with the step being illustrated with a reverse figure for simple explanation, a polymer layer 99 can be formed on the metal layer 9c of the patterned metal layer 9 and on the surface 15a of the insulating layer 15 by using a spin coating process, a lamination process, a printing process or a spraying process. Next, the polymer layer 99 is patterned with processes of lithographic, light exposure with a 1× stepper and development to form multiple openings 99a exposing multiple contact points of the metal layer 9c of the patterned metal layer 9. Next, the polymer layer 99 is cured or heated at a temperature between 130 and 400° C. Accordingly, the polymer layer 99 can be formed on the metal layer 9c of the patterned metal layer 9 and on the surface 15a of the insulating layer 15, and the openings 99a in the polymer layer 99 are over the contact points of the metal layer 9c and expose them. The polymer layer 99 can be a polyimide layer, a polybenzoxazole (PBO) layer, a benzocyclobutane (BCB) layer, an epoxy layer, a poly-phenylene oxide (PPO) layer, a silosane layer or a SU-8 layer. The polymer layer 99 covering a surface of the metal layer 9c may have a thickness, e.g., between 1 and 20 micrometers, and preferably between 5 and 25 micrometers or between 5 and 10 micrometers.

Figure 49:
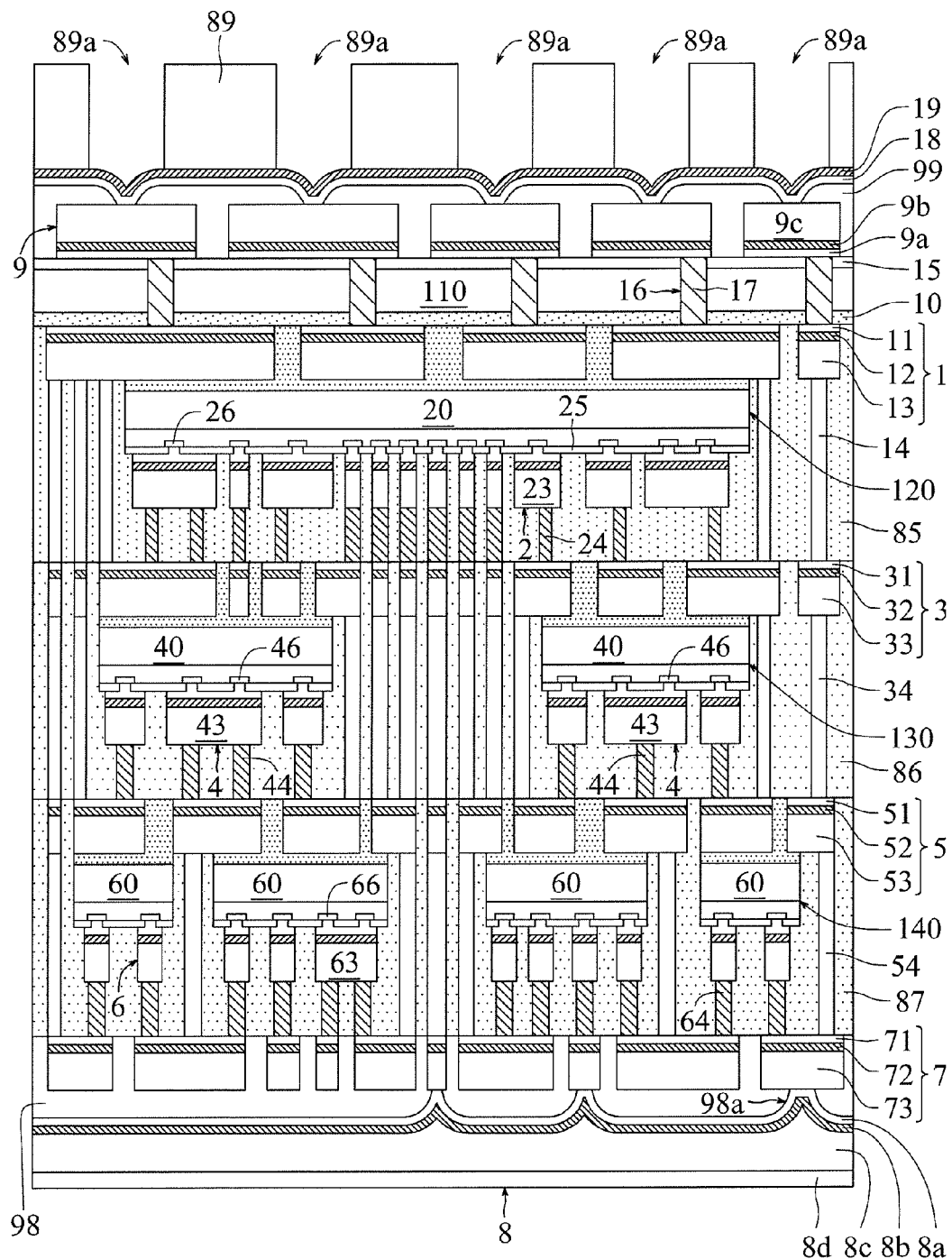

Next, referring to FIG. 49, with the step being illustrated with a reverse figure for simple explanation, an adhesion layer 18 having a thickness, e.g., less than 1 micrometer, such as between 1 nanometer and 0.5 micrometers, can be formed on the contact points of the metal layer 9c and on the polymer layer 99 by using a physical-vapor deposition (PVD) process, such as sputtering process or evaporation process, or a chemical-vapor deposition (CVD) process. Next, a seed layer 19 having a thickness, e.g., less than 1 micrometer, such as between 10 nanometers and 0.8 micrometers, can be formed on the adhesion layer 18 by using a physical-vapor deposition (PVD) process, such as sputtering process or evaporation process, a chemical-vapor deposition (CVD) process or an electroless plating process. Next, a photoresist layer 89, such as positive-type photoresist layer or negative-type photoresist layer (preferred), having a thickness, e.g., greater than 1 micrometer can be formed on the seed layer 19 by using a spin-on coating process or a lamination process. Next, the photoresist layer 89 is patterned with processes of lithographic, light exposure and development to form multiple cylinder-shaped openings 89a in the photoresist layer 89 exposing the seed layer 19.

The material of the adhesion layer 18 may include titanium, a titanium-tungsten alloy, titanium nitride, chromium, tantalum, tantalum nitride, nickel or nickel vanadium. The material of the seed layer 19 may include copper, silver, gold or titanium-copper alloy.

For example, when the adhesion layer 18 is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the contact points of the metal layer 9c and on the polymer layer 99, the seed layer 19 can be formed by sputtering a copper layer, a silver layer, a titanium-copper-alloy layer or a gold layer with a thickness, e.g., less than 1 micrometer, such as between 10 nanometers and 0.8 micrometers, on the titanium-containing layer.

Alternatively, when the adhesion layer 18 is formed by sputtering a tantalum-containing layer, such as a single layer of tantalum or tantalum nitride, having a thickness, e.g., less than 1 micrometer, such as between 1 nanometer and 0.5 micrometers, on the contact points of the metal layer 9c and on the polymer layer 99, the seed layer 19 can be formed by sputtering a copper layer, a silver layer, a titanium-copper-alloy layer or a gold layer with a thickness, e.g., less than 1 micrometer, such as between 10 nanometers and 0.8 micrometers, on the tantalum-containing layer.

Alternatively, when the adhesion layer 18 is formed by sputtering a chromium-containing layer, such as a single layer of chromium, having a thickness, e.g., less than 1 micrometer, such as between 1 nanometer and 0.5 micrometers, on the contact points of the metal layer 9c and on the polymer layer 99, the seed layer 19 can be formed by sputtering a copper layer, a silver layer, a titanium-copper-alloy layer or a gold layer with a thickness, e.g., less than 1 micrometer, such as between 10 nanometers and 0.8 micrometers, on the chromium-containing layer.

Alternatively, when the adhesion layer 18 is formed by sputtering a nickel-containing layer, such as a single layer of nickel or nickel vanadium, having a thickness, e.g., less than 1 micrometer, such as between 1 nanometer and 0.5 micrometers, on the contact points of the metal layer 9c and on the polymer layer 99, the seed layer 19 can be formed by sputtering a copper layer, a silver layer, a titanium-copper-alloy layer or a gold layer with a thickness, e.g., less than 1 micrometer, such as between 10 nanometers and 0.8 micrometers, on the nickel-containing layer.

Figure 50:
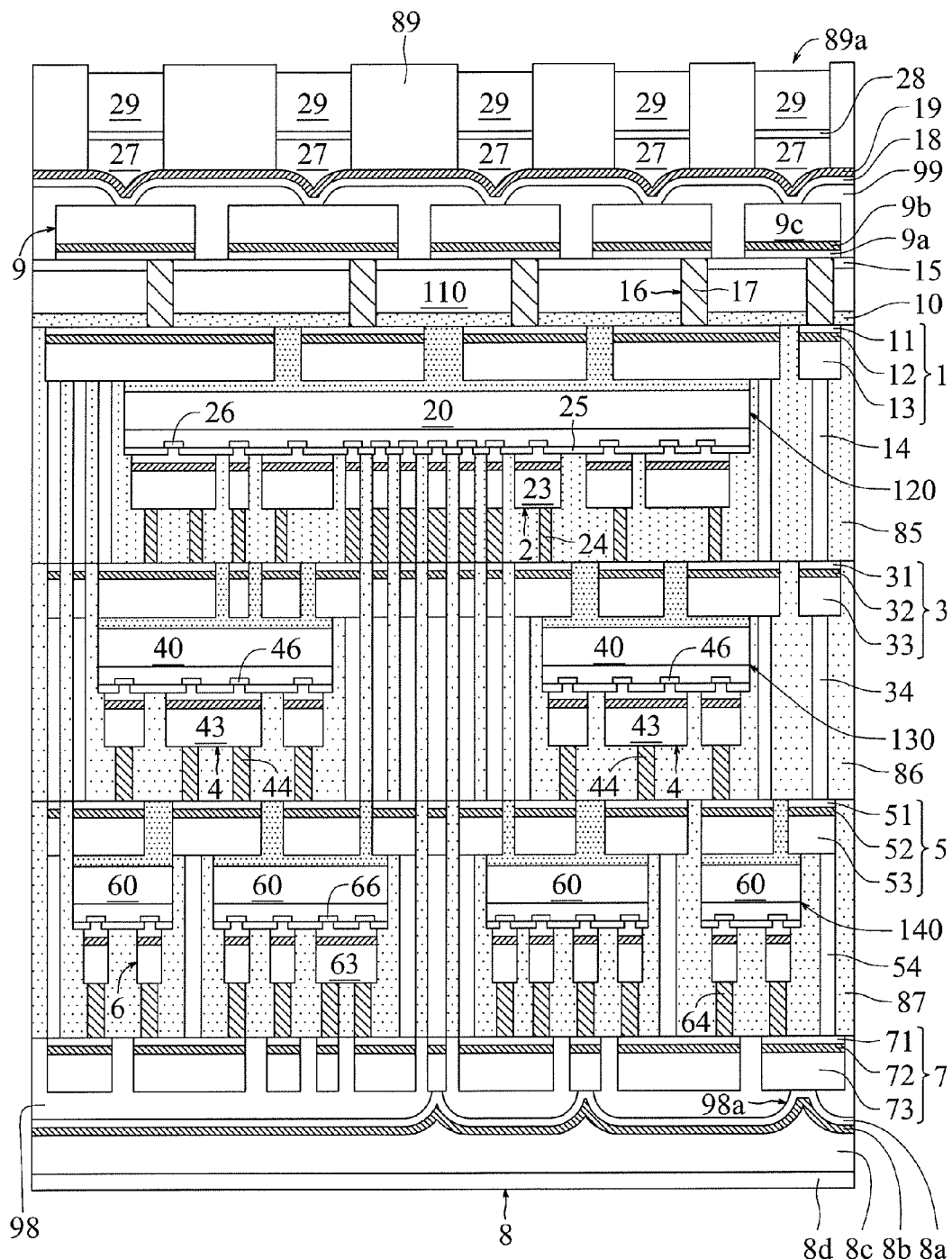

Next, referring to FIG. 50, with the step being illustrated with a reverse figure for simple explanation, a metal layer 27, a conductive layer, having a thickness, e.g., greater than 1 micrometer, such as between 2 and 100 micrometers, and preferably between 5 and 60 micrometers or between 10 and 50 micrometers, can be formed on the seed layer 19 exposed by the cylinder-shaped openings 89a and in the cylinder-shaped openings 89a by using an electroplating process and/or an electroless plating process. The metal layer 27 can be a single layer of copper, silver or gold.

For example, the metal layer 27 can be a single metal layer formed by electroplating a copper layer, to a thickness, e.g., greater than 1 micrometer, such as between 2 and 100 micrometers, and preferably between 5 and 60 micrometers or between 10 and 50 micrometers, in the cylinder-shaped openings 89a and on the seed layer 19, preferably the previously described copper or titanium-copper-alloy seed layer 19, exposed by the cylinder-shaped openings 89a.

Alternatively, the metal layer 27 can be a single metal layer formed by electroplating a silver layer, to a thickness, e.g., greater than 1 micrometer, such as between 2 and 100 micrometers, and preferably between 5 and 60 micrometers or between 10 and 50 micrometers, in the cylinder-shaped openings 89a and on the seed layer 19, preferably the previously described silver seed layer 19, exposed by the cylinder-shaped openings 89a.

Alternatively, the metal layer 27 can be a single metal layer formed by electroplating a gold layer, to a thickness, e.g., greater than 1 micrometer, such as between 2 and 100 micrometers, and preferably between 5 and 60 micrometers or between 10 and 50 micrometers, in the cylinder-shaped openings 89a and on the seed layer 19, preferably the previously described gold seed layer 19, exposed by the cylinder-shaped openings 89a.

After forming the metal layer 27, a metal layer 28, a barrier layer, having a thickness, e.g., between 0.2 and 10 micrometers, and preferably between 1 and 5 micrometers, can be formed in the cylinder-shaped openings 89a and on the metal layer 27 in the cylinder-shaped openings 89a by using an electroplating process and/or an electroless plating process. The metal layer 28 can be a single layer of nickel, nickel vanadium or gold, or a composite layer made of the previously described metals.

For example, the metal layer 28 can be a single metal layer formed by electroplating or electroless plating a nickel layer or a nickel-vanadium layer, to a thickness, e.g., between 0.2 and 10 micrometers, and preferably between 1 and 5 micrometers, in the cylinder-shaped openings 89a and on the metal layer 27, preferably the previously described electroplated copper layer 27, in the cylinder-shaped openings 89a.

Alternatively, the metal layer 28 can be composed of double metal layers formed by electroplating or electroless plating a nickel layer, to a thickness, e.g., between 0.2 and 10 micrometers, and preferably between 1 and 5 micrometers, in the cylinder-shaped openings 89a and on the metal layer 27, preferably the previously described electroplated copper layer 27, in the cylinder-shaped openings 89a, and then electroplating or electroless plating a gold layer, to a thickness, e.g., between 0.005 and 1 micrometers, and preferably between 0.05 and 0.1 micrometers, in the cylinder-shaped openings 89a and on the electroplated or electroless plated nickel layer in the cylinder-shaped openings 89a.

After forming the metal layer 28, a solder layer 29 having a thickness, e.g., greater than 5 micrometers, such as between 5 and 400 micrometers, and preferably between 10 and 100 micrometers, can be formed in the cylinder-shaped openings 89a and on the metal layer 28 in the cylinder-shaped openings 89a by using an electroplating process and/or an electroless plating process. The solder layer 29 can be a bismuth-containing layer, an indium-containing layer or a tin-containing layer of a tin-lead alloy, a tin-silver alloy, a tin-silver-copper alloy or a tin-gold alloy.

For example, the solder layer 29 can be a single metal layer formed by electroplating a bismuth-containing layer, an indium-containing layer or a tin-containing layer of a tin-lead alloy, a tin-silver alloy, a tin-silver-copper alloy or a tin-gold alloy, to a thickness, e.g., greater than 5 micrometers, such as between 5 and 400 micrometers, and preferably between 10 and 100 micrometers, in the cylinder-shaped openings 89a and on the metal layer 28, preferably the previously described electroplated or electroless plated nickel layer 28, in the cylinder-shaped openings 89a.

Figure 51:
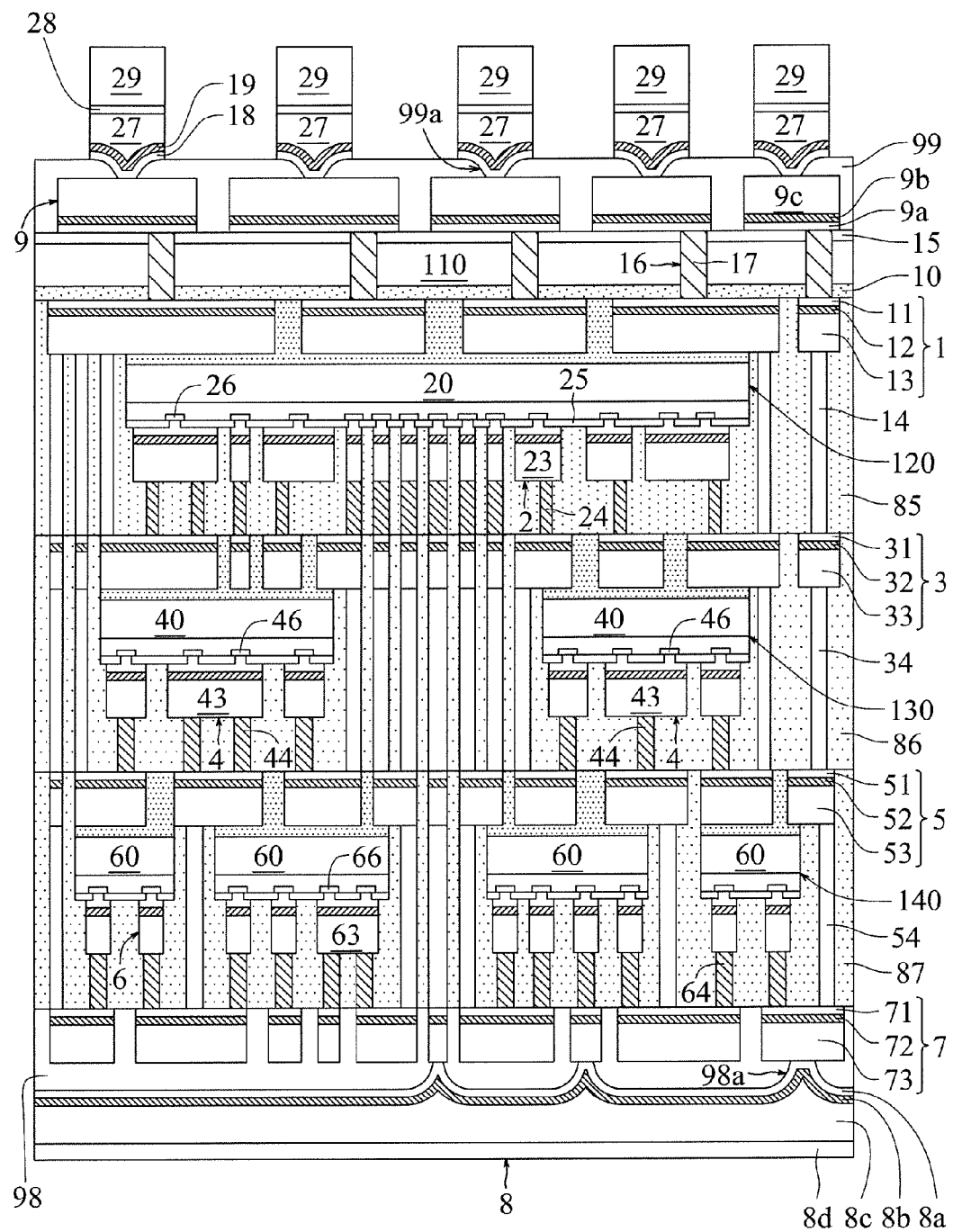

Referring to FIG. 51, with the step being illustrated with a reverse figure for simple explanation, after forming the solder layer 29 illustrated in FIG. 50, the photoresist layer 89 is removed using a chemical solution containing amine or NaCO$_3$. Next, the seed layer 19 not under the metal layer 27 is removed by using a wet chemical etching process or a reactive ion etching (RIE) process, and then the adhesion layer 18 not under the metal layer 27 is removed by using a wet chemical etching process or a reactive ion etching (RIE) process.

Accordingly, the adhesion layer 18, the seed layer 19 and the metal layers 27 and 28 compose an under bump metallurgic (UBM) layer formed on the contact points of the metal layer 9c and on the polymer layer 99, and the solder layer 29 is formed on the metal layer 28, preferably the previously described electroplated or electroless plated nickel layer 28, of the under bump metallurgic (UBM) layer.

Next, referring to FIG. 52, the solder layer 29 is reflowed to form multiple solid solder bumps or balls 29a on the metal layer 28, preferably the previously described electroplated or electroless plated nickel layer 28, of the under bump metallurgic (UBM) layer, and then a singulation process can be performed to cut the substrate 110, the filling or encapsulating layers 85, 86 and 87 and the thermal spreading plane 8 and to singularize a plurality of the system-in package or multichip module shown in FIG. 52. The system-in package or multi-chip module can be connected to a mother board, a printed circuit board, a metal substrate, a glass substrate or a ceramic substrate using the solder bumps or balls 29a.

The solder bumps or balls 29a have a desired bump height, e.g., greater than 5 micrometers, such as between 5 and 400 micrometers, and preferably between 10 and 100 micrometers, and a suitable width or diameter, e.g., between 20 and 400 micrometers, and preferably between 50 and 100 micrometers. The solder bumps or balls 29a can be bismuth-containing bumps or balls, indium-containing bumps or balls, or tin-containing bumps or balls of a tin-lead alloy, a tin-silver alloy, a tin-silver-copper alloy or a tin-gold alloy. Alternatively, the solder bumps or balls 29a can be formed by processes including a screen-printing process and a reflow process or including a ball-mounting process and a reflow process.

The solder bumps or balls 29a can be connected to the patterned metal layer 1 through, in sequence, the under bump metallurgic (UBM) layer, the patterned metal layer 9 and the through-hole connections 17.

One of the solder bumps or balls 29*a* can be connected to one or more metal traces or pads 26 of one of the chips 120 through, in sequence, the under bump metallurgic (UBM) layer, the patterned metal layer 9, one of the through-hole connections 17, the patterned metal layer 1, one of the metal pillars or bumps 14, the patterned metal layer 3, one or more metal pillars or bumps 24, and the patterned metal layer 2.

Another one of the solder bumps or balls 29*a* can be connected to one or more metal traces or pads 46 of one of the chips 130 through, in sequence, the under bump metallurgic (UBM) layer, the patterned metal layer 9, one of the through-hole connections 17, the patterned metal layer 1, one of the metal pillars or bumps 14, the patterned metal layer 3, one of the metal pillars or bumps 34, the patterned metal layer 5, one or more metal pillars or bumps 44, and the patterned metal layer 4.

Another one of the solder bumps or balls 29*a* can be connected to one or more metal traces or pads 66 of one of the chips 140 through, in sequence, the under bump metallurgic (UBM) layer, the patterned metal layer 9, one of the through-hole connections 17, the patterned metal layer 1, one of the metal pillars or bumps 14, the patterned metal layer 3, one of the metal pillars or bumps 34, the patterned metal layer 5, one of the metal pillars or bumps 54, the patterned metal layer 7, one or more metal pillars or bumps 64, and the patterned metal layer 6.

Figure 53:
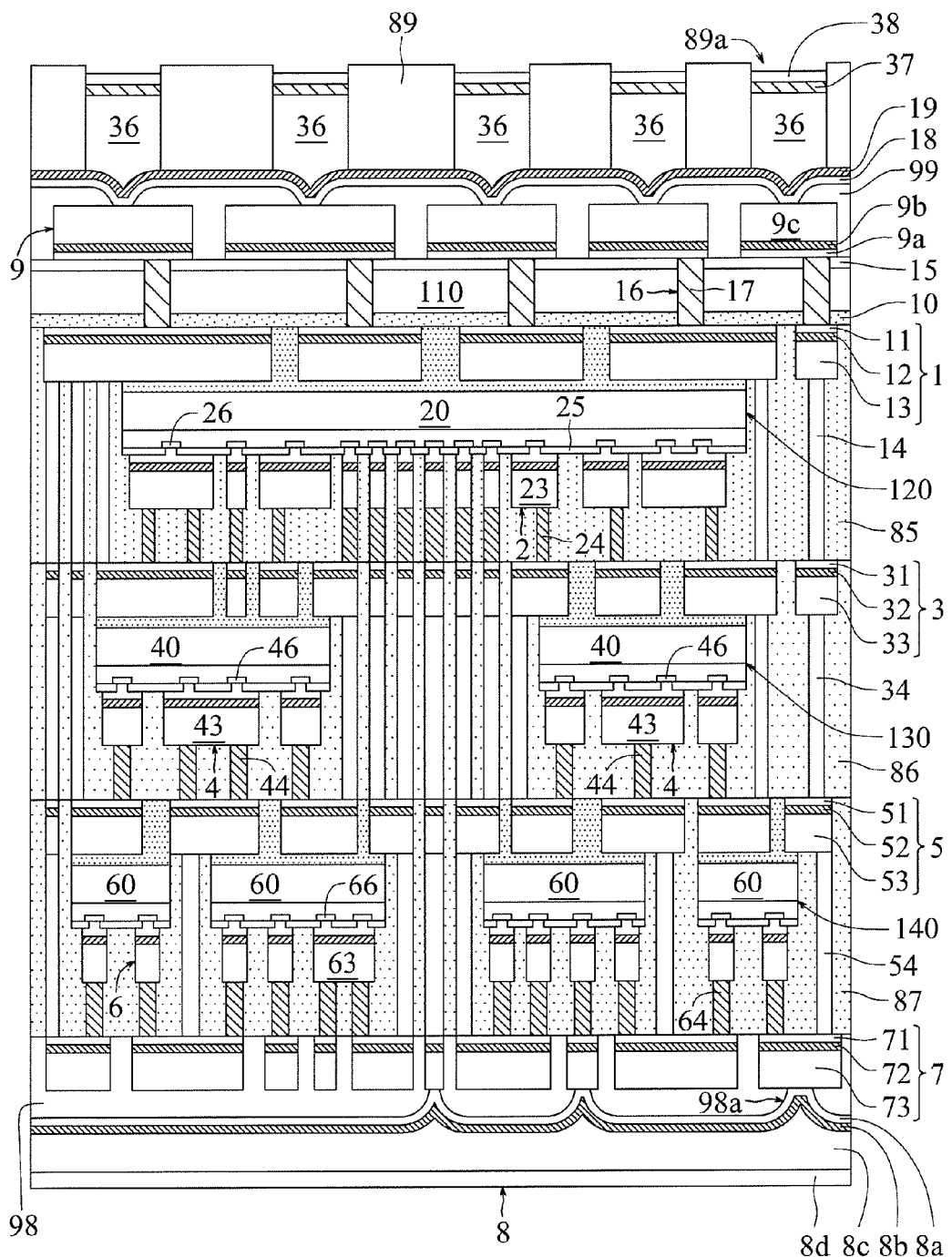
FIGS. 53 and 54 are cross-sectional views showing a process for forming a system-in package or multichip module, according to an embodiment of the present disclosure.
Figure 54:
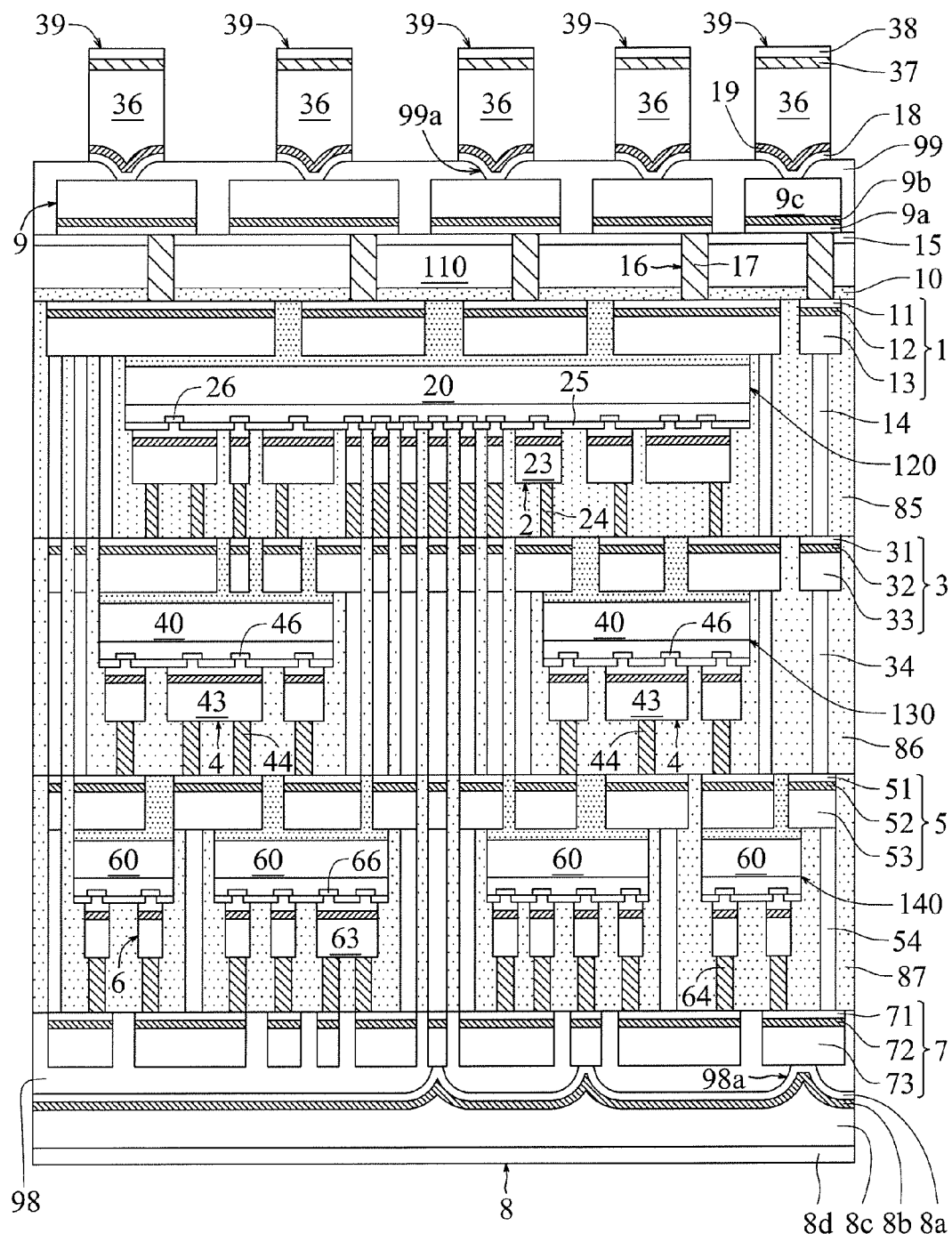

Alternatively, another kind of metal bumps can be formed on the contact points, exposed by the openings 99*a*, of the metal layer 9*c* illustrated in FIG. 48, which can be referred to as the following steps as illustrated in FIGS. 53 and 54.

FIGS. 53 and 54 show a process for forming another system-in package or multichip module according to another embodiment of the present disclosure. Referring to FIG. 53, with the step being illustrated with a reverse figure for simple explanation, after the step illustrated in FIG. 49, a metal layer 36 having a thickness, e.g., greater than 10 micrometers, such as between 10 and 100 micrometers, and preferably between 20 and 60 micrometers, can be formed on the seed layer 19 exposed by the cylinder-shaped openings 89*a* and in the cylinder-shaped openings 89*a* by using an electroplating process or by using an electroplating process and an electroless plating process. Next, a barrier layer 37, a metal layer, having a thickness, e.g., between 0.2 and 10 micrometers, and preferably between 1 and 5 micrometers, can be formed in the cylinder-shaped openings 89*a* and on the metal layer 36 in the cylinder-shaped openings 89*a* by using an electroplating process or an electroless plating process. Finally, a solder wetting layer 38, a metal layer, having a thickness, e.g., between 0.02 and 5 micrometers, and preferably between 0.1 and 1 micrometers, can be formed in the cylinder-shaped openings 89*a* and on the barrier layer 37 in the cylinder-shaped openings 89*a* by using an electroplating process or an electroless plating process.

The metal layer 36 may include copper, silver, gold or nickel. For example, the metal layer 36 can be a single metal layer formed by electroplating a copper layer or a nickel layer, to a thickness, e.g., greater than 10 micrometers, such as between 10 and 100 micrometers, and preferably between 20 and 60 micrometers, in the cylinder-shaped openings 89*a* and on the seed layer 19, preferably the previously described copper seed layer 19, exposed by the cylinder-shaped openings 89*a*. Alternatively, the metal layer 36 can be a single metal layer formed by electroplating a silver layer, to a thickness, e.g., greater than 10 micrometers, such as between 10 and 100 micrometers, and preferably between 20 and 60 micrometers, in the cylinder-shaped openings 89*a* and on the seed layer 19, preferably the previously described silver seed layer 19, exposed by the cylinder-shaped openings 89*a*. Alternatively, the metal layer 36 can be a single metal layer formed by electroplating a gold layer, to a thickness, e.g., greater than 10 micrometers, such as between 10 and 100 micrometers, and preferably between 20 and 60 micrometers, in the cylinder-shaped openings 89*a* and on the seed layer 19, preferably the previously described gold seed layer 19, exposed by the cylinder-shaped openings 89*a*.

The barrier layer 37 may include nickel or nickel vanadium. For example, the barrier layer 37 can be a single metal layer formed by electroplating or electroless plating a nickel or nickel-vanadium layer, to a thickness, e.g., between 0.2 and 10 micrometers, and preferably 1 and 5 micrometers, in the cylinder-shaped openings 89*a* and on the metal layer 36, preferably the previously described electroplated copper layer 36, in the cylinder-shaped openings 89*a*.

The solder wetting layer 38 may include gold, silver, copper, solder, bismuth, indium, a tin-lead alloy, a tin-silver alloy, a tin-silver-copper alloy or a tin-gold alloy. For example, the solder wetting layer 38 can be a single metal layer formed by electroplating or electroless plating a gold layer, a bismuth-containing layer, an indium-containing layer or a tin-containing layer of a tin-lead alloy, a tin-silver alloy, a tin-silver-copper alloy or a tin-gold alloy, to a thickness, e.g., between 0.02 and 5 micrometers, and preferably between 0.1 and 1 micrometers, in the cylinder-shaped openings 89*a* and on the barrier layer 37, preferably the previously described electroplated or electroless plated nickel layer 37, in the cylinder-shaped openings 89*a*.

Referring to FIG. 54, with the step being illustrated with a reverse figure for simple explanation, after forming the solder wetting layer 38 illustrated in FIG. 53, the photoresist layer 89 is removed using a chemical solution containing amine or NaCO$_3$, next the seed layer 19 not under the metal layer 36 is removed by using a wet chemical etching process or a reactive ion etching (RIE) process, and then the adhesion layer 18 not under the metal layer 36 is removed by using a wet chemical etching process or a reactive ion etching (RIE) process.

Accordingly, the adhesion layer 18, the seed layer 19, the metal layer 36, the barrier layer 37 and the solder wetting layer 38 compose multiple metal pillars or bumps 39 formed on the contact points of the metal layer 9*c* exposed by the openings 99*a* and on the polymer layer 99. Each of the metal pillars or bumps 39 may have a suitable width, e.g., between 20 and 400 micrometers, and preferably between 50 and 100 micrometers, and a bump height greater than 10 micrometers, such as between 10 and 115 micrometers, and preferably between 20 and 65 micrometers.

Alternatively, the barrier layer 37 can be omitted from the metal pillars or bumps 39, that is, the metal pillars or bumps 39 can be composed of the adhesion layer 18 on the contact points, exposed by the openings 99*a*, of the metal layer 9*c* and on the polymer layer 99, the seed layer 19 on the adhesion layer 18, the metal layer 36 on the seed layer 19, and the solder wetting layer 38 on the metal layer 36. For example, when the metal layer 36 is a nickel-containing layer, such as a single layer of nickel or nickel vanadium, with a thickness, e.g., greater than 10 micrometers, such as between 10 and 100 micrometers, and preferably between 20 and 60 micrometers, formed on the seed layer 19, preferably the previously described copper seed layer 19, by an electroplating process, the solder wetting layer 38 can be a gold layer, a bismuth-containing layer, an indium-containing layer or a tin-containing layer with a thickness, e.g., between 0.02 and 5 micrometers, and preferably between 0.1 and 1 micrometers, formed on the electroplated nickel-containing layer 36 by an electroplating process or an electroless plating process.

After forming the metal pillars or bumps 39, a singulation process can be performed to cut the substrate 110, the filling or encapsulating layers 85, 86 and 87 and the thermal spreading plane 8 and to singularize a plurality of the system-in package or multichip module shown in FIG. 54. The system-in package or multichip module can be connected to a mother board, a printed circuit board, a metal substrate, a glass substrate or a ceramic substrate using the metal pillars or bumps 39.

Figure 104:
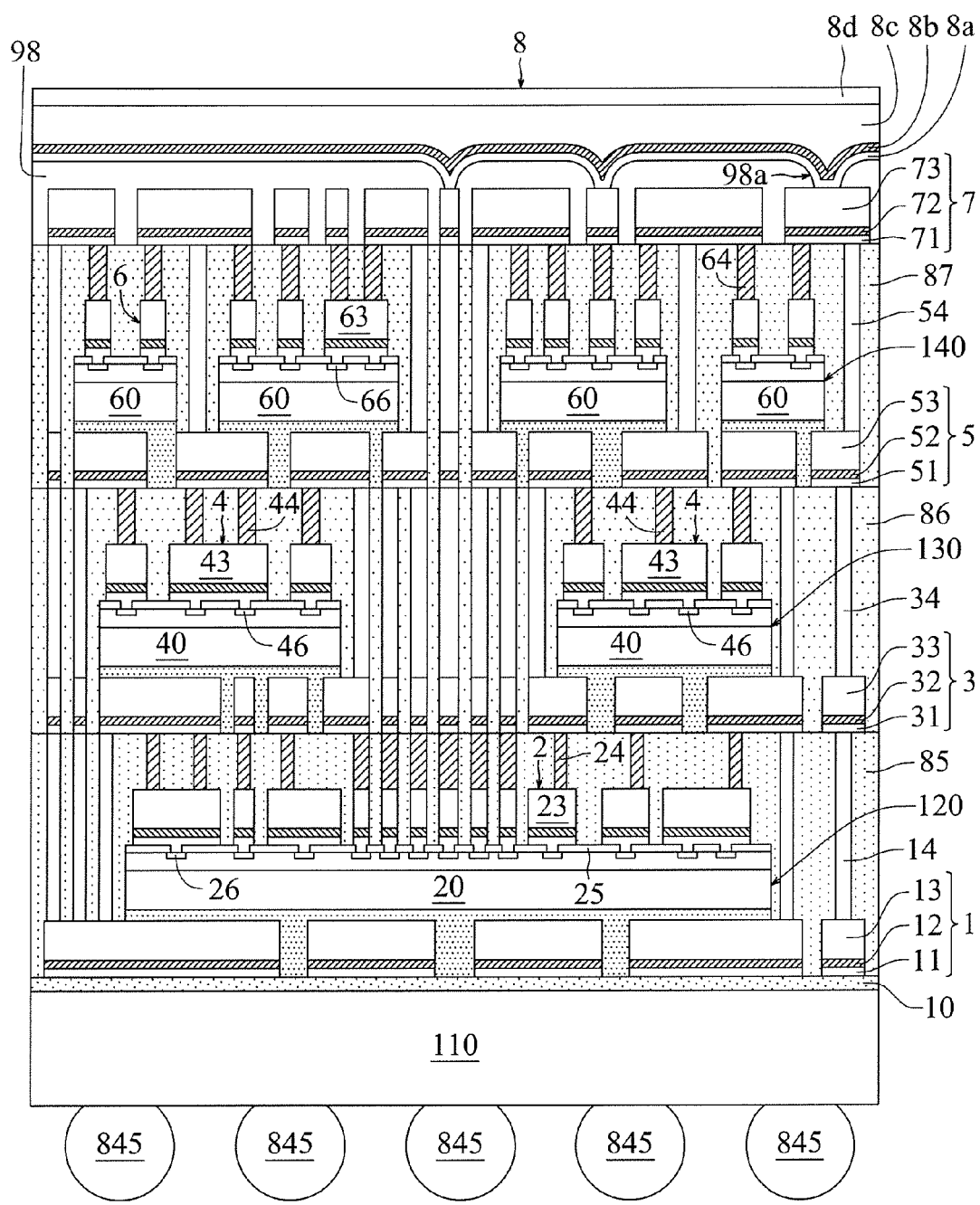
FIG. 104 shows a cross-sectional view of a system-in package or multichip module, according to an embodiment of the present disclosure.

FIG. 104 shows another system-in package or multichip module according to another embodiment of the present disclosure. When the substrate 110 is a ball-grid-array (BGA) substrate or a print circuit board (PCB), multiple solder bumps or balls 845 can be formed on a bottom surface of the substrate 110 after the previously described steps illustrated in FIGS. 1-39, and then a singulation process can be performed to cut the substrate 110, the filling or encapsulating layers 85, 86 and 87 and the thermal spreading plane 8 and to singularize a plurality of the system-in package or multichip module shown in FIG. 104. The patterned metal layer 1 of the system-in package or multichip module shown in FIG. 104 can be connected to the solder bumps or balls 845 through multiple metal layers in the substrate 110. The system-in package or multichip module shown in FIG. 104 can be connected to a mother board, a printed circuit board, a metal substrate, a glass substrate or a ceramic substrate using the solder bumps or balls 845. The solder bumps or balls 845 have a bump height greater than 5 micrometers, such as between 5 and 400 micrometers, and preferably between 10 and 100 micrometers, and a suitable width or diameter, e.g., between 20 and 400 micrometers, and preferably between 50 and 100 micrometers. The solder bumps or balls 845 may include, for example, bismuth, indium, a tin-lead alloy, a tin-silver alloy, a tin-silver-copper alloy, and/or a tin-gold alloy.

Figure 55:
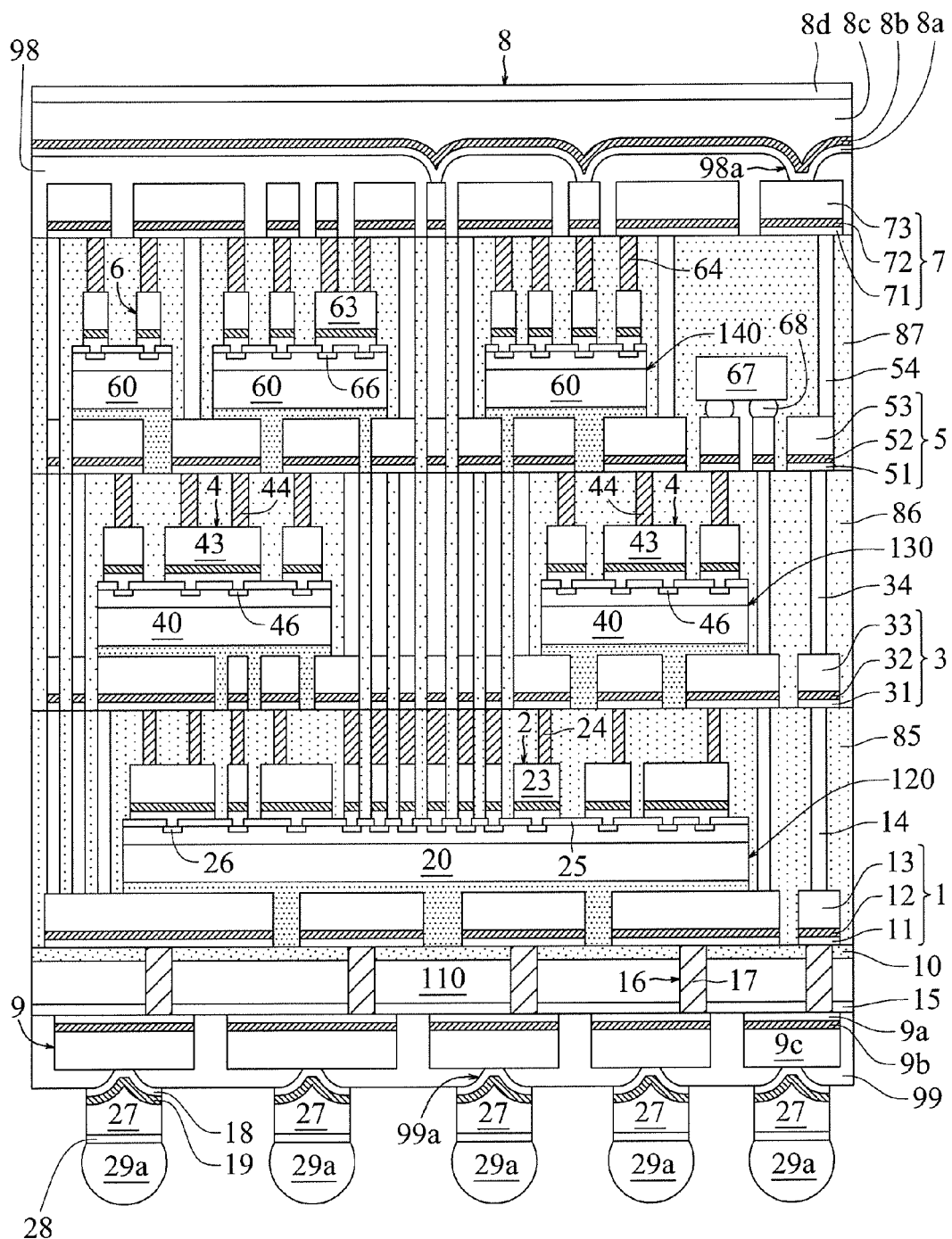
FIG. 55 shows a cross-sectional view of a system-in package or multichip module, according to an embodiment of the present disclosure.

FIG. 55 demonstrates another system-in package or multichip module according to another embodiment of the present disclosure. In this embodiment, one of the chips 140 in the system-in package or multichip module illustrated in FIG. 52 can be replaced by a passive component 67, such as capacitor, inductor or resistor. The element in FIG. 55 indicated by a same reference number as indicates the element in FIGS. 1-52 has a same material and spec as the element illustrated in FIGS. 1-52. The passive component 67 can be connected to the metal layer 53 of the patterned metal layer 5 through two solder joints 68. The solder joints 68 may include bismuth, indium, tin-lead alloy, tin-silver alloy, tin-silver-copper alloy or tin-gold.

The passive component 67 may have first and second terminals. The first terminal of the passive component 67 can be connected to one or more metal traces or pads 46 of one or more chips 130 through, in sequence, one of the solder joints 68, the patterned metal layer 5, one or more metal pillars or bumps 44 and the patterned metal layer 4. The second terminal of the passive component 67 can be connected to one or more metal traces or pads 26 of one or more chips 120 through, in sequence, the other one of the solder joints 68, the patterned metal layer 5, one or more metal pillars or bumps 34, the patterned metal layer 3, one or more metal pillars or bumps 24, and the patterned metal layer 2. Alternatively, the second terminal of the passive component 67 can be connected to one or more solder bumps or balls 29a through, in sequence, the other one of the solder joints 68, the patterned metal layer 5, one or more metal pillars or bumps 34, the patterned metal layer 3, one or more metal pillars or bumps 14, the patterned metal layer 1, one or more through-hole connections 17, the patterned metal layer 9, and the under bump metallurgic (UBM) layer composed of the adhesion layer 18, the seed layer 19 and the metal layers 27 and 28.

Furthermore, the first terminal of the passive component 67 can be connected to a first signal interconnect or trace, provided by the patterned metal layer 5, through one of the solder joints 68, and the second terminal of the passive component 67 can be connected a second signal interconnect or trace, provided by the patterned metal layer 5, through the other one of the solder joints 68. Alternatively, the first terminal of the passive component 67 can be connected to a signal interconnect or trace, provided by the patterned metal layer 5, through one of the solder joints 68, and the second terminal of the passive component 67 can be connected a ground interconnect or trace, provided by the patterned metal layer 5, through the other one of the solder joints 68. Alternatively, the first terminal of the passive component 67 can be connected to a power interconnect or trace, provided by the patterned metal layer 5, through one of the solder joints 68, and the second terminal of the passive component 67 can be connected a ground interconnect or trace, provided by the patterned metal layer 5, through the other one of the solder joints 68.

The system-in package or multichip module illustrated in FIG. 55 can be formed by the following steps. First, the passive component 67 is mounted onto the metal layer 53 of the patterned metal layer 5 using the solder joints 68 after the step illustrated in FIG. 30. Next, the filling or encapsulating layer 87 is formed on the top surface 86a of the filling or encapsulating layer 86, on the metal layer 53 of the patterned metal layer 5, on the chips 140, on the passive component 67, on the metal layer 63 of the patterned metal layer 6 and on tops of the metal pillars or bumps 54 and 64 by using a molding process, a spin coating process, a lamination process or a printing process. Next, the steps illustrated in FIGS. 32-52 can be performed to form the system-in package or multichip module illustrated in FIG. 55. The system-in package or multichip module illustrated in FIG. 55 can be connected to a mother board, a printed circuit board, a metal substrate, a glass substrate or a ceramic substrate using the solder bumps or balls 29a.

Figure 56:
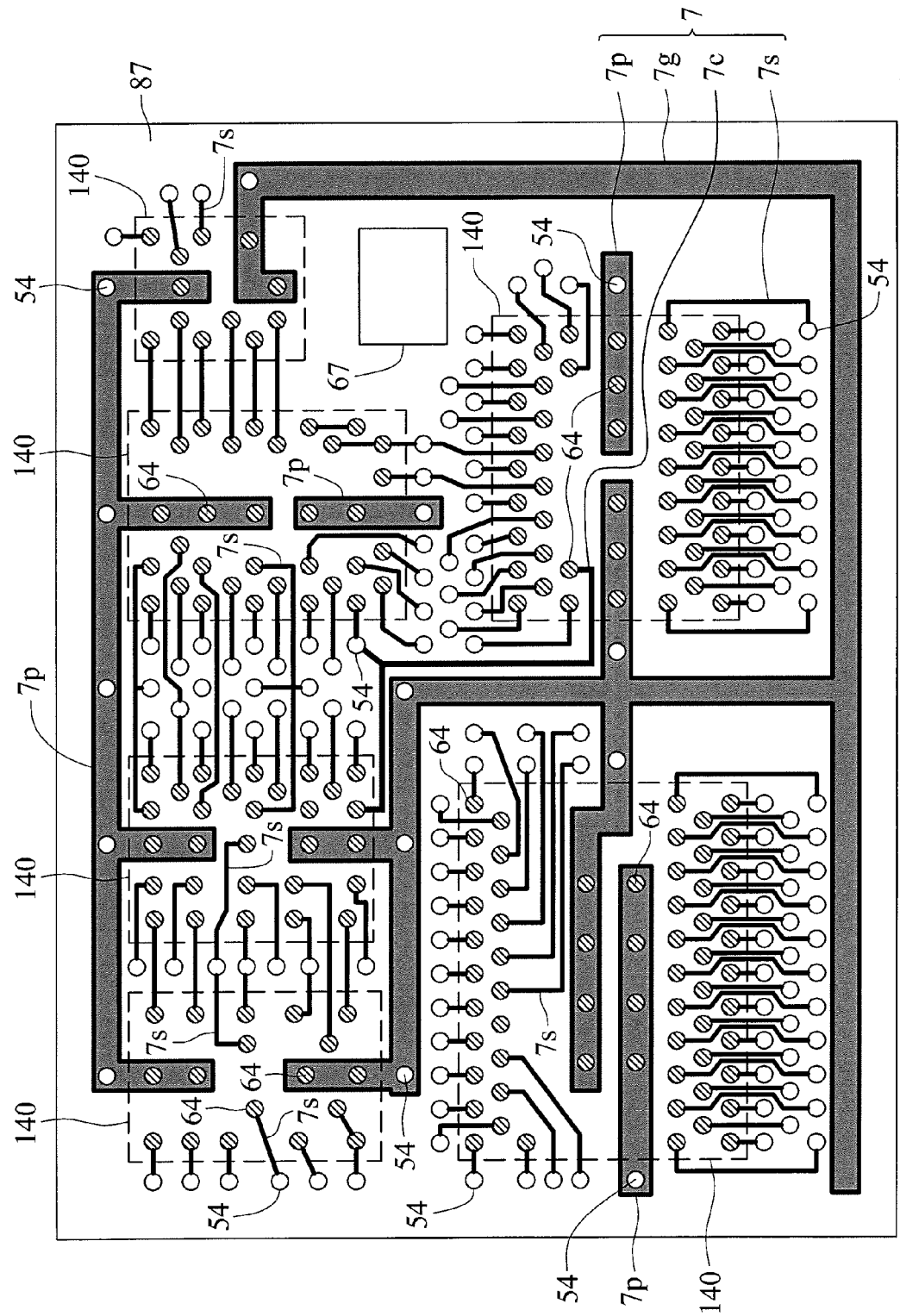
FIG. 56 is a schematic top perspective view of the patterned metal layer 7 shown in FIG. 55.

FIG. 56 is a schematically top perspective view of the patterned metal layer 7 illustrated in FIG. 55. Circles 64 enclosing oblique lines indicate the metal pillars or bumps 64 preformed on the patterned metal layer 6, shown in FIG. 55, before the chips 140 are cut from a semiconductor wafer. Circles 54 enclosing no oblique lines indicate the metal pillars or bumps 54 preformed on the patterned metal layer 5, shown in FIG. 55, before the chips 140 and the passive component 67 are mounted on the patterned metal layer 5.

Figure 57:
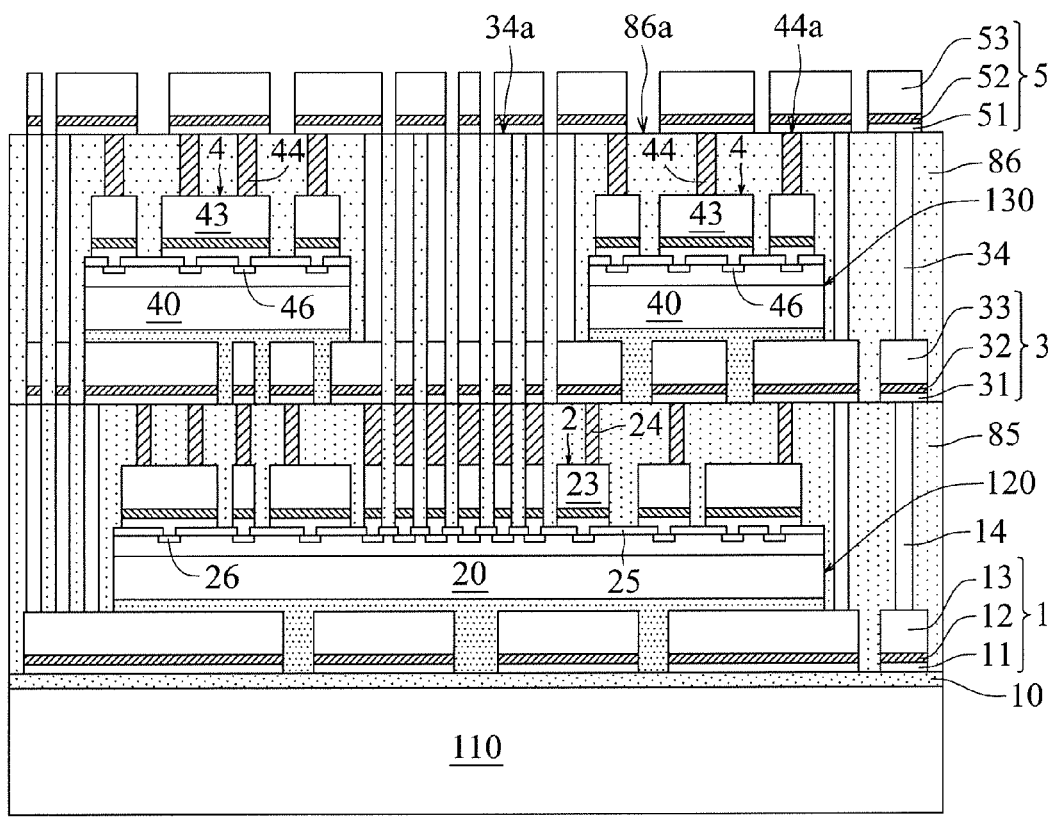
FIGS. 57-67 are cross-sectional views showing a process for forming a system-in package or multichip module, according to an embodiment of the present disclosure.

FIGS. 57-67 show a process for forming another system-in package or multichip module according to another embodiment of the present disclosure. Referring to FIG. 57, after the steps illustrated in FIGS. 1-24 are performed, the photoresist layer 94 is removed by using a chemical solution containing amine or $NaCO_3$. Next, the seed layer 52 not under the metal layer 53 is removed by using a wet chemical etching process or a reactive ion etching (RIE) process. Next, the adhesion layer 51 not under the metal layer 53 is removed by using a wet chemical etching process or a reactive ion etching (RIE) process. Accordingly, the adhesion layer 51, the seed layer 52 and the metal layer 53 compose a patterned metal layer 5 formed on the top surface 86a of the filling or encapsulating layer 86, on the top surfaces 44a of the metal pillars or bumps 44 and on the top surfaces 34a of the metal pillars or bumps 34. A coverage ratio of an area of the patterned metal layer 5 covering a ground or polished surface including the top surfaces 34a, 44a and 86a to an area of the ground or polished surface ranges from 50% to 95%, and preferably ranges from 60% to 90%. The patterned metal layer 5 may include a metal interconnect or trace, such as signal trace, clock bus, clock trace, power plane, power bus, power trace, ground plane, ground bus or ground trace, connecting multiple of the metal pillars or bumps 34, connecting multiple of the metal pillars or bumps 44, or connecting one or more of the metal pillars or bumps 34 to one or more of the metal pillars or bumps 44. Each of the chips 130 may have one of the metal traces or pads 46 connected to multiple of the metal traces or pads 26 in one or more of the chips 120 through, in sequence, the patterned metal layer 4, one of the metal pillars or bumps 44, the patterned metal layer 5, one or more of the metal pillars or bumps 34, the patterned metal layer 3, multiple of the metal pillars or bumps 24, and the patterned metal layer 2.

Figure 58:
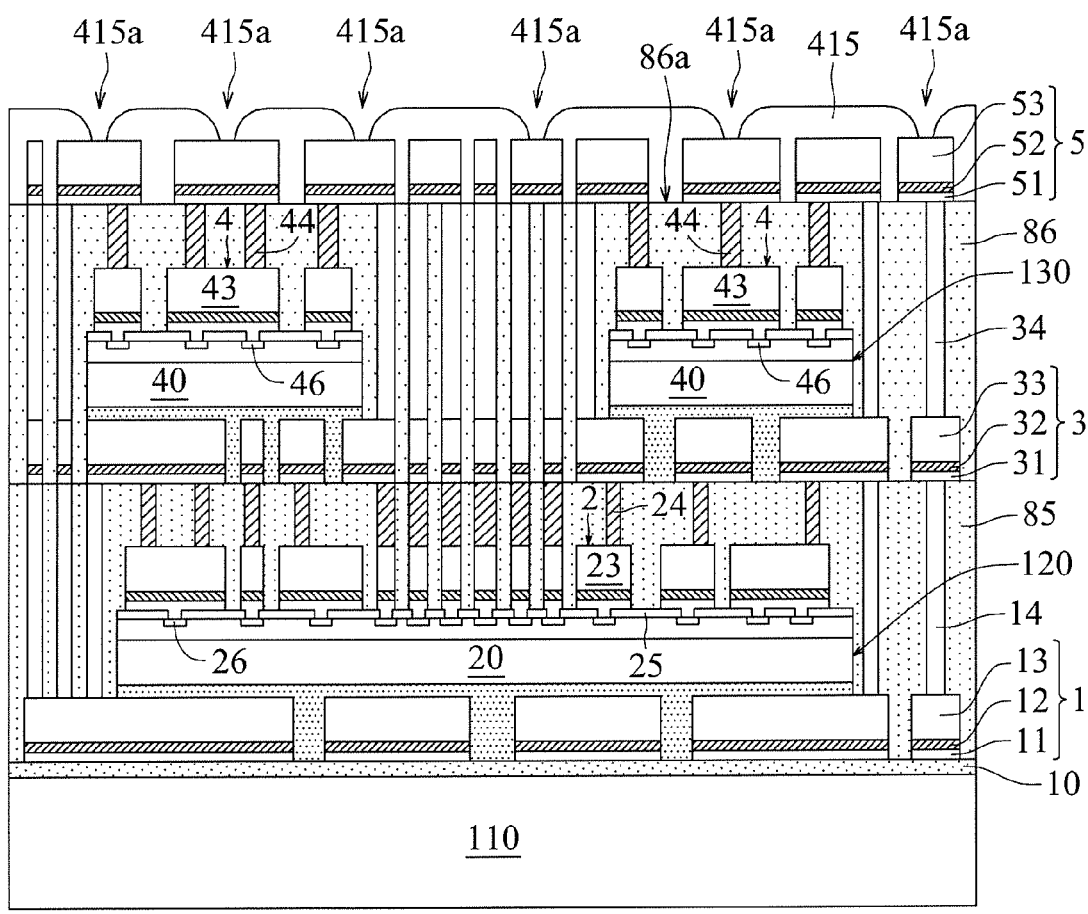

Referring to FIG. 58, after the step illustrated in FIG. 57, a polymer layer 415 is formed on the metal layer 53 of the patterned metal layer 5 and on the top surface 86*a* of the filling or encapsulating layer 86, and multiple openings 415*a* in the polymer layer 415 are over multiple contact points of the metal layer 53 and expose them. The polymer layer 415 may have a thickness, e.g., between 1 and 20 micrometers, and preferably between 2 and 15 micrometers or between 5 and 10 micrometers, and can be a polyimide layer, a polybenzoxazole (PBO) layer, a benzocyclobutane (BCB) layer, an epoxy layer, a poly-phenylene oxide (PPO) layer, a silosane layer or a SU-8 layer.

Figure 59:
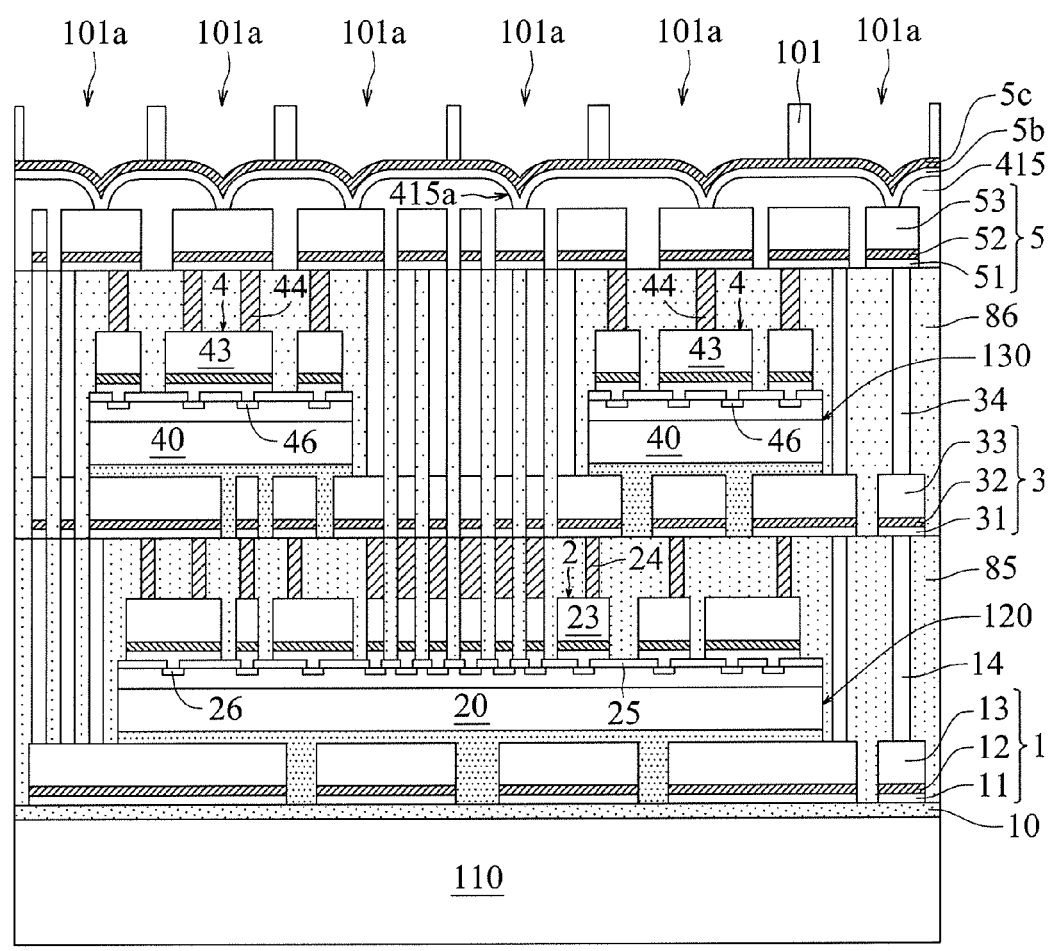

Next, referring to FIG. 59, an adhesion layer 5*b* having a thickness, e.g., less than 1 micrometer, such as between 1 nanometer and 0.5 micrometers, can be formed on the contact points, exposed by the openings 415*a*, of the metal layer 53 and on the polymer layer 415 by using a physical-vapor deposition (PVD) process, such as sputtering process or evaporation process. Next, a seed layer 5*c* having a thickness, e.g., less than 1 micrometer, such as between 10 nanometers and 0.8 micrometers, can be formed on the adhesion layer 5*b* by using a physical-vapor deposition (PVD) process, such as sputtering process or evaporation process, or an electroless plating process. Next, a photoresist layer 101 can be formed on the seed layer 5*c* by using a spin-on coating process or a lamination process. Next, the photoresist layer 101 is patterned with processes of lithographic, light exposure and development to form multiple openings 101*a* in the photoresist layer 101 exposing the seed layer 5*c*.

The material of the adhesion layer 5*b* may include titanium, a titanium-tungsten alloy, titanium nitride, chromium, tantalum, tantalum nitride, nickel or nickel vanadium. The material of the seed layer 5*c* may include copper, silver, gold or titanium-copper alloy.

For example, when the adhesion layer 5*b* is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the contact points, exposed by the openings 415*a*, of the metal layer 53 and on the polymer layer 415, the seed layer 5*c* can be formed by sputtering a copper layer, a silver layer, a titanium-copper-alloy layer or a gold layer with a thickness, e.g., less than 1 micrometer, such as between 10 nanometers and 0.8 micrometers, on the titanium-containing layer.

Alternatively, when the adhesion layer 5*b* is formed by sputtering a tantalum-containing layer, such as a single layer of tantalum or tantalum nitride, having a thickness, e.g., less than 1 micrometer, such as between 1 nanometer and 0.5 micrometers, on the contact points, exposed by the openings 415*a*, of the metal layer 53 and on the polymer layer 415, the seed layer 5*c* can be formed by sputtering a copper layer, a silver layer, a titanium-copper-alloy layer or a gold layer with a thickness, e.g., less than 1 micrometer, such as between 10 nanometers and 0.8 micrometers, on the tantalum-containing layer.

Alternatively, when the adhesion layer 5*b* is formed by sputtering a chromium-containing layer, such as a single layer of chromium, having a thickness, e.g., less than 1 micrometer, such as between 1 nanometer and 0.5 micrometers, on the contact points, exposed by the openings 415*a*, of the metal layer 53 and on the polymer layer 415, the seed layer 5*c* can be formed by sputtering a copper layer, a silver layer, a titanium-copper-alloy layer or a gold layer with a thickness, e.g., less than 1 micrometer, such as between 10 nanometers and 0.8 micrometers, on the chromium-containing layer.

Alternatively, when the adhesion layer 5*b* is formed by sputtering a nickel-containing layer, such as a single layer of nickel or nickel vanadium, having a thickness, e.g., less than 1 micrometer, such as between 1 nanometer and 0.5 micrometers, on the contact points, exposed by the openings 415*a*, of the metal layer 53 and on the polymer layer 415, the seed layer 5*c* can be formed by sputtering a copper layer, a silver layer, a titanium-copper-alloy layer or a gold layer with a thickness, e.g., less than 1 micrometer, such as between 10 nanometers and 0.8 micrometers, on the nickel-containing layer.

Figure 60:
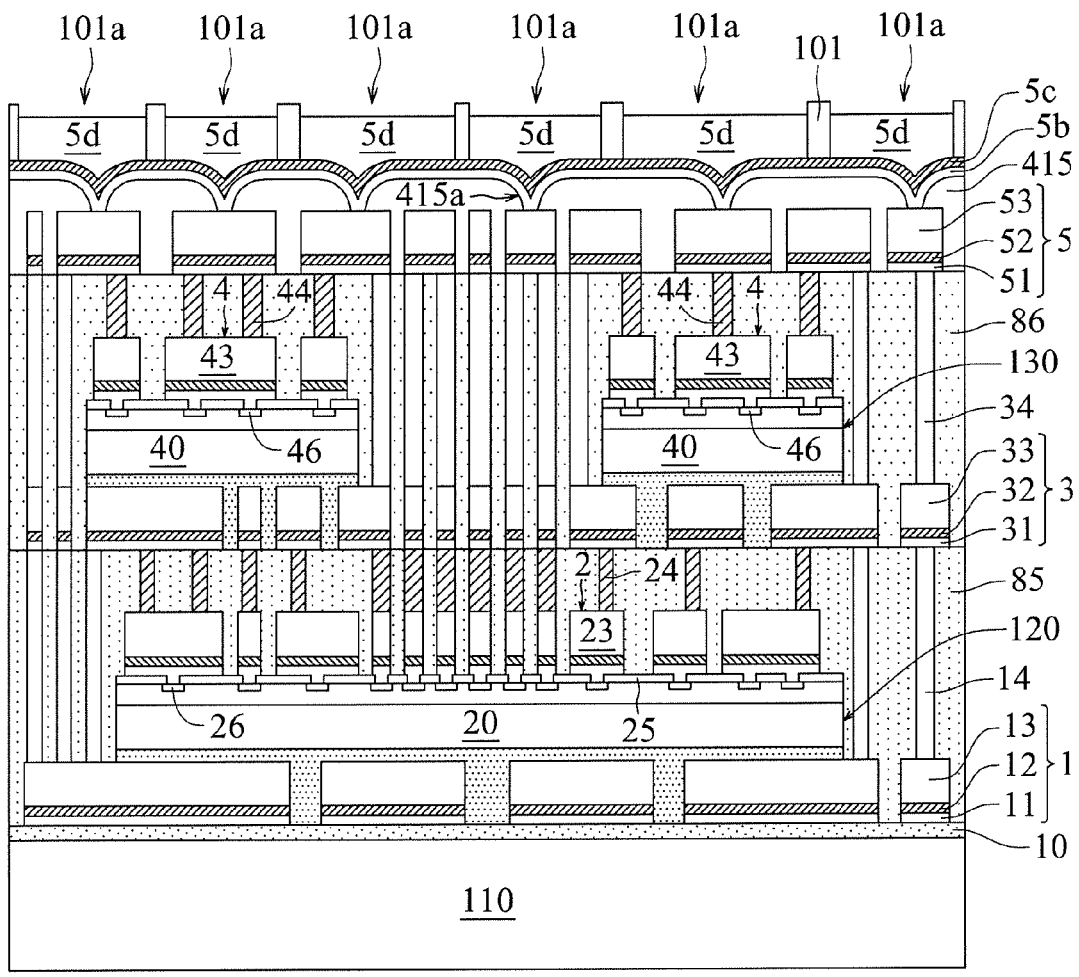

Referring to FIG. 60, after the step illustrated in FIG. 59, a metal layer 5*d*, a conductive layer, having a thickness, e.g., greater than 1 micrometer, such as between 2 and 30 micrometers, and preferably between 3 and 10 micrometers, can be formed on the seed layer 5*c* exposed by the openings 101*a* and in the openings 101*a* by using a process including an electroplating process. The metal layer 5*d* can be a single layer of copper, silver, gold, palladium, platinum, rhodium, ruthenium, rhenium or nickel, or a composite layer made of the previously described metals.

For example, the metal layer 5*d* can be a single metal layer formed by electroplating a copper layer, to a thickness, e.g., greater than 1 micrometer, such as between 2 and 30 micrometers, and preferably between 3 and 10 micrometers, in the openings 101*a* and on the seed layer 5*c*, preferably the previously described copper or titanium-copper-alloy seed layer 5*c*, exposed by the openings 101*a*.

Alternatively, the metal layer 5*d* can be a single metal layer formed by electroplating a gold layer, to a thickness, e.g., greater than 1 micrometer, such as between 2 and 30 micrometers, and preferably between 3 and 10 micrometers, in the openings 101*a* and on the seed layer 5*c*, preferably the previously described gold seed layer 5*c*, exposed by the openings 101*a*.

Figure 61:
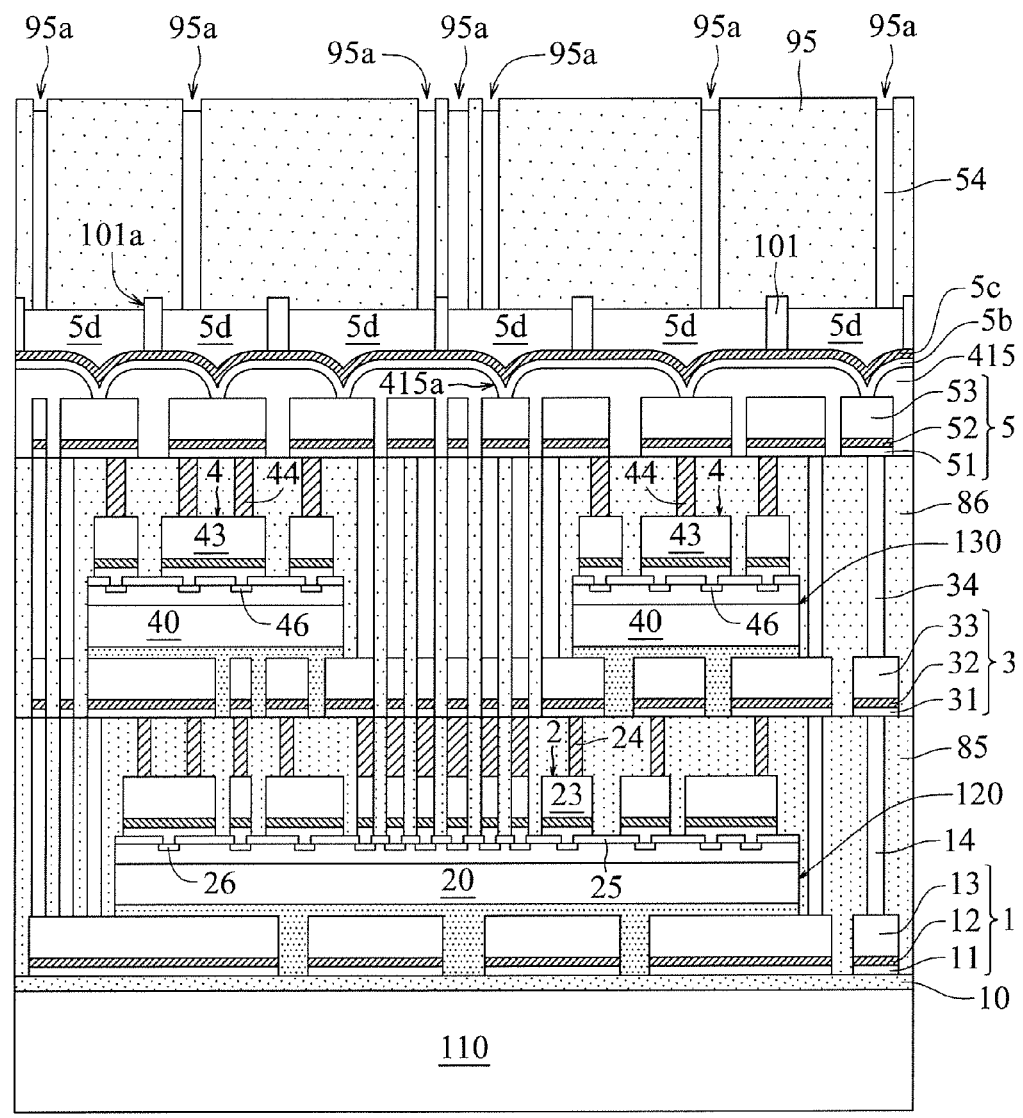

Next, referring to FIG. 61, a photoresist layer 95 can be formed on the photoresist layer 101 and on the metal layer 5*d*, and multiple cylindrical openings 95*a* in the photoresist layer 95 are over multiple contact points of the metal layer 5*d* and expose them. Next, multiple metal pillars or bumps 54 having a thickness, e.g., or height greater than 15 micrometers, such as between 15 and 520 micrometers, and preferably between 20 and 110 micrometers, are formed in the cylindrical openings 95*a* and on the contact points, exposed by the cylindrical openings 95*a*, of the metal layer 5*d* by using a process including an electroplating process, which can be referred to as the step illustrated in FIG. 26. The specification of the metal pillars or bumps 54 shown in FIG. 61 can be referred to as the specification of the metal pillars or bumps 54 as illustrated in FIG. 26.

Figure 62:
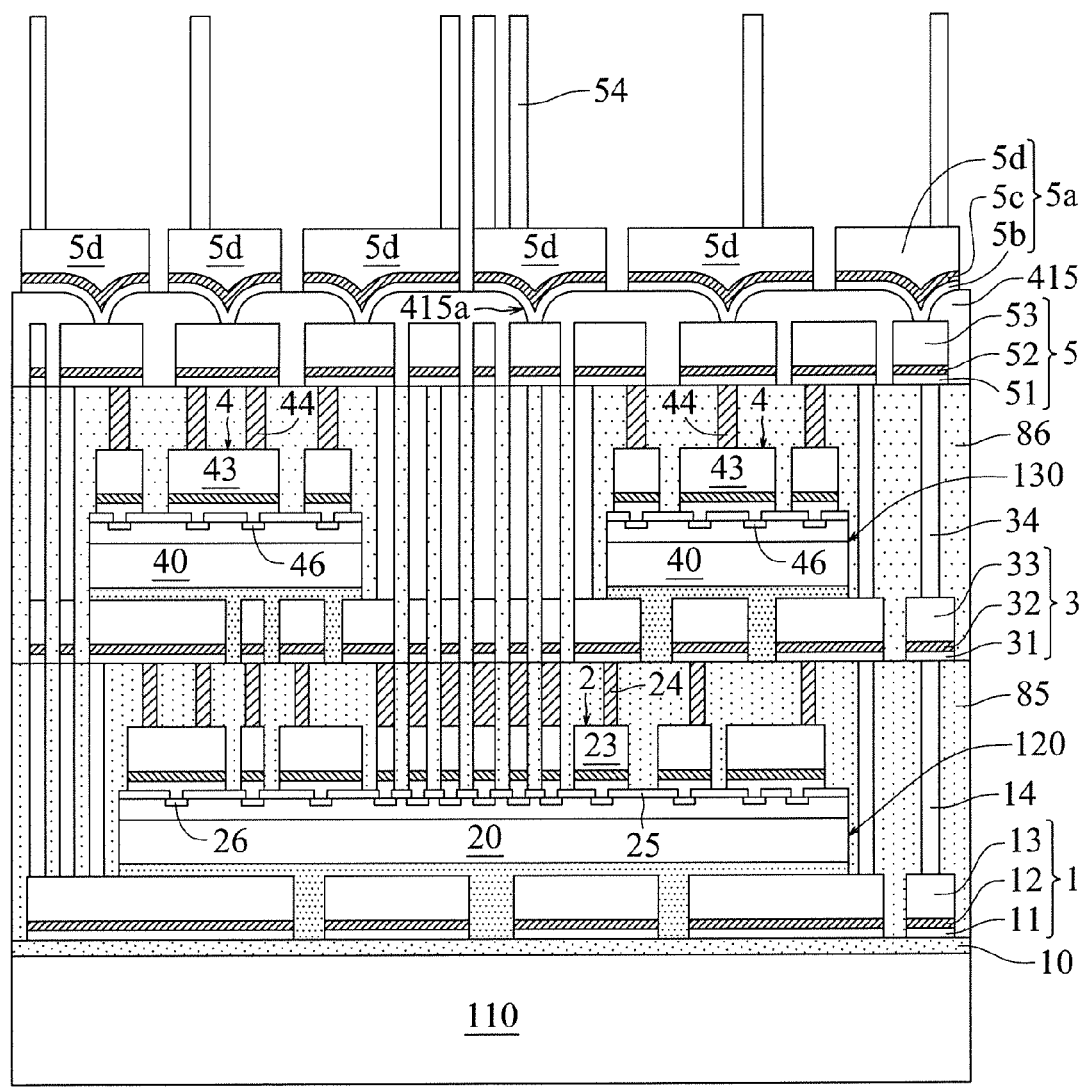

Referring to FIG. 62, after forming the metal pillars or bumps 54 illustrated in FIG. 61, the photoresist layers 95 and 101 are removed using a chemical solution containing amine or $NaCO_3$. Next, the seed layer 5*c* not under the metal layer 5*d* is removed by using a wet chemical etching process or a reactive ion etching (RIE) process. Next, the adhesion layer 5b not under the metal layer 5d is removed by using a wet chemical etching process or a reactive ion etching (RIE) process.

Accordingly, the adhesion layer 5b, the seed layer 5c and the metal layer 5d compose a patterned metal layer 5a formed on the contact points, exposed by the openings 415a, of the metal layer 53 and on the polymer layer 415, and the metal pillars or bumps 54 are formed on the metal layer 5d of the patterned metal layer 5a. The pitch between neighboring or adjacent pairs of metal pillars or bumps 54 can be, for example, greater than 100 micrometers, such as between 100 and 250 micrometers, or less than 100 micrometers, such as between 5 and 50 micrometers or between 50 and 100 micrometers. Each of the metal pillars or bumps 54 may have a suitable width or diameter, e.g., greater than 5 micrometers, such as between 5 and 300 micrometers, and preferably between 5 and 50 micrometers. The patterned metal layer 5a may include a metal interconnect or trace, such as signal trace, clock bus, clock trace, power plane, power bus, power trace, ground plane, ground bus or ground trace, connecting one or more of the metal pillars or bumps 54 to the patterned metal layer 5. The metal pillars or bumps 54 can be connected to the metal pillars or bumps 34 and 44 through the patterned metal layers 5 and 5a.

Alternatively, another process for forming the metal pillars or bumps 54 on the metal layer 5d can be performed by the following steps. First, the photoresist layer 101 is removed using a chemical solution containing amine or $NaCO_3$ after forming the metal layer 5d illustrated in FIG. 60. Next, the photoresist layer 95 illustrated in FIG. 61 can be formed on the metal layer 5d and on the seed layer 5c by a spin-on coating process or a lamination process. Next, the photoresist layer 95 is patterned with the processes of lithographic, light exposure and development to form the cylindrical openings 95a in the photoresist layer 95 exposing the contact points of the metal layer 5d. Next, the metal pillars or bumps 54 are formed in the cylindrical openings 95a and on the contact points, exposed by the cylindrical openings 95a, of the metal layer 5d using a process including an electroplating process, which can be referred to as the step illustrated in FIG. 26. Next, the photoresist layer 95 is removed using a chemical solution containing amine or $NaCO_3$. Accordingly, the metal pillars or bumps 54 can be formed on the metal layer 5d after the photoresist layer 95 is removed.

Figure 63:
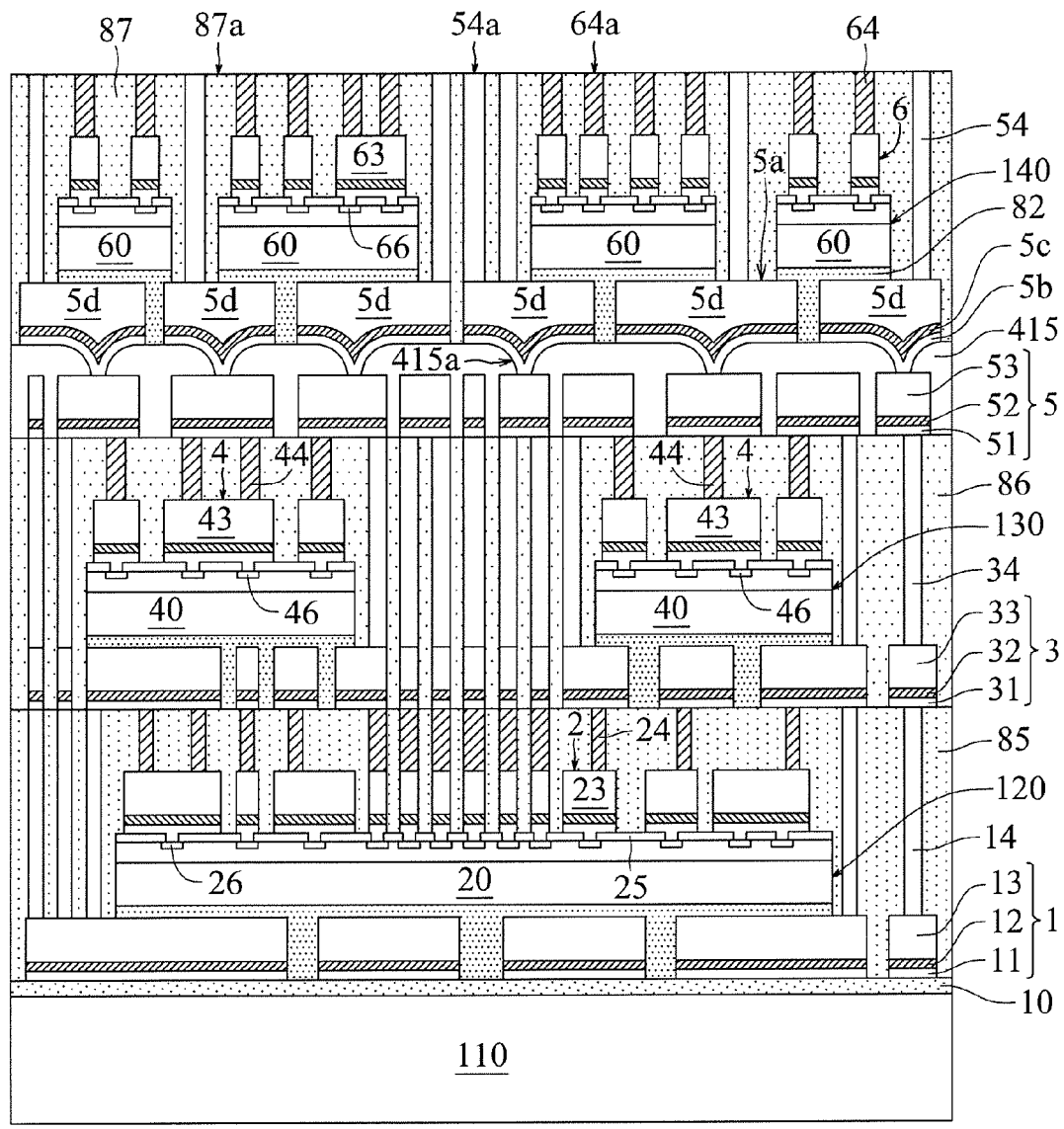

Next, referring to FIG. 63, the chips 140 illustrated in FIGS. 29 and 30 are attached to the metal layer 5d of the patterned metal layer 5a by using the previously described glue material 82, next the previously described filling or encapsulating layer 87 is formed on the polymer layer 415, on the metal layer 5d of the patterned metal layer 5a, on the chips 140, on the metal layer 63 of the patterned metal layer 6 and on tops of the metal pillars or bumps 54 and 64 by using a molding process, a spin coating process, a lamination process or a printing process, and then the filling or encapsulating layer 87 is ground or polished by a grinding or polishing process, such as mechanical grinding process, mechanical polishing process or chemical mechanical polishing (CMP) process.

Alternatively, after the step illustrated in FIG. 62, a polymer layer, such as polyimide layer with a thickness, e.g., between 2 and 30 micrometers, may be formed on the metal layer 5d of the patterned metal layer 5a and on the polymer layer 415, next the chips 140 can be attached to the polymer layer by using the glue material 82, next the filling or encapsulating layer 87 can be formed on the polymer layer, on the chips 140, on the metal layer 63 of the patterned metal layer 6 and on tops of the metal pillars or bumps 54 and 64, and then the filling or encapsulating layer 87 is ground or polished by the grinding or polishing process. In this case, the glue material 82 is on the polymer layer, and the chips 140 are on the glue material 82.

After the grinding or polishing process, top surfaces 54a of the metal pillars or bumps 54 and top surfaces 64a of the metal pillars or bumps 64 are exposed and are not covered by the filling or encapsulating layer 87, and the top surfaces 64a of the metal pillars or bumps 64 are substantially coplanar with the top surfaces 54a of the metal pillars or bumps 54 and with a top surface 87a of the filling or encapsulating layer 87, After the grinding or polishing process, each of the metal pillars or bumps 64 has a thickness, e.g., or height greater than 5 micrometers, such as between 5 and 50 micrometers, and preferably between 10 and 20 micrometers, and each of the metal pillars or bumps 54 has a thickness, e.g., or height greater than 15 micrometers, such as between 15 and 520 micrometers, and preferably between 20 and 110 micrometers, and greater than that of each of the metal pillars or bumps 64. The specification of the metal pillars or bumps 54, after the grinding or polishing process, shown in FIG. 63 can be referred to as the specification of the metal pillars or bumps 54, after the grinding or polishing process, as illustrated in FIG. 32. The specification of the metal pillars or bumps 64, after the grinding or polishing process, shown in FIG. 63 can be referred to as the specification of the metal pillars or bumps 64, after the grinding or polishing process, as illustrated in FIG. 32.

Figure 64:
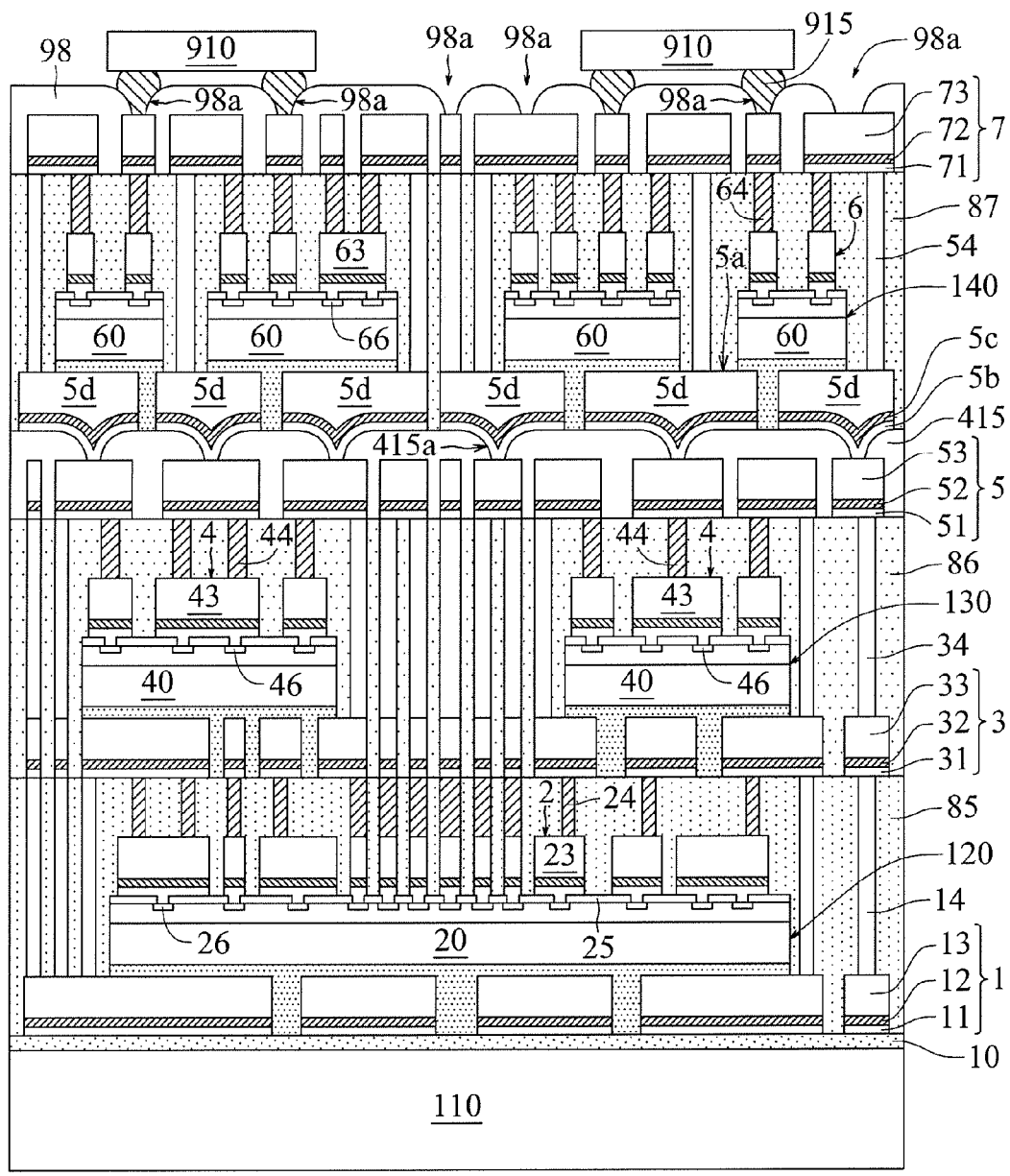

Referring to FIG. 64, after the grinding or polishing process illustrated in FIG. 63, the steps illustrated in FIGS. 33-36 can be performed to provide the previously described patterned metal layer 7 which is formed on the top surface 87a of the filling or encapsulating layer 87, on the top surfaces 54a of the metal pillars or bumps 54 and on the top surfaces 64a of the metal pillars or bumps 64. Next, a polymer layer 98 is formed on the metal layer 73 of the patterned metal layer 7 and on the top surface 87a of the filling or encapsulating layer 87, and multiple openings 98a in the polymer layer 98 are over multiple contact points of the metal layer 73 and expose them. Next, multiple discrete (preformed) passive components 910, such as capacitors, inductors or resistors, are mounted onto some of the contact points, exposed by some of the openings 98a, of the metal layer 73 through multiple solder joints 915 including bismuth, indium, tin-lead alloy, tin-silver alloy, tin-silver-copper alloy or tin-gold.

Each of the discrete passive components 910, for example, may have a first terminal connected to one of the metal traces or pads 66 in one of the chips 140 through, in sequence, one of the solder joints 915, a first signal interconnect or trace provided by the patterned metal layer 7, one of the metal pillars or bumps 64 and the patterned metal layer 6, and a second terminal connected to another one of the metal traces or pads 66 in another one of the chips 140 through, in sequence, another one of the solder joints 915, a second signal interconnect or trace provided by the patterned metal layer 7, another one of the metal pillars or bumps 64 and the patterned metal layer 6.

Alternatively, each of the discrete passive components 910 may have a first terminal connected to one of the metal traces or pads 66 in one of the chips 140 through, in sequence, one of the solder joints 915, a signal interconnect or trace provided by the patterned metal layer 7, one of the metal pillars or bumps 64 and the patterned metal layer 6, and a second terminal connected to another one of the metal traces or pads 66 in another one of the chips 140 through, in sequence, another one of the solder joints 915, a ground interconnect or trace provided by the patterned metal layer 7, another one of the metal pillars or bumps 64 and the patterned metal layer 6.

Alternatively, each of the discrete passive components 910 may have a first terminal connected to one of the metal traces or pads 66 in one of the chips 140 through, in sequence, one of the solder joints 915, a power interconnect or trace provided by the patterned metal layer 7, one of the metal pillars or bumps 64 and the patterned metal layer 6, and a second terminal connected to another one of the metal traces or pads 66 in another one of the chips 140 through, in sequence, another one of the solder joints 915, a ground interconnect or trace provided by the patterned metal layer 7, another one of the metal pillars or bumps 64 and the patterned metal layer 6.

Figure 65:
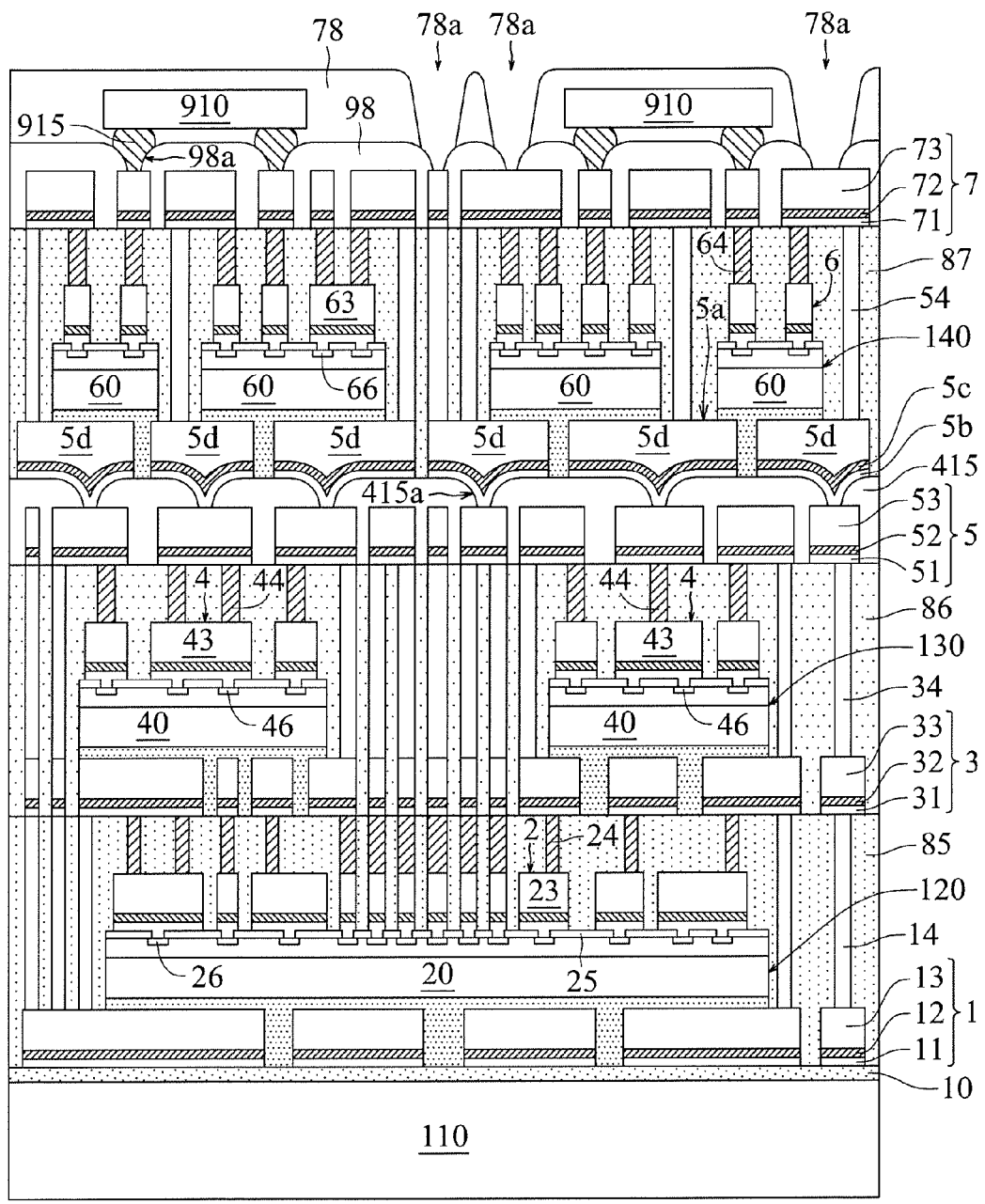

Referring to FIG. 65, after the step illustrated in FIG. 64, a polymer layer 78 having a thickness, e.g., between 5 and 50 micrometers, and preferably between 5 and 15 micrometers or between 5 and 10 micrometers, can be formed on the polymer layer 78 and on the discrete passive components 910, and multiple openings 78a in the polymer layer 78 are over the other of the contact points, exposed by the other of the openings 98a and not bonded with any passive component by solder joints, of the metal layer 73 and expose them. The polymer layer 78 may include benzocyclobutane (BCB), epoxy, polyimide, polybenzoxazole (PBO), poly-phenylene oxide (PPO), silosane or SU-8.

Figure 66:
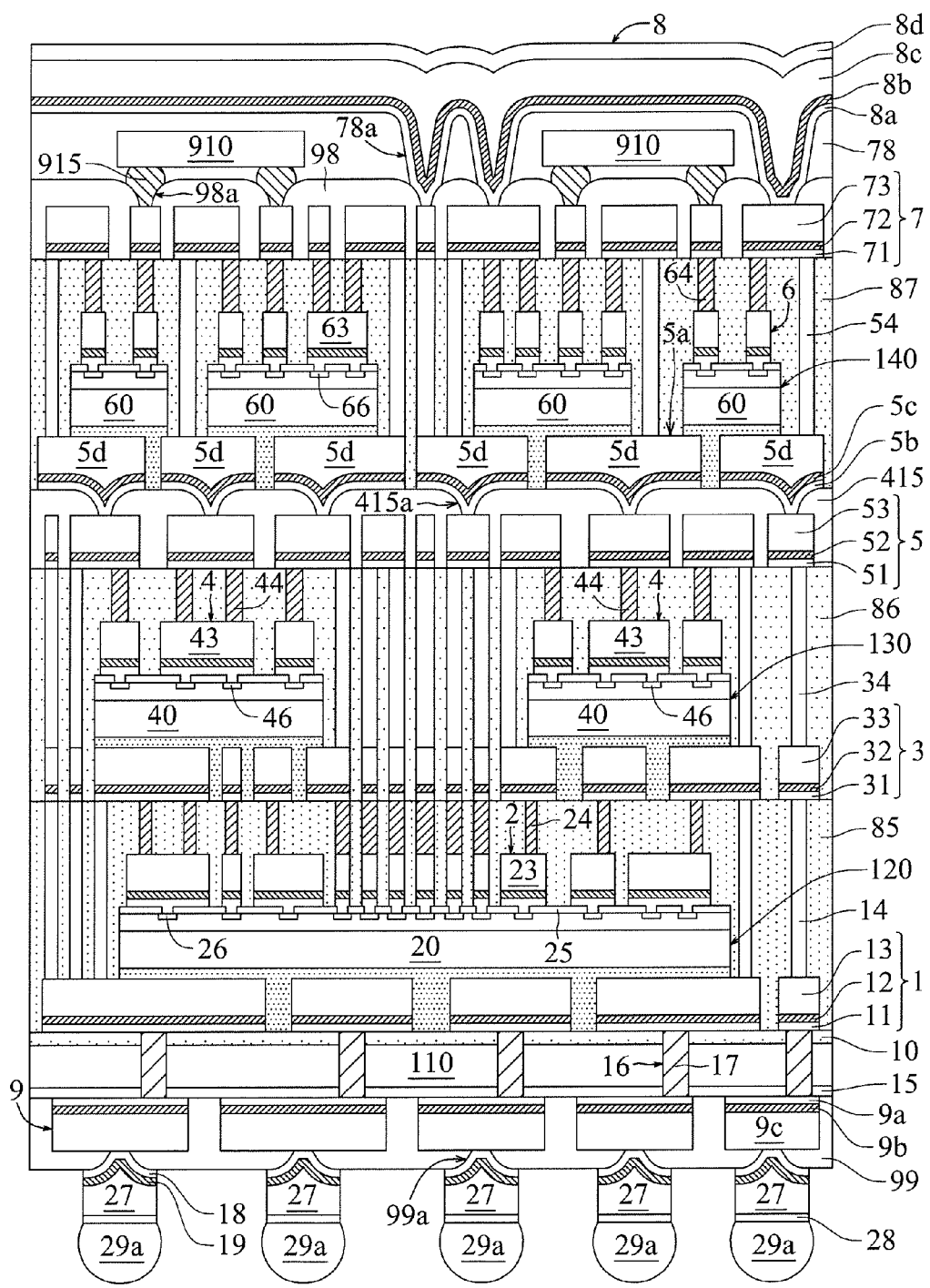

Next, referring to FIG. 66, the steps illustrated in FIG. 39 can be performed to provide the previously described metal layer 8 which is formed on the polymer layer 78 and on the contact points, exposed by the openings 78a, of the metal layer 73. The metal layer 8 illustrated in FIG. 66 is composed of the previously described adhesion layer 8a on the polymer layer 78 and on the contact points, exposed by the openings 78a, of the metal layer 73, the previously described seed layer 8b on the adhesion layer 8a, the previously described metal layer 8c on the seed layer 8b, and the previously described metal layer 8d on the metal layer 8c. After forming the metal layer 8, the steps illustrated in FIGS. 40-52 can be performed to provide a system-in package or multichip module, and the system-in package or multichip module can be connected to a mother board, a printed circuit board, a metal substrate, a glass substrate or a ceramic substrate using the solder bumps or balls 29a.

Figure 67:
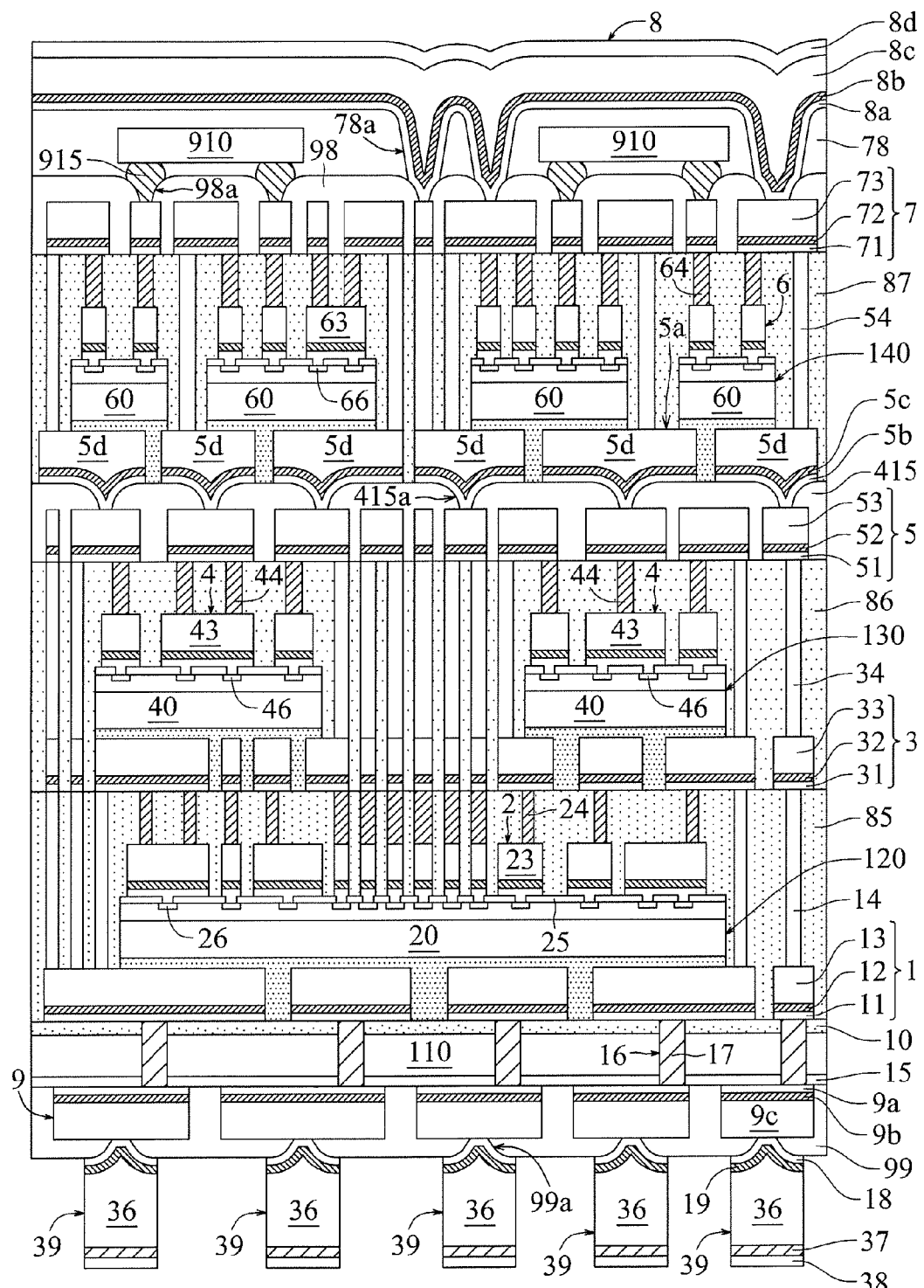

Alternatively, referring to FIG. 67, after forming the metal layer 8, the steps illustrated in FIGS. 40-49, 53 and 54 can be performed to provide a system-in package or multichip module, and the system-in package or multichip module can be connected to a mother board, a printed circuit board, a metal substrate, a glass substrate or a ceramic substrate using the metal pillars or bumps 39.

Regarding the system-in package or multichip module illustrated in FIG. 66 or 67, a top perspective view of the patterned metal layer 7 can be referred to FIG. 37, and the patterned metal layer 7 may include the clock interconnect, bus or trace 7c, the ground plane, bus or trace 7g, the power planes, buses or traces 7p and the signal interconnects, traces or lines 7s, as shown in FIG. 37.

The metal layer 8 of the system-in package or multichip module shown in FIG. 66 or 67 can be connected to one or more of the power planes, buses or traces 7p, shown in FIG. 37, through one or more of the openings 78 in the polymer layer 78, or to the ground plane, bus or trace 7g, shown in FIG. 37, through one or more of the openings 78 in the polymer layer 78. Each of the chips 140 of the system-in package or multichip module shown in FIG. 66 or 67 may have one of the metal traces or pads 66 connected to the metal layer 8 through, in sequence, the patterned metal layer 6, one of the metal pillars or bumps 64, and the patterned metal layer 7 such as the power plane, bus or trace 7p or the ground plane, bus or trace 7g.

Regarding the system-in package or multichip module shown in FIG. 66 or 67, all of the passive components 910 and all of the chips 120, 130 and 140 are surrounded by a power system for providing a power voltage and a ground system for providing a ground voltage. The power system can be provided by the patterned metal layer 1 under the chips 120 and the leftmost metal pillars or bumps 14, 34 and 54, and the ground system can be provided by the rightmost metal pillars or bumps 14, 34 and 54 and the metal layer 8 serving as thermal spreading plane. Alternatively, the ground system can be provided by the patterned metal layer 1 under the chips 120 and the leftmost metal pillars or bumps 14, 34 and 54, and the power system can be provided by the rightmost metal pillars or bumps 14, 34 and 54 and the metal layer 8 serving as thermal spreading plane.

A coverage ratio of the entire area of the patterned metal layer 7 covering a ground or polished surface including the top surfaces 54a, 64a and 87a of the system-in package or multichip module illustrated in FIG. 66 or 67 to the entire area of the ground or polished surface ranges from 50% to 95%, and preferably ranges from 60% to 90%.

Figure 68:
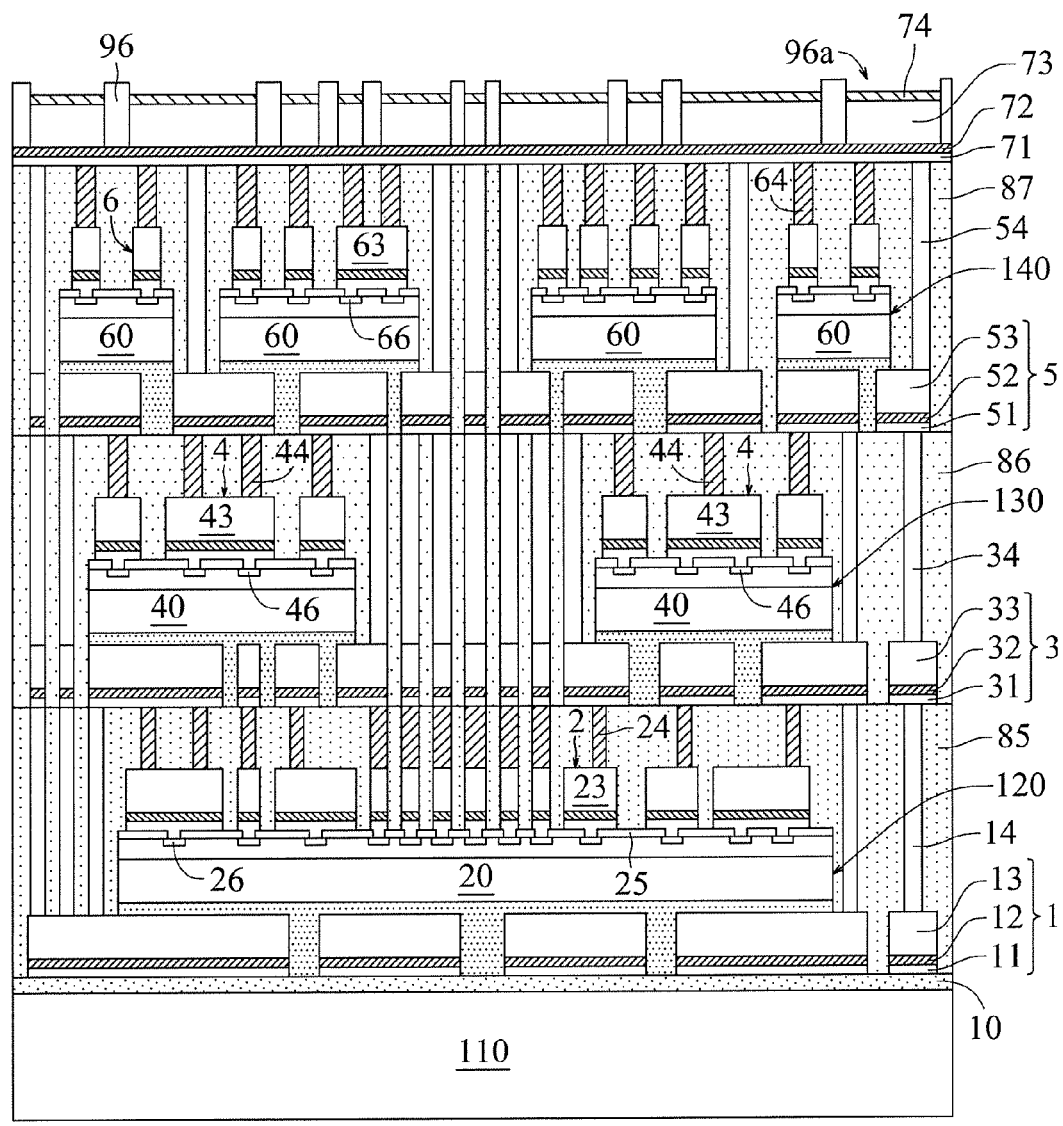
FIGS. 68-73 are cross-sectional views showing a process for forming a system-in package or multichip module, according to an embodiment of the present disclosure.

FIGS. 68-73 show a process for forming another system-in package or multichip module according to another embodiment of the present disclosure. Referring to FIG. 68, after the steps illustrated in FIGS. 1-34 are performed, a barrier/wetting layer 74 having a thickness, e.g., between 0.2 and 10 micrometers, and preferably between 1 and 5 micrometers, can be formed in the openings 96a and on the metal layer 73 in the openings 96a by using an electroplating or electroless plating process. The barrier/wetting layer 74 can be a single layer of nickel, gold, silver, tin, palladium, platinum, rhodium, ruthenium or rhenium, or a composite layer made of the previously described metals.

For example, the barrier/wetting layer 74 can be a single metal layer formed by electroplating or electroless plating a nickel layer, to a thickness, e.g., between 0.2 and 10 micrometers, and preferably between 1 and 5 micrometers, in the openings 96a and on the metal layer 73, preferably the previously described copper layer 73, in the openings 96a.

Alternatively, the barrier/wetting layer 74 can be composed of double metal layers formed by electroplating or electroless plating a nickel layer in the openings 96a and on the metal layer 73, preferably the previously described copper layer 73, in the openings 96a, and then electroplating or electroless plating a gold layer, a palladium layer, a tin layer or a silver layer in the openings 96a and on the electroplated or electroless plated nickel layer in the openings 96a.

Figure 69:
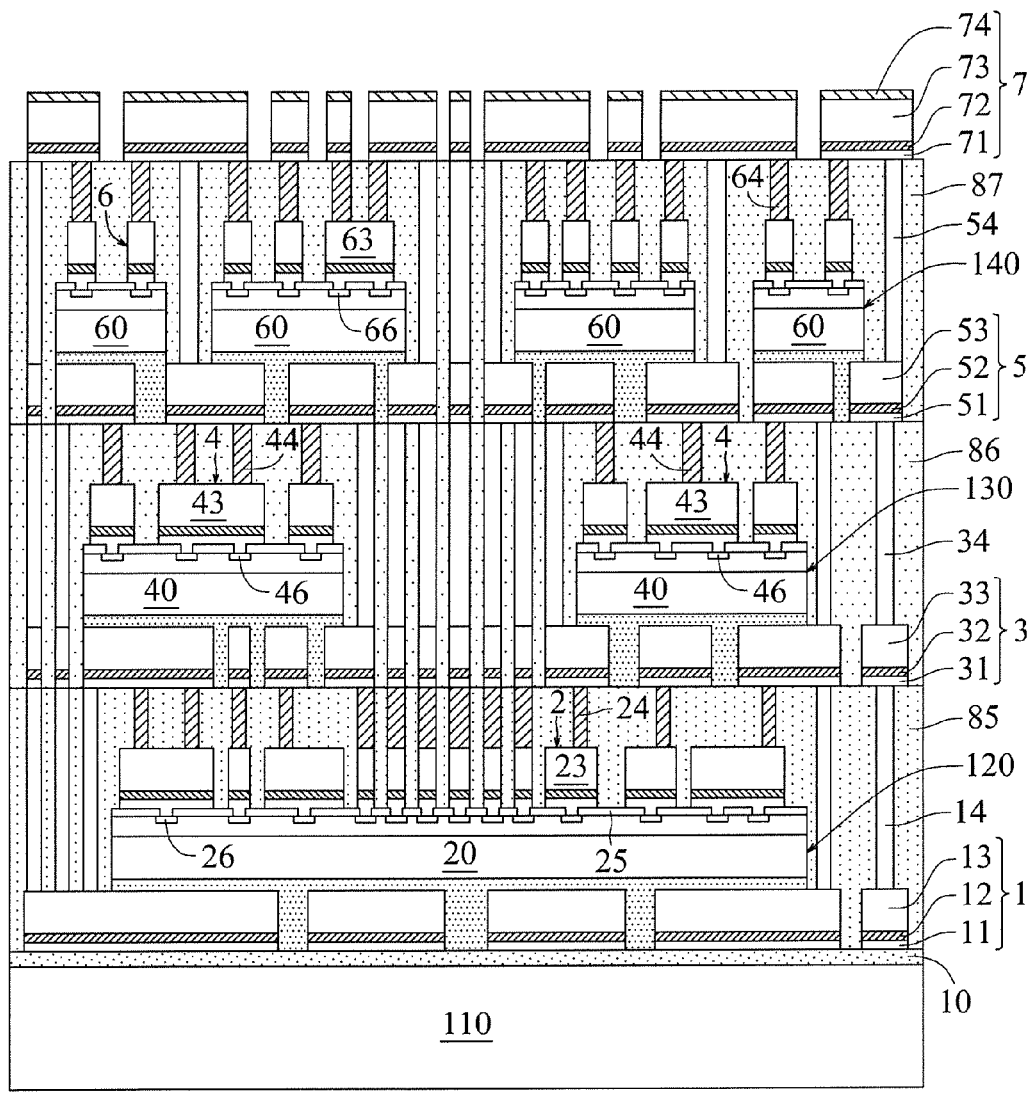

Referring to FIG. 69, after forming the barrier/wetting layer 74, the photoresist layer 96 is removed using a chemical solution containing amine or NaCO₃. Next, the seed layer 72 not under the metal layer 73 is removed by using a wet chemical etching process or a reactive ion etching (RIE) process. Next, the adhesion layer 71 not under the metal layer 73 is removed by using a wet chemical etching process or a reactive ion etching (RIE) process.

Accordingly, the adhesion layer 71, the seed layer 72, the metal layer 73 and the barrier/wetting layer 74 compose a patterned metal layer 7 formed on the top surface 87a of the filling or encapsulating layer 87, on the top surfaces 54a of the metal pillars or bumps 54 and on the top surfaces 64a of the metal pillars or bumps 64. The patterned metal layer 7 illustrated in FIG. 69 may include a metal plane, bus or trace, such as signal trace, clock bus, clock trace, power plane, power bus, power trace, ground plane, ground bus or ground trace, connecting one or more metal pillars or bumps 54, connecting one or more metal pillars or bumps 64 or connecting one or more metal pillars or bumps 54 to one or more metal pillars or bumps 64.

Figure 70:
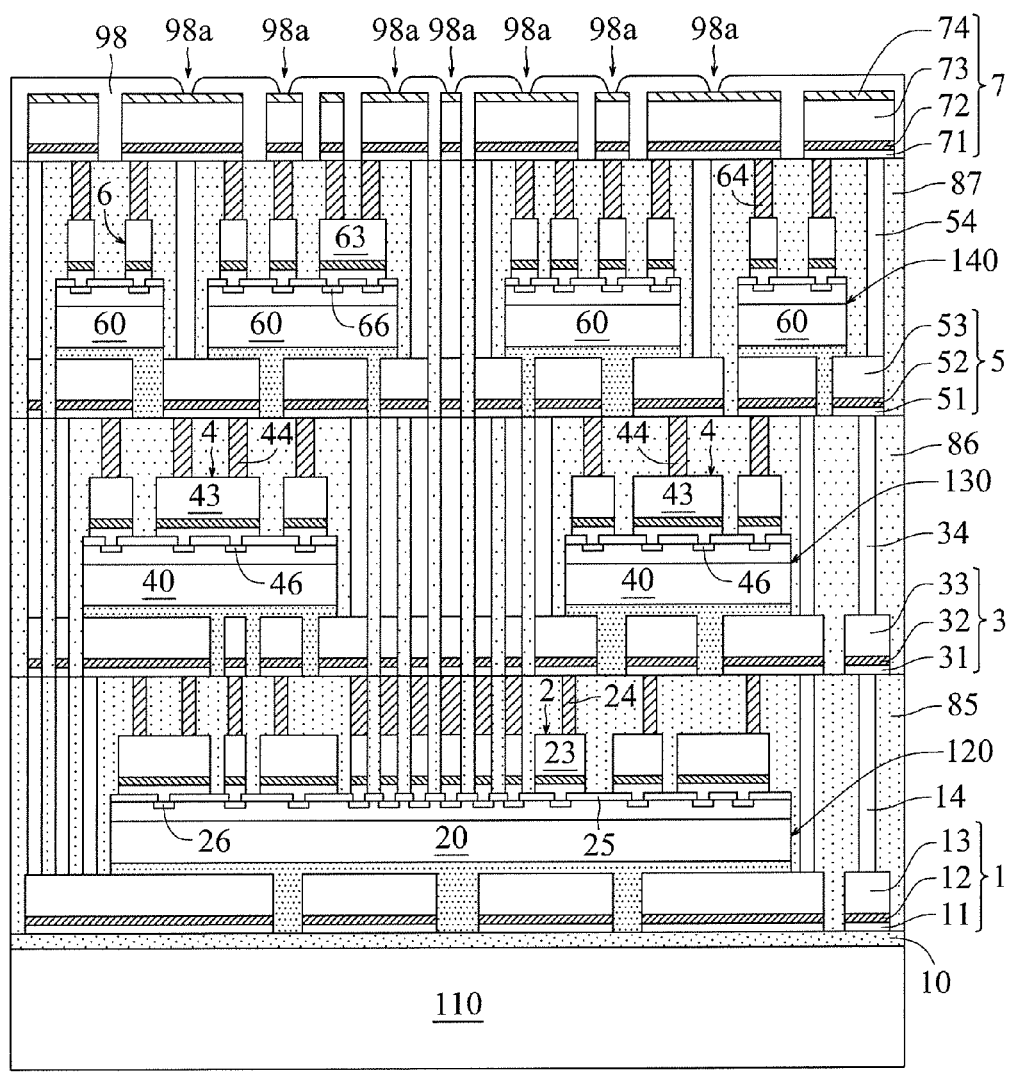

Referring to FIG. 70, after the step illustrated in FIG. 69, a polymer layer 98 having a thickness, e.g., between 1 and 20 micrometers, and preferably between 2 and 15 micrometers or between 5 and 10 micrometers, can be formed on the barrier/wetting layer 74 of the patterned metal layer 7 and on the top surface 87a of the filling or encapsulating layer 87, and multiple openings 98a in the polymer layer 98 are over multiple contact points of the barrier/wetting layer 74 and expose them. The polymer layer 98 can be a polyimide layer, a polybenzoxazole (PBO) layer, a benzocyclobutane (BCB) layer, an epoxy layer, a poly-phenylene oxide (PPO) layer, a silosane layer or a SU-8 layer.

Figure 71:
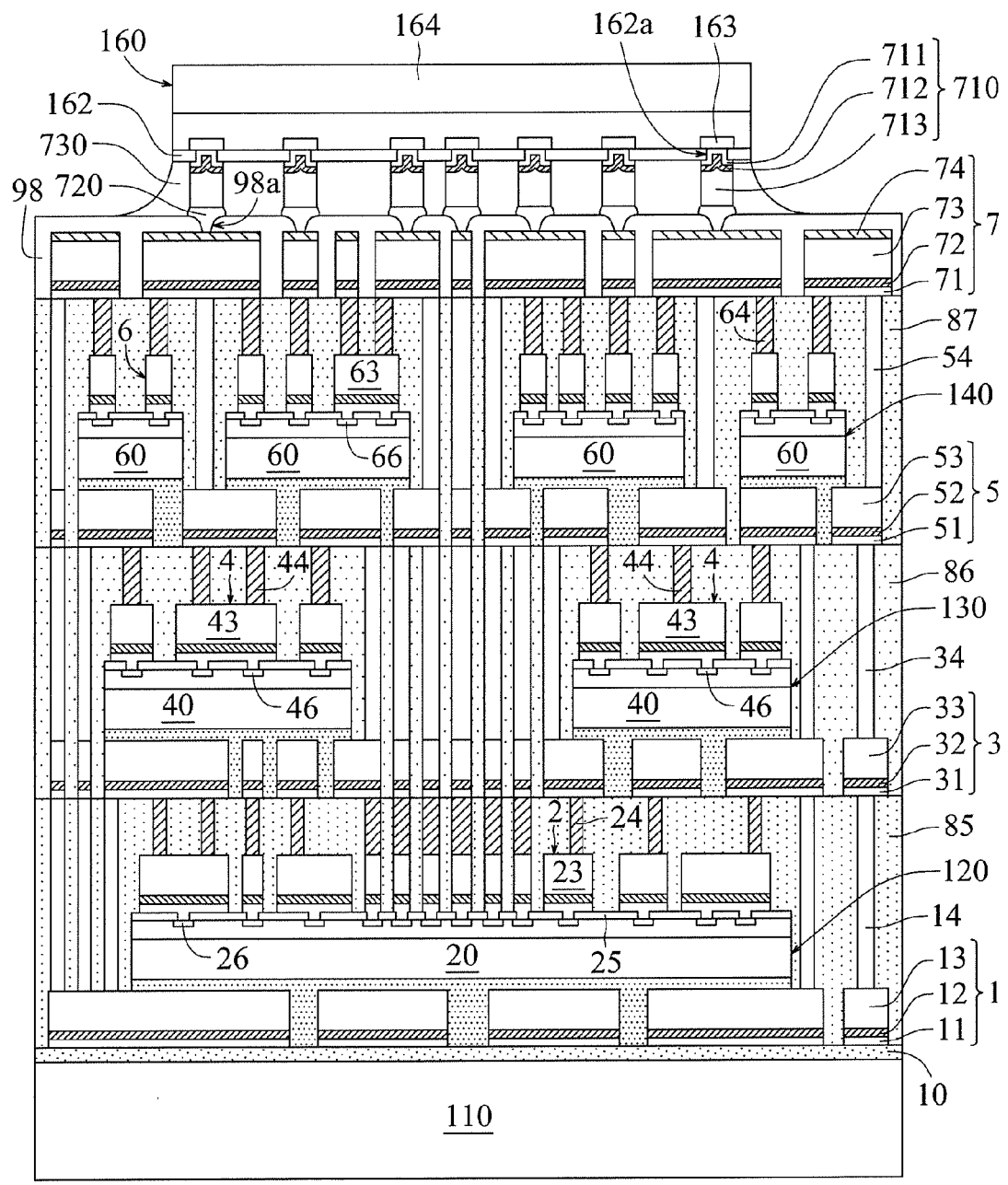

Next, referring to FIG. 71, a chip 160 can be mounted onto the contact points, exposed by the openings 98a, of the barrier/wetting layer 74 by bonding multiple metal pillars or bumps 710 of the chip 160 with multiple solder joints 720 which are formed on the contact points, exposed by the openings 98a, of the barrier/wetting layer 74. Next, an underfill 730, such as epoxy, polyimide, benzocyclobutane (BCB), polybenzoxazole (PBO), poly-phenylene oxide (PPO), silosane or SU-8, can be filled into a gap between the chip 160 and the polymer layer 98, enclosing the metal pillars or bumps 710.

The chip 160 can be a central-processing-unit (CPU) chip designed by x86 architecture, a central-processing-unit (CPU) chip designed by non x86 architectures, such as ARM, Strong ARM or MIPs, a baseband chip, a graphics-processing-unit (GPU) chip, a digital-signal-processing (DSP) chip, a wireless local area network (WLAN) chip, a memory chip, such as flash memory chip, dynamic-random-access-memory (DRAM) chip or statistic-random-access-memory (SRAM) chip, a logic chip, an analog chip, a power device, a regulator, a power management device, a global-positioning-system (GPS) chip, a Bluetooth chip, a system-on chip (SOC) including a graphics-processing-unit (GPU) circuit block, a wireless local area network (WLAN) circuit block and a central-processing-unit (CPU) circuit block designed by x86 architecture or by non x86 architectures, but not including any baseband circuit block, a system-on chip (SOC) including a baseband circuit block, a wireless local area network (WLAN) circuit block and a central-processing-unit (CPU) circuit block designed by x86 architecture or by non x86 architectures, but not including any graphics-processing-unit (GPU) circuit block, a system-on chip (SOC) including a baseband circuit block, a graphics-processing-unit (GPU) circuit block and a central-processing-unit (CPU) circuit block designed by x86 architecture or by non x86 architectures, but not including any wireless local area network (WLAN) circuit block, a system-on chip (SOC) including a baseband circuit block and a wireless local area network (WLAN) circuit block, but not including any graphics-processing-unit (GPU) circuit block and any central-processing-unit (CPU) circuit block, or a system-on chip (SOC) including a graphics-processing-unit (GPU) circuit block and a wireless local area network (WLAN) circuit block, but not including any baseband circuit block and any central-processing-unit (CPU) circuit block. Alternatively, the chip 160 can be a chip including a central-processing-unit (CPU) circuit block designed by x86 architecture or by non x86 architecture, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block, and/or a modem circuit block.

As shown in FIG. 71, the chip 160 includes a semiconductor substrate 164 containing transistors, a passivation layer 162 under the semiconductor substrate 164, multiple metal interconnections between the semiconductor substrate 164 and the passivation layer 162, multiple dielectric layers between the semiconductor substrate 164 and the passivation layer 162, multiple metal traces or pads 163 between the semiconductor substrate 164 and the passivation layer 162, and the metal pillars or bumps 710 under multiple contact points, exposed by multiple openings 162a in the passivation layer 162, of the metal traces or pads 163. The transistors may be NMOS transistors, PMOS transistors or bipolar transistors. The dielectric layers can be composed of a single layer of silicon oxide, silicon nitride, silicon oxynitride, silicon carbon nitride or silicon oxycarbide, or a composite layer made of the previously described materials. The metal interconnections may have a thickness, e.g., between 10 nanometers and 2 micrometers, and include electroplated copper, aluminum, aluminum-copper-alloy or tungsten.

The contact points, exposed by the openings 162a in the passivation layer 162, of the metal traces or pads 163 are at tops of the openings 162a, and the openings 162a in the passivation layer 162 are under the contact points of the metal traces or pads 163. Each of the openings 162a may have a suitable width or diameter, e.g., between 0.5 and 100 micrometers, and preferably between 1 and 20 micrometers. The metal pillars or bumps 710 can be connected to the contact points, exposed by the openings 162a, of the metal traces or pads 163 through the openings 162a. The metal traces or pads 163 may include aluminum, aluminum-copper-alloy or electroplated copper.

Alternatively, the chip 160 as shown in FIG. 71 may further include multiple carbon nanotube interconnects between the semiconductor substrate 164 and the passivation layer 162, and an organic polymer layer with a thickness, e.g., greater than 3 micrometers, such as between 3 and 20 micrometers, and preferably between 5 and 12 micrometers, under the passivation layer 162. Multiple openings in the organic polymer layer are under the contact points, exposed by the openings 162a in the passivation layer 162, of the metal traces or pads 163 and expose them. The organic polymer layer can be polyimide, benzocyclobutane (BCB), polybenzoxazole (PBO), poly-phenylene oxide (PPO), silosane, SU-8 or epoxy. In this case, the metal pillars or bumps 710 can be connected to the contact points, exposed by the openings 162a, of the metal traces or pads 163 through the openings in the organic polymer layer. The chip 160 may have the metal interconnections connected to the transistors through the carbon nanotube interconnects.

The semiconductor substrate 164 may have a thickness, e.g., greater than 5 micrometer, such as between 5 and 50 micrometers, between 10 and 100 micrometers or between 10 and 500 micrometers. The semiconductor substrate 164 can be a silicon substrate or a gallium arsenide (GaAs) substrate.

The passivation layer 162 can be formed by a suitable process or processes, e.g., a chemical vapor deposition (CVD) method. The passivation layer 162 can have a thickness, e.g., greater than 0.2 micrometers, such as between 0.3 and 1.5 micrometers. The passivation layer 162 can be made of silicon oxide (such as $SiO_2$), silicon nitride (such as $Si_3N_4$), silicon oxynitride, silicon oxycarbide, phosphosilicate glass (PSG), silicon carbon nitride or a composite of the previously described materials. For example, the passivation layer 162 may include two inorganic layers, and the two inorganic layers can be an oxide layer, such as silicon oxide or silicon oxycarbide, having a suitable thickness, e.g., between 0.3 and 1.5 micrometer and a nitride layer, such as silicon nitride, silicon oxynitride or silicon carbon nitride, having a suitable thickness, e.g., between 0.3 and 1.5 micrometers.

The metal pillars or bumps 710 after being bonded with the solder joints 720 may have a thickness, e.g., or height greater than 10 micrometers, such as between 10 and 100 micrometers, and preferably between 10 and 30 micrometers, and a suitable width or diameter, e.g., greater than 5 micrometers, such as between 10 and 100 micrometers, and preferably between 10 and 30 micrometers. The pitch between neighboring or adjacent pairs of metal pillars or bumps 710 can be selected as desired, e.g., greater than 80 micrometers, such as between 80 and 150 micrometers or between 150 and 300 micrometers, or less than 80 micrometers, such as between 5 and 50 micrometers or between 50 and 80 micrometers.

The metal pillars or bumps 710 between the solder joints 720 and the contact points, exposed by the openings 162*a*, of the metal traces or pads 163 are composed of an adhesion layer 711 under the contact points, exposed by the openings 162*a*, of the metal traces or pads 163 and under the passivation layer 162, a seed layer 712 under the adhesion layer 711, and a metal layer 713 under the seed layer 712 and over the solder joints 720. The metal layer 713 can be connected to the contact points, exposed by the openings 162*a* in the passivation layer 162, of the metal traces or pads 163 through the seed layer 712 and the adhesion layer 711, and to the contact points, exposed by the openings 98*a* in the polymer layer 98, of the barrier/wetting layer 74 through the solder joints 720.

The adhesion layer 711 may have a thickness, e.g., less than 1 micrometer, such as between 1 nanometer and 0.5 micrometers. The seed layer 712 may have a thickness, e.g., less than 1 micrometer, such as between 10 nanometers and 0.8 micrometers. The material of the adhesion layer 711 may include titanium, a titanium-tungsten alloy, titanium nitride, chromium, tantalum, tantalum nitride, nickel or nickel vanadium. The material of the seed layer 712 may include copper, silver, gold, nickel or titanium-copper alloy.

For example, when the adhesion layer 711 is a titanium-containing layer, such as a single layer of titanium-tungsten alloy, titanium or titanium nitride, having a thickness, e.g., less than 1 micrometer, such as between 1 nanometer and 0.5 micrometers, under the contact points, exposed by the openings 162*a*, of the metal traces or pads 163 and under the passivation layer 162, the seed layer 712 can be a copper layer, a silver layer, a titanium-copper-alloy layer, a gold layer or a nickel layer with a thickness, e.g., less than 1 micrometer, such as between 10 nanometers and 0.8 micrometers, under the titanium-containing layer.

Alternatively, when the adhesion layer 711 is a tantalum-containing layer, such as a single layer of tantalum or tantalum nitride, having a thickness, e.g., less than 1 micrometer, such as between 1 nanometer and 0.5 micrometers, under the contact points, exposed by the openings 162*a*, of the metal traces or pads 163 and under the passivation layer 162, the seed layer 712 can be a copper layer, a silver layer, a titanium-copper-alloy layer, a gold layer or a nickel layer with a thickness, e.g., less than 1 micrometer, such as between 10 nanometers and 0.8 micrometers, under the tantalum-containing layer.

Alternatively, when the adhesion layer 711 is a chromium-containing layer, such as a single layer of chromium, having a thickness, e.g., less than 1 micrometer, such as between 1 nanometer and 0.5 micrometers, under the contact points, exposed by the openings 162*a*, of the metal traces or pads 163 and under the passivation layer 162, the seed layer 712 can be a copper layer, a silver layer, a titanium-copper-alloy layer, a gold layer or a nickel layer with a thickness, e.g., less than 1 micrometer, such as between 10 nanometers and 0.8 micrometers, under the chromium-containing layer.

Alternatively, when the adhesion layer 711 is a nickel-containing layer, such as a single layer of nickel or nickel vanadium, having a thickness, e.g., less than 1 micrometer, such as between 1 nanometer and 0.5 micrometers, under the contact points, exposed by the openings 162*a*, of the metal traces or pads 163 and under the passivation layer 162, the seed layer 712 can be a copper layer, a silver layer, a titanium-copper-alloy layer, a gold layer or a nickel layer with a thickness, e.g., less than 1 micrometer, such as between 10 nanometers and 0.8 micrometers, under the nickel-containing layer.

The metal layer 713 may have a thickness, e.g., greater than 1 micrometer, such as between 2 and 30 micrometers, and preferably between 3 and 10 micrometers. Sidewalls of the metal layer 713 are not covered by the adhesion layer 711 and the seed layer 712. The metal layer 713 can be a single layer of copper, silver, gold, palladium or nickel, or a composite layer made of the previously described metals.

For example, the metal layer 713 can be a single copper layer having a thickness, e.g., greater than 1 micrometer, such as between 2 and 30 micrometers, and preferably between 3 and 10 micrometers, under the seed layer 712, preferably the previously described copper or titanium-copper-alloy seed layer 712, and over the solder joints 720.

Alternatively, the metal layer 713 can be a single silver layer having a thickness, e.g., greater than 1 micrometer, such as between 2 and 30 micrometers, and preferably between 3 and 10 micrometers, under the seed layer 712, preferably the previously described silver seed layer 712, and over the solder joints 720.

Alternatively, the metal layer 713 can be a single gold layer having a thickness, e.g., greater than 1 micrometer, such as between 2 and 30 micrometers, and preferably between 3 and 10 micrometers, under the seed layer 712, preferably the previously described gold seed layer 712, and over the solder joints 720.

Alternatively, the metal layer 713 can be a single nickel layer having a thickness, e.g., greater than 1 micrometer, such as between 2 and 30 micrometers, and preferably between 3 and 10 micrometers, under the seed layer 712, preferably the previously described copper, nickel or titanium-copper-alloy seed layer 712, and over the solder joints 720.

Alternatively, the metal layer 713 can be composed of an electroplated copper layer having a thickness, e.g., greater than 5 micrometer, such as between 5 and 50 micrometers, and preferably between 10 and 35 micrometers, under the seed layer 712, preferably the previously described copper or titanium-copper-alloy seed layer 712, a nickel-containing layer having a thickness, e.g., between 0.5 and 10 micrometers, and preferably between 1 and 5 micrometers, under the electroplated copper layer, and a gold-containing layer having a thickness, e.g., between 0.05 and 2 micrometers, and preferably between 0.5 and 1 micrometers, under the nickel-containing layer and over the solder joints 720.

The chip 160 may include input/output (I/O) circuits serving for chip probing testing (CP testing), for build-in-self testing or for external signal connection. Each of the input/output (I/O) circuits may include a driver, a receiver and/or an electro static discharge (ESD) circuit. One of the input/output (I/O) circuits has a total loading (total capacitance) between 15 pF (pico farad) and 50 pF. The chip 160 may have built-in self test (BIST) circuits for reducing the testing time for the system-in package or multichip module.

The solder joints 720 after being bonded with the metal pillars or bumps 710 may have a thickness, e.g., greater than 5 micrometers, such as between 5 and 50 micrometers, and preferably between 10 and 30 micrometers, and may include bismuth, indium, tin-lead alloy, tin-gold, tin-silver alloy or tin-silver-copper alloy.

Figure 72:
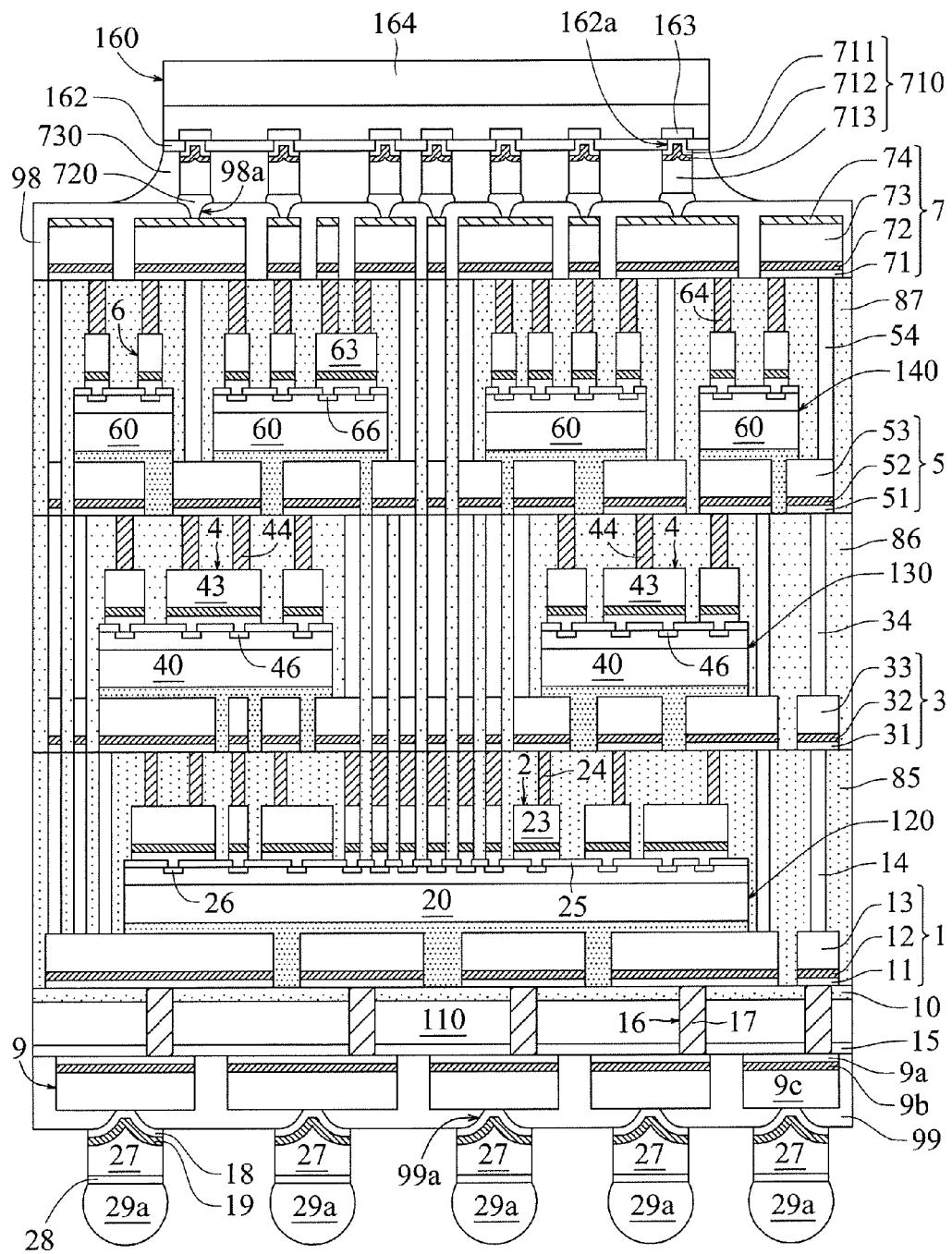

Referring to FIG. 72, after the step illustrated in FIG. 71, the steps illustrated in FIGS. 40-52 can be performed to provide a system-in package or multichip module, and the system-in package or multichip module can be connected to a mother board, a printed circuit board, a metal substrate, a glass substrate or a ceramic substrate using the solder bumps or balls 29a.

Figure 73:
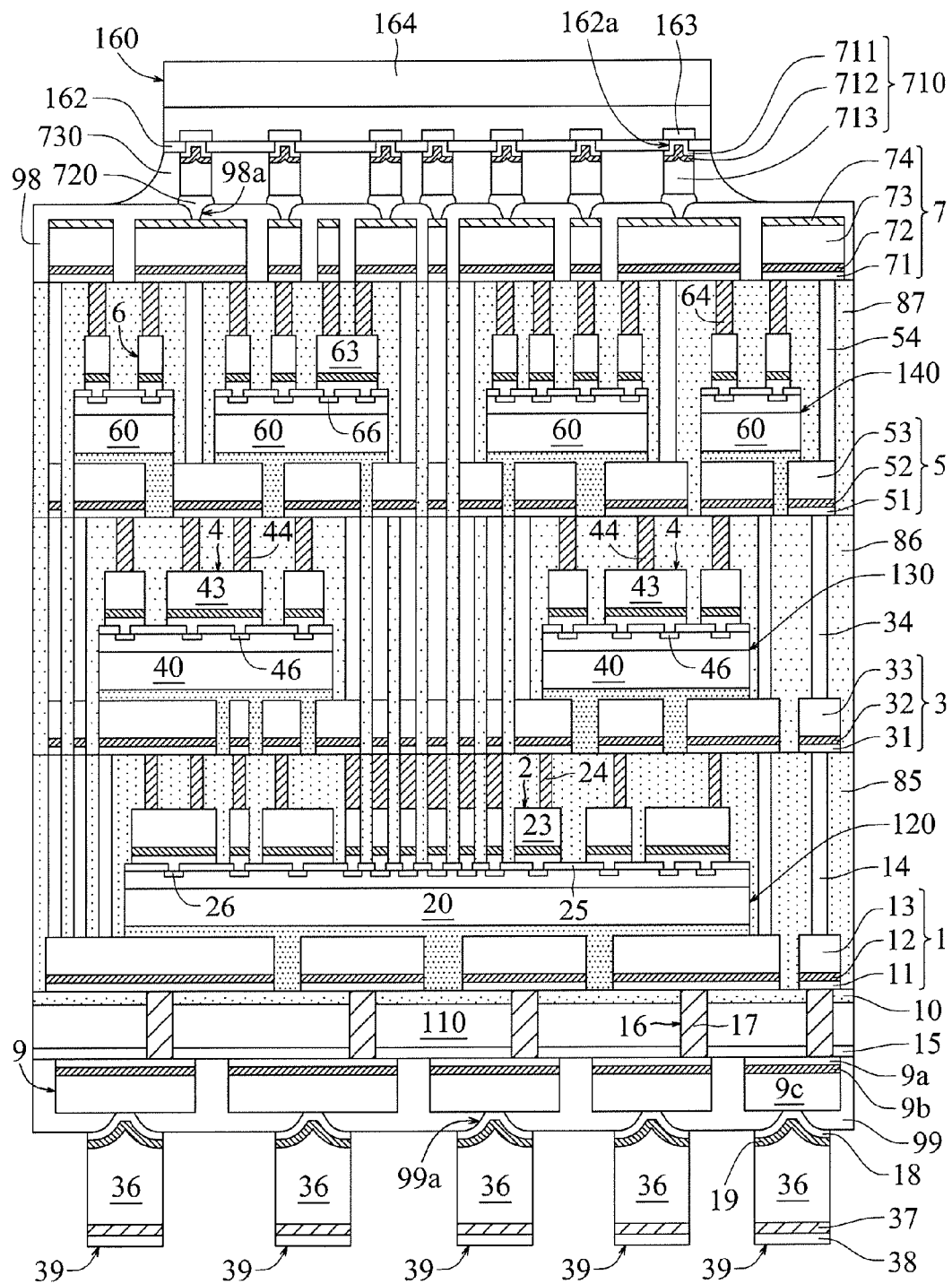

Alternatively, referring to FIG. 73, after the step illustrated in FIG. 71, the steps illustrated in FIGS. 40-49, 53 and 54 can be performed to provide a system-in package or multichip module, and the system-in package or multichip module can be connected to a mother board, a printed circuit board, a metal substrate, a glass substrate or a ceramic substrate using the metal pillars or bumps 39.

Regarding the system-in package or multichip module illustrated in FIG. 72 or 73, a top perspective view of the patterned metal layer 7 can be referred to FIG. 37, and the patterned metal layer 7 may include the clock interconnect, bus or trace 7c, the ground plane, bus or trace 7g, the power planes, buses or traces 7p and the signal interconnects, traces or lines 7s, as shown in FIG. 37. A coverage ratio of the entire area of the patterned metal layer 7 covering a ground or polished surface including the top surfaces 54a, 64a and 87a of the system-in package or multichip module illustrated in FIG. 72 or 73 to the entire area of the ground or polished surface ranges from 50% to 95%, and preferably ranges from 60% to 90%.

The chip 160 of the system-in package or multichip module illustrated in FIG. 72 or 73 may have one of the metal traces or pads 163 connected to one or more of the metal traces or pads 66 in one or more of the chips 140 through, in sequence, one of the metal pillars or bumps 710, one of the solder joints 720, the patterned metal layer 7 such as the clock interconnect, bus or trace 7c, the ground plane, bus or trace 7g, the power plane, bus or trace 7p or the signal interconnect, trace or line 7s, one or more of the metal pillars or bumps 64, and the patterned metal layer 6.

The chip 160 of the system-in package or multichip module illustrated in FIG. 72 or 73 may have another one of the metal traces or pads 163 connected to one or more of the metal traces or pads 46 in one or more of the chips 130 through, in sequence, one of the metal pillars or bumps 710, one of the solder joints 720, the patterned metal layer 7 such as the clock interconnect, bus or trace 7c, the ground plane, bus or trace 7g, the power plane, bus or trace 7p or the signal interconnect, trace or line 7s, one or more of the metal pillars or bumps 54, the patterned metal layer 5, one or more of the metal pillars or bumps 44, and the patterned metal layer 4.

The chip 160 of the system-in package or multichip module illustrated in FIG. 72 or 73 may have another one of the metal traces or pads 163 connected to one or more of the metal traces or pads 26 in one or more of the chips 120 (one of them is shown in FIG. 72 or 73) through, in sequence, one of the metal pillars or bumps 710, one of the solder joints 720, the patterned metal layer 7 such as the clock interconnect, bus or trace 7c, the ground plane, bus or trace 7g, the power plane, bus or trace 7p or the signal interconnect, trace or line 7s, one or more of the metal pillars or bumps 54, the patterned metal layer 5, one or more of the metal pillars or bumps 34, the patterned metal layer 3, one or more of the metal pillars or bumps 24, and the patterned metal layer 2.

One of the chips 120, 130, 140 and 160 shown in FIG. 72 or 73 may include small input/output (I/O) circuits serving for intra-chip signal connection, having a data bit width, e.g., equal to or more than 128, equal to or more than 512, between 32 and 2048, between 128 and 2048, between 256 and 1024, or between 512 and 1024, to the other one of the chips 120, 130, 140 and 160. Each of the small I/O circuits can be composed of a small driver and a small or no ESD (electro static discharge) circuit, or can be composed of a small receiver and a small or no ESD circuit. For exemplary embodiments, one of the small I/O circuits may have a total loading (total capacitance) between 0.1 pF and 10 pF, and preferably between 0.1 pF and 2 pF. For exemplary embodiments, the small driver may have an output capacitance (loading) between 0.01 pF and 10 pF, between 0.1 pF and 10 pF, between 0.1 pF and 5 pF, between 0.1 pF and 2 pF, between 0.1 pF and 1 pF, or between 0.01 pF and 1 pF. For exemplary embodiments, the small receiver may have an input capacitance (loading) between 0.01 pF and 10 pF, between 0.1 pF and 10 pF, between 0.1 pF and 5 pF, between 0.1 pF and 2 pF, between 0.1 pF and 1 pF, or between 0.01 pF and 1 pF.

Figure 74:
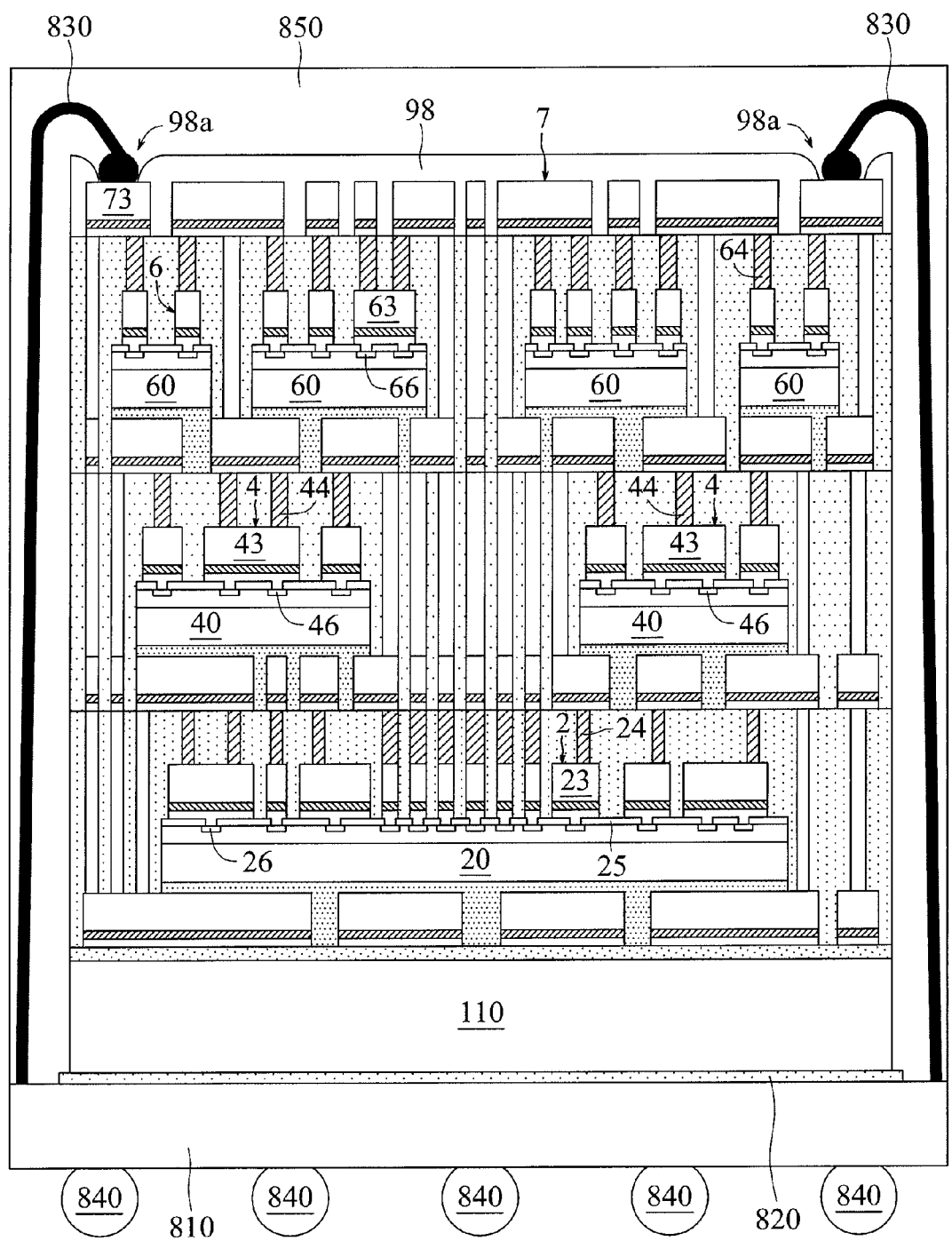
FIG. 74 shows a cross-sectional view of a module, according to an embodiment of the present disclosure.

FIG. 74 shows a module according to an embodiment of the present disclosure, which can be formed by the following steps. After the steps illustrated in FIGS. 1-38, a singulation process can be performed to cut the substrate 110, the filling or encapsulating layers 85, 86 and 87 and the polymer layer 98 and to provide a system-in package or multichip module. Next, the system-in package or multichip module is attached to a top side of a ball-grid-array (BGA) substrate 810 by a glue material 820. Next, using a wire-bonding process, one end of each wirebonded wire 830 can be ball bonded with one of the contact points, exposed by the openings 98a in the polymer layer 98, of the metal layer 73 of the system-in package or multichip module, and the other end of each wirebonded wire 830 can be wedge bonded with one of contact points of the top side of the ball-grid-array (BGA) substrate 810. Next, a molding compound 850 including epoxy and carbon filler is formed on the top side of the ball-grid-array (BGA) substrate 810, on the system-in package or multichip module and on the wirebonded wires 830, encapsulating the system-in package or multichip module and the wirebonded wires 830. Next, multiple solder balls 840 having a diameter between 250 and 1000 micrometers are formed on a bottom side of the ball-grid-array (BGA) substrate 810. Next, a singulation process can be performed to cut the ball-grid-array (BGA) substrate 810 and the molding compound 850 and to provide the module shown in FIG. 74. The module shown in FIG. 74 can be connected to a mother board, a printed circuit board, a metal substrate, a glass substrate or a ceramic substrate using the solder balls 840.

The ball-grid-array (BGA) substrate 810 may include bismaleimide triazine (BT), fiberglass or ceramic. The glue material 820 can be polyimide, benzocyclobutane (BCB), polybenzoxazole (PBO), poly-phenylene oxide (PPO), epoxy, silosane or SU-8, and may have a thickness, e.g., greater than 3 micrometers, such as between 3 and 100 micrometers, and preferably between 5 and 50 micrometers or between 10 and 30 micrometers. The contact points, exposed by the openings 98a in the polymer layer 98, of the metal layer 73 of the system-in package or multichip module can be connected to the contact points of the top side of the ball-grid-array (BGA) substrate 810 through the wirebonded wires 830. The wirebonded wires 830 can be gold wires, copper wires or aluminum wires each having a diameter between 5 and 50 micrometers, and preferably between 10 and 35 micrometers. The solder balls 840 may include bismuth, indium, tin-lead alloy, tin-silver alloy, tin-silver-copper alloy or tin-gold.

Figure 75:
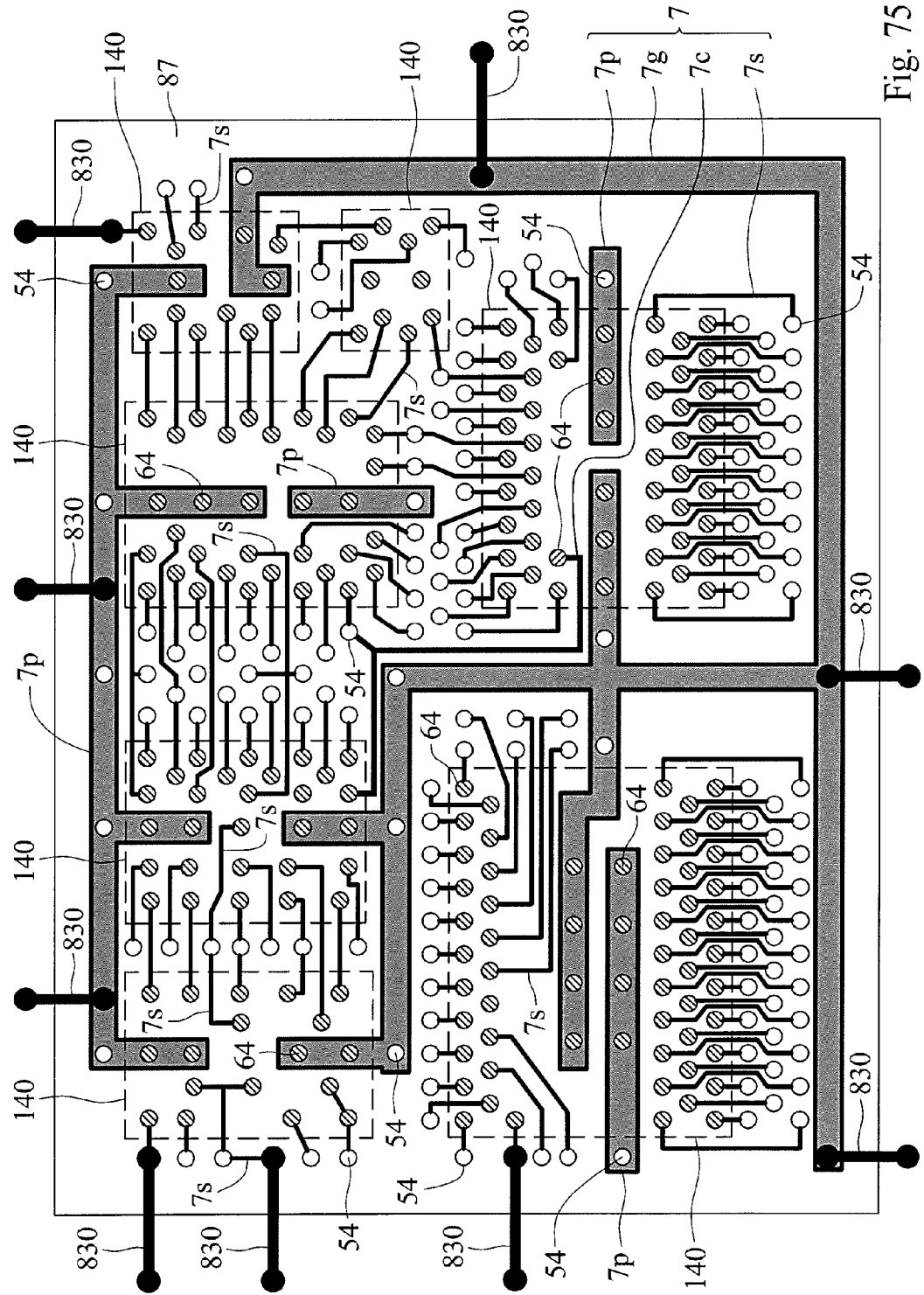
FIG. 75 is a schematic top perspective view of the patterned metal layer 7 of the module shown in FIG. 74.

FIG. 75 shows a schematically top perspective view of the patterned metal layer 7 of the module illustrated in FIG. 74. Referring to FIGS. 74 and 75, the patterned metal layer 7 may include the previously described clock interconnect, bus or trace 7*c*, the previously described ground plane, bus or trace 7*g*, the previously described power planes, buses or traces 7*p*, and the previously described signal interconnects, traces or lines 7*s*. The wirebonded wires 830 can be bonded with the clock interconnect, bus or trace 7*c*, the ground plane, bus or trace 7*g*, the power planes, buses or traces 7*p* and the signal interconnects, traces or lines 7*s*. For more detailed description about FIGS. 74 and 75, please refer to the illustration in FIGS. 36 and 37.

Figure 76:
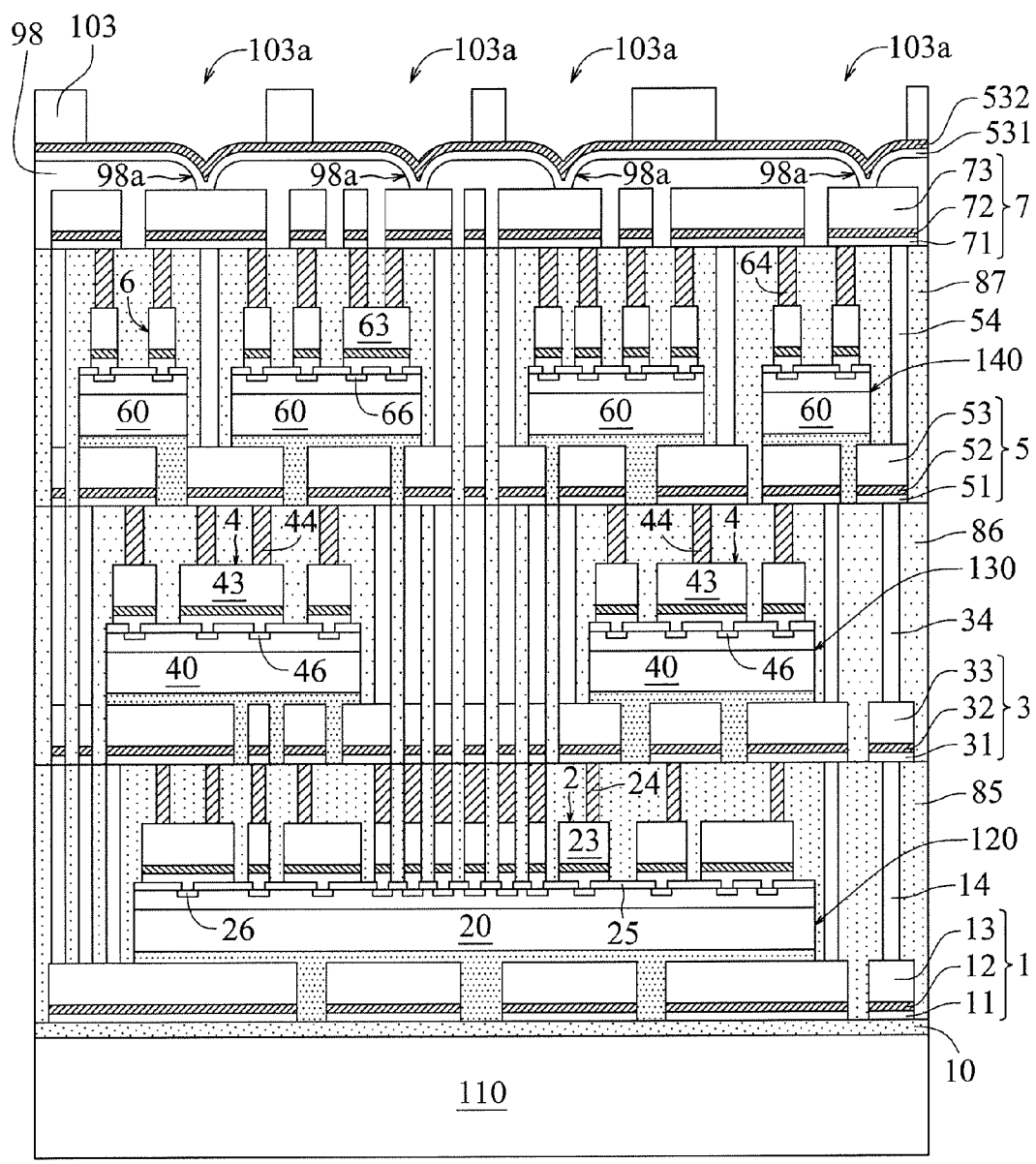
FIGS. 76-84 are cross-sectional views showing a process for forming a system-in package or multichip module, according to an embodiment of the present disclosure.

FIGS. 76-84 show a process for forming another system-in package or multichip module according to another embodiment of the present disclosure. Referring to FIG. 76, after the steps illustrated in FIGS. 1-38 are performed, an adhesion layer 531 having a thickness, e.g., less than 1 micrometer, such as between 1 nanometer and 0.5 micrometers, can be formed on the polymer layer 98 and on the contact points, exposed by the openings 98*a*, of the metal layer 73 by using a physical-vapor deposition (PVD) process, such as sputtering process or evaporation process. Next, a seed layer 532 having a thickness, e.g., less than 1 micrometer, such as between 10 nanometers and 0.8 micrometers, can be formed on the adhesion layer 531 by using a physical-vapor deposition (PVD) process, such as sputtering process or evaporation process, or an electroless plating process. Next, a photoresist layer 103 can be formed on the seed layer 532 by using a spin-on coating process or a lamination process. Next, the photoresist layer 103 is patterned with processes of lithographic, light exposure and development to form multiple openings 103*a* in the photoresist layer 103 exposing the seed layer 532.

The material of the adhesion layer 531 may include titanium, a titanium-tungsten alloy, titanium nitride, chromium, tantalum, tantalum nitride, nickel or nickel vanadium. The material of the seed layer 532 may include copper, silver, gold or titanium-copper alloy.

For example, when the adhesion layer 531 is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the polymer layer 98 and on the contact points, exposed by the openings 98*a*, of the metal layer 73, the seed layer 532 can be formed by sputtering a copper layer, a silver layer, a titanium-copper-alloy layer or a gold layer with a thickness, e.g., less than 1 micrometer, such as between 10 nanometers and 0.8 micrometers, on the titanium-containing layer.

Alternatively, when the adhesion layer 531 is formed by sputtering a tantalum-containing layer, such as a single layer of tantalum or tantalum nitride, having a thickness, e.g., less than 1 micrometer, such as between 1 nanometer and 0.5 micrometers, on the polymer layer 98 and on the contact points, exposed by the openings 98*a*, of the metal layer 73, the seed layer 532 can be formed by sputtering a copper layer, a silver layer, a titanium-copper-alloy layer or a gold layer with a thickness, e.g., less than 1 micrometer, such as between 10 nanometers and 0.8 micrometers, on the tantalum-containing layer.

Alternatively, when the adhesion layer 531 is formed by sputtering a chromium-containing layer, such as a single layer of chromium, having a thickness, e.g., less than 1 micrometer, such as between 1 nanometer and 0.5 micrometers, on the polymer layer 98 and on the contact points, exposed by the openings 98*a*, of the metal layer 73, the seed layer 532 can be formed by sputtering a copper layer, a silver layer, a titanium-copper-alloy layer or a gold layer with a thickness, e.g., less than 1 micrometer, such as between 10 nanometers and 0.8 micrometers, on the chromium-containing layer.

Alternatively, when the adhesion layer 531 is formed by sputtering a nickel-containing layer, such as a single layer of nickel or nickel vanadium, having a thickness, e.g., less than 1 micrometer, such as between 1 nanometer and 0.5 micrometers, on the polymer layer 98 and on the contact points, exposed by the openings 98*a*, of the metal layer 73, the seed layer 532 can be formed by sputtering a copper layer, a silver layer, a titanium-copper-alloy layer or a gold layer with a thickness, e.g., less than 1 micrometer, such as between 10 nanometers and 0.8 micrometers, on the nickel-containing layer.

Figure 77:
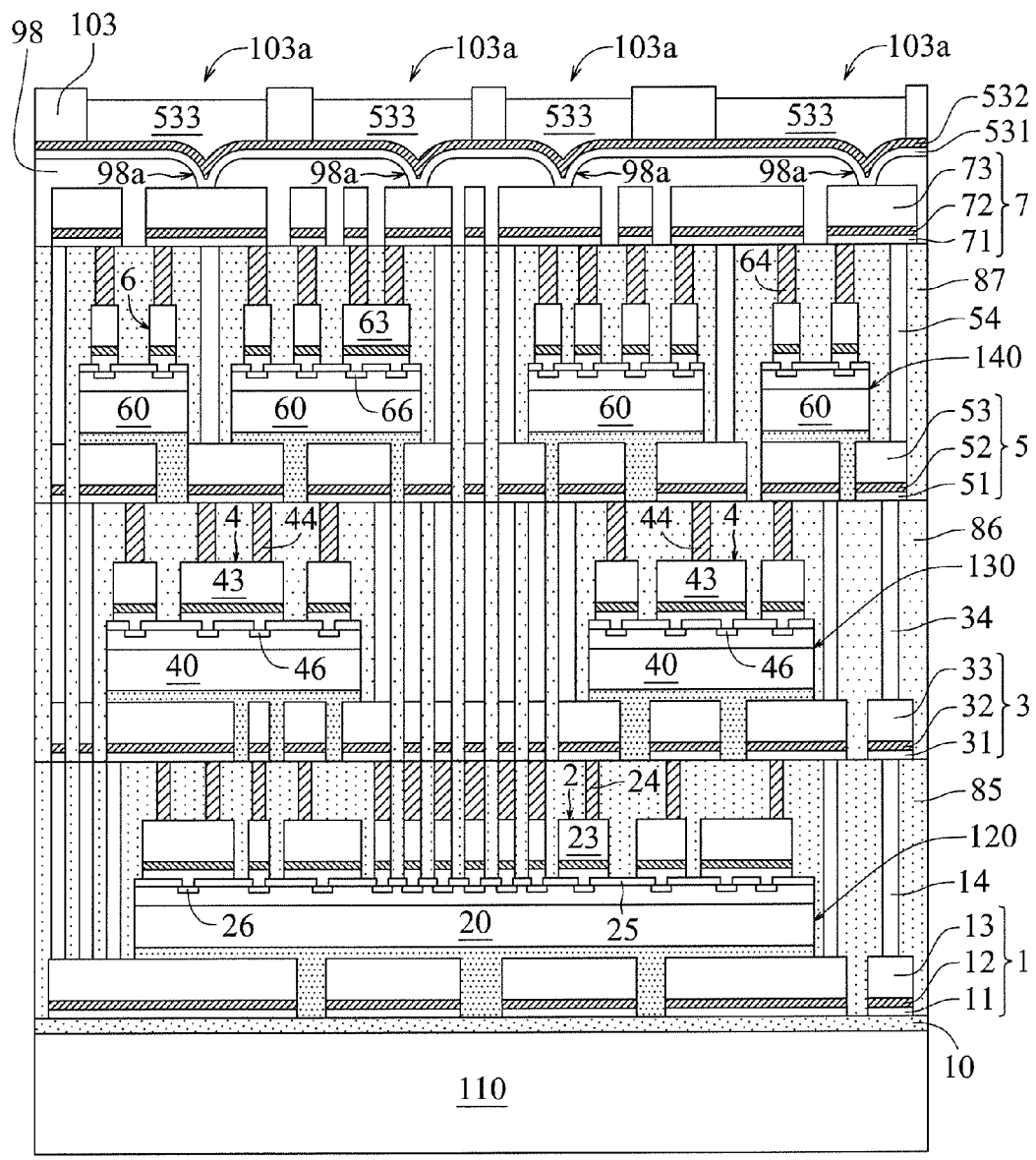

Referring to FIG. 77, after the step illustrated in FIG. 76, a metal layer 533, a conductive layer, having a thickness, e.g., greater than 1 micrometer, such as between 2 and 30 micrometers, and preferably between 3 and 10 micrometers, can be formed on the seed layer 532 exposed by the openings 103*a* and in the openings 103*a* by using a process including an electroplating process. The metal layer 533 can be a single layer of copper, silver, gold, palladium, platinum, rhodium, ruthenium, rhenium or nickel, or a composite layer made of the previously described metals.

For example, the metal layer 533 can be a single metal layer formed by electroplating a copper layer, to a thickness, e.g., greater than 1 micrometer, such as between 2 and 30 micrometers, and preferably between 3 and 10 micrometers, in the openings 103*a* and on the seed layer 532, preferably the previously described copper or titanium-copper-alloy seed layer 532, exposed by the openings 103*a*.

Alternatively, the metal layer 533 can be a single metal layer formed by electroplating a gold layer, to a thickness, e.g., greater than 1 micrometer, such as between 2 and 30 micrometers, and preferably between 3 and 10 micrometers, in the openings 103*a* and on the seed layer 532, preferably the previously described gold seed layer 532, exposed by the openings 103*a*.

Figure 78:
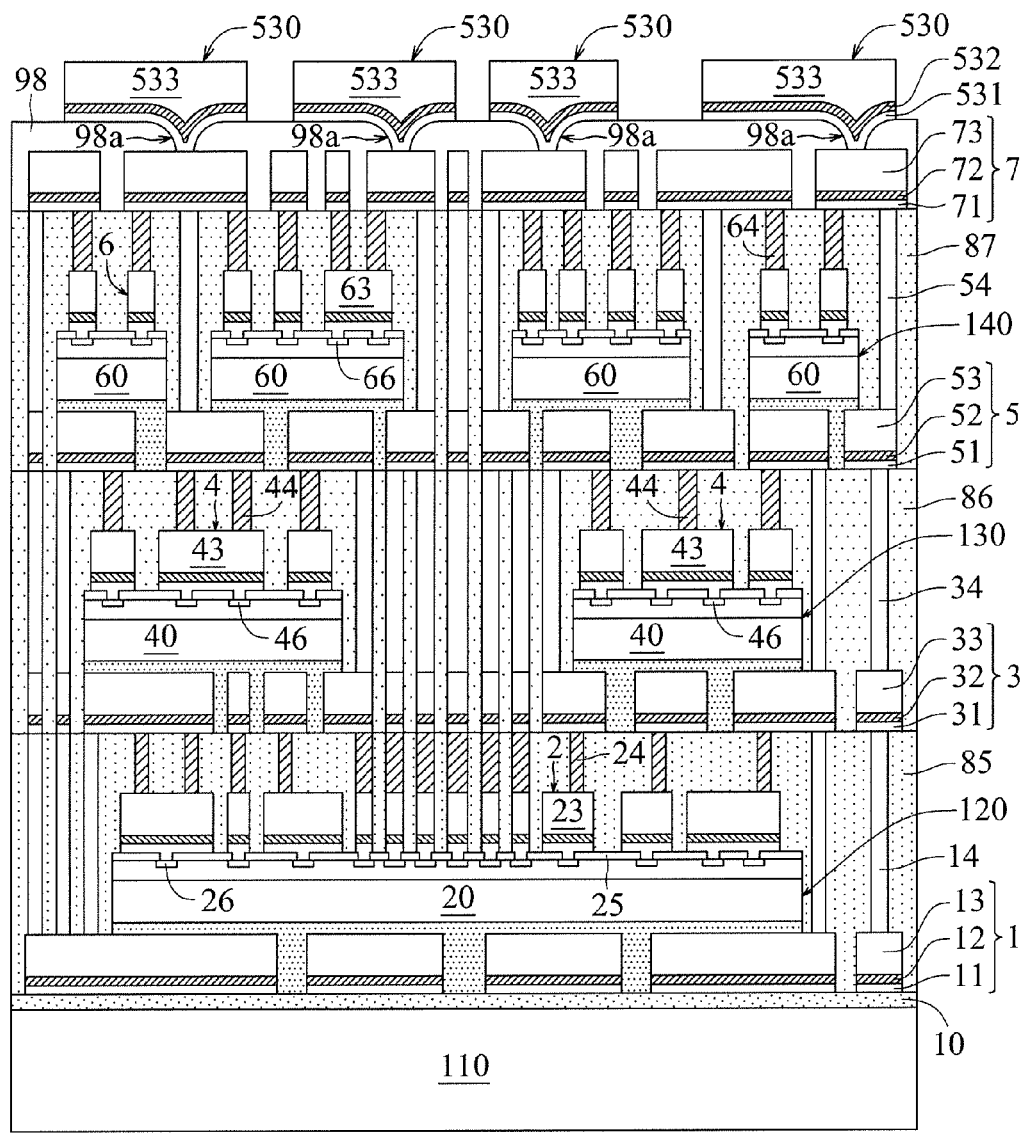

Referring to FIG. 78, after forming the metal layer 533, the photoresist layer 103 is removed using a chemical solution containing amine or NaCO$_3$. Next, the seed layer 532 not under the metal layer 533 is removed by using a wet chemical etching process or a reactive ion etching (RIE) process. Next, the adhesion layer 531 not under the metal layer 533 is removed by using a wet chemical etching process or a reactive ion etching (RIE) process.

Accordingly, the adhesion layer 531, the seed layer 532 and the metal layer 533 compose a patterned metal layer 530 formed on the polymer layer 98 and on the contact points, exposed by the openings 98*a*, of the metal layer 73. The patterned metal layer 530 can be connected to the patterned metal layer 7 through the openings 98*a* in the polymer layer 98. The patterned metal layer 530 may include a metal plane, bus or trace, such as signal trace, clock bus, clock trace, power plane, power bus, power trace, ground plane, ground bus or ground trace, connecting to the patterned metal layer 7.

Figure 79:
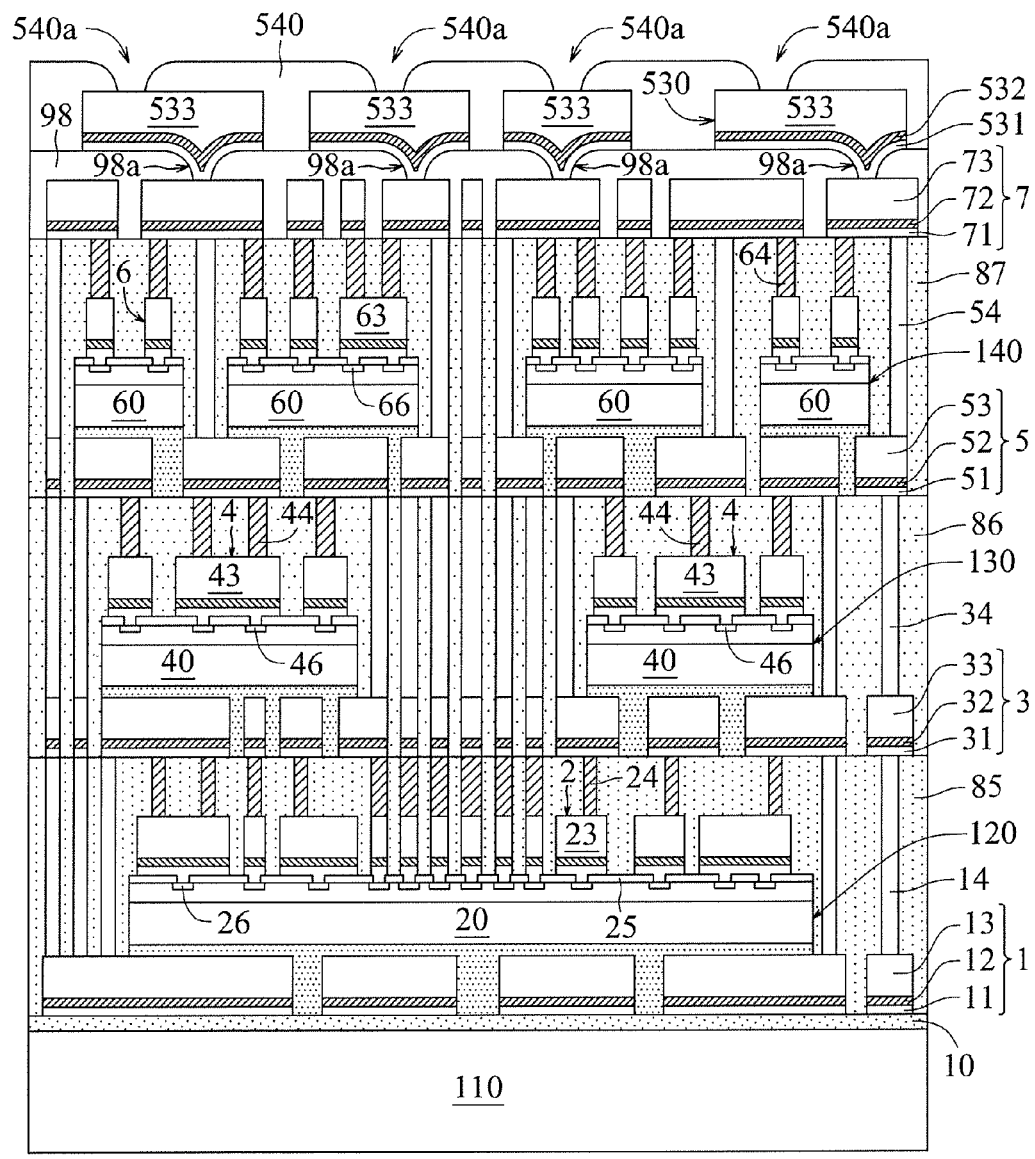

Next, referring to FIG. 79, a polymer layer 540 can be formed on the metal layer 533 of the patterned metal layer 530 and on the polymer layer 98, and multiple openings 540*a* in the polymer layer 540 are over multiple contact points of the metal layer 533 of the patterned metal layer 530 and expose them. The polymer layer 540 can be a polyimide layer, a polybenzoxazole (PBO) layer, a benzocyclobutane (BCB) layer, an epoxy layer, a poly-phenylene oxide (PPO) layer, a silosane layer or a SU-8 layer, and may have a thickness, e.g., greater than 5 micrometers, such as between 5 and 50 micrometers, and preferably between 5 and 15 micrometers or between 5 and 10 micrometers.

Figure 80:
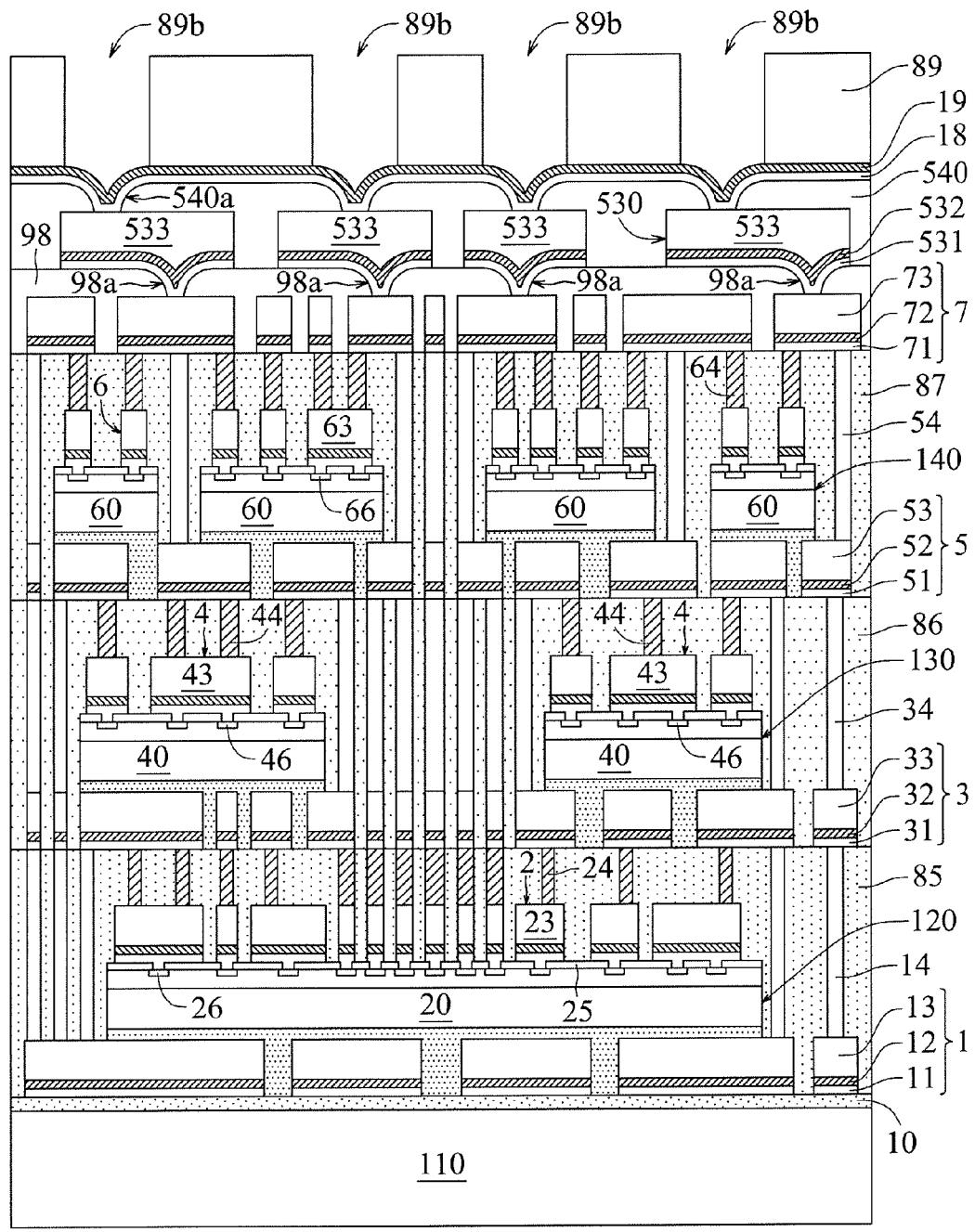

Next, referring to FIG. 80, an adhesion layer 18 having a thickness, e.g., less than 1 micrometer, such as between 1 nanometer and 0.5 micrometers, can be formed on the contact points, exposed by the openings 540a, of the metal layer 533 and on the polymer layer 540 by using a physical-vapor deposition (PVD) process, such as sputtering process or evaporation process. Next, a seed layer 19 having a thickness, e.g., less than 1 micrometer, such as between 10 nanometers and 0.8 micrometers, can be formed on the adhesion layer 18 by using a physical-vapor deposition (PVD) process, such as sputtering process or evaporation process, or an electroless plating process. Next, a photoresist layer 89 can be formed on the seed layer 19 by using a spin-on coating process or a lamination process. Next, the photoresist layer 89 is patterned with processes of lithographic, light exposure and development to form multiple openings 89b in the photoresist layer 89 exposing the seed layer 19.

The material of the adhesion layer 18 may include titanium, a titanium-tungsten alloy, titanium nitride, chromium, tantalum, tantalum nitride, nickel or nickel vanadium. The material of the seed layer 19 may include copper, silver, gold or titanium-copper alloy.

For example, when the adhesion layer 18 is formed by sputtering a titanium-containing layer, such as a single layer of titanium-tungsten alloy, titanium or titanium nitride, having a thickness, e.g., less than 1 micrometer, such as between 1 nanometer and 0.5 micrometers, on the contact points, exposed by the openings 540a, of the metal layer 533 and on the polymer layer 540, the seed layer 19 can be formed by sputtering a copper layer, a silver layer, a titanium-copper-alloy layer or a gold layer with a thickness, e.g., less than 1 micrometer, such as between 10 nanometers and 0.8 micrometers, on the titanium-containing layer.

Alternatively, when the adhesion layer 18 is formed by sputtering a tantalum-containing layer, such as a single layer of tantalum or tantalum nitride, having a thickness, e.g., less than 1 micrometer, such as between 1 nanometer and 0.5 micrometers, on the contact points, exposed by the openings 540a, of the metal layer 533 and on the polymer layer 540, the seed layer 19 can be formed by sputtering a copper layer, a silver layer, a titanium-copper-alloy layer or a gold layer with a thickness, e.g., less than 1 micrometer, such as between 10 nanometers and 0.8 micrometers, on the tantalum-containing layer.

Alternatively, when the adhesion layer 18 is formed by sputtering a chromium-containing layer, such as a single layer of chromium, having a thickness, e.g., less than 1 micrometer, such as between 1 nanometer and 0.5 micrometers, on the contact points, exposed by the openings 540a, of the metal layer 533 and on the polymer layer 540, the seed layer 19 can be formed by sputtering a copper layer, a silver layer, a titanium-copper-alloy layer or a gold layer with a thickness, e.g., less than 1 micrometer, such as between 10 nanometers and 0.8 micrometers, on the chromium-containing layer.

Alternatively, when the adhesion layer 18 is formed by sputtering a nickel-containing layer, such as a single layer of nickel or nickel vanadium, having a thickness, e.g., less than 1 micrometer, such as between 1 nanometer and 0.5 micrometers, on the contact points, exposed by the openings 540a, of the metal layer 533 and on the polymer layer 540, the seed layer 19 can be formed by sputtering a copper layer, a silver layer, a titanium-copper-alloy layer or a gold layer with a thickness, e.g., less than 1 micrometer, such as between 10 nanometers and 0.8 micrometers, on the nickel-containing layer.

Figure 81:
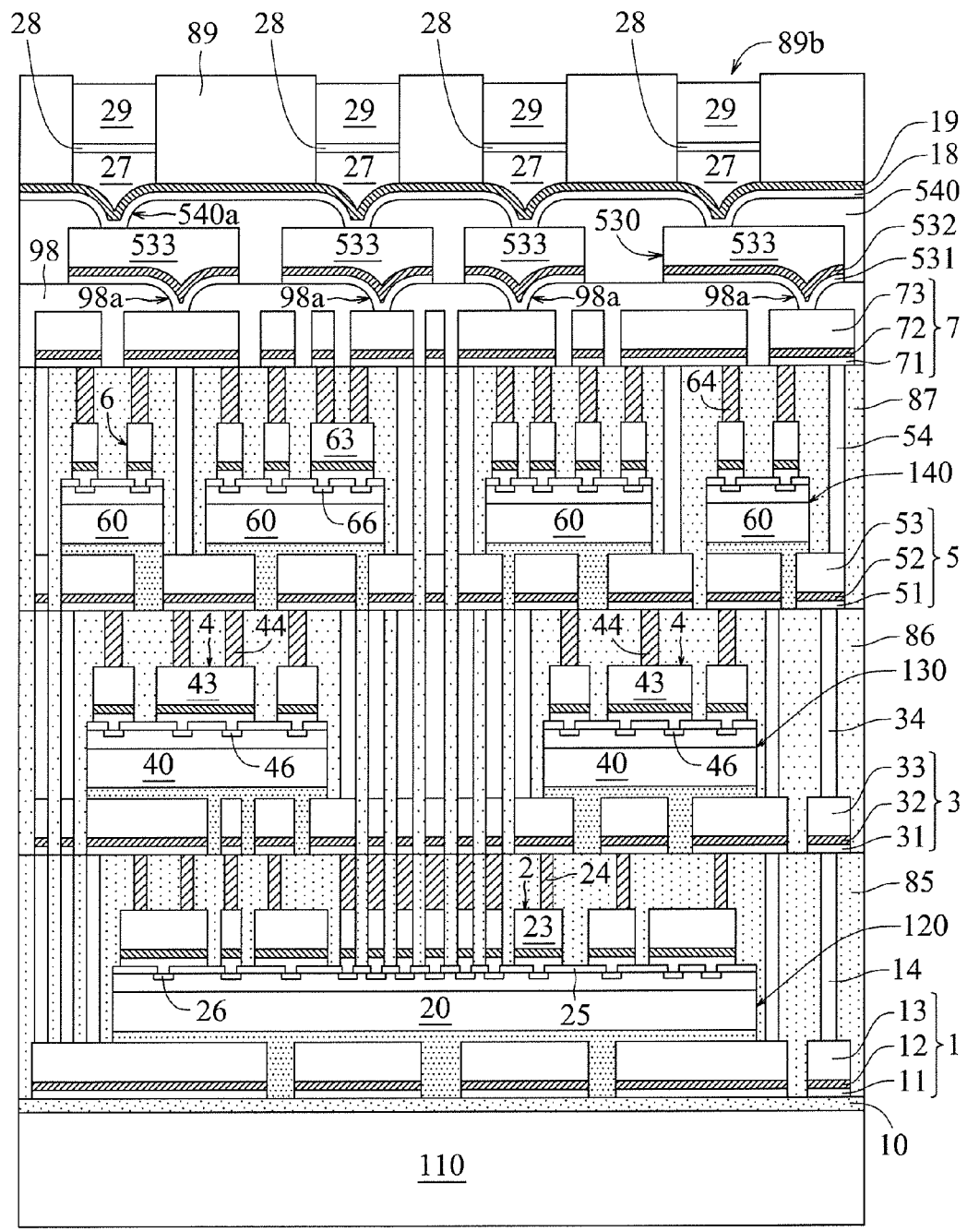

Next, referring to FIG. 81, a metal layer 27, a conductive layer, having a thickness, e.g., greater than 1 micrometer, such as between 2 and 100 micrometers, and preferably between 5 and 60 micrometers or between 10 and 50 micrometers, can be formed on the seed layer 19 exposed by the openings 89b and in the openings 89b by using an electroplating process. Next, a metal layer 28, a barrier layer, having a thickness, e.g., between 0.2 and 10 micrometers, and preferably between 1 and 5 micrometers, can be formed in the openings 89b and on the metal layer 27 in the openings 89b by using an electroplating or electroless plating process. Next, a solder layer 29 having a thickness, e.g., greater than 5 micrometers, such as between 5 and 400 micrometers, and preferably between 10 and 100 micrometers, can be formed in the openings 89b and on the metal layer 28 in the openings 89b by using an electroplating or electroless plating process.

The metal layer 27 may include copper, silver or gold. For example, the metal layer 27 can be a single metal layer formed by electroplating a copper layer, to a thickness, e.g., greater than 1 micrometer, such as between 2 and 100 micrometers, and preferably between 5 and 60 micrometers or between 10 and 50 micrometers, in the openings 89b and on the seed layer 19, preferably the previously described copper or titanium-copper-alloy seed layer 19, exposed by the openings 89b.

The metal layer 28 may include nickel, nickel vanadium or gold. For example, the metal layer 28 can be a single metal layer formed by electroplating or electroless plating a nickel layer or a nickel-vanadium layer, to a thickness, e.g., between 0.2 and 10 micrometers, and preferably between 1 and 5 micrometers, in the openings 89b and on the metal layer 27, preferably the previously described electroplated copper layer 27, in the openings 89b. Alternatively, the metal layer 28 can be composed of double metal layers formed by electroplating or electroless plating a nickel layer, to a thickness, e.g., between 0.2 and 10 micrometers, and preferably between 1 and 5 micrometers, in the openings 89b and on the metal layer 27, preferably the previously described electroplated copper layer 27, in the openings 89b, and then electroplating or electroless plating a gold layer, to a thickness, e.g., between 0.005 and 1 micrometers, and preferably between 0.05 and 0.1 micrometers, in the openings 89b and on the electroplated or electroless plated nickel layer in the openings 89b.

The solder layer 29 may include bismuth, indium, tin, a tin-lead alloy, a tin-silver alloy, a tin-silver-copper alloy or a tin-gold alloy. For example, the solder layer 29 can be a single metal layer formed by electroplating a bismuth-containing layer, an indium-containing layer or a tin-containing layer of a tin-lead alloy, a tin-silver alloy, a tin-silver-copper alloy or a tin-gold alloy, to a thickness, e.g., greater than 5 micrometers, such as between 5 and 400 micrometers, and preferably between 10 and 100 micrometers, in the openings 89b and on the metal layer 28, preferably the previously described electroplated or electroless plated nickel or gold layer 28, in the openings 89b.

Figure 82:
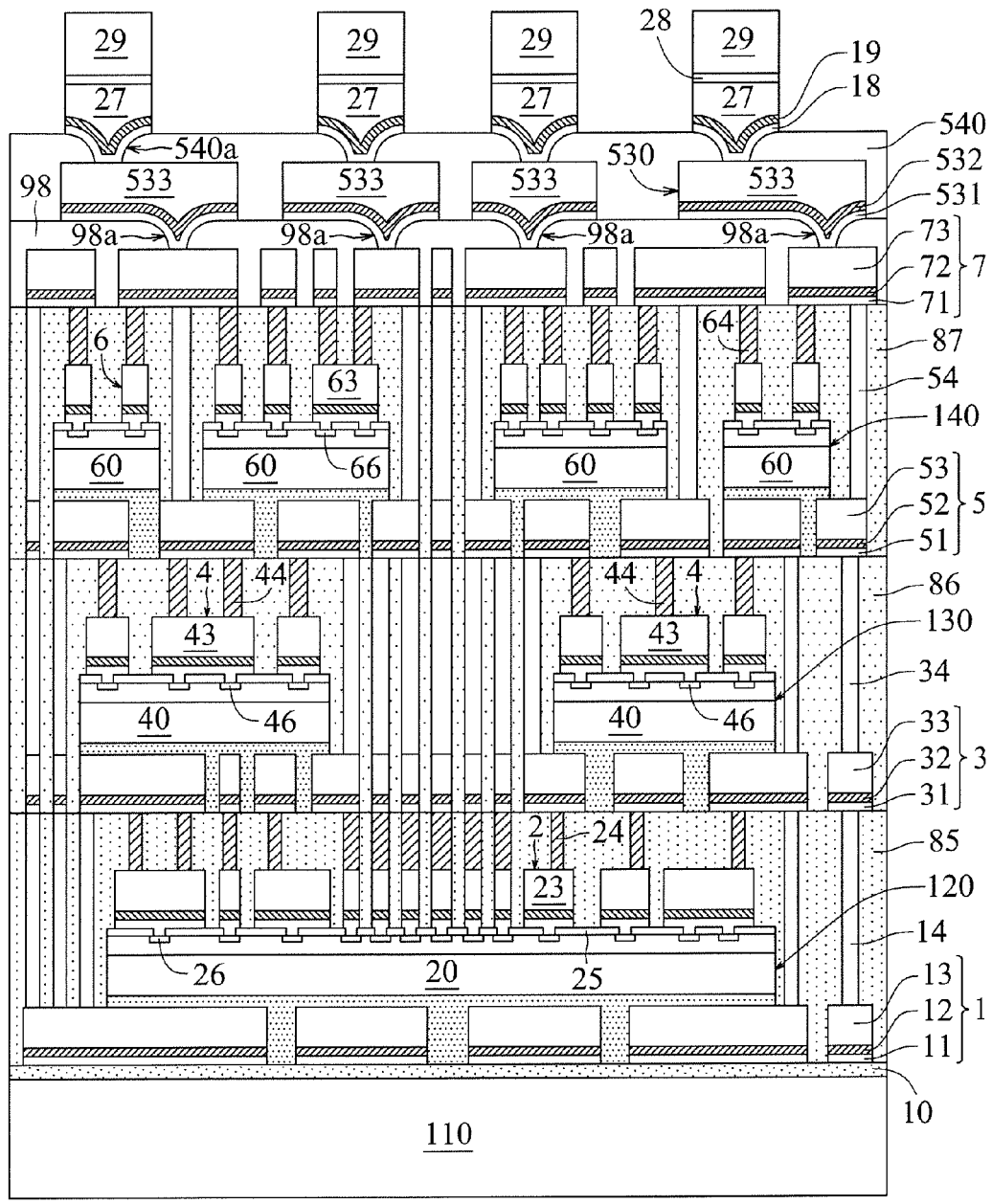

Referring to FIG. 82, after forming the solder layer 29 illustrated in FIG. 81, the photoresist layer 89 is removed using a chemical solution containing amine or NaCO$_3$. Next, the seed layer 19 not under the metal layer 27 is removed by using a wet chemical etching process or a reactive ion etching (RIE) process. Next, the adhesion layer 18 not under the metal layer 27 is removed by using a wet chemical etching process or a reactive ion etching (RIE) process.

Accordingly, the adhesion layer 18, the seed layer 19 and the metal layers 27 and 28 compose an under bump metallurgic (UBM) layer formed on the contact points, exposed by the openings 540a, of the metal layer 533 and on the polymer layer 540, and the solder layer 29 is formed on the metal layer 28, preferably the previously described electroplated or electroless plated nickel or gold layer 28, of the under bump metallurgic (UBM) layer.

Figure 83:
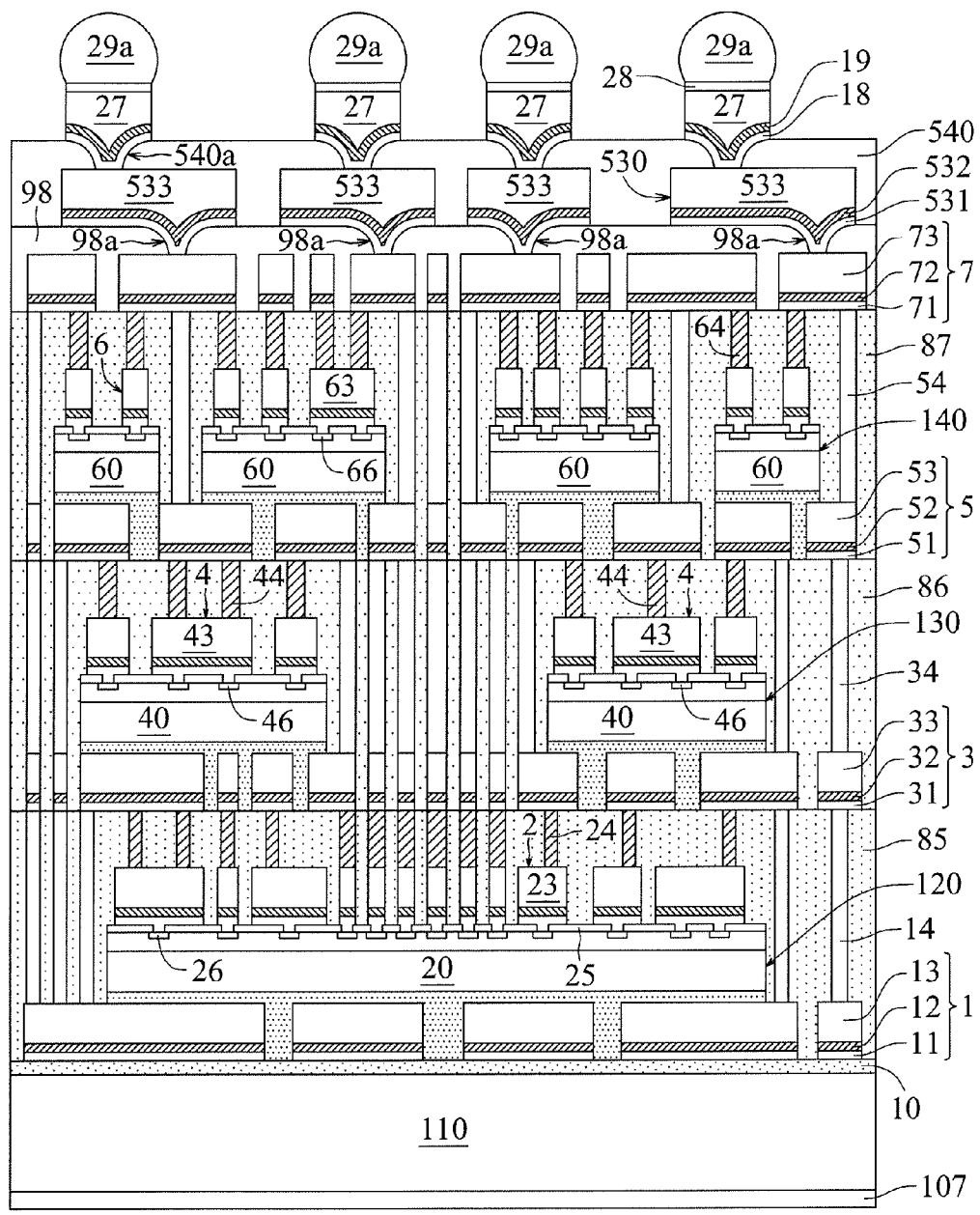

Referring to FIG. 83, after the step illustrated in FIG. 82, the solder layer 29 is reflowed to form multiple solid solder bumps or balls 29a on the metal layer 28, preferably the previously described electroplated or electroless plated nickel or gold layer 28, of the under bump metallurgic (UBM) layer by using a reflowing process. Next, a protection layer 107 having a thickness, e.g., greater than 5 micrometers, such as between 10 and 100 micrometers, and preferably between 20 and 50 micrometers, can be optionally formed on a bottom side of the substrate 110. Next, a singulation process can be performed to cut the substrate 110, the filling or encapsulating layers 85, 86 and 87 and the polymer layers 98 and 540 and to singularize a plurality of the system-in package or multichip module shown in FIG. 83. The system-in package or multichip module shown in FIG. 83 can be connected to a mother board, a printed circuit board, a metal substrate, a glass substrate or a ceramic substrate using the solder bumps or balls 29a.

The protection layer 107 can be a polymer layer such as polyimide layer, polybenzoxazole (PBO) layer, benzocyclobutane (BCB) layer, epoxy layer, poly-phenylene oxide (PPO) layer, silosane layer or SU-8 layer.

Figure 84:
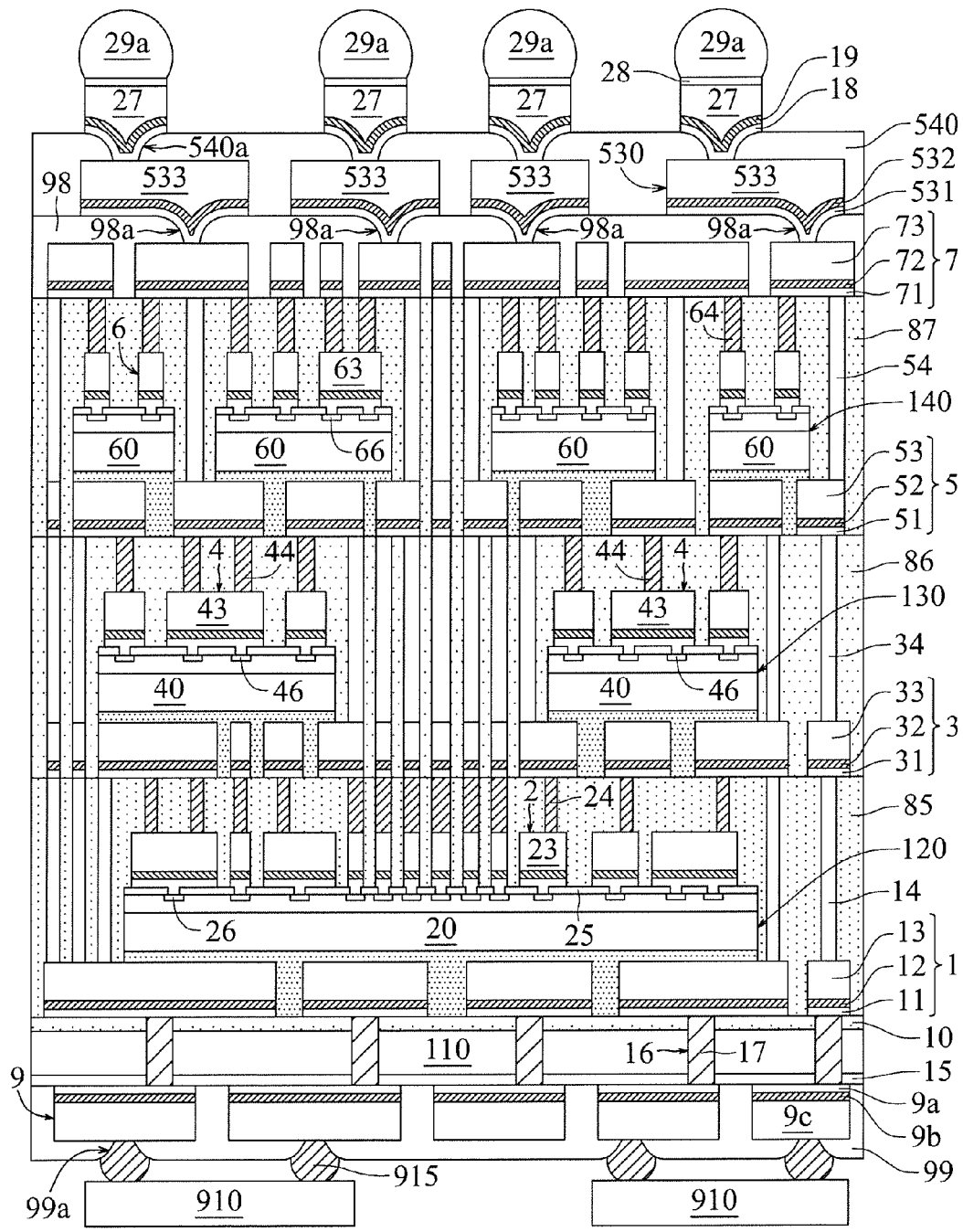

Alternatively, referring to FIG. 84, after the step illustrated in FIG. 82, the solder layer 29 can be reflowed to form multiple solid solder bumps or balls 29a on the metal layer 28, preferably the previously described electroplated or electroless plated nickel or gold layer 28, of the under bump metallurgic (UBM) layer by using a reflowing process. Next, the steps illustrated in FIGS. 40-48 can be performed. Next, multiple discrete (preformed) passive components 910, such as capacitors, inductors or resistors, are mounted onto the contact points, exposed by the openings 99a in the polymer layer 99, of the metal layer 9c through multiple solder joints 915 including bismuth, indium, tin-lead alloy, tin-silver alloy, tin-silver-copper alloy or tin-gold. Next, a singulation process can be performed to cut the substrate 110, the filling or encapsulating layers 85, 86 and 87 and the polymer layers 98 and 540 and to singularize a plurality of the system-in package or multichip module shown in FIG. 84. The system-in package or multichip module shown in FIG. 84 can be connected to a mother board, a printed circuit board, a metal substrate, a glass substrate or a ceramic substrate using the solder bumps or balls 29a.

The patterned metal layer 1 of the system-in package or multichip module shown in FIG. 83 or 84 may include multiple clock interconnects, buses or traces, multiple ground planes, buses or traces, multiple power planes, buses or traces, and multiple signal interconnects or traces.

For example, one of the discrete passive components 910 shown in FIG. 84 may have a first terminal connected to one of the signal interconnects or traces provided by the patterned metal layer 1 through, in sequence, one of the solder joints 915, the patterned metal layer 9 and one of the through-hole connections 17, and a second terminal connected to another one of the signal interconnects or traces provided by the patterned metal layer 1 through, in sequence, another one of the solder joints 915, the patterned metal layer 9 and another one of the through-hole connections 17.

Alternatively, one of the discrete passive components 910 shown in FIG. 84 may have a first terminal connected to one of the signal interconnects or traces provided by the patterned metal layer 1 through, in sequence, one of the solder joints 915, the patterned metal layer 9 and one of the through-hole connections 17, and a second terminal connected to one of the ground planes, buses or traces provided by the patterned metal layer 1 through, in sequence, another one of the solder joints 915, the patterned metal layer 9 and another one of the through-hole connections 17.

Alternatively, one of the discrete passive components 910 shown in FIG. 84 may have a first terminal connected to one of the power planes, buses or traces provided by the patterned metal layer 1 through, in sequence, one of the solder joints 915, the patterned metal layer 9 and one of the through-hole connections 17, and a second terminal connected to one of the ground planes, buses or traces provided by the patterned metal layer 1 through, in sequence, another one of the solder joints 915, the patterned metal layer 9 and another one of the through-hole connections 17.

Regarding the system-in package or multichip module illustrated in FIG. 83 or 84, a top perspective view of the patterned metal layer 7 can be referred to FIG. 37, and the patterned metal layer 7 may include the clock interconnect, bus or trace 7c, the ground plane, bus or trace 7g, the power planes, buses or traces 7p and the signal interconnects, traces or lines 7s, as shown in FIG. 37. For example, one of the solder bumps or balls 29a shown in FIG. 83 or 84 can be connected to the clock interconnect, bus or trace 7c, the ground plane, bus or trace 7g, one of the power planes, buses or traces 7p or one of the signal interconnects, traces or lines 7s through the under bump metallurgic (UBM) layer and the patterned metal layer 530.

The solder bumps or balls 29a shown in FIG. 83 or 84 have a bump height greater than 5 micrometers, such as between 5 and 400 micrometers, and preferably between 10 and 100 micrometers, and a suitable width or diameter, e.g., between 20 and 400 micrometers, and preferably between 50 and 100 micrometers. The solder bumps or balls 29a shown in FIG. 83 or 84 can be bismuth-containing bumps or balls, indium-containing bumps or balls, or tin-containing bumps or balls of a tin-lead alloy, a tin-silver alloy, a tin-silver-copper alloy or a tin-gold alloy.

One of the chips 120, 130 and 140 shown in FIG. 52, 54, 55, 66, 67, 74, 83, 84 or 104 may include small input/output (I/O) circuits serving for intra-chip signal connection, having a data bit width, e.g., equal to or more than 128, equal to or more than 512, between 32 and 2048, between 128 and 2048, between 256 and 1024, or between 512 and 1024, to the other one of the chips 120, 130 and 140. Each of the small I/O circuits can be composed of a small driver and a small or no ESD (electro static discharge) circuit, or can be composed of a small receiver and a small or no ESD circuit. For some application, one of the small I/O circuits may have a total loading (total capacitance) between 0.1 pF and 10 pF, and preferably between 0.1 pF and 2 pF. In some instances, the small driver may have an output capacitance (loading) between 0.01 pF and 10 pF, between 0.1 pF and 10 pF, between 0.1 pF and 5 pF, between 0.1 pF and 2 pF, between 0.1 pF and 1 pF, or between 0.01 pF and 1 pF. For exemplary embodiments, the small receiver may have an input capacitance (loading) between 0.01 pF and 10 pF, between 0.1 pF and 10 pF, between 0.1 pF and 5 pF, between 0.1 pF and 2 pF, between 0.1 pF and 1 pF, or between 0.01 pF and 1 pF.

Figure 85:
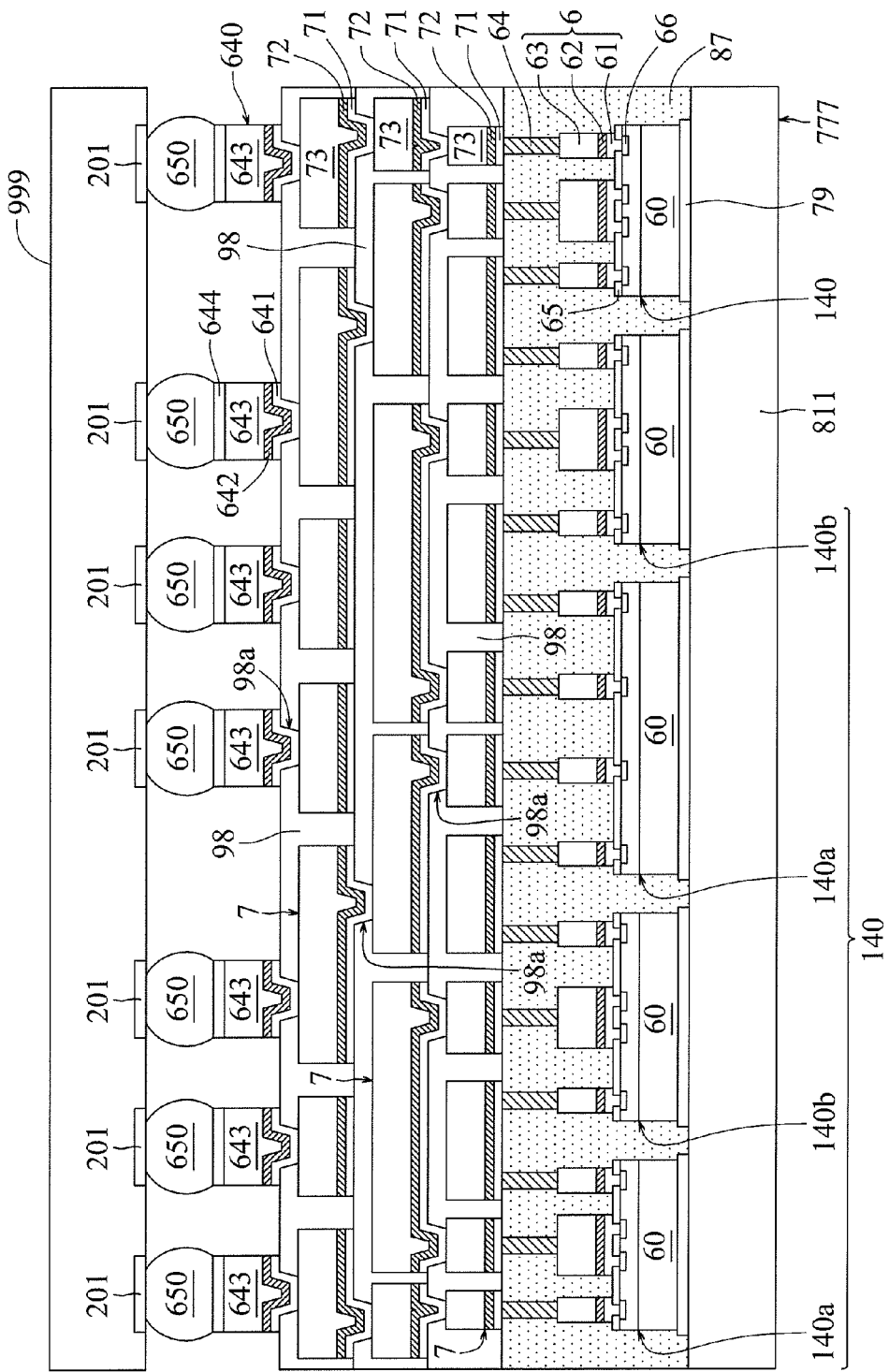
FIG. 85 shows a cross-sectional view of an electronic device, according to an embodiment of the present disclosure.

FIG. 85 shows an electronic device in accordance with an exemplary embodiment of the present disclosure. The electronic device may include a circuit board 999 and a system-in package or multichip module 777. The circuit board 999 can be a mother board, a printed circuit board, a metal substrate, a glass substrate or a ceramic substrate. The system-in package or multichip module 777 may include a supporting substrate 811, the previously described chips 140 attached to the supporting substrate 811 by a glue material 79, the previously described filling or encapsulating layer 87 on the supporting substrate 811 and on the chips 140, a plurality of the previously described polymer layer 98 over the chips 140 and over the filling or encapsulating layer 87, a plurality of the previously described patterned metal layer 7 over the chips 140, over the filling or encapsulating layer 87 and in the polymer layers 98, and multiple metal bumps 640 on the topmost polymer layer 98 and on the topmost patterned metal layer 7 exposed by multiple openings 98a in the topmost polymer layer 98. Alternatively, the supporting substrate 811 can be removed, that is, the system-in package or multichip module 777 may not include the supporting substrate 811 under the chips 140 and the filling or encapsulating layer 87.

The system-in package or multichip module 777 can be connected to the circuit board 999 through multiple solder bumps 650. The solder bumps 650 are between multiple contact points 201 of the circuit board 999 and the metal bumps 640 of the system-in package or multichip module 777. The solder bumps 650 can be performed on the metal bumps 640 of the system-in package or multichip module 777, and then the solder bumps 650 of the system-in package or multichip module 777 can be bonded with the contact points 201 of the circuit board 999. Alternatively, the solder bumps 650 can be performed on the contact points 201 of the circuit board 999, and then the metal bumps 640 of the system-in package or multichip module 777 can be bonded with the solder bumps 650 of the circuit board 999.

The solder bumps 650 may have a bump height greater than 5 micrometers, such as between 5 and 400 micrometers, and preferably between 10 and 100 micrometers, and a suitable width or diameter, e.g., between 20 and 400 micrometers, and preferably between 50 and 100 micrometers. The solder bumps 650 may include bismuth, indium, a tin-lead alloy, a tin-silver alloy, a tin-silver-copper alloy or a tin-gold alloy or other suitable materials.

The supporting substrate 811 of the system-in package or multichip module 777 may include bismaleimide triazine (BT), fiberglass, ceramic, glass, silicon, copper or aluminum. For example, the supporting substrate 811 can be a print circuit board (PCB), a silicon substrate, a glass substrate, a ceramic substrate or a metal substrate.

The glue material 79 can be polyimide, benzocyclobutane (BCB), polybenzoxazole (PBO), poly-phenylene oxide (PPO), epoxy, silosane or SU-8, and may have a thickness, e.g., greater than 3 micrometers, such as between 3 and 100 micrometers, and preferably between 5 and 50 micrometers or between 10 and 30 micrometers.

Each of the metal pillars or bumps 64 of the chips 140 in the system-in package or multichip module 777 has a top surface not covered by the filling or encapsulating layer 87, and the top surfaces of the metal pillars or bumps 64 may be substantially coplanar with a top surface of the filling or encapsulating layer 87.

Each of the patterned metal layers 7 can be composed of the previously described adhesion layer 71, the previously described seed layer 72 on the adhesion layer 71, and the previously described metal layer 73 on the seed layer 72. The bottommost patterned metal layer 7 is formed on the top surface of the filling or encapsulating layer 87 and on the top surfaces of the metal pillars or bumps 64. The adhesion layer 71 of the bottommost patterned metal layer 7 is formed on the top surface of the filling or encapsulating layer 87 and on the top surfaces of the metal pillars or bumps 64. The bottommost polymer layer 98 is formed on the top surface of the filling or encapsulating layer 87 and on the metal layer 73 of the bottommost patterned metal layer 7, and multiple openings 98a in the bottommost polymer layer 98 are over multiple contact points of the metal layer 73 of the bottommost patterned metal layer 7 and expose them. The middle patterned metal layer 7 is formed on the bottommost polymer layer 98 and on the contact points, exposed by the openings 98a in the bottommost polymer layer 98, of the metal layer 73 of the bottommost patterned metal layer 7. The adhesion layer 71 of the middle patterned metal layer 7 is formed on the bottommost polymer layer 98 and on the contact points, exposed by the openings 98a in the bottommost polymer layer 98, of the metal layer 73 of the bottommost patterned metal layer 7. The middle polymer layer 98 is formed on the bottommost polymer layer 98 and on the middle patterned metal layer 7, and multiple openings 98a in the middle polymer layer 98 are over multiple contact points of the metal layer 73 of the middle patterned metal layer 7 and expose them. The topmost patterned metal layer 7 is formed on the middle polymer layer 98 and on the contact points, exposed by the openings 98a in the middle polymer layer 98, of the metal layer 73 of the middle patterned metal layer 7. The adhesion layer 71 of the topmost patterned metal layer 7 is formed on the middle polymer layer 98 and on the contact points, exposed by the openings 98a in the middle polymer layer 98, of the metal layer 73 of the middle patterned metal layer 7. The topmost polymer layer 98 is formed on the middle polymer layer 98 and on the metal layer 73 of the topmost patterned metal layer 7, and the openings 98a in the topmost polymer layer 98 are over multiple contact points of the metal layer 73 of the topmost patterned metal layer 7 and expose them. The process of forming the patterned metal layer 7 as shown in FIG. 85 can be referred to as the process of forming the patterned metal layer 7 as illustrated in FIGS. 33-36.

The metal bumps 640 may be composed of an adhesion layer 641, a seed layer 642 and two metal layers 643 and 644. The adhesion layer 641, which may have a thickness, e.g., less than 1 micrometer, such as between 1 nanometer and 0.5 micrometers, is formed on the topmost polymer layer 98 and on the contact points, exposed by the openings 98a in the topmost polymer layer 98, of the metal layer 73 of the topmost patterned metal layer 7. The seed layer 642, which may have a thickness, e.g., less than 1 micrometer, such as between 10 nanometers and 0.8 micrometers, is formed on the adhesion layer 641. The material of the adhesion layer 641 may include titanium, a titanium-tungsten alloy, titanium nitride, chromium, tantalum, tantalum nitride, nickel or nickel vanadium. The material of the seed layer 642 may include copper, silver, gold or titanium-copper alloy. For example, when the adhesion layer 641 is a titanium-containing layer, such as a single layer of titanium-tungsten alloy, titanium or titanium nitride, having a thickness, e.g., less than 1 micrometer, such as between 1 nanometer and 0.5 micrometers, on the topmost polymer layer 98 and on the contact points, exposed by the openings 98a in the topmost polymer layer 98, of the metal layer 73 of the topmost patterned metal layer 7, the seed layer 642 can be formed by sputtering a copper layer, a silver layer, a titanium-copper-alloy layer or a gold layer with a thickness, e.g., less than 1 micrometer, such as between 10 nanometers and 0.8 micrometers, on the titanium-containing layer.

The metal layer 643 is formed on the seed layer 642 and has a thickness, e.g., greater than 1 micrometer, such as between 2 and 100 micrometers, and preferably between 5 and 60 micrometers or between 10 and 50 micrometers. The metal layer 643 may include copper, silver or gold. For example, the metal layer 643 can be a single metal layer formed by electroplating a copper layer, to a thickness, e.g., greater than 1 micrometer, such as between 2 and 100 micrometers, and preferably between 5 and 60 micrometers or between 10 and 50 micrometers, on the seed layer 642, preferably the previously described copper or titanium-copper-alloy seed layer 642.

The metal layer 644 serving as barrier layer or solder wetting layer is formed on the metal layer 643 and has a thickness, e.g., between 0.2 and 10 micrometers, and preferably between 1 and 5 micrometers. The metal layer 644 can be a single layer of nickel, nickel vanadium or gold, or a composite layer made of the previously described metals. For example, the metal layer 644 can be a nickel-containing layer, such as a single layer of nickel or nickel vanadium, having a thickness, e.g., between 0.2 and 10 micrometers, and preferably between 1 and 5 micrometers, on the metal layer 643, preferably the previously described electroplated copper layer 643, and under solder bumps 650. Alternatively, the metal layer 644 can be a gold-containing layer, such as a single layer of gold, having a thickness, e.g., between 0.2 and 10 micrometers, and preferably between 1 and 5 micrometers, on the metal layer 643, preferably the previously described electroplated copper layer 643, and under solder bumps 650. Alternatively, the metal layer 644 may include a nickel-containing layer having a thickness, e.g., between 0.2 and 10 micrometers, and preferably between 1 and 5 micrometers, on the metal layer 643, preferably the previously described electroplated copper layer 643, and a gold-containing layer having a thickness, e.g., between 0.2 and 10 micrometers, and preferably between 1 and 5 micrometers, on the nickel-containing layer and under solder bumps 650.

In FIG. 85, one of the chips 140, such as one of chips 140*a*, has one of the metal pillars or bumps 64 connected to one of the metal pillars or bumps 64 of another one of the chips 140, such as one of chips 140*b*, through a metal interconnect or trace, such as power plane, power trace, ground plane, ground trace or signal trace, provided by the bottommost patterned metal layer 7. One of the chips 140*a* has another one of the metal pillars or bumps 64 connected to another one of the metal pillars or bumps 64 of one of the chips 140*b* through the bottommost patterned metal layer 7 and through a metal interconnect or trace, such as power plane, power trace, ground plane, ground trace or signal trace, provided by the middle patterned metal layer 7. Each of the chips 140*a* has another one of the metal pillars or bumps 64 connected to one of the solder bumps 650, vertically over or not vertically over the metal pillar or bump 64 connecting thereto, through the patterned metal layers 7 and one of the metal bumps 640.

One of the chips 140 shown in FIG. 85 may include small input/output (I/O) circuits serving for intra-chip signal connection, having a data bit width, e.g., equal to or more than 128, equal to or more than 512, between 32 and 2048, between 128 and 2048, between 256 and 1024, or between 512 and 1024, to the other one of the chips 140. Each of the small I/O circuits can be composed of a small driver and a small or no ESD (electro static discharge) circuit, or can be composed of a small receiver and a small or no ESD circuit. In exemplary embodiments, one of the small I/O circuits may have a total loading (total capacitance) between 0.1 pF and 10 pF, and preferably between 0.1 pF and 2 pF. In exemplary embodiments, the small driver may have an output capacitance (loading) between 0.01 pF and 10 pF, between 0.1 pF and 10 pF, between 0.1 pF and 5 pF, between 0.1 pF and 2 pF, between 0.1 pF and 1 pF, or between 0.01 pF and 1 pF. The small receiver may have an input capacitance (loading) between 0.01 pF and 10 pF, between 0.1 pF and 10 pF, between 0.1 pF and 5 pF, between 0.1 pF and 2 pF, between 0.1 pF and 1 pF, or between 0.01 pF and 1 pF for some applications.

Figure 86:
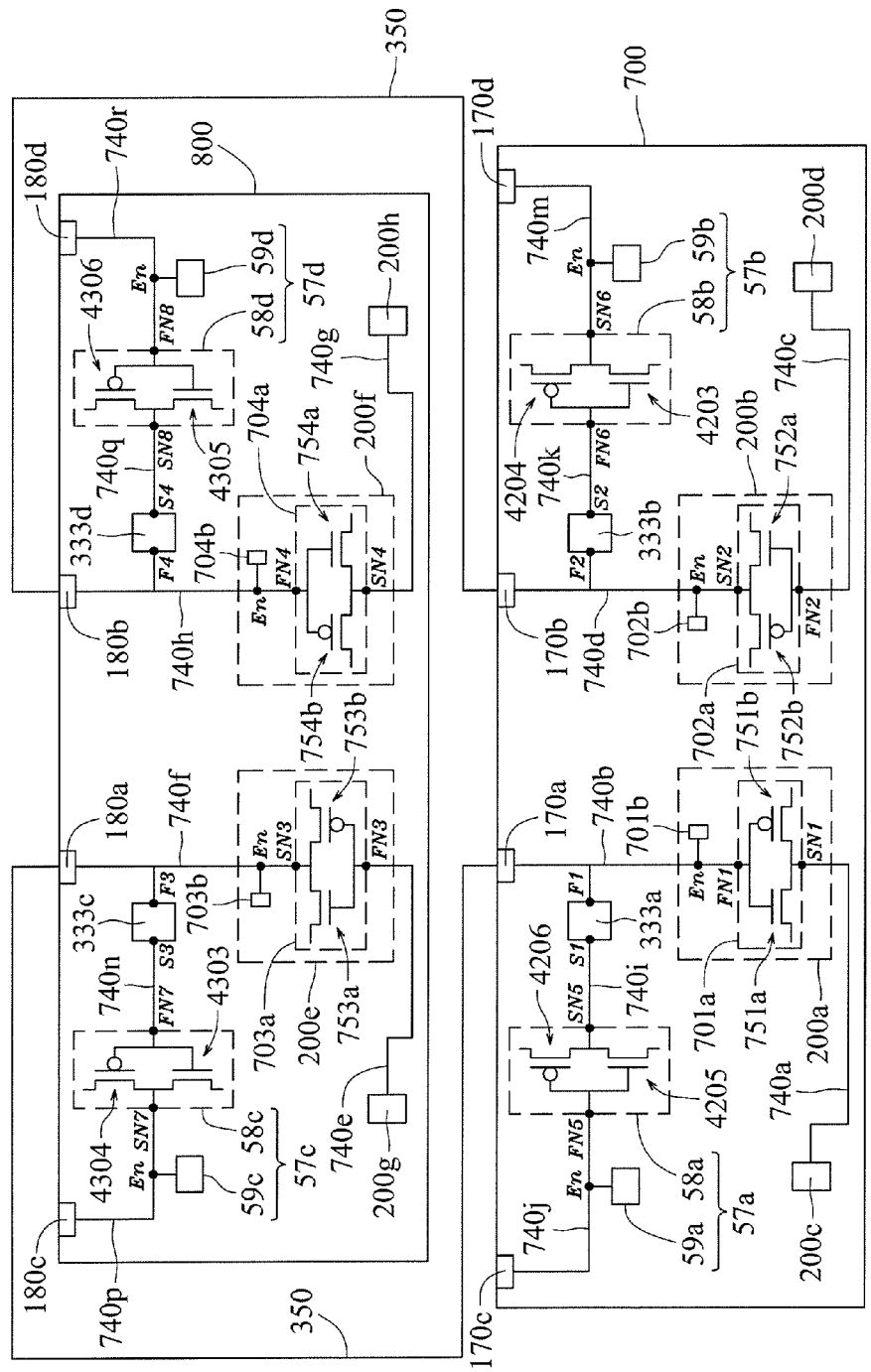
FIGS. 86 and 95 are circuit diagrams each showing interface circuits between two chips, according to an embodiment of the present disclosure.

FIG. 86 is an example of a circuit diagram showing interface circuits between two chips 700 and 800. The two chips 700 and 800 can be any two of the previously described chips 120, 130 and 140 illustrated in FIG. 52, 54, 55, 66, 67, 74, 83, 84, 85 or 104. Alternatively, the two chips 700 and 800 can be any two of the previously described chips 120, 130, 140 and 160 illustrated in FIG. 72 or 73. Alternatively, the two chips 700 and 800 can be any two of the below described chips 120, 130 and 140 illustrated in FIG. 107K, 107L, 108F or 109T.

For example, while the chip 700 is one of the chips 120 shown in FIG. 52, 54, 55, 66, 67, 72, 73, 74, 83, 84, 104, 107K, 107L, 108F or 109T, the chip 800 can be one of the chips 130 and 140 shown in FIG. 52, 54, 55, 66, 67, 72, 73, 74, 83, 84, 104, 107K, 107L, 108F or 109T. Alternatively, while the chip 700 is one of the chips 120, 130 and 140 shown in FIG. 72 or 73, the chip 800 can be the chip 160 shown in FIG. 72 or 73. Alternatively, while the chip 700 is one of the chips 120 shown in FIG. 52, 54, 55, 66, 67, 72, 73, 74, 83, 84, 104, 107K, 107L, 108F or 109T, the chip 800 can be another one of the chips 120 shown in FIG. 52, 54, 55, 66, 67, 72, 73, 74, 83, 84, 104, 107K, 107L, 108F or 109T. Alternatively, while the chip 700 is one of the chips 130 shown in FIG. 52, 54, 55, 66, 67, 72, 73, 74, 83, 84, 104, 107K, 107L, 108F or 109T, the chip 800 can be another one of the chips 130 shown in FIG. 52, 54, 55, 66, 67, 72, 73, 74, 83, 84, 104, 107K, 107L, 108F or 109T. Alternatively, while the chip 700 is one of the chips 140 shown in FIG. 52, 54, 55, 66, 67, 72, 73, 74, 83, 84, 85, 104, 107K, 107L, 108F or 109T, the chip 800 can be another one of the chips 140 shown in FIG. 52, 54, 55, 66, 67, 72, 73, 74, 83, 84, 85, 104, 107K, 107L, 108F or 109T.

If the chip 700 or 800 is a memory chip, such as static-random-access-memory (SRAM) chip or dynamic-random-access-memory (DRAM) chip, the chip 700 or 800 may have a memory size larger than 10 megabytes (MB), such as between 10 megabytes and 32 gigabytes, and preferably between 100 megabytes and 4 gigabytes.

Referring to FIG. 86, the chip 700 may include two inter-chip circuits 200*a* and 200*b*, two internal circuits 200*c* and 200*d*, two off-chip circuits 57*a* and 57*b*, and two testing interface circuits 333*a* and 333*b*. The chip 800 may include two inter-chip circuits 200*e* and 200*f*, two internal circuits 200*g* and 200*h*, two off-chip circuits 57*c* and 57*d*, and two testing interface circuits 333*c* and 333*d*. The chip 700 is connected to the chip 800 through multiple metal interconnects 350 (two of them are shown). The metal interconnects 350, for example, may include the patterned metal layers 2, 3, 4 and 5 and the metal pillars or bumps 24, 34 and 44 when the chip 700 is one of the chip 120 and the chip 800 is one of the chip 130. Alternatively, the metal interconnects 350 may include the patterned metal layers 4, 5, 6 and 7 and the metal pillars or bumps 44, 54 and 64 when the chip 700 is one of the chip 130 and the chip 800 is one of the chip 140. Alternatively, the metal interconnects 350 may include the patterned metal layers 2, 3, 5, 6 and 7 and the metal pillars or bumps 24, 34, 54 and 64 when the chip 700 is one of the chip 120 and the chip 800 is one of the chip 140. Alternatively, the metal interconnects 350 may include the patterned metal layers 2 and 3 and the metal pillars or bumps 24 when the chips 700 and 800 are two of the chips 120. Alternatively, the metal interconnects 350 may include the patterned metal layers 4 and 5 and the metal pillars or bumps 44 when the chips 700 and 800 are two of the chips 130. Alternatively, the metal interconnects 350 may include the patterned metal layers 6 and 7 and the metal pillars or bumps 64 when the chips 700 and 800 are two of the chips 140.

The inter-chip circuit 200a of the chip 700 may include an inter-chip buffer 701a and an inter-chip ESD (electro static discharge) circuit 701b. The inter-chip buffer 701a has a first node FN1 and a second node SN1, and the inter-chip ESD circuit 701b has a node En connected to the first node FN1. The inter-chip buffer 701a can be an inter-chip receiver which can be an inverter composed of an NMOS transistor 751a and a PMOS transistor 751b. The gates of the NMOS transistor 751a and the PMOS transistor 751b serve as an input node that is the first node FN1 of the inter-chip buffer 701a. The drains of the NMOS transistor 751a and the PMOS transistor 751b serve as an output node that is the second node SN1 of the inter-chip buffer 701a.

Figure 87:
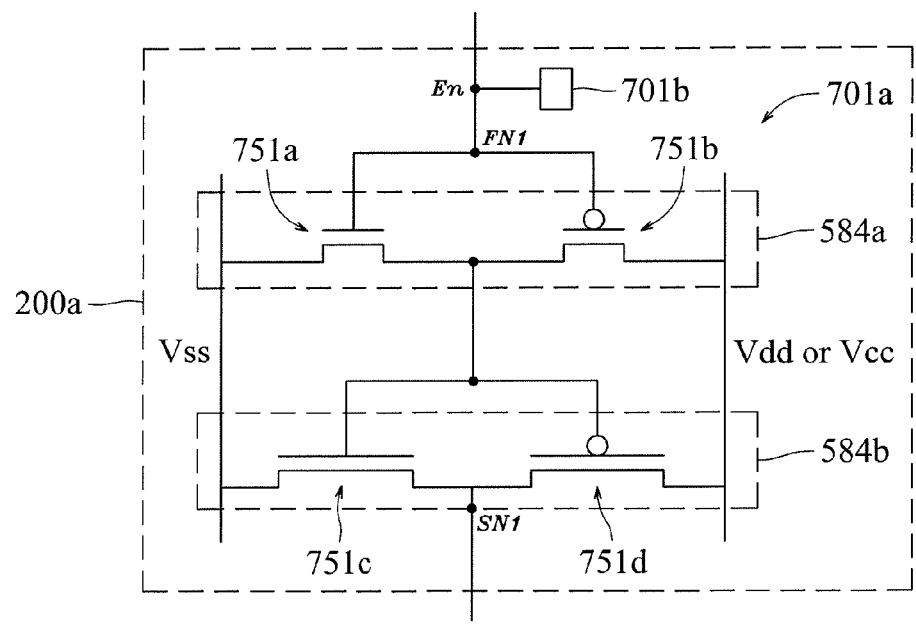
FIGS. 87 and 90 show inter-chip circuits each including a two-stage cascade inter-chip receiver and an inter-chip ESD (electro static discharge) circuit, according to an embodiment of the present disclosure.

Alternatively, the inter-chip buffer 701a can be a multi-stage cascade inter-chip receiver including several stages of inverters. For example, referring to FIG. 87, the inter-chip buffer 701a can be a two-stage cascade inter-chip receiver. The first stage 584a of the two-stage cascade inter-chip receiver is an inverter composed of the NMOS transistor 751a and the PMOS transistor 751b, and the second stage 584b (the last stage) of the two-stage cascade inter-chip receiver is an inverter composed of an NMOS transistor 751c and a PMOS transistor 751d. The size of the NMOS transistor 751c is larger than that of the NMOS transistor 751a, and the size of the PMOS transistor 751d is larger than that of the PMOS transistor 751b. The gates of the NMOS transistor 751a and the PMOS transistor 751b serve as an input node that is the first node FN1 of the inter-chip buffer 701a. The drains of the NMOS transistor 751c and the PMOS transistor 751d serve as an output node that is the second node SN1 of the inter-chip buffer 701a. The drains of the NMOS transistor 751a and the PMOS transistor 751b are connected to the gates of the NMOS transistor 751c and the PMOS transistor 751d.

Referring to FIG. 86, the inter-chip circuit 200b of the chip 700 may include an inter-chip buffer 702a and an inter-chip ESD (electro static discharge) circuit 702b. The inter-chip buffer 702a has a first node FN2 and a second node SN2, and the inter-chip ESD circuit 702b has a node En connected to the second node SN2. The inter-chip buffer 702a can be an inter-chip driver which can be an inverter composed of an NMOS transistor 752a and a PMOS transistor 752b. The gates of the NMOS transistor 752a and the PMOS transistor 752b serve as an input node that is the first node FN2 of the inter-chip buffer 702a. The drains of the NMOS transistor 752a and the PMOS transistor 752b serve as an output node that is the second node SN2 of the inter-chip buffer 702a.

Figure 88:
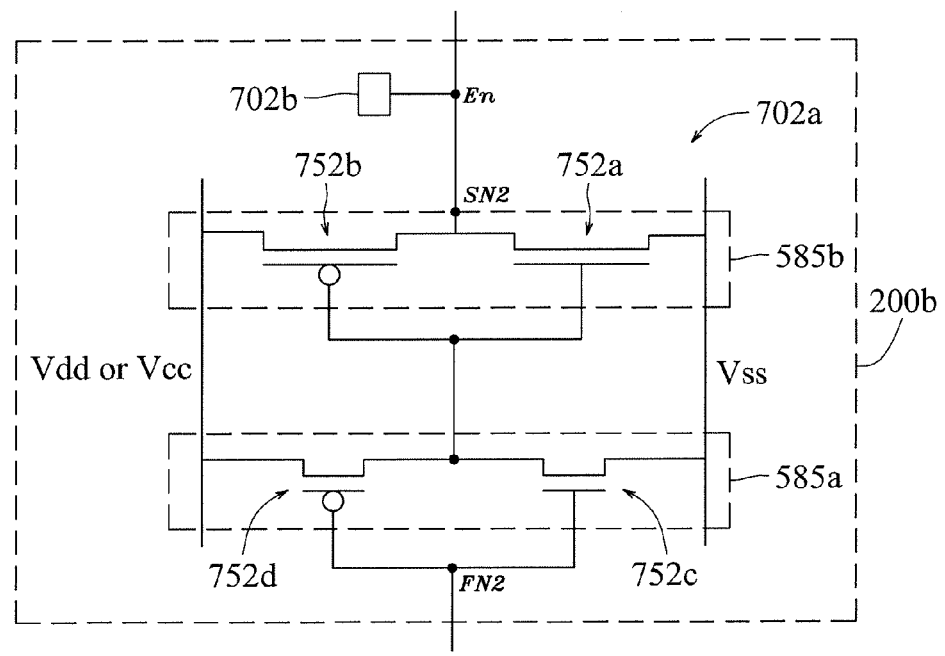
FIGS. 88 and 89 show inter-chip circuits each including a two-stage cascade inter-chip driver and an inter-chip ESD (electro static discharge) circuit, according to an embodiment of the present disclosure.

Alternatively, the inter-chip buffer 702a can be a multi-stage cascade inter-chip driver including several stages of inverters. For example, referring to FIG. 88, the inter-chip buffer 702a can be a two-stage cascade inter-chip driver. The first stage 585a of the two-stage cascade inter-chip driver is an inverter composed of an NMOS transistor 752c and a PMOS transistor 752d, and the second stage 585b (the last stage) of the two-stage cascade inter-chip driver is an inverter composed of the NMOS transistor 752a and the PMOS transistor 752b. The size of the NMOS transistor 752a is larger than that of the NMOS transistor 752c, and the size of the PMOS transistor 752b is larger than that of the PMOS transistor 752d. The gates of the NMOS transistor 752c and the PMOS transistor 752d serve as an input node that is the first node FN2 of the inter-chip buffer 702a. The drains of the NMOS transistor 752a and the PMOS transistor 752b serve as an output node that is the second node SN2 of the inter-chip buffer 702a. The drains of the NMOS transistor 752c and the PMOS transistor 752d are connected to the gates of the NMOS transistor 752a and the PMOS transistor 752b.

Referring to FIG. 86, the inter-chip circuit 200e of the chip 800 may include an inter-chip buffer 703a and an inter-chip ESD (electro static discharge) circuit 703b. The inter-chip buffer 703a has a first node FN3 and a second node SN3, and the inter-chip ESD circuit 703b has a node En connected to the second node SN3. The inter-chip buffer 703a can be an inter-chip driver which can be an inverter composed of an NMOS transistor 753a and a PMOS transistor 753b. The gates of the NMOS transistor 753a and the PMOS transistor 753b serve as an input node that is the first node FN3 of the inter-chip buffer 703a. The drains of the NMOS transistor 753a and the PMOS transistor 753b serve as an output node that is the second node SN3 of the inter-chip buffer 703a.

Figure 89:
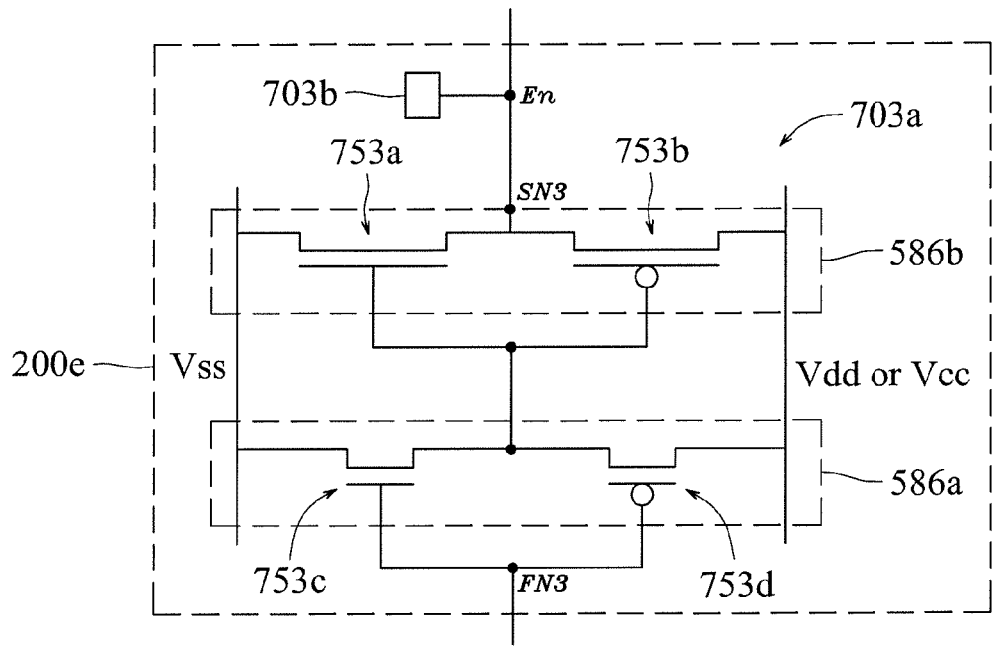

Alternatively, the inter-chip buffer 703a can be a multi-stage cascade inter-chip driver including several stages of inverters. For example, referring to FIG. 89, the inter-chip buffer 703a can be a two-stage cascade inter-chip driver. The first stage 586a of the two-stage cascade inter-chip driver is an inverter composed of an NMOS transistor 753c and a PMOS transistor 753d, and the second stage 586b (the last stage) of the two-stage cascade inter-chip driver is an inverter composed of the NMOS transistor 753a and the PMOS transistor 753b. The size of the NMOS transistor 753a is larger than that of the NMOS transistor 753c, and the size of the PMOS transistor 753b is larger than that of the PMOS transistor 753d. The gates of the NMOS transistor 753c and the PMOS transistor 753d serve as an input node that is the first node FN3 of the inter-chip buffer 703a. The drains of the NMOS transistor 753a and the PMOS transistor 753b serve as an output node that is the second node SN3 of the inter-chip buffer 703a. The drains of the NMOS transistor 753c and the PMOS transistor 753d are connected to the gates of the NMOS transistor 753a and the PMOS transistor 753b.

Referring to FIG. 86, the inter-chip circuit 200f of the chip 800 may include an inter-chip buffer 704a and an inter-chip ESD (electro static discharge) circuit 704b. The inter-chip buffer 704a has a first node FN4 and a second node SN4, and the inter-chip ESD circuit 704b has a node En connected to the first node FN4. The inter-chip buffer 704a can be an inter-chip receiver which can be an inverter composed of an NMOS transistor 754a and a PMOS transistor 754b. The gates of the NMOS transistor 754a and the PMOS transistor 754b serve as an input node that is the first node FN4 of the inter-chip buffer 704a. The drains of the NMOS transistor 754a and the PMOS transistor 754b serve as an output node that is the second node SN4 of the inter-chip buffer 704a.

Figure 90:
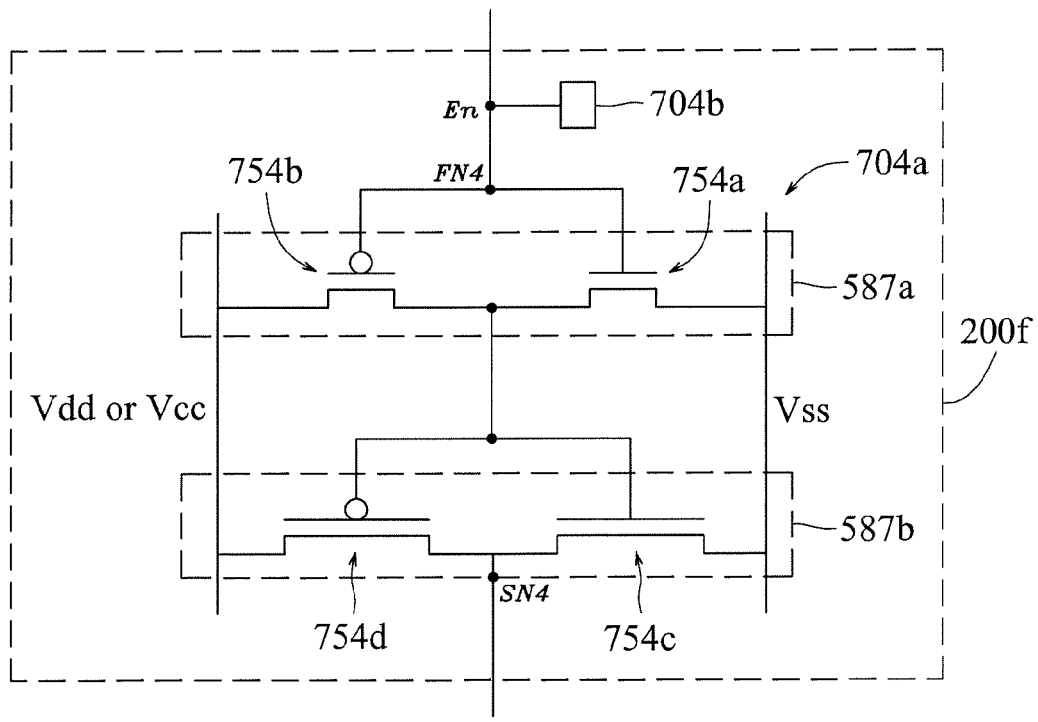

Alternatively, the inter-chip buffer 704a can be a multi-stage cascade inter-chip receiver including several stages of inverters. For example, referring to FIG. 90, the inter-chip buffer 704a can be a two-stage cascade inter-chip receiver. The first stage 587a of the two-stage cascade inter-chip receiver is an inverter composed of the NMOS transistor 754a and the PMOS transistor 754b, and the second stage 587b (the last stage) of the two-stage cascade inter-chip receiver is an inverter composed of an NMOS transistor 754c and a PMOS transistor 754d. The size of the NMOS transistor 754c is larger than that of the NMOS transistor 754a, and the size of the PMOS transistor 754d is larger than that of the PMOS transistor 754b. The gates of the NMOS transistor 754a and the PMOS transistor 754b serve as an input node that is the first node FN4 of the inter-chip buffer 704a. The drains of the NMOS transistor 754c and the PMOS transistor 754d serve as an output node that is the second node SN4 of the inter-chip buffer 704a. The drains of the NMOS transistor 754a and the PMOS transistor 754b are connected to the gates of the NMOS transistor 754c and the PMOS transistor 754d.

Referring to FIG. 86, the off-chip circuit 57a of the chip 700 may include an off-chip buffer 58a and an off-chip ESD (electro static discharge) circuit 59a. The off-chip buffer 58a has a first node FN5 and a second node SN5, and the off-chip ESD circuit 59a has a node En connected to the first node FN5. The off-chip buffer 58a can be an off-chip receiver which can be an inverter composed of an NMOS transistor 4205 and a PMOS transistor 4206. The gates of the NMOS transistor 4205 and the PMOS transistor 4206 serve as an input node that is the first node FN5 of the off-chip buffer 58a. The drains of the NMOS transistor 4205 and the PMOS transistor 4206 serve as an output node that is the second node SN5 of the off-chip buffer 58a.

Figure 91:
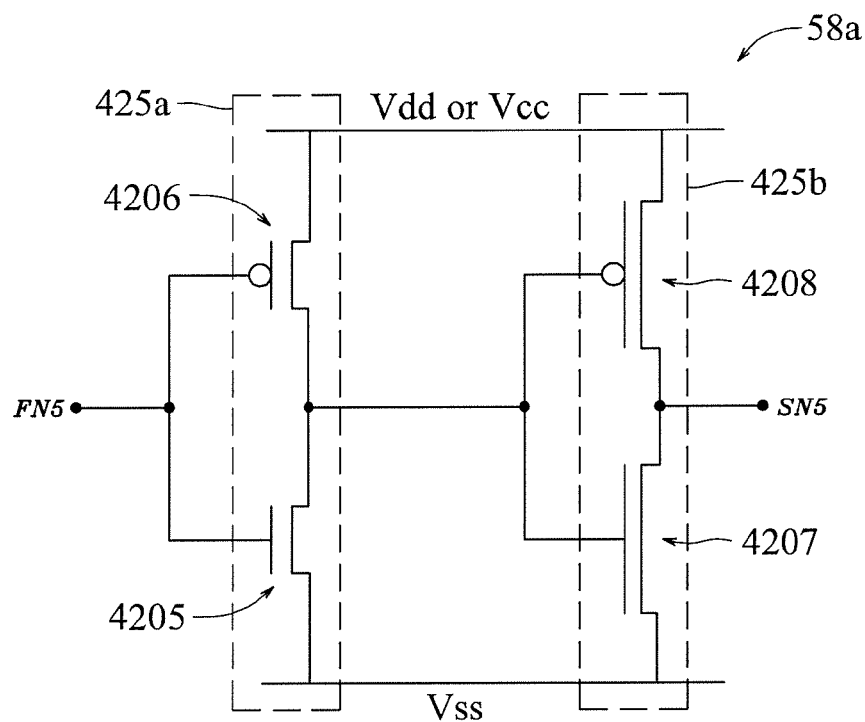
FIGS. 91 and 94 show two-stage cascade off-chip receivers, according to an embodiment of the present disclosure.

Alternatively, the off-chip buffer 58a can be a multi-stage cascade off-chip receiver including several stages of inverters. For example, referring to FIG. 91, the off-chip buffer 58a can be a two-stage cascade off-chip receiver. The first stage 425a of the two-stage cascade off-chip receiver is an inverter composed of the NMOS transistor 4205 and the PMOS transistor 4206, and the second stage 425b (the last stage) of the two-stage cascade off-chip receiver is an inverter composed of an NMOS transistor 4207 and a PMOS transistor 4208. The size of the NMOS transistor 4207 is larger than that of the NMOS transistor 4205, and the size of the PMOS transistor 4208 is larger than that of the PMOS transistor 4206. The gates of the NMOS transistor 4205 and the PMOS transistor 4206 serve as an input node that is the first node FN5 of the off-chip buffer 58a. The drains of the NMOS transistor 4207 and the PMOS transistor 4208 serve as an output node that is the second node SN5 of the off-chip buffer 58a. The drains of the NMOS transistor 4205 and the PMOS transistor 4206 are connected to the gates of the NMOS transistor 4207 and the PMOS transistor 4208.

Referring to FIG. 86, the off-chip circuit 57b of the chip 700 may include an off-chip buffer 58b and an off-chip ESD (electro static discharge) circuit 59b. The off-chip buffer 58b has a first node FN6 and a second node SN6, and the off-chip ESD circuit 59b has a node En connected to the second node SN6. The off-chip buffer 58b can be an off-chip driver which can be an inverter composed of an NMOS transistor 4203 and a PMOS transistor 4204. The gates of the NMOS transistor 4203 and the PMOS transistor 4204 serve as an input node that is the first node FN6 of the off-chip buffer 58b, and the drains of the NMOS transistor 4203 and the PMOS transistor 4204 serve as an output node that is the second node SN6 of the off-chip buffer 58b.

Figure 92:
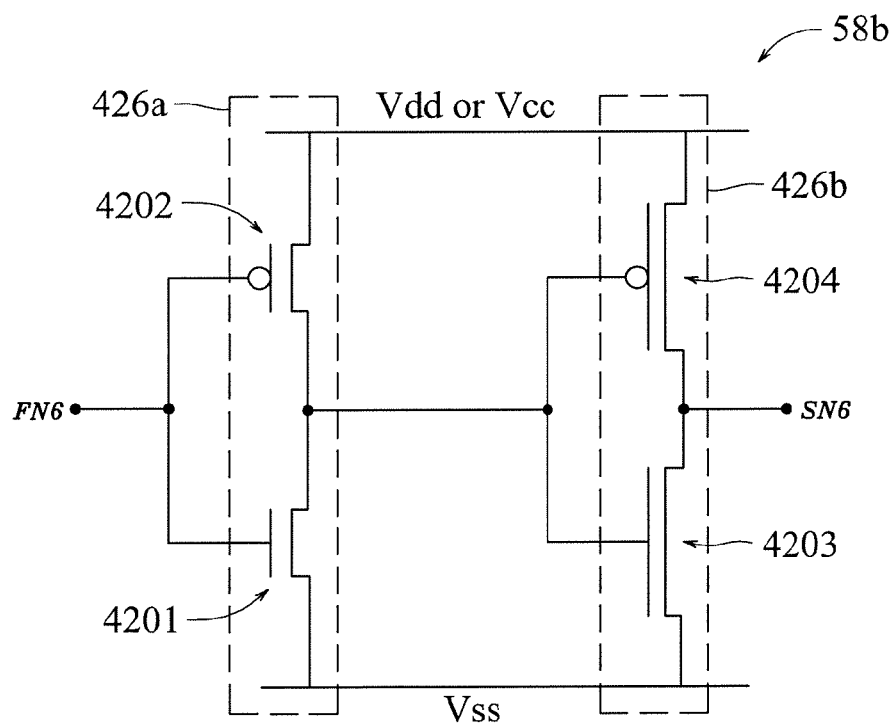
FIGS. 92 and 93 show two-stage cascade off-chip drivers, according to an embodiment of the present disclosure.

Alternatively, the off-chip buffer 58b can be a multi-stage cascade off-chip driver including several stages of inverters. For example, referring to FIG. 92, the off-chip buffer 58b can be a two-stage cascade off-chip driver. The first stage 426a of the two-stage cascade off-chip driver is an inverter composed of an NMOS transistor 4201 and a PMOS transistor 4202, and the second stage 426b (the last stage) of the two-stage cascade off-chip driver is an inverter composed of the NMOS transistor 4203 and the PMOS transistor 4204. The size of the NMOS transistor 4203 is larger than that of the NMOS transistor 4201, and the size of the PMOS transistor 4204 is larger than that of the PMOS transistor 4202. The gates of the NMOS transistor 4201 and the PMOS transistor 4202 serve as an input node that is the first node FN6 of the off-chip buffer 58b. The drains of the NMOS transistor 4203 and the PMOS transistor 4204 serve as an output node that is the second node SN6 of the off-chip buffer 58b. The drains of the NMOS transistor 4201 and the PMOS transistor 4202 are connected to the gates of the NMOS transistor 4203 and the PMOS transistor 4204.

Referring to FIG. 86, the off-chip circuit 57c of the chip 800 may include an off-chip buffer 58c and an off-chip ESD (electro static discharge) circuit 59c. The off-chip buffer 58c has a first node FN7 and a second node SN7, and the off-chip ESD circuit 59c has a node En connected to the second node SN7. The off-chip buffer 58c can be an off-chip driver which can be an inverter composed of an NMOS transistor 4303 and a PMOS transistor 4304. The gates of the NMOS transistor 4303 and the PMOS transistor 4304 serve as an input node that is the first node FN7 of the off-chip buffer 58c. The drains of the NMOS transistor 4303 and the PMOS transistor 4304 serve as an output node that is the second node SN7 of the off-chip buffer 58c.

Figure 93:
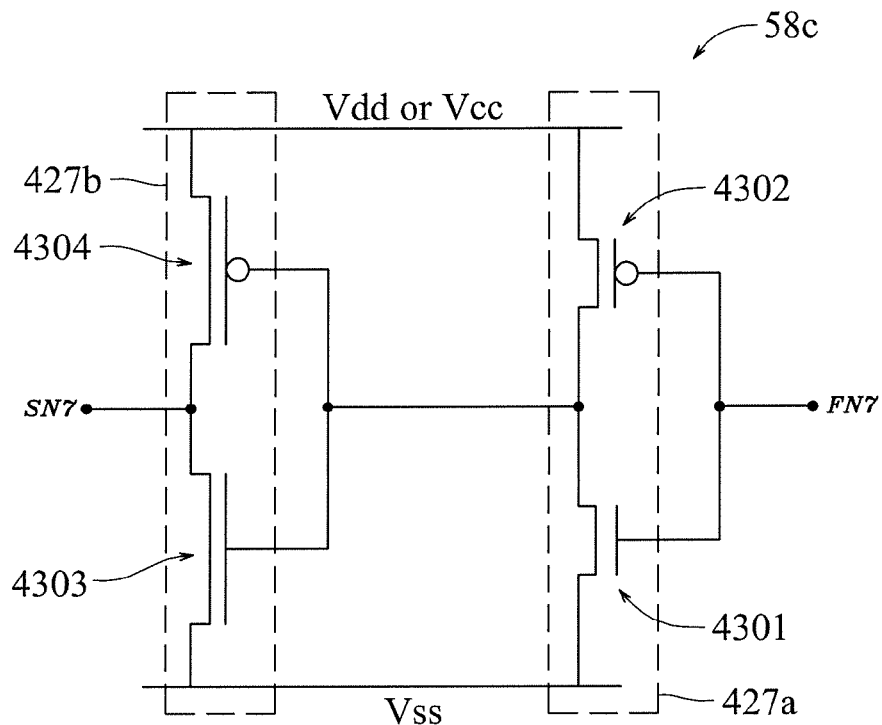

Alternatively, the off-chip buffer 58c can be a multi-stage cascade off-chip driver including several stages of inverters. For example, referring to FIG. 93, the off-chip buffer 58c can be a two-stage cascade off-chip driver. The first stage 427a of the two-stage cascade off-chip driver is an inverter composed of an NMOS transistor 4301 and a PMOS transistor 4302, and the second stage 427b (the last stage) of the two-stage cascade off-chip driver is an inverter composed of the NMOS transistor 4303 and the PMOS transistor 4304. The size of the NMOS transistor 4303 is larger than that of the NMOS transistor 4301, and the size of the PMOS transistor 4304 is larger than that of the PMOS transistor 4302. The gates of the NMOS transistor 4301 and the PMOS transistor 4302 serve as an input node that is the first node FN7 of the off-chip buffer 58c. The drains of the NMOS transistor 4303 and the PMOS transistor 4304 serve as an output node that is the second node SN7 of the off-chip buffer 58c. The drains of the NMOS transistor 4301 and the PMOS transistor 4302 are connected to the gates of the NMOS transistor 4303 and the PMOS transistor 4304.

Referring to FIG. 86, the off-chip circuit 57d of the chip 800 may include an off-chip buffer 58d and an off-chip ESD (electro static discharge) circuit 59d. The off-chip buffer 58d has a first node FN8 and a second node SN8, and the off-chip ESD circuit 59d has a node En connected to the first node FN8. The off-chip buffer 58d can be an off-chip receiver which can be an inverter composed of an NMOS transistor 4305 and a PMOS transistor 4306. The gates of the NMOS transistor 4305 and the PMOS transistor 4306 serve as an input node that is the first node FN8 of the off-chip buffer 58d. The drains of the NMOS transistor 4305 and the PMOS transistor 4306 serve as an output node that is the second node SN8 of the off-chip buffer 58d.

Figure 94:
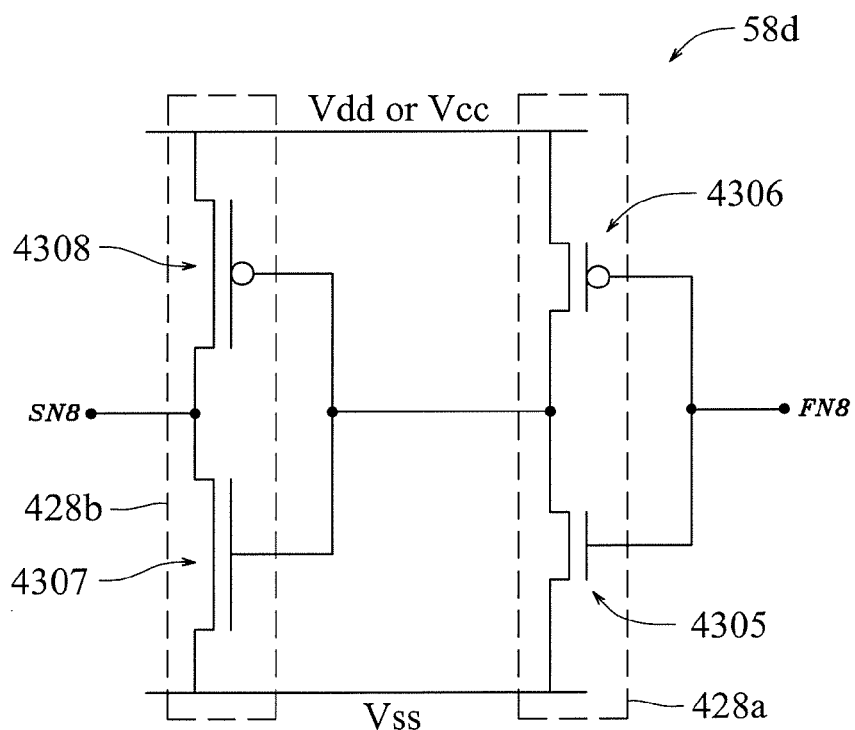

Alternatively, the off-chip buffer 58d can be a multi-stage cascade off-chip receiver including several stages of inverters. For example, referring to FIG. 94, the off-chip buffer 58d can be a two-stage cascade off-chip receiver. The first stage 428a of the two-stage cascade off-chip receiver is an inverter composed of the NMOS transistor 4305 and the PMOS transistor 4306, and the second stage 428b (the last stage) of the two-stage cascade off-chip receiver is an inverter composed of an NMOS transistor 4307 and a PMOS transistor 4308. The size of the NMOS transistor 4307 is larger than that of the NMOS transistor 4305, and the size of the PMOS transistor 4308 is larger than that of the PMOS transistor 4306. The gates of the NMOS transistor 4305 and the PMOS transistor 4306 serve as an input node that is the first node FN8 of the off-chip buffer 58d. The drains of the NMOS transistor 4307 and the PMOS transistor 4308 serve as an output node that is the second node SN8 of the off-chip buffer 58d. The drains of the NMOS transistor 4305 and the PMOS transistor 4306 are connected to the gates of the NMOS transistor 4307 and the PMOS transistor 4308.

Figure 95:
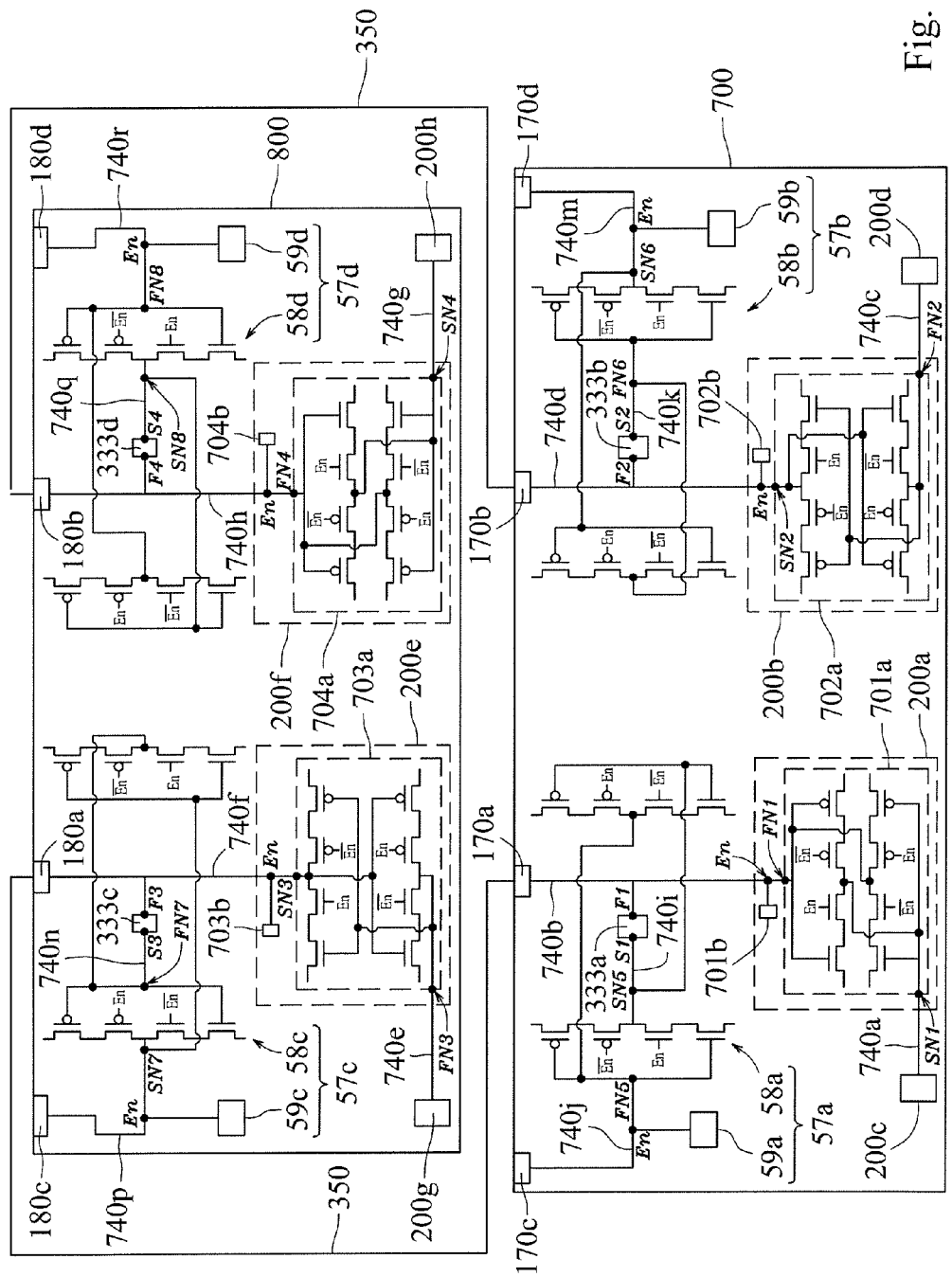

FIG. 95 is another example of a circuit diagram showing interface circuits between the chips 700 and 800. The circuit diagram shown in FIG. 95 is similar to that shown in FIG. 86 except that the inter-chip buffers 701a, 702a, 703a and 704a are designed with inter-chip tri-state buffers each including a tri-state driver and a tri-state receiver, instead of the inter-chip receivers and drivers, and the off-chip buffers 58a, 58b, 58c and 58d are designed with off-chip tri-state buffers each including a tri-state driver and a tri-state receiver, instead of the off-chip receivers and drivers. In FIG. 95, the inter-chip buffer 701a of the chip 700 can be an inter-chip tri-state buffer having a first I/O (input/output) node serving as the first node FN1 of the inter-chip buffer 701a, and having a second I/O node serving as the second node SN1 of the inter-chip buffer 701a. The inter-chip buffer 702a of the chip 700 can be an inter-chip tri-state buffer having a first I/O node serving as the first node FN2 of the inter-chip buffer 702a, and having a second I/O node serving as the second node SN2 of the inter-chip buffer 702a. The inter-chip buffer 703a of the chip 800 can be an inter-chip tri-state buffer having a first I/O node serving as the first node FN3 of the inter-chip buffer 703a, and having a second I/O node serving as the second node SN3 of the inter-chip buffer 703a. The inter-chip buffer 704a of the chip 800 can be an inter-chip tri-state buffer having a first I/O node serving as the first node FN4 of the inter-chip buffer 704a, and having a second I/O node serving as the second node SN4 of the inter-chip buffer 704a. The off-chip buffer 58a of the chip 700 can be an off-chip tri-state buffer having a first I/O node serving as the first node FN5 of the off-chip buffer 58a, and having a second I/O node serving as the second node SN5 of the off-chip buffer 58a. The off-chip buffer 58b of the chip 700 can be an off-chip tri-state buffer having a first I/O node serving as the first node FN6 of the off-chip buffer 58b, and having a second I/O node serving as the second node SN6 of the off-chip buffer 58b. The off-chip buffer 58c of the chip 800 can be an off-chip tri-state buffer having a first I/O node serving as the first node FN7 of the off-chip buffer 58c, and having a second I/O node serving as the second node SN7 of the off-chip buffer 58c. The off-chip buffer 58d of the chip 800 can be an off-chip tri-state buffer having a first I/O node serving as the first node FN8 of the off-chip buffer 58d, and having a second I/O node serving as the second node SN8 of the off-chip buffer 58d.

Referring to FIG. 86 or 95, each of the internal circuits 200c, 200d, 200g and 200h can be a NOR gate, a NAND gate, an AND gate, an OR gate, an operational amplifier, a flash memory cell, a static-random-access-memory (SRAM) cell, a dynamic-random-access-memory (DRAM) cell, a non-volatile memory cell, an erasable programmable read-only memory (EPROM) cell, a read-only memory (ROM) cell, a magnetic random access memory (MRAM) cell, a sense amplifier, an analog-to-digital (A/D) converter, a digital-to-analog (D/A) converter, an inverter, an adder, a multiplexer, a diplexer, a multiplier, a complementary-metal-oxide-semiconductor (CMOS) device, a bi-polar CMOS device, a bipolar circuit or an analog circuit. Each of the internal circuits 200c, 200d, 200g and 200h may include a NMOS transistor (n-type metal-oxide-semiconductor transistor) having a ratio of a physical channel width thereof to a physical channel length thereof ranging from, e.g., about 0.1 and 20, ranging from, e.g., about 0.1 and 10 or ranging from, e.g., about 0.2 and 2. Alternatively, each of the internal circuits 200c, 200d, 200g and 200h may include a PMOS transistor (p-type metal-oxide-semiconductor transistor) having a ratio of a physical channel width thereof to a physical channel length thereof ranging from, e.g., about 0.2 and 40, ranging from, e.g., about 0.2 and 20 or ranging from, e.g., about 0.4 and 4. Each of the inter-chip ESD circuits 701b, 702b, 703b and 704b and each of the off-chip ESD circuits 59a, 59b, 59c and 59d may include one or more ESD (electro static discharge) units each composed of two reverse-biased diodes or of a PMOS transistor and an NMOS transistor.

The first node FN1 of the inter-chip buffer 701a can be connected to the node En of the inter-chip ESD circuit 701b, to a first terminal F1 of the testing interface circuit 333a through a metal interconnect 740b of the chip 700, and to a metal trace or pad 170a of the chip 700 through the metal interconnect 740b. The metal trace or pad 170a is connected to a metal trace or pad 180a of the chip 800 through one of the metal interconnects 350. The second node SN1 of the inter-chip buffer 701a can be connected to the internal circuit 200c through a metal interconnect 740a of the chip 700.

The first node FN2 of the inter-chip buffer 702a can be connected to the internal circuit 200d through a metal interconnect 740c of the chip 700. The second node SN2 of the inter-chip buffer 702a can be connected to the node En of the inter-chip ESD circuit 702b, to a first terminal F2 of the testing interface circuit 333b through a metal interconnect 740d of the chip 700, and to a metal trace or pad 170b of the chip 700 through the metal interconnect 740d. The metal trace or pad 170b is connected to a metal trace or pad 180b of the chip 800 through another one of the metal interconnects 350.

The first node FN3 of the inter-chip buffer 703a can be connected to the internal circuit 200g through a metal interconnect 740e of the chip 800. The second node SN3 of the inter-chip buffer 703a can be connected to the node En of the inter-chip ESD circuit 703b, to a first terminal F3 of the testing interface circuit 333c through a metal interconnect 740f of the chip 800, and to the metal pad or trace 180a of the chip 800 through the metal interconnect 740f.

The first node FN4 of the inter-chip buffer 704a can be connected to the node En of the inter-chip ESD circuit 704b, to a first terminal F4 of the testing interface circuit 333d through a metal interconnect 740h of the chip 800, and to the metal trace or pad 180b of the chip 800 through the metal interconnect 740h. The second node SN4 of the inter-chip buffer 704a can be connected to the internal circuit 200h through a metal interconnect line 740g of the chip 800.

The first node FN5 of the off-chip buffer 58a can be connected to the node En of the off-chip ESD circuit 59a, and to a metal trace or pad 170c of the chip 700 through a metal interconnect 740j of the chip 700. The second node SN5 of the off-chip buffer 58a can be connected to a second terminal S1 of the testing interface circuit 333a through a metal interconnect 740i of the chip 700.

The first node FN6 of the off-chip buffer 58b can be connected to a second terminal S2 of the testing interface circuit 333b through a metal interconnect 740k of the chip 700. The second node SN6 of the off-chip buffer 58b can be connected to the node En of the off-chip ESD circuit 59b, and to a metal trace or pad 170d of the chip 700 through a metal interconnect 740m of the chip 700.

The first node FN7 of the off-chip buffer 58c can be connected to a second terminal S3 of the testing interface circuit 333c through a metal interconnect 740n of the chip 800. The second node SN7 of the off-chip buffer 58c can be connected to the node En of the off-chip ESD circuit 59c, and to a metal trace or pad 180c of the chip 800 through a metal interconnect 740p of the chip 800.

The first node FN8 of the off-chip buffer 58d can be connected to the node En of the off-chip ESD circuit 59d, and to a metal trace or pad 180d of the chip 800 through a metal interconnect 740r of the chip 800.

The four metal traces or pads 170a-170d of the chip 700 can be four of the metal traces or pads 26 of one of the chips 120 shown in FIG. 52, 54, 55, 66, 67, 72, 73, 74, 83, 84, 104, 107K, 107L, 108F or 109T, and the four metal traces or pads 180a-180d of the chip 800 can be four of the metal traces or pads 26 of another one of the chips 120 shown in FIG. 52, 54, 55, 66, 67, 72, 73, 74, 83, 84, 104, 107K, 107L, 108F or 109T, can be four of the metal traces or pads 46 of one of the chips 130 shown in FIG. 52, 54, 55, 66, 67, 72, 73, 74, 83, 84, 104, 107K, 107L, 108F or 109T, or can be four of the metal traces or pads 66 of one of the chips 140 shown in FIG. 52, 54, 55, 66, 67, 72, 73, 74, 83, 84, 104, 107K, 107L, 108F or 109T. Alternatively, the four metal traces or pads 170a-170d of the chip 700 can be four of the metal traces or pads 46 of one of the chips 130 shown in FIG. 52, 54, 55, 66, 67, 72, 73, 74, 83, 84, 104, 107K, 107L, 108F or 109T, and the four metal traces or pads 180a-180d of the chip 800 can be four of the metal traces or pads 46 of another one of the chips 130 shown in FIG. 52, 54, 55, 66, 67, 72, 73, 74, 83, 84, 104, 107K, 107L, 108F or 109T. Alternatively, the four metal traces or pads 170a-170d of the chip 700 can be four of the metal traces or pads 66 of one of the chips 140 shown in FIG. 52, 54, 55, 66, 67, 72, 73, 74, 83, 84, 85, 104, 107K, 107L, 108F or 109T, and the four metal traces or pads 180a-180d of the chip 800 can be four of the metal traces or pads 66 of another one of the chips 140 shown in FIG. 52, 54, 55, 66, 67, 72, 73, 74, 83, 84, 85, 104, 107K, 107L, 108F or 109T. Alternatively, the four metal traces or pads 180a-180d of the chip 800 can be four of the metal traces or pads 163 of the chip 160 shown in FIG. 72 or 73, and the four metal traces or pads 170a-170d of the chip 700 can be four of the metal traces or pads 26 of one of the chips 120 shown in FIG. 72 or 73, four of the metal traces or pads 46 of one of the chips 130 shown in FIG. 72 or 73, or four of the metal traces or pads 66 of one of the chips 140 shown in FIG. 72 or 73.

The metal traces or pads 170a-170d and 180a-180d may include aluminum or electroplated copper. The metal traces or pads 170c, 170d, 180c and 180d, for example, can be connected to an external circuit, such as mother board, printed circuit board, metal substrate, glass substrate or ceramic substrate, through the solder bumps or balls 29a shown in FIG. 52, 55, 66, 72, 83 or 84, through the solder bumps or balls 845 shown in FIG. 104 or through the metal pillars or bumps 39 shown in FIG. 54, 67 or 73. Alternatively, the metal traces or pads 170c, 170d, 180c and 180d can be connected to the ball-grid-array (BGA) substrate 810 shown in FIG. 74 through the wirebonded wires 830 shown in FIG. 74. Alternatively, the metal traces or pads 170c, 170d, 180c and 180d can be connected to the circuit board 999 shown in FIG. 85 through the solder bumps 650 shown in FIG. 85.

The small inter-chip buffer 701a or 702a, such as inter-chip driver, inter-chip receiver or inter-chip tri-state buffer, may be designed just like an internal buffer, such as internal driver, internal receiver or internal tri-state buffer, respectively, used for long interconnection within the chip 700, that is, the long interconnection connects multiple transistors in long distance within the chip 700. The small inter-chip buffer 703a or 704a, such as inter-chip driver, inter-chip receiver or inter-chip tri-state buffer, may be designed just like an internal buffer, such as internal driver, internal receiver or internal tri-state buffer, respectively, used for long interconnection within the chip 800, that is, the long interconnection connects multiple transistors in long distance within the chip 800. The small inter-chip buffers 701a, 702a, 703a and 704a may be designed on both the chip 700 and the chip 800 for a signal, clock, power or ground connection between the chip 800 and the chip 700. The number of inter-chip buffers including the inter-chip buffers 701a and 702a on the chip 700 may be equal to or more than, e.g., 512, and preferably equal to or more than, e.g., 1024. The number of inter-chip buffers including the inter-chip buffers 703a and 704a on the chip 800 may be equal to or more than, e.g., 512, and preferably equal to or more than, e.g., 1024.

The large off-chip buffers 58a, 58b, 58c and 58d, such as off-chip drivers, off-chip receivers or off-chip tri-sate buffers, are designed on both the chip 700 and the chip 800 for circuit testing and/or for signal, clock, power or ground connection, for example, to a mother board, a printed circuit board, a metal substrate, a glass substrate or a ceramic substrate through the solder bumps or balls 29a shown in FIG. 52, 55, 66, 72, 83 or 84, or through the metal pillars or bumps 39 shown in FIG. 54, 67 or 73, to the ball-grid-array (BGA) substrate 810 shown in FIG. 74 through the wirebonded wires 830 shown in FIG. 74, or to the circuit board 999 shown in FIG. 85 through the solder bumps 650 shown in FIG. 85. The testing circuit is either (i) the wafer level testing performed before the chip 700 or 800 is sawed or diced apart from a wafer, or (ii) the package level testing (the final testing) after the chips 700 and 800 are connected to each other.

The testing interface circuits 333a and 333b are designed on the chip 700, and the testing interface circuits 333c and 333d are designed on the chip 800. The output capacitance at the first terminal F1 or F4 of the testing interface circuit 333a or 333d shown in FIG. 86 as seen from the inter-chip buffer 701a or 704a is less than 2 pF, exemplary less than 1 pF or less than 0.2 pF. The output loading capacitance of the first terminal F1 or F4 of the testing interface circuit 333a or 333d shown in FIG. 86 is less than 2 pF, exemplary less than 1 pF or less than 0.2 pF. The input capacitance at the first terminal F2 or F3 of the testing interface circuit 333b or 333c shown in FIG. 86 as seen from the inter-chip buffer 702a or 703a is less than 2 pF, exemplary less than 1 pF or less than 0.2 pF. The input loading capacitance of the first terminal F2 or F3 of the testing interface circuit 333b or 333c shown in FIG. 86 is less than 2 pF, exemplary less than 1 pF or less than 0.2 pF. The input or output capacitance at the first terminal F1, F2, F3 or F4 of the testing interface circuit 333a, 333b, 333c or 333d shown in FIG. 95 as seen from the inter-chip buffer 701a, 702a, 703a or 704a is less than 2 pF, exemplary less than 1 pF or less than 0.2 pF. The input or output loading capacitance of the first terminal F1, F2, F3 or F4 of the testing interface circuit 333a, 333b, 333c or 333d shown in FIG. 95 is less than 2 pF, exemplary less than 1 pF or less than 0.2 pF. Each of the test interface circuits 333a, 333b, 333c and 333d shown in FIG. 86 or 95 can be a scan test circuit, and the scan test circuit can be used for scan testing performed at the wafer level testing, via the metal traces or pads 170a-170d and 180a-180d connecting with testing probes, before the chip 700 or 800 is sawed or diced apart from a wafer or at the package level testing (the final testing) after the chips 700 and 800 are connected to each other. The scan test circuit is used to test flip flops by input the scan-in signal or output the scan-out signal.

Referring to FIG. 86 or 95, the metal interconnects 350 can be used for clock lines or interconnects, or for signal lines or interconnects, such as bit lines, bit interconnects, address lines or address interconnects.

The total number of bit lines or bit interconnects, provided by two of the metal interconnects 350, in parallel data communication between the chips 700 and 800 can be two, for example, as shown in FIG. 86 or 95. In this case, the bit width of the parallel data communication between the chips 700 and 800 is two. Alternatively, the total number of the bit lines or bit interconnects, provided by the metal interconnects 350, in parallel data communication between the chips 700 and 800 can be equal to or more than 4, 8, 16, 32, 64, 128, 256, 512 or 1024; that means the bit width of the parallel data communication can be equal to or more than 4, 8, 16, 32, 64, 128, 256, 512 or 1024. Note that, in these alternatives, only two bit lines or bit interconnects 350 (and their corresponding inter-chip buffers 701a, 702a, 703a and 704a) are shown in FIG. 86 or 95, and other bit lines or bit interconnects (and their corresponding inter-chip buffers) are not shown in FIG. 86 or 95, but they (and their corresponding inter-chip buffers) are designed as same as the two bit lines or bit interconnects 350 (and their corresponding inter-chip buffers 701a, 702a, 703a and 704a) shown in FIG. 86 or 95. Each of the metal interconnects 350 used for the bit lines or bit interconnects connects one of the inter-chip buffers 701a and 702a of the chip 700 to one of the inter-chip buffers 703a and 704a of the chip 800. As an example of a case of bit width of 1024, there are 1024 inter-chip buffers, such as 701a or 702a, of the chip 700, connected to 1024 bit lines or bit interconnects, such as 350, and then connected to 1024 inter-chip buffers, such as 703a or 704a, of the chip 800. Accordingly, the total number of the inter-chip buffers 701a and 702a connected with the bit lines or bit interconnects 350 in parallel data communication between the chips 700 and 800 is equal to the total number of the bit lines or bit interconnects 350, and is also equal to the total number of the inter-chip buffers 703a and 703a connected with the bit lines or bit interconnects 350. The data communication of the bit lines or bit interconnects, provided by the metal interconnects 350, between the chips 700 and 800 may have a data bit width equal to or more than e.g., 2, 4, 8, 16, 32, 64, 128, 256, 512 or 1024, and preferably equal to or more than 512 or 1024.

Referring to FIG. 86 or 95, the small inter-chip ESD circuits 701b, 702b, 703b and 704b are used for the small inter-chip buffers 701a, 702a, 703a and 704a between the chips 700 and 800 for electrostatic charge protection during the chip packaging or assembly manufacturing process. Alternatively, no ESD circuit can be required for the small inter-chip buffers 701a, 702a, 703a and 704a between the chips 700 and 800, that is, the inter-chip ESD circuits 701b, 702b, 703b and 704b can be omitted. In other words, there is no ESD circuit connected to the metal interconnects 740b, 740d, 740f and 740h.

The large off-chip ESD circuits 59a, 59b, 59c and 59d required for the large off-chip buffers 58a, 58b, 58c, and 58d are designed on both the chip 700 and the chip 800 for the circuit testing and/or for signal, clock, power or ground connection, for example, to a mother board, a printed circuit board, a metal substrate, a glass substrate or a ceramic substrate through the solder bumps or balls 29a shown in FIG. 52, 55, 66, 72, 83 or 84, or through the metal pillars or bumps 39 shown in FIG. 54, 67 or 73, to the ball-grid-array (BGA) substrate 810 shown in FIG. 74 through the wirebonded wires 830 shown in FIG. 74, or to the circuit board 999 shown in FIG. 85 through the solder bumps 650 shown in FIG. 85. The circuit testing is either (i) the wafer level testing performed before the chip 700 or 800 is sawed or diced apart from a wafer, or (ii) the package level testing (the final testing) after the chips 700 and 800 are connected to each other. The large off-chip ESD circuits 59a, 59b, 59c and 59d are used for electrostatic charge protection during the circuit testing, such as the wafer level testing or the package level testing (the final testing).

The size of the small inter-chip ESD circuit 701b, 702b, 703b or 704b can be less than the size of the large off-chip ESD circuit 59a, 59b, 59c or 59d, respectively. For example, the size of the inter-chip ESD circuit 701b, 702b, 703b or 704b can be defined as the loading or capacitance of the inter-chip ESD circuit 701b, 702b, 703b or 704b, and the size of the off-chip ESD circuit 59a, 59b, 59c or 59d can be defined as the loading or capacitance of the off-chip ESD circuit 59a, 59b, 59c or 59d. In a case, each of the small inter-chip ESD circuits 701b, 702b, 703b and 704b has a size (loading or capacitance) less than 2 pF (pico Farads), such as between 0.01 and 2 pF, exemplary less than 0.5 pF, such as between 0.01 and 0.5 pF, and each of the large off-chip ESD circuits 59a, 59b, 59c and 59d has a size (loading or capacitance) larger than 2 pF, such as between 2 and 100 pF, exemplary larger than 5 pF, such as between 5 and 100 pF. In another case, each of the small inter-chip ESD circuits 701b, 702b, 703b and 704b has a size (loading or capacitance) less than 1 pF, such as between 0.01 and 1 pF, and each of the large off-chip ESD circuits 59a, 59b, 59c and 59d has a size (loading or capacitance) larger than 1 pF, such as between 1 and 100 pF.

Alternatively, the size of the small inter-chip ESD circuit 701b, 702b, 703b or 704b or the size of the large off-chip ESD circuit 59a, 59b, 59c or 59d can be defined as below. An ESD (electro static discharge) circuit, such as the inter-chip ESD circuit 701b, 702b, 703b or 704b or the off-chip ESD circuit 59a, 59b, 59c or 59d, may include one or more ESD units, and each of the ESD units may include a $P^+$ active region and an $N^+$ active region connected to the $P^+$ active region and connected to an I/O (input/output) metal pad or testing metal pad of a chip, such as the metal pad 170a, 170b, 170c, 170d, 180a, 180b, 180c or 180d shown in FIG. 86 or 95. The area of the $P^+$ active region plus the area of the $N^+$ active region equals the active area of each of the ESD units. The total of the active areas of the ESD units equals the active area of the ESD circuit. If the ESD circuit is composed of only one ESD unit, the active area of the ESD circuit equals the active area of the only one ESD unit. If the ESD circuit is composed of multiple ESD units, the active area of the ESD circuit equals the total of the active areas of the ESD units connected in parallel. The active area of the ESD circuit can be used to define the size of the ESD circuit. FIGS. 96-101 show how to calculate the active area of an ESD unit of a chip and define the size of an ESD circuit composed of one or more the ESD units.

Figure 96:
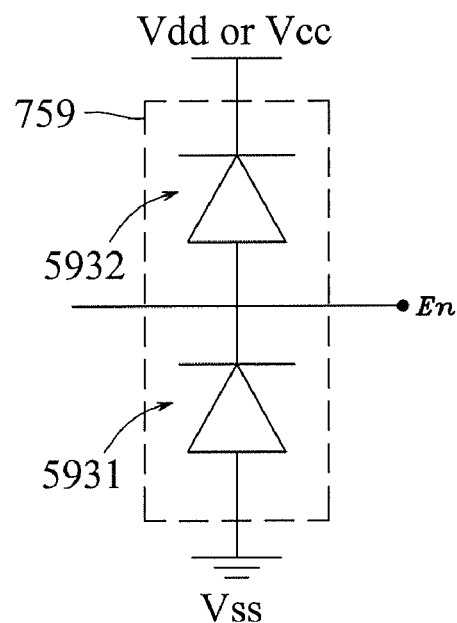
FIGS. 96-101 show how to calculate an active area of an ESD unit of a chip and define a size of an ESD circuit composed of one or more of the ESD units, according to an embodiment of the present disclosure.
Figure 98:
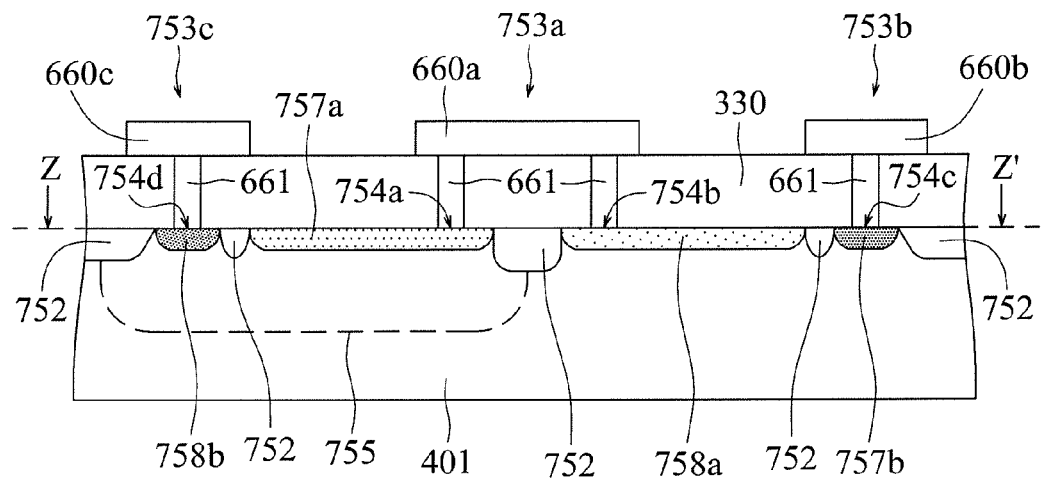

Referring to FIG. 96, an electro static discharge (ESD) unit 759 of a chip can be composed of two reverse-biased diodes 5931 and 5932. FIG. 98 shows a cross-sectional view of the ESD unit 759 shown in FIG. 96, and FIG. 99 is a top perspective view showing the topography of the ESD unit 759 derived from the top surface Z-Z' of a p-type silicon substrate 401 shown in FIG. 98.

Figure 99:
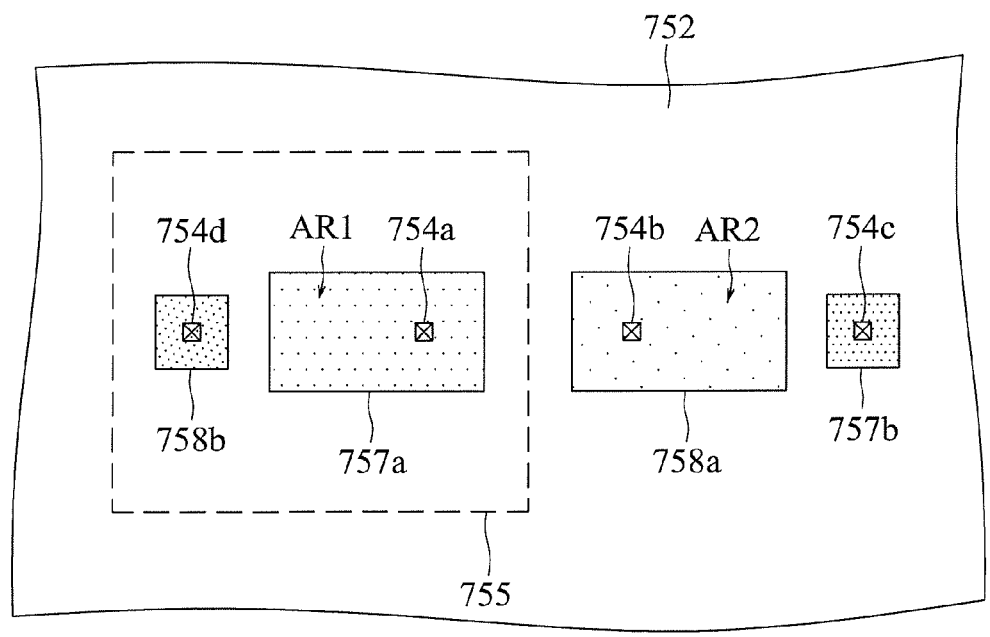

Referring to FIGS. 96, 98 and 99, the ESD unit 759 includes two $P^+$ active regions 757a and 757b and two $N^+$ active regions 758a and 758b. The $P^+$ active region 757a is in an N-well 755 in the p-type silicon substrate 401, and the $N^+$ active region 758a is in the p-type silicon substrate 401. The $P^+$ active region 757a is connected to an I/O metal pad or testing metal pad of the chip, such as the metal pad 170a, 170b, 170c or 170d of the chip 700 shown in FIG. 86 or 95 or the metal pad 180a, 180b, 180c or 180d of the chip 800 shown in FIG. 86 or 95, through a metal interconnect 753a of the chip. The $N^+$ active region 758a is connected to the $P^+$ active region 757a and to the I/O metal pad or the testing metal pad of the chip through the metal interconnect 753a. The metal interconnect 753a includes a fine-line metal layer 660a formed on a dielectric layer 330 over the p-type silicon substrate 401, a first via plug 661 formed on a contact region 754a of the P+ active region 757a and in the dielectric layer 330, and a second via plug 661 formed on a contact region 754b of the N+ active region 758a and in the dielectric layer 330. The P+ active region 757b is in the p-type silicon substrate 401, and the N+ active region 758b is in the N-well 755 in the p-type silicon substrate 401. The P+ active region 757b is connected to a ground bus through a metal interconnect 753b, and the N+ active region 758b is connected to a power bus through a metal interconnect 753c. The metal interconnect 753b contains a fine-line metal layer 660 formed on the dielectric layer 330 over the p-type silicon substrate 401, and a via plug 661 formed on a contact region 754c of the P+ active region 757b and in the dielectric layer 330. The metal interconnect 753c contains a fine-line metal layer 660c formed on the dielectric layer 330 over the p-type silicon substrate 401, and a via plug 661 formed on a contact region 754d of the N+ active region 758b and in the dielectric layer 330.

Referring to FIG. 99, the P+ active region 757a, connected to the I/O metal pad or testing metal pad of the chip, has an area AR1, from a top view, enclosed by a field oxide 752 in the p-type silicon substrate 401. The N+ active region 758a, connected to the I/O metal pad or testing metal pad of the chip, has an area AR2, from a top view, enclosed by the field oxide 752 in the p-type silicon substrate 401. The active area of the ESD unit 759 equals the area AR1 plus the area AR2.

Figure 97:
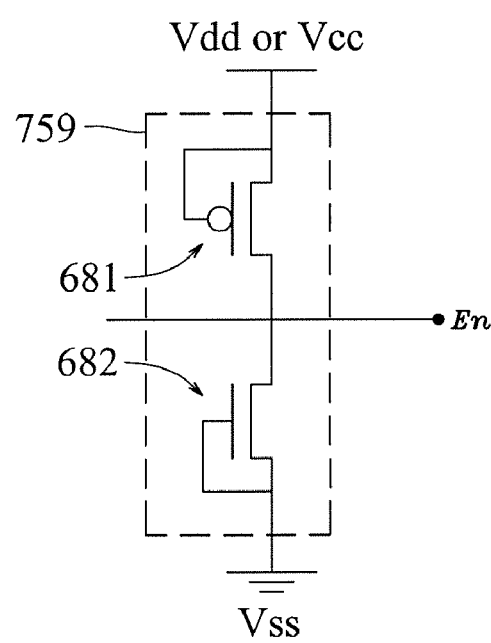
Figure 100:
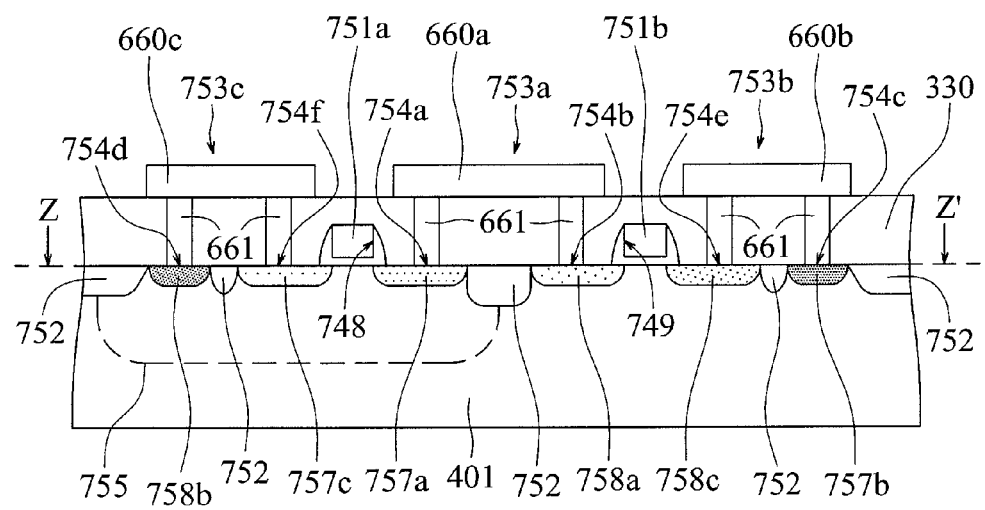

Alternatively, referring to FIG. 97, the ESD unit 759 of the chip can be composed of a PMOS transistor 681 and an NMOS transistor 682. FIG. 100 shows a cross-sectional view of the ESD unit 759 shown in FIG. 97, and FIG. 101 is a top perspective view showing the topography of the ESD unit 759 derived from the top surface Z-Z' of the p-type silicon substrate 401 shown in FIG. 100.

Figure 101:
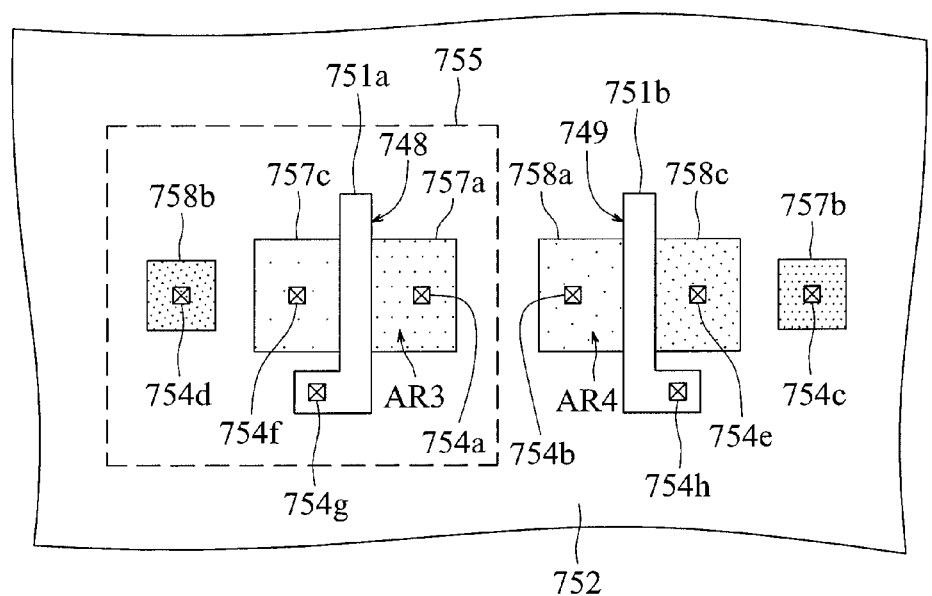

Referring to FIGS. 97, 100 and 101, the PMOS transistor 681 of the ESD unit 759 includes a gate 751a and two P+ active regions 757a and 757c at two opposite sides of the gate 751a, and the NMOS transistor 682 of the ESD unit 759 includes a gate 751b and two N+ active regions 758a and 758c at two opposite sides of the gate 751b. The P+ active region 757a is in an N-well 755 in the p-type silicon substrate 401, and the N+ active region 758a is in the p-type silicon substrate 401. The P+ active region 757a is connected to an I/O metal pad or testing metal pad of the chip, such as the metal pad 170a, 170b, 170c or 170d of the chip 700 shown in FIG. 86 or 95 or the metal pad 180a, 180b, 180c or 180d of the chip 800 shown in FIG. 86 or 95, through a metal interconnect 753a of the chip. The N+ active region 758a is connected to the P+ active region 757a and to the I/O metal pad or the testing metal pad of the chip through the metal interconnect 753a. The metal interconnect 753a contains a fine-line metal layer 660a formed on a dielectric layer 330 over the p-type silicon substrate 401, a first via plug 661 formed on a contact region 754a of the P+ active region 757a and in the dielectric layer 330, and a second via plug 661 formed on a contact region 754b of the N+ active region 758a and in the dielectric layer 330. The P+ active region 757b is in the p-type silicon substrate 401, and the N+ active region 758b is in the N-well 755 in the p-type silicon substrate 401. The P+ active region 757c is in the N-well 755 in the p-type silicon substrate 401, and the N+ active region 758c is in the p-type silicon substrate 401. The N+ active region 758c is connected to a ground bus of the chip through a metal interconnect 753b of the chip and to the P+ active region 757b through the metal interconnect 753b, and the P+ active region 757b is connected to the ground bus through the metal interconnect 753b. The P+ active region 757c is connected to a power bus of the chip through a metal interconnect 753c of the chip and to the N+ active region 758b through the metal interconnect 753c, and the N+ active region 758b is connected to the power bus through the metal interconnect 753c. The metal interconnect 753b contains a fine-line metal layer 660b formed on the dielectric layer 330 over the p-type silicon substrate 401, a first via plug 661 formed on a contact region 754c of the P+ active region 757b and in the dielectric layer 330, and a second via plug 661 formed on a contact region 754e of the N+ active region 758c and in the dielectric layer 330. The metal interconnect 753c contains a fine-line metal layer 660c formed on the dielectric layer 330 over the p-type silicon substrate 401, a first via plug 661 formed on a contact region 754d of the N+ active region 758b, and a second via plug 661 formed on a contact region 754f of the P+ active region 757c. The gate 751a has a contact region 754g connected to the power bus of the chip and to the contact regions 754d and 754f through the metal interconnect 753c. The gate 751b has a contact region 754h connected to the ground bus of the chip and to the contact regions 754c and 754e through the metal interconnect 753b.

Referring to FIG. 101, the P+ active region 757a, connected to the I/O metal pad or testing metal pad of the chip, has an area AR3, from a top view, enclosed by the boundary defined by a sidewall 748 of the gate 751a and the border between a field oxide 752 and the P+ active region 757a. The N+ active region 758a, connected to the I/O metal pad or testing metal pad of the chip, has an area AR4, from a top view, enclosed by the boundary defined by a sidewall 749 of the gate 751b and the border between the field oxide 752 and the N+ active region 758a. The active area of the ESD unit 759 equals the area AR3 plus the area AR4.

Based on the previously described definition or calculation illustrated in FIGS. 96-101, the active area of each of ESD units of an ESD circuit can be calculated, and the total of active areas of the ESD units equals the active area of the ESD circuit. If the ESD circuit is composed of only one ESD unit, the active area of the ESD circuit equals the active area of the only one ESD unit. If the ESD circuit is composed of multiple ESD units, the active area of the ESD circuit equals the total of the active areas of the ESD units connected in parallel.

Accordingly, the active area of each of the inter-chip ESD circuits 701b, 702b, 703b and 704b and the active area of each of the off-chip ESD circuits 59a, 59b, 59c and 59d can be calculated. For example, the small inter-chip ESD circuit 701b, 702b, 703b or 704b may have an active area less than 1300 square millimeters, such as between 6.5 and 1300 square millimeters, exemplary less than 325 square millimeters, such as between 6.5 and 325 square millimeters, and the large off-chip ESD circuit 59a, 59b, 59c or 59d may have an active area larger than 1300 square millimeters, such as between 1300 and 65,000 square millimeters, exemplary larger than 3250 square millimeters, such as between 3250 and 65,000 square millimeters. Alternatively, the small inter-chip ESD circuit 701b, 702b, 703b or 704b may have an active area less than 650 square millimeters, and the large off-chip ESD circuit 59a, 59b, 59c or 59d may have an active area larger than 650 square millimeters.

The size of the large off-chip ESD circuit 59a of the chip 700, defined as the total of the active areas of the one or more ESD units in the large off-chip ESD circuit 59a or the loading or capacitance of the large off-chip ESD circuit 59a, can be larger than the size of the small inter-chip ESD circuit 701b of the chip 700, defined as the total of the active areas of the one or more ESD units in the small inter-chip ESD circuit 701b or the loading or capacitance of the small inter-chip ESD circuit 701b, by more than 3 times, 10 times, 25 times or 50 times, such as between 3 and 50 times.

The size of the large off-chip ESD circuit 59*b* of the chip 700, defined as the total of the active regions of the one or more ESD units in the large off-chip ESD circuit 59*b* or the loading or capacitance of the large off-chip ESD circuit 59*b*, can be larger than the size of the small inter-chip ESD circuit 702*b* of the chip 700, defined as the total of the active regions of the one or more ESD units in the small inter-chip ESD circuit 702*b* or the loading or capacitance of the small inter-chip ESD circuit 702*b*, by more than 3 times, 10 times, 25 times or 50 times, such as between 3 and 50 times.

The size of the large off-chip ESD circuit 59*c* of the chip 800 defined as the total of the active regions of the one or more ESD units in the large off-chip ESD circuit 59*c* or the loading or capacitance of the large off-chip ESD circuit 59*c*, can be larger than the size of the small inter-chip ESD circuit 703*b* of the chip 800, defined as the total of the active regions of the one or more ESD units in the small inter-chip ESD circuit 703*b* or the loading or capacitance of the small inter-chip ESD circuit 703*b*, by more than 3 times, 10 times, 25 times or 50 times, such as between 3 and 50 times.

The size of the large off-chip ESD circuit 59*d* of the chip 800 defined as the total of the active regions of the one or more ESD units in the large off-chip ESD circuit 59*d* or the loading or capacitance of the large off-chip ESD circuit 59*d*, can be larger than the size of the small inter-chip ESD circuit 704*b* of the chip 800, defined as the total of the active regions of the one or more ESD units in the small inter-chip ESD circuit 704*b* or the loading or capacitance of the small inter-chip ESD circuit 704*b*, by more than 3 times, 10 times, 25 times or 50 times, such as between 3 and 50 times.

Referring to FIG. 86, the size of the inter-chip buffer 702*a* or 703*a* can be characterized by the load or loading of the inter-chip buffer 702*a* or 703*a*. The load or loading of the inter-chip buffer 702*a* or 703*a* is total equivalent capacitance load of the inter-chip buffer 702*a* or 703*a*. The load or loading (capacitance) of the inter-chip buffer 702*a* or 703*a*, such as the load or loading (capacitance) of the last stage inverter 585*b* or 586*b*, with drains of the NMOS transistor 752*a* or 753*a* and the PMOS transistor 752*b* or 753*b* connected to the metal pad 170*b* or 180*a*, of the two-stage cascade inter-chip driver shown in FIG. 88 or 89, can be less than 10 pF, such as between 0.01 pF and 10 pF or between 0.1 pF and 5 pF, less than 2 pF, such as between 0.001 pF and 2 pF, or less than 1 pF, such as between 0.01 pF and 1 pF. The size of the inter-chip buffer 701*a* or 704*a* can be characterized by an input capacitance (loading) of the inter-chip buffer 701*a* or 704*a*, and the input capacitance (loading) of the inter-chip buffer 701*a* or 704*a* may be less than 10 pF, such as between 0.01 pF and 10 pF or between 0.1 pF and 5 pF, less than 2 pF, such as between 0.001 pF and 2 pF, or less than 1 pF, such as between 0.01 pF and 1 pF.

Referring to FIG. 95, the size of the inter-chip buffer 701*a*, 702*a*, 703*a* or 704*a* can be characterized by the load or loading of the inter-chip buffer 701*a*, 702*a*, 703*a* or 704*a*. The load or loading of the inter-chip buffer 701*a*, 702*a*, 703*a* or 704*a* is total equivalent capacitance load of the inter-chip buffer 701*a*, 702*a*, 703*a* or 704*a*. The load or loading (capacitance) of the inter-chip buffer 701*a*, 702*a*, 703*a* or 704*a*, such as the load or loading (capacitance) of a last stage tri-state driver, with drains of an NMOS transistor and a PMOS transistor connected to the metal pad 170*a*, 170*b*, 180*a* or 180*b*, of a multi-stage cascade tri-state buffer, can be less than 10 pF, such as between 0.01 pF and 10 pF or between 0.1 pF and 5 pF, less than 2 pF, such as between 0.001 pF and 2 pF, or less than 1 pF, such as between 0.01 pF and 1 pF.

Referring to FIG. 86, the size of the off-chip buffer 58*b* or 58*c* can be characterized by the load or loading of the off-chip buffer 58*b* or 58*c*. The load or loading of the off-chip buffer 58*b* or 58*c* is total equivalent capacitance load of the off-chip buffer 58*b* or 58*c*. The load or loading (capacitance) of the off-chip buffer 58*b* or 58*c*, such as the load or loading (capacitance) of the last stage driver 426*b* or 427*b*, with drains of the NMOS transistor 4203 or 4303 and the PMOS transistor 4204 or 4304 connected to the metal pad 170*d* or 180*c*, of the multi-stage cascade off-chip driver shown in FIG. 92 or 93, can be larger than 10 pF, such as between 10 pF and 100 pF, larger than 2 pF, such as between 2 and 100 pF, or larger than 1 pF, such as between 1 pF and 100 pF. The size of the off-chip buffer 58*a* or 58*d* can be characterized by an input capacitance (loading) of the off-chip buffer 58*a* or 58*d*, and the input capacitance (loading) of the off-chip buffer 58*a* or 58*d* may be larger than 10 pF, such as between 10 pF and 100 pF, larger than 2 pF, such as between 2 and 100 pF, or larger than 1 pF, such as between 1 pF and 100 pF.

Referring to FIG. 95, the size of the off-chip buffer 58*a*, 58*b*, 58*c* or 58*d* can be characterized by the load or loading of the off-chip buffer 58*a*, 58*b*, 58*c* or 58*d*. The load or loading of the off-chip buffer 58*a*, 58*b*, 58*c* or 58*d* is total equivalent capacitance load of the off-chip buffer 58*a*, 58*b*, 58*c* or 58*d*. The load or loading (capacitance) of the off-chip buffer 58*a*, 58*b*, 58*c* or 58*d*, such as the load or loading (capacitance) of a last stage tri-state driver, with drains of an NMOS transistor and a PMOS transistor connected to the metal pad 170*c*, 170*d*, 180*c* or 180*d*, of a multi-stage cascade tri-state buffer, can be larger than 10 pF, such as between 10 pF and 100 pF, larger than 2 pF, such as between 2 and 100 pF, or larger than 1 pF, such as between 1 pF and 100 pF.

The load or loading (capacitance) of the off-chip buffer 58*b* shown in FIG. 86 or 95 is larger than the load or loading (capacitance) of the inter-chip buffer 702*a* shown in FIG. 86 or 95 by more than 3 times, 10 times, 25 times or 50 times, such as between 3 and 100 times. The load or loading (capacitance) of the off-chip buffer 58*c* shown in FIG. 86 or 95 is larger than the load or loading (capacitance) of the inter-chip buffer 703*a* shown in FIG. 86 or 95 by more than 3 times, 10 times, 25 times or 50 times, such as between 3 and 100 times.

Referring to FIG. 86 or 95, the size of the inter-chip buffer 702*a* or 703*a* can be characterized by a peak drive current of the inter-chip buffer 702*a* or 703*a*, and the size of the off-chip buffer 58*b* or 58*c* can be characterized by a peak drive current of the off-chip buffer 58*b* or 58*c*. The peak drive current of the off-chip buffer 58*b* or 58*c* is larger than the peak drive current of the inter-chip buffer 702*a* or 703*a* by more than 3 times, 10 times, 25 times or 50 times, such as between 3 and 100 times.

For example, regarding to the inter-chip buffer 702*a* shown in FIG. 86, when the PMOS transistor 752*b* is on and the NMOS transistor 752*a* is off, the previously described load or loading driven by the inter-chip buffer 702*a* is charged with a charging current. When the NMOS transistor 752*a* is on and the PMOS transistor 752*b* is off, the load or loading the previously described load or loading driven by the inter-chip buffer 702*a* is discharged with a discharging current. The peak charging or discharging current (a function of bias-voltages) of the NMOS transistor 752*a* or PMOS transistor 752*b* can be used to define the peak drive current of the inter-chip buffer 702*a*. Regarding to the off-chip buffer 58*b* shown in FIG. 86, when the PMOS transistor 4204 is on and the NMOS transistor 4203 is off, the previously described load or loading driven by the off-chip buffer 58*b* is charged with a charging current. When the NMOS transistor 4203 is on and the PMOS transistor 4204 is off, the previously described load or loading driven by the off-chip buffer 58*b* is discharged with a discharging current. The peak charging or discharging current (a function of bias-voltages) of the NMOS transistor 4203 or PMOS transistor 4204 can be used to define the peak drive current of the off-chip buffer 58b. The peak drive current of the off-chip buffer 58b is larger than the peak drive current of the inter-chip buffer 702a by more than 3 times, 10 times, 25 times or 50 times, such as between 3 and 100 times.

Referring to FIG. 86 or 95, the size of the inter-chip buffer 702a or 703a can be characterized by an on-resistance of a transistor in the last stage driver of the inter-chip buffer 702a or 703a, and the size of the off-chip buffer 58b or 58c can be characterized by an on-resistance of a transistor in the last stage driver of the off-chip buffer 58b or 58c. The on-resistance of the off-chip buffer 58b or 58c is larger than the on-resistance of the inter-chip buffer 702a or 703a by more than 3 times, 10 times, 25 times or 50 times, such as between 3 and 100 times.

For example, regarding to the inter-chip buffer 702a shown in FIG. 86, when the PMOS transistor 752b is on and the NMOS transistor 752a is off, the previously described load or loading driven by the inter-chip buffer 702a is charged, and the PMOS transistor 752b is equivalent to a resister with an on-resistance. When the NMOS transistor 752a is on and the PMOS transistor 752b is off, the previously described load or loading driven by the inter-chip buffer 702a is discharged, and the NMOS transistor 752a is equivalent to a resister with resistance of an on-resistance. The on-resistance (a function of bias-voltages) of the NMOS transistor 752a or PMOS transistor 752b can be used to characterize the size of the inter-chip buffer 702a. Regarding to the off-chip buffer 58b shown in FIG. 86, when the PMOS transistor 4204 is on and the NMOS transistor 4203 is off, the previously described load or loading driven by the off-chip buffer 58b is charged, and the PMOS transistor 4204 is equivalent to a resister with an on-resistance. When the NMOS transistor 4203 is on and the PMOS transistor 4204 is off, the previously described load or loading driven by the off-chip buffer 58b is discharged, and the NMOS transistor 4203 is equivalent to a resister with an on-resistance. The on-resistance (a function of bias-voltages) of the NMOS transistor 4203 or PMOS transistor 4204 can be used to characterize the size of the off-chip buffer 58b.

Figure 102:
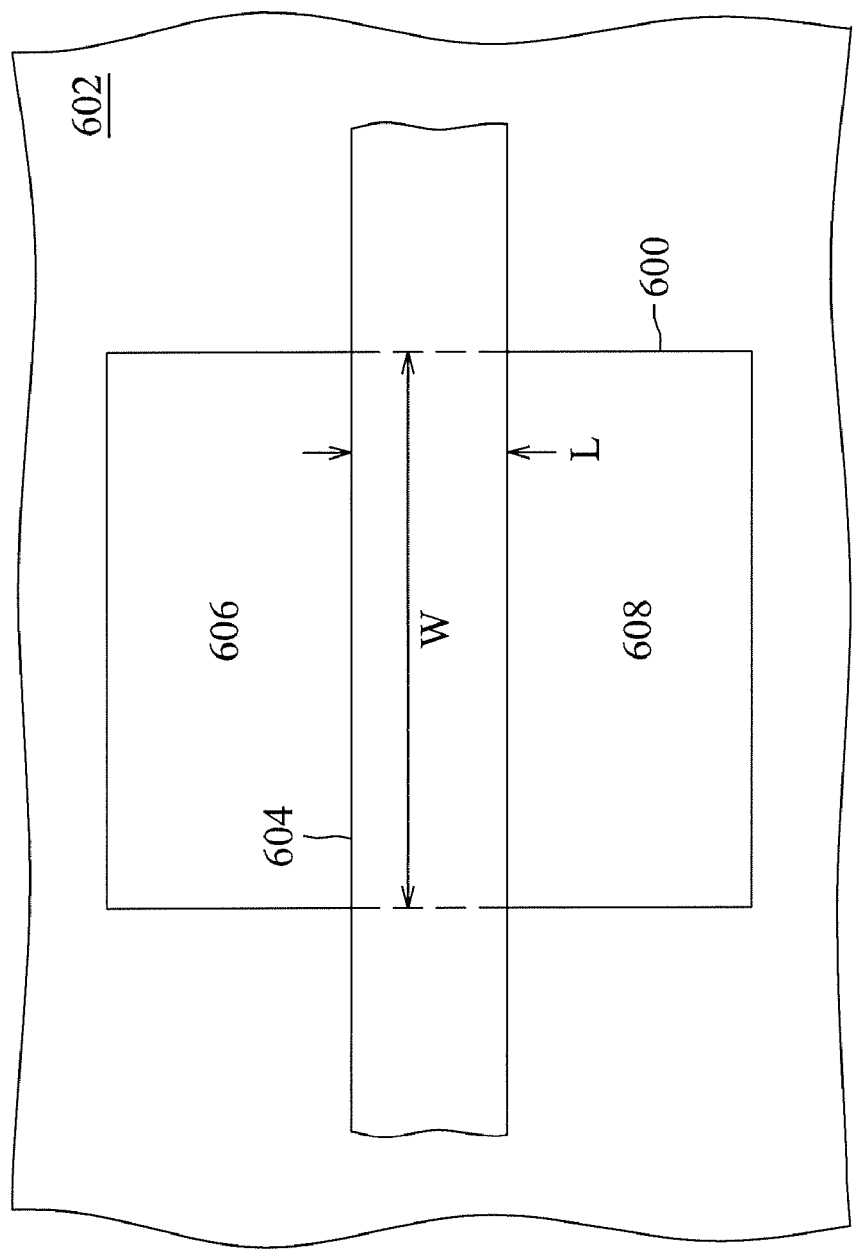
FIGS. 102 and 103 show how to define or calculate a physical channel width and a physical channel length of a MOS transistor, according to an embodiment of the present disclosure.
Figure 103:
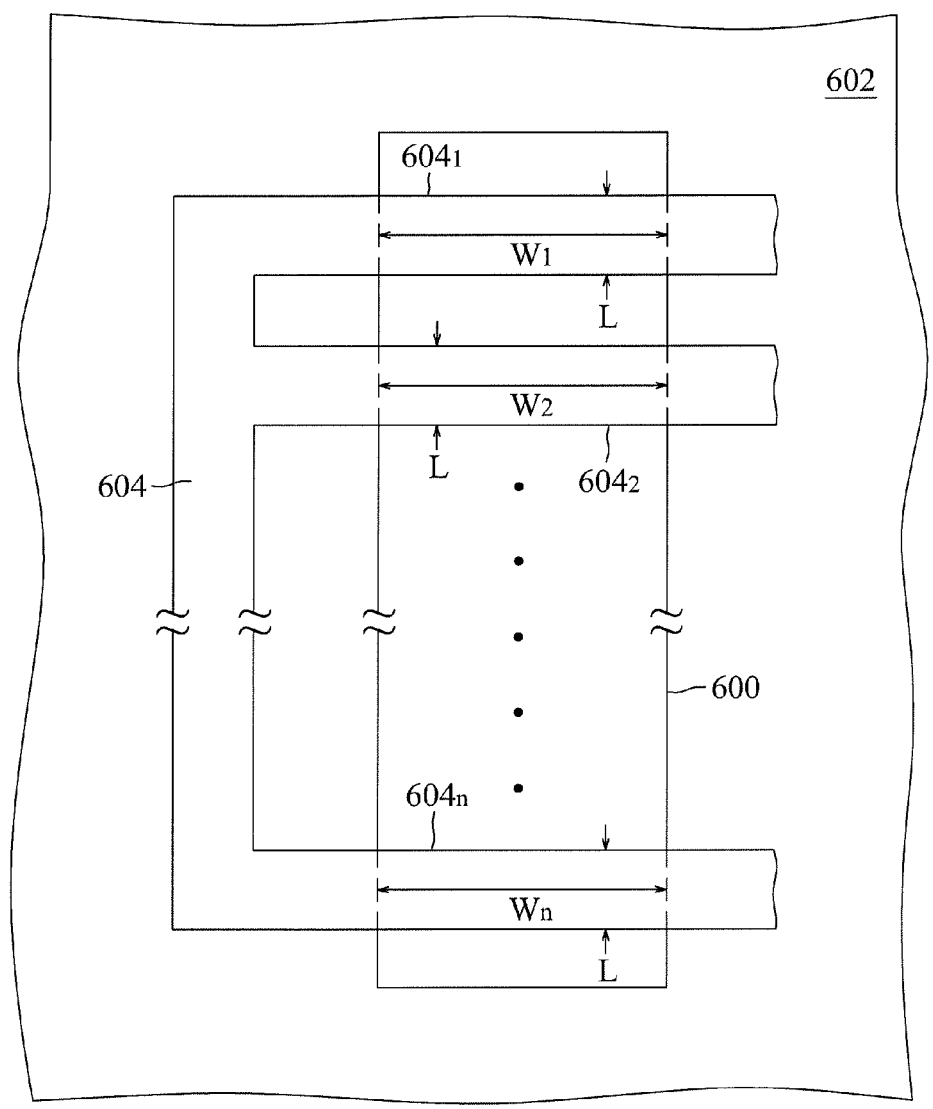

Referring to FIG. 86 or 95, the size of the inter-chip buffer 701a, 702a, 703a or 704a or the size of the off-chip buffer 58a, 58b, 58c or 58d can be characterized by a ratio of a physical channel width to a physical channel length of an NMOS transistor or PMOS transistor. FIG. 102 or 103 shows how to define or calculate a physical channel width and a physical channel length of an NMOS transistor or PMOS transistor.

FIG. 102 or 103 shows a top view of a MOS transistor (metal-oxide-semiconductor transistor) that can be a PMOS transistor or an NMOS transistor. Referring to FIG. 102, a MOS transistor of a chip includes an active region 600, diffusion region, in a semiconductor substrate of the chip, a field oxide region 602 in the semiconductor substrate and around the active region 600, a gate 604 on the field oxide region 602 and across the active region 600, and a gate oxide (not shown) between the active region 600 and the gate 604. The active region 600 can be defined as a source 606 at a side of the gate 604, and a drain 608 at the other side of the gate 604. The material of the gate 604 may be poly silicon, metal silicide or composite layer of above materials, and the metal silicide may be NiSi, CoS, $TiSi_2$ or WSi. Alternatively, the material of the gate 604 may be a metal, such as W, WN, TiN, Ta, TaN, Mo, or alloy or composite layer of above materials. The material of the gate oxide may be silicon oxide or high k oxide, such as Hf containing oxide. The Hf containing oxide may be $HfO_2$, HfSiON or HfSiO. The reference mark of W is defined as the physical channel width of the MOS transistor, the length of the gate 604 crossing over the diffusion region 600; the reference mark of L is defined as the physical channel length of the MOS transistor, the width of the gate 604 over the diffusion region 600.

Referring to FIG. 103, alternatively, a MOS transistor may include a gate 604 with multiple portions $604_1$-$604_n$ over one or more diffusion regions 600. The reference marks of $W_1$-$W_n$ are defined as the physical channel width of each portion $604_1$-$604_n$ of the gate 604, the length of each portion $604_1$-$604_n$ of the gate 604 crossing over the diffusion region (s) 600; the reference mark of L is defined as the physical channel length of one of the portions $604_1$-$604_n$ of the gate 604, the width of one of the portions $604_1$-$604_n$ of the gate 604 over the diffusion region(s) 600. In this case, the physical channel width of the MOS transistor is the summation of the physical channel widths $W_1$-$W_n$ of each portions $604_1$-$604_n$ of the gate 604, and the physical channel length of the MOS transistor is the physical channel length L of one of the portions $604_1$-$604_n$ of the gate 604.

Accordingly, the definition of the physical channel width and physical channel length of the MOS transistor as illustrated in FIG. 102 or 103 can be applicable to various features/structures described herein.

The size of the inter-chip buffer 702a shown in FIG. 86 can be characterized by a ratio of a physical channel width to a physical channel length of the NMOS transistor 752a or PMOS transistor 752b. As shown, the drains of the NMOS transistor 752a and the PMOS transistor 752b can be connected to the metal pad 170b of the chip 700 through the metal interconnect line 740d. If the inter-chip buffer 702a is the two-stage cascade inter-chip driver shown in FIG. 88, the size of the inter-chip buffer 702a can be characterized by the ratio of the physical channel width to the physical channel length of the NMOS transistor 752a or PMOS transistor 752b in the last stage driver 585b, and the drains of the NMOS transistor 752a and the PMOS transistor 752b are connected to the metal pad 170b of the chip 700 through the metal interconnect 740d. The ratio of the physical channel width to the physical channel length of the NMOS transistor 752a can be, e.g., between 1 and 50, and in exemplary embodiments the ratio can be between 1 and 20. The ratio of the physical channel width to the physical channel length of the PMOS transistor 752b can be a suitable value, e.g., between 1 and 100, in exemplary embodiments the ratio can be between 1 and 40.

The size of the inter-chip buffer 703a shown in FIG. 86 can be characterized by a ratio of a physical channel width to a physical channel length of the NMOS transistor 753a or PMOS transistor 753b. As shown, the drains of the NMOS transistor 753a and the PMOS transistor 753b can be connected to the metal pad 180a of the chip 800 through the metal interconnect 740f. If the inter-chip buffer 703a is the two-stage cascade inter-chip driver shown in FIG. 89, the size of the inter-chip buffer 703a can be characterized by the ratio of the physical channel width to the physical channel length of the NMOS transistor 753a or PMOS transistor 753b in the last stage driver 586b, and the drains of the NMOS transistor 753a and the PMOS transistor 753b are connected to the metal pad 180a of the chip 800 through the metal interconnect 740f. The ratio of the physical channel width to the physical channel length of the NMOS transistor 753a can be, e.g., between 1 and 50, and in exemplary embodiments, the ratio can be between 1 and 20. The ratio of the physical channel width to the physical channel length of the PMOS transistor 753b can be, e.g., between 1 and 100, and in exemplary embodiments, the ratio can be between 1 and 40.

The size of the off-chip buffer 58b shown in FIG. 86 can be characterized by a ratio of a physical channel width to a physical channel length of the NMOS transistor 4203 or PMOS transistor 4204. As shown, the drains of the NMOS transistor 4203 and the PMOS transistor 4204 can be connected to the metal pad 170d of the chip 700 through the metal interconnect 740m. If the off-chip buffer 58b is the two-stage cascade off-chip driver shown in FIG. 92, the size of the off-chip buffer 58b can be characterized by the ratio of the physical channel width to the physical channel length of the NMOS transistor 4203 or PMOS transistor 4204 in the last stage driver 426b, and the drains of the NMOS transistor 4203 and the PMOS transistor 4204 are connected to the metal pad 170d of the chip 700 through the metal interconnect 740m. The ratio of the physical channel width to the physical channel length of the NMOS transistor 4203 can be, e.g., larger than 30, such as between 30 and 20,000, and in exemplary embodiments the ratio can be larger than 50, such as between 50 and 300. The ratio of the physical channel width to the physical channel length of the PMOS transistor 4204 can be, e.g., larger than 60, such as between 60 and 40,000, and in exemplary embodiments the ratio can be larger than 100, such as between 100 and 600. For exemplary embodiments, the ratio of the physical channel width to the physical channel length of the NMOS transistor 4203 may be larger than the ratio of the physical channel width to the physical channel length of the NMOS transistor 752a by, e.g., more than 3 times, 10 times, 25 times or 50 times, such as between 3 and 100 times. Moreover, for exemplary embodiments, the ratio of the physical channel width to the physical channel length of the PMOS transistor 4204 may be larger than the ratio of the physical channel width to the physical channel length of the PMOS transistor 752b by, e.g., more than 3 times, 10 times, 25 times or 50 times, such as between 3 and 100 times.

The size of the off-chip buffer 58c shown in FIG. 86 can be characterized by a ratio of a physical channel width to a physical channel length of the NMOS transistor 4303 or PMOS transistor 4304. As shown, the drains of the NMOS transistor 4303 and the PMOS transistor 4304 can be connected to the metal pad 180c of the chip 800 through the metal interconnect 740p. If the off-chip buffer 58c is the two-stage cascade off-chip driver shown in FIG. 93, the size of the off-chip buffer 58c can be characterized by the ratio of the physical channel width to the physical channel length of the NMOS transistor 4303 or PMOS transistor 4304 in the last stage driver 427b, and the drains of the NMOS transistor 4303 and the PMOS transistor 4304 are connected to the metal pad 180c of the chip 800 through the metal interconnect 740p. The ratio of the physical channel width to the physical channel length of the NMOS transistor 4303 can be, e.g., larger than 30, such as between 30 and 20,000, and in exemplary embodiments the ratio can be larger than 50, such as between 50 and 300. The ratio of the physical channel width to the physical channel length of the PMOS transistor 4304 can be, e.g., larger than 60, such as between 60 and 40,000, and in exemplary embodiments the ratio can be larger than 100, such as between 100 and 600. The ratio of the physical channel width to the physical channel length of the NMOS transistor 4303 may be larger than the ratio of the physical channel width to the physical channel length of the NMOS transistor 753a by, e.g., more than 3 times, 10 times, 25 times or 50 times, such as between 3 and 100 times. The ratio of the physical channel width to the physical channel length of the PMOS transistor 4304 may be larger than the ratio of the physical channel width to the physical channel length of the PMOS transistor 753b by, e.g., more than 3 times, 10 times, 25 times or 50 times, such as between 3 and 100 times.

The size of the inter-chip buffer 701a or 702a shown in FIG. 95 can be characterized by a ratio of a physical channel width to a physical channel length of an NMOS transistor or PMOS transistor of the tri-state driver of the inter-chip tri-state buffer. As shown, the tri-state driver can be connected to the metal pad 170a or 170b of the chip 700 through the metal interconnect 740b or 740d. The ratio of the physical channel width to the physical channel length of the NMOS transistor of the tri-state driver can be, e.g., between 1 and 50, and in exemplary embodiments between 1 and 20. The ratio of the physical channel width to the physical channel length of the PMOS transistor of the tri-state driver can be, e.g., between 1 and 100, and in exemplary embodiments between 1 and 40.

If the inter-chip buffer 701a or 702a shown in FIG. 95 is a multi-stage tri-state buffer, the size of the inter-chip buffer 701a or 702a can be characterized by a ratio of a physical channel width to a physical channel length of an NMOS transistor or PMOS transistor in the last stage tri-state driver of the multi-stage tri-state buffer. As shown, the last stage tri-state driver can be connected to the metal pad 170a or 170b of the chip 700 through the metal interconnect 740b or 740d. The ratio of the physical channel width to the physical channel length of the NMOS transistor of the last stage tri-state driver can be, for example, between 1 and 50, and in exemplary embodiments the ratio can be between 1 and 20. The ratio of the physical channel width to the physical channel length of the PMOS transistor of the last stage tri-state driver can be between 1 and 100, and in exemplary embodiments the ratio can be between 1 and 40.

The size of the inter-chip buffer 703a or 704a shown in FIG. 95 can be characterized by a ratio of a physical channel width to a physical channel length of an NMOS transistor or PMOS transistor of the tri-state driver of the inter-chip tri-state buffer. As shown, the tri-state driver can be connected to the metal pad 180a or 180b of the chip 800 through the metal interconnect 740f or 740h. The ratio of the physical channel width to the physical channel length of the NMOS transistor of the tri-state driver is between 1 and 50, and in exemplary embodiments between 1 and 20. The ratio of the physical channel width to the physical channel length of the PMOS transistor of the tri-state driver is between 1 and 100, and in exemplary embodiments can be between 1 and 40.

If the inter-chip buffer 703a or 704a shown in FIG. 95 is a multi-stage tri-state buffer, the size of the inter-chip buffer 703a or 704a can be characterized by a ratio of a physical channel width to a physical channel length of an NMOS transistor or PMOS transistor in the last stage tri-state driver of the multi-stage tri-state buffer. As shown, the last stage tri-state driver can be connected to the metal pad 180a or 180b of the chip 800 through the metal interconnect 740f or 740h. The ratio of the physical channel width to the physical channel length of the NMOS transistor of the last stage tri-state driver can be, e.g., between 1 and 50, and in exemplary embodiments can be between 1 and 20. The ratio of the physical channel width to the physical channel length of the PMOS transistor of the last stage tri-state driver can be, e.g., between 1 and 100, and in exemplary embodiments can be between 1 and 40.

The size of the off-chip buffer 58a or 58b shown in FIG. 95 can be characterized by a ratio of a physical channel width to a physical channel length of an NMOS transistor or PMOS transistor of a tri-state driver of the off-chip tri-state buffer. As shown, the tri-state driver can be connected to the metal pad 170c or 170d of the chip 700 through the metal interconnect 740j or 740m. The ratio of the physical channel width to the physical channel length of the NMOS transistor of the tri-state driver can be, e.g., larger than 30, such as between 30 and 20,000, and in exemplary embodiments the ratio can be larger than 50, such as between 50 and 300. The ratio of the physical channel width to the physical channel length of the PMOS transistor of the tri-state driver can be, e.g., larger than 60, such as between 60 and 40,000, and in exemplary embodiments can be larger than 100, such as between 100 and 600.

If the off-chip buffer 58a or 58b shown in FIG. 95 is a multi-stage tri-state buffer, the size of the off-chip buffer 58a or 58b can be characterized by a ratio of a physical channel width to a physical channel length of an NMOS transistor or PMOS transistor in the last stage tri-state driver of the multi-stage tri-state buffer. As shown, the last stage tri-state driver can be connected to the metal pad 170c or 170d of the chip 700 through the metal interconnect 740j or 740m. The ratio of the physical channel width to the physical channel length of the NMOS transistor of the last stage tri-state driver can be, for example, larger than 30, such as between 30 and 20,000, and in exemplary embodiments the ratio can be larger than 50, such as between 50 and 300. The ratio of the physical channel width to the physical channel length of the PMOS transistor of the last stage tri-state driver can be larger than 60, such as between 60 and 40,000, and in exemplary embodiments can be larger than 100, such as between 100 and 600.

The ratio of the physical channel width to the physical channel length of the NMOS transistor of the tri-state driver (at the last stage) of the off-chip tri-state buffer 58a or 58b shown in FIG. 95 may be larger than the ratio of the physical channel width to the physical channel length of the NMOS transistor of the tri-state driver (at the last stage) of the inter-chip tri-state buffer 701a or 702a shown in FIG. 95 by, e.g., more than 3 times, 10 times, 25 times or 50 times, such as between 3 and 100 times. The ratio of the physical channel width to the physical channel length of the PMOS transistor of the tri-state driver (at the last stage) of the off-chip tri-state buffer 58a or 58b shown in FIG. 95 may be larger than the ratio of the physical channel width to the physical channel length of the PMOS transistor of the tri-state driver (at the last stage) of the inter-chip tri-state buffer 701a or 702a shown in FIG. 95 by, e.g., more than 3 times, 10 times, 25 times or 50 times, such as between 3 and 100 times.

The size of the off-chip buffer 58c or 58d shown in FIG. 95 can be characterized by a ratio of a physical channel width to a physical channel length of an NMOS transistor or PMOS transistor of a tri-state driver of the off-chip tri-state buffer. As shown, the tri-state driver can be connected to the metal pad 180c or 180d of the chip 800 through the metal interconnect 740p or 740r. The ratio of the physical channel width to the physical channel length of the NMOS transistor of the tri-state driver can be, e.g., larger than 30, such as between 30 and 20,000, and in exemplary embodiments can be larger than 50, such as between 50 and 300. The ratio of the physical channel width to the physical channel length of the PMOS transistor of the tri-state driver can be, e.g., larger than 60, such as between 60 and 40,000, and in exemplary embodiments the ratio can be larger than 100, such as between 100 and 600.

If the off-chip buffer 58c or 58d shown in FIG. 95 is a multi-stage tri-state buffer, the size of the off-chip buffer 58c or 58d can be characterized by a ratio of a physical channel width to a physical channel length of an NMOS transistor or PMOS transistor in the last stage tri-state driver of the multi-stage tri-state buffer. As shown, the last stage tri-state driver can be connected to the metal pad 180c or 180d of the chip 800 through the metal interconnect 740p or 740r. The ratio of the physical channel width to the physical channel length of the NMOS transistor of the last stage tri-state driver can be, e.g., larger than 30, such as between 30 and 20,000, and in exemplary embodiments the ratio can be larger than 50, such as between 50 and 300. The ratio of the physical channel width to the physical channel length of the PMOS transistor of the last stage tri-state driver can be, e.g., larger than 60, such as between 60 and 40,000, and in exemplary embodiments can be larger than 100, such as between 100 and 600.

The ratio of the physical channel width to the physical channel length of the NMOS transistor of the tri-state driver (at the last stage) of the off-chip tri-state buffer 58c or 58d shown in FIG. 95 may be larger than the ratio of the physical channel width to the physical channel length of the NMOS transistor of the tri-state driver (at the last stage) of the inter-chip tri-state buffer 703a or 704a shown in FIG. 95 by, e.g., more than 3 times, 10 times, 25 times or 50 times, such as between 3 and 100 times. The ratio of the physical channel width to the physical channel length of the PMOS transistor of the tri-state driver (at the last stage) of the off-chip tri-state buffer 58c or 58d shown in FIG. 95 may be larger than the ratio of the physical channel width to the physical channel length of the PMOS transistor of the tri-state driver (at the last stage) of the inter-chip tri-state buffer 703a or 704a shown in FIG. 95 by, e.g., more than 3 times, 10 times, 25 times or 50 times, such as between 3 and 100 times.

Figure 110A:
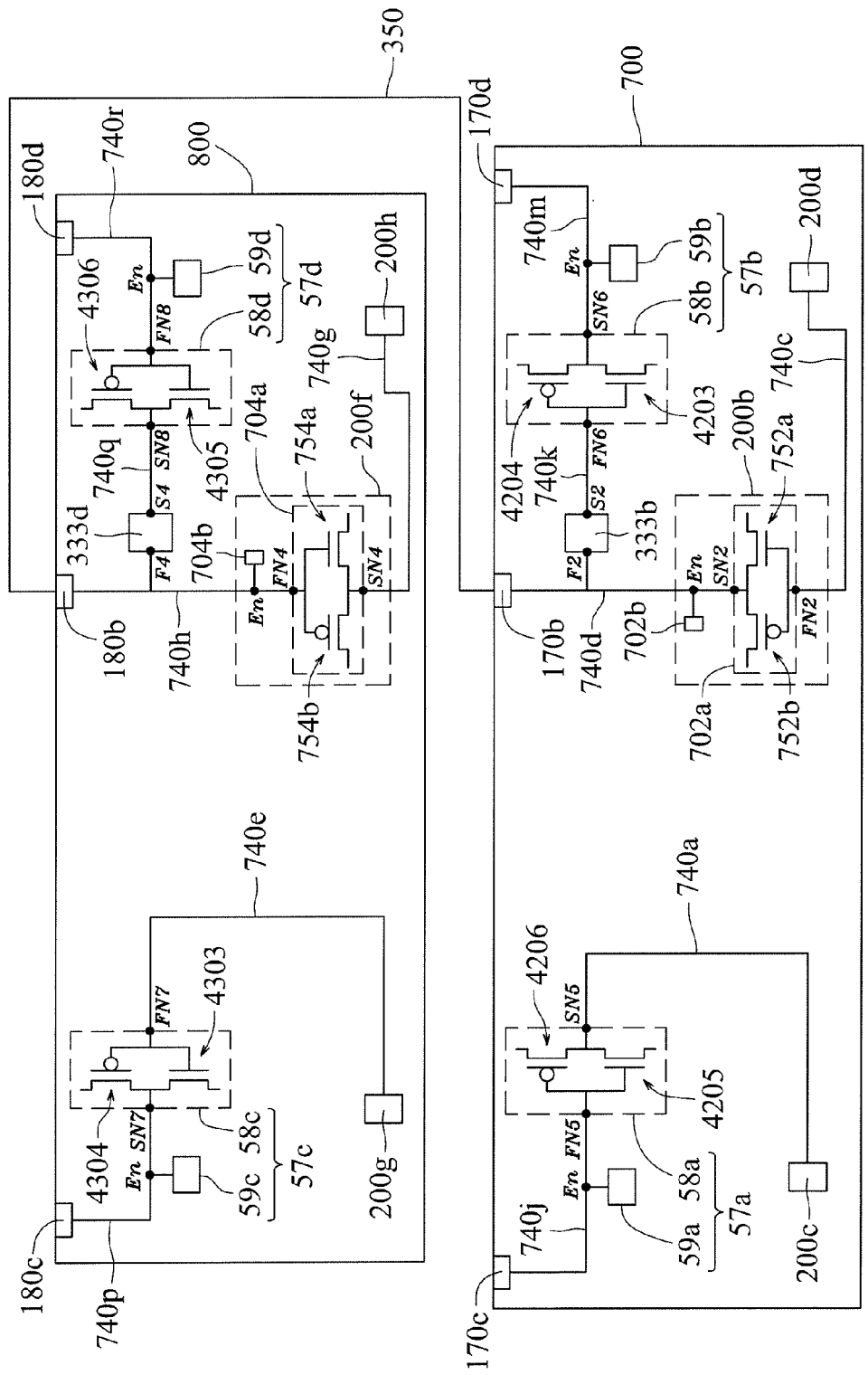
FIGS. 110A and 110B are circuit diagrams each showing interface circuits between two chips, according to an embodiment of the present disclosure.

Referring to FIG. 110A, alternatively, the internal circuit 200c of the chip 700 can be connected to the second node SN5 of the off-chip buffer 58a through the metal interconnect 740a of the chip 700 without passing through any inter-chip circuit and any testing interface circuit of the chip 700. The internal circuit 200g of the chip 800 can be connected to the first node FN7 of the off-chip buffer 58c through the metal interconnect 740e of the chip 800 without passing through any inter-chip circuit and any testing interface circuit of the chip 800. Comparing to the circuit diagram of FIG. 86, the inter-chip circuits 200a and 200e and the testing interface circuits 333a and 333c as shown in FIG. 86 can be omitted. The element in FIG. 110A indicated by a some reference number as indicates the element in FIG. 86 has a same material and spec as the element illustrated in FIG. 86.

Figure 110B:
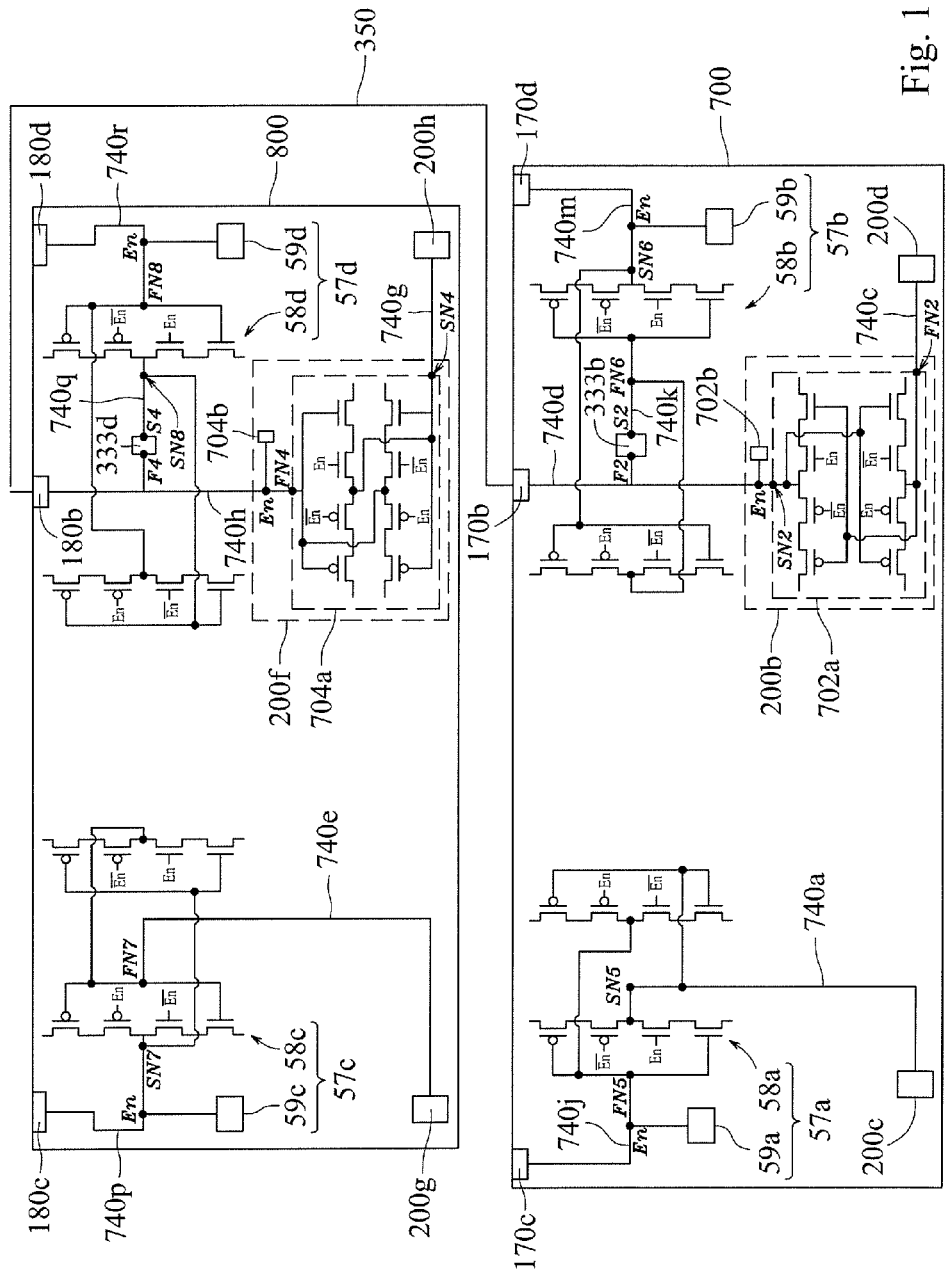

Referring to FIG. 110B, alternatively, the internal circuit 200c of the chip 700 can be connected to the second node SN5 of the off-chip buffer 58a through the metal interconnect 740a of the chip 700 without passing through any inter-chip circuit and any testing interface circuit of the chip 700. The internal circuit 200g of the chip 800 can be connected to the first node FN7 of the off-chip buffer 58c through the metal interconnect 740e of the chip 800 without passing through any inter-chip circuit and any testing interface circuit of the chip 800. Comparing to the circuit diagram of FIG. 95, the inter-chip circuits 200a and 200e and the testing interface circuits 333a and 333c as shown in FIG. 95 can be omitted. The element in FIG. 110B indicated by a same reference number as indicates the elements in FIGS. 86 and 95 has a same material and spec as the element illustrated in FIGS. 86 and 95.

Figure 105:
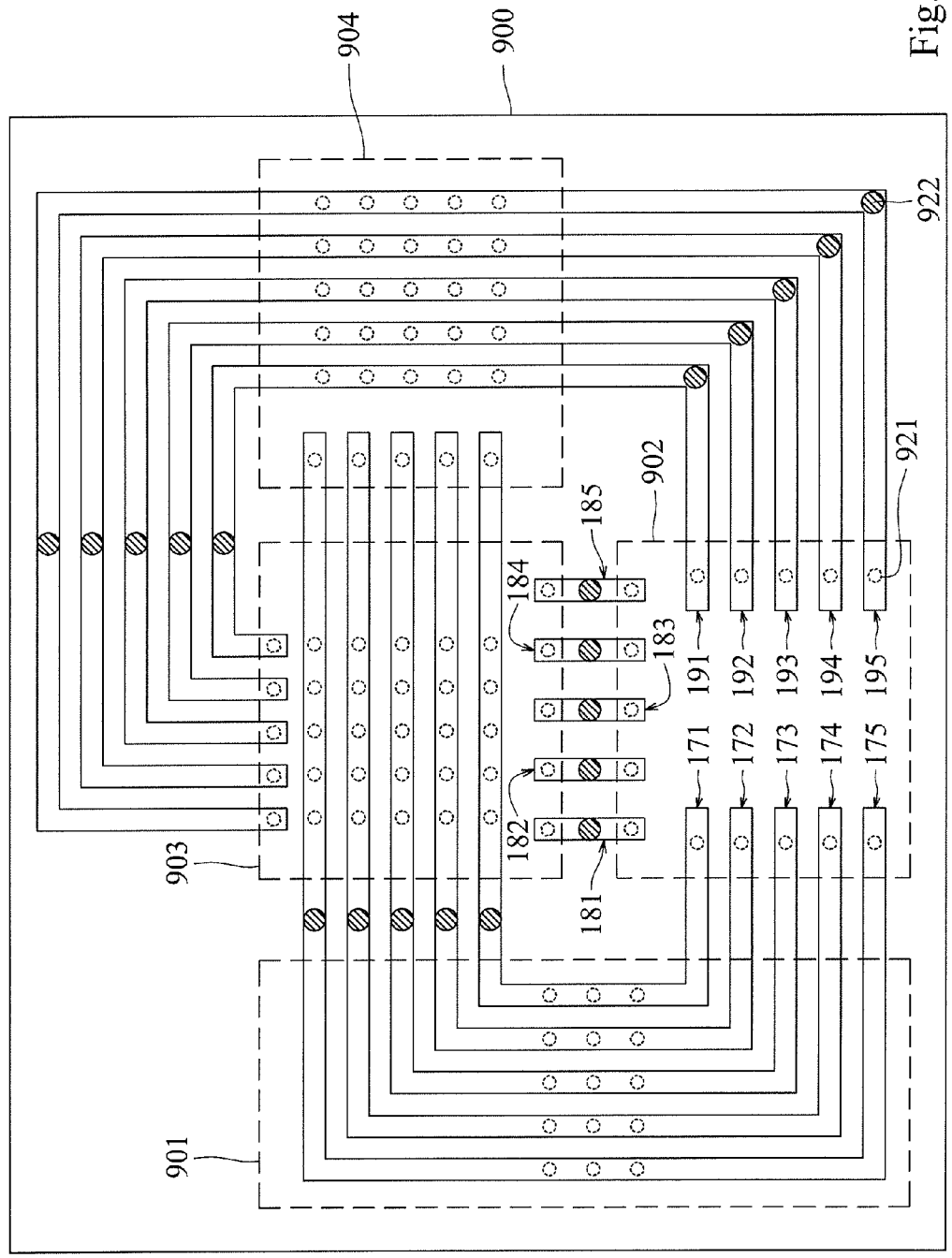
FIG. 105 shows a schematic top perspective view of a chip, according to an embodiment of the present disclosure.

FIG. 105 shows a schematic top perspective view of a chip. The circuit design of the chip 900 can be applied to any one of the chips 120, 130 and 140. The chip 900 includes a shared-memory circuit block 901 and multiple circuit blocks 902, 903 and 904.

The shared-memory circuit block 901 can be a statistic-random-access-memory circuit block, for example, having a memory size between 256 kilobytes and 16 megabytes. Alternatively, the shared-memory circuit block 901 can be a dynamic-random-access-memory circuit block, for example, having a memory size between 1 megabyte and 256 megabytes.

Any one of the circuit blocks 902, 903 and 904 can be a central-processing-unit (CPU) circuit block, a graphics-processing-unit (GPU) circuit block, a digital-signal-processing (DSP) circuit block, a baseband circuit block, a wireless local area network (WLAN) circuit block, a logic circuit block, an analog circuit block, a global-positioning-system (GPS) circuit block, a Bluetooth circuit block, a radio frequency (RF) circuit block, or a modem circuit block. For instance, the circuit block 902 can be a central-processing-unit (CPU) circuit block, the circuit block 903 can be a graphics-processing-unit (GPU) circuit block, and the circuit block 904 can be another central-processing-unit (CPU) circuit block, another graphics-processing-unit (GPU) circuit block, a digital-signal-processing (DSP) circuit block, a baseband circuit block, a wireless local area network (WLAN) circuit block, a logic circuit block, an analog circuit block, a global-positioning-system (GPS) circuit block, a Bluetooth circuit block, a radio frequency (RF) circuit block or a modem circuit block.

The chip 900 also includes multiple metal interconnects or traces 171-175, 181-185 and 191-195 over a passivation layer of the chip 900, and multiple metal pillars or bumps 922 on the metal interconnects or traces 171-175, 181-185 and 191-195. In case the circuit design of the chip 900 is applied to any one of the chips 120 shown in FIG. 8, 52, 54, 55, 66, 67, 72, 73, 74, 83, 84, 107K or 107L, the metal interconnects or traces 171-175, 181-185 and 191-195 as designed in the chip 900 can be provided by the patterned metal layer 2 and the metal pillars or bumps 922 as designed in the chip 900 can be the metal pillars or bumps 24. In case the circuit design of the chip 900 is applied to any one of the chips 130 shown in FIG. 19, 52, 54, 55, 66, 67, 72, 73, 74, 83, 84, 107K, 107L, 108F or 109T, the metal interconnects or traces 171-175, 181-185 and 191-195 as designed in the chip 900 can be provided by the patterned metal layer 4 and the metal pillars or bumps 922 as designed in the chip 900 can be the metal pillars or bumps 44. In case the circuit design of the chip 900 is applied to any one of the chips 140 shown in FIG. 29, 52, 54, 55, 66, 67, 72, 73, 74, 83, 84, 85, 107K, 107L, 108F or 109T, the metal interconnects or traces 171-175, 181-185 and 191-195 as designed in the chip 900 can be provided by the patterned metal layer 6 and the metal pillars or bumps 922 as designed in the chip 900 can be the metal pillars or bumps 64.

The shared-memory circuit block 901 can be connected to the circuit blocks 902, 903 and 904 through the metal interconnects or traces 171-175. The metal interconnects or traces 171-175 can include multiple power interconnects, planes, buses or traces 171 and 175 (two of them are shown), multiple shared signal interconnects, buses or traces 172 (one of them is shown), multiple ground interconnects, planes, buses or traces 173 (one of them is shown), and multiple clock interconnects, buses or traces 174 (one of them is shown). The shared signal interconnects, buses or traces 172 may include multiple shared bit lines or interconnects, and multiple shared address lines or interconnects. The metal interconnects or traces 171-175 can be connected to the shared-memory circuit block 901 and the circuit blocks 902, 903 and 904 through some of openings 921 in the passivation layer of the chip 900.

The circuit block 902 can be connected to the circuit block 903 through the metal interconnects or traces 181-185. The metal interconnects or traces 181-185 can include multiple power interconnects, planes, buses or traces 181 and 185 (two of them are shown), multiple signal interconnects, buses or traces 182 (one of them is shown), multiple ground interconnects, planes, buses or traces 183 (one of them is shown), and multiple clock interconnects, buses or traces 184 (one of them is shown). The signal interconnects, buses or traces 182 may include multiple bit lines or bit interconnects. The metal interconnects or traces 181-185 can be connected to the circuit blocks 902 and 903 through some of the openings 921 in the passivation layer of the chip 900.

The circuit block 904 can be connected to the circuit blocks 902 and 903 through the metal interconnects or traces 191-195. The metal interconnects or traces 191-195 can include multiple power interconnects, planes, buses or traces 191 and 195 (two of them are shown), multiple shared signal interconnects, buses or traces 192 (one of them is shown), multiple ground interconnects, planes, buses or traces 193 (one of them is shown), and multiple clock interconnects, buses or traces 194 (one of them is shown). The shared signal interconnects, buses or traces 192 may include multiple bit lines or bit interconnects. The metal interconnects or traces 191-195 can be connected to the circuit blocks 902, 903 and 904 through some of the openings 921 in the passivation layer of the chip 900.

Data can be transmitted from the circuit blocks 902, 903 and 904 to the shared-memory circuit block 901 through the shared signal interconnects, buses or traces 172, for example, having a data bit width equal to or more than 16, equal to or more than 32, equal to or more than 64, equal to or more than 128, equal to or more than 512, or between 16 and 128. Data can be transmitted from the shared-memory circuit block 901 to the circuit blocks 902, 903 and 904 through the shared signal interconnects, buses or traces 172, for example, having a data bit width equal to or more than 16, equal to or more than 32, equal to or more than 64, equal to or more than 128, equal to or more than 512, or between 16 and 128. For example, when the signal paths in the shared signal buses between the shared-memory circuit block 901 and the circuit block 902 are turned on, the signal paths in the shared signal buses between the shared-memory circuit block 901 and the circuit block 903 and the signal paths in the shared signal buses between the shared-memory circuit block 901 and the circuit block 904 are turned off. Alternatively, when the signal paths in the shared signal buses between the shared-memory circuit block 901 and the circuit block 903 are turned on, the signal paths in the shared signal buses between the shared-memory circuit block 901 and the circuit block 902 and the signal paths in the shared signal buses between the shared-memory circuit block 901 and the circuit block 904 are turned off. Alternatively, when the signal paths in the shared signal buses between the shared-memory circuit block 901 and the circuit block 904 are turned on, the signal paths in the shared signal buses between the shared-memory circuit block 901 and the circuit block 902 and the signal paths in the shared signal buses between the shared-memory circuit block 901 and the circuit block 903 are turned off.

Alternatively, the interconnection for transmitting data between the circuit block 902 and the shared-memory circuit block 901 may have a data bit width equal to or more than 16, equal to or more than 32, equal to or more than 64, equal to or more than 128, equal to or more than 512, or between 16 and 128. The interconnection for transmitting data between the circuit block 903 and the shared-memory circuit block 901 may have a data bit width equal to or more than 16, equal to or more than 32, equal to or more than 64, equal to or more than 128, equal to or more than 512, or between 16 and 128. The interconnection for transmitting data between the circuit block 904 and the shared-memory circuit block 901 may have a data bit width equal to or more than 16, equal to or more than 32, equal to or more than 64, equal to or more than 128, equal to or more than 512, or between 16 and 128.

The interconnection for transmitting signals between the circuit blocks 902 and 903 can be through the signal interconnects, buses or traces 182, for example, having a data bit width equal to or more than 16, equal to or more than 32, equal to or more than 64, equal to or more than 128, equal to or more than 512, or between 16 and 128.

The interconnection for transmitting signals between the circuit blocks 902, 903 and 904 can be through the shared signal interconnects, buses or traces 192, for example, having a data bit width equal to or more than 16, equal to or more than 32, equal to or more than 64, equal to or more than 128, equal to or more than 512, or between 16 and 128. Alternatively, the interconnection for transmitting signals between the circuit blocks 902 and 904 may have a data bit width equal to or more than 16, equal to or more than 32, equal to or more than 64, equal to or more than 128, equal to or more than 512, or between 16 and 128, and the interconnection for transmitting signals between the circuit blocks 903 and 904 may have a data bit width equal to or more than 16, equal to or more than 32, equal to or more than 64, equal to or more than 128, equal to or more than 512, or between 16 and 128.

Figure 106A:
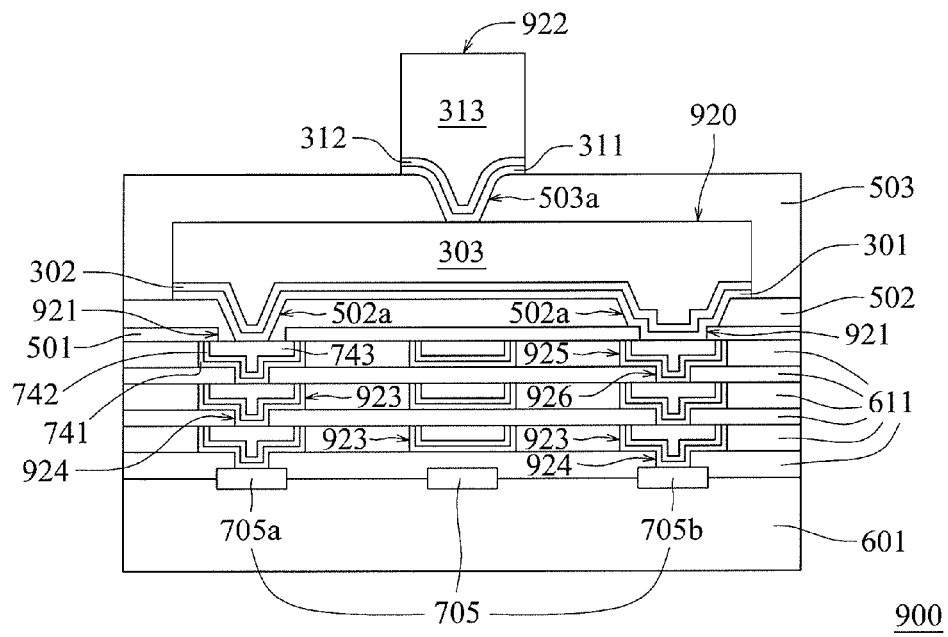
FIGS. 106A-106H show schematic cross-sectional views of eight alternates with regards to the chip 900 illustrated in FIG. 105.

FIGS. 106A-106H schematically show eight alternates with regards to the chip 900 illustrated in FIG. 105. Referring to FIG. 106A, the chip 900 may include a semiconductor substrate 601, multiple transistors 705, including transistors 705a and 705b, in and/or over the semiconductor substrate 601, multiple dielectric layers 611 over the semiconductor substrate 601, multiple fine-line metal layers 923 in the dielectric layers 611, multiple via plugs 924 and 926 in the dielectric layers 611, multiple metal traces or pads 925 in or on one of the dielectric layers 611, a passivation layer 501 over the semiconductor substrate 601, over the transistors 705, over the dielectric layers 611, over the fine-line metal layers 923 and over the metal traces or pads 925, a polymer layer 502 on the passivation layer 501, a patterned metal layer 920 on the polymer layer 502 and on multiple contact points of the metal traces or pads 925, a polymer layer 503 on the patterned metal layer 920 and on the polymer layer 502, and multiple metal pillars or bumps 922 (one of them is shown) on multiple contact points of the patterned metal layer 920 and on the polymer layer 503.

The semiconductor substrate 601 may be a silicon substrate or a gallium arsenide (GaAs) substrate, and may have a thickness greater than 1 micrometer, such as between 1 and 30 micrometers, between 2 and 10 micrometers, between 5 and 50 micrometers, between 10 and 100 micrometers or between 10 and 500 micrometers. Each of the dielectric layers 611 can be composed of a single layer of silicon oxide, silicon nitride, silicon oxynitride, silicon carbon nitride or silicon oxycarbide, or a composite layer made of the previously described materials.

The fine-line metal layers 923 and the metal traces or pads 925 can be formed by a damascene or double-damascene process including an electroplating process and a chemical mechanical polishing (CMP) process. Each of the fine-line metal layers 923 and the metal traces or pads 925 can be composed of an electroplated copper layer 743, an adhesion/barrier layer 741 at a bottom of the electroplated copper layer 743 and at sidewalls of the electroplated copper layer 743, and a seed layer 742 between the electroplated copper layer 743 and the adhesion/barrier layer 741, at the bottom of the electroplated copper layer 743 and at the sidewalls of the electroplated copper layer 743. The electroplated copper layer 743, for example, may have a thickness smaller than 1.5 micrometers, such as between 0.15 and 1.2 micrometers, and may have a width smaller than 1 micrometer, such as between 0.05 and 1 micrometers. The seed layer 742 can be formed by a physical-vapor deposition (PVD) process, such as sputtering process, and may include copper or titanium-copper alloy. The adhesion/barrier layer 741 can be formed by a physical-vapor deposition (PVD) process, such as sputtering process, and may include titanium, a titanium-tungsten alloy, titanium nitride, chromium, tantalum or tantalum nitride. The sidewalls of the electroplated copper layer 743 are covered by the adhesion/barrier layer 741 and the seed layer 742.

Alternatively, the metal traces or pads 925 can be formed by a process including sputtering aluminum. Each of the metal traces or pads 925, for example, may be composed of a titanium-containing layer, such as a single layer of titanium nitride, and an aluminum or aluminum-alloy layer with a thickness between 0.25 and 3 micrometers on the titanium-containing layer.

The metal traces or pads 925 can be connected to the top fine-line metal layers 923 through the via plugs 926. The top fine-line metal layers 923 can be connected to the bottom fine-line metal layers 923 through the via plugs 924. The bottom fine-line metal layers 923 can be connected to the transistors 705 through the via plugs 924.

The passivation layer 501 can be formed by a chemical vapor deposition (CVD) method, and may have a thickness greater than 0.2 micrometers, such as between 0.3 and 1.5 micrometers. The passivation layer 501 is commonly made of silicon oxide (such as $SiO_2$), silicon nitride (such as $Si_3N_4$), silicon oxynitride, silicon oxycarbide, phosphosilicate glass (PSG), silicon carbon nitride or a composite of the previously described materials. The passivation layer 501 can be composed of one or more inorganic layers. For example, the passivation layer 501 can be composed of an oxide layer, such as silicon oxide or silicon oxycarbide, having a thickness between 0.2 and 1.2 micrometers and a nitride layer, such as silicon nitride, silicon oxynitride or silicon carbon nitride, having a thickness between 0.2 and 1.2 micrometers on the oxide layer. Alternatively, the passivation layer 501 can be a single layer of silicon nitride, silicon oxynitride or silicon carbon nitride with a thickness between 0.3 and 1.5 micrometers.

Multiple openings 921 (two of them are shown) in the passivation layer 501 are over the contact points of the metal traces or pads 925 and expose them, and the contact points of the metal traces or pads 925 are at bottoms of the openings 921.

The polymer layer 502 may have a thickness between 2 and 30 micrometers. Multiple openings 502a in the polymer layer 502 are over the contact points, exposed by the openings 921, of the metal traces or pads 925 and expose them. The thickness of the polymer layer 502 can be greater than that of the passivation layer 501 and greater than that of each of the dielectric layers 611.

The patterned metal layer 920 can be composed of an adhesion layer 301, a seed layer 302 and a metal layer 303. The adhesion layer 301 can be formed on the polymer layer 502 and on the contact points, exposed by the openings 502a, of the metal traces or pads 925. The seed layer 302 can be formed on the adhesion layer 301, over the polymer layer 502 and over the contact points, exposed by the openings 502a, of the metal traces or pads 925. The metal layer 303 can be formed on the seed layer 302, over the polymer layer 502 and over the contact points, exposed by the openings 502a, of the metal traces or pads 925. The sidewalls of the metal layer 303 are not covered by the seed layer 302 and the adhesion layer 301. The thickness of the metal layer 303 can be greater than that of each of the metal traces or pads 925 and greater than that of each of the fine-line metal layers 923. The passivation layer 501 is between the patterned metal layer 920 and the metal traces or pads 925. The specification of the adhesion layer 301, the seed layer 302 and the metal layer 303 can be referred to as the specification of the adhesion layer 21, 41 or 61, the seed layer 22, 42 or 62 and the metal layer 23, 43 or 63 as illustrated in FIG. 8, 19 or 29, respectively.

For example, the adhesion layer 301 can be a titanium-containing layer, such as a single layer of titanium-tungsten alloy, titanium or titanium nitride, with a thickness smaller than 1 micrometer, such as between 1 nanometer and 0.5 micrometers, and preferably between 1 nanometer and 0.1 micrometers, on the polymer layer 502 and on the contact points, exposed by the openings 502a, of the metal traces or pads 925. The seed layer 302 can be a single layer of copper or titanium-copper alloy with a thickness smaller than 1 micrometer, such as between 10 nanometers and 0.8 micrometers, and preferably between 20 nanometer and 0.5 micrometers, on the titanium-containing layer. The metal layer 303 can be a copper layer having a thickness greater than 1 micrometer, such as between 2 and 30 micrometers, and preferably between 3 and 10 micrometers, on the single layer of copper or titanium-copper alloy.

Alternatively, the adhesion layer 301 can be a tantalum-containing layer, such as a single layer of tantalum or tantalum nitride, with a thickness smaller than 1 micrometer, such as between 1 nanometer and 0.5 micrometers, and preferably between 1 nanometer and 0.1 micrometers, on the polymer layer 502 and on the contact points, exposed by the openings 502a, of the metal traces or pads 925. The seed layer 302 can be a single layer of copper or titanium-copper alloy with a thickness smaller than 1 micrometer, such as between 10 nanometers and 0.8 micrometers, and preferably between 20 nanometer and 0.5 micrometers, on the tantalum-containing layer. The metal layer 303 can be a copper layer having a thickness greater than 1 micrometer, such as between 2 and 30 micrometers, and preferably between 3 and 10 micrometers, on the single layer of copper or titanium-copper alloy.

The patterned metal layer 920 can provide the metal interconnects or traces 171-175, 181-185 and 191-195 illustrated in FIG. 105. For example, the transistor 705a, when being in the shared-memory circuit block 901 illustrated in FIG. 105, can be physically and electrically connected to the transistor 705b, when being in the circuit block 902, 903 or 904 illustrated in FIG. 105, through the metal interconnect or trace 171,172 173, 174 or 175 illustrated in FIG. 105 provided by the patterned metal layer 920. Alternatively, the transistor 705a, when being in the circuit block 902 illustrated in FIG. 105, can be physically and electrically connected to the transistor 705b, when being in the circuit block 903 illustrated in FIG. 105, through the metal interconnect or trace 181,182 183, 184 or 185 illustrated in FIG. 105 provided by the patterned metal layer 920. Alternatively, the transistor 705a, when being in the circuit block 904 illustrated in FIG. 105, can be physically and electrically connected to the transistor 705b, when being in the circuit block 902 or 903 illustrated in FIG. 105, through the metal interconnect or trace 191,192 193, 194 or 195 illustrated in FIG. 105 provided by the patterned metal layer 920.

The polymer layer 503 may have a thickness between 2 and 30 micrometers. Multiple openings 503a (one of them is shown) in the polymer layer 503 are over the contact points (of the metal layer 303) of the patterned metal layer 920 and expose them. The thickness of the polymer layer 503 can be greater than that of the passivation layer 501 and greater than that of each of the dielectric layers 611.

The metal pillars or bumps 922 can be composed of an adhesion layer 311, a seed layer 312 and a metal layer 313. The adhesion layer 311 can be formed on the contact points, exposed by the openings 503a, of the metal layer 303 and on the polymer layer 503. The seed layer 312 can be formed on the adhesion layer 311. The metal layer 313 can be formed on the seed layer 312. The metal layer 313 has a sidewall or sidewalls not covered by the seed layer 312 and the adhesion layer 311.

The adhesion layer 311 may have a thickness smaller than 1 micrometer, such as between 1 nanometer and 0.5 micrometers, and preferably between 1 nanometer and 0.1 micrometers, and may include titanium, a titanium-tungsten alloy, titanium nitride, tantalum, tantalum nitride or chromium. The seed layer 312 may have a thickness smaller than 1 micrometer, such as between 10 nanometers and 0.8 micrometers, and preferably between 20 nanometer and 0.5 micrometers, and may include copper, titanium-copper alloy, gold or nickel. The metal layer 313 may have a thickness greater than 5 micrometers, such as between 5 and 50 micrometers, and preferably between 10 and 20 micrometers, and can be a single layer of copper, nickel or gold, or a composite layer including a copper layer having a thickness between 5 and 50 micrometers, a nickel layer having a thickness between 0.1 and 10 micrometers on the copper layer, and a gold layer having a thickness between 0.01 and 5 micrometers on the nickel layer.

For example, the adhesion layer 311 can be a titanium-containing layer, such as a single layer of titanium-tungsten alloy, titanium or titanium nitride, with a thickness smaller than 1 micrometer, such as between 1 nanometer and 0.5 micrometers, and preferably between 1 nanometer and 0.1 micrometers, on the contact points, exposed by the openings 503a, of the metal layer 303 and on the polymer layer 503. The seed layer 312 can be a single layer of copper or titanium-copper alloy with a thickness smaller than 1 micrometer, such as between 10 nanometers and 0.8 micrometers, and preferably between 20 nanometer and 0.5 micrometers, on the titanium-containing layer. The metal layer 313 can be a copper layer with a thickness greater than 5 micrometers, such as between 5 and 50 micrometers, and preferably between 10 and 20 micrometers, on the single layer of copper or titanium-copper alloy.

Alternatively, the adhesion layer 311 can be a tantalum-containing layer, such as a single layer of tantalum or tantalum nitride, with a thickness smaller than 1 micrometer, such as between 1 nanometer and 0.5 micrometers, and preferably between 1 nanometer and 0.1 micrometers, on the contact points, exposed by the openings 503a, of the metal layer 303 and on the polymer layer 503. The seed layer 312 can be a single layer of copper or titanium-copper alloy with a thickness smaller than 1 micrometer, such as between 10 nanometers and 0.8 micrometers, and preferably between 20 nanometer and 0.5 micrometers, on the tantalum-containing layer. The metal layer 313 can be a copper layer with a thickness greater than 5 micrometers, such as between 5 and 50 micrometers, and preferably between 10 and 20 micrometers, on the single layer of copper or titanium-copper alloy.

Figure 106B:
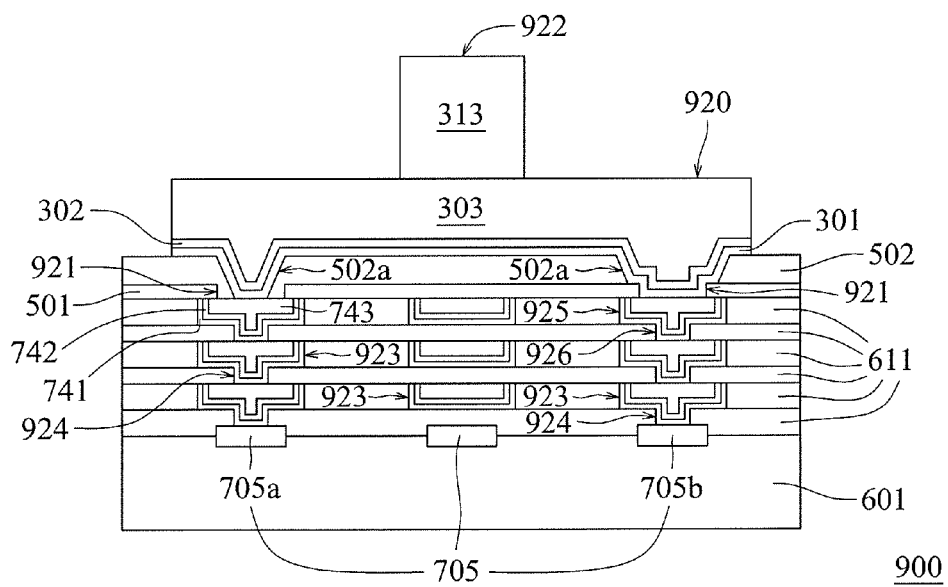

Referring to FIG. 106B, the chip 900 is similar to that shown in FIG. 106A except that the polymer layer 503 is not formed on the polymer layer 502 and on the patterned metal layer 920, and the metal pillars or bumps 922 (one of them is shown) are formed without the adhesion layer 311 and the seed layer 312, but formed with the metal layer 313 directly on multiple contact points of the metal layer 303 of the patterned metal layer 920. The metal layer 313 shown in FIG. 106B may have a thickness greater than 5 micrometers, such as between 5 and 50 micrometers, and preferably between 10 and 20 micrometers, and can be a single layer of copper, nickel or gold, or a composite layer including a copper layer having a thickness between 5 and 50 micrometers, a nickel layer having a thickness between 0.1 and 10 micrometers on the copper layer, and a gold layer having a thickness between 0.01 and 5 micrometers on the nickel layer. The element in FIG. 106B indicated by a same reference number as indicates the element in FIG. 106A has a same material and spec as the element illustrated in FIG. 106A.

Figure 106C:
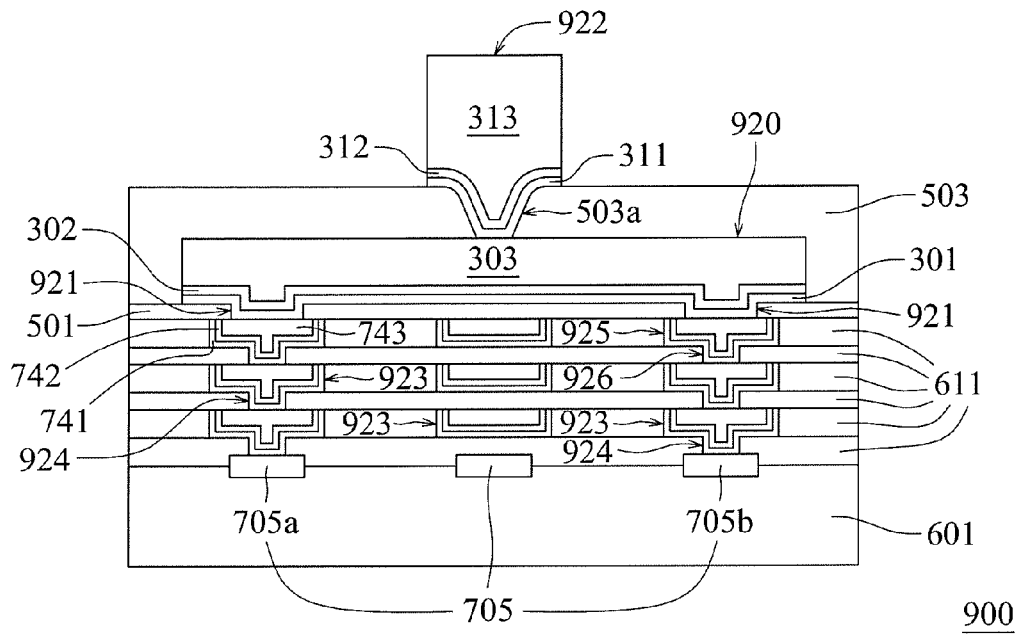

Referring to FIG. 106C, the chip 900 is similar to that shown in FIG. 106A except that the polymer layer 502 is omitted, and the adhesion layer 301 of the patterned metal layer 920 is formed on the passivation layer 501 and on the contact points, exposed by the openings 921, of the metal traces or pads 925. The element in FIG. 106C indicated by a same reference number as indicates the element in FIG. 106A has a same material and spec as the element illustrated in FIG. 106A.

Figure 106D:
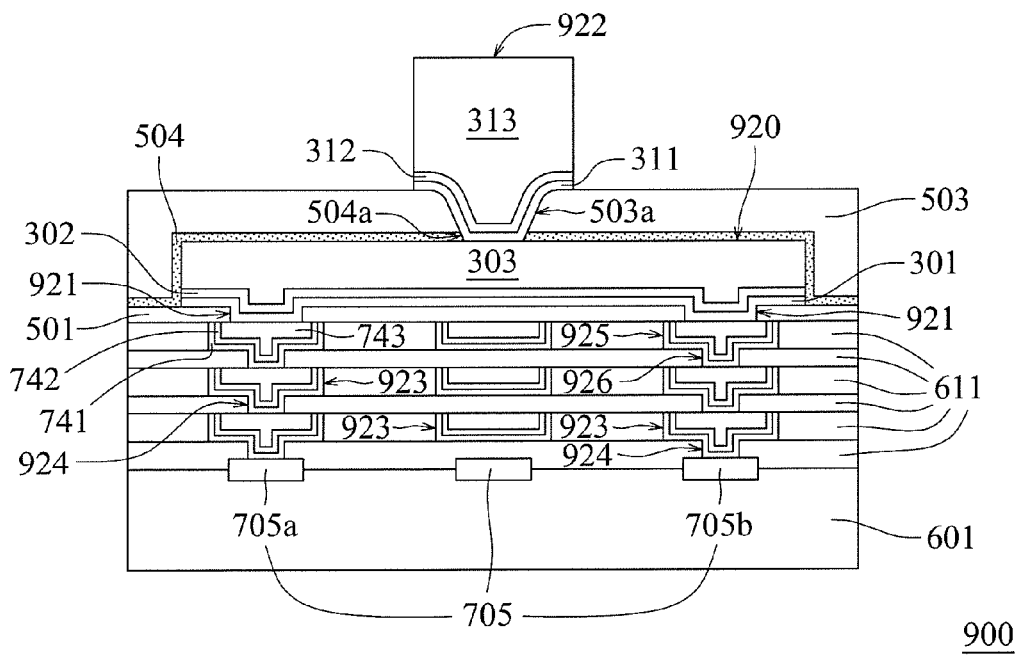

Referring to FIG. 106D, the chip 900 is similar to that shown in FIG. 106C except that an insulating layer 504 is formed on the metal layer 303 and on the passivation layer 501, and the polymer layer 503 is formed on the insulating layer 504 and over the metal layer 303. The patterned metal layer 920 is covered with the insulating layer 504, and multiple openings 504a (one of them is shown) in the insulating layer 504 are over multiple contact points of the metal layer 303 and under the openings 503a and expose these contact points. The insulating layer 504 may have a thickness larger than 0.1 micrometers, such as between 0.2 and 1.5 micrometers, and preferably between 0.3 and 1 micrometers, and can be a single layer of silicon oxide, silicon oxynitride or silicon nitride, or a composite layer including an oxide layer, such as silicon oxide, and a nitride layer, such as silicon nitride, on the oxide layer. The insulating layer 504 can be formed by a chemical vapor deposition (CVD) process. The element in FIG. 106D indicated by a same reference number as indicates the element in FIG. 106A has a same material and spec as the element illustrated in FIG. 106A.

Figure 106E:
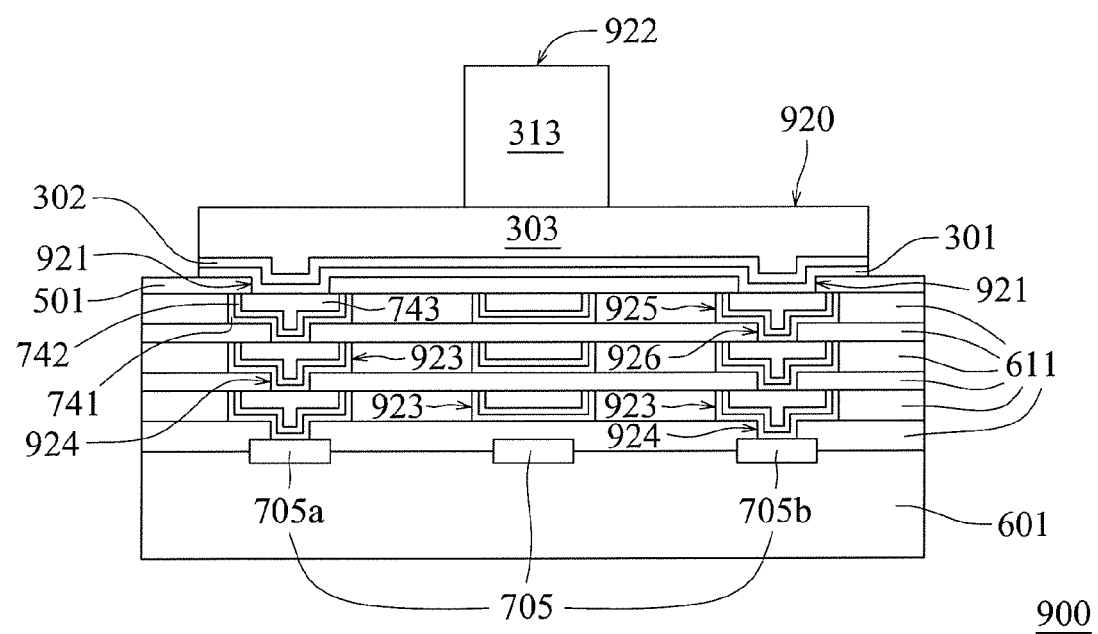

Referring to FIG. 106E, the chip 900 is similar to that shown in FIG. 106A except that the polymer layers 502 and 503 are omitted, the adhesion layer 301 of the patterned metal layer 920 is formed on the passivation layer 501 and on the contact points, exposed by the openings 921, of the metal traces or pads 925, and the metal pillars or bumps 922 (one of them is shown) are formed without the adhesion layer 311 and the seed layer 312, but formed with the metal layer 313 directly on multiple contact points of the metal layer 303 of the patterned metal layer 920. The metal layer 313 shown in FIG. 106E may have a thickness greater than 5 micrometers, such as between 5 and 50 micrometers, and preferably between 10 and 20 micrometers, and can be a single layer of copper, nickel or gold, or a composite layer including a copper layer having a thickness between 5 and 50 micrometers, a nickel layer having a thickness between 0.1 and 10 micrometers on the copper layer, and a gold layer having a thickness between 0.01 and 5 micrometers on the nickel layer. The element in FIG. 106E indicated by a same reference number as indicates the element in FIG. 106A has a same material and spec as the element illustrated in FIG. 106A.

Figure 106F:
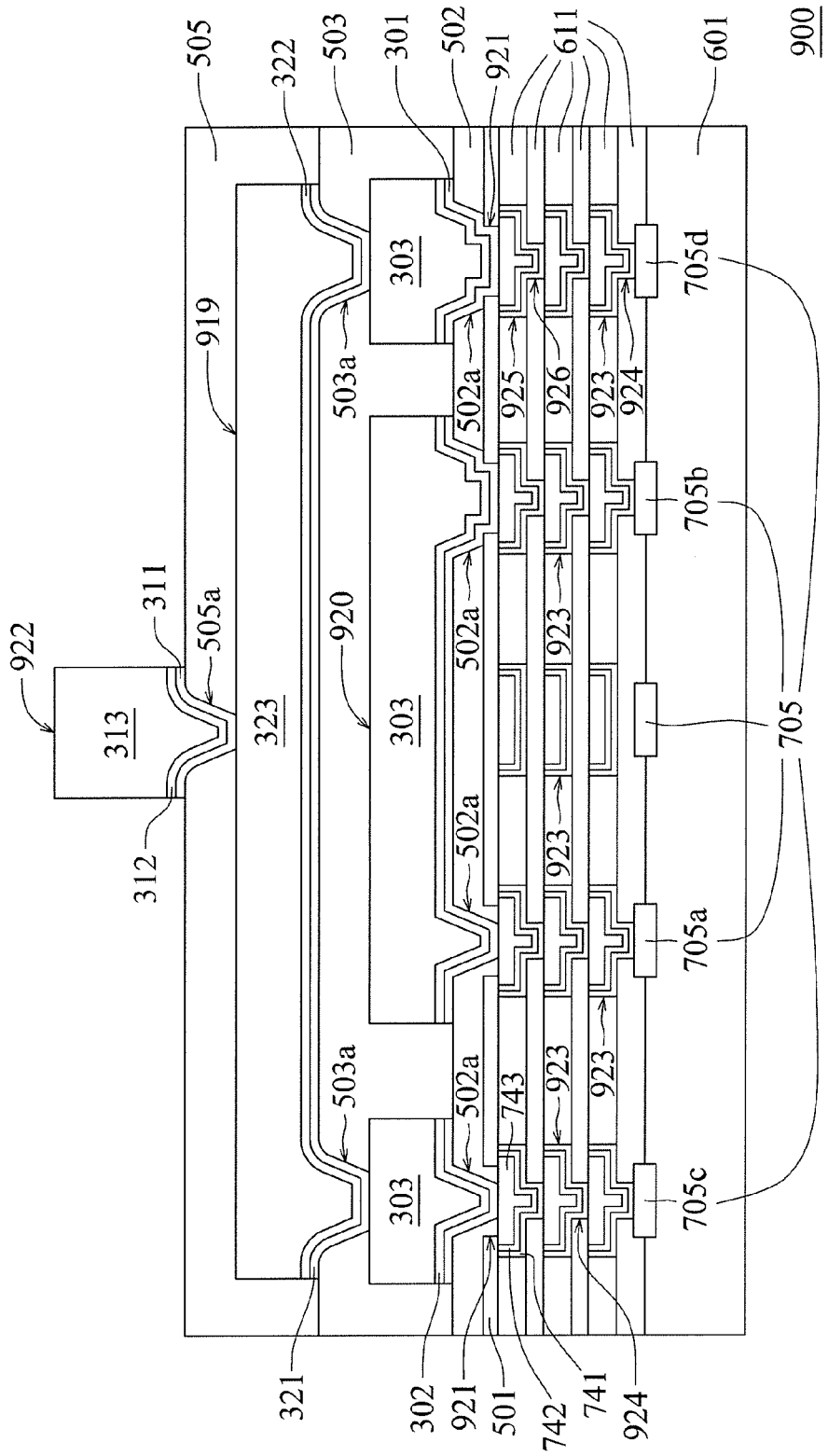

Referring to FIG. 106F, compared with the chip 900 illustrated in FIG. 160A, the chip 900 shown in FIG. 160F further includes a patterned metal layer 919 and a polymer layer 505. The element in FIG. 106F indicated by a same reference number as indicates the element in FIG. 106A has a same material and spec as the element illustrated in FIG. 106A.

The patterned metal layer 919 can be formed on the polymer layer 503, over the patterned metal layer 920, and on the contact points, exposed by the openings 503a in the polymer layer 503, of the metal layer 303 of the patterned metal layer 920. The patterned metal layer 919 can be composed of an adhesion layer 321, a seed layer 322 and a metal layer 323.

The adhesion layer 321 can be formed on the polymer layer 503, over the patterned metal layer 920, and on the contact points, exposed by the openings 503a, of the metal layer 303. The adhesion layer 321 may have a thickness smaller than 1 micrometer, such as between 1 nanometer and 0.5 micrometers, and may include titanium, a titanium-tungsten alloy, titanium nitride, tantalum, tantalum nitride or chromium. The seed layer 322 can be formed on the adhesion layer 321, over the patterned metal layer 920, over the polymer layer 503 and over the contact points, exposed by the openings 503a, of the metal layer 303. The seed layer 322 may have a thickness smaller than 1 micrometer, such as between 10 nanometers and 0.8 micrometers, and may include copper, titanium-copper alloy, gold or nickel. The metal layer 323 can be formed on the seed layer 322, over the patterned metal layer 920, over the polymer layer 503 and over the contact points, exposed by the openings 503a, of the metal layer 303. Sidewalls of the metal layer 323 are not covered by the seed layer 322 and the adhesion layer 321. The thickness of the metal layer 323 can be greater than that of each of the metal traces or pads 925 and greater than that of each of the fine-line metal layers 923.

For example, the adhesion layer 321 can be a titanium-containing layer, such as a single layer of titanium-tungsten alloy, titanium or titanium nitride, with a thickness smaller than 1 micrometer, such as between 1 nanometer and 0.5 micrometers, on the polymer layer 503, over the patterned metal layer 920 and on the contact points, exposed by the openings 503a, of the metal layer 303. The seed layer 322 can be a single layer of copper or titanium-copper alloy with a thickness smaller than 1 micrometer, such as between 10 nanometers and 0.8 micrometers, on the titanium-containing layer, over the patterned metal layer 920, over the polymer layer 503 and over the contact points, exposed by the openings 503a, of the metal layer 303. The metal layer 323 can be a copper layer having a thickness greater than 1 micrometer, such as between 2 and 30 micrometers, and preferably between 3 and 10 micrometers, on the single layer of copper or titanium-copper alloy, over the patterned metal layer 920, over the polymer layer 503 and over the contact points, exposed by the openings 503a, of the metal layer 303.

Alternatively, the adhesion layer 321 can be a tantalum-containing layer, such as a single layer of tantalum or tantalum nitride, with a thickness smaller than 1 micrometer, such as between 1 nanometer and 0.5 micrometers, on the polymer layer 503, over the patterned metal layer 920 and on the contact points, exposed by the openings 503a, of the metal layer 303. The seed layer 322 can be a single layer of copper or titanium-copper alloy with a thickness smaller than 1 micrometer, such as between 10 nanometers and 0.8 micrometers, on the tantalum-containing layer, over the patterned metal layer 920, over the polymer layer 503 and over the contact points, exposed by the openings 503a, of the metal layer 303. The metal layer 323 can be a copper layer having a thickness greater than 1 micrometer, such as between 2 and 30 micrometers, and preferably between 3 and 10 micrometers, on the single layer of copper or titanium-copper alloy, over the patterned metal layer 920, over the polymer layer 503 and over the contact points, exposed by the openings 503a, of the metal layer 303.

The polymer layer 505 can be formed on the metal layer 323 of the patterned metal layer 919 and on the polymer layer 503. Multiple openings 505a (one of them is shown) in the polymer layer 505 are over multiple contact points of the metal layer 323 and expose them. The metal pillars or bumps 922 (one of them is shown) can be formed on the contact points, exposed by the openings 505a, of the metal layer 323 and on the polymer layer 505.

For example, the adhesion layer 311 can be a titanium-containing layer, such as a single layer of titanium-tungsten alloy, titanium or titanium nitride, with a thickness smaller than 1 micrometer, such as between 1 nanometer and 0.5 micrometers, on the contact points, exposed by the openings 505a, of the metal layer 323 and on the polymer layer 505. The seed layer 312 can be a single layer of copper or titanium-copper alloy with a thickness smaller than 1 micrometer, such as between 10 nanometers and 0.8 micrometers, on the titanium-containing layer. The metal layer 313 can be a copper layer with a thickness greater than 5 micrometers, such as between 5 and 50 micrometers, and preferably between 10 and 20 micrometers, on the single layer of copper or titanium-copper alloy. The copper layer has a sidewall or sidewalls not covered by the titanium-containing layer and the single layer of copper or titanium-copper alloy.

Alternatively, the adhesion layer 311 can be a tantalum-containing layer, such as a single layer of tantalum or tantalum nitride, with a thickness smaller than 1 micrometer, such as between 1 nanometer and 0.5 micrometers, on the contact points, exposed by the openings 505a, of the metal layer 323 and on the polymer layer 505. The seed layer 312 can be a single layer of copper or titanium-copper alloy with a thickness smaller than 1 micrometer, such as between 10 nanometers and 0.8 micrometers, on the tantalum-containing layer. The metal layer 313 can be a copper layer with a thickness greater than 5 micrometers, such as between 5 and 50 micrometers, and preferably between 10 and 20 micrometers, on the single layer of copper or titanium-copper alloy. The copper layer has a sidewall or sidewalls not covered by the tantalum-containing layer and the single layer of copper or titanium-copper alloy.

The metal interconnects or traces 171-175, 181-185 or 191-195 as shown in FIG. 105, for example, can be provided by the patterned metal layer 920 and connected to some of the metal pillars or bumps 922 through the patterned metal layer 919. Alternatively, the metal interconnects or traces 171-175, 181-185 or 191-195 as shown in FIG. 105 can be provided by the patterned metal layers 919 and 920, and connected to some of the metal pillars or bumps 922 formed on the patterned metal layer 919.

In a first case, the transistor 705a, when being in the shared-memory circuit block 901 illustrated in FIG. 105, can be physically and electrically connected to the transistor 705b, when being in the circuit block 902, 903 or 904 illustrated in FIG. 105, through the metal interconnect or trace 171,172 173, 174 or 175 illustrated in FIG. 105 provided by the patterned metal layer 920. The transistor 705c, when being in the circuit block 904 illustrated in FIG. 105, can be physically and electrically connected to the transistor 705d, when being in the circuit block 902 or 903 illustrated in FIG. 105, through the metal interconnect or trace 191,192 193, 194 or 195 illustrated in FIG. 105 provided by the patterned metal layers 919 and 920.

In a second case, the transistor 705a, when being in the circuit block 904 illustrated in FIG. 105, can be physically and electrically connected to the transistor 705b, when being in the circuit block 902 or 903 illustrated in FIG. 105, through the metal interconnect or trace 191,192 193, 194 or 195 illustrated in FIG. 105 provided by the patterned metal layer 920. The transistor 705c, when being in the shared-memory circuit block 901 illustrated in FIG. 105, can be physically and electrically connected to the transistor 705d, when being in the circuit block 902, 903 or 904 illustrated in FIG. 105, through the metal interconnect or trace 171,172 173, 174 or 175 illustrated in FIG. 105 provided by the patterned metal layers 919 and 920.

In a third case, the transistor 705a, when being in the shared-memory circuit block 901 illustrated in FIG. 105, can be physically and electrically connected to the transistor 705b, when being in the circuit block 902, 903 or 904 illustrated in FIG. 105, through the metal interconnect or trace 171,172 173, 174 or 175 illustrated in FIG. 105 provided by the patterned metal layer 920. The transistor 705c, when being in the circuit block 902 illustrated in FIG. 105, can be physically and electrically connected to the transistor 705d, when being in the circuit block 903 illustrated in FIG. 105, through the metal interconnect or trace 181,182 183, 184 or 185 illustrated in FIG. 105 provided by the patterned metal layers 919 and 920.

Figure 106G:
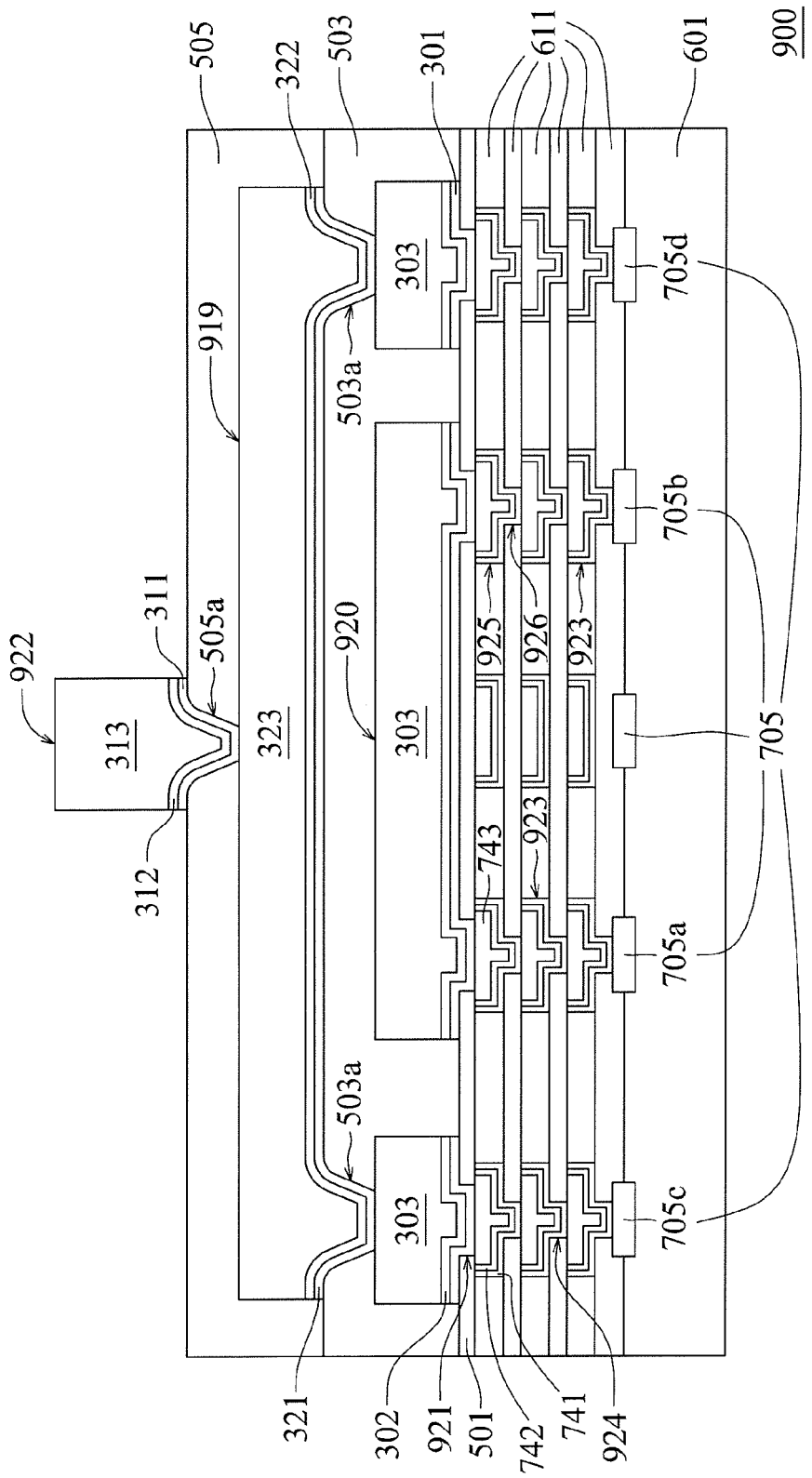

Referring to FIG. 106G, the chip 900 is similar to that shown in FIG. 106F except that the polymer layer 502 is omitted, the polymer layer is formed on the passivation layer 501 and on the patterned metal layer 920, and the adhesion layer 301 of the patterned metal layer 920 is formed on the passivation layer 501 and on the contact points, exposed by the openings 921, of the metal traces or pads 925. The element in FIG. 106G indicated by a same reference number as indicates the element in FIGS. 106A and 106F has a same material and spec as the element illustrated in FIGS. 106A and 106F.

Figure 106H:
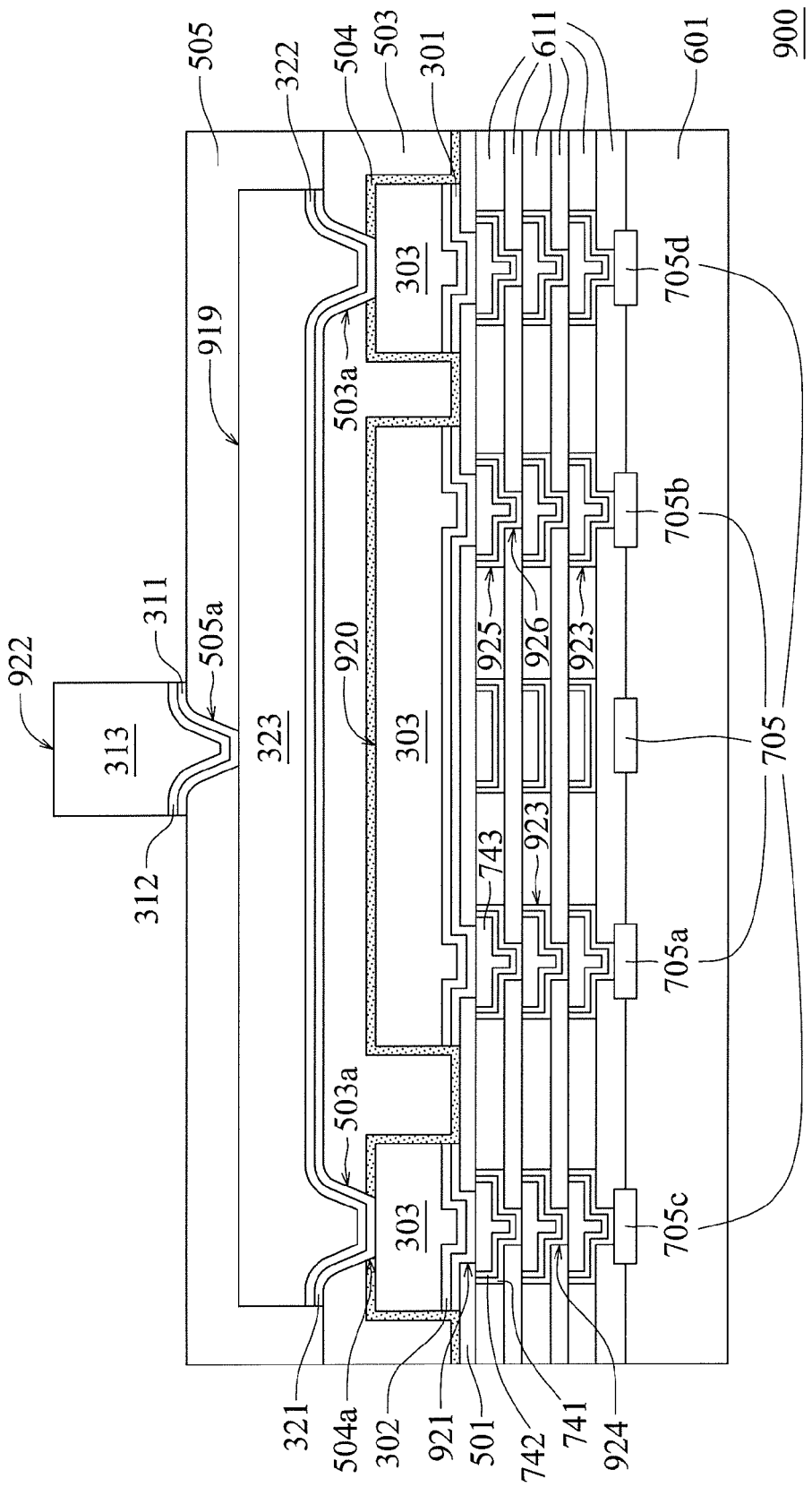

Referring to FIG. 106H, the chip 900 is similar to that shown in FIG. 106G except that an insulating layer 504 is formed on the metal layer 303 and on the passivation layer 501, and the polymer layer 503 is formed on the insulating layer 504 and over the metal layer 303. The patterned metal layer 920 is covered with the insulating layer 504, and multiple openings 504a in the insulating layer 504 are over multiple contact points of the metal layer 303 and under the openings 503a and expose these contact points. The insulating layer 504 may have a thickness larger than 0.1 micrometers, such as between 0.2 and 1.5 micrometers, and preferably between 0.3 and 1 micrometers, and can be a single layer of silicon oxide, silicon oxynitride or silicon nitride, or a composite layer including an oxide layer, such as silicon oxide, and a nitride layer, such as silicon nitride, on the oxide layer. The insulating layer 504 can be formed by a chemical vapor deposition (CVD) process. The element in FIG. 106H indicated by a same reference number as indicates the element in FIGS. 106A and 106F has a same material and spec as the element illustrated in FIGS. 106A and 106F.

The structure of any one of the chips 900 illustrated in FIGS. 106A-106H can be applied to one or more of the chips 120, 130 and 140. For example, the structure of the chip 900 may be applied to any one of the chips 120 shown in FIG. 8, 52, 54, 55, 66, 67, 72, 73, 74, 83, 84, 107K or 107L. The specifications of the metal pillars or bumps 922, the patterned metal layer 920 and the metal traces or pads 925 may be applied to those of the metal pillars or bumps 24, the patterned metal layer 2 and the metal traces or pads 26, respectively, and the processes of forming the metal pillars or bumps 922, the patterned metal layer 920 and the metal traces or pads 925 may be applied to those of forming the metal pillars or bumps 24, the patterned metal layer 2 and the metal traces or pads 26, respectively.

Alternatively, the structure of the chip 900 may be applied to any one of the chips 130 shown in FIG. 19, 52, 54, 55, 66, 67, 72, 73, 74, 83, 84, 107K, 107L or 108F. The specifications of the metal pillars or bumps 922, the patterned metal layer 920 and the metal traces or pads 925 may be applied to those of the metal pillars or bumps 44, the patterned metal layer 4 and the metal traces or pads 46, respectively, and the processes of forming the metal pillars or bumps 922, the patterned metal layer 920 and the metal traces or pads 925 may be applied to those of forming the metal pillars or bumps 44, the patterned metal layer 4 and the metal traces or pads 46, respectively.

Alternatively, the structure of the chip 900 may be applied to any one of the chips 140 shown in FIG. 29, 52, 54, 55, 66, 67, 72, 73, 74, 83, 84, 85, 107K, 107L or 108F. The specifications of the metal pillars or bumps 922, the patterned metal layer 920 and the metal traces or pads 925 may be applied to those of the metal pillars or bumps 64, the patterned metal layer 6 and the metal traces or pads 66, respectively, and the processes of forming the metal pillars or bumps 922, the patterned metal layer 920 and the metal traces or pads 925 may be applied to those of forming the metal pillars or bumps 64, the patterned metal layer 6 and the metal traces or pads 66, respectively.

Figure 107A:
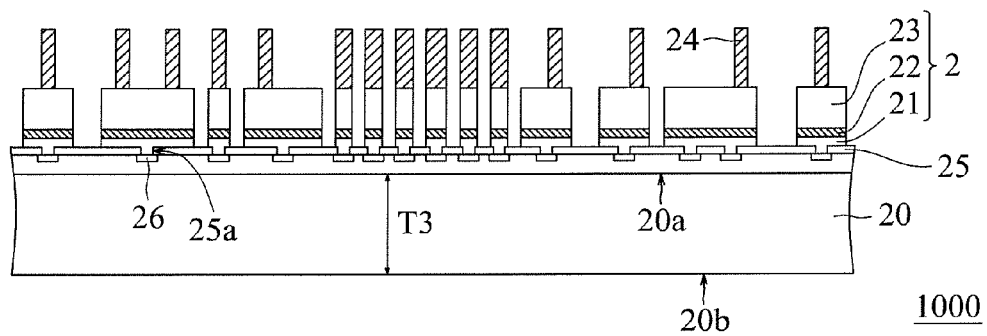
FIGS. 107A-107D show a process for forming a chip, according to an embodiment of the present disclosure.

FIGS. 107A-107D show a process for forming another alternate of chips 120. Referring to FIG. 107A, a semiconductor wafer 1000 may comprise a semiconductor substrate 20, multiple transistors in and/or over the semiconductor substrate 20, multiple fine-line metal layers over the semiconductor substrate 20, multiple dielectric layers over the semiconductor substrate 20 and between the fine-line metal layers, multiple via plugs in the dielectric layers, a passivation layer 25 over the semiconductor substrate 20, over the transistors, over the dielectric layers and over the fine-line metal layers, a patterned metal layer 2 on the passivation layer 25, and multiple metal pillars or bumps 24 on the patterned metal layer 2. The dielectric layers can be composed of a single layer of silicon oxide, silicon nitride, silicon oxynitride, silicon carbon nitride or silicon oxycarbide, or a composite layer made of the previously described materials. The specification of the passivation layer 25 can be referred to as the specification of the passivation layer 25 as illustrated in FIG. 8. In a case, the passivation layer 25 of the semiconductor wafer 1000 may include a topmost inorganic layer of the semiconductor wafer 1000, and the topmost inorganic layer of the semiconductor wafer 1000 can be a layer of a nitrogen-containing compound, such as silicon nitride, silicon oxynitride, silicon carbon nitride or silicon carbon oxynitride, having a thickness greater than 0.2 micrometers, such as between 0.2 and 1.5 micrometers, or a layer of an oxygen-containing compound, such as silicon oxide, silicon oxynitride, silicon carbon oxide or silicon carbon oxynitride, having a thickness greater than 0.2 micrometers, such as between 0.2 and 1.5 micrometers.

In the semiconductor wafer 1000, multiple metal traces or pads 26 provided by the topmost fine-line metal layer are formed over the semiconductor substrate 20, on one of the dielectric layers and under the passivation layer 25. Multiple openings 25a in the passivation layer 25 are over multiple contact points of the metal traces or pads 26 and expose them, and the contact points of the metal traces or pads 26 are at bottoms of the openings 25a. Each of the openings 25a may have a width or diameter between 0.5 and 100 micrometers, and preferably between 1 and 20 micrometers. The patterned metal layer 2 can be formed on the contact points, exposed by the openings 25a, of the metal traces or pads 26 and on the passivation layer 25, and can be connected to the contact points, exposed by the openings 25a, of the metal traces or pads 26 through the openings 25a.

The metal traces or pads 26 may include aluminum, aluminum-copper-alloy or electroplated copper. Alternatively, the structure and the circuit design of the metal traces or pads 26 can be referred to as the structure and the circuit design of the metal traces or pads 925 as illustrated in FIG. 106A, that is, the metal traces or pads 26, for example, can be formed by a damascene or double-damascene process including an electroplating process and a chemical mechanical polishing (CMP) process, and can be composed of the electroplated copper layer 743, the adhesion/barrier layer 741 at the bottom of the electroplated copper layer 743 and at the sidewalls of the electroplated copper layer 743, and the seed layer 742 between the electroplated copper layer 743 and the adhesion/barrier layer 741, at the bottom of the electroplated copper layer 743 and at the sidewalls of the electroplated copper layer 743. The sidewalls of the electroplated copper layer 743 are covered by the adhesion/barrier layer 741 and the seed layer 742.

The semiconductor substrate 20 of the semiconductor wafer 1000 can be a silicon substrate or a gallium arsenide (GaAs) substrate, and may have a thickness T3 greater than 100 micrometers, such as between 100 and 300 micrometers, or between 150 and 250 micrometers.

The patterned metal layer 2 of the semiconductor wafer 1000 can be composed of an adhesion layer 21 on the contact points, exposed by the openings 25a, of the metal traces or pads 26 and on the passivation layer 25, a seed layer 22 on the adhesion layer 21, and a metal layer 23 on the seed layer 22. The specification of the adhesion layer 21, the seed layer 22 and the metal layer 23 can be referred to as the specification of the adhesion layer 21, the seed layer 22 and the metal layer 23 as illustrated in FIG. 8, respectively. The sidewalls of the metal layer 23 are not covered by the adhesion layer 21 and the seed layer 22.

The metal pillars or bumps 24 can be formed on the metal layer 23 of the patterned metal layer 2, and can be connected to the contact points, exposed by the openings 25a, of the metal traces or pads 26 through the patterned metal layer 2 and through the openings 25a in the passivation layer 25. Each of the metal pillars or bumps 24 has a thickness or height greater than 5 micrometers, such as between 5 and 50 micrometers, and preferably between 10 and 20 micrometers. The specification of the metal pillars or bumps 24 can be referred to as the specification of the metal pillars or bumps 24 as illustrated in FIG. 8.

Figure 107B:
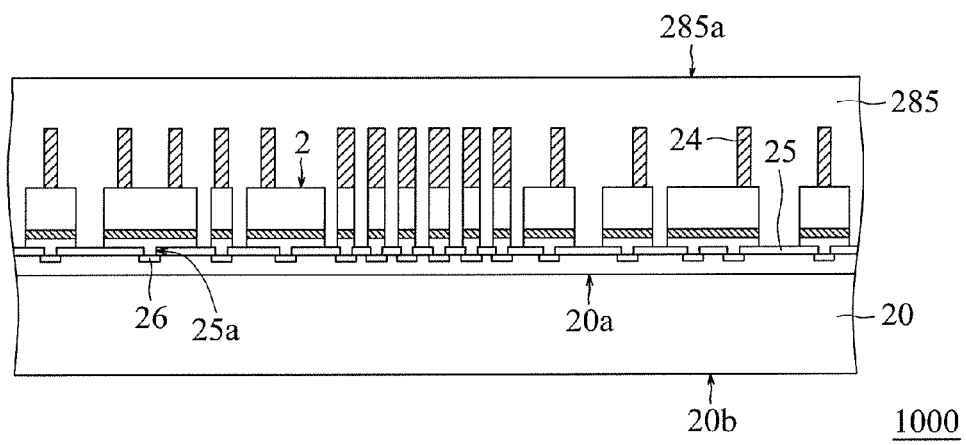

Next, referring to FIG. 107B, a polymer layer 285 can be formed on the passivation layer 25, on the patterned metal layer 2, and on the metal pillars or bumps 24 by using a molding process or a lamination process. The patterned metal layer 2 and the metal pillars or bumps 24 are covered with the polymer layer 285. The top surface 285a of the polymer layer 285 is substantially flat. The polymer layer 285 can be a polyimide or epoxy layer having a coefficient of thermal expansion smaller than 15, such as between 3 and 6, between 2 and 8, between 5 and 10 or between 8 and 15.

The semiconductor wafer 1000 has a top side 20a and a bottom side 29b. The metal traces or pads 26, the passivation layer 25, the patterned metal layer 2, the metal pillars or bumps 24 and the polymer layer 285 are over the top side 20a of the semiconductor wafer 1000.

Figure 107C:
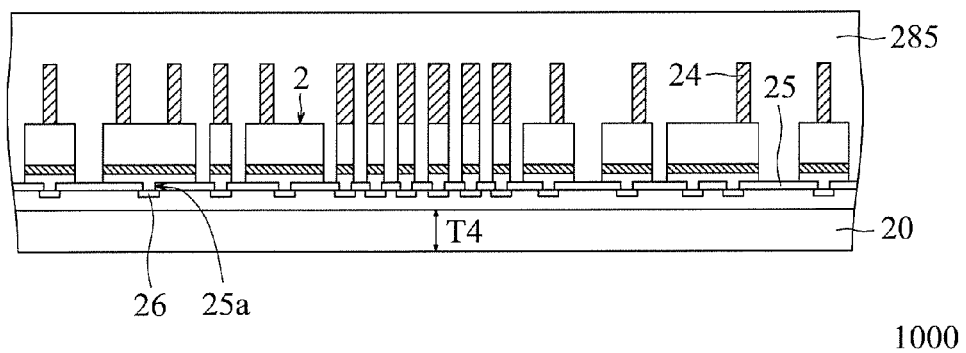

Next, referring to FIG. 107C, the semiconductor substrate 20 of the semiconductor wafer 1000 is thinned to a thickness T4 between 1 and 30 micrometers, between 2 and 10 micrometers, between 5 and 50 micrometers or between 10 and 100 micrometers by mechanically grinding or chemically mechanically polishing (CMP) the bottom side 20b of the semiconductor substrate 20.

Figure 107D:
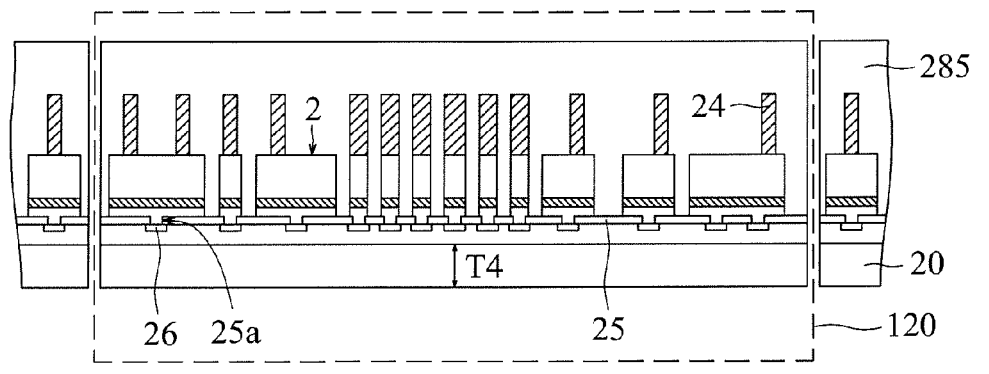

Referring to FIG. 107D, after the step illustrated in FIG. 107C, the semiconductor wafer 1000 can be cut into a plurality of individual chip 120 by a die-sawing process. Compared with the chips 120 illustrated in FIG. 8, each of the chips 120 (one of them is shown) illustrated in FIG. 107D further includes the polymer layer 285 which covers the patterned metal layer 2 and the metal pillars or bumps 24 and has a first sidewall and a second sidewall opposite to and substantially parallel with the first sidewall. In each of the chips 120, the top surface of the polymer layer 285 is substantially flat.

Figure 107E:
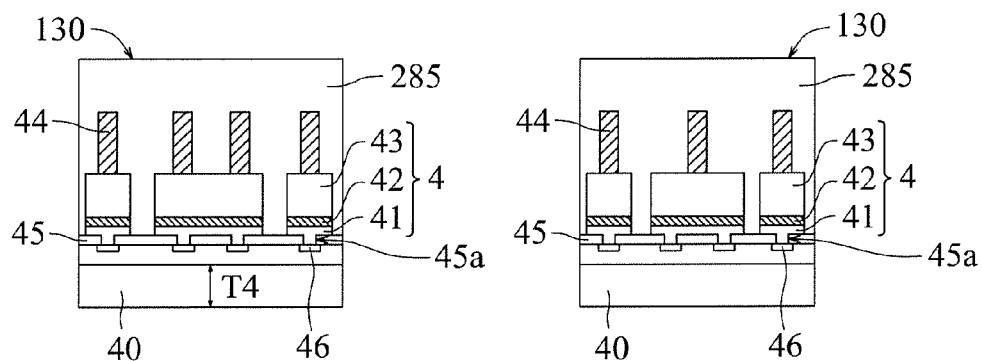
FIG. 107E shows a cross-sectional view of a chip, according to an embodiment of the present disclosure.

FIG. 107E shows a cross-sectional view for another alternate of chips 130. The chips 130 can be formed by a process including the steps illustrated in FIGS. 107A-107D. Compared with the chips 130 illustrated in FIG. 19, each of the chips 130 illustrated in FIG. 107E further includes the polymer layer 285 which covers the patterned metal layer 4 and the metal pillars or bumps 44 and has a first sidewall and a second sidewall opposite to and substantially parallel with the first sidewall. In each of the chips 130, the top surface of the polymer layer 285 is substantially flat, and the semiconductor substrate 40 has a thickness T4 between 1 and 30 micrometers, between 2 and 10 micrometers, between 5 and 50 micrometers or between 10 and 100 micrometers.

Figure 107F:
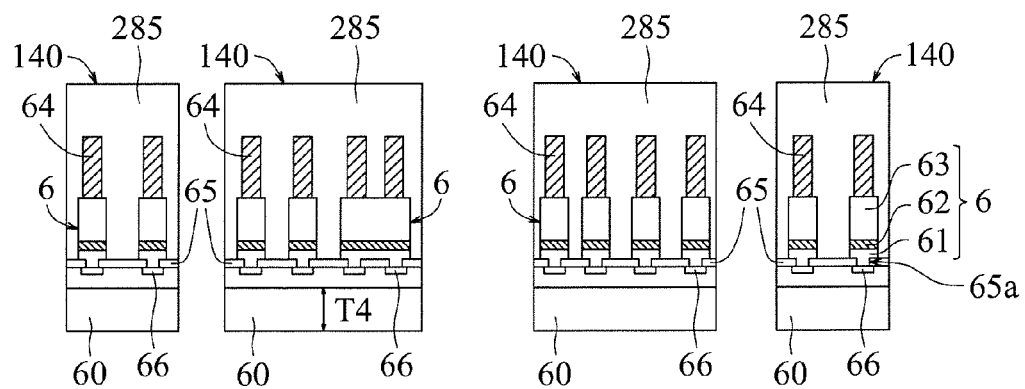
FIG. 107F shows a cross-sectional view of a chip, according to an embodiment of the present disclosure.

FIG. 107F shows a cross-sectional view for another alternate of chips 140. The chips 140 can be formed by a process including the steps illustrated in FIGS. 107A-107D. Compared with the chips 140 illustrated in FIG. 29, each of the chips 140 illustrated in FIG. 107F further includes the polymer layer 285 which covers the patterned metal layer 6 and the metal pillars or bumps 64 and has a first sidewall and a second sidewall opposite to and substantially parallel with the first sidewall. In each of the chips 140, the top surface of the polymer layer 285 is substantially flat, and the semiconductor substrate 60 has a thickness T4 between 1 and 30 micrometers, between 2 and 10 micrometers, between 5 and 50 micrometers or between 10 and 100 micrometers.

Figure 107G:
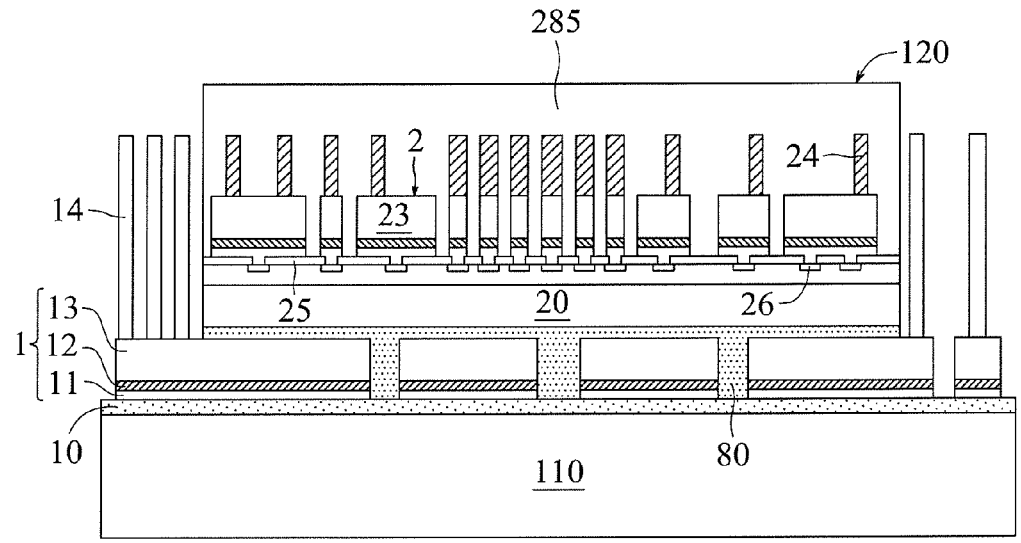
FIGS. 107G-107K are cross-sectional views showing a process of forming a system-in package or multichip module, according to an embodiment of the present disclosure.

FIGS. 107G-107K show a process for forming another system-in package or multichip module according to another embodiment of the present disclosure. Referring to FIG. 107G, after the steps illustrated in FIGS. 1-7, the chips 120 (one of them is shown) illustrated in FIG. 107D can be attached to the metal layer 13 of the patterned metal layer 1 and to the dielectric or insulating layer 10 by the previously described glue material 80.

Alternatively, after the steps illustrated in FIGS. 1-7, a polymer layer can be formed on the metal layer 13 of the patterned metal layer 1 and on the dielectric or insulating layer 10, and then the chips 120 illustrated in FIG. 107D can be attached to the polymer layer by the glue material 80. In this case, the glue material 80 is formed on the polymer layer, and the chips 120 illustrated in FIG. 107D are formed on the glue material 80. The polymer layer can be a polyimide layer or a benzocyclobutene layer having a thickness between 2 and 30 micrometers.

Figure 107H:
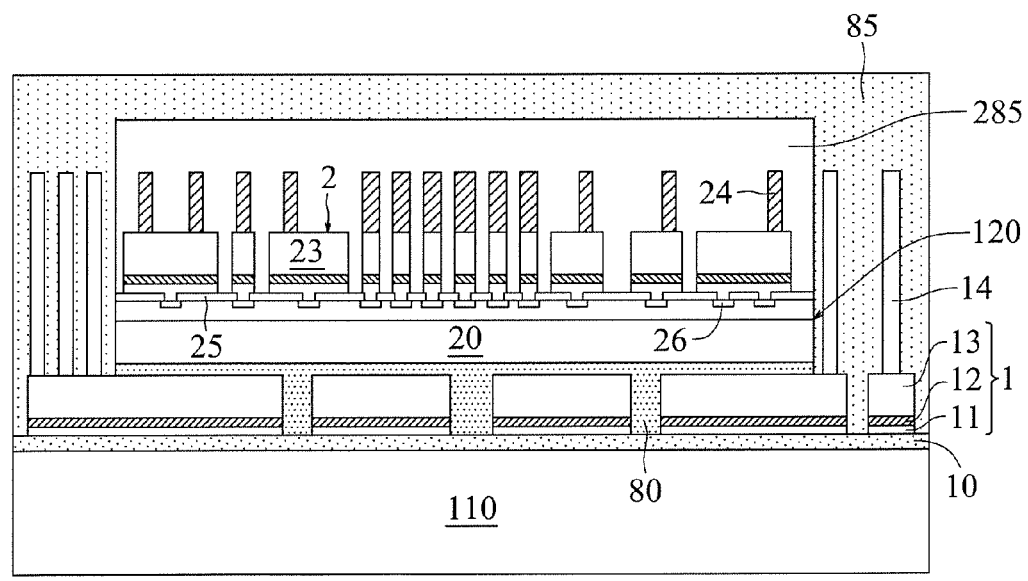

Referring to FIG. 107H, after attaching the chips 120 to the metal layer 13 of the patterned metal layer 1 and to the dielectric or insulating layer 10, the previously described filling or encapsulating layer 85 can be formed over the substrate 110, on the dielectric or insulating layer 10, on the metal layer 13 of the patterned metal layer 1, on the metal pillars or bumps 14, and on the polymer layer 285 of chips 120 by using a molding process, a spin coating process, a lamination process or a printing process.

Figure 107I:
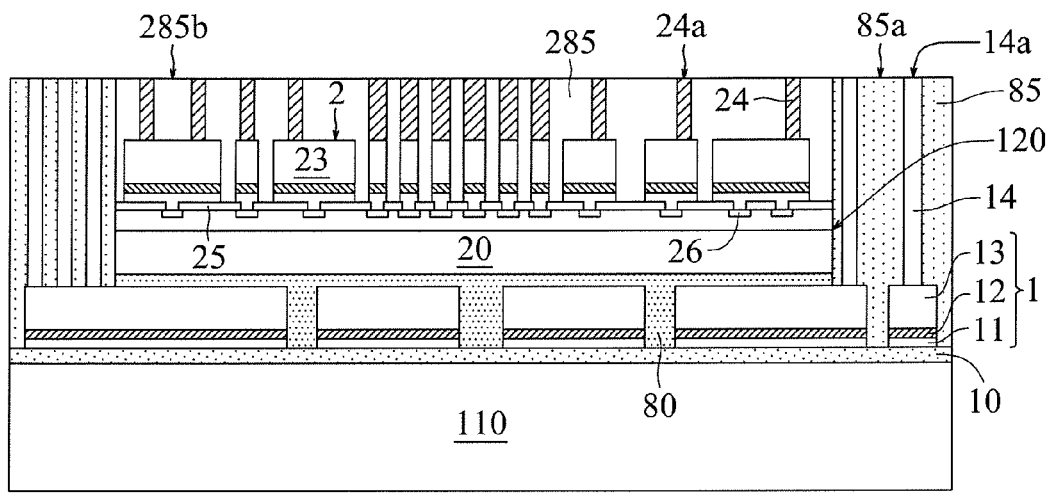

Next, referring to FIG. 107I, the filling or encapsulating layer 85 and the polymer layer 285 are ground or polished by a grinding or polishing process, such as mechanical grinding process, mechanical polishing process or chemical mechanical polishing (CMP) process. Accordingly, top surfaces 14a of the metal pillars or bumps 14 and top surfaces 24a of the metal pillars or bumps 24 are exposed and are not covered by the filling or encapsulating layer 85 and the polymer layer 285, and the top surfaces 24a of the metal pillars or bumps 24 are substantially coplanar with the top surfaces 14a of the metal pillars or bumps 14, with a top surface 85a of the filling or encapsulating layer 85, and with a top surface 285b of the polymer layer 285. The specification of the metal pillars or bumps 14 and 24, after the grinding or polishing process, illustrated in FIG. 107I can be referred to as the specification of the metal pillars or bumps 14 and 24, after the grinding or polishing process, as illustrated in FIG. 12, respectively.

Figure 107J:
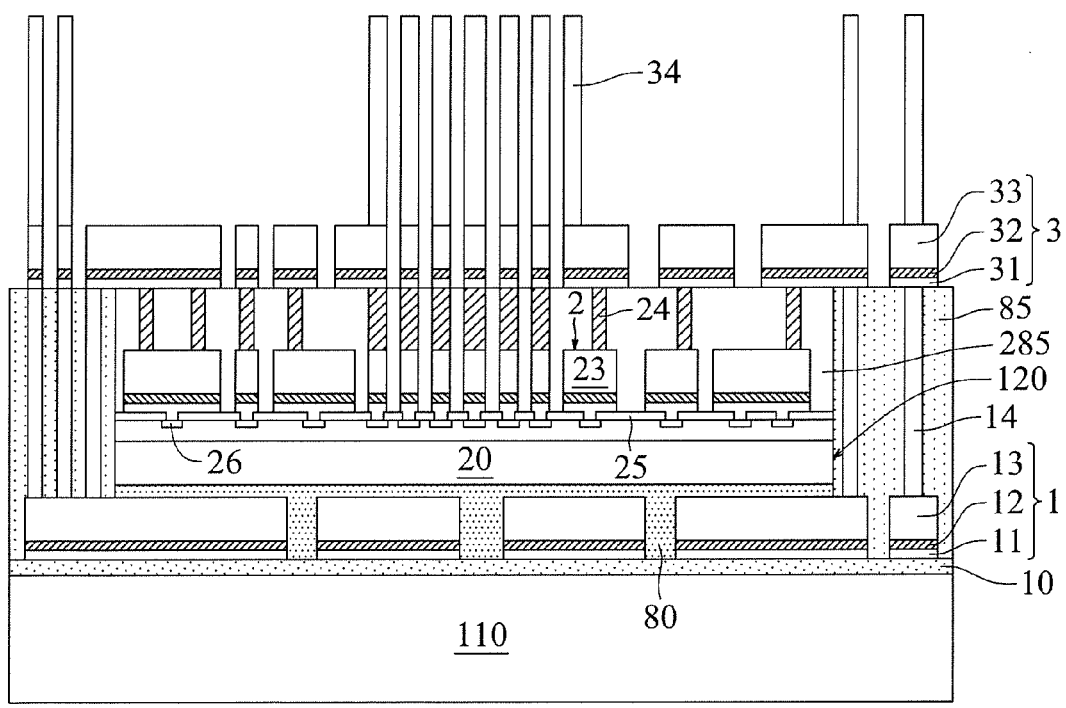

Next, referring to FIG. 107J, the steps illustrated in FIGS. 13-18 can be performed to provide the previously described patterned metal layer 3 and the previously described metal pillars or bumps 34 formed on the patterned metal layer 3. The patterned metal layer 3 is formed on the top surface 85a of the filling or encapsulating layer 85, on the top surface 285b of the polymer layer 285, on the top surfaces 24a of the metal pillars or bumps 24 and on the top surfaces 14a of the metal pillars or bumps 14, and is composed of the previously described adhesion layer 31 on the top surfaces 85a, 285b, 24a and 14a, the previously described seed layer 32 on the adhesion layer 31 and the previously described metal layer 33 on the seed layer 32.

Figure 107K:
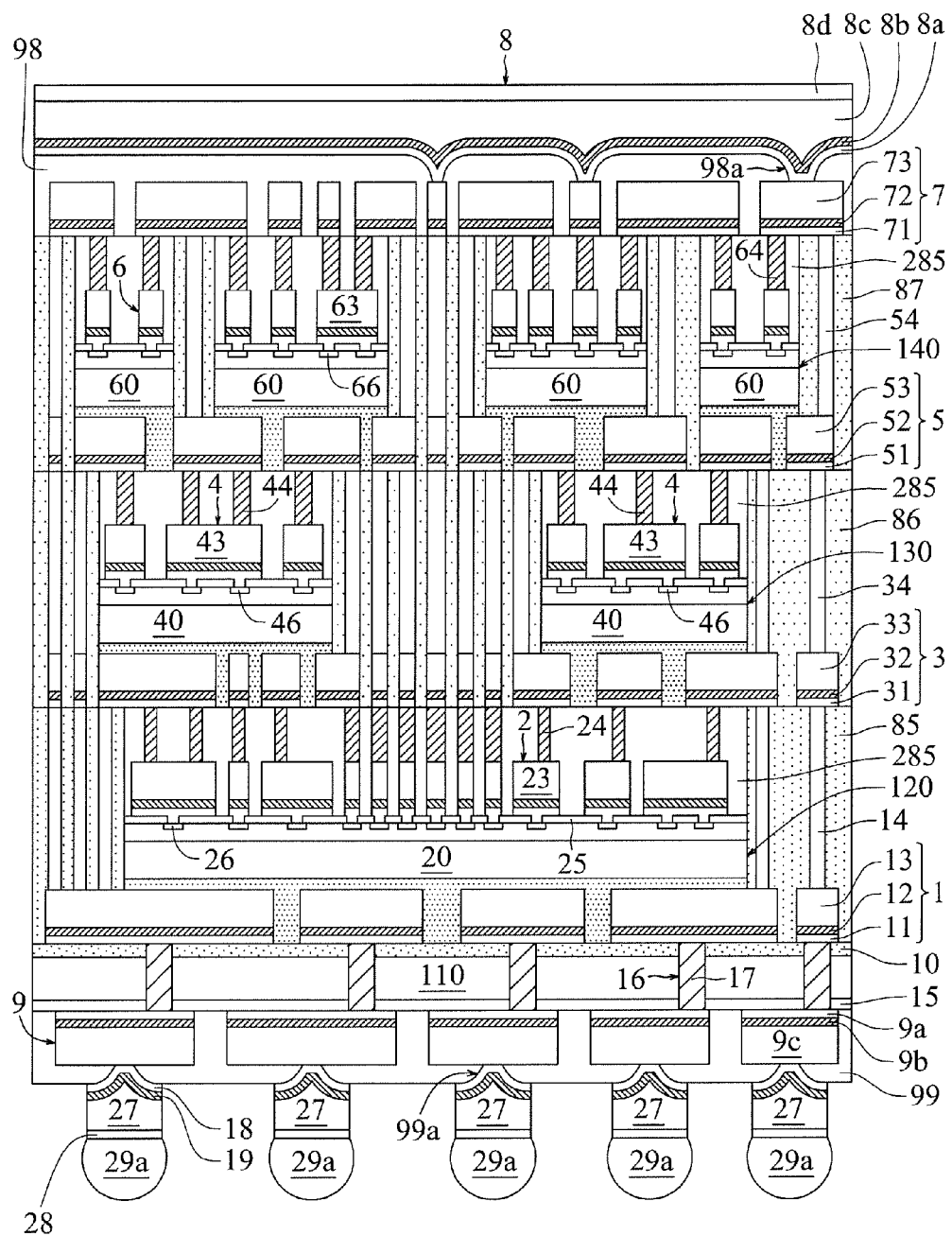
Figure 107L:
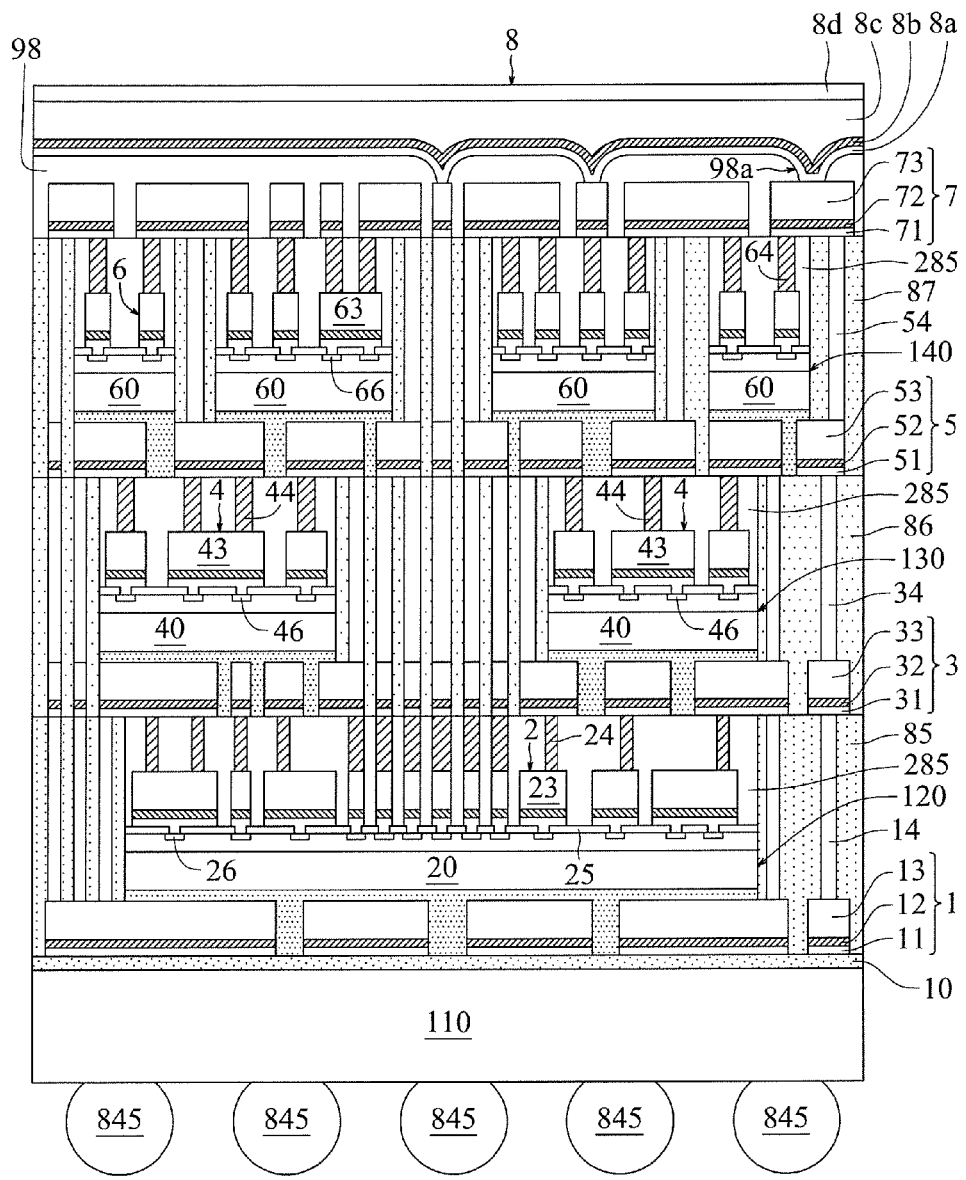
FIG. 107L shows a cross-sectional view of a system-in package or multichip module, according to an embodiment of the present disclosure.

Next, the steps illustrated in FIGS. 19-52 can be performed, except of using the chips 130 illustrated in FIG. 107E instead of the chips 130 illustrated in FIG. 19 and using the chips 140 illustrated in FIG. 107F instead of the chips 140 illustrated in FIG. 29, to provide a plurality of the system-in package or multichip module shown in FIG. 107K. The system-in package or multichip module shown in FIG. 107K can be connected to a mother board, a printed circuit board, a metal substrate, a glass substrate or a ceramic substrate using the solder bumps or balls 29a. Alternatively, the substrate 110 of the system-in package or multichip module shown in FIG. 107K can be replaced by a ball-grid-array (BGA) substrate or a print circuit board (PCB), that is, the solder bumps or balls 845 illustrated in FIG. 104 can be formed on a bottom surface of the substrate 110 after the step illustrated in FIG. 39, and then a singulation process can be performed to cut the substrate 110, the filling or encapsulating layers 85, 86 and 87 and the thermal spreading plane 8 and to singularize a plurality of the system-in package or multichip module shown in FIG. 107L. The patterned metal layer 1 of the system-in package or multichip module shown in FIG. 107L can be connected to the solder bumps or balls 845 through multiple metal layers in the substrate 110. The system-in package or multichip module shown in FIG. 107L can be connected to a mother board, a printed circuit board, a metal substrate, a glass substrate or a ceramic substrate using the solder bumps or balls 845.

Figure 108A:
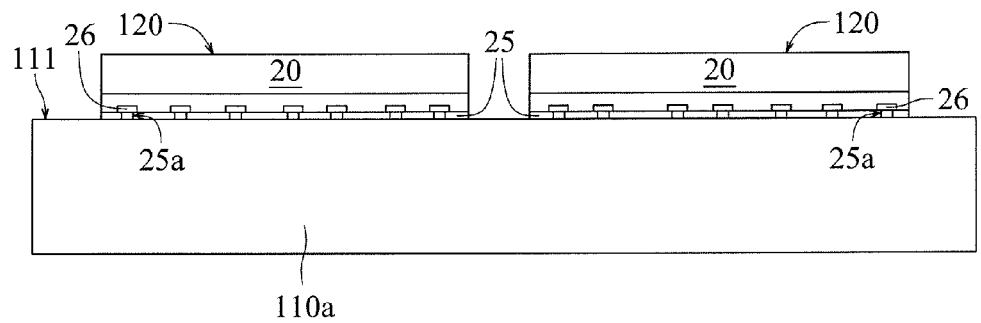
FIGS. 108A-108F are cross-sectional views showing a process for forming a system-in package or multichip module, according to an embodiment of the present disclosure.

FIGS. 108A-108F show a process for forming another system-in package or multichip module according to another embodiment of the present disclosure. Referring to FIG. 108A, multiple chips 120 can be attached to a surface 111 of a substrate 110a, for example, by sucking the chips 120 using a vacuum through holes in the substrate 110a, or by first coating a glue material, such as polyimide, benzocyclobutane (BCB), polybenzoxazole (PBO), poly-phenylene oxide (PPO), epoxy, silosane or SU-8, on the surface 111 of the substrate 110a and then placing the chips 120 on the glue material.

The chips 120 shown in FIG. 108A are similar to the chips 120 shown in FIGS. 8 and 9 except that the patterned metal layer 2 and the metal pillars or bumps 24 are not formed. Any of the chips 120 can be a central-processing-unit (CPU) chip, a baseband chip, a digital-signal-processing (DSP) chip, a graphics-processing-unit (GPU) chip, a memory chip, such as flash memory chip, dynamic-random-access-memory (DRAM) chip or statistic-random-access-memory (SRAM) chip, a wireless local area network (WLAN) chip, a logic chip, an analog chip, a power device, a regulator, a power management device, a global-positioning-system (GPS)

chip, a Bluetooth chip, or a chip comprising a central-processing-unit (CPU) circuit block, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block and a modem circuit block.

Each of the chips 120 shown in FIG. 108A has the passivation layer 25 and the metal traces or pads 26, under the top surface of the semiconductor substrate 20, at a top side of each chip 120. The bottom surface of the semiconductor substrate 20 is at a backside of each chip 120. The top sides of the chips 120 are attached to the surface 111 of the substrate 110*a*.

Figure 108B:
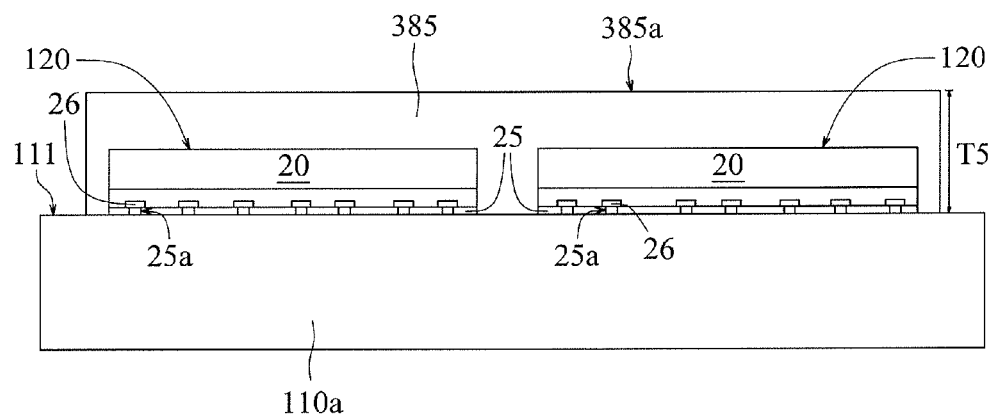

Next, referring to FIG. 108B, a molding layer 385 is formed on the surface 111 of the substrate 110*a*, between the neighboring two chips 120 and on the backsides and sidewalls of the chips 120 by using a molding process. The backsides of the chips 120 are covered by the molding layer 385. The top surface 385*a* of the molding layer 385 is substantially flat. The molding layer 385 may have a left sidewall and a right sidewall opposite to and substantially parallel with the left saidewall. The molding layer 385 may have a thickness T5 greater than 100 micrometers, such as between 150 and 300 micrometers or between 200 and 400 micrometers. The molding layer 385 can be a polymer layer, such as polyimide or epoxy layer having a coefficient of thermal expansion between 2 and 10 or between 5 and 15.

Figure 108C:
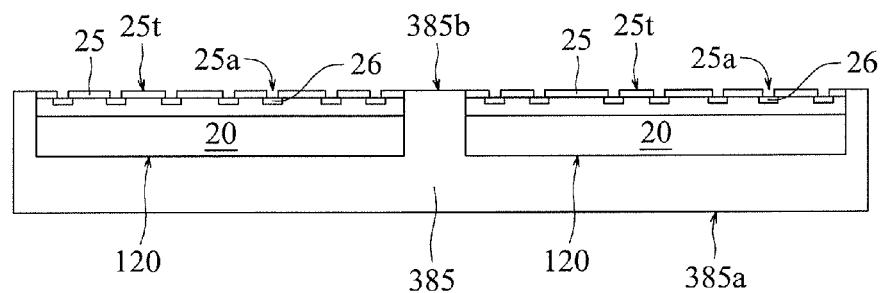

Next, referring to FIG. 108C, the substrate 110*a* is removed from the top sides of the chips 120 and from the molding layer 385, and then the semifinished device can be flipped over to perform the following steps. The molding layer 385 may have a surface 385*b* opposite to the top surface 385*a*. Preferably, the surface 385*b* may be substantially coplanar with the top surfaces 25*t* of the passivation layers 25 of the chips 120.

Figure 108D:
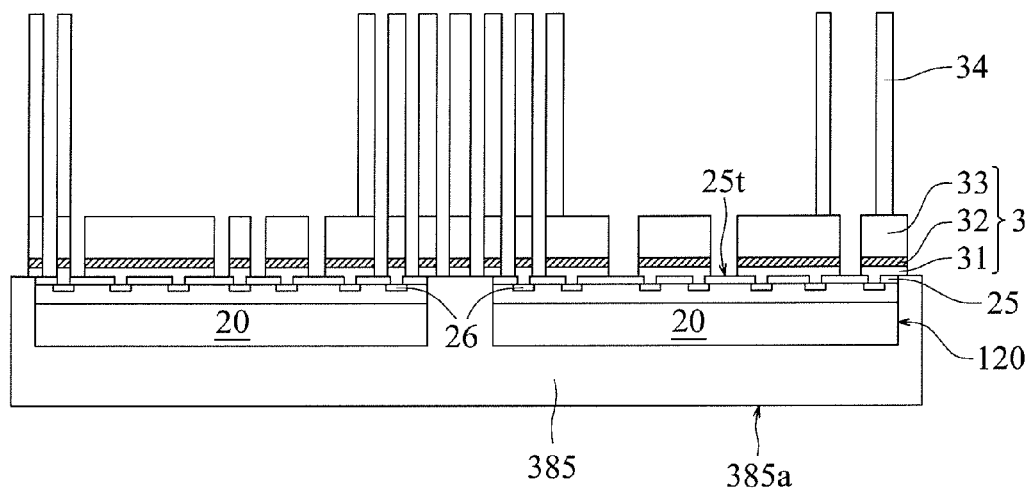

Next, referring to FIG. 108D, the steps illustrated in FIGS. 13-18 can be performed to provide the previously described patterned metal layer 3 and the previously described metal pillars or bumps 34 on the patterned metal layer 3. The patterned metal layer 3 can be formed on multiple contact points, exposed by the openings 25*a* in the passivation layer 25, of the metal traces or pads 26 of each chip 120, on the surface 385*b* of the molding layer 385, and on the top surface 25*t* of the passivation layer 25 of each chip 120.

The patterned metal layer 3 can be composed of the previously described adhesion layer 31, the previously described seed layer 32 on the adhesion layer 31, and the previously described metal layer 33 on the seed layer 32. The sidewalls of the metal layer 33 are not covered by the adhesion layer 31 and the seed layer 32. The adhesion layer 31 can be formed on the contact points, exposed by the openings 25*a* in the passivation layer 25, of the metal traces or pads 26 of each chip 120, on the surface 385*b* of the molding layer 385, and on the top surface 25*t* of the passivation layer 25 of each chip 120.

For example, the adhesion layer 31 can be a titanium-containing layer, such as a single layer of titanium-tungsten alloy, titanium or titanium nitride, having a thickness smaller than 1 micrometer, such as between 1 nanometer and 0.5 micrometers, on the contact points, exposed by the openings 25*a* in the passivation layer 25, of the metal traces or pads 26 of each chip 120, on the surface 385*b* of the molding layer 385, and on the top surface 25*t* of the passivation layer 25 of each chip 120. The seed layer 32 can be a single layer of copper or titanium-copper alloy with a thickness smaller than 1 micrometer, such as between 10 nanometers and 0.8 micrometers, on the titanium-containing layer. The metal layer 33 can be an electroplated copper layer having a thickness between 2 and 30 micrometers, and preferably between 3 and 10 micrometers, on the single layer of copper or titanium-copper alloy. The sidewalls of the electroplated copper layer are not covered by the titanium-containing layer and the single layer of copper or titanium-copper alloy. The metal pillars or bumps 34 can be copper pillars or bumps having a height or thickness greater than 15 micrometers, such as between 15 and 520 micrometers, and preferably between 20 and 110 micrometers, on the electroplated copper layer.

Alternatively, the adhesion layer 31 can be a tantalum-containing layer, such as a single layer of tantalum or tantalum nitride, having a thickness smaller than 1 micrometer, such as between 1 nanometer and 0.5 micrometers, on the contact points, exposed by the openings 25*a* in the passivation layer 25, of the metal traces or pads 26 of each chip 120, on the surface 385*b* of the molding layer 385, and on the top surface 25*t* of the passivation layer 25 of each chip 120. The seed layer 32 can be a single layer of copper or titanium-copper alloy with a thickness smaller than 1 micrometer, such as between 10 nanometers and 0.8 micrometers, on the tantalum-containing layer. The metal layer 33 can be an electroplated copper layer having a thickness between 2 and 30 micrometers, and preferably between 3 and 10 micrometers, on the single layer of copper or titanium-copper alloy. The sidewalls of the electroplated copper layer are not covered by the tantalum-containing layer and the single layer of copper or titanium-copper alloy. The metal pillars or bumps 34 can be copper pillars or bumps having a height or thickness greater than 15 micrometers, such as between 15 and 520 micrometers, and preferably between 20 and 110 micrometers, on the electroplated copper layer.

Figure 108E:
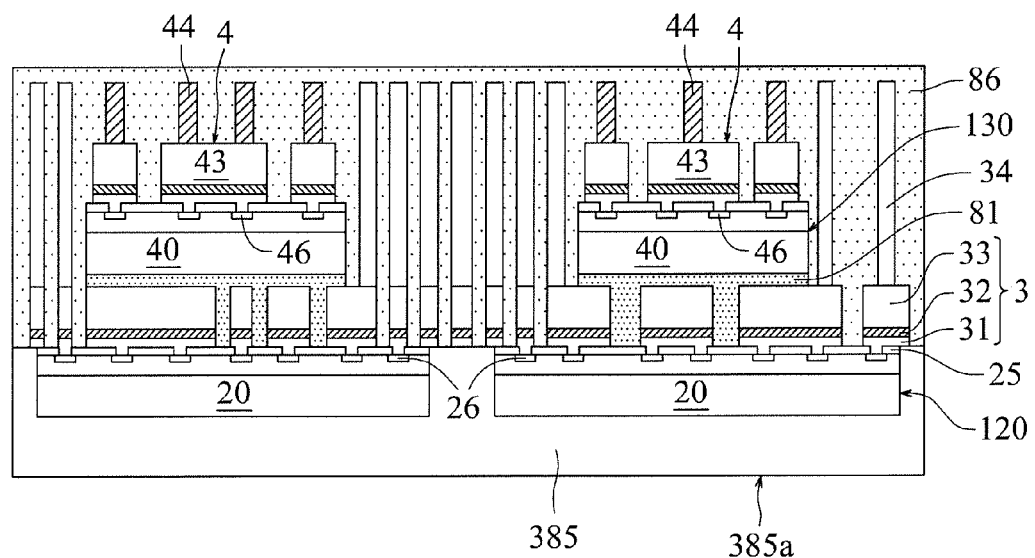

Next, referring to FIG. 108E, the steps illustrated in FIGS. 19-21 can be performed to provide the previously described chips 130 attached to the metal layer 33 of the patterned metal layer 3 by the glue material 81, and provide the previously described filling or encapsulating layer 86 formed on the surface 385*b* of the molding layer 385, on the top surface 25*t* of the passivation layer 25 of each chip 120, on the metal layer 33 of the patterned metal layer 3, on the chips 130, on the metal layer 43 of the patterned metal layer 4 and on tops of the metal pillars or bumps 34 and 44 by using a molding process, a spin coating process, a lamination process or a printing process.

Figure 108F:
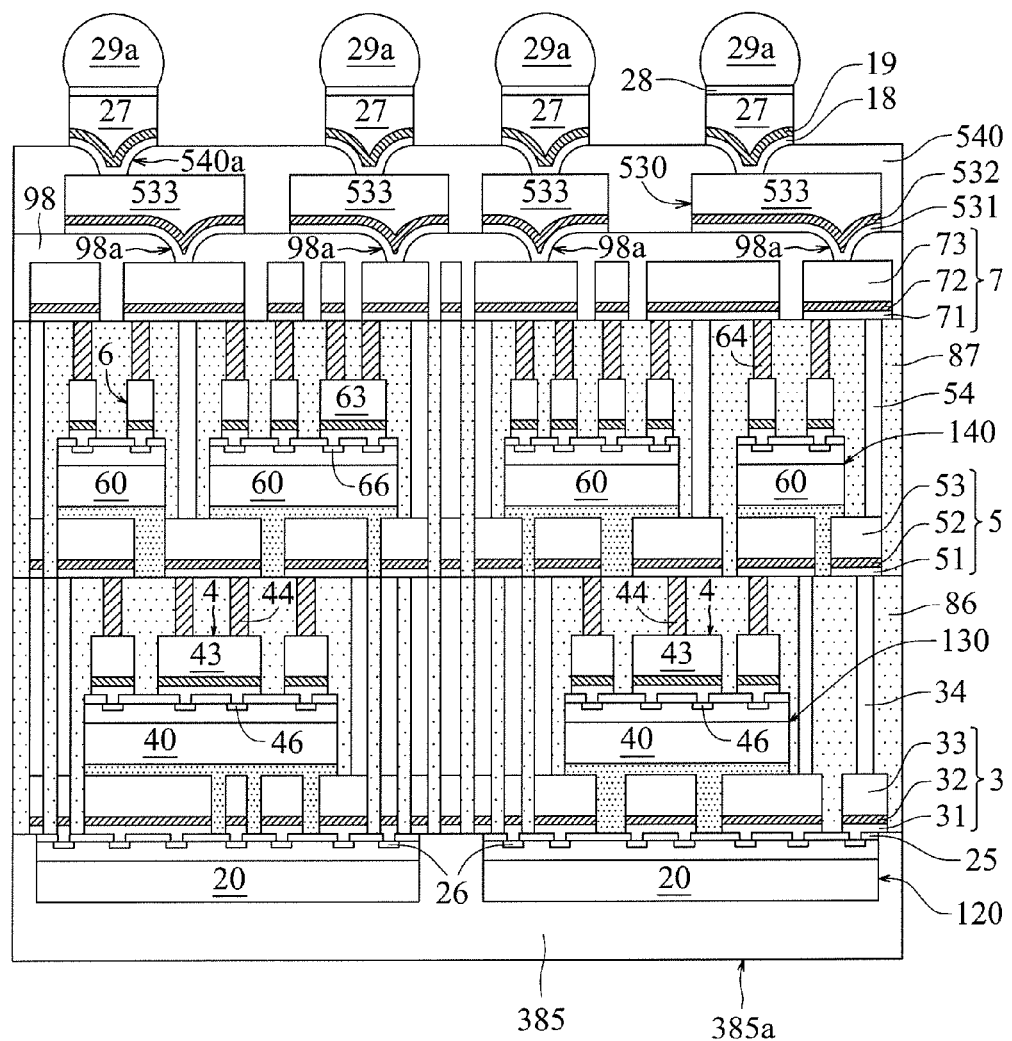

Next, referring to FIG. 108F, the steps illustrated in FIGS. 22-38 and 76-82 can be performed, then the solder layer 29 is reflowed to form multiple solid solder bumps or balls 29*a* on the metal layer 28 of the under bump metallurgic (UBM) layer by using a reflowing process, and then a singulation process can be performed to cut the molding layer 385, the filling or encapsulating layers 86 and 87 and the polymer layers 98 and 540 and to singularize a plurality of the system-in package or multichip module shown in FIG. 108F.

The molding layer 385 of the system-in package or multichip module shown in FIG. 108F may have a left sidewall and a right sidewall opposite to and substantially parallel with the left saidewall. The solder bumps or balls 29*a* may have a bump height greater than 5 micrometers, such as between 5 and 400 micrometers, and preferably between 10 and 100 micrometers, and a width or diameter between 20 and 400 micrometers, and preferably between 50 and 100 micrometers. The solder bumps or balls 29*a* may include bismuth, indium, a tin-lead alloy, a tin-silver alloy, a tin-silver-copper alloy or a tin-gold alloy.

The structure and the circuit design of the metal traces or pads 26, 46 or 66 shown in FIG. 108F can be referred to as the structure and the circuit design of the metal traces or pads 925 as illustrated in FIG. 106A, that is, the metal traces or pads 26, 46 or 66, for example, can be formed by a damascene or double-damascene process including an electroplating process and a chemical mechanical polishing (CMP) process, and can be composed of the electroplated copper layer 743, the adhesion/barrier layer 741 at the bottom of the electroplated copper layer 743 and at the sidewalls of the electroplated copper layer 743, and the seed layer 742 between the electroplated copper layer 743 and the adhesion/barrier layer 741, at the bottom of the electroplated copper layer 743 and at the sidewalls of the electroplated copper layer 743. The sidewalls of the electroplated copper layer 743 are covered by the adhesion/barrier layer 741 and the seed layer 742.

The system-in package or multichip module shown in FIG. 108F can be connected to a mother board, a printed circuit board, a metal substrate, a glass substrate or a ceramic substrate using the solder bumps or balls 29a.

Figure 109A:
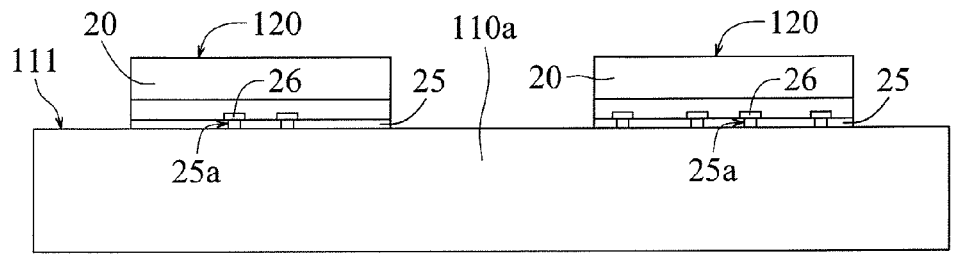
FIGS. 109A-109T are cross-sectional views showing a process for forming a system-in package or multichip module, according to an embodiment of the present disclosure.
Figure 109B:
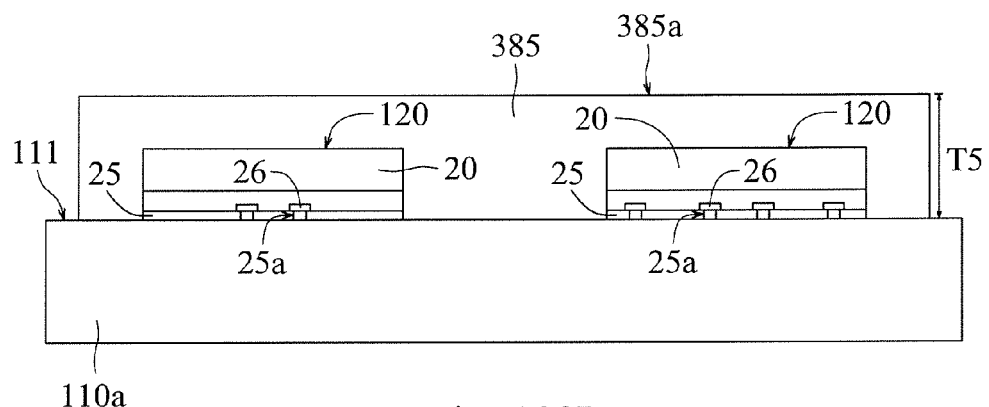
FIG. 109U shows a schematic top perspective view of the patterned metal layer 5 of the system-in package or multichip module shown in FIG. 109T.
Figure 109C:
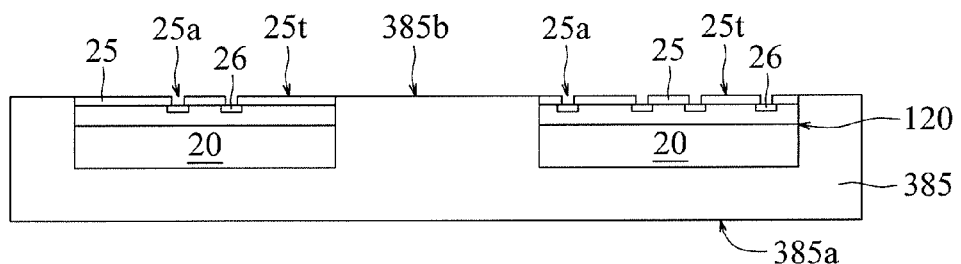
Figure 109D:
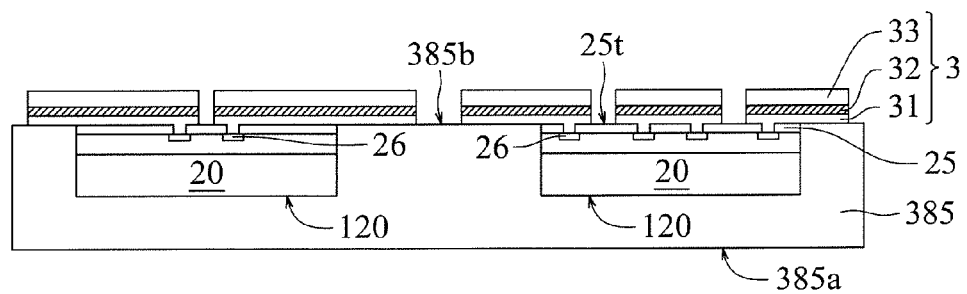
Figure 109E:
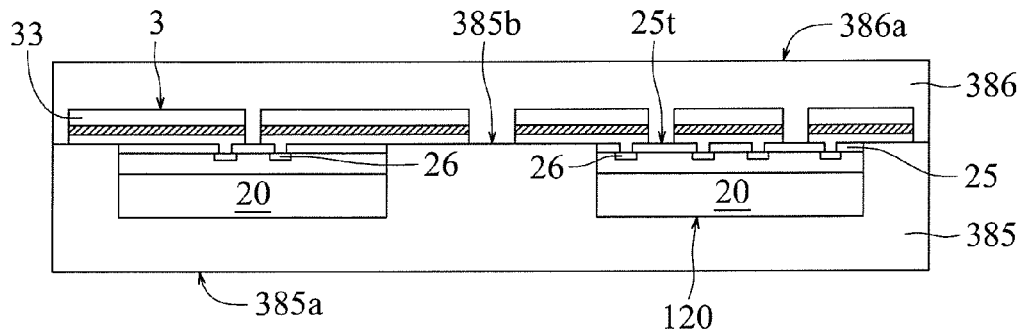
Figure 109F:
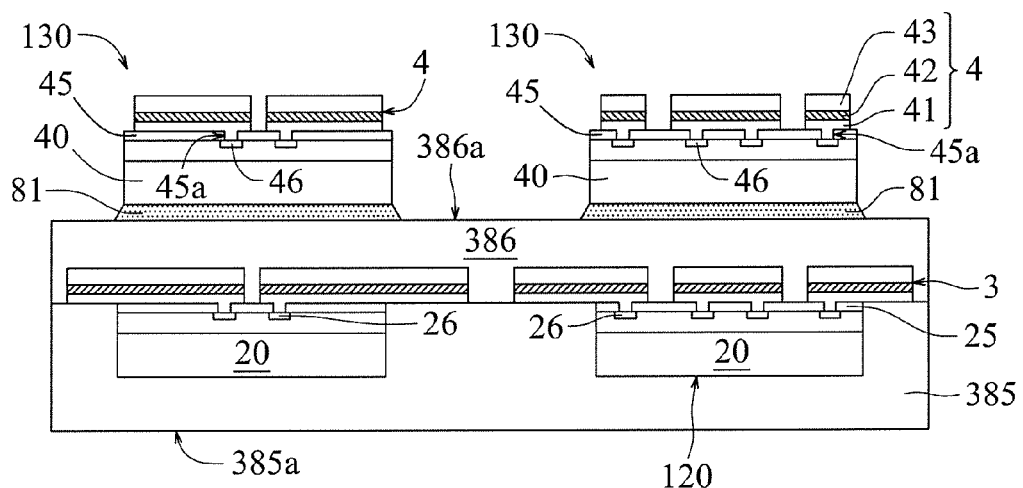
Figure 109G:
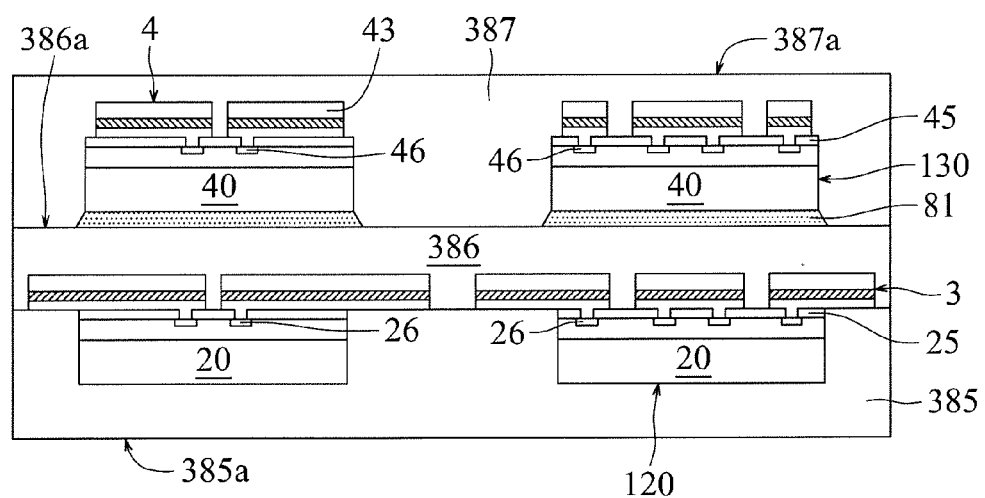
Figure 109H:
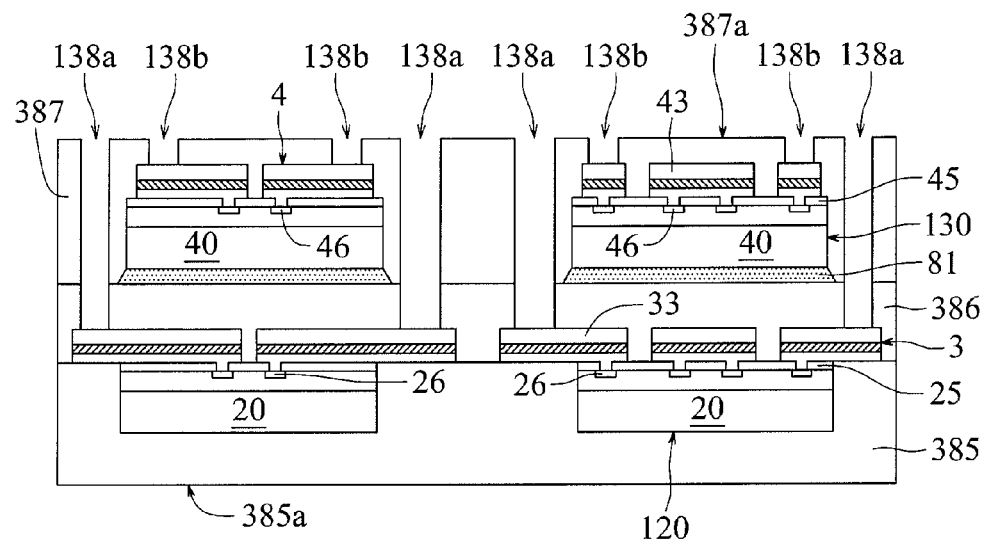
Figure 109I:
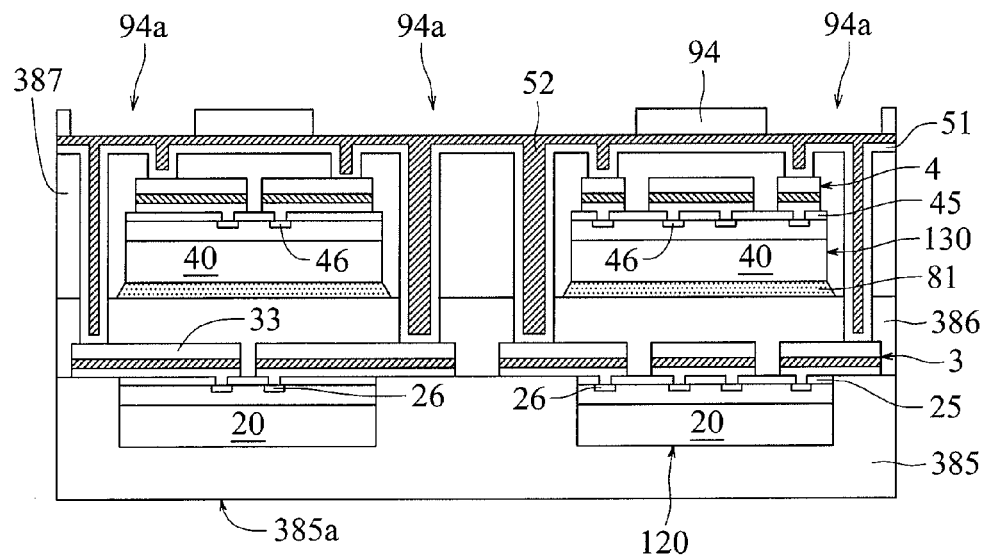
Figure 109J:
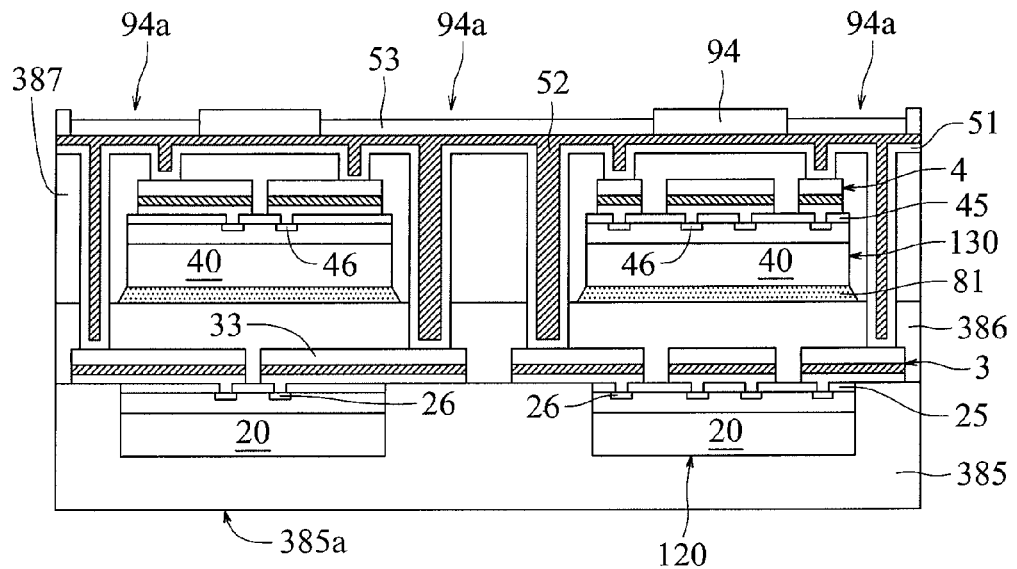
Figure 109K:
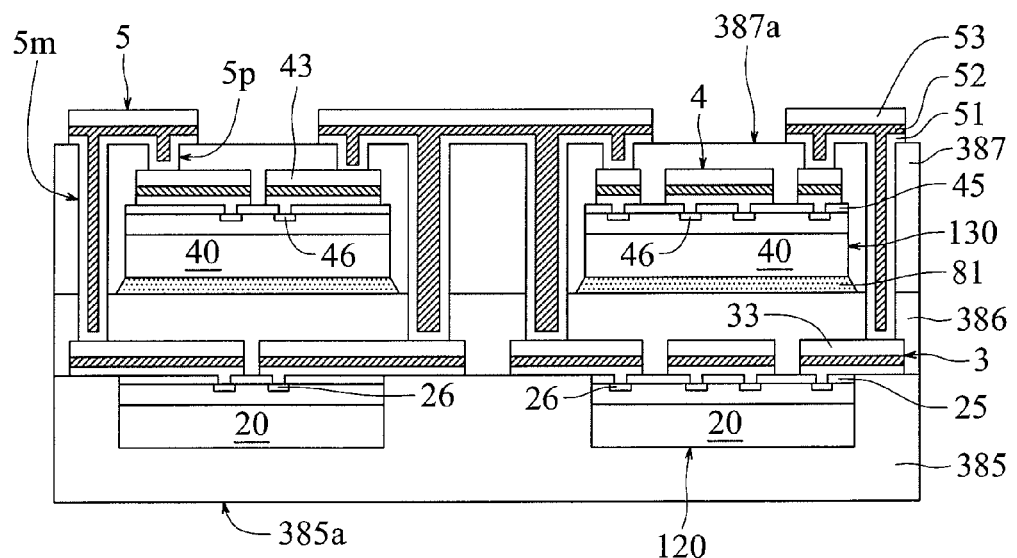
Figure 109L:
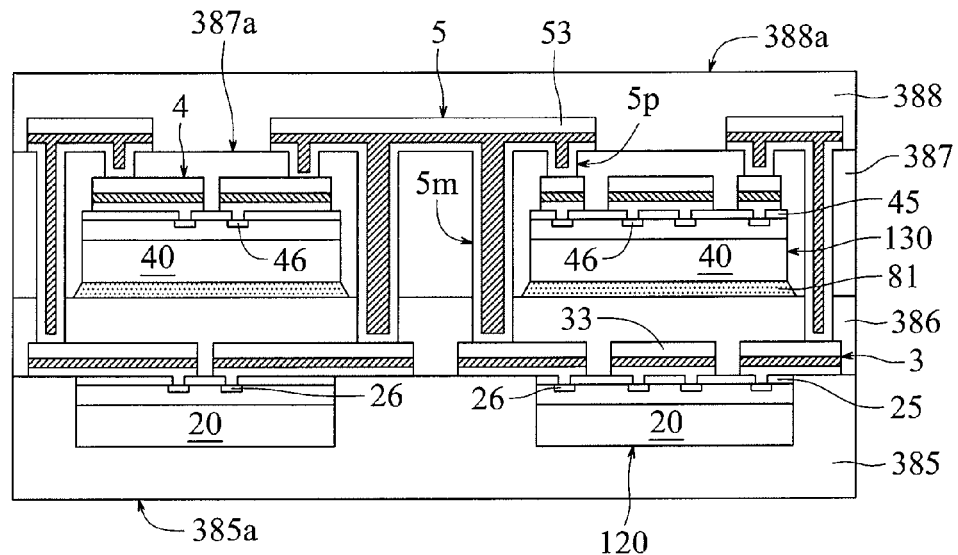
Figure 109M:
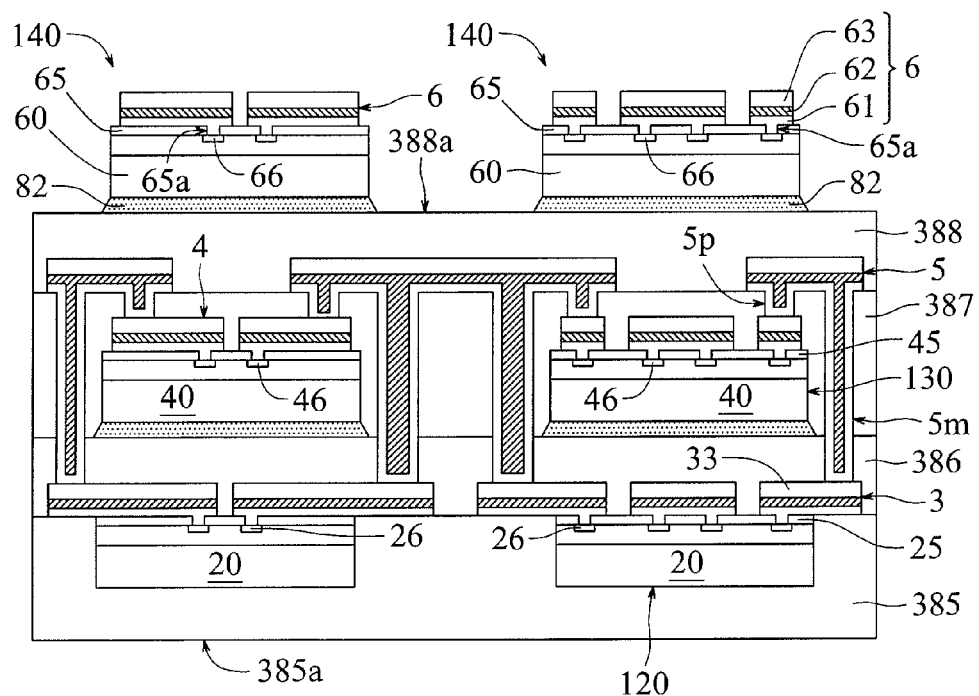
Figure 109N:
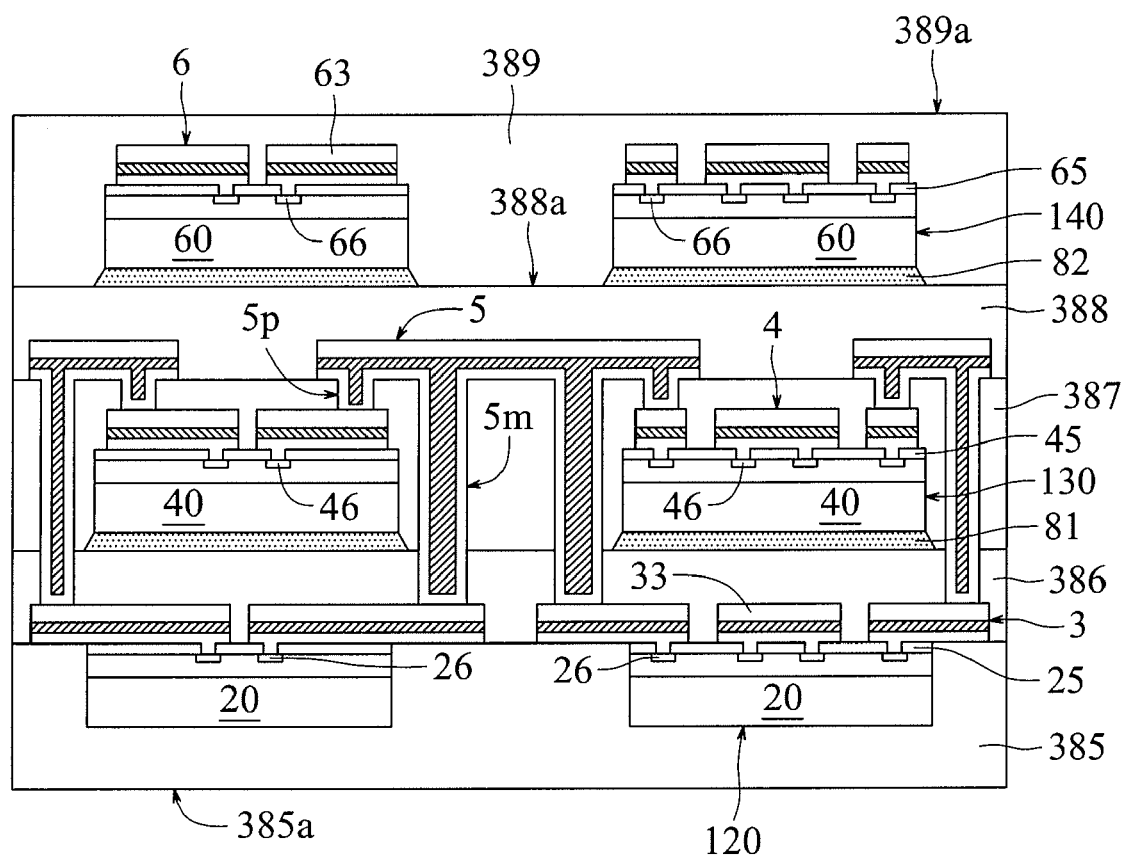
Figure 109O:
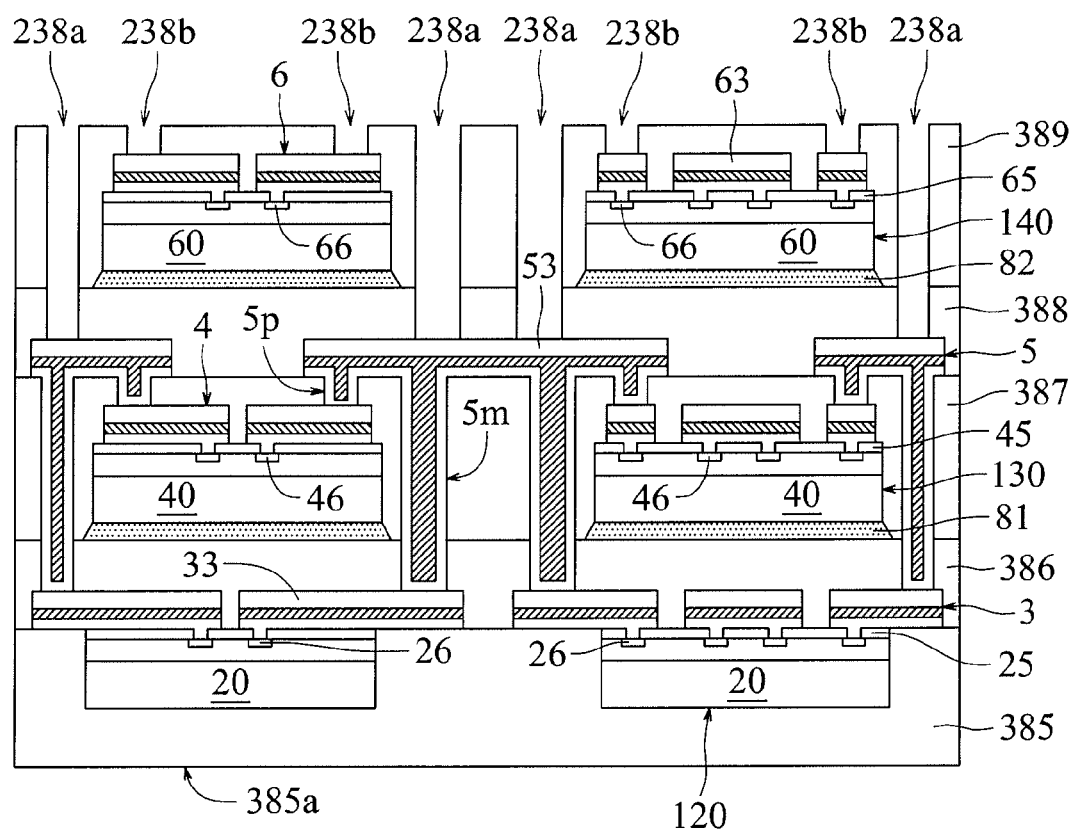
Figure 109P:
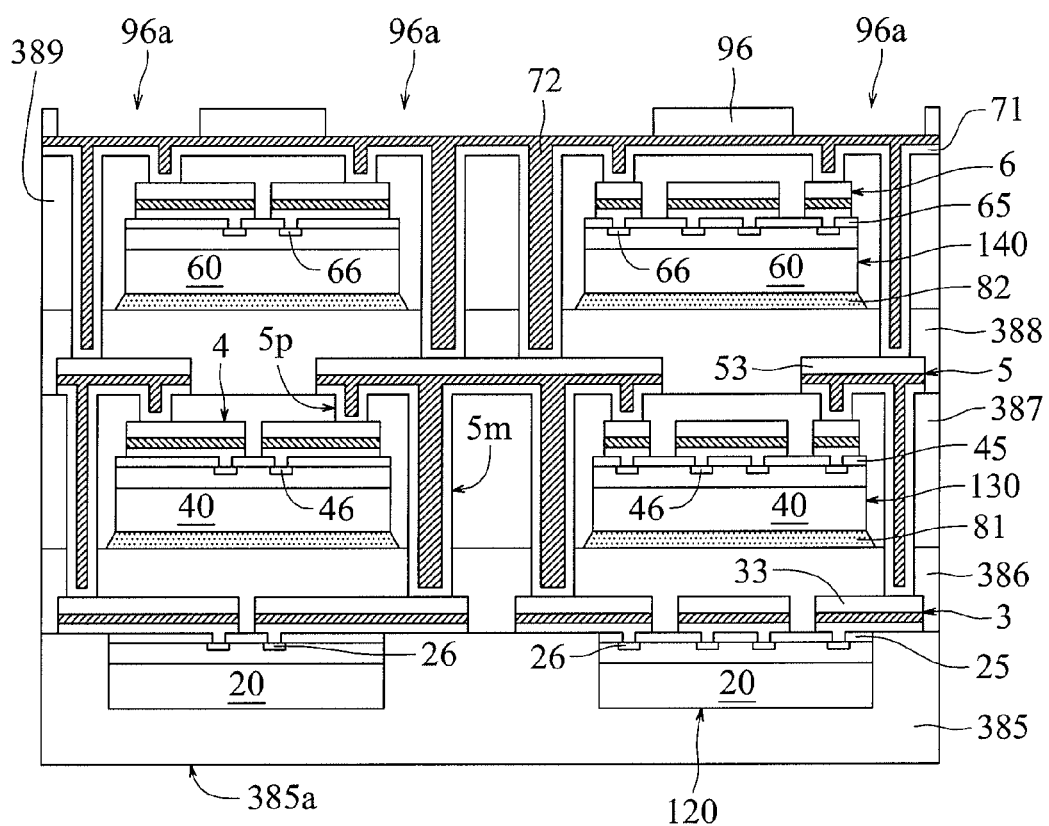
Figure 109Q:
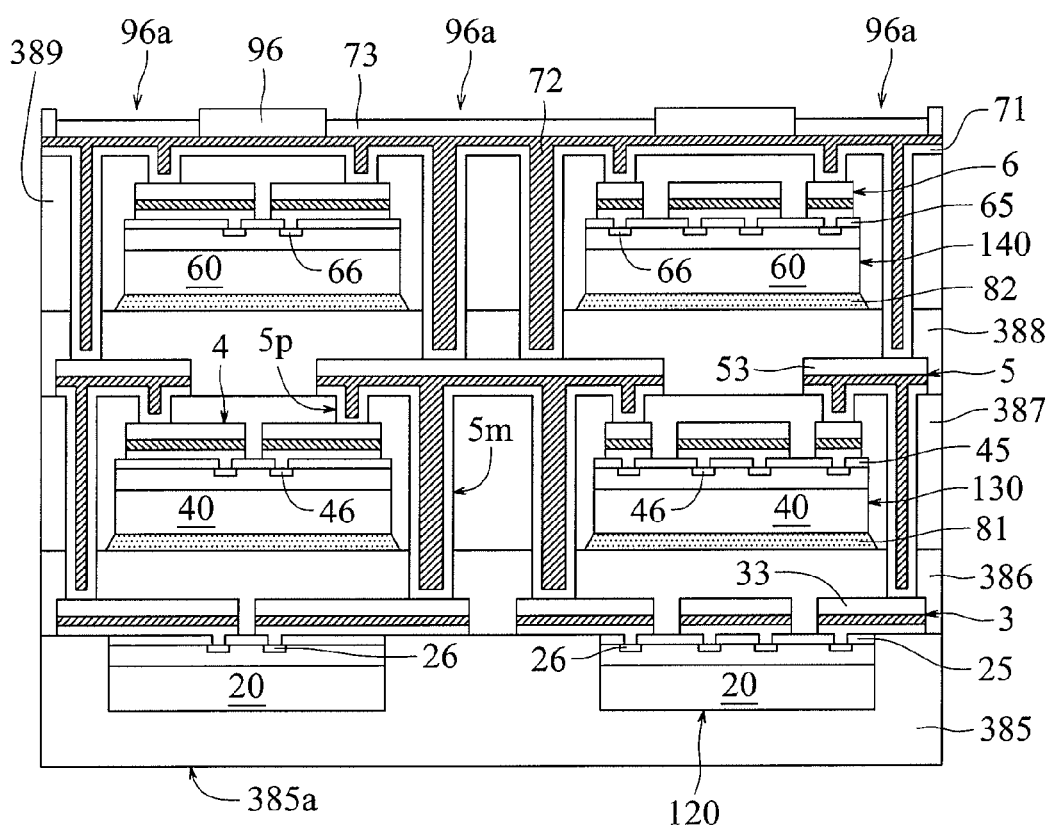
Figure 109R:
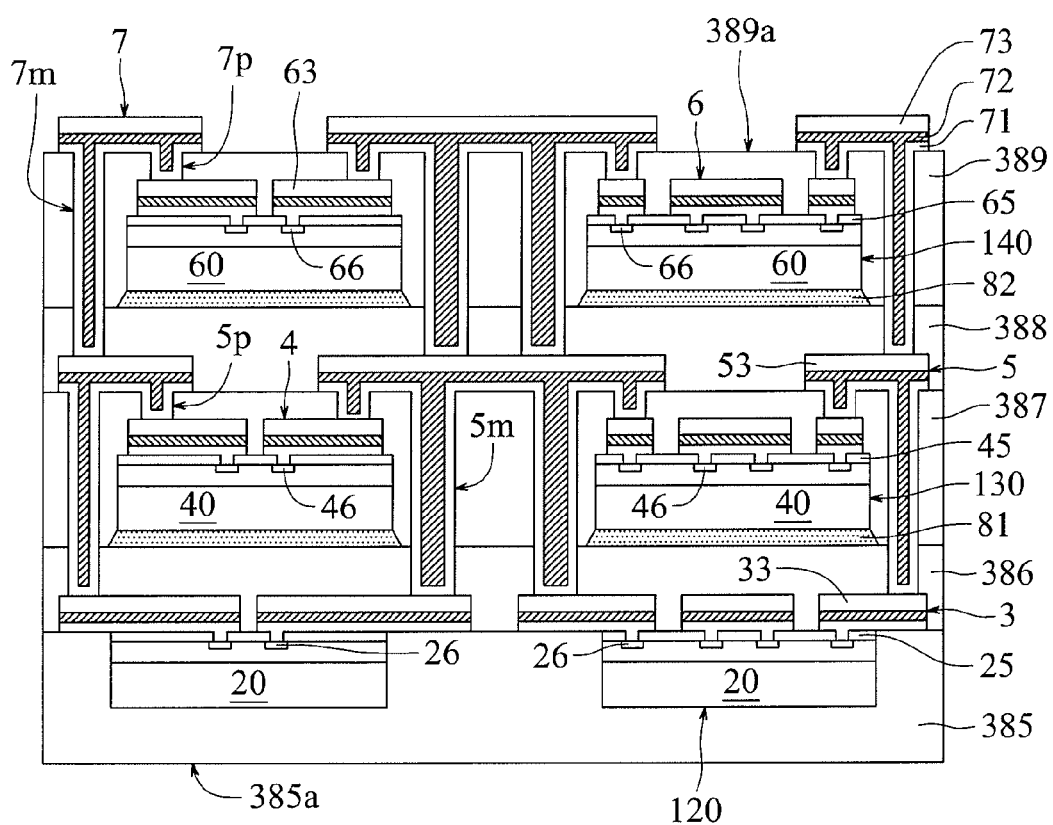
Figure 109S:
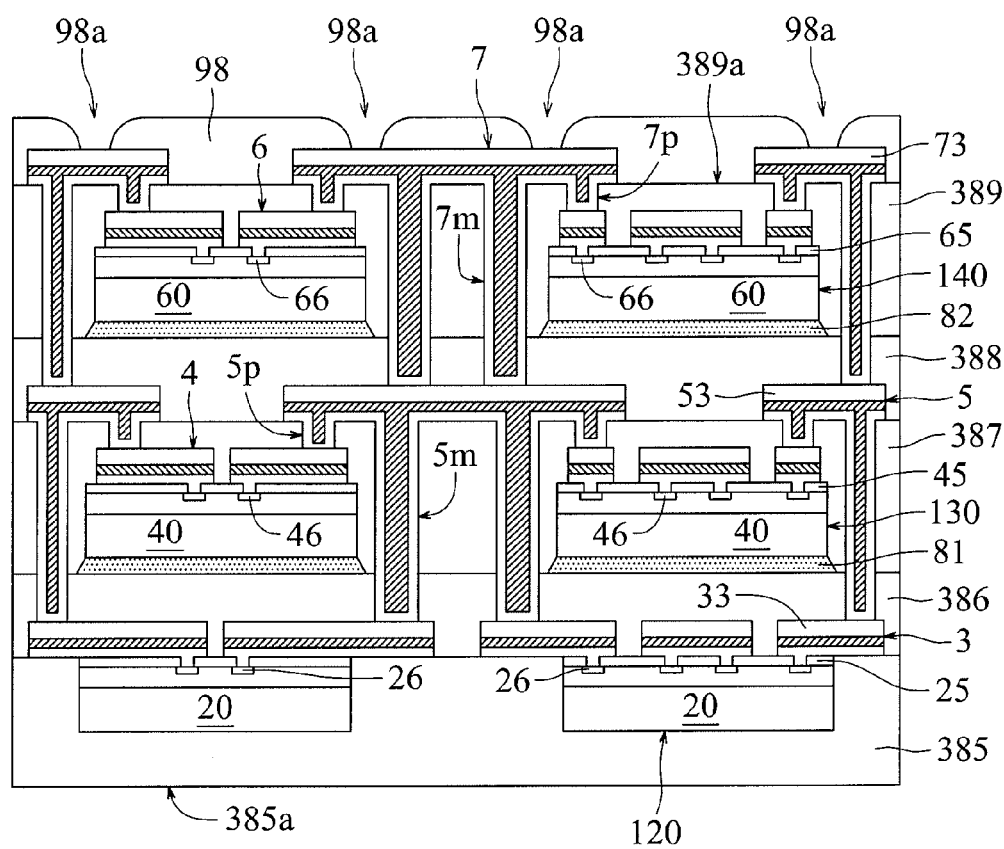
Figure 109T:
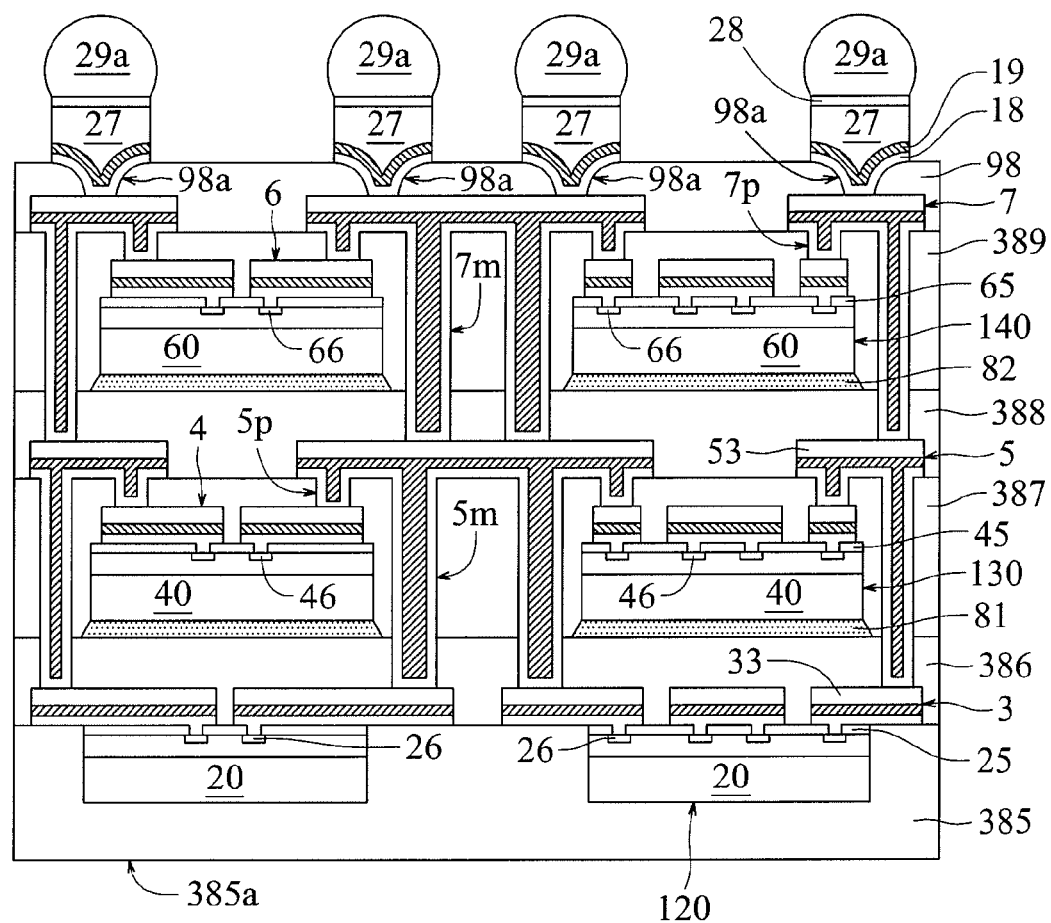

FIGS. 109A-109T show a process for forming another system-in package or multichip module according to another embodiment of the present disclosure. Referring to FIG. 109A, multiple chips 120 can be attached to a surface 111 of a substrate 110a, for example, by sucking the chips 120 using a vacuum through holes in the substrate 110a, or by first coating a glue material, such as polyimide, benzocyclobutane (BCB), polybenzoxazole (PBO), poly-phenylene oxide (PPO), epoxy, silosane or SU-8, on the surface 111 of the substrate 110a and then placing the chips 120 on the glue material.

The chips 120 shown in FIG. 109A are similar to the chips 120 shown in FIGS. 8 and 9 except that the patterned metal layer 2 and the metal pillars or bumps 24 are not formed. Any of the chips 120 can be a central-processing-unit (CPU) chip, a baseband chip, a digital-signal-processing (DSP) chip, a graphics-processing-unit (GPU) chip, a memory chip, such as flash memory chip, dynamic-random-access-memory (DRAM) chip or statistic-random-access-memory (SRAM) chip, a wireless local area network (WLAN) chip, a logic chip, an analog chip, a power device, a regulator, a power management device, a global-positioning-system (GPS) chip, a Bluetooth chip, or a chip comprising a central-processing-unit (CPU) circuit block, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block and a modem circuit block.

Each of the chips 120 shown in FIG. 109A has the passivation layer 25 and the metal traces or pads 26, under the top surface of the semiconductor substrate 20, at a top side of each chip 120. The bottom surface of the semiconductor substrate 20 is at a backside of each chip 120. The top sides of the chips 120 are attached to the surface 111 of the substrate 110a.

Next, referring to FIG. 109B, a molding layer 385 is formed on the surface 111 of the substrate 110a, between the neighboring two chips 120 and on the backsides and sidewalls of the chips 120 by using a molding process. The backsides of the chips 120 are covered by the molding layer 385. The top surface 385a of the molding layer 385 is substantially flat. The molding layer 385 may have a left sidewall and a right sidewall opposite to and substantially parallel with the left saidewall. The molding layer 385 may have a thickness T5 greater than 100 micrometers, such as between 150 and 300 micrometers or between 200 and 400 micrometers. The molding layer 385 can be a polymer layer, such as polyimide or epoxy layer having a coefficient of thermal expansion between 2 and 10 or between 5 and 15.

Next, referring to FIG. 109C, the substrate 110a is removed from the top sides of the chips 120 and from the molding layer 385, and then the semifinished device can be flipped over to perform the following steps. The molding layer 385 may have a surface 385b opposite to the top surface 385a. Preferably, the surface 385b may be substantially coplanar with the top surfaces 25t of the passivation layers 25 of the chips 120.

Next, referring to FIG. 109D, the steps illustrated in FIGS. 13 and 14 can be performed, except forming the adhesion layer 31 on multiple contact points, exposed by the openings 25a in the passivation layer 25, of the metal traces or pads 26 of each chip 120, on the surface 385b of the molding layer 385 and on the top surface 25t of the passivation layer 25 of each chip 120. Next, the photoresist layer 92 is removed using a chemical solution containing amine or NaCO$_3$. Next, the seed layer 32 not under the metal layer 33 is removed by using a wet chemical etching process or a reactive ion etching (RIE) process. Next, the adhesion layer 31 not under the metal layer 33 is removed by using a wet chemical etching process or a reactive ion etching (RIE) process. Accordingly, the adhesion layer 31, the seed layer 32 and the metal layer 33 compose a patterned metal layer 3 formed on the contact points, exposed by the openings 25a in the passivation layer 25, of the metal traces or pads 26 of each chip 120, on the surface 385b of the molding layer 385, and on the top surface 25t of the passivation layer 25 of each chip 120. The specification of the patterned metal layer 3 shown in FIG. 109D can be referred to as the specification of the patterned metal layer 3 as illustrated in FIG. 18.

The adhesion layer 31, for example, can be a titanium-containing layer, such as a single layer of titanium-tungsten alloy, titanium or titanium nitride, having a thickness smaller than 1 micrometer, such as between 1 nanometer and 0.5 micrometers, on the contact points, exposed by the openings 25a in the passivation layer 25, of the metal traces or pads 26 of each chip 120, on the surface 385b of the molding layer 385, and on the top surface 25t of the passivation layer 25 of each chip 120. The seed layer 32 can be a single layer of copper or titanium-copper alloy with a thickness smaller than 1 micrometer, such as between 10 nanometers and 0.8 micrometers, on the titanium-containing layer. The metal layer 33 can be an electroplated copper layer having a thickness between 2 and 30 micrometers, and preferably between 3 and 10 micrometers, on the single layer of copper or titanium-copper alloy. The sidewalls of the electroplated copper layer are not covered by the titanium-containing layer and the single layer of copper or titanium-copper alloy.

Alternatively, the adhesion layer 31 can be a tantalum-containing layer, such as a single layer of tantalum or tantalum nitride, having a thickness smaller than 1 micrometer, such as between 1 nanometer and 0.5 micrometers, on the contact points, exposed by the openings 25a in the passivation layer 25, of the metal traces or pads 26 of each chip 120, on the surface 385b of the molding layer 385, and on the top surface 25t of the passivation layer 25 of each chip 120. The seed layer 32 can be a single layer of copper or titanium-copper alloy with a thickness smaller than 1 micrometer, such as between 10 nanometers and 0.8 micrometers, on the tantalum-containing layer. The metal layer 33 can be an electroplated copper layer having a thickness between 2 and 30 micrometers, and preferably between 3 and 10 micrometers, on the single layer of copper or titanium-copper alloy. The sidewalls of the electroplated copper layer are not covered by the tantalum-containing layer and the single layer of copper or titanium-copper alloy.

Next, referring to FIG. 109E, an insulating layer 386 can be formed on the metal layer 33 of the patterned metal layer 3, on the surface 385b of the molding layer 385, and on the top surface 25t of the passivation layer 25 of each chip 120, for example, by using a molding process, a spin coating process, a lamination process or a printing process. The insulating layer 386 can be a polymer layer, such as epoxy layer, polyimide layer, benzocyclobutane (BCB) layer, polybenzoxazole (PBO) layer or poly-phenylene oxide (PPO) layer, having a thickness between 2 and 50 micrometers, and preferably between 5 and 30 micrometers. The top surface 386a of the insulating layer 386 may be substantially flat.

Next, referring to FIG. 109F, multiple chips 130 can be attached to the top surface 386a of the insulating layer 386 by a glue material 81. The chips 130 illustrated in FIG. 109F are similar to the chips 130 illustrated in FIGS. 19 and 20 except that the metal pillars or bumps 44 are not formed on the patterned metal layer 4. The glue material 81 can be a polymer, such as epoxy, polyimide, benzocyclobutane (BCB), polybenzoxazole (PBO) or poly-phenylene oxide (PPO), and may have a thickness greater than 1 micrometers, such as between 3 and 100 micrometers, and preferably between 5 and 50 micrometers. Any of the chips 130 can be a central-processing-unit (CPU) chip, a baseband chip, a digital-signal-processing (DSP) chip, a graphics-processing-unit (GPU) chip, a memory chip, such as flash memory chip, dynamic-random-access-memory (DRAM) chip or statistic-random-access-memory (SRAM) chip, a wireless local area network (WLAN) chip, a global-positioning-system (GPS) chip, a logic chip, an analog chip, a power device, a regulator, a power management device, a Bluetooth chip, or a chip comprising a central-processing-unit (CPU) circuit block, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block and a modem circuit block.

Next, referring to FIG. 109G, an insulating layer 387 can be formed on the top surface 386a of the insulating layer 386, on the metal layer 43 of the patterned metal layer 4 of each chip 130, on the chips 130 and between the neighboring two chips 130, for example, by using a molding process, a spin coating process, a lamination process or a printing process. The chips 130 are covered by the insulating layer 387. The insulating layer 387 can be a polymer layer, such as epoxy layer, polyimide layer, benzocyclobutane (BCB) layer, polybenzoxazole (PBO) layer or poly-phenylene oxide (PPO) layer, having a thickness greater than 5 micrometers, such as between 10 and 300 micrometers or between 15 and 200 micrometers. The top surface 387a of the insulating layer 387 may be substantially flat.

Next, referring to FIG. 109H, using a laser drill process or a dry etching process, multiple openings (or vias) 138a are formed in and through the insulating layers 386 and 387 to expose multiple contact points of the metal layer 33 of the patterned metal layer 3, and multiple openings (or vias) 138b are formed in and through the insulating layer 387 to expose multiple contact points of the metal layer 43 of the patterned metal layer 4.

Next, referring to FIG. 109I, an adhesion layer 51 having a thickness smaller than 1 micrometer, such as between 1 nanometer and 0.5 micrometers, can be formed on the top surface 387a of the insulating layer 387, in the openings 138a and 138b and on the contact points, exposed by the openings 138a and 138b, of the metal layers 33 and 43 by using a physical-vapor deposition (PVD) process, such as sputtering process or evaporation process. Next, a seed layer 52 having a thickness smaller than 1 micrometer, such as between 10 nanometers and 0.8 micrometers, can be formed on the adhesion layer 51 and in the openings 138a and 138b by using a physical-vapor deposition (PVD) process, such as sputtering process or evaporation process. Next, a photoresist layer 94 can be formed on the seed layer 52. Next, the photoresist layer 94 is patterned with processes of lithographic, light exposure and development to form multiple openings 94a in the photoresist layer 94 exposing the seed layer 52.

The material of the adhesion layer 51 may include titanium, a titanium-tungsten alloy, titanium nitride, chromium, tantalum or tantalum nitride. The material of the seed layer 52 may include copper, titanium-copper alloy, gold or nickel.

For example, the adhesion layer 51 can be formed by sputtering a titanium-containing layer, such as a single layer of titanium-tungsten alloy, titanium or titanium nitride, having a thickness smaller than 1 micrometer, such as between 1 nanometer and 0.5 micrometers, on the top surface 387a of the insulating layer 387, in the openings 138a and 138b and on the contact points, exposed by the openings 138a and 138b, of the metal layers 33 and 43. And the seed layer 52 can be formed by sputtering a copper layer, a titanium-copper-alloy layer, a gold layer or a nickel layer with a thickness smaller than 1 micrometer, such as between 10 nanometers and 0.8 micrometers, on the titanium-containing layer and in the openings 138a and 138b.

Alternatively, the adhesion layer 51 can be formed by sputtering a tantalum-containing layer, such as a single layer of tantalum or tantalum nitride, having a thickness smaller than 1 micrometer, such as between 1 nanometer and 0.5 micrometers, on the top surface 387a of the insulating layer 387, in the openings 138a and 138b and on the contact points, exposed by the openings 138a and 138b, of the metal layers 33 and 43. And the seed layer 52 can be formed by sputtering a copper layer, a titanium-copper-alloy layer, a gold layer or a nickel layer with a thickness smaller than 1 micrometer, such as between 10 nanometers and 0.8 micrometers, on the tantalum-containing layer and in the openings 138a and 138b.

Next, referring to FIG. 109J, a metal layer 53 having a thickness greater than 1 micrometer, such as between 2 and 30 micrometers, and preferably between 3 and 10 micrometers, can be formed on the seed layer 52 exposed by the openings 94a by using a process including an electroplating process and/or an electroless plating process. Alternatively, the metal layer 53 may be further formed in the openings 138a and 138b. The metal layer 53 can be a single layer of copper, gold or nickel, or a composite layer including a copper layer having a thickness between 2 and 30 micrometers, a nickel layer having a thickness between 0.1 and 10 micrometers on the copper layer, and a gold layer having a thickness between 0.01 and 5 micrometers on the nickel layer. For example, the metal layer 53 can be a single metal layer formed by electroplating a copper layer, to a thickness greater than 1 micrometer, such as between 2 and 30 micrometers, and preferably between 3 and 10 micrometers, in the openings 94a and on the seed layer 52, preferably the previously described copper or titanium-copper-alloy seed layer 52, exposed by the openings 94a.

Next, referring to FIG. 109K, the photoresist layer 94 is removed using a chemical solution containing amine or $NaCO_3$. Next, the seed layer 52 not under the metal layer 53 is removed by using a wet chemical etching process or a reactive ion etching (RIE) process. Next, the adhesion layer 51 not under the metal layer 53 is removed by using a wet chemical etching process or a reactive ion etching (RIE) process.

Accordingly, the adhesion layer 51, the seed layer 52 and the metal layer 53 compose a patterned metal layer 5, multiple metal plugs (or metal vias) 5m and multiple metal plugs (or metal vias) 5p. The patterned metal layer 5, composed of the adhesion layer 51, the seed layer 52 and the metal layer 53, can be formed on the top surface 387a of the insulating layer 387. The metal plugs 5m, composed of the adhesion layer 51 and the seed layer 52 or composed of the adhesion layer 51, the seed layer 52 and the metal layer 53, can be formed in the openings 138a and on the contact points, exposed by the openings 138a, of the metal layer 33 of the patterned metal layer 3. The metal plugs 5m between the patterned metal layer 5 and the contact points, exposed by the openings 138a, of the metal layer 33 can connect the patterned metal layer 5 to the contact points, exposed by the openings 138a, of the metal layer 33. The metal plugs 5p, composed of the adhesion layer 51 and the seed layer 52 or composed of the adhesion layer 51, the seed layer 52 and the metal layer 53, can be formed in the openings 138b and on the contact points, exposed by the openings 138b, of the metal layer 43 of the patterned metal layer 4. The metal plugs 5p between the patterned metal layer 5 and the contact points, exposed by the openings 138b, of the metal layer 43 can connect the patterned metal layer 5 to the contact points, exposed by the openings 138b, of the metal layer 43.

Next, referring to FIG. 109L, an insulating layer 388 can be formed on the metal layer 53 of the patterned metal layer 5 and on the top surface 387a of the insulating layer 387, for example, by using a molding process, a spin coating process, a lamination process or a printing process. The insulating layer 388 can be a polymer layer, such as epoxy layer, polyimide layer, benzocyclobutane (BCB) layer, polybenzoxazole (PBO) layer or poly-phenylene oxide (PPO) layer, having a thickness between 2 and 50 micrometers, and preferably between 5 and 30 micrometers. The top surface 388a of the insulating layer 388 may be substantially flat.

Next, referring to FIG. 109M, multiple chips 140 can be attached to the top surface 388a of the insulating layer 388 by a glue material 82. The chips 140 illustrated in FIG. 109M are similar to the chips 140 illustrated in FIGS. 29 and 30 except that the metal pillars or bumps 64 are not formed on the patterned metal layer 6. The glue material 82 can be a polymer, such as epoxy, polyimide, benzocyclobutane (BCB), polybenzoxazole (PBO) or poly-phenylene oxide (PPO), and may have a thickness greater than 1 micrometers, such as between 3 and 100 micrometers, and preferably between 5 and 50 micrometers. Any of the chips 140 can be a central-processing-unit (CPU) chip, a baseband chip, a digital-signal-processing (DSP) chip, a graphics-processing-unit (GPU) chip, a memory chip, such as flash memory chip, dynamic-random-access-memory (DRAM) chip or statistic-random-access-memory (SRAM) chip, a wireless local area network (WLAN) chip, a global-positioning-system (GPS) chip, a logic chip, an analog chip, a power device, a regulator, a power management device, a Bluetooth chip, or a chip comprising a central-processing-unit (CPU) circuit block, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block and a modem circuit block.

Next, referring to FIG. 109N, an insulating layer 389 can be formed on the top surface 388a of the insulating layer 388, on the metal layer 63 of the patterned metal layer 6 of each chip 140, on the chips 140 and between the neighboring two chips 140, for example, by using a molding process, a spin coating process, a lamination process or a printing process. The chips 140 are covered by the insulating layer 389. The insulating layer 389 can be a polymer layer, such as epoxy layer, polyimide layer, benzocyclobutane (BCB) layer, polybenzoxazole (PBO) layer or poly-phenylene oxide (PPO) layer, having a thickness greater than 5 micrometers, such as between 10 and 300 micrometers or between 15 and 200 micrometers. The top surface 389a of the insulating layer 389 may be substantially flat.

Next, referring to FIG. 109O, using a laser drill process or a dry etching process, multiple openings (or vias) 238a are formed in and through the insulating layers 388 and 389 to expose multiple contact points of the metal layer 53 of the patterned metal layer 5, and multiple openings (or vias) 238b are formed in and through the insulating layer 389 to expose multiple contact points of the metal layer 63 of the patterned metal layer 6.

Next, referring to FIG. 109P, an adhesion layer 71 having a thickness smaller than 1 micrometer, such as between 1 nanometer and 0.5 micrometers, can be formed on the top surface 389a of the insulating layer 389, in the openings 238a and 238b and on the contact points, exposed by the openings 238a and 238b, of the metal layers 53 and 63 by using a physical-vapor deposition (PVD) process, such as sputtering process or evaporation process. Next, a seed layer 72 having a thickness smaller than 1 micrometer, such as between 10 nanometers and 0.8 micrometers, can be formed on the adhesion layer 71 and in the openings 238a and 238b by using a physical-vapor deposition (PVD) process, such as sputtering process or evaporation process. Next, a photoresist layer 96 can be formed on the seed layer 72. Next, the photoresist layer 96 is patterned with processes of lithographic, light exposure and development to form multiple openings 96a in the photoresist layer 96 exposing the seed layer 72.

The material of the adhesion layer 71 may include titanium, a titanium-tungsten alloy, titanium nitride, chromium, tantalum or tantalum nitride. The material of the seed layer 72 may include copper, titanium-copper alloy, gold or nickel.

For example, the adhesion layer 71 can be formed by sputtering a titanium-containing layer, such as a single layer of titanium-tungsten alloy, titanium or titanium nitride, having a thickness smaller than 1 micrometer, such as between 1 nanometer and 0.5 micrometers, on the top surface 389a of the insulating layer 389, in the openings 238a and 238b and on the contact points, exposed by the openings 238a and 238b, of the metal layers 53 and 63. And the seed layer 72 can be formed by sputtering a copper layer, a titanium-copper-alloy layer, a gold layer or a nickel layer with a thickness smaller than 1 micrometer, such as between 10 nanometers and 0.8 micrometers, on the titanium-containing layer and in the openings 238a and 238b.

Alternatively, the adhesion layer 71 can be formed by sputtering a tantalum-containing layer, such as a single layer of tantalum or tantalum nitride, having a thickness smaller than 1 micrometer, such as between 1 nanometer and 0.5 micrometers, on the top surface 389a of the insulating layer 389, in the openings 238a and 238b and on the contact points, exposed by the openings 238a and 238b, of the metal layers 53 and 63. And the seed layer 72 can be formed by sputtering a copper layer, a titanium-copper-alloy layer, a gold layer or a nickel layer with a thickness smaller than 1 micrometer, such as between 10 nanometers and 0.8 micrometers, on the tantalum-containing layer and in the openings 238a and 238b.

Next, referring to FIG. 109Q, a metal layer 73 having a thickness greater than 1 micrometer, such as between 2 and 30 micrometers, and preferably between 3 and 10 micrometers, can be formed on the seed layer 72 exposed by the openings 96a by using a process including an electroplating process and/or an electroless plating process. Alternatively, the metal layer 73 may be further formed in the openings 238a and 238b. The metal layer 73 can be a single layer of copper, gold or nickel, or a composite layer including a copper layer having a thickness between 2 and 30 micrometers, a nickel layer having a thickness between 0.1 and 10 micrometers on the copper layer, and a gold layer having a thickness between 0.01 and 5 micrometers on the nickel layer. For example, the metal layer 73 can be a single metal layer formed by electroplating a copper layer, to a thickness greater than 1 micrometer, such as between 2 and 30 micrometers, and preferably between 3 and 10 micrometers, in the openings 96a and on the seed layer 72, preferably the previously described copper or titanium-copper-alloy seed layer 72, exposed by the openings 96a.

Next, referring to FIG. 109R, the photoresist layer 96 is removed using a chemical solution containing amine or NaCO$_3$. Next, the seed layer 72 not under the metal layer 73 is removed by using a wet chemical etching process or a reactive ion etching (RIE) process. Next, the adhesion layer 71 not under the metal layer 73 is removed by using a wet chemical etching process or a reactive ion etching (RIE) process.

Accordingly, the adhesion layer 71, the seed layer 72 and the metal layer 73 compose a patterned metal layer 7, multiple metal plugs 7m and multiple metal plugs 7p. The patterned metal layer 7, composed of the adhesion layer 71, the seed layer 72 and the metal layer 73, can be formed on the top surface 389a of the insulating layer 389. The metal plugs 7m, composed of the adhesion layer 71 and the seed layer 72 or composed of the adhesion layer 71, the seed layer 72 and the metal layer 73, can be formed in the openings 238a and on the contact points, exposed by the openings 238a, of the metal layer 53 of the patterned metal layer 5. The metal plugs 7m between the patterned metal layer 7 and the contact points, exposed by the openings 238a, of the metal layer 53 can connect the patterned metal layer 7 to the contact points, exposed by the openings 238a, of the metal layer 53. The metal plugs 7p, composed of the adhesion layer 71 and the seed layer 72 or composed of the adhesion layer 71, the seed layer 72 and the metal layer 73, can bee formed in the openings 238b and on the contact points, exposed by the openings 238b, of the metal layer 63 of the patterned metal layer 6. The metal plugs 7p between the patterned metal layer 7 and the contact points, exposed by the openings 238b, of the metal layer 63 can connect the patterned metal layer 7 to the contact points, exposed by the openings 238b, of the metal layer 63.

Referring to FIG. 109S, after the step illustrated in FIG. 109R, a polymer layer 98 can be formed on the metal layer 73 of the patterned metal layer 7 and on the top surface 389a of the insulating layer 389, and multiple openings 98a in the polymer layer 98 are over multiple contact points of the metal layer 73 of the patterned metal layer 7 and expose them. The polymer layer 98 can be a polyimide layer, a polybenzoxazole (PBO) layer, a benzocyclobutane (BCB) layer, an epoxy layer, or a poly-phenylene oxide (PPO) layer, and may have a thickness between 1 and 30 micrometers, and preferably between 2 and 15 micrometers or between 5 and 10 micrometers.

Next, referring to FIG. 109T, multiple solder bumps or balls 29a and an under bump metallurgic (UBM) layer composed of the previously described adhesion layer 18, seed layer 19 and metal layers 27 and 28 are formed over the contact points, exposed by the openings 98a, of the patterned metal layer 7, and then a singulation process can be performed to cut the molding layer 385, the insulating layers 386-389 and the polymer layer 98 and to singularize a plurality of the system-in package or multichip module shown in FIG. 109T. The under bump metallurgic (UBM) layer can be formed on the polymer layer 98 and on the contact points, exposed by the openings 98a, of the metal layer 73, and the solder bumps or balls 29a can be formed on the under bump metallurgic (UBM) layer. The process for forming the under bump metallurgic (UBM) layer and the solder bumps or balls 29a as illustrated in FIG. 109T is similar to that as illustrated in FIGS. 80-83 except that the adhesion layer 18 of the under bump metallurgic (UBM) layer is formed on the polymer layer 98 and on the contact points, exposed by the openings 98a, of the metal layer 73.

The molding layer 385 of the system-in package or multichip module shown in FIG. 109T may have a left sidewall and a right sidewall opposite to and substantially parallel with the left saidewall. The solder bumps or balls 29a may have a bump height greater than 5 micrometers, such as between 5 and 400 micrometers, and preferably between 10 and 100 micrometers, and a width or diameter between 20 and 400 micrometers, and preferably between 50 and 100 micrometers. The solder bumps or balls 29a may include bismuth, indium, a tin-lead alloy, a tin-silver alloy, a tin-silver-copper alloy or a tin-gold alloy. The system-in package or multichip module shown in FIG. 109T can be connected to a mother board, a printed circuit board, a metal substrate, a glass substrate or a ceramic substrate using the solder bumps or balls 29a.

Regarding the system-in package or multichip module illustrated in FIG. 109T, the chips 130 can be connected to each other through the metal plugs 5p and the patterned metal layer 5, and can be connected to the chips 120 through, in sequence, the metal plugs 5p, the patterned metal layer 5, the metal plugs 5m and the patterned metal layer 3. The chips 120 may be connected to each other through the patterned metal layer 3. The chips 140 can be connected to each other through the metal plugs 7p and the patterned metal layer 7, can be connected to the chips 130 through, in sequence, the metal plugs 7p, the patterned metal layer 7, the metal plugs 7m, the patterned metal layer 5 and the metal plugs 5p, and can be connected to the chips 120 through, in sequence, the metal plugs 7p, the patterned metal layer 7, the metal plugs 7m, the patterned metal layer 5, the metal plugs 5m and the patterned metal layer 3.

The patterned metal layer 3 of the system-in package or multichip module illustrated in FIG. 109T may include multiple metal interconnects or traces, such as signal traces, clock buses, clock traces, power planes, power buses, power traces, ground planes, ground buses or ground traces. One of the chips 120, for example, may have one of the metal traces or pads 26 connected to one or more of the metal traces or pads 26 of another one of the chips 120 through one or more of the metal interconnects or traces provided by the patterned metal layer 3.

The patterned metal layer 5 of the system-in package or multichip module illustrated in FIG. 109T may include multiple metal interconnects or traces, such as signal traces, clock buses, clock traces, power planes, power buses, power traces, ground planes, ground buses or ground traces. One of the chips 130, for example, may have one of the metal traces or pads 46 connected to one of the metal traces or pads 26 of one of the chips 120 through, in sequence, the patterned metal layer 4, one of the metal plugs 5p, one of the metal interconnects or traces provided by the patterned metal layer 5, one of the metal plugs 5m, and the patterned metal layer 3, and may have another one of the metal traces or pads 46 connected to one of the metal traces or pads 66 of one of the chips 140 through, in sequence, the patterned metal layer 4, another one of the metal plugs 5p, another one of the metal interconnects or traces provided by the patterned metal layer 5, one of the metal plugs 7m, the patterned metal layer 7, one of the metal plugs 7p and the patterned metal layer 6. One of the chips 130, for example, may be connected to another one of the chips 130 through one or more of the metal interconnects or traces provided by the patterned metal layer 5.

The patterned metal layer 7 of the system-in package or multichip module illustrated in FIG. 109T may include multiple metal interconnects or traces, such as signal traces, clock buses, clock traces, power planes, power buses, power traces, ground planes, ground buses or ground traces. One of the chips 140, for example, may have one of the metal traces or pads 66 connected to one of the metal traces or pads 26 of one of the chips 120 through, in sequence, the patterned metal layer 6, one of the metal plugs 7p, one of the metal interconnects or traces provided by the patterned metal layer 7, one of the metal plugs 7m, the patterned metal layer 5, one of the metal plugs 5m and the patterned metal layer 3, and may have another one of the metal traces or pads 66 connected to one of the metal traces or pads 46 of one of the chips 130 through, in sequence, the patterned metal layer 6, another one of the metal plugs 7p, another one of the metal interconnects or traces provided by the patterned metal layer 7, another one of the metal plugs 7m, the patterned metal layer 5, one of the metal plugs 5p and the patterned metal layer 4. One of the chips 140, for example, may be connected to another one of the chips 140 through one or more of the metal interconnects or traces provided by the patterned metal layer 7.

Figure 109U:
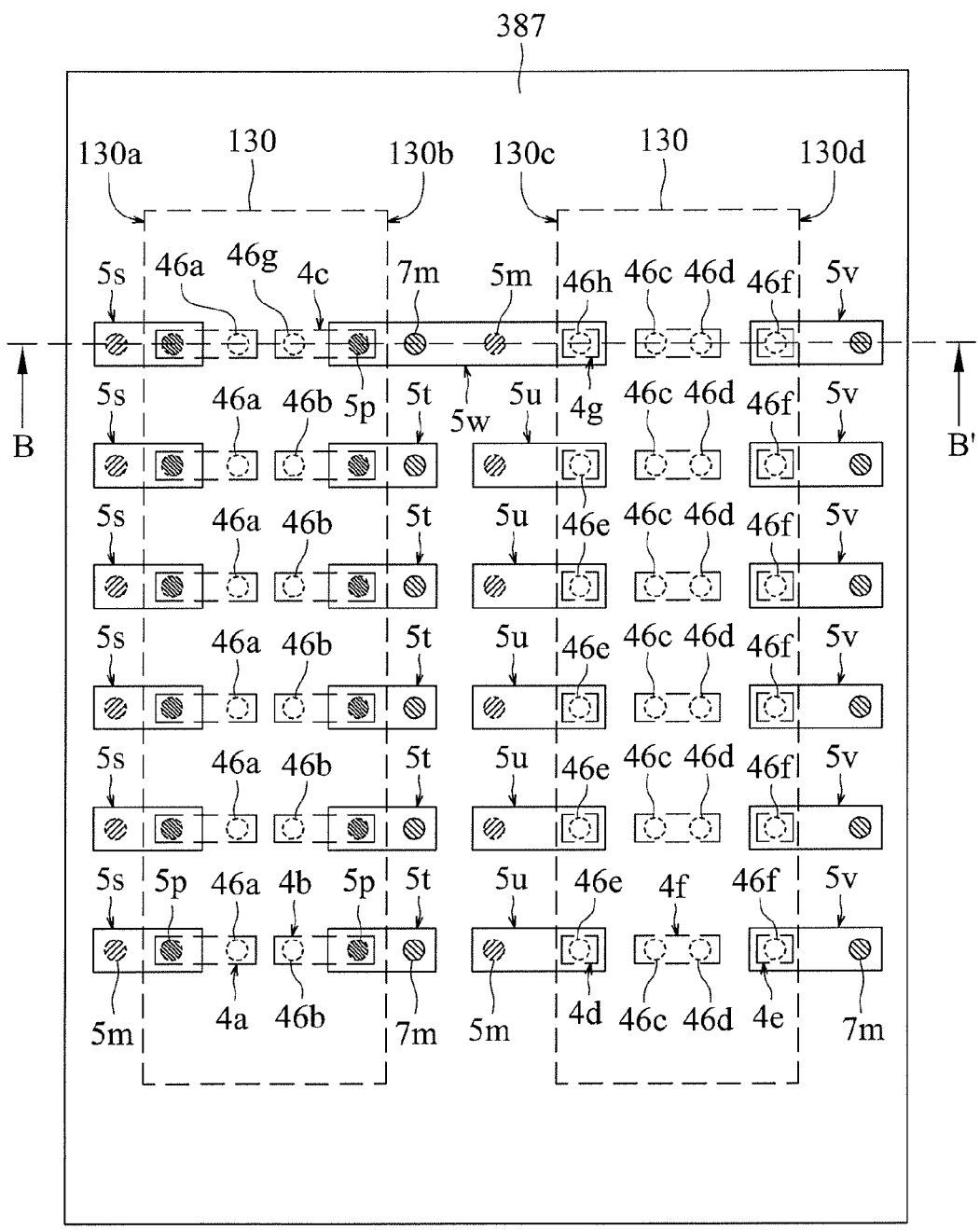

FIG. 109U shows a schematic top perspective view of the patterned metal layer 5 of the system-in package or multichip module shown in FIG. 109T, and FIG. 109T can be a cross-sectional view cut along the line B-B' shown in FIG. 109U. Referring to FIGS. 109T and 109U, the system-in package or multichip module may include multiple metal interconnects or traces 5s, 5t, 5u, 5v and 5w provided by the patterned metal layer 5. No matter where the metal interconnects or traces 5s, 5t, 5u, 5v and 5w are formed, any one of the metal interconnects or traces 5s, 5t, 5u, 5v and 5w can be a signal trace, a clock bus, a clock trace, a power plane, a power bus, a power trace, a ground plane, a ground bus or a ground trace. The left chip 130 has an edge 130a and an edge 130b opposite to and substantially parallel with the edge 130a. The right chip 130 has an edge 130c and an edge 130d opposite to and substantially parallel with the edge 130c. The metal interconnects or traces 5s can extend across the edge 130a of the left chip 130, and the metal interconnects or traces 51 can extend across the edge 130b of the left chip 130. The metal interconnects or traces 5u can extend across the edge 130c of the right chip 130, and the metal interconnects or traces 5v can extend across the edge 130d of the right chip 130. The metal interconnect or trace 5w can extend across the edge 130b of the left chip 130 and across the edge 130c of the right chip 130.

The metal interconnects or traces 5s, 5t, 5u, 5v and 5w can be connected to the metal plugs 5m, and can be connected to the metal traces or pads 26 of the chips 120 through, in sequence, the metal plugs 5m and the patterned metal layer 3. Furthermore, the metal interconnects or traces 5s, 5t, 5u, 5v and 5w can be connected to the metal plugs 7m, and can be connected to the metal traces or pads 66 of the chips 140 through, in sequence, the metal plugs 7m, the patterned metal layer 7 and the metal plugs 7p.

The left chip 130 may include multiple metal interconnects or traces 4a, 4b and 4c provided by the patterned metal layer 4 of the left chip 130. No matter where the metal interconnects or traces 4a, 4b and 4c are formed, any one of the metal interconnects or traces 4a, 4b and 4c can be a signal trace, a clock bus, a clock trace, a power plane, a power bus, a power trace, a ground plane, a ground bus or a ground trace.

The right chip 130 may include multiple metal interconnects or traces 4d, 4e, 4f and 4g provided by the patterned metal layer 4 of the right chip 130. No matter where the metal interconnects or traces 4d, 4e, 4f and 4g are formed, any one of the metal interconnects or traces 4d, 4e, 4f and 4g can be a signal trace, a clock bus, a clock trace, a power plane, a power bus, a power trace, a ground plane, a ground bus or a ground trace.

The left chip 130 has multiple contact points 46a, 46b and 46g arranged in a center area of the left chip 130. Alternatively, the contact point 46g may be arranged in a peripheral area of the left chip 130. The contact points 46a, 46b and 46g are provided by the metal traces or pads 46 of the left chip 130. The openings 45a in the passivation layer 45 of the left chip 130 are over the contact points 46a, 46b and 46g and expose the contact points 46a, 46b and 46g, and the contact points 46a, 46b and 46g are at bottoms of the openings 45a in the passivation layer 45 of the left chip 130.

The right chip 130 has multiple contact points 46c and 46d arranged in a center area of the right chip 130, and multiple contact points 46e, 46f and 46h arranged in a peripheral area of the right chip 130. Alternatively, the contact point 46h may be arranged in the center area of the right chip 130. The contact points 46c, 46d, 46e, 46f and 46h are provided by the metal traces or pads 46 of the right chip 130. The openings 45a in the passivation layer 45 of the right chip 130 are over the contact points 46c, 46d, 46e, 46f and 46h and expose the contact points 46c, 46d, 46e, 46f and 46h, and the contact points 46c, 46d, 46e, 46f and 46h are at bottoms of the openings 45a in the passivation layer 45 of the right chip 130.

The contact points 46a can be arranged in a first line in the center area of the left chip 130, and the contact points 46b can be arranged in a second line, parallel with the first line, in the center area of the left chip 130. The contact points 46c can be arranged in a third line in the center area of the right chip 130, and the contact points 46d can be arranged in a fourth line, parallel with the third line, in the center area of the right chip 130. The contact points 46e can be arranged in a fifth line, parallel with the third line, in the peripheral area of the right chip 130. The contact points 46f can be arranged in a sixth line, parallel with the third line, in the peripheral area of the right chip 130.

Each of the contact points 46a can be connected to one of the metal plugs 5m through, in sequence, one of the metal interconnects or traces 4a, one of the metal plugs 5p and one of the metal interconnects or traces 5s. From the top perspective view, the positions of the contact points 46a are different from the positions of the metal plugs 5m and 5p that connect with the contact points 46a.

Each of the contact points 46b can be connected to one of the metal plugs 7m through, in sequence, one of the metal interconnects or traces 4b, one of the metal plugs 5p and one of the metal interconnects or traces 5t. From the top perspective view, the positions of the contact points 46b are different from the positions of the metal plugs 7m which connect that the contact points 46b.

Each of the contact points 46e can be connected to one of the metal plugs 5m through, in sequence, one of the metal interconnects or traces 4d, one of the metal plugs 5p and one of the metal interconnects or traces 5u. From the top perspective view, the positions of the contact points 46e are different from the positions of the metal plugs 5m that connect with the contact points 46e.

Each of the contact points 46f can be connected to one of the metal plugs 7m through, in sequence, one of the metal interconnects or traces 4e, one of the metal plugs 5p and one of the metal interconnects or traces 5v. From the top perspective view, the positions of the contact points 46f are different from the positions of the metal plugs 7m that connect with the contact points 46f.

The contact points 46c can be connected to the contact points 46d through the metal interconnects or traces 4f. The contact point 46g of the left chip 130 can be connected to the contact point 46h of the right chip 130 through, in sequence, the metal interconnect or trace 4c, the metal plug 5p over the left chip 130, the metal interconnect or trace 5w, the metal plug 5p over the right chip 130, and the metal interconnect or trace 4g.

In a case, the left chip 130 can be a dynamic-random-access-memory (DRAM) chip, and the right chip 130 can be another dynamic-random-access-memory (DRAM) chip, a central-processing-unit (CPU) chip, a graphics-processing-unit (GPU) chip, a digital-signal-processing (DSP) chip, or a chip including a central-processing-unit (CPU) circuit block, a graphics-processing-unit (GPU) circuit block, a digital-signal-processing (DSP) circuit block, a baseband circuit block, a Bluetooth circuit block, a global-positioning-system (GPS) circuit block, a memory circuit block, a wireless local area network (WLAN) circuit block and a modem circuit block.

In another case, the left chip 130 can be a central-processing-unit (CPU) chip, and the right chip 130 can be another central-processing-unit (CPU) chip, a graphics-processing-unit (GPU) chip, a digital-signal-processing (DSP) chip, or a chip including a central-processing-unit (CPU) circuit block, a graphics-processing-unit (GPU) circuit block, a digital-signal-processing (DSP) circuit block, a baseband circuit block, a Bluetooth circuit block, a global-positioning-system (GPS) circuit block, a memory circuit block, a wireless local area network (WLAN) circuit block and a modem circuit block.

Alternatively, regarding to the system-in package or multichip module shown in FIGS. 109T and 109U, the metal plugs 5p may be further formed on multiple contact points of the metal interconnects or traces 4f. And one of the interconnects or traces 4f can be connected to one of the metal traces or pads 26 of the chips 120 through, in sequence, one of the metal plugs 5p that are formed on the contact points of the metal interconnects or traces 4f, one of multiple metal interconnects or traces, such as signal traces, clock traces, power buses or traces, or ground buses or traces, provided by the patterned metal layer 5, one of the metal plugs 5m, and the patterned metal layer 3, and connected to one of the metal traces or pads 66 of the chips 140 through, in sequence, the one of the metal plugs 5p that are formed on the contact points of the metal interconnects or traces 4f, the one of the metal interconnects or traces provided by the patterned metal layer 5, one of the metal plugs 7m, the patterned metal layer 7 and one of the metal plugs 7p.

Alternatively, regarding to the system-in package or multichip module shown in FIGS. 109T and 109U, the metal interconnects or traces 4a, 4b, 4c, 4d, 4e, 4f and 4g provided by the patterned metal layers 4 of the left and right chips 130 can be omitted, and the metal plugs 5p can be formed directly on the contact points 46a, 46b, 46c, 46d, 46e, 46f, 46g and 46h. The contact points 46a can be connected to the metal interconnects or traces 5s through the metal plugs 5p that are formed directly on the contact points 46a. The contact points 46b can be connected to the metal interconnects or traces 51 through the metal plugs 5p that are formed directly on the contact points 46b. The contact points 46e can be connected to the metal interconnects or traces 5u through the metal plugs 5p that are formed directly on the contact points 46e. The contact points 46f can be connected to the metal interconnects or traces 5v through the metal plugs 5p that are formed directly on the contact points 46f. The contact point 46g can be connected to the metal interconnect or trace 5w through the metal plug 5p that is formed directly on the contact point 46g, and the contact point 46h can be connected to the metal interconnect or trace 5w through the metal plug 5p that is formed directly on the contact point 46h. The contact points 46c can be connected to the contact points 46d through, in sequence, the metal plugs 5p formed directly on the contact points 46c, multiple metal interconnects or traces, such as signal traces, clock traces, power buses or traces, or ground buses or traces, provided by the patterned metal layer 5 over the right chip 130, and the metal plugs 5p formed directly on the contact points 46d, and the metal interconnects or traces can be connected to the metal traces or pads 26 of the chips 120 through the metal plugs 5m and the patterned metal layer 3 and to the metal traces or pads 66 of the chips 140 through the metal plugs 7m, the patterned metal layer 7 and the metal plugs 7p.

The previously described system-in packages or multichip modules shown in FIGS. 52, 54, 55, 66, 67, 72, 73, 83, 84, 104, 107K, 107L, 108F and 109T, the previously described module shown in FIG. 74 and the previously described electronic device shown in FIG. 85 can be used, e.g., for a telephone, a cordless phone, a mobile phone, a smart phone, a netbook computer, a notebook computer, a digital camera, a digital video camera, a digital picture frame, a personal digital assistant (PDA), a pocket personal computer, a portable personal computer, an electronic book, a digital book, a desktop computer, a tablet or slate computer, an automobile electronic product, a mobile internet device (MID), a mobile television, a projector, a mobile projector, a pico projector, a smart projector, a three-dimensional 3D video display, a 3D television (3D TV), a 3D video game player, a mobile computer device, a mobile compuphone (also called mobile phoneputer or mobile personal computer phone) which is a device or a system combining and providing functions of computers and phones, or a high performance and/or low power computer or server, for example, used for cloud computing.

The components, steps, features, benefits and advantages that have been discussed are merely illustrative. None of them, nor the discussions relating to them, are intended to limit the scope of the present disclosure in any way. Numerous other embodiments are also contemplated. These include embodiments that have fewer, additional, and/or different components, steps, features, benefits and advantages. These also include embodiments in which the components and/or steps are arranged and/or ordered differently. In reading the present disclosure, one skilled in the art will appreciate that embodiments of the present disclosure can be implemented in hardware, software, firmware, or any combinations of such, and over one or more communications networks. Suitable software can include computer-readable or machine-readable instructions for performing methods and techniques (and portions thereof) of designing and/or controlling the implementation system in packages (SIPs) or multichip modules MCMs (or portions thereof) in accordance with the present disclosure. Any suitable software language (machine-dependent or machine-independent) or computer-readable storage media may be utilized. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims, are approximate, not exact. They are intended to have a reasonable range that is consistent with the functions to which they relate and with what is customary in the art to which they pertain.

What is claimed is:

1. A system-in package comprising:
   a first polymer layer;
   a first chip in the first polymer layer;
   a first metal layer over the first chip and over a top surface of the first polymer layer, wherein the first metal layer is connected to the first chip;
   a second polymer layer over the first polymer layer, over the first chip and over the first metal layer;
   a second chip in the second polymer layer, wherein the second chip comprises a first metal bump at a top of the second chip and in the second polymer layer;
   a second metal bump in the second polymer layer and over the first metal layer, wherein the second metal bump is connected to the first metal layer, wherein the second metal bump is higher than the first metal bump, wherein a top surface of the first metal bump and a top surface of the second metal bump are not covered by the second polymer layer; and
   a second metal layer on the top surface of the first metal bump, on the top surface of the second metal bump and over a top surface of the second polymer layer, wherein a first interface is between the first metal bump and the second metal layer, and a second interface is between the second metal bump and the second metal layer, wherein the second metal layer connects the first metal bump to the second metal bump, wherein the first metal bump is connected to the first chip through, in sequence, the second metal layer, the second metal bump and the first metal layer.

2. The system-in package of claim 1, wherein the first chip comprises a central-processing-unit (CPU) chip, a baseband chip, a graphics-processing-unit (GPU) chip, a digital-signal-processing (DSP) chip, a wireless local area network (WLAN) chip, a memory chip, a flash memory chip, a dynamic-random-access-memory (DRAM) chip, a static-random-access-memory (SRAM) chip, a logic chip, an analog chip, a power device, a regulator, a power management device, a global-positioning-system (GPS) chip, a bluetooth chip, or a system-on chip (SOC) comprising a central-processing-unit (CPU) circuit block, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block or a modem circuit block.

3. The system-in package of claim 1 further comprising a substrate under the first polymer layer, wherein the first chip and the second chip are over the substrate.

4. The system-in package of claim 1 further comprising a third metal layer over the top surface of the first polymer layer, wherein the second chip is further vertically over the third metal layer.

5. The system-in package of claim 1 further comprising a metal plane over the first chip, over the second chip, over the second polymer layer and over the second metal layer, and a third polymer layer between the metal plane and the second metal layer.

6. The system-in package of claim 1, wherein the first metal bump comprises a first copper layer having a thickness between 5 and 50 micrometers, and wherein the second metal bump comprises a second copper layer having a thickness between 15 and 520 micrometers.

7. The system-in package of claim 1, wherein the first chip comprises a third metal bump at a top of the first chip and in the first polymer layer, wherein a top surface of the third metal bump is not covered by the first polymer layer, wherein the first metal layer is further on the top surface of the third metal bump, wherein the first metal bump is connected to the third metal bump through, in sequence, the second metal layer, the second metal bump and the first metal layer.

8. The system-in package of claim 7, wherein the third metal bump comprises a copper layer having a thickness between 5 and 50 micrometers.

9. The system-in package of claim 1 further comprising a third metal layer over the top surface of the first polymer layer and over the first chip, a third chip in the second polymer layer, a third metal bump in the second polymer layer and over the third metal layer, and a fourth metal layer on a top surface of a fourth metal bump of the third chip, on a top surface of the third metal bump and over the top surface of the second polymer layer, wherein the fourth metal bump is at a top of the third chip and in the second polymer layer, wherein a third interface is between the third metal bump and the fourth metal layer, and a fourth interface is between the fourth metal bump and the fourth metal layer, wherein the top surface of the third metal bump and the top surface of the fourth metal bump are not covered by the second polymer layer, wherein the fourth metal layer connects the third metal bump to the fourth metal bump, wherein the third metal bump is higher than the fourth metal bump, wherein the fourth metal bump is connected to the first chip through, in sequence, the fourth metal layer, the third metal bump and the third metal layer.

10. The system-in package of claim 1, wherein the total number of bit lines in parallel data communication between the first and second chips is more than 128, and one of the bit lines is provided by the first and second metal layers and the first and second metal bumps.

11. A system-in package comprising:
    a substrate;
    a first polymer layer over the substrate;
    a first chip in the first polymer layer and over the substrate, wherein the first chip comprises a first metal bump at a top of the first chip and a second metal bump at the top of the first chip;
    a third metal bump in the first polymer layer and over the substrate, wherein the third metal bump is connected to a pad of the substrate, wherein the third metal bump is higher than the first metal bump and higher than the second metal bump, wherein a top surface of the first metal bump, a top surface of the second metal bump and a top surface of the third metal bump are not covered by the first polymer layer;
    a first metal layer on the top surface of the first metal bump, on the top surface of the third metal bump and over a top surface of the first polymer layer, wherein a first interface is between the first metal bump and the first layer, and a second interface is between the third metal bump and the first metal layer, wherein the first metal layer connects the first metal bump to the third metal bump, wherein the first metal bump is connected to the pad of the substrate through, in sequence, the first metal layer and the third metal bump;
    a second metal layer on the top surface of the second metal bump and over the top surface of the first polymer layer, wherein a third interface is between the second metal bump and the second metal layer, wherein the second metal layer is connected to the second metal bump;

a second polymer layer over the first polymer layer, over the first metal layer, over the second metal layer and over the first chip;

a second chip in the second polymer layer, wherein the second chip comprises a fourth metal bump at a top of the second chip and in the second polymer layer;

a fifth metal bump in the second polymer layer, wherein the fifth metal bump is connected to the second metal layer, wherein the fifth metal bump is higher than the fourth metal bump, wherein a top surface of the fourth metal bump and a top surface of the fifth metal bump are not covered by the second polymer layer; and a third metal layer on the top surface of the fourth metal bump, on the top surface of the fifth metal bump and over a top surface of the second polymer layer, wherein a fourth interface is between the fourth metal bump and the third metal layer, and a fifth interface is between the fifth metal bump and the third metal layer, wherein the third metal layer connects the fourth metal bump to the fifth metal bump, wherein the fourth metal bump is connected to the second metal bump through, in sequence, the third metal layer, the fifth metal bump and the second metal layer.

12. The system-in package of claim 11, wherein the substrate comprises a mother board, a printed circuit board, a ball-grid-array (BGA) substrate, a metal substrate, a glass substrate or a ceramic substrate.

13. The system-in package of claim 11, wherein the first chip comprises a central-processing-unit (CPU) chip, a baseband chip, a graphics-processing-unit (GPU) chip, a digital-signal-processing (DSP) chip, a wireless local area network (WLAN) chip, a memory chip, a flash memory chip, a dynamic-random-access-memory (DRAM) chip, a static-random-access-memory (SRAM) chip, a logic chip, an analog chip, a power device, a regulator, a power management device, a global-positioning-system (GPS) chip, a bluetooth chip, or a system-on chip (SOC) comprising a central-processing-unit (CPU) circuit block, a graphics-processing-unit (GPU) circuit block, a baseband circuit block, a digital-signal-processing (DSP) circuit block, a memory circuit block, a Bluetooth circuit block, a global-positioning-system (GPS) circuit block, a wireless local area network (WLAN) circuit block or a modem circuit block.

14. The system-in package of claim 11 further comprising a fourth metal layer over the top surface of the first polymer layer, wherein the second chip is further vertically over the fourth metal layer.

15. The system-in package of claim 11 further comprising a metal plane over the first chip, over the second chip, over the second polymer layer and over the third metal layer, and a third polymer layer between the metal plane and the third metal layer.

16. The system-in package of claim 11, wherein the fourth metal bump comprises a first copper layer having a thickness between 5 and 50 micrometers, wherein the fifth metal bump comprises a second copper layer having a thickness between 15 and 520 micrometers.

17. The system-in package of claim 11, wherein the second metal layer comprises a first copper layer having a thickness between 2 and 30 micrometers, wherein the third metal layer comprises a second copper layer having a thickness between 2 and 30 micrometers.

18. The system-in package of claim 11, wherein the third metal layer comprises a ground interconnect.

19. The system-in package of claim 11 further comprising a passive component in the second polymer layer.

20. The system-in package of claim 11, wherein the second chip is further vertically over the second metal layer.

* * * * *